(12) United States Patent
Wang et al.

(10) Patent No.: US 10,700,225 B2
(45) Date of Patent: Jun. 30, 2020

(54) MICROSTRUCTURE ENHANCED ABSORPTION PHOTOSENSITIVE DEVICES

(71) Applicant: W&WSens, Devices Inc., Los Altos, CA (US)

(72) Inventors: Shih-Yuan Wang, Palo Alto, CA (US); Shih-Ping Wang, Los Altos, CA (US)

(73) Assignee: W&WSENS DEVICES, INC., Los Altos, CA (US)

( * ) Notice: Subject to any disclaimer, the term of this patent is extended or adjusted under 35 U.S.C. 154(b) by 0 days.

(21) Appl. No.: 16/042,535

(22) Filed: Jul. 23, 2018

(65) Prior Publication Data

US 2019/0019899 A1    Jan. 17, 2019

Related U.S. Application Data

(63) Continuation-in-part of application No. 15/797,821, filed on Oct. 30, 2017, now Pat. No. 10,446,700,
(Continued)

(51) Int. Cl.
*H01L 31/0236* (2006.01)
*H01L 31/107* (2006.01)
(Continued)

(52) U.S. Cl.
CPC ........ *H01L 31/02363* (2013.01); *G02B 1/002* (2013.01); *G02B 1/005* (2013.01);
(Continued)

(58) Field of Classification Search
CPC .............. H01L 31/02; H01L 31/02024; H01L 31/0232; H01L 31/02327; H01L 31/0236;
(Continued)

(56) References Cited

U.S. PATENT DOCUMENTS

| 4,292,512 A | 9/1981 | Miller et al. |
| 4,571,559 A | 2/1986 | Henry et al. |

(Continued)

FOREIGN PATENT DOCUMENTS

| JP | 6-53424 | 2/1994 |
| JP | 2003-142778 | 5/2003 |

(Continued)

OTHER PUBLICATIONS

Jul. 16, 2018 European Search Report issued by the European Patent Office in connection with European Patent Application No. 15861593.0.

(Continued)

*Primary Examiner* — Eduardo A Rodela
(74) *Attorney, Agent, or Firm* — Cooper & Dunham LLP

(57) ABSTRACT

Lateral and vertical microstructure enhanced photodetectors and avalanche photodetectors are monolithically integrated with CMOS/BiCMOS ASICs and can also be integrated with laser devices using fluidic assembly techniques. Photodetectors can be configured in a vertical PIN arrangement or lateral metal-semiconductor-metal arrangement where electrodes are in an inter-digitated pattern. Microstructures, such as holes and protrusions, can improve quantum efficiency in silicon, germanium and III-V materials and can also reduce avalanche voltages for avalanche photodiodes. Applications include optical communications within and between datacenters, telecommunications, LIDAR, and free space data communication.

29 Claims, 151 Drawing Sheets

Related U.S. Application Data which is a continuation-in-part of application No. 15/309,922, filed as application No. PCT/US2015/061120 on Nov. 17, 2015, now Pat. No. 9,818,893, and a continuation of application No. 14/943,898, filed on Nov. 17, 2015, now Pat. No. 9,530,905, and a continuation of application No. 14/945,003, filed on Nov. 18, 2015, now Pat. No. 9,525,084, and a continuation-in-part of application No. PCT/US2016/067977, filed on Dec. 21, 2016, and a continuation-in-part of application No. 14/947,718, filed on Nov. 20, 2015, which is a continuation of application No. PCT/US2014/039208, filed on May 22, 2014.

(60) Provisional application No. 62/081,538, filed on Nov. 18, 2014, provisional application No. 62/090,879, filed on Dec. 11, 2014, provisional application No. 62/100,025, filed on Jan. 5, 2015, provisional application No. 62/139,511, filed on Mar. 27, 2015, provisional application No. 62/153,443, filed on Apr. 27, 2015, provisional application No. 62/154,675, filed on Apr. 29, 2015, provisional application No. 62/157,876, filed on May 6, 2015, provisional application No. 62/171,915, filed on Jun. 5, 2015, provisional application No. 62/174,498, filed on Jun. 11, 2015, provisional application No. 62/175,855, filed on Jun. 15, 2015, provisional application No. 62/182,602, filed on Jun. 21, 2015, provisional application No. 62/188,876, filed on Jul. 6, 2015, provisional application No. 62/197,120, filed on Jul. 27, 2015, provisional application No. 62/199,607, filed on Jul. 31, 2015, provisional application No. 62/205,717, filed on Aug. 15, 2015, provisional application No. 62/209,311, filed on Aug. 24, 2015, provisional application No. 62/213,556, filed on Sep. 2, 2015, provisional application No. 62/111,582, filed on Feb. 3, 2015, provisional application No. 62/232,716, filed on Sep. 25, 2015, provisional application No. 62/415,339, filed on Oct. 31, 2016, provisional application No. 62/270,577, filed on Dec. 21, 2015, provisional application No. 61/826,446, filed on May 22, 2013, provisional application No. 61/834,873, filed on Jun. 13, 2013, provisional application No. 61/843,021, filed on Jul. 4, 2013, provisional application No. 61/905,109, filed on Nov. 15, 2013.

(51) Int. Cl.

| | | |
|---|---|---|
| *G02B 1/00* | (2006.01) | |
| *G02B 6/42* | (2006.01) | |
| *H01L 31/18* | (2006.01) | |
| *H01L 31/0352* | (2006.01) | |
| *H01L 27/144* | (2006.01) | |
| *H01L 31/103* | (2006.01) | |
| *H01L 27/146* | (2006.01) | |
| *H04B 10/80* | (2013.01) | |
| *H04B 10/25* | (2013.01) | |
| *H04B 10/40* | (2013.01) | |
| *H01L 31/0232* | (2014.01) | |
| *H01L 31/028* | (2006.01) | |
| *H01L 31/02* | (2006.01) | |
| *H04B 10/69* | (2013.01) | |
| *H01L 31/09* | (2006.01) | |
| *H01L 31/105* | (2006.01) | |

(52) U.S. Cl.
CPC ............ *G02B 6/42* (2013.01); *H01L 27/1443* (2013.01); *H01L 27/1446* (2013.01); *H01L 27/14625* (2013.01); *H01L 31/02* (2013.01); *H01L 31/028* (2013.01); *H01L 31/0232* (2013.01); *H01L 31/0236* (2013.01); *H01L 31/02325* (2013.01); *H01L 31/02327* (2013.01); *H01L 31/02366* (2013.01); *H01L 31/0352* (2013.01); *H01L 31/035218* (2013.01); *H01L 31/035281* (2013.01); *H01L 31/09* (2013.01); *H01L 31/103* (2013.01); *H01L 31/105* (2013.01); *H01L 31/107* (2013.01); *H01L 31/1075* (2013.01); *H01L 31/18* (2013.01); *H01L 31/1804* (2013.01); *H01L 31/1808* (2013.01); *H04B 10/25* (2013.01); *H04B 10/40* (2013.01); *H04B 10/691* (2013.01); *H04B 10/6971* (2013.01); *H04B 10/801* (2013.01); *Y02E 10/547* (2013.01); *Y02P 70/521* (2015.11)

(58) Field of Classification Search
CPC ........... H01L 31/02363; H01L 31/0352; H01L 31/035209; H01L 31/08; H01L 31/105; H01L 31/18
See application file for complete search history.

(56) References Cited

U.S. PATENT DOCUMENTS

| | | | |
|---|---|---|---|
| 4,637,129 A | | 1/1987 | Derkits, Jr. et al. |
| 4,716,449 A | | 12/1987 | Miller |
| 4,814,847 A | | 3/1989 | Tabatabaie |
| 5,244,749 A | | 9/1993 | Bean et al. |
| 5,451,767 A | | 9/1995 | Amano et al. |
| 5,457,327 A | | 10/1995 | Taguchi |
| 5,525,828 A | * | 6/1996 | Bassous ............ H01L 31/02024 257/449 |
| 5,625,636 A | | 4/1997 | Bryan et al. |
| 5,757,057 A | | 5/1998 | Dabrowski |
| 5,886,374 A | | 3/1999 | Sakamoto et al. |
| 6,027,956 A | | 2/2000 | Irissou |
| 6,177,289 B1 | | 1/2001 | Crow et al. |
| 6,392,282 B1 | | 5/2002 | Sahara et al. |
| 6,538,299 B1 | * | 3/2003 | Kwark ............... H01L 31/03529 257/452 |
| 6,667,528 B2 | | 12/2003 | Cohen et al. |
| 6,724,798 B2 | | 4/2004 | Liu et al. |
| 6,845,034 B2 | | 1/2005 | Bhattacharyya |
| 6,879,014 B2 | | 4/2005 | Wagner et al. |
| 7,115,971 B2 | | 10/2006 | Stumbo |
| 7,161,220 B2 | | 1/2007 | Cohen |
| 7,251,386 B1 | * | 7/2007 | Dickinson ............... B82Y 20/00 385/129 |
| 7,264,982 B2 | * | 9/2007 | Cheng ............... H01L 31/03529 438/48 |
| 7,340,709 B1 | | 3/2008 | Masini et al. |
| 7,397,101 B1 | | 7/2008 | Masini et al. |
| 7,495,306 B2 | | 2/2009 | Langguth et al. |
| 7,510,904 B2 | * | 3/2009 | Chu ....................... H01L 31/101 257/E21.093 |
| 7,601,597 B2 | | 10/2009 | Takei |
| 7,605,406 B2 | | 10/2009 | Iguchi |
| 7,674,563 B2 | | 3/2010 | Suda |
| 7,772,615 B2 | | 8/2010 | Ledentsov et al. |
| 7,795,064 B2 | | 9/2010 | Pan et al. |
| 7,893,348 B2 | | 2/2011 | Korevaar |
| 7,898,052 B2 | | 3/2011 | Prantl et al. |
| 7,972,934 B2 | | 7/2011 | Wilson et al. |
| 7,977,637 B1 | | 7/2011 | Yap et al. |
| 8,114,695 B2 | | 2/2012 | Masuoka et al. |
| 8,129,710 B2 | | 3/2012 | Cho et al. |
| 8,319,241 B2 | | 11/2012 | Na et al. |
| 8,357,960 B1 | | 1/2013 | Dutta |

(56) References Cited

U.S. PATENT DOCUMENTS

| | | | |
|---|---|---|---|
| 8,436,370 B2 | 5/2013 | Park et al. | |
| 8,728,847 B2 | 5/2014 | Maruyama et al. | |
| 9,045,418 B2 | 6/2015 | Jordan et al. | |
| 9,360,554 B2 | 6/2016 | Retterath et al. | |
| 9,453,190 B1* | 9/2016 | Byron | H01L 3/02363 |
| 9,496,435 B2 | 11/2016 | Wang et al. | |
| 9,525,084 B2 | 12/2016 | Wang et al. | |
| 9,530,905 B2 | 12/2016 | Wang et al. | |
| 9,793,439 B2* | 10/2017 | Lunev | H01L 33/38 |
| 9,818,893 B2 | 11/2017 | Wang et al. | |
| 2002/0000244 A1* | 1/2002 | Zaidi | H01L 31/02363 |
| | | | 136/259 |
| 2002/0097962 A1 | 7/2002 | Yoshimura et al. | |
| 2003/0059820 A1 | 3/2003 | Vo-Dinh | |
| 2003/0122210 A1 | 7/2003 | Cohen | |
| 2004/0222357 A1 | 11/2004 | King et al. | |
| 2005/0092925 A1 | 5/2005 | Zentai et al. | |
| 2005/0184354 A1 | 8/2005 | Chu et al. | |
| 2006/0186501 A1 | 8/2006 | Ishimura | |
| 2006/0267054 A1 | 11/2006 | Martin et al. | |
| 2007/0092192 A1 | 4/2007 | Achouche et al. | |
| 2007/0170536 A1 | 7/2007 | Hsu et al. | |
| 2007/0190434 A1 | 8/2007 | Suda | |
| 2007/0215968 A1 | 9/2007 | Wilson | |
| 2007/0277869 A1 | 12/2007 | Shan | |
| 2008/0102582 A1 | 1/2008 | Takei | |
| 2008/0047604 A1 | 2/2008 | Korevaar et al. | |
| 2008/0079022 A1 | 4/2008 | Yamamoto et al. | |
| 2008/0080854 A1 | 4/2008 | Tian et al. | |
| 2008/0218740 A1 | 9/2008 | Williams et al. | |
| 2008/0229941 A1 | 9/2008 | Heidari | |
| 2008/0248608 A1 | 10/2008 | Wilson et al. | |
| 2008/0265449 A1 | 10/2008 | Meinders et al. | |
| 2009/0008735 A1 | 1/2009 | Ogino et al. | |
| 2009/0188557 A1 | 7/2009 | Wang et al. | |
| 2009/0225804 A1 | 9/2009 | Sasahata et al. | |
| 2009/0230498 A1 | 9/2009 | Iwai et al. | |
| 2009/0267049 A1 | 10/2009 | Cho et al. | |
| 2009/0321868 A1 | 12/2009 | Nakaji | |
| 2010/0029067 A1 | 2/2010 | Vijh | |
| 2010/0059789 A1 | 3/2010 | Choi | |
| 2010/0059822 A1 | 3/2010 | Pinguet et al. | |
| 2010/0126548 A1 | 5/2010 | Jang et al. | |
| 2010/0148318 A1 | 6/2010 | Wang et al. | |
| 2010/0193768 A1 | 8/2010 | Habib | |
| 2010/0197068 A1 | 8/2010 | Poon | |
| 2010/0207223 A1* | 8/2010 | Feng | G02B 6/12004 |
| | | | 257/432 |
| 2010/0221866 A1 | 9/2010 | Graham | |
| 2010/0288341 A1 | 11/2010 | Kim et al. | |
| 2010/0289939 A1* | 11/2010 | Ogino | G02B 1/11 |
| | | | 348/340 |
| 2010/0308428 A1 | 12/2010 | Okamoto et al. | |
| 2010/0313941 A1 | 12/2010 | Huang | |
| 2011/0000545 A1 | 1/2011 | Nishi et al. | |
| 2011/0255046 A1 | 10/2011 | Kurokawa et al. | |
| 2012/0012741 A1* | 1/2012 | Vasylyev | G01J 1/0407 |
| | | | 250/237 R |
| 2012/0141122 A1 | 6/2012 | Carusone et al. | |
| 2012/0153260 A1 | 6/2012 | Kim et al. | |
| 2012/0193676 A1 | 8/2012 | Bobde et al. | |
| 2012/0273911 A1* | 11/2012 | Shigeta | H01L 31/02327 |
| | | | 257/432 |
| 2012/0279553 A1 | 11/2012 | Shigeta et al. | |
| 2012/0292676 A1 | 11/2012 | Pan | |
| 2013/0009265 A1 | 1/2013 | Dautet et al. | |
| 2013/0084044 A1 | 4/2013 | Ertel et al. | |
| 2013/0114629 A1 | 5/2013 | Firth et al. | |
| 2013/0207222 A1 | 8/2013 | Qu et al. | |
| 2013/0230272 A1 | 9/2013 | Raj et al. | |
| 2014/0001528 A1 | 1/2014 | Pfirsch et al. | |
| 2014/0167107 A1 | 6/2014 | Yoneda et al. | |
| 2014/0225063 A1 | 8/2014 | Klem et al. | |
| 2014/0263975 A1 | 9/2014 | Nagano et al. | |
| 2015/0041965 A1 | 2/2015 | Schulze et al. | |
| 2015/0054997 A1 | 2/2015 | Hynecek | |
| 2015/0108327 A1* | 4/2015 | Huang | H01L 31/022408 |
| | | | 250/200 |
| 2015/0340538 A1 | 11/2015 | Novack et al. | |
| 2016/0225631 A1 | 8/2016 | Jun et al. | |
| 2016/0240718 A1 | 8/2016 | Hansson et al. | |
| 2016/0254407 A1 | 9/2016 | Wang et al. | |
| 2017/0338367 A1 | 11/2017 | Novack et al. | |
| 2018/0145098 A1* | 5/2018 | Yamashita | H01L 27/1461 |

FOREIGN PATENT DOCUMENTS

| | | |
|---|---|---|
| JP | 2012-502466 | 1/2012 |
| WO | WO2012034078 | 3/2012 |
| WO | WO2012149441 | 11/2012 |
| WO | WO2013180690 | 12/2013 |
| WO | WO2014190189 | 11/2014 |
| WO | WO2016081476 | 5/2016 |
| WO | WO2017112747 | 6/2017 |

OTHER PUBLICATIONS

Jan. 8, 2019 official action issued by the Japanese Patent Office in connection with Japanese Patent Application No. 2016-515097.

Jan. 15, 2019 International Search Report of the International Searching Authority in connection with PCT/US2018/057963.

Feb. 12, 2019 International Search Report of the International Searching Authority in connection with PCT/US2018/043289.

Yokogawa, s., et al., IR sensitivity enhancement of CMOS Image Sensor with diffractive light trapping pixels, Scientific Reports/ 7:3832/DOI:10.1038/s41598-017-04200-y, Jun. 19, 2017.

Zang et al., "Silicon single-photon avalanche diodes with nanostructured light trapping" Nature Communications 8: 628 (Sep. 20, 2017).

Liu et al. "Tensile strained Ge photodetectors on Si platform for C and L band telecommunications", Appl. Phys. Lett. 87 (2005). American Institute of Physics. pp. 011110-1-011110-3.

Chen et al. "Ultra-low capacitance and high speed germanium photodetectors on silicon", Optical Society of America, May 11, 2009 / vol. 17, No. 10 / Optics Express pp. 7901-7906.

Houng et al., "Characterization of the Nanoporous Template Using Anodic Alumina Method", Journal of Nanomaterials, vol. 2014, Article 10 130716, pp. 1-7.

European Patent Office Supplementary Search Report issued in European Application No. 14801543 on Dec. 6, 2016.

Ackert, "10 Gbps silicon waveguide-integrated infrared avalanche photodiode." Optics 3 Express, Aug. 12, 2013, (Aug. 12, 2013), Abstract, pp. 19535 https:/lwww.osapublishing.org/DirectPDFAccess/ 5DB4DFDB-E034-29D4-E6AEE5BDEF4D8089 2601821 Je-21-17 -19530 .pdf?da= 1 &id=260 182&seq=0&mobile=no.

Berenschot et al. "Fabrication of 3D fractal structures using nanoscale anisotropic etching of single crystalline silicon" J. Micromech. Microeng. 2013, 23,055024 (10pp).

Sato "Basic 2 Anisotropic Wet-etching of Silicon: Characterization and Modeling of Changeable Anisotropy" http://gcoe.mech.nagoya-u.ac.jp/basic/pdf/basic-02.pdf.

Sato et al. "Anisotropic etching rates of single-crystal silicon for TMAH water solution as a function of crystallographic orientation" Sensors and Actuators, 73(1999) 131-137.

Bassous "Fabrication of Novel Three Dimensinal Microstructures by the Anisotropic Etching of (100) and (110) Silicon" IEEE Transactions of Electron Devices, ED-25, 10, 1978.

Zubel "Anisotropic etching of silicon in solutions containing tensioactive compounds" Proc. of SPIE vol. 10175 101750L-1.

Hsiao et al. "Compact and passive-alignment 4-channel x 2.5- Gbps optical interconnect modules based on silicon optical benches with 45° micro-reflectors" Optics Express, Dec. 21, 2009, vol. 17, No. 26, 24250.

Rola "Anisotropic etching of silicon in KOH + Triton X-100 for 45° micromirror applications" Microsyst Technol (2017) 23:1463-1473.

Rola et al "Triton Surfactant as an Additive to KOH Silicon Etchant" Journal of Microelectromechanical Systems, vol. 22, No. 6, Dec. 2013.

(56) References Cited

OTHER PUBLICATIONS

Izumi et al. "C.M.O.S. Devices Fabricated on Buried SiO2 Layers Formed by Oxygen Implantation Into Silicon" Electronics Letters, Aug. 31, 1978 vol. 14 No. 1.
Hauthan et al. "Improvement in buried silicon nitride silicon-on-insulator structures by fluorine-ion implantation" J. Appl. Phys., vol. 83, No. 7, Apr. 1, 1998.
Judy "Microelectromechanical systems (MEMS): fabrication, design and applications" Smart Mater. Struct. 10 (2001) 1115-1134.
Smith et al. "Embedded Micromechanical Devices for the Monolithic Integration of MEMS with CMOS" Proc. 1995 IEDM, pp. 609-612.
Gao et al. "High Speed Surface Illuminated Si Photodiode Using Microstructured Holes for Absorption Enhancements at 900-1000 nm Wavelength" DOI: 10.1021/acsphotonics.7b00486.
Fiori et al. "Electronics based on two-dimensional materials" Published Online: Oct. 6, 2014 | DOI: 10.1038/NNANO.2014.207.
Molle et al. "Buckled two-dimensional Xene sheets" Published Online: Jan. 16, 2017 | DOI: 10.1038/NMAT4802.
Mak et al. "Photonics and optoelectronics of 2D semiconductor transition metal dichalcogenides" Published Online: Mar. 31, 2016 | DOI: 10.1038/NPHOTON.2015.282.
Takai et al. "Single-Photon Avalanche Diode with Enhanced NIR-Sensitivity for Automotive LIDAR Systems" Sensors 2016, 16, 459; doi:10.3390/s16040459.
Carey K.W., et al. "Characterization of InP/GaInAs/InP heterostructures grown by organometallic vapor phase epitaxy for high-speed pin photodiode" Journal of Crystal Growth 1986.
Chen et al. "Optimization of InGaAs/InAlAs Avalanche Photodiodes" Nanoscale Research Letters (2017) 12:33.
Miura et al. "Modeling and Fabrication of Hollow Optical Waveguide for Photonic Integrated Circuits" Jpn. J. Appl. Phys. vol. 41 (2002) pp. 4785-4789.
Germanium Electrical Properties: http://www.ioffe.ru/SVA/NSM/Semicond/Ge/electric.html.
Rylyakov et al. "A 40-Gb/s, 850-nm, VCSEL-Based Full Optical Link" 2012.
Kenneth et al. "A BiCMOS Process Utilizing Selective Epitaxy for Analog/Digital Applications", IEEE Transactions on Electron Devices. vol. 36. No. 7. Jul. 1989.
Litchinitser et al. "Antiresonant reflecting photonic crystal optical waveguides" Optics Letters 2002, vol. 27, No. 18, 1592.
Tatarczak et al. "Reach Extension and Capacity Enhancement of VCSEL-Based Transmission Over Single-Lane MMF Links" Journal of Lightwave Technology, vol. 35, No. 4, Feb. 15, 2017.
Paneva et al. "Nitrogen implanted etch-stop layers in silicon" Microelectronic Engineering 27 (1995) 509-512.
Wada et al. "Very high speed GaInAs metal-semiconductor-metal photodiode incorporating an AllnAs/GaInAs graded superlattice" Appl. Phys. Lett. 54, 16 (1989). American Institute of Physics.
Liu et al. "140-GHz metal-semiconductor-metal photodetectors on silicon-on-insulator substrate with a scaled active layer" Appl. Phys. Lett. 65, 887 (1994). American Institute of Physics.
Zang et al. "Application of dopant segregation to metal-germanium-metal photodetectors and its dark current suppression mechanism" Appl. Phys. Lett. 92, 051110 (2008). American Institute of Physics.
Ghanbarzadeh, et al. "Low Dark Current Amorphous SiliconMetal-Semiconductor-Metal Photodetector for Digital Imaging Applications" IEEE Electron Device Letters, vol. 35, No. 2, Feb. 2014. pp. 234-237.
Assefa, et al. "A 90nm CMOS Integrated Nano-Photonics Technology for 25Gbps WDM Optical Communications Applications" IEEE International Electron Devices Meeting (IEDM), postdeadline session 33.8, Dec. 10-12, 2012.
Gao et al. "High Speed Surface Illuminated Si Photodiode Using Microstructured Holes for Absorption Enhancements at 900-1000 nm Wavelength" ACS Photonics, pp. A-H, Jul. 18, 2017.
Anderson et al. "HPSM4 Technology & Relative Cost Analysis Update" IEEE P802.3bm TF, Phoenix, AZ, Jan. 21-24, 2013.

Xi et al. "Optical thin-film materials with low refractive index for broadband elimination of Fresnel reflection" Nature Photonics, vol. 1, Mar. 2007.
Assefa et al. "CMOS-integrated high-speed MSM germanium waveguide photodetector" Mar. 1, 2010 / vol. 18, No. 5 / Optics Express pp. 4986-4999.
Zheng et al. "Fluidic Heterogeneous Microsystems Assembly and Packaging" Journal of Microelectromechanical Systems vol. 15, No. 4, Aug. 2006, pp. 864-870.
Xue et al. "1 X 4 Ge-on-SOI PIN Photodetector Array for Parallel Optical Interconnects" Journal of Lightwave Technology, vol. 27, No. 24, Dec. 15, 2009, pp. 5687-5689.
DiLello et al. "Characterization of dark current in Ge-on-Si photodiodes" Journal of Applied Physics 112, 054506 (2012).
Dong et al., "Suppression of dark current in germanium-tin on silicon p-i-n photodiode by a silicon surface passivation technique", Optical Society of America, Jul. 13, 2015 | vol. 23, No. 14 | DOI:10.1364/OE.23.018611 | Optics Express, pp. 18611-18619.
Koester et al., "Ge-on-SOI-Detector/Si-CMOS-Amplifier Receivers for High-Performance Optical-Communication Applications", Journal of Lightwave Technology, vol. 25, No. 1, Jan. 2007, pp. 46-57.
Pearson et al., "Germanium Photodetectors on Amorphous Substrates for Electronic-Photonic Integration", 2016 IEEE, pp. 20-21.
Michel et al., "High-performance Ge-on-Si photodetectors," Nature Photonics | vol. 4 | Aug. 2010, pp. 527-534.
Knoll et al., "Monolithically Integrated 25Gbit/sec Receiver for 1.55µm in Photonic BiCMOS Technology", Optical Society of America 2014.
Xiao et al., "A 2 Gb/s optical receiver with monolithically integrated MSM photodetector in standard CMOS process", Chinese Science Bulletin, Jul. 2011, vol. 56, No. 21, pp. 2281-2285.
Nishimura et al., "A Significant Shift of Schottky Barrier Heights at Strongly Pinned Metal/Germanium Interface by Inserting an Ultra-Thin Insulating Film", The Japan Society of Applied Physics, Applied Physics Express 1 (2008), pp. 051406-1-051406-3.
Urino et al., "Demonstration of 12.5-Gbps optical interconnects integrated with lasers, optical splitters, optical modulators and photodetectors on a single silicon substrate", Optical Society of America, Dec. 10, 2012 / vol. 20, No. 26 / Optics Express B256.
Miura et al., "Differential receivers with highly-uniform MSM Germanium photodetectors capped by SiGe layer", Optical Society of America, Oct. 7, 2013 | vol. 21, No. 20 | DOI:10.1364/OE.21.023295 | Optics Express 23295.
Kang et al. "Suppression of dark current in GeOx-passivated germanium metal-semiconductor-metal photodetector by plasma post-oxidation", Optical Society of America, Jun. 29, 2015 | vol. 23, No. 13 | DOI:10.1364/OE.23.016967 | Optics Express 16967.
Dushaq et al. "Metal-germanium-metal photodetector grown on silicon using low temperature RF-PECVD", vol. 25, No. 25 | Dec. 11, 2017 | Optics Express, pp. 32110-32119.
Zang et al. "Asymmetrically contacted germanium photodiode using a metal-interlayer-semiconductor-metal structure for extremely large dark current suppression", Optical Society of America, vol. 41, No. 16 / Aug. 15, 2016 / Optics Letters, pp. 3686-3689.
Y. G. Wang, Y. X. Kang, W. J. Zhao, S. Yan, P. J. Zhai, and X. W. Tang, "Studies on surface damage induced by ion bombardment," Journal of Applied Physics, vol. 83, pp. 1341-1344, Feb. 1, 1998.
Liu Ay et al., High performance continous wave 1.3 µm quantum dot lasers on silicon, Appl. Phys. Letters, 2014, 104, 041104.
European Patent Office Supplementary Search Report issued in European Application No. 14801543 dated Dec. 6, 2016.
Joshi et al., "25 Gbps 850 nm photodiode for emerging 100 Gb ethernet applications" SPIE Proceedings vol. 8054, May 4, 2011, (May 4, 2011), Abstract http://proceedings.spiedigitallibrary.org/proceeding.aspx?articleid= 1351039.
"Dosunmu et al., "Germanium on double-SOI photodetectors for 1550 nm operation." Conference: Lasers and Electro-Optics Society, Nov. 2003, (Nov. 2003). https://www.researchgate.neVpublication/224745299".
Fan et al. "Differences in etching characteristics of TMAH and KOH on preparing inverted pyramids for silicon solar cells", Applied Surface Science, 2013, 264, 761-766.

(56) References Cited

OTHER PUBLICATIONS

Wu et al. "High aspect ration silicon etch: A review" J. Appl. Phys. 2010, 108, 051101.
Singh et al. "Silicon on Insulator technology review", International Journal of Engineering Sciences & Emerging Technologies, 2011, 1, 1, 1-16.
Montalenti et al. "Fully coherent growth of Ge on free-standing Si(001) nanomesas", Physical Review B 89, 014101 (2014).
Collot et al. "Dry-etch monitoring of III-V heterostructures using laser reflectometry and optical emission spectroscopy", J. Vac. Sci. Technol. B9 (5) Sep./Oct. 1991.
Ingham "Future of Short-Reach Optical Interconnects based on MMF Technologies" OFC 2017.
Sun et al. "SWDM PAM4 Transmission Over Next Generation Wide-Band Multimode Optical Fiber" Journal of Lightwave Technology, vol. 35, No. 4, Feb. 15, 2017.
Tekin "Review of packaging of Optoelectronic, Photonic and MEMS Components" IEEE Journal of Selected Topics in Quantum Electronics, vol. 17, No. 3, 2011.
Orcutt et al. "Monolithic Silicon Photonics at 25 Gb/s" OFC 2016 © OSA (2016).
Eshaghi et al., "Optical and electrical properties of indium tin oxide (ITO) nanostructured thin films deposited on polycarbonate substrates "thickness effect"", Optik 125 (2014) 1478-1481.
Uddin et al. "Highly efficient color filter array using resonant Si3N4 gratings" Optics Express May 20, 2013, vol. 21, No. 10, 12497.
Jacob et al., "Normally incident resonant grating reflection filters for efficient narrow-band spectral filtering of finite beams" J. Opt. Soc. Am. A, vol. 18, No. 9, Sep. 2001.
Zhou et al., "Surface-normal emission of a high-Q resonator using a subwavelength high-contrast grating" Optics Express, Oct. 27, 2008,vol. 16, No. 22, 17282.
Poulton et al., "MIT and DARPA Pack Lidar Sensor Onto Single Chip" http://spectrum.ieee.org/tech-talk/semiconductors/optoelectronics/mit-lidar-on-a-chip, IEEE Spectrum, 2016.
Rasshofer et al., "Influences of weather phenomena on automotive laser radar systems" Adv. Radio Sci., 9, 49-60, 2011.
Youn et al. "10-Gb/s 850-nm CMOS OEIC Receiver with a Silicon Avalanche Photodetector" IEEE Journal of Quantum Electronics, vol. 48, No. 2, Feb. 2012.
Swoboda et al., "11Gb/s Monolithically Integrated Silicon Optical Receiver for 850nm Wavelength" 006 IEEE International Solid-State Circuits Conference.
Tavernier et al. "Power Efficient 4.5Gbit/s Optical Receiver in 130nm CMOS with Integrated Photodiode" 34th European Solid-State Circuits Conference, 2008.
CMOS Manufacturing Process, EE141 UCBerkeley, http://bwrcs.eecs.berkeley.edu/Classes/icdesign/ee141_s02/Lectures/Lecture5-Manufacturing.pdf.
Williams "Ion Implantation of Semiconductors, Materials Science and Engineering" A253 (1998) 8-15.
Gibbons "Ion Implantation in Semiconductors—Part I Range Distribution Theory and Experiments" Proceedings of the IEEE, vol. 56, No. 3, 1968.
Assefa et al. "Monolithically Integrated Silicon Nanophotonics Receiver in 90nm CMOS Technology Node" OFC/NFOEC Technical Digest © 2013 OSA.
Taubenblatt "Optical Interconnects for High-Performance Computing" Journal of Lightwave Technology, vol. 30, No. 4, Feb. 15, 2012.
Chen et al. "A 1.8-V 10-Gb/s Fully Integrated CMOS Optical Receiver Analog Front-End" IEEE Journal of Solid-State Circuits, vol. 40, No. 6, Jun. 2005.
Kuchta et al., "A 55Gb/s Directly Modulated 850nm VCSEL-Based Optical Link" IEEE Photonics Conference 2012 (IPC 2012) Post Deadline Paper PD 1.5.
Lengyel et al. "Sensitivity Improvements in an 850-nm VCSEL-Based Link Using a Two-Tap Pre-Emphasis Electronic Filter" Journal of Lightwave Technology, vol. 35, No. 9, May 1, 2017.
Ghosh et al. "On Integrated CMOS-MEMS System-on-Chip" IEEE-NEWCAS Conference, 2005.
Kalogerakis et al. "A Quad 25Gb/s 270mW TIA in 0.13μm BiCMOS with <0.15dB Crosstalk Penalty" ISSCC 2013, Session 7, Optical Transceivers and Silicon Photonics, 7.1.
Knochenhauer et al. "40 Gbit/s transimpedance amplifier with high linearity range in 0.13 mm SiGe BiCMOS" Electronics Letters May 12, 2011 vol. 47 No. 10.
Nishihara et al. "10.3 Gbit/s burst-mode PIN-TIA module with high sensitivity, wide dynamic range and quick response" Electronics Letters Jan. 31, 2008 vol. 44 No. 3.
Racanelli et al. "SiGe BiCMOS Technology for Communication Products" IEEE 2003 Custom Integrated Circuits Conference.
General Properties of Silicon, http://www.pveducation.org/pvcdrom/materials/general-properties-of-silicon.
Wegrzecka et al. "Design and properties of silicon avalanche photodiodes" Opto-Electronics Review 12(1), 95-104 (2004).
Xie et al. "Post-CMOS Processing for High-Aspect-Ratio Integrated Silicon Microstructures" Journal of Microelectromechanical Systems, vol. 11, No. 2, Apr. 2002.
Huang et al. "A 10-Gb/s OEIC with Meshed Spatially-Modulated PhotoDetector in 0.18- umCMOSTechnology" IEEE Journal of Solid-State Circuits, vol. 46, No. 5, May 2011.
Tavernier et al. "High-Speed Optical Receivers With Integrated Photodiode in 130 nm CMOS" IEEE Journal of Solid-State Circuits, vol. 44, No. 10, Oct. 2009.
Kao et al. "A 5-Gbit/s CMOS Optical Receiver With Integrated Spatially Modulated Light Detector and Equalization" IEEE Transactions on Circuits and Systems—I: Regular Papers.
Hartman et al. "A Monolithic Silicon Photodetector/Amplifier IC for Fiber and Integrated Optics Application" Journal of Lightwave Technology, vol. LT-3, No. 4, Aug. 1985.
Radovanovic et al. "A 3-Gb/s Optical Detector in Standard CMOS for 850-nm Optical Communication" IEEE Journal of Solid-State Circuits, vol. 40, No. 8, Aug. 2005.
Csutak et al. "High-Speed Monolithically Integrated Silicon Photoreceivers Fabricated in 130-nm CMOS Technology" Journal of Lightwave Technology, vol. 20, No. 9, Sep. 2002.
Yin et al. "Integrated Arrow waveguides with hollow cores" Optics Express, Jun. 14, 2004, vol. 12, No. 12, 2710.
Michel et al. "High-performance Ge-on-Si photodetectors" Nature Photonics, Jul. 30, 2010, DOI: 10.1038/NPHOTON.2010.157.
Analog Devices, Inc. data sheet ADN3010-11 11.3 Gbps Optical Receiver.
Yashiki et al. "5 mW/Gbps hybrid-integrated Si-photonics-based optical I/O cores and their 25-Gbps/ch error-free operation with over 300-m MMF" OFC 2015 © OSA 2015.
Pyo et al., "3D Printed Nanophotonic Waveguides" Adv. Optical Mater. 2016, 4, 1190-1195.
Zang K. et al. "Silicon single-photon avalanche diodes with nanostructured light trapping" Nat. Comm. 2017, 8, 628.
Gao, Y. et al. "Photon-trapping microstructures enable high-speed high-efficiency silicon photodiodes" Nature, 2017, 11, 301-308.
International Search Report dated Nov. 28, 2014 in connection with PCT/US2014/39208.
International Search Report dated Dec. 23, 2011 in connection with PCT/US2011/051091.
International Search report dated Mar. 11, 2016 in connection with PCT/US2015/061120.
International Search report dated Mar. 9, 2017 in connection with PCT/US2016/67977.
Ren, R., et al., "Enhanced absorption in elliptical silicon nanowire arrays for solar energy harvesting", Optical Engineering, vol. 53(2), 027102, Feb. 2014, http://opticalengineering.spiedigitallibrary.org/article.aspx?articleid=1828860.
Dayal, G., et al, "Broadband infrared metamaterial absorber with visible transparency using ITO as ground plane", Optics Express 15104 Jun. 2014.
Donnelly, J. L., et al., "Mode-based analysis of silicon nanohole arrays for photovoltaic applications," vol. 22, No. S5, Optics Express, A1343, Aug. 25, 2014.

(56) References Cited

OTHER PUBLICATIONS

Gasca, L., "From O to L: The Future of Optical-Wavelength Bands," Broadband Properties, Jun. 2008, pp. 83-85. www.broadbandproperties.com.

"Finisar, "World's Largest Supplier of Optical Solutions for the Communications Industry."http://files.shareholder.com/downloads/FNSR/0x0x382377/0b3893ea-fb06-417d-ac71-84f2f9084b0d/Finisar_Investor_Presentation.pdf,)".

Silvaco., "Investigation of the SiGe Waveguide Phototides Using FDTD Method for High Speed Optical Communication," Simulation Standard, http://www.silvaco.com/tech_lib_TCAD/simulationstandard/2010/apr_may_jun/a1/a1.html).

Kolodzey, J., et al, "Optical and electronic properties of SiGeC alloys grown on Si substrates," Journal of Crystal Growth 157, 386-391, (1995).

Kraus, T.F., "Slow light in photonic crystal waveguides," Journal of Physics D: Applied Physics, 2007, vol. 40, pp. 2666-2670.

Liu, A., et al., "Quantum dot lasers for silicon photonics [Invited]," Photonics Research, vol. 3, No. 5, Oct. 2015.

"Liu, N., et al, "Infrared Perfect Absorber and Its Application As Plasmonic Sensor," Nano Lett. 10, 2342-2348, (2010).".

Kang, Y., "Monolithic Ge/Si Avalnache Photodiodes," 978-1-4244-4403, IEEE, (2009).

Liu, A.Y., et al., Quantum Dot Lasers on Silicon, aUCSB Materials Department, Santa Barbara, California, USA, bUCSB Department of Electrical and Computer Engineering, Santa Barbara, California, USA.

Logeeswaran et al. "A 14-ps full width at half maximum high-speed photoconductor fabricated with intersecting InP nanowires on an amorphous surface," Applied Physics A, vol. 91, 1-5., (2008).

Hu, L., et al. "Analysis of Optical Absorption in Silicon Nanowire Arrays for Photovoltaic Applications," Nano Lett. vol. 7, No. 11, 2007.

Meng, L., et al. "Polarization-sensitive perfect absorbers at near-infrared wavelengths," Optics Express, A111, Dec. 2012.

Molin, D. et al. "850-950nm WideBand OM4 Multimode Fiber for Next-Generation WDM Systems," OFC (2015).

Piels, et al., "40 GHz Si/Ge uni-traveling carrier waveguide phototiode", Journal of Lightwave Technology, 15908, (2014).

Fountaine, K., et al., "Near-unity broadband absorption designs for semiconducting nanowire arrays via localized radial mode excitation", vol. 22, No. Optics Express A930, May 5, 2014.

Feng, D., et al, "High-speed Ge photodetector monolithically integrated with large cross-section silicon-on-insulator waveguide," Applied Physics Letters 95, 261105 (2009).

Schaub, J.D., et al. "Resonant-Cavity-Enhanced High-Speed Si Photodiode Grown by Epitaxial Lateral Overgrowth," IIEE Photonics Technology Letters, vol. 11, No. 12, Dec. 1999.

Seyedi, M.A., et al., "Efficient Schottky-like junction GaAs nanowire photodetector with 9 GHz modulation bandwidth with large active area," Applied Physics Letters 105, 041105 (2014).

Piatek, S., "Physics and Operation of an MPPC," Tutorials, Hamanatsu Phototonics, Nov. 16, 2015; http://www.hamamatsu.com/us/en/community/optical_sensors/tutorials/physics_of_mppc/index.html?utm_source=googleplus&utm_medium=social&Utm_campaign=hc-social.

Garnett, E., et al. "Light Trapping in Silicon Nanowire Solar Cells", Nano Letters 2010, 10, pp. 1082-1087.

Tanus et al.; "High-performance 1200-nm InGaAs and 1300-nm InGaAsN quantum-well lasers by metalorganic chemical vapor deposition," Selected Topics in Quantum Electronics, IEEE Journal of Selected Topics in Quantum Electronics, vol. 9, Issue: 5 (2003).

Kelzenberg, et al., Enhanced absorption and carrier collection in Si wire arrays for photovoltaic applications, Nature Materials, vol. 9, Mar. 2010, p. 239-244. http://authors.library.caltech.edu/17688/.

Lin, et al., "Optical absorption enhancement in silicon nanowire and nanohole arrays for photovoltaic applications," Proceeding of SPIE, vol. 772, 77721G-1, (2010).

Chang-Hasnain, C., et al., "High contrast gratings for integrated optoelectrionics" Advances in Optics and Photonics vol. 4, (2012), pp. 379-440. http://www.eecs.berkeley.edu/Pubs/TechRpts/2014/EECS-2014-197.html.

Chu., H-J.,et al., "Wurtzite InP nanowire arrays grown by selective area MOCVD," Phys. Status Solidi vol. C 7, No. 10, (2010), p. 2494-2497.

Kang et al., "Epitaxially-grown Ge/Si avalanche photodiodes for 1.3µm light detection," Optics Express 9365, vol. 16, No. 13, Jun. 23, 2008.

E. D. Palik, Handbook of optical constants of solids. Orlando: Academic Press, 1985.

M. K. Emsley, O. Dosunmu, and M. S. Unlu, "High-speed resonant-cavity-enhanced silicon photodetectors on reflecting silicon-on-insulator substrates," IEEE Photonics Technology Letters, vol. 14, pp. 519-521, Apr. 2002.

E. Ozbay, M. S. Islam, B. Onat, M. Gokkavas, O. Aytur, G. Tuttle, et al., "Fabrication of high-speed resonant cavity enhanced Schottky photodiodes," IEEE Photonics Technology Letters, vol. 9, pp. 672-674, May 1997.

T. Knodl, H. K. H. Choy, J. L. Pan, R. King, R. Jager, G. Lullo et al., "RCE photodetectors based on VCSEL structures," IEE Photonics Technology Letters, vol. 11, pp. 1289-1291, Oct. 1999.

K. Kato, "Ultrawide-band/high-frequency photodetectors," IEEE Transactions on Microwave Theory and Techniques, vol. 47, pp. 1265-1281, Jul. 1999.

M. Amani, D. H. Lien, D. Kiriya, J. Xiao, A. Azcatl, J. Noh, et al., "Near-unity photoluminescence quantum yield in MoS2," Science, vol. 350, pp. 1065-1068, Nov. 27, 2015.

T. Mueller, F. N. A. Xia, and P. Avouris, "Graphene photodetectors for high-speed optical communications," Nature Photonics, vol. 4, pp. 297-301, May 2010.

L. Chen and M. Lipson "Ultra-low capacitance and high speed germanium photodetectors on silicon," Optics Express, vol. 17, pp. 7901-7906, May 11, 2009.

P. Kuang, S. Eyderman, M. L. Hsieh, A. Post, S. John, and S. Y. Lin "Achieving an Accurate Surface Profile of a Photonic Crystal for Near-Unity Solar Absorption in a Super Thin-Film Architecture," ACS Nano, vol. 10, pp. 6116-6124, Jun. 2016.

A. Mavrokefalos, S. E. Han, S. Yerci, M. S. Branham and G. Chen "Efficient Light Trapping in Inverted Nanopyramid Thin Crystalline Silicon Membranes for Solar Cell Applications," Nano Letters, vol. 12, pp. 2792-2796, Jun. 2012.

K. X. Z. Wang, Z. F. Yu, V. Liu, A. Raman, Y. Cui, and S. H. Fan, "Light trapping in photonic crystals," Energy & Environmental Science, vol. 7, pp. 2725-2738, Aug. 2014.

E. Garnett and P. D. Yang, "Light Trapping in Silicon Nanowire Solar Cells," Nano Letters, vol. 10, pp. 1082-1087, Mar. 2010.

S. E. Han and G. Chen "Optical Absorption Enhancement in Silicon Nanohole Arrays for Solar Photovoltaics," Nano Letters, vol. 10, pp. 1012-1015, Mar. 2010.

Y. Park, E. Drouard, O. El Daif, X. Letartre, P. Viktorovotich, A. Fave et al., "Absorption enhancement using photonic crystals for silicon thin film solar cells," Optics Express, vol. 17, pp. 14312-14321, Aug. 3, 2009.

C. Yeh and F. I. Shimabukuro "The essence of dielectric waveguides". New York ; London: Springer, 2008.

Hideyuki Nasu et al, 1.3-Tb/s VCSEL-Based On-Board Parallel-Optical Transceiver Module for High-Density Optical Interconnects, Journal of Lightwave Technology, vol. 31, No. XX Jan. 2018.

Molly Piels et al., 40 GHz Si/Ge uni-traveling carrier waveguide photodiode, Journal of Lightwave Technology, 2013, pp. 1-7.

Cristiano Niclass et al., A 0.18- m CMOS SoC for a 100-m-Range 10-Frame/s 200 96-Pixel Time-of-Flight Depth Sensor, IEEE Journal of Solid-State Circuits, vol. 49, No. 1, Jan. 2014, pp. 315-330.

Cristiano Niclass et al., A 0.18µm CMOS Single-Photon Sensor for Coaxial Laser Rangefinders, IEEE Asian Solid-State Circuits Conference Nov. 8-10, 2010 / Beijing, China.

Cristiano Niclass et al., A 100-m Range 10-Frame/s 340 96-Pixel Time-of-Flight Depth Sensor in 0.18- m CMOS, IEEE Journal of Solid-State Circuits, vol. 48, No. 2, Feb. 2013, pp. 559-572.

Sanggwon Lee et al., A Back-Illuminated Time-of-Flight Image Sensor with SOI-Based Fully Depleted Detector Technology for

(56) References Cited

OTHER PUBLICATIONS

LiDAR Application, Nov. 22, 2018, Proceedings 2018, 2, 798; doi:10.3390/proceedings2130798, pp. 1-4.
Z. Chen, R. Fan, X. Li, Z. Dong, Z. Zhou, G. Ye, D. Chen, Accuracy improvement of imaging lidar based on time-correlated single-photon counting using three laser beams, Optics Communications (2018), https://doi.org/10.1016/j.optcom.2018.08.017.
Ulrich Hofmann, MEMS mirror for low cost laser scanners, <URL: http://www.minfaros.eu>.
Frederic Laforce, Low noise optical receiver using Si APD, Proc. SPIE vol. 7212, 721210 (Feb. 6, 2009).
Hamamatsu Photonics K.K., Solid State Division, Technical Information SD-28 Characteristics and Use of Si APD (Avalanche Photodiode), May 2004.
Federica Villa et al., CMOS Imager With 1024 SPADs and TDCs for Single-Photon Timing, IEEE Journal of Selected Topics in Quantum Electronics, vol. 20, No. 6, Nov./Dec. 2014.
Chao Zhang et al., A CMOS SPAD Imager with Collision Detection and 128 Dynamically Reallocating TDCs for Single-Photon Counting and 3D Time-of-Flight Imaging, Sensors 2018, 18, 4016; doi:10.3390/s18114016.
Cristiano Niclass et al., Design and characterization of a 256x64-pixel single-photon imager in CMOS for a MEMSbased laser scanning time-of-flight sensor, May 2012 / vol. 20, No. 11 / Optics Express 11863-11881.
I. Węgrzecka et al,, Design and properties of silicon avalanche photodiodes, Opto-Electronics Review 12 (1), 95-104 (2004).
Hallman et al., Detection jitter of pulsed time-of-flight lidar with dual pulse triggering, Review of Scientific Instruments 85, 036105 (2014); doi: 10.1063/1.4868590.
Takashi Baba et al., Development of an InGaAs SPAD 2D array for flash LIDAR, Quantum Sensing and Nano Electronics and Photonics XV, edited by Manijeh Razeghi, Gail J. Brown, Jay S. Lewis, Giuseppe Leo, Proc. of SPIE vol. 10540, 105400L • © 2018 SPIE.
M. Saiful Islam et al., Distributed Balanced Photodetectors for Broad-Band Noise Suppression, IEEE Transactions on Microwave Theory and Techniques, vol. 47, No. 7, Jul. 1999.
Jean Benoit Heroux et al., Energy-Efficient 1060-nm Optical Link Operating up to 28 Gb/s, Journal of Lightwave Technology, vol. 33, No. 4, Feb. 15, 2015, pp. 733-740.
Se-Chul Park et al., A First Implementation of an Automated Reel-to-Reel Fluidic Self-Assembly Machine, https://doi.org/10.1002/adma.201401573, Jun. 27, 2014.
Jaehoon Chung et al., Fluidic Heterogeneous Microsystems Assembly and Packaging, Journal of Microelectromechanical Systems—Sep. 2006, p. 864-870.
Huei Pei Kuo et al., Free-space optical links for board-to-board interconnects, Appl Phys A (2009) 95: 955-965, DOI 10.1007/s00339-009-5144-z, Mar. 5, 2009.
Ghada Dushaq et al., Metal-germanium-metal photodetector grown on silicon using low temperature RF-PECVD, vol. 25, No. 25 | Dec. 11, 2017 | Optics Express 32110-32119.
D. Renker, Geiger-mode avalanche photodiodes, history, properties and problems, Nuclear Instruments and Methods in Physics Research A 567 (2006) 48-56.
Steven J. Koester et al., Ge-on-SOI-Detector/Si-CMOS-Amplifier Receivers for High-Performance Optical-Communication Applications, Journal of Lightwave Technology, vol. 25, No. 1, Jan. 2007.
Wissem Sfar Zaoui, Origin of the Gain-Bandwidth-Product Enhancement in Separate-Absorption-Charge-Multiplication Ge/Si Avalanche Photodiodes, 2009 OSA/OFC/NFOEC 2009.
Fuad E. Doany, High Density Optical Interconnects for High Performance Computing, OFC 2014 © OSA 2014.
Sungeun Jo et al., High resolution three-dimensional flash LIDAR system using a polarization modulating Pockels cell and a micro-polarizer CCD camera, vol. 24, No. 26 | Dec. 26, 2016 | Optics Express A1580-A1585.
High-Speed Germanium-on-SOI Lateral PIN Photodiodes, IEEE Photonics Technology Letters, vol. 16, No. 11, Nov. 2004, pp. 2547-2549.
Joris Van Kerrebrouck et al., High-Speed PAM4-Based Optical SDM Interconnects With Directly Modulated Long-Wavelength VCSEL, DOI 10.1109/JLT.2018.2875538, Journal of Lightwave Technology 2018.
Y. Wang et al., InP-based Balanced Photodiodes Heterogeneously Integrated on SOI Nano-Waveguides, 978-1-5090-1602-0/16/$31.00 © 2016 IEEE, pp. 237-240.
Yokogawa et al., IR sensitivity enhancement of CMOS Image Sensor with diffractive light trapping pixels, Scientific Reports | 7: 3832 | DOI:10.1038/s41598-017-04200-y, Jun. 19, 2017.
E. Simpanen et al., Long-Reach 1060 nm SM VCSEL—SMF Optical Interconnects, Optical Fiber Technology, vol. 44, p. 36-42. Aug. 2018.
Jean Benoit Héroux et al., Low power CMOS-driven 1060 nm multimode optical link, OFC 2014 © OSA 2014.
Yimin Kang et al., Monolithic germanium/silicon avalanche photodiodes with 340 GHz gain-bandwidth product, nature photonics, Published Online: Dec. 7, 2008 | DOI: 10.1038/NPHOTON.2008.247, pp. 59-63.
D. Knoll et al., Monolithically Integrated 25Gbit/sec Receiver for 1.55μm in Photonic BiCMOS Technology, 978-1-55752-993-0/14/$31.00 © 2014 Optical Society of America.
Claudio Piemonte et al., Overview on the main parameters and technology of modem Silicon Photomultipliers, Nuclear Inst. and Methods in Physics Research, A 926 (2019) 2-15.
Photodetectors for LiDAR, Hamamatsu, May 2017.
S. Vasile et al., Photon Detection with High Gain Avalanche Photodiode Arrays, IEEE Transactions on Nuclear Science, vol. 45, No. 3, Jun. 1998.
Jin-Sung Youn et al., A 12.5-Gb/s SiGe BiCMOS Optical Receiver with a Monolithically Integrated 850-nm Avalanche Photodetector, OFC/NFOEC Technical Digest © 2012 OSA.
Koichi Liyama, Silicon Lateral Avalanche Photodiodes Fabricated by Standard 0.18 um CMOS Process, ECOC 2009, Sep. 20-24, 2009, Vienna, Austria.
X. Li, et al., Silicon photodiodes with high photoconductive gain at room temperature, Feb. 27, 2012 / vol. 20, No. 5 / Optics Express 5518.
Seigo Ito et al., Small Imaging Depth LIDAR and DCNN-Based Localization for Automated Guided Vehicle, Sensors 2018, 18, 177; doi:10.3390/s18010177.
Maik Beer et al., SPAD-based flash LiDAR sensor with high ambient light rejection for automotive applications, Proceedings of SPIE, SPIEDigitalLibrary.org/conference-proceedings-of-spie, Event: SPIE OPTO, 2018, San Francisco, California, United States.
Fuad E. Doany, Terabit/Sec VCSEL-Based 48-Channel Optical Module Based on Holey CMOS Transceiver IC, Journal of Lightwave Technology, vol. 31, No. 4, Feb. 15, 2013.
Patrick Runge, Waveguide Integrated Balanced Photodetectors for Coherent Receivers, IEEE Journal of Selected Topics in Quantum Electronics, vol. 24, No. 2, Mar./Apr. 2018.
Shiyang Zhu et al., Waveguided Ge/Si Avalanche Photodiode With Separate Vertical SEG-Ge Absorption, Lateral Si Charge, and Multiplication Configuration, IEEE Electron Device Letters, vol. 30, No. 9, Sep. 2009.
Frey et al. "Enhancing Near-Infrared Photodetection Efficiency in SPAD With Silicon Surface Nanostructuration" Journal of the Electron Devices Society, Published Feb. 28, 2018.

\* cited by examiner

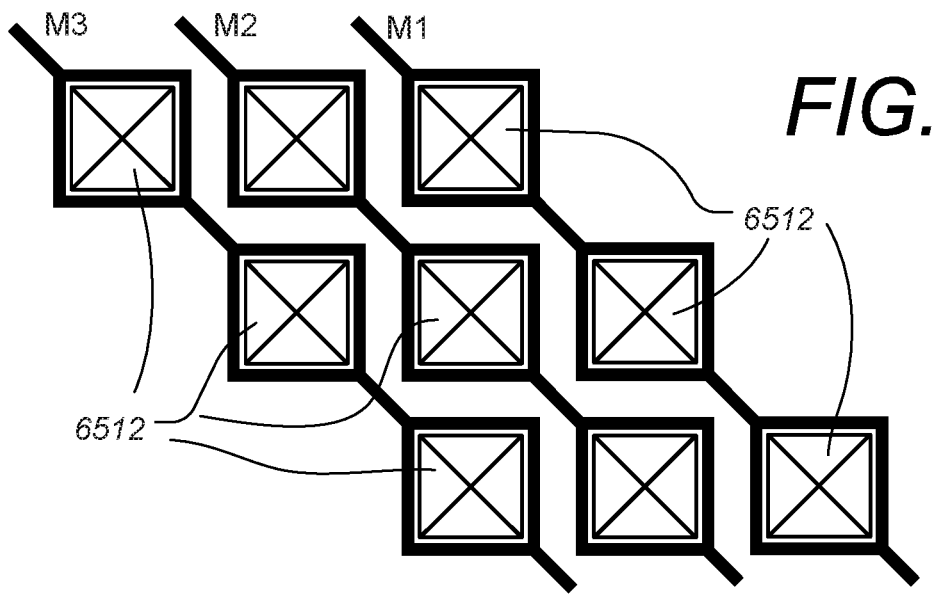
FIG. 65A
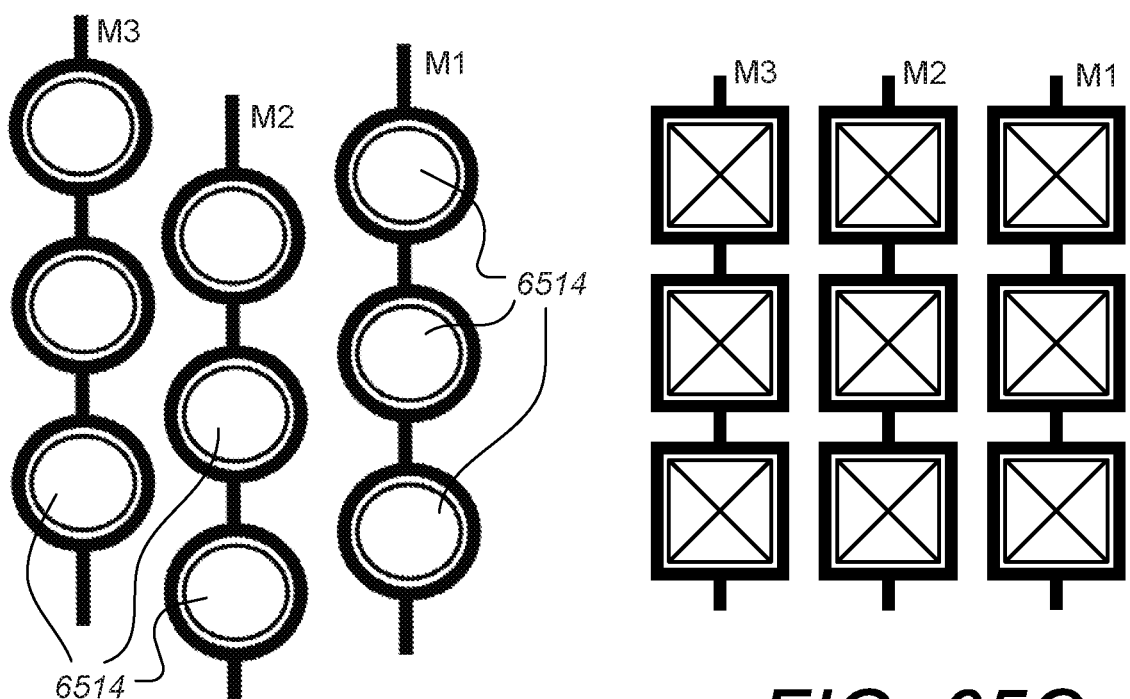
FIG. 65B
FIG. 65C

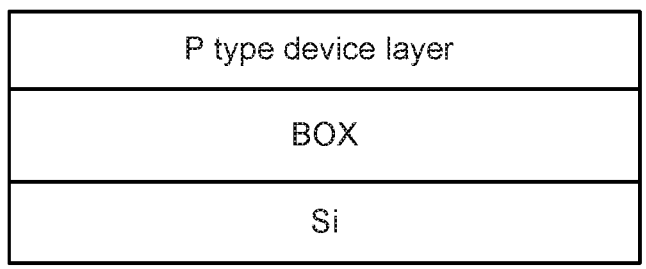
FIG. 68A
FIG. 68B
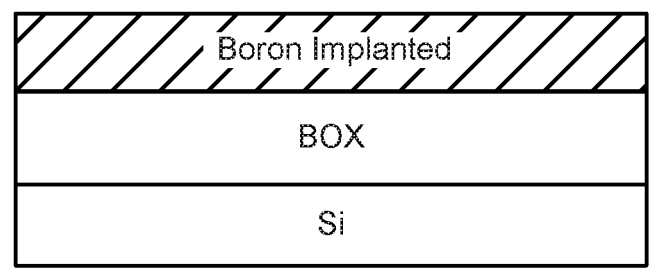
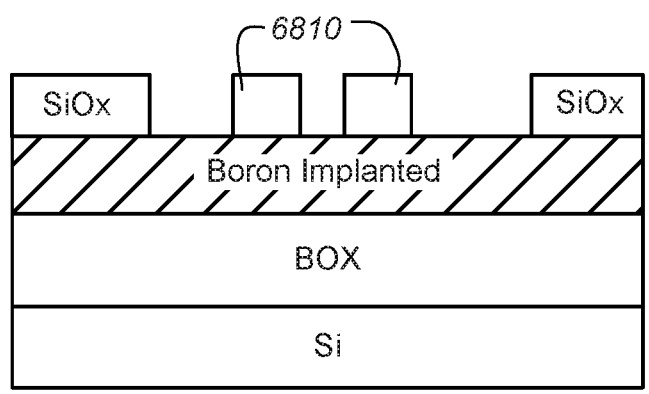
FIG. 68C
FIG. 68D
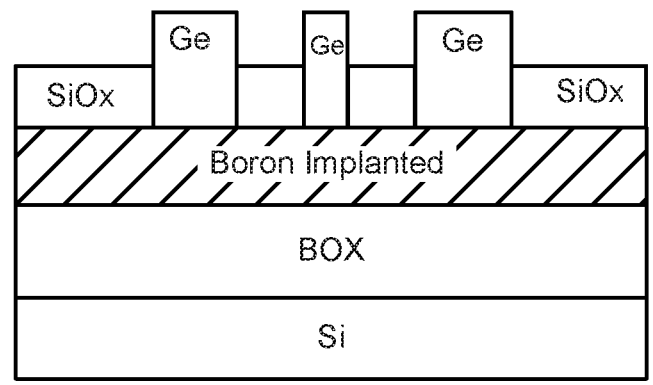

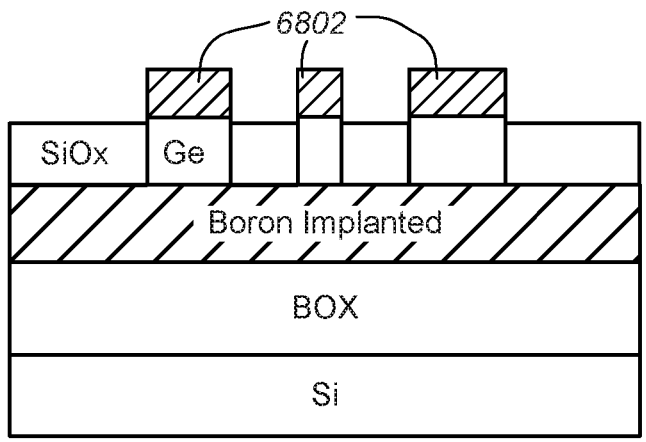
FIG. 68E
FIG. 68F
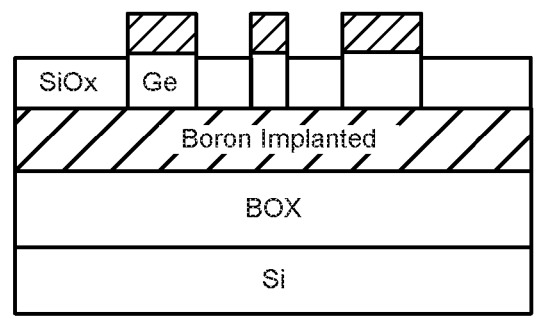
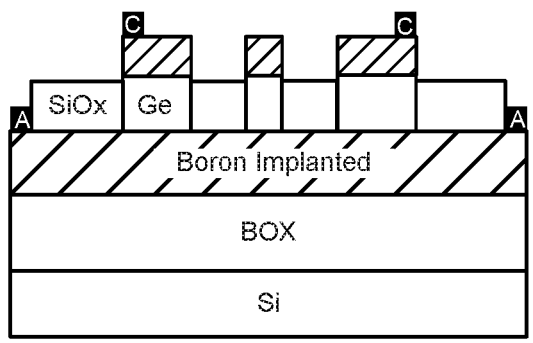
FIG. 68G
FIG. 68H
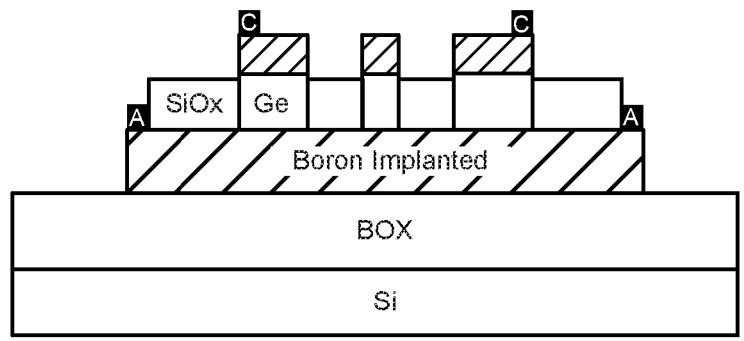

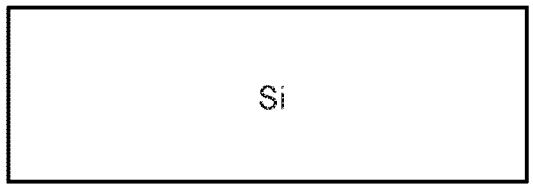
FIG. 69A
FIG. 69B
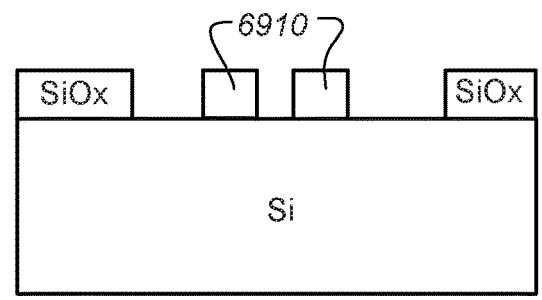
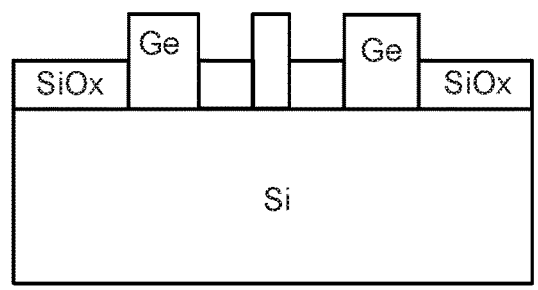
FIG. 69C
FIG. 69D
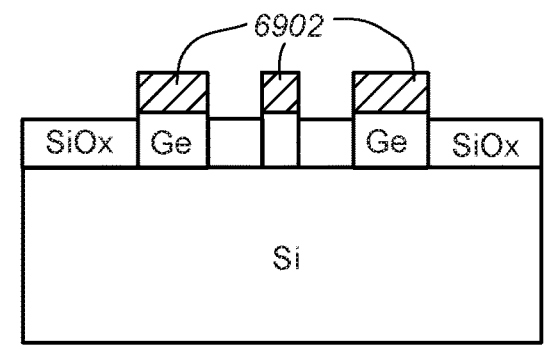

| 7106 | P-Si layer 1-40ohm-cm |
FIG. 71A
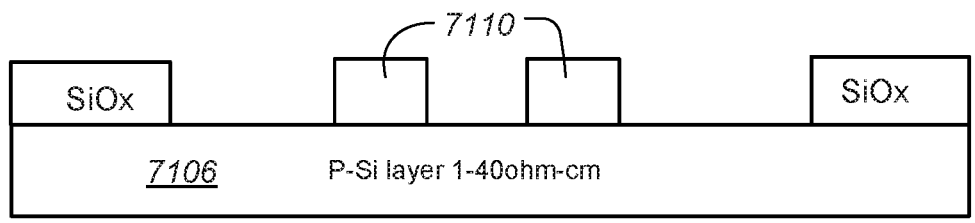
FIG. 71B
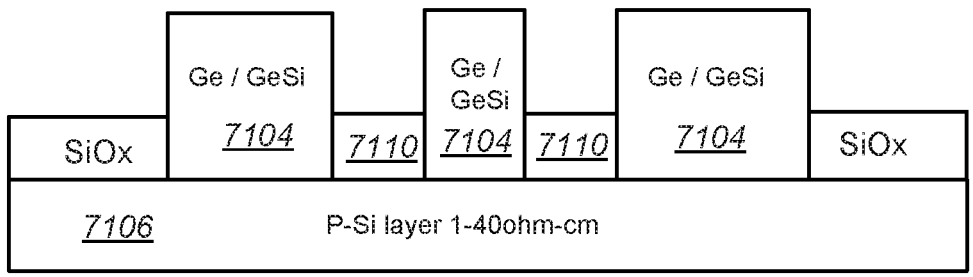
FIG. 71C

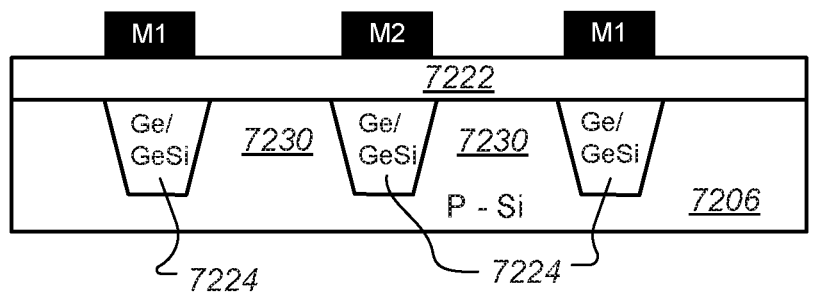
FIG. 72E
FIG. 72F
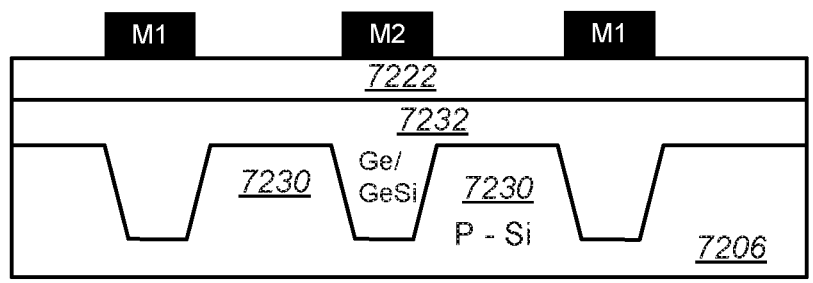
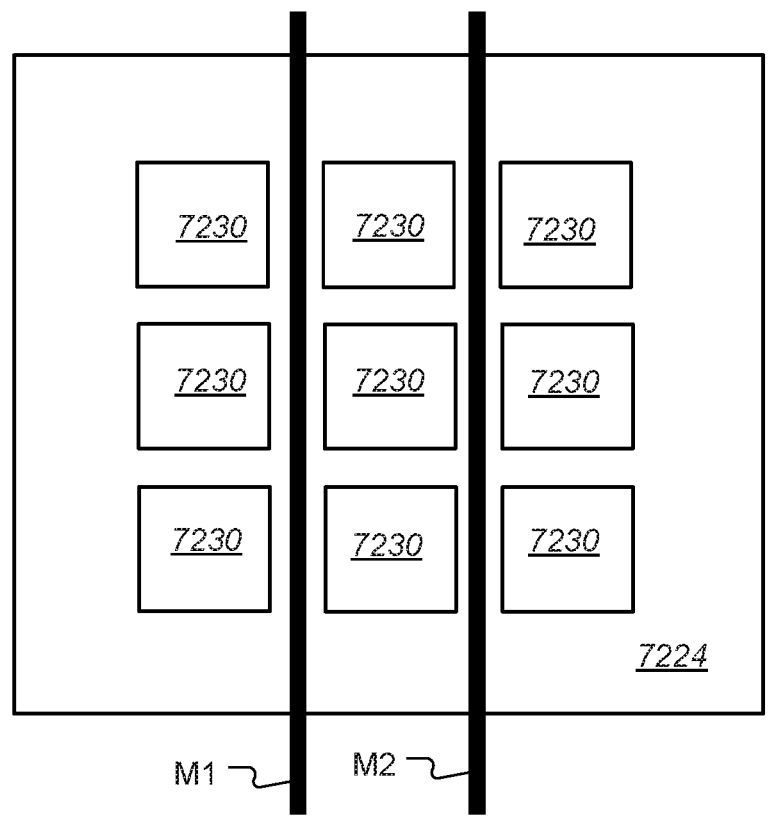
FIG. 72G

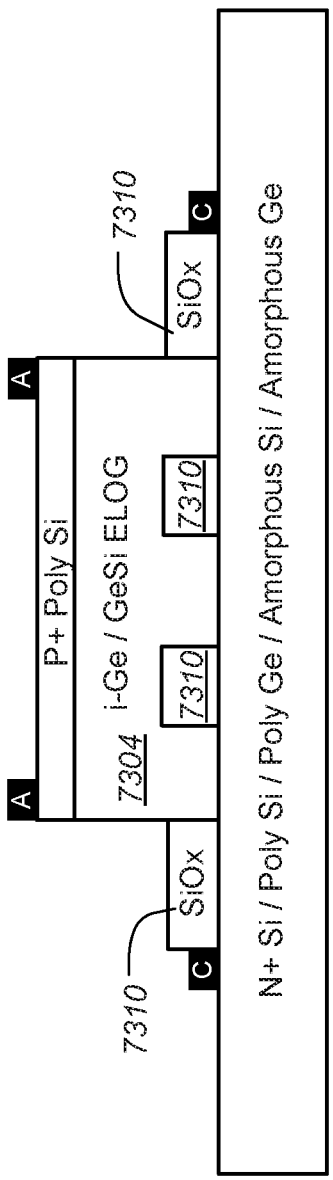
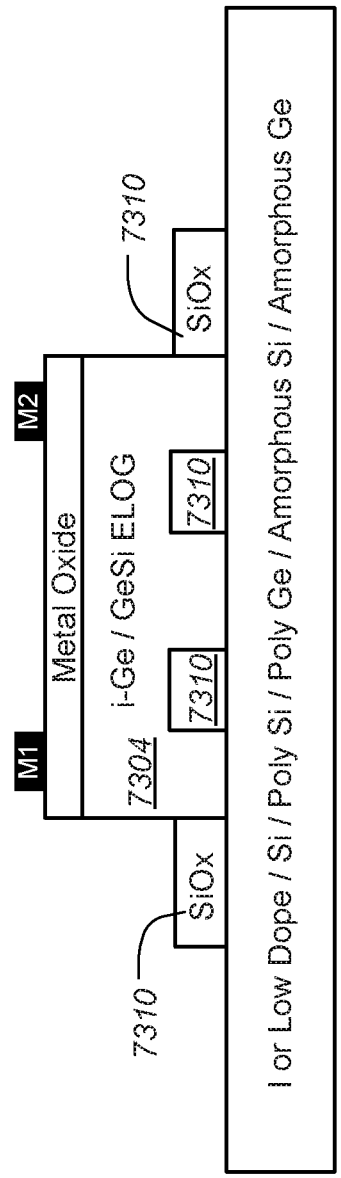
FIG. 73A
FIG. 73B

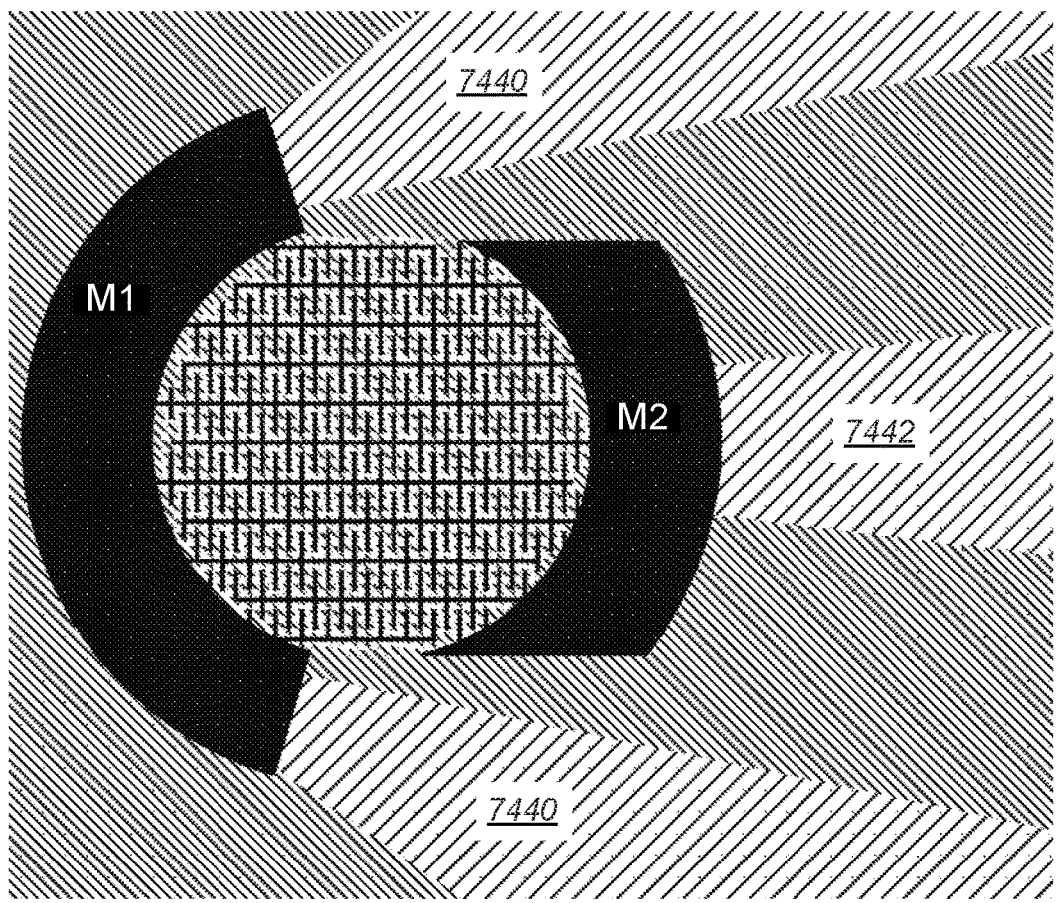
FIG. 74A
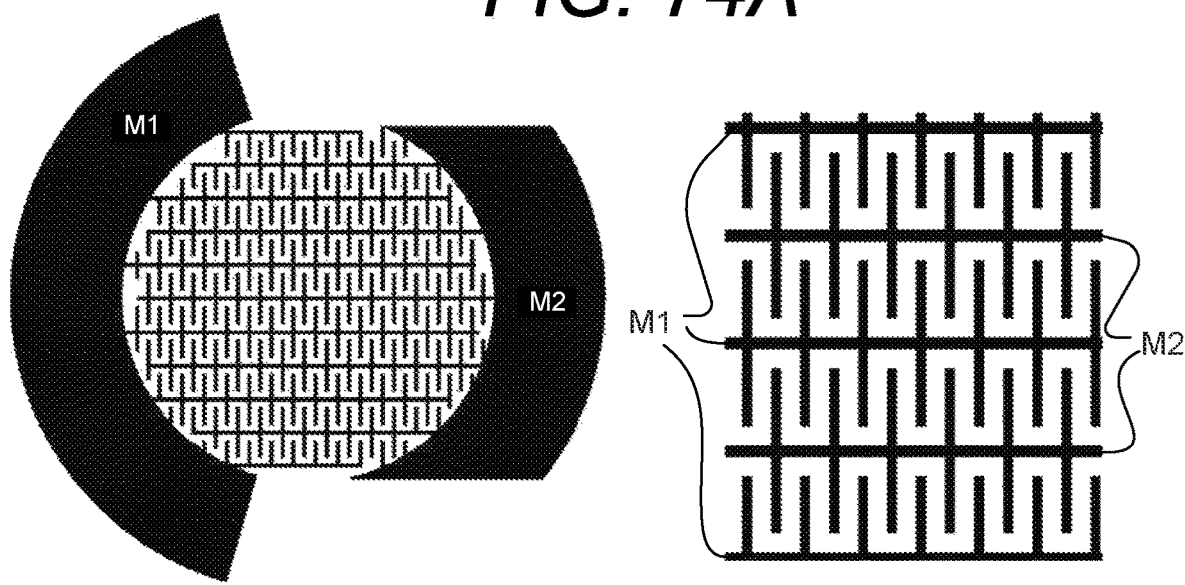
FIG. 74B
FIG. 74C

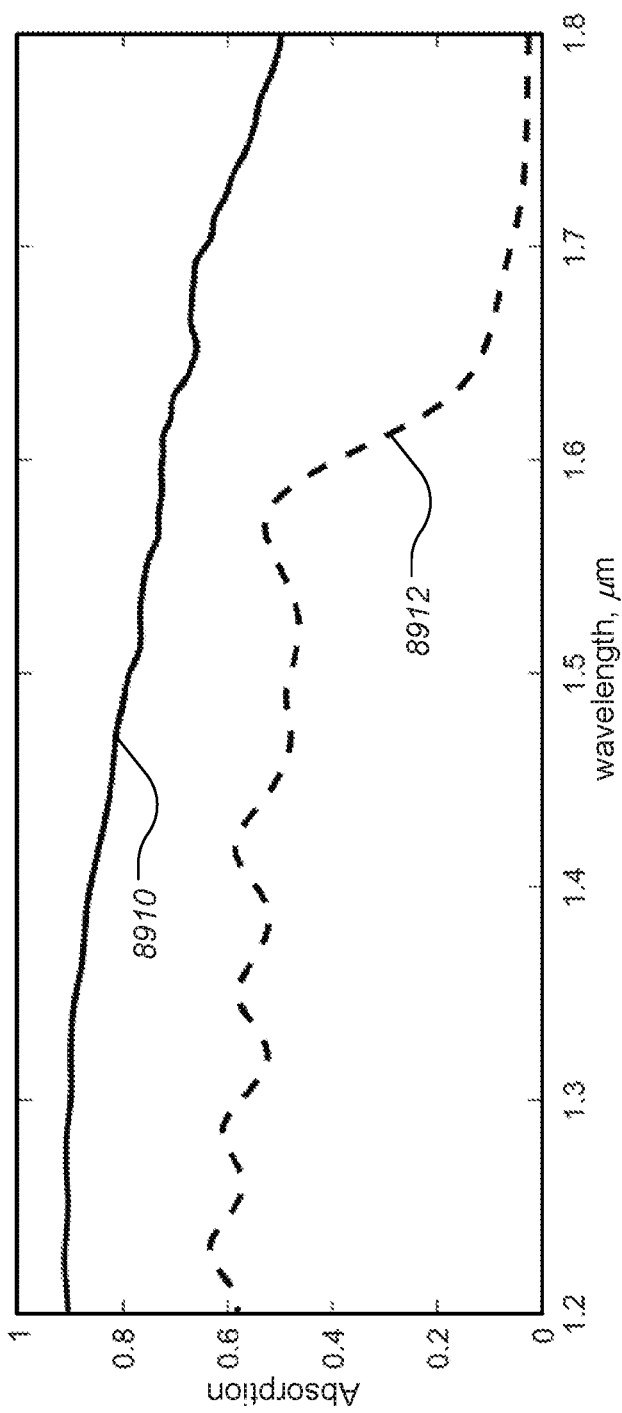
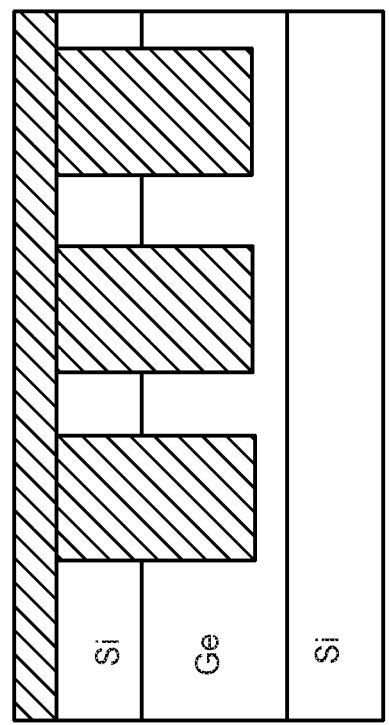
FIG. 89A
FIG. 89B

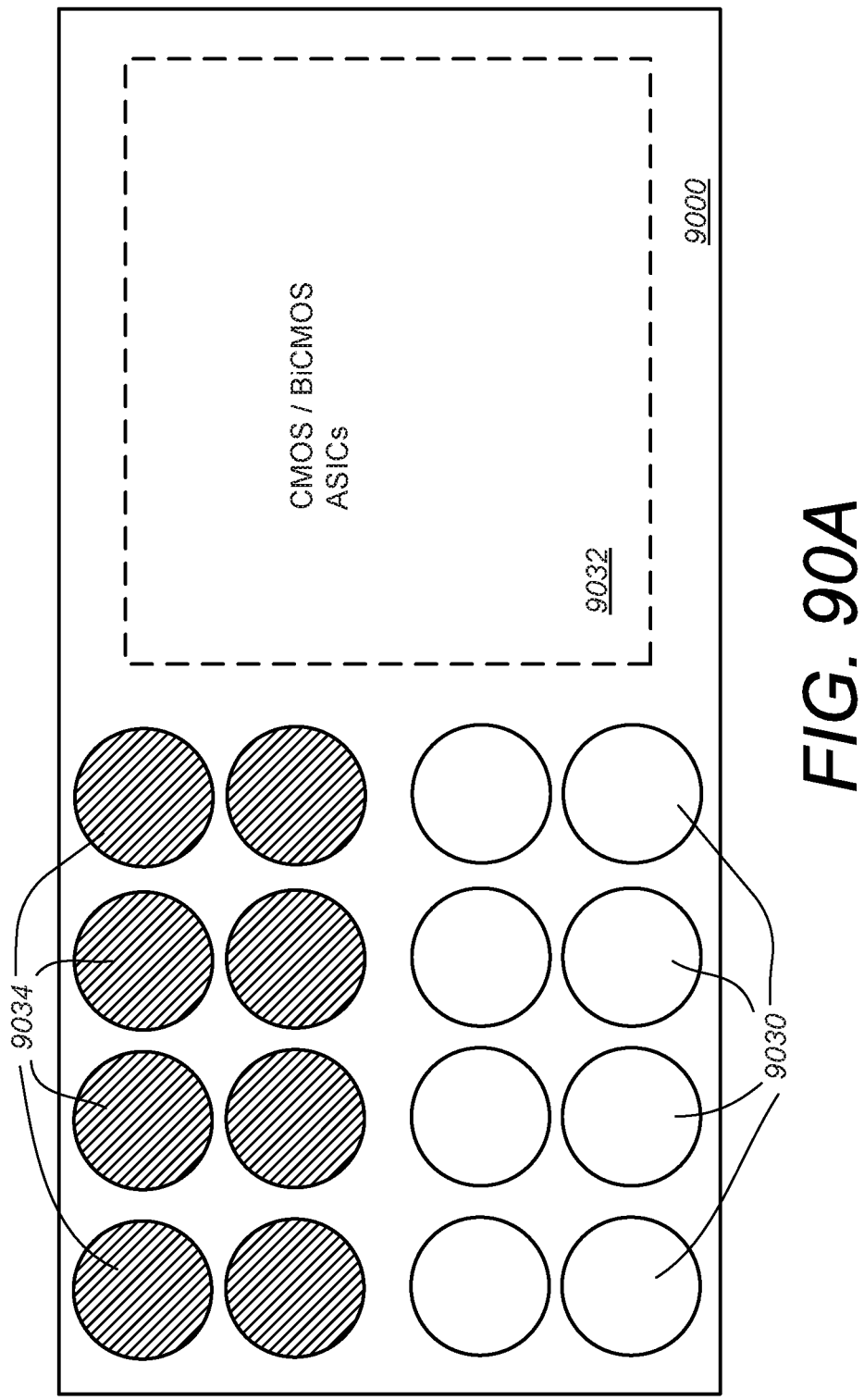

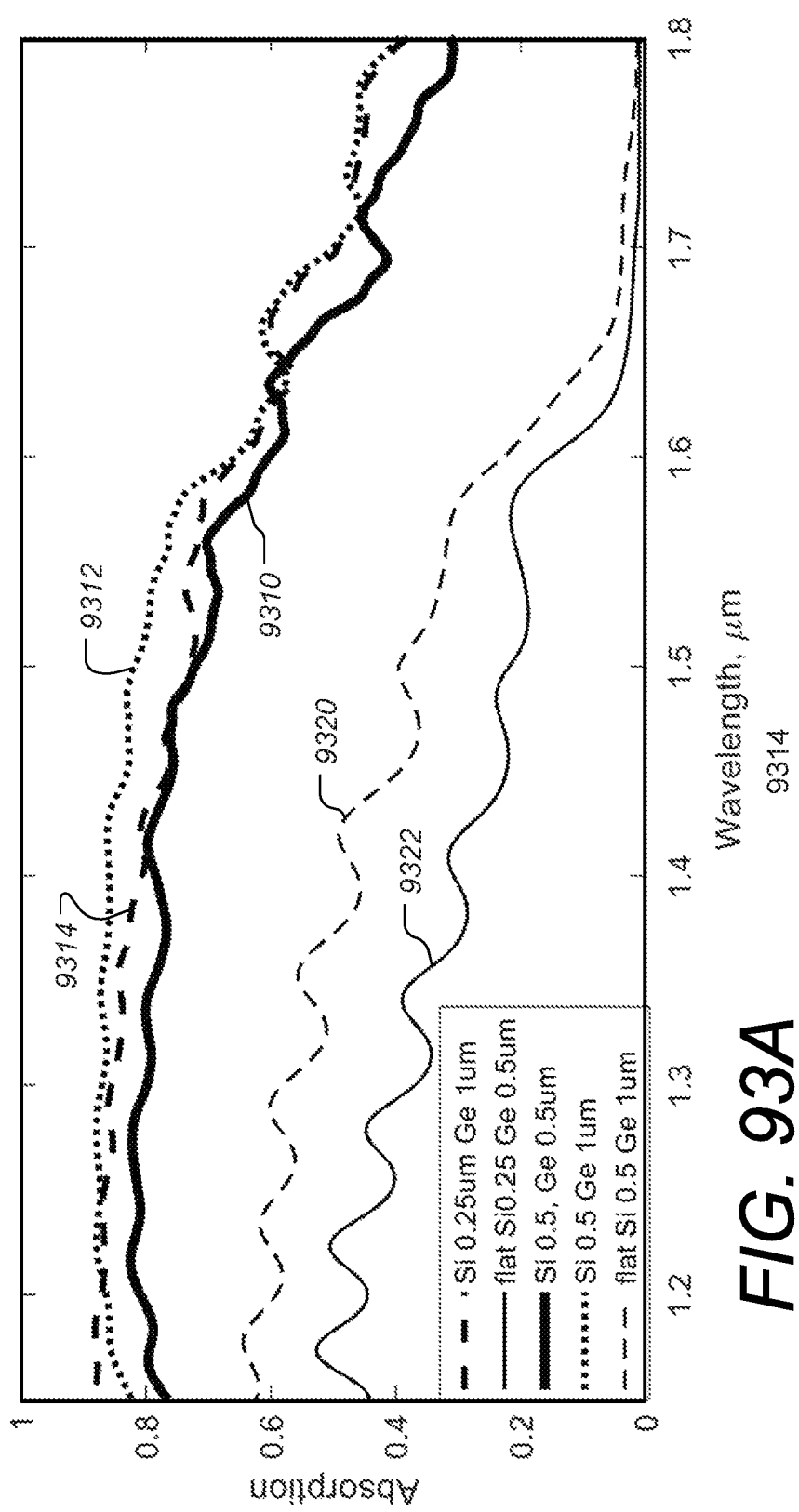
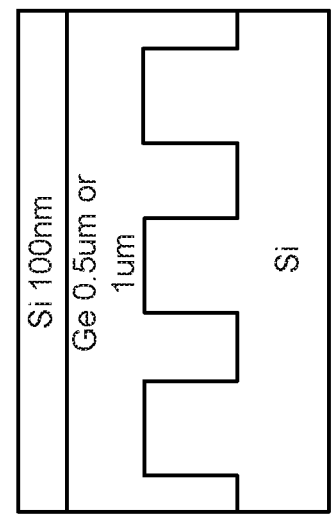
FIG. 93A
FIG. 93B

MICROSTRUCTURE ENHANCED ABSORPTION PHOTOSENSITIVE DEVICES

REFERENCE TO RELATED APPLICATIONS

This application is a continuation-in-part of U.S. patent application Ser. No. 15/797,821 filed Oct. 30, 2017 which is a continuation-in-part of each of:
  U.S. patent application Ser. No. 15/309,922, now U.S. Pat. No. 9,818,893, which is a § 371 national stage of International Patent Appl. No. PCT/US15/061120 filed Nov. 17, 2015;
  U.S. patent application Ser. No. 14/947,718 filed Nov. 20, 2015; and
  International Patent Appl. No. PCT/US16/67977 filed Dec. 21, 2016 published as WO 2017/112747.

This application incorporates by reference and claims the benefit of the filing date of each of the above-identified patent applications, as well as of the applications that they incorporate by reference, directly or indirectly, and the benefit of which they claim, including U.S. provisional applications, U.S. non-provisional applications, and International applications.

Said application Ser. No. 15/309,922 is a continuation of each of (i) U.S. patent application Ser. No. 14/943,898 (now U.S. Pat. No. 9,530,905), (ii) U.S. patent application Ser. No. 14/945,003 (now U.S. Pat. No. 9,525,084), and is a § 371 national stage of International Patent Appl. No. PCT/US15/061120, and incorporates each by reference and claims the benefit of the filing date of each as well as of each of the U.S. Provisional Patent applications the benefit of which they claim, including:
  U.S. Prov. Ser. No. 62/081,538 filed Nov. 18, 2014;
  U.S. Prov. Ser. No. 62/090,879 filed Dec. 11, 2014;
  U.S. Prov. Ser. No. 62/100,025 filed Jan. 5, 2015;
  U.S. Prov. Ser. No. 62/111,582 filed Feb. 3, 2015;
  U.S. Prov. Ser. No. 62/139,511 filed Mar. 27, 2015;
  U.S. Prov. Ser. No. 62/153,443 filed Apr. 27, 2015;
  U.S. Prov. Ser. No. 62/154,675 filed Apr. 29, 2015;
  U.S. Prov. Ser. No. 62/157,876 filed May 6, 2015;
  U.S. Prov. Ser. No. 62/171,915 filed Jun. 5, 2015;
  U.S. Prov. Ser. No. 62/174,498 filed Jun. 11, 2015;
  U.S. Prov. Ser. No. 62/175,855 filed Jun. 15, 2015;
  U.S. Prov. Ser. No. 62/182,602 filed Jun. 21, 2015;
  U.S. Prov. Ser. No. 62/188,876 filed Jul. 6, 2015;
  U.S. Prov. Ser. No. 62/197,120 filed Jul. 27, 2015;
  U.S. Prov. Ser. No. 62/199,607 filed Jul. 31, 2015;
  U.S. Prov. Ser. No. 62/205,717 filed Aug. 15, 2015;
  U.S. Prov. Ser. No. 62/209,311 filed Aug. 24, 2015;
  U.S. Prov. Ser. No. 62/213,556 filed Sep. 2, 2015; and
  U.S. Prov. Ser. No. 62/232,716 filed Sep. 25, 2015.

Said application Ser. No. 14/947,718 is a continuation of International Patent Appl. No. PCT/US14/39208, published as WO 2014/190189, and incorporates each by reference and claims the benefit of the filing date thereof and of each of the U.S. Provisional Patent applications the benefit of which it claims including:
  U.S. Prov. Ser. No. 61/826,446 filed May 22, 2013;
  U.S. Prov. Ser. No. 61/834,873 filed Jun. 13, 2013;
  U.S. Prov. Ser. No. 61/843,021 filed Jul. 4, 2013; and
  U.S. Prov. Ser. No. 61/905,109 filed Nov. 15, 2013.

U.S. application Ser. No. 14/892,821, now U.S. Pat. No. 9,496,435, is a national stage application of said PCT/US14/39208.

Said International Patent Appl. No. PCT/US16/67977 claims the benefit of the filing date of each of the following U.S. Provisional Patent applications:
  U.S. Prov. Ser. No. 62/270,577 filed Dec. 21, 2015;
  U.S. Prov. Ser. No. 62/290,391 filed Feb. 2, 2016;
  U.S. Prov. Ser. No. 62/304,907 filed Mar. 7, 2016;
  U.S. Prov. Ser. No. 62/334,934 filed May 11, 2016;
  U.S. Prov. Ser. No. 62/338,263 filed May 18, 2016;
  U.S. Prov. Ser. No. 62/346,850 filed Jun. 7, 2016;
  U.S. Prov. Ser. No. 62/359,349 filed Jul. 7, 2016;
  U.S. Prov. Ser. No. 62/366,188 filed Jul. 25, 2016;
  U.S. Prov. Ser. No. 62/368,109 filed Jul. 28, 2016;
  U.S. Prov. Ser. No. 62/374,828 filed Aug. 13, 2016;
  U.S. Prov. Ser. No. 62/376,869 filed Aug. 18, 2016;
  U.S. Prov. Ser. No. 62/380,364 filed Aug. 27, 2016;
  U.S. Prov. Ser. No. 62/383,391 filed Sep. 3, 2016;
  U.S. Prov. Ser. No. 62/383,479 filed Sep. 4, 2016;
  U.S. Prov. Ser. No. 62/394,222 filed Sep. 14, 2016;
  U.S. Prov. Ser. No. 62/398,607 filed Sep. 23, 2016;
  U.S. Prov. Ser. No. 62/401,126 filed Sep. 28, 2016;
  U.S. Prov. Ser. No. 62/406,999 filed Oct. 12, 2016;
  U.S. Prov. Ser. No. 62/414,671 filed Oct. 29, 2016; and
  U.S. Prov. Ser. No. 62/415,339 filed Oct. 31, 2016.

Said application Ser. No. 15/797,821 claims the benefit of and incorporates by reference each of the following provisional applications:
  U.S. Prov. Ser. No. 62/465,734 filed Mar. 1, 2017;
  U.S. Prov. Ser. No. 62/474,179 filed Mar. 21, 2017;
  U.S. Prov. Ser. No. 62/484,474 filed Apr. 12, 2017;
  U.S. Prov. Ser. No. 62/487,606 filed Apr. 20, 2017;
  U.S. Prov. Ser. No. 62/488,998 filed Apr. 24, 2017;
  U.S. Prov. Ser. No. 62/500,581 filed May 3, 2017;
  U.S. Prov. Ser. No. 62/505,974 filed May 14, 207;
  U.S. Prov. Ser. No. 62/509,093 filed May 20, 2017;
  U.S. Prov. Ser. No. 62/510,249 filed May 23, 2017;
  U.S. Prov. Ser. No. 62/514,889 filed Jun. 4, 2017;
  U.S. Prov. Ser. No. 62/521,504 filed Jun. 18, 2017;
  U.S. Prov. Ser. No. 62/522,169 filed Jun. 20, 2017;
  U.S. Prov. Ser. No. 62/527,962 filed Jun. 30, 2017;
  U.S. Prov. Ser. No. 62/530,281 filed Jul. 9, 2017;
  U.S. Prov. Ser. No. 62/533,078 filed Jul. 16, 2017;
  U.S. Prov. Ser. No. 62/533,603 filed Jul. 17, 2017;
  U.S. Prov. Ser. No. 62/535,801 filed Jul. 21, 2017;
  U.S. Prov. Ser. No. 62/540,524 filed Aug. 2, 2017;
  U.S. Prov. Ser. No. 62/542,243 filed Aug. 7, 2017;
  U.S. Prov. Ser. No. 62/547,728 filed Aug. 18, 2017;
  U.S. Prov. Ser. No. 62/553,844 filed Sep. 2, 2017;
  U.S. Prov. Ser. No. 62/556,426 filed Sep. 10, 2017; and
  U.S. Prov. Ser. No. 62/561,869 filed Sep. 22, 2017.

This patent application claims the benefit of and incorporates by reference each of the following provisional applications:
  U.S. Prov. Ser. No. 62/535,801 filed Jul. 21, 2017;
  U.S. Prov. Ser. No. 62/540,524 filed Aug. 2, 2017;
  U.S. Prov. Ser. No. 62/542,243 filed Aug. 7, 2017;
  U.S. Prov. Ser. No. 62/547,728 filed Aug. 18, 2017;
  U.S. Prov. Ser. No. 62/553,844 filed Sep. 2, 2017;
  U.S. Prov. Ser. No. 62/556,426 filed Sep. 10, 2017;
  U.S. Prov. Ser. No. 62/561,869 filed Sep. 22, 2017;
  U.S. Prov. Ser. No. 62/591,072 filed Nov. 27, 2017
  U.S. Prov. Ser. No. 62/599,246 filed Dec. 15, 2017
  U.S. Prov. Ser. No. 62/607,860 filed Dec. 19, 2017
  U.S. Prov. Ser. No. 62/615,314 filed Jan. 9, 2018
  U.S. Prov. Ser. No. 62/623,971 filed Jan. 30, 2018
  U.S. Prov. Ser. No. 62/628,764 filed Feb. 9, 2018
  U.S. Prov. Ser. No. 62/631,630 filed Feb. 17, 2018
  U.S. Prov. Ser. No. 62/633,514 filed Feb. 21, 2018
  U.S. Prov. Ser. No. 62/634,692 filed Feb. 23, 2018
  U.S. Prov. Ser. No. 62/637,945 filed Mar. 2, 2018
  U.S. Prov. Ser. No. 62/639,356 filed Mar. 6, 2018

U.S. Prov. Ser. No. 62/639,472 filed Mar. 6, 2018
U.S. Prov. Ser. No. 62/639,920 filed Mar. 7, 2018
U.S. Prov. Ser. No. 62/640,522 filed Mar. 8, 2018
U.S. Prov. Ser. No. 62/643,010 filed Mar. 14, 2018
U.S. Prov. Ser. No. 62/645,810 filed Mar. 21, 2018
U.S. Prov. Ser. No. 62/646,871 filed Mar. 22, 2018
U.S. Prov. Ser. No. 62/651,053 filed Mar. 30, 2018;
U.S. Prov. Ser. No. 62/651,087 filed Mar. 31, 2018;
U.S. Prov. Ser. No. 62/652,830 filed Apr. 4, 2018;
U.S. Prov. Ser. No. 62/659,067 filed Apr. 17, 2018;
U.S. Prov. Ser. No. 62/659,072 filed Apr. 17, 2018;
U.S. Prov. Ser. No. 62/662,217 filed Apr. 24, 2018;
U.S. Prov. Ser. No. 62/666,005 filed May 2, 2018;
U.S. Prov. Ser. No. 62/669,194 filed May 9, 2018;
U.S. Prov. Ser. No. 62/675,130 filed May 22, 2018;
U.S. Prov. Ser. No. 62/677,609 filed May 29, 2018; and
U.S. Prov. Ser. No. 62/682,909 filed Jun. 9, 2018.

All of the above-referenced provisional and non-provisional patent applications are collectively referenced herein as "the commonly assigned incorporated applications."

FIELD

This patent specification relates mainly to photosensitive devices. More particularly, some embodiments relate to photosensitive devices having microstructure enhanced absorption characteristics and photosensitive devices monolithically integrated with active electronic circuits on or in the same chip.

BACKGROUND

Fiber-optic communication is widely used in applications such as telecommunications, communication within large data centers, and communications between data centers. Because of attenuation losses associated with using shorter optical wavelengths, most fiber-optic data communication uses optical wavelengths of 800 nm and longer. Commonly used multimode and single mode optical fiber uses wavelengths between 800 nm and 1675 nm. A main component of optical receivers used in fiber-optic communication system is the photo detector, usually in the form of a photodiode (PD) or avalanche photodiode (APD).

High-quality low-noise APDs can be made from silicon. However, while silicon will absorb light in the visible and near infrared range, it becomes more transparent at longer optical wavelengths. Silicon PDs and APDs can be made for optical wavelengths of 800 nm and longer by increasing the thickness of the absorption "I" region of the device. However, in order to obtain adequate quantum efficiency (also known as external quantum efficiency), the thickness of the silicon "I" region becomes so large that the device's maximum bandwidth (also referred to as "data rate") becomes too low for many current and future telecom and data center applications.

To avoid the inherent problem that silicon PDs and APDs have with longer wavelengths and higher bandwidths, other materials are used. Germanium (Ge) APDs detect infrared out to a wavelength of 2000 nm, but has relatively high multiplication noise. InGaAs APDs can detect out to longer than 1600 nm, and have less multiplication noise than Ge, but still far greater multiplication noise than silicon APDs. InGaAs is known to be used as the absorption region of a heterostructure diode, most typically involving InP as a substrate and as a multiplication layer. This material system is compatible with an absorption window of roughly 900 to 1700 nm. However, InGaAs PD and APD devices are relatively expensive and have relatively high multiplication noise when compared with silicon and are difficult to integrate with Si electronics as a single chip.

Information published by a major company in the business of photodetectors (See http://files.shareholder.com/downloads/FNSR/0x0x382377/0b3893ea-fb06-417d-ac71-84f2f9084b0d/Finisar_Investor_Presentation.pdf,) indicates at page 10 that the current market for optical communication devices is over 7 billion U.S. dollars with a compounded annual growth rate of 12%. Photodiodes (PD) used for 850-950 nm wavelength employ GaAs material and for 1550-1650 nm wavelength photodiodes are InP material based, which is both expensive and difficult to integrate with Si based electronics. Therefore, there is a large market and a long-felt need that has not been met for the development of a better device. To date there are no Si material based photodiodes nor avalanche photodiodes (APD) for 850-950 nm and no Ge on Si material based photodiodes nor avalanche photodiodes for 1550-1650 nm that are top-surface or bottom-surface illuminated, with a data rate of at least 25 Gb/s, and are monolithically integrated with CMOS/BiCMOS silicon electronics on a single chip that are commercially available, to the knowledge of the inventors herein. However, there has been no lack of trying to develop a better device for this large market. For example, there have been proposals for resonant photodiodes fabricated in Si material (see *Resonant-Cavity-Enhanced High-Speed Si Photodiode Grown by Epitaxial Lateral Overgrowth*, Schaub et al., IEEE PHOTONICS TECHNOLOGY LETTERS, VOL. 11, NO. 12, DECEMBER 1999), but they have not reached the known commercial market. Other forms of high speed photodiodes in a waveguide configuration have been proposed, such as in 40 *GHz Si/Ge uni-traveling carrier waveguide photodiode*, Piels et al, DOI 10.1109/JLT.2014.2310780, Journal of Lightwave Technology (incorporated herein by reference); *Monolithic germanium/silicon avalanche photodiodes with* 340 *GHz gain-bandwidth product*, NATURE PHOTONICS|VOL 3|January 2009|www.nature.com/naturephotonics (incorporated herein by reference and referred to herein as "Kang et al. 2009"); High-speed Ge photodetector monolithically integrated with large cross-section silicon-on-insulator waveguide, Feng et al., Applied Physics Letters 95, 261105 (2009), doi: 10.1063/1.3279129 (incorporated herein by reference); where light is coupled edge-wise into an optical waveguide and where the absorption length can be 100 um or longer to compensate for the weak absorption coefficient of Ge at 1550 nm. In these previously proposed waveguide photodiode structures, light propagates along the length of the waveguide and the electric field is applied across the PIN waveguide such that the direction of light propagation and the direction of the electric field are predominantly perpendicular in this waveguide configuration. Since light in Si travels approximately 1000 times faster than the saturated velocity of electrons/holes, a waveguide PD can be 200 microns long for example and the "I" in the PIN can be 2 microns, for example, and achieve a bandwidth of over 10 Gb/s. Such edge coupling of light is costly in packaging as compared to surface illumination as described in this patent specification, where dimensions of the cross-section in the direction of light propagation are typically a few microns as compared to tens of microns for known surface illuminated photodiodes or avalanche photodiodes. Known waveguide PD/APD are often only single mode optical systems whereas surface illuminated PD/APD described in this patent specification can be used in both single and multimode optical systems. In addition, known waveguide photodiodes are difficult to test at wafer level, whereas surface illuminated photodiodes described in this patent specification can be easily tested at wafer level. Known waveguide photodiodes/ avalanche photodiodes are used mostly in specialty photonic circuits and in many cases require careful temperature control, which can be costly and inefficient in a hostile data center environment. A top or bottom illuminated Si and Ge on Si or GeSi on Si PD/APD that can be integrated with Si is not known to the inventors herein to be commercially available at data rates of 25 Gb/s or more at wavelengths of 850-950 nm, 1250-1350 nm and 1550-1650 nm. In contrast, photodiodes on Si based material, as described in this patent specification, can be monolithically integrated with integrated electronic circuits on a single Si chip, thereby significantly reducing the cost of packaging. In addition, the microstructured PD/APD at 850 nm, 1300 nm and 1550 nm nominal wavelengths described in this patent specification can be predominantly for short haul (short reach), medium haul (reach gap) and long haul (long reach), distances less than 300 meters, in certain cases less than 2000 meters, in certain cases less than 10000 meters and in certain cases greater than 10000 meters optical data transmission. The microstructured PD/APD direction of incident optical beam and the electric field in the "I" region of a PIN or NIP structure, can be predominately collinear and/or almost collinear. In lateral PDs and APDs described in this patent specification, the electric field and light propagation can be in different direction, but the absorption layer can still be much thinner than in devices known to the inventors herein for comparable data rate and/or absorption and quantum efficiency. This patent specification enables such a device and is expected to transform the current data centers to almost all optical data transmission between blades, within a blade, between racks and/or between data centers, that will vastly increase the data transmission bandwidth capabilities and significantly reduce electrical power usage.

The subject matter claimed herein is not limited to embodiments that solve any specific disadvantages or that operate only in environments such as those described above. Rather, this background is only provided to illustrate one exemplary technology area where some embodiments described herein may be practiced.

Each published document referenced in this patent specification is hereby incorporated by reference.

SUMMARY

According to some embodiments, a lateral microstructure-enhanced photodetector comprises: one or more laterally extending, non-doped or low-doped I-layers of semiconductor material; interdigitated electrodes that are laterally spaced from each other and are electrically coupled with said one or more I-layers and configured to produce a laterally extending electrical field therein; a microstructure comprising a laterally extending multiplicity of deliberately formed holes in said photodetector; wherein: said one or more I-layers are continuous except for any penetration thereof by said holes; said holes have heights in a direction transverse to said I-layers; said photodetector is configured to respond to illumination with spatially continuous light at each of one or more regions each encompassing a multiplicity of said holes, in a direction transverse to said one or more I-layers, by producing an electrical output that depends on said illumination; and said holes enhance a desirable electrical response of said photodetector to said light in one or more selected wavelength ranges compared to an electrical response of an otherwise same photodetector without said holes.

According to some embodiments: the photodetector can further include a monolithic chip and one or more active electronic circuits monolithically integrated with said photodetector on or in said chip and electrically coupled with said electrodes to receive and process said electrical output; the active electronic circuits can be plural (two or more such circuits on or in the same chip); in addition, one or more light emitting devices can be mounted to the same chip and coupled to the one or more active electronic circuits on or in the chip to be driven thereby; at least some of said holes can be laterally between said electrodes; said electrodes can overlie at least some of said holes; the photodetector can further include a cover layer over said one of more I-layers, and said holes can be only in said cover layer; said holes can extend only partway down from a top surface of said one of more I-layers; said one or more I-layers can have a top surface and a bottom surface and said holes can extend down from said top to said bottom surface; said holes can comprise islands of dielectric material laterally spaced from each other by said semiconductor material of said I-layers, formed by processes such as etching or deposition; said one or more I-layers can have a bottom surface and at least some of said holes can extend from said bottom surface up into said one or more I-layers and can comprise material with electrical properties different from those of said one or more I-layers; some of said holes can extend into said one or more I-layers down from said top surface and some of said holes can extend into said one or more I-layers up from said bottom surface; the holes can comprise a dielectric material; the holes can comprise a semiconductor with different electrical and/or optical properties from the semiconductor material of the one or more I-layers; said electrodes can comprise laterally extending conductors and doped semiconductor material regions thereunder, laterally spaced by said one or more I-layers and forming at least one PN junction in said photoconductor; the photodetector can further comprise at least one doped semiconductor region and said electrodes can comprise laterally extending conductors and additional doped semiconductor material regions under one or more of said conductors and in ohmic contact therewith, said doped regions being laterally spaced by said one or more I-layers and forming at least one PN junction in said photoconductor, where the materials forming the PN junction can touch; said electrodes can comprise laterally extending conductors forming Schottky junctions in said photodetector; at least two of said electrodes can differ from each other in vertical position relative to a top surface of said one or more I-layers; said electrodes and said one or more I-layers can have top and/or bottom surfaces that are substantially at the same level(s); the photoconductor can further include a layer of a light-absorbing material over at least portions of said electrodes; the photoconductor can further include a layer of a light-absorbing material over at least portions of said electrodes; the light-absorbing layer can have a nono-structured top surface; the light-absorbing layer with a nono-structured top surface can be over at least portions of both the electrodes and the one or more I-layers; and/or the photoconductor can further include a layer of doped semiconductor over at least a portion of said one or more I-layers, forming one or more PN junctions in said photodetector, where the materials forming the PN junction can touch.

According to some embodiments, a microstructure-enhanced photodetector comprises: one or more laterally extending, non-doped or low-doped I-layers of semiconductor material; spaced-apart electrodes electrically coupled with said one or more I-layers and configured to produce an electrical field therein; a microstructure comprising a laterally extending multiplicity of deliberately formed holes in said photodetector; wherein: said one or more I-layers are continuous except for any penetration thereof by said holes; said photodetector is configured to respond to illumination with spatially continuous light at each of one or more regions each encompassing a multiplicity of said holes, in a direction transverse to said one or more I-layers, by producing an electrical output that depends on said illumination; and said holes enhance a desirable electrical response of said photodetector to said light in one or more selected wavelength ranges compared to an electrical response of an otherwise same photodetector without said holes.

According to some embodiments, the photodetector described in the preceding paragraph is configured: for said electrical field to extend in directions transverse to said one or more I-layers in some examples; for said electrical field to extend in laterally in some examples; to further include a monolithic chip and one or more active electronic circuits monolithically integrated with said photodetector on or in said chip and electrically coupled with said electrodes to receive and process said electrical output; to include further a monolithic chip and plural active electronic circuits monolithically integrated with said photodetector on or in said chip and electrically coupled with said electrodes to receive and process said electrical output; to include further a monolithic chip and plural electronic circuits monolithically integrated with said photodetector on or in said chip and electrically coupled with said electrodes to receive and process said electrical output, and one or more light emitting devices mounted to said single chip and coupled to one or more active electronic circuits to be driven thereby; to include further a cover layer over said one of more I-layers, and wherein said holes are only in said cover layer; to include said holes such that they extend only partway down from a top surface of said one of more I-layers; to provide for said one or more I-layers a top surface and a bottom surface and to extend said holes down from said top to said bottom surface; to include said holes in the form of islands of solid material having electrical and/or optical properties different from those of said one or more I-layers, said islands being laterally spaced from each other by said semiconductor material of said I-layers, wherein at least some of said islands are formed by processes such as etching or deposition and at least some of the material of said one of more I-layers is formed by epitaxial growth over said islands; to form said one or more I-layers with a bottom surface and to extend at least some of said holes from said bottom surface up into said one or more I-layers; to provide said one or more I-layers with a top surface and a bottom surface and to extend some of said holes into said one or more I-layers down from said top surface and to extend some of said holes into said one or more I-layers up from said bottom surface; to include in said holes a solid dielectric material such an oxide; to include in at least some of the holes a semiconductor material that differs in electrical and/or optical properties from the material of the one or more I-layers; to further include an upper layer above said one or more I-layer and a lower layer under said one or more I-layers, wherein said upper layer and lower layer are doped more than said one or more I-layers, and wherein said electrodes electrically contact said upper and lower layers; to further include an electrically conductive upper layer over said more doped upper layer and over said one or more I-layers and a lower layer that is under and more doped than said one or more I-layers, and wherein said electrodes make electrical contact with said upper layer and said lower layer and said conductive upper layer is configured to reduce a series resistance of said more doped upper layer; to further include a layer of material that is over said one or more I-layers and has a textured upper surface to reduce reflection of light illuminating said photodetector; to form at least one of the electrodes in a region under said one or more I-layers that also includes at least some of said holes; to form the photodetector as an avalanche photodetector; and/or to form said photodetector as plural photodetectors each having respective electrodes and a respective multiplicity of said holes, wherein one or more of said plural photodetectors at avalanche photodetectors.

According to some embodiments, the photodetector can comprise plural photodetectors each having respective electrodes and a respective multiplicity of said holes, and further including a monolithic chip and plural active electronic circuits monolithically integrated with said plural photodetectors on or in said chip and electrically coupled with said electrodes to receive and process said electrical output, and wherein said plural photodetectors are arranged in a pattern extending in at least two-dimensions and said electronic circuits also are arranged in a pattern expending in at least two dimensions. This applies to embodiments in which the electrodes are laterally spaced from each other and to embodiments in which they are not necessarily laterally spaced (for example, to vertical photoconductors).

Some embodiments pertain to a method of manufacturing a microstructure-enhanced photodetector comprising: providing one or more laterally extending, non-doped or low-doped I-layers of semiconductor material, plural electrodes electrically coupled with said one or more I-layers and configured to produce an electrical field therein, and a microstructure comprising a laterally extending multiplicity of deliberately formed holes in said photodetector; said providing step further comprising: forming said one or more I-layers as continuous layers except for any penetration thereof by said holes; configuring said photodetector to respond to illumination with spatially continuous light at each of one or more regions each encompassing a multiplicity of said holes, in a direction transverse to said one or more I-layers, by producing an electrical output that depends on said illumination; configuring said holes to enhance a desirable electrical response of said photodetector to said light in one or more selected wavelength ranges compared to an electrical response of an otherwise same photodetector without said holes; and monolithically integrating said photoconductor on or in a single chip with one or more active electronic circuits and electrically connecting said photodetector and said active electronic circuits for transfer of said electrical output to said circuits for processing thereby.

Some embodiments of the method further include: providing one or more additional photodetectors each comprising a laterally extending multiplicity of holes that enhance desirable electrical responses of said one or more additional photodetectors to light having selected wavelengths compared to otherwise same photodetectors without said holes and assembling said photodetectors on or in said chip and electrically connecting them with said one or more active electronic circuits; providing plural additional photodetectors each comprising a laterally extending multiplicity of holes that enhance desirable electrical responses of said one or more additional photodetectors to light having selected wavelengths compared to otherwise same photodetectors without said holes and fluidically assembling said photodetectors on or in said chip and electrically connecting them with said active electronic circuits; and/or forming at least some of said holes as island of a solid material that differs in electrical properties from said one or more I-layers and wherein forming at least some of said holes involves selective area growth and forming at least some of the material of said one or more I-layers employs epitaxial layer growth over said islands.

The term "hole" refers in this patent specification to a deliberately formed volume of material shaped and dimensions as specified, that differs from surrounding material in specified electrical and/or optical properties. The material of a hole can be solid, such as a semiconductor with such different electrical/optical properties, or a dielectric, or a gas such as air, or even vacuum. A hole can be into a top surface of a layer, or into a bottom surface, or can be an internal volume that is between a top layer and a bottom layer of a device. Numerous examples of such holes are described in detail infra., and some are interchangeably called protrusions, for example when a hole in the underside of an I-layer is an indentation filled with material protruding from a layer below.

The term "electrode" refers in this specification to material that serves to create desired electrical fields in the disclosed devices and to extract desired electrical signals that the devices produce in response to light illumination. Numerous examples of electrodes are described in detail infra., for example electrodes that comprise electrically conductive material in ohmic contact with doped regions of a device, or electrically conductive material that makes other types of contact such as Schottky junctions.

The terms "top" and "bottom" and similar terms refer to a specified orientation of a device so that, for example, the top of a device being described below becomes its bottom when the device is flipped over or becomes its left or right side when the device is turned 90 degrees.

BRIEF DESCRIPTION OF THE DRAWINGS

To further clarify the above and other advantages and features of the subject matter of this patent specification, specific examples of embodiments thereof are illustrated in the appended drawings. It should be appreciated that these drawings depict only illustrative embodiments and are therefore not to be considered limiting of the scope of this patent specification or the appended claims. The subject matter hereof will be described and explained with additional specificity and detail through the use of the accompanying drawings in which:

FIGS. 65A-65C are partial top view diagrams of inter-digitated microstructure hole photodetectors where the holes are connected to the inter-digitated electrodes, according to some embodiments;

FIGS. 68A-68J are cross-sections illustrating some basic processing steps for fabricating a Ge on Si microstructure hole photodiode on a SOI wafer, according to some embodiments;

FIG. 69A to 69H are cross-sections illustrating some basic steps for fabricating a Ge/GeSi on Si microstructure hole PIN photodiode on P Si substrate that can be monolithically integrated with CMOS I BiCMOS ASICs;

FIGS. 71A to 71F are cross-sections illustrating some basic steps for fabricating a Ge I GeSi metal semiconductor metal (MSM) lateral photodiode that can be monolithically integrated with CMOS/BiCMOS ASICs;

FIG. 72A-72G are cross-sections and a plan view illustrating some variations in Ge/GeSi microstructure hole and/or protrusions MSM, according to some embodiments;

FIGS. 73A and 73B are cross-sections illustrating I-Ge/GeSI vertical and lateral photodetectors with buried ELOG dielectric islands, according to some embodiments;

FIGS. 74A-74C; 75A, 75B, 76A, 76B, 77A, 77B, 78A, 78B, 79A, 79B, 80A and 80B are diagrams illustrating aspects of various configurations of inter-digitated electrodes for MSM photodetectors, according to some embodiments;

FIG. 89A illustrates an FDTD simulation of a microstructure PIN photodiode similar to the structures simulated in FIGS. 87B and 87C, and FIG. 89B is a partial cross-section of a photodetector, according to some embodiments;

FIG. 90A is a plan view of microstructure photodetectors monolithically integrated with CMOS/BiCMOS ASICs on a single chip having receptacle holes for surface emitting lasers, according to some embodiments;

FIG. 93A is a plot of FDTD simulations of optical absorption vs wavelength for Ge—Si structures having Si rectangular islands with poly Si capping layer on the Ge surface, and FIG. 93B is a partial cross-section of structure shapes, according to some embodiments;

DETAILED DESCRIPTION

Figure 1:
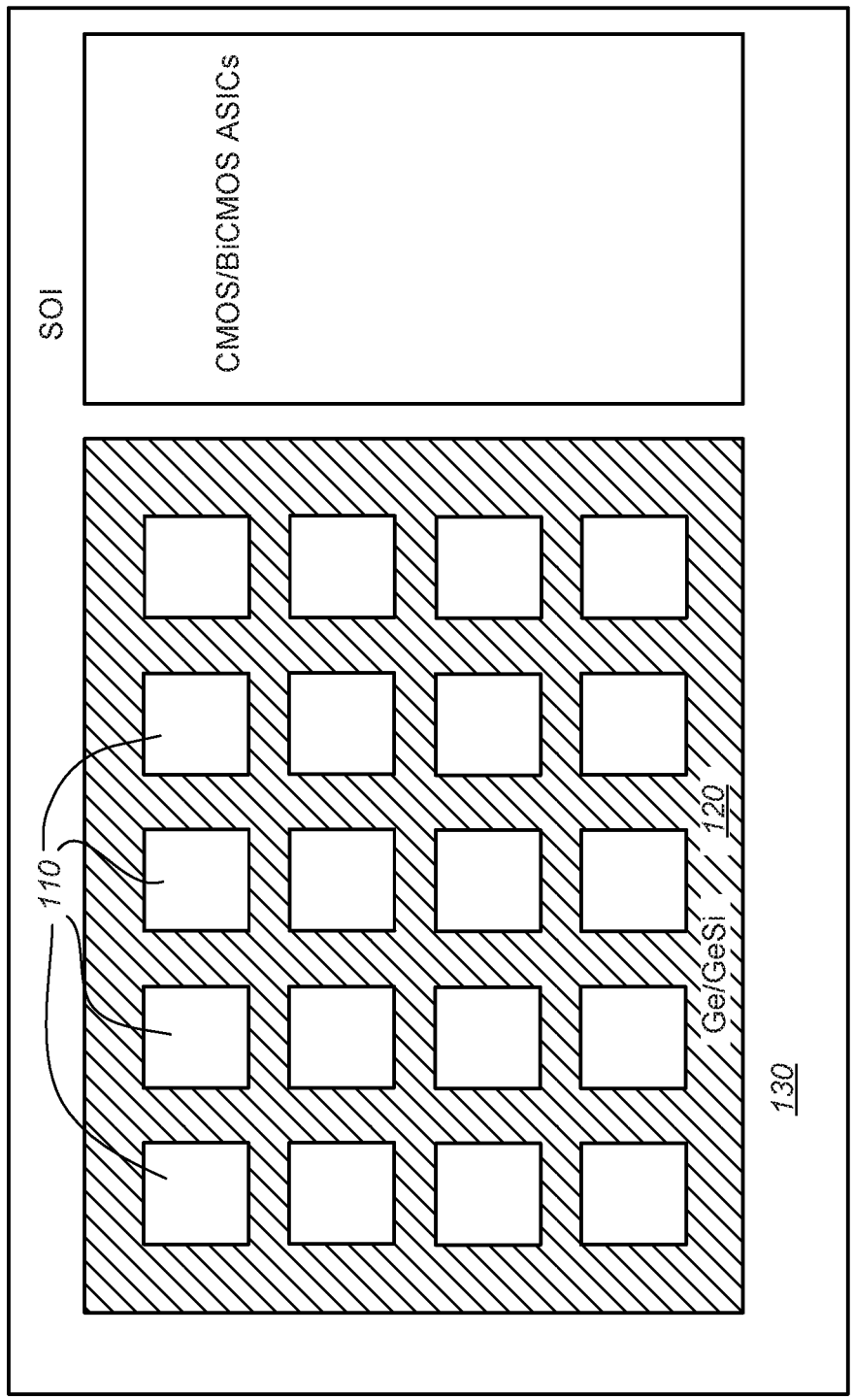
FIG. 1 is a schematic top view of a Ge and/or GeSi I layer grown on a silicon or silicon on insulator (SOI) wafer, according to some embodiments.

A detailed description of examples of preferred embodiments is provided below. While several embodiments are described, it should be understood that the new subject matter described in this patent specification is not limited to any one embodiment or combination of embodiments described herein, but instead encompasses numerous alternatives, modifications, and equivalents. In addition, while numerous specific details are set forth in the following description in order to provide a thorough understanding, some embodiments can be practiced without some or all of these details. Moreover, for the purpose of clarity, certain technical material that is known in the related art has not been described in detail in order to avoid unnecessarily obscuring the new subject matter described herein. It should be clear that individual features of one or several of the specific embodiments described herein can be used in combination with features or other described embodiments. Further, like reference numbers and designations in the various drawings indicate like elements.

Microstructures in photodiodes and microstructures avalanche photodiodes can enhance the absorption of incident signal photons and can result in a larger external quantum efficiency over a similar structure without microstructures for enhancement of the absorption over a given wavelength range. Enhancement of the absorption can also be viewed as an enhancement in the absorption length. Light can interact with absorbing layer(s) for a longer length of time, which if velocity is constant can equivalently be longer distance of travel of the light through absorbing material. The optical modes excited in a microstructured photodiode/avalanche photodiode can propagate in a direction that is the same and/or different from the incident photon direction impinging in the microstructured photodiode/avalanche photodiode (MPD/APD), which can include a predominantly lateral direction in the plane of the epitaxial layers and/or a mixture of lateral and vertical stationary and/or propagating optical modes. The optical modes can be any arithmetic combination of vertical and lateral modes which are complex coupled modes of many resonators that may be similar and/or different. In addition, slow waves can be generated by the microstructures that further enhance absorption and therefore quantum efficiency (external quantum efficiency where reflection off the incident surface and transmission through the structure and any scattering can be accounted for. When quantum efficiency is mentioned herein, it is always the external quantum efficiency) which is proportional to absorption in the case of photodiodes. Ratios of quantum efficiency to absorption can range from 1 to 0.3, for example. For a heterostructure photodiode, for example a P–I–N structure where the P and N are silicon and the I can be GeSi alloy, at longer wavelengths, for example, 950 nm or longer, the P and N will absorb less and most of the absorption will occur in the I GeSi layer. This can result in a quantum efficiency to absorption ratio closer to 1, for example 0.6-0.99. In the case of avalanche photodiode where there is gain, quantum efficiency can often be greater than 100%; for example, with an absorption of 60% and a ratio of quantum efficiency to absorption ratio of 70% (in the case of unity gain) the quantum efficiency is 42% and with a gain of 2 (3 dB) the quantum efficiency can be 84% and with a gain of 4 (6 dB) the quantum efficiency can be 164%.

The microstructured photodiodes and microstructured avalanche photodiodes are predominantly surface illuminated where the optical signal impinges on the top or bottom or both surfaces of the photodiode/avalanche photodiode. The angle of the incident photon, depending on the numerical aperture and/or angle of the fiber, can range in angles from 80 degrees off normal to normal.

The microstructure holes and protrusions can be etched in a KOH solution, see Refs. Fan et al, Differences in etching characteristics of TMAH and KOH on preparing inverted pyramids for silicon solar cells, Applied Surface Science 264 (2013) 761-766; and Mavrokefalos et al, Efficient Light Trapping in Inverted Nanopyramid Thin Crystalline Silicon Membranes for Solar Cell Applications, Nano Lett. 2012, 12, 2792-2796 (both incorporated herein by reference).

In addition, holes and protrusions can be etched with any combinations of wet and dry etching and also can have a multiple of wet/dry/wet/dry/wet etchings to define different hole shapes, different features such as nano glass to reduce reflections, and different wet and dry etching methods and chemicals.

FIG. 1 is a schematic top view of a Ge and/or GeSi P and I layer grown on a silicon or silicon on insulator (SOI) wafer, according to some embodiments. In some cases, the Ge/GeSi layers can be grown using selective area growth (SAG) where areas of crystalline or poly crystalline growth that are not desired can be covered with a dielectric material such as silicon oxide, silicon nitride, and silicon carbide, to name a few. In FIG. 1, a waffle iron pattern can be created where rectangular and/or other shapes such as polygon, circular, or amoebic dielectric islands 110 can be deposited on silicon with a further border of dielectric to define an area of Ge/GeSi region 120 for photodetector fabrication. The small dielectric islands can also be used to define the microstructure holes in the Ge/GeSi layers. The dielectric island layer can have lateral dimensions ranging from 100 nm to 10000 nm and in some cases from 500 nm to 3000 nm and can have edge-to-edge spacing ranging from 100 nm to 5000 nm and in some cases from 30 nm to 3000 nm. Thicknesses of the dielectric can range from 10 nm to 1000 nm or more.

The islands 110 can be periodic and/or aperiodic in one or both directions in a plane and/or any combination of periodic and/or aperiodic and/or random spacing. The islands 110 can have the same size and/or a variation in size and dimensions which can be random, periodic and/or aperiodic. The lattice can be square, hexagonal and/or other arrangements.

The lateral diameter of the Ge/GeSi region 120 defined by the boarder of dielectric 130 can range from 5 microns to 1000 microns or more and in some cases from 20 microns to 100 microns and in some cases from 20 microns to 1000 microns or more. The thickness of the Ge/GeSi 120 can range from 100 nm to 3000 nm and in some cases from 500 nm to 1500 nm and in some cases from 500 nm to 5000 nm.

According to some embodiments, SAG Ge/GeSi microstructure photodiodes (MSPD) or microstructured avalanche photodiodes (MSAPD) can be monolithically integrated with active electronic circuits such as CMOS (complementary metal oxide semiconductor) or BiCMOS (bipolar CMOS) application specific integrated circuit (ASIC) electronics 140, which can be configured for signal processing, conditioning, transmitting, error corrections, storage, amplifications, equalizations, dispersion corrections, to name a few.

Single MSPD/MSAPD devices or arrays of MSPD/MSAPD devices and associated electronics can be fabricated on a single chip. For example the arrays can be 1×4, 2×4, 4×4, 1×8, 2×8, 4×8, 8×8, 1×16, 2×16, 8×16, or 16×16.

Data rates can range from 10 to 50 Gb/s or higher, in some cases 25 to 50 Gb/s and in some cases 25 to 100 Gb/s or higher for optical data communication applications. For LIDAR (light distance and ranging) data rates can be less than one Gb/s, in some cases less than 10 Gb/s and in some cases less than 25 Gb/s. Timing jitter can determine the resolution of the LIDAR system, where 1 ps is equivalent to light travelling 300 microns in air. For 10 cm resolution timing jitter of 1 ns or less is important. Higher resolution will demand shorter timing jitter for single photon MSAPD and for MSAPD and MSPD.

Wavelengths can range from 800 nm to 1650 nm depending on the Ge fraction in the $Ge_x Si_{1-x}$ alloy where x can range from 1 (all Ge) to 0 (all Si).

With microstructure holes the absorption of photons can be enhanced compared to a similar photodetector without microstructure holes especially in cases where the absorption coefficient of the material is weak, for example in the neighborhood of 1000/cm or less, in some cases 2000/cm or less, in some cases 6000/cm or less and in some cases 8000/cm or less. In some cases strong absorption of 8000-10000/cm or more can be obtained. However, when the absorption layer is thin, less than 1 micron and in some cases less than 2 microns, the absorption of photons at certain wavelengths can be enhanced with the addition of microstructure holes as compared to a similar photodetector without microstructure holes at certain wavelengths.

The fraction of optical power absorbed can be expressed by $1-\exp(alpha*x)$ where alpha is the absorption coefficient at a particular wavelength and x is the distance the photon of a particular wavelength travels in the material. If the fraction of optical absorbed power is less than 0.8 then microstructure holes can be used to enhance the absorption and enhance the fraction of optical power absorbed over that of a similar photodetector without microstructure holes at certain wavelengths. In some cases, if the fraction of optical absorbed power is less than 0.6 then microstructure holes can be used to enhance the absorption and enhance the fraction of optical power absorbed over a similar photodetector without microstructure holes at certain wavelengths. In some cases if the fraction of optical absorbed power is less than 0.4 then microstructure holes can be used to enhance the absorption and enhance the fraction of optical power absorbed over a similar photodetector without microstructure holes at certain wavelengths. In some cases if the fraction of optical absorbed power is less than 0.2 then microstructure holes can be used to enhance the absorption and enhance the fraction of optical power absorbed over a similar photodetector without microstructure holes at certain wavelengths.

Enhancements of the fraction of absorbed optical power of a photodetector with microstructure holes over a similar photodetector without microstructure holes for enhancement of the product of absorption coefficient times the distance the photon travels in the material through photon trapping, can range from greater than 1 to 20 or more at certain wavelengths and in some cases from 1.5 to 30 or more at certain wavelengths. Enhancement of absorption can be the result of photons traveling a greater distance in the material such that the photons spend a longer time in the material. The photons interact with the microstructure holes collectively and include both linear and non-linear effects. Simulations have shown that light can propagate in a direction in the microstructure hole MSPD/MSAPD that is different from the incident direction of the light impinging on the MSPD/MSAPD. See, e.g., Ref. Gao et al, High Speed Surface Illuminated Si Photodiode Using Microstructured Holes for Absorption Enhancements at 900-1000 nm Wavelength, DOI: 10.1021/acsphotonics, 7b00486, which is incorporated by reference herein. In some cases, SAG may be achieved without a waffle or any other pattern and microstructure holes can be etched, dry and/or wet, after SAG.

Figure 2:
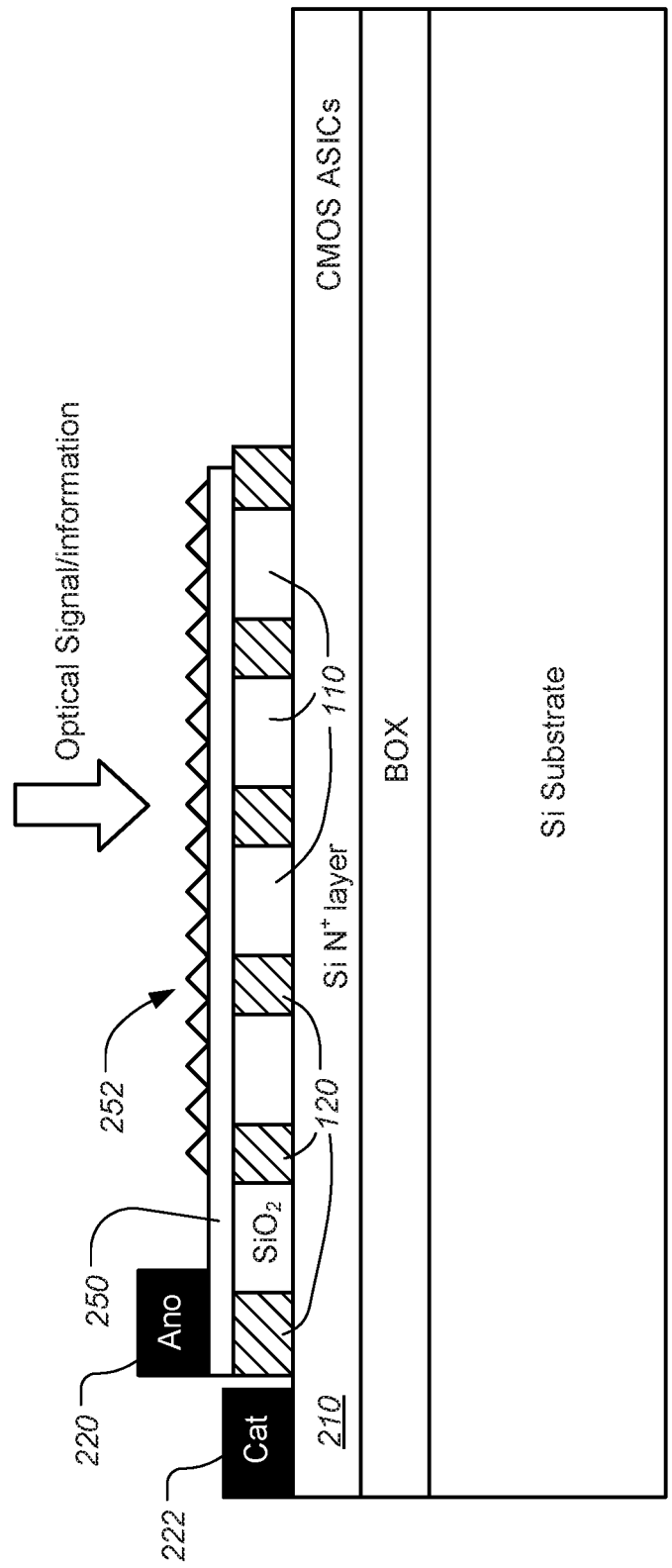
FIG. 2 is a schematic cross-section of a structure such as shown in FIG. 1 for use in a microstructure-enhanced photodetector (MSPD), according to some embodiments.

FIG. 2 is a schematic cross-section structure shown in FIG. 1, according to some embodiments. In this case, the Ge/GeSi SAG layer 120 can be grown on N+ silicon 210 where the N+ silicon can have resistivity of 0.1 ohm-cm or less at some regions of the Si layer and can have thickness ranging from 50 nm to 600 nm or more. The Ge/GeSi layer 120 can be intrinsic "I" or low doped with doping less than $1\times10^{17}/cm^3$ and with thickness ranging from 100 nm to 3000 nm and in some cases 100 nm to 1500 nm. In addition, a P+ Ge/GeSi layer can be grown on the I or low doped layer 120 with resistivity of 0.01 ohm-cm or less and with layer thickness ranging from 10 nm to 500 nm, and in some cases 50 nm to 300 nm or more. A transparent conducting metal oxide 250 such as indium tin oxide can be deposited on the P+ Ge/GeSi layer to further reduce the series resistance. The indium tin oxide (ITO) can be textured (252) to reduce reflection. In some cases, the P+ Ge/GeSi layer may not be present, and the ITO 250 can be directly deposited on the I or low doped Ge/GeSi layer 120. The thickness of the ITO 250 can range from 10 nm to 3000 nm or more.

In some cases, a semitransparent metal film can be deposited directly on the I or low doped Ge/GeSi layer 120 with film thicknesses ranging from 1 nm to 50 nm or more. The metal film can be made of a suitable material such as Pt, Ni, Cr, Cu, Al, V, W. The ITO may also be used in conjunction with a thin metal film.

Cathode 222 and anode 220 are formed on the N (210) and P or ITO (250) layers respectively. A reverse bias voltage can be applied between the cathode and anode with voltages ranging from 0 to −5 volts for MSPD and in some cases −3.3 volts and in some cases −1.8 volts and in some cases 0 volts.

For MSAPD, the structure can be a PIN (for single photon avalanche photodiode or a SPAD. In some examples, charge and multiplication layers in silicon can be added such that the structure is P(Ge/GeSi) I(Ge/GeSi) P(Si/GeSi) I(Si) N(Si) or P(Ge/GeSi) I(Ge/GeSi) P(Si) N(Si). Other APD structures are also possible and the P and N can be interchanged. With the addition of microstructure holes the layer thicknesses for absorbing photons can be reduced to achieve equivalent and/or superior external quantum efficiencies as compared to a similar photodetector without microstructure holes at certain wavelengths due to photon trapping. The reduction in thickness can result in high data rate bandwidths and high external quantum efficiency for MSPD and MSAPD. In addition, for MSAPD the reduction in absorption layer thickness can also result in a reduction in the reverse bias voltage form 100-200 volts to less than 45 V, in some cases to less than 30V, in some cases to less than 20V, and in some cases less than 10V.

In some cases, the BOX layer can be etched away entirely or partially under the photodetector region and/or the CMOS/BiCMOS region using trenches that allow etchant to reach the BOX layer from the surface. In some cases, the CMOS/BiCMOS region can be shielded from the incident photon and other stray light with an opaque dielectric and/or metallic layer. In some cases, the entire or almost entire monolithic chip can be hermetically sealed with a dielectric.

A Poly Si layer can be deposited on the Ge/GeSi layer 120, and in some cases can cover the oxide 250, and can be doped P type for example, and the anode can contact with the P Poly Si which can have a thickness from 50 nm to 500 nm or more.

Figure 3:
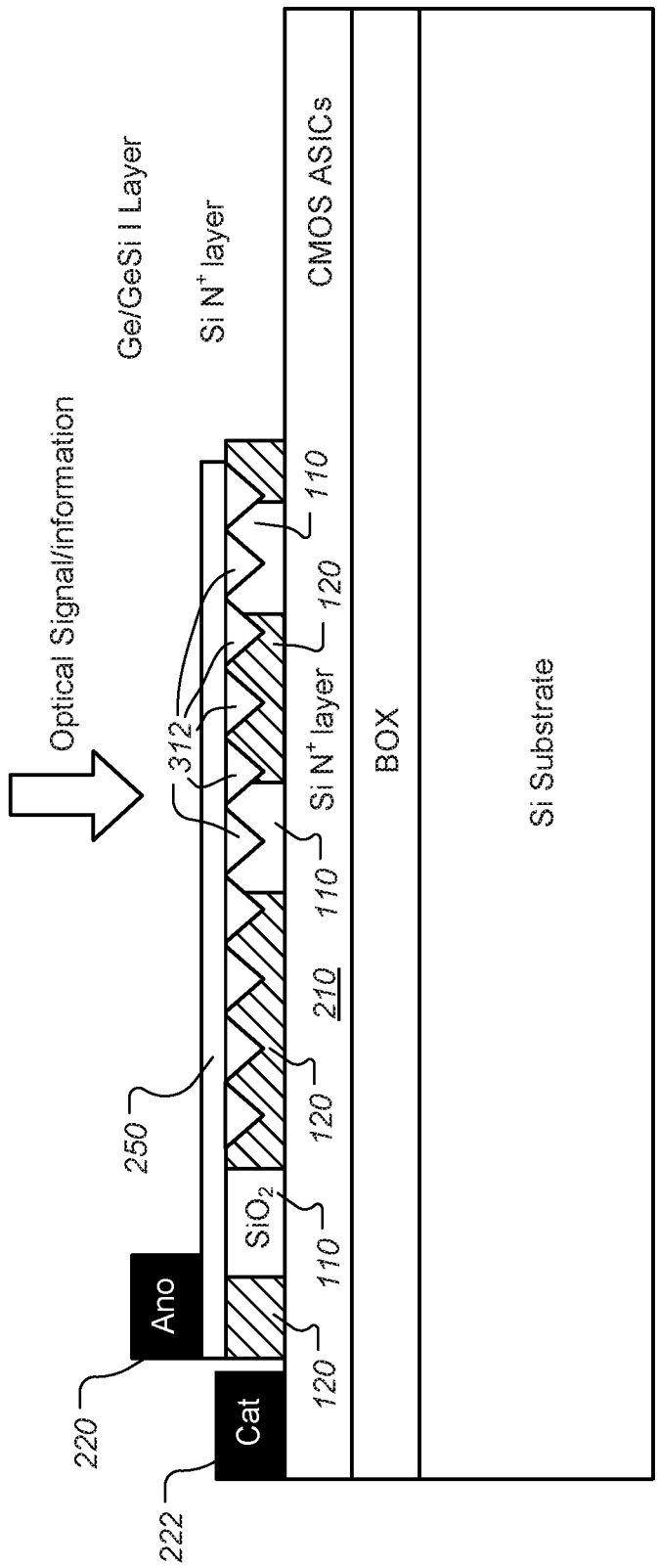
FIG. 3 is a cross-section schematic similar to that of FIG. 2 with different microstructures, according to some embodiments.

FIG. 3 is a cross-section schematic similar to that of FIG. 2 with the addition of microstructures, according to some embodiments. The microstructures 312 can be microstructured holes such as inverted pyramids, cones, or funnels. The microstructures 312 can be formed using wet and/or dry etching methods. Etch depth of the microstructure holes 312 can range from 100 nm or less to 3000 nm or more, in some cases from 200 nm to 1500 nm, in some cases from 300 nm to 2500 nm and in some cases from 300 nm to 5000 nm. Lateral dimension of the microstructure holes 312 at the surface can range from 100 nm to 3500 nm, in some cases from 300 nm to 3000 nm and in some cases from subwavelength to 10 times the operational wavelength. The adjacent edge-to-edge spacing of the microstructure holes 312 can range from 20 nm to 5000 nm and in some cases from subwavelength to 10 times the operational wavelength. The shape of the microstructure holes 312 can be rectangular, polygonal, oval, circular and/or any other shapes or sizes which can vary in any manner in relation to other microstructure holes. The microstructure holes 312 can be spaced periodically, aperiodically and/or randomly in one or more dimensions.

Figure 4:
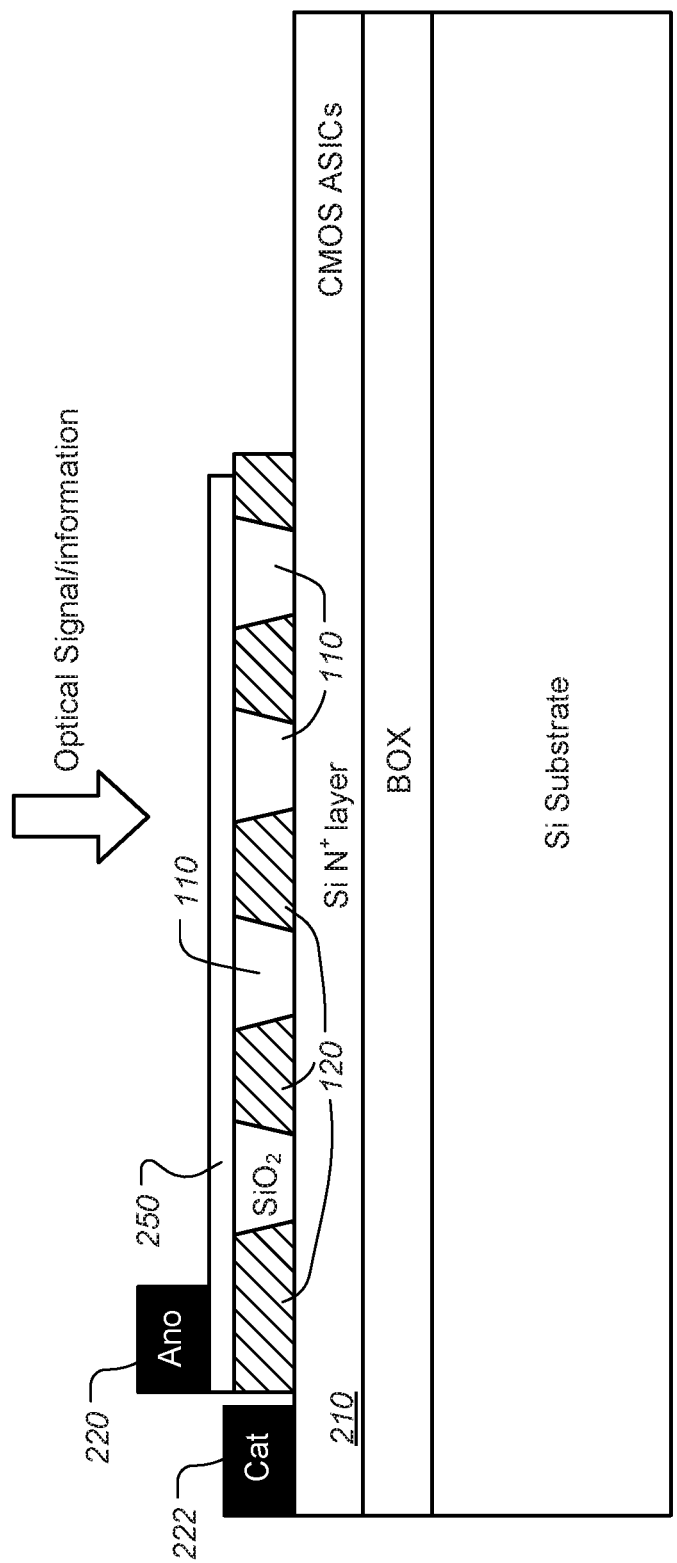
FIG. 4 is a cross-section schematic similar to that of FIG. 2 with different microstructures, according to some embodiments.

FIG. 4 is a cross-section schematic similar to that of FIG. 2 with the addition of microstructures, according to some embodiments. In this case, the dielectric regions 110 are trapezoidal, resulting in a Ge/GeSi SAG funnel type structures 120. The trapezoidal shaped dielectric regions 110 form microstructures. The side wall angle with respect to the horizontal can range from 90 to 30 degrees or less and in some cases the structure can have multiple side wall angles and can also have side wall angles greater than 90 degrees. In some cases, layer 250 can be P Poly Si or can be covered with a layer of Poly Si.

Figure 5A:
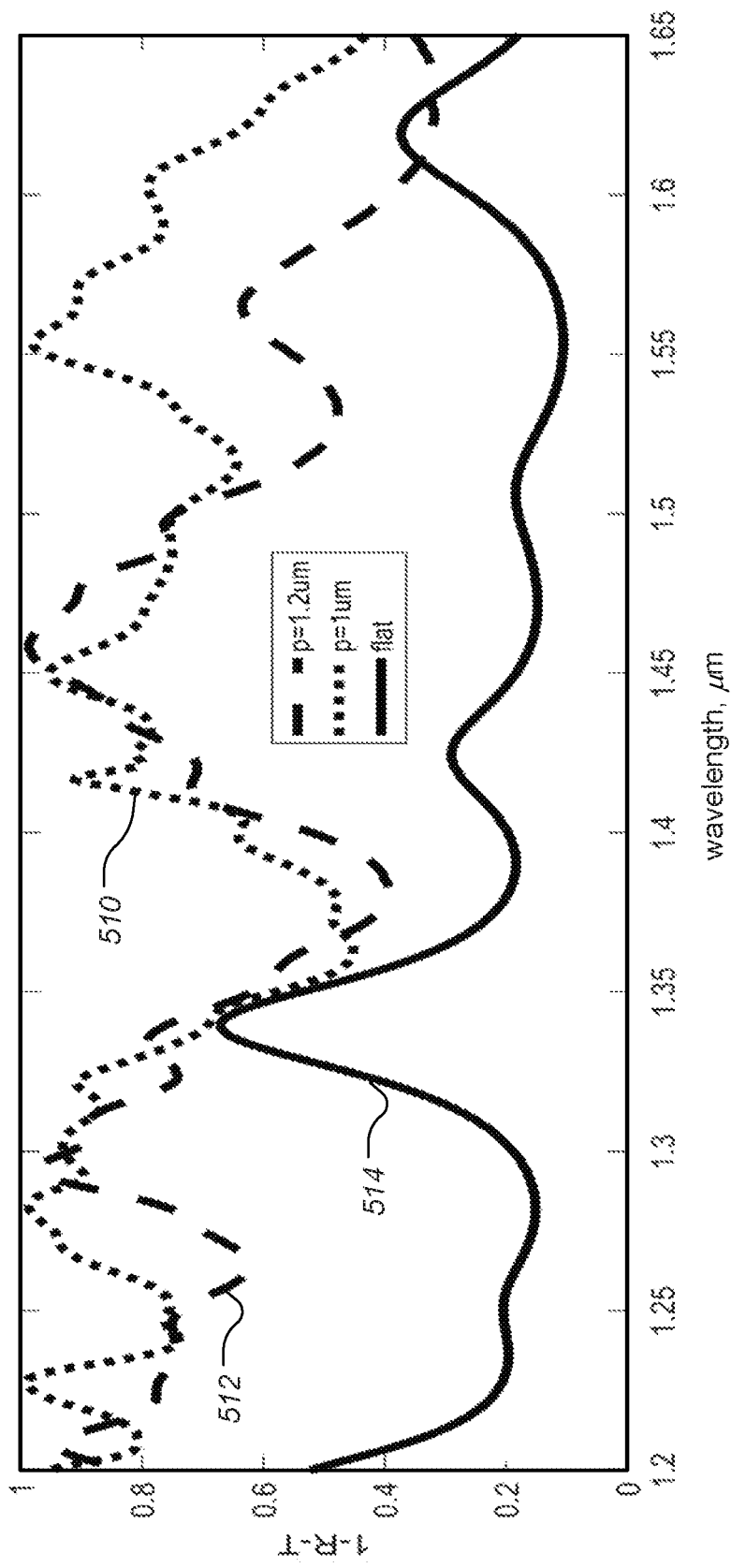
FIG. 5A is a plot of a finite difference time domain (FDTD) simulation of the optical power absorption (1-R-T, where R is reflection and T is transmission) in a structure similar to that shown in FIG. 4, according to some embodiments.

FIG. 5A is a plot of a finite difference time domain (FDTD) simulation of the optical power absorption (1-R-T, where R is reflection and T is transmission) in a structure similar to that shown in FIG. 4, according to some embodiments. The structure has side walls with an angle of 61 degrees. The Ge/GeSi thickness is 600 nm. The Si layer has a thickness of 400 nm. The BOX layer is 2000 nm on a Si substrate of 750 microns thick. The simulation is for wavelengths from 1200 nm to 1650 nm. Three curves are shown: curve 514 is for a similar structure without microstructure holes; curve 510 is for square holes 700 nm per side, 1000 nm period in a square lattice; and curve 512 is for square holes 850 nm per side, 1200 nm period in a square lattice. At some wavelengths the absorption of the Ge MSPD is over 80% as compared to the absorption of a similar Ge photodiode without microstructure holes of approximately 20% at similar wavelengths. Similar results have been obtained for a structure as shown in FIG. 4 but without the BOX layer.

Figure 5B:
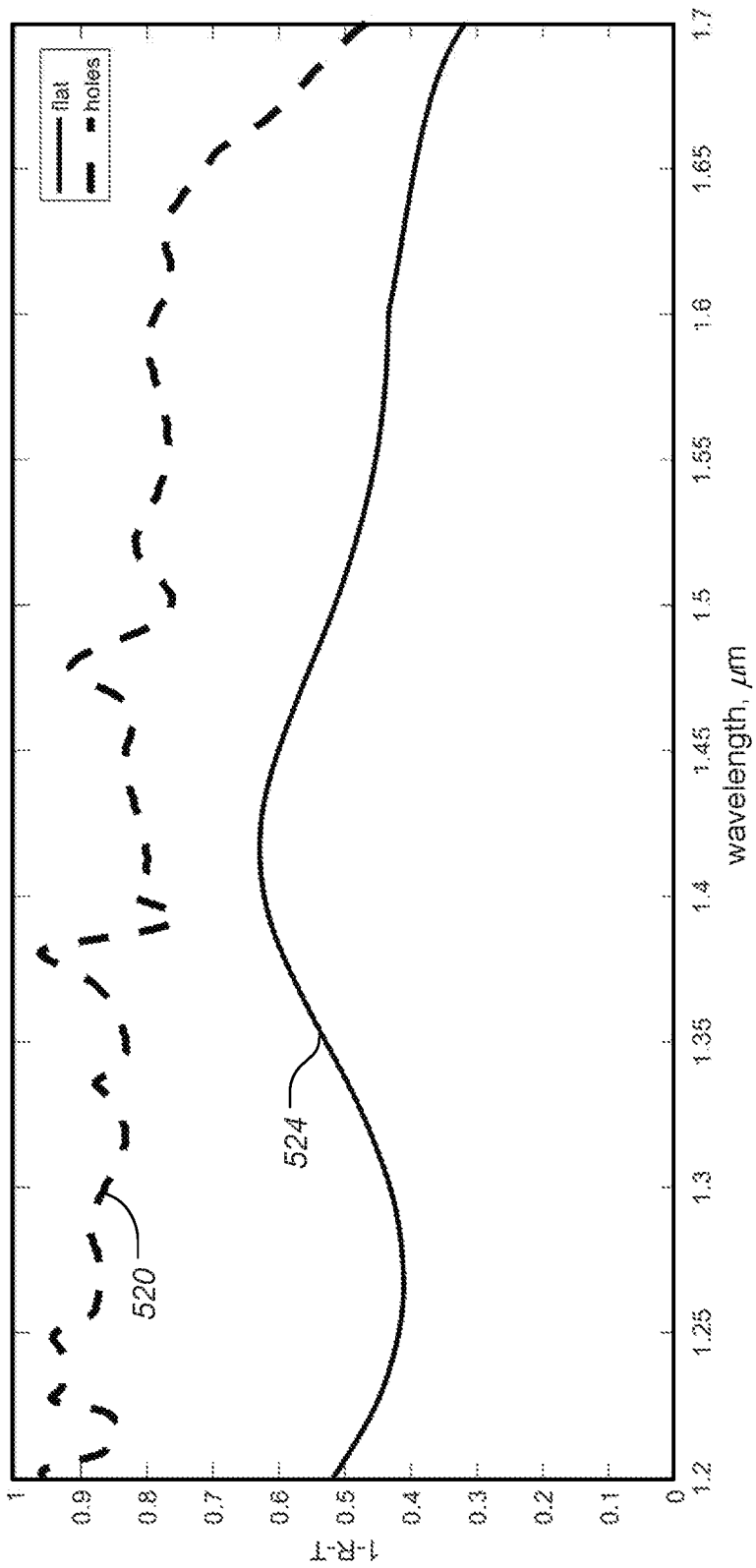
FIG. 5B is a plot of a FDTD simulation similar to that of FIG. 5A for a structure shown in FIG. 4, according to some embodiments.

FIG. 5B is a plot of an FDTD simulation similar to that of FIG. 5A for a structure shown in FIG. 4, according to some embodiments. Curve 520 is for a structure having square microstructure holes filled with silicon dioxide with dimensions of 700 nm on each side and with a period of 1000 nm in a square lattice without a BOX layer. The Ge layer has 600 nm thickness. Curve 524 is for the absorption of a Ge layer of 600 nm thickness without microstructure holes from 1200 nm to 1650 nm wavelength. The vertical axis is absorption (1-R-T). The enhanced optical power absorption with microstructure holes can be greater than 80% at certain wavelengths. The absorption is directly proportional to quantum efficiency or external quantum efficiency. The structure with microstructure holes can have an absorption enhancement factor of 1.3 to 1.5 times greater than a similar structure's absorption without microstructure holes at certain wavelengths. In some cases the absorption enhancement factor can range from 1.1 to 20 or more at certain wavelengths. In some cases the enhancement factor can range from 1.1 to 100 or more at certain wavelengths.

Figure 6:
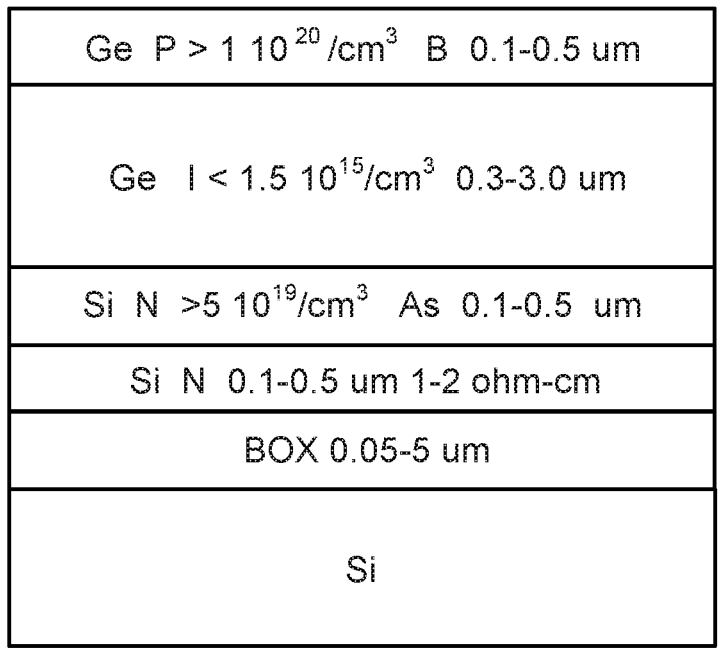
FIG. 6 is an example of Ge P and/or low doped layers and Si N formed on a SOI epitaxial structure MSPD, according to some embodiments.

FIG. 6 is an example of Ge P and/or low doped layers and Si N formed on a SOI epitaxial structure, according to some embodiments. In some cases the BOX may not be included. The SOI wafer can include an N or a P device layer, although an N device layer is shown. The device layer can have thicknesses ranging from 100 to 500 nm or more, and resistivity of a few ohm-cm and in some cases greater than a few ohm-cm. A N+ layer is shown with thicknesses ranging from 100 to 500 nm. A Ge I or low doped layer is shown over the N+ layer, with doping density of less than $1.5 \times 10^{15}/cm^3$ and with thickness ranging from 300 to 3000 nm. A P+ Ge layer can then be grown over the Ge I layer, with doping density of $1 \times 10^{20}/cm^3$ or greater. Thickness can range from 100 to 500 nm. Other thicknesses, doping densities and resistivities are also possible. The structure can be used for MSPD and in some cases for MSAPD. With the addition of a charge layer in Si and multiplication layer in Si, the structure can be used for MSAPD. Other APD structures are also possible such as PIN, PIPIN, PIPN.

Figure 7:
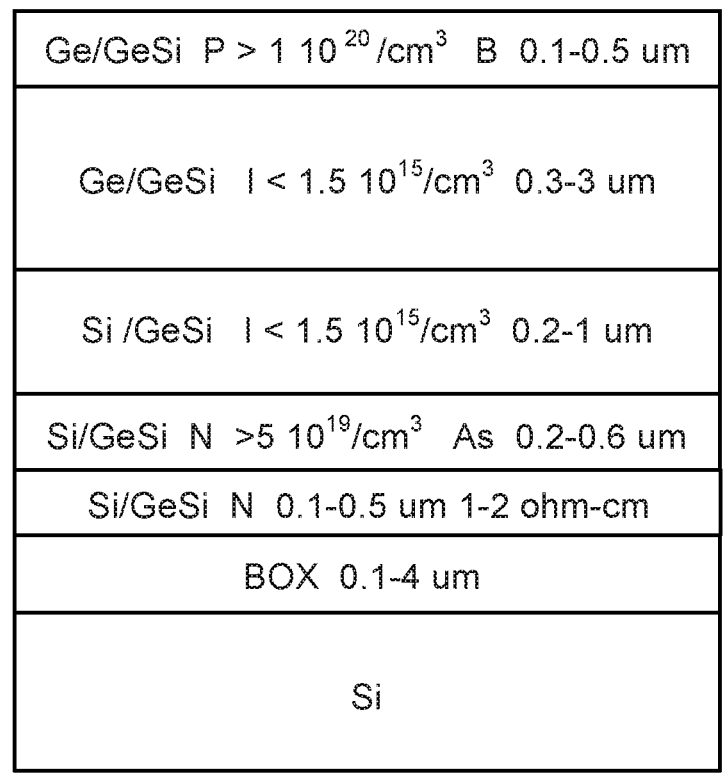
FIG. 7 is an example similar to FIG. 6 except one or more layers can be a GeSi alloy.

FIG. 7 is an example similar to FIG. 6 except one or more layers can be a GeSi alloy. In the GeSi alloy the Ge fraction can vary from all Ge to no Ge. The bandgap of the alloy GeSi becomes smaller with increased amount of Ge in the alloy. By adjusting the Ge content in the alloy GeSi, the operational wavelength of the MSPD and MSAPD can be optimized such that with the addition of microstructure holes, the power absorption of the optical signal with high data rate and therefore the quantum efficiency and the thickness of the absorption layer(s) can be optimized for high data rate bandwidth, high quantum efficiency (external quantum efficiency), high quantum efficiency, low avalanche breakdown voltage and in some cases low timing jitter. See, e.g. Zang et al, Silicon single-photon avalanche diodes with nanostructured light trapping; DOI: 10.1038/s41467-017-00733-y, which is incorporated herein by reference.

Figure 8:
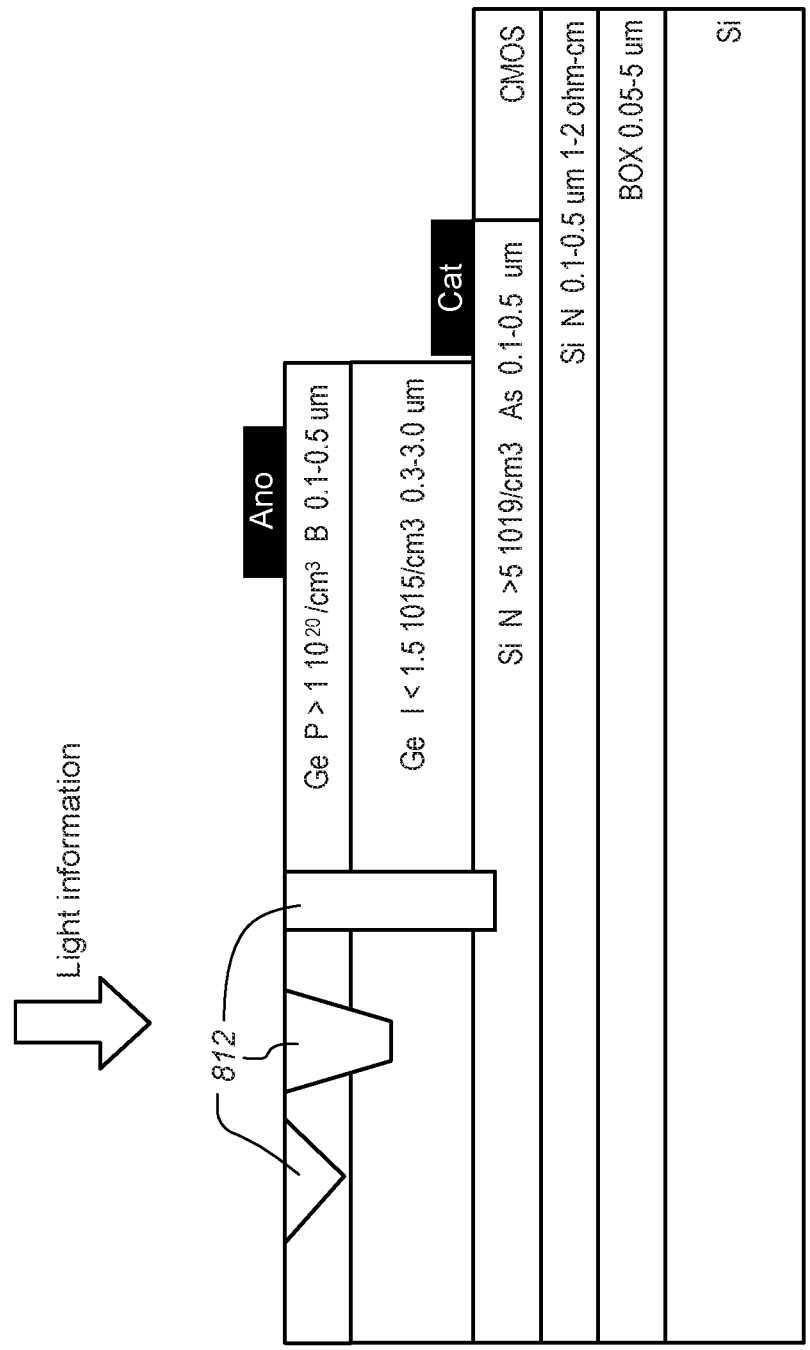
FIG. 8 is a cross-section schematic of a monolithic integration of CMOS/BiCMOS ASICs with a structure such as shown in FIG. 6 or FIG. 7, according to some embodiments.

FIG. 8 is a cross-section schematic of a monolithic integration of CMOS/BiCMOS ASICs with a structure such as shown in FIG. 6 or FIG. 7, according to some embodiments. As shown, a mesa can be used to define the photodetector region. Microstructure holes 812 are similar to those discussed in FIG. 3, where the microstructure holes can be inverted pyramids, conical, trapezoidal, cylindrical, and/or any combination of shapes. The shapes at the surface may evolve to other shapes as the microstructure hole is etched depending on the etching process. Examples include isotropic, anisotropic, a combination of isotropic and anisotropic etching methods, either wet or dry or combination of wet and dry etching methods. The microstructure holes can be etched partially into the first doped layer or region, through the first doped layer, through the first doped layer/region and partially into the I or low doped region, through the I or low doped region, through the I or low doped region and partially into the second doped layer/region, or through the second doped layer/region. The microstructure holes can have an etch depth ranging from 20 nm to 5000 nm or more.

The spacing in one or more directions of the microstructure holes 812 can range from 50 nm to 5000 nm and can be periodic and/or aperiodic and/or random in one or more directions on a plane. Anode and cathode to the P and N region/layer provide both a reverse bias contact and connection to transmission lines, not shown, to the ASICs electronics. One or more layers/regions can be GeSi alloy.

Figure 9:
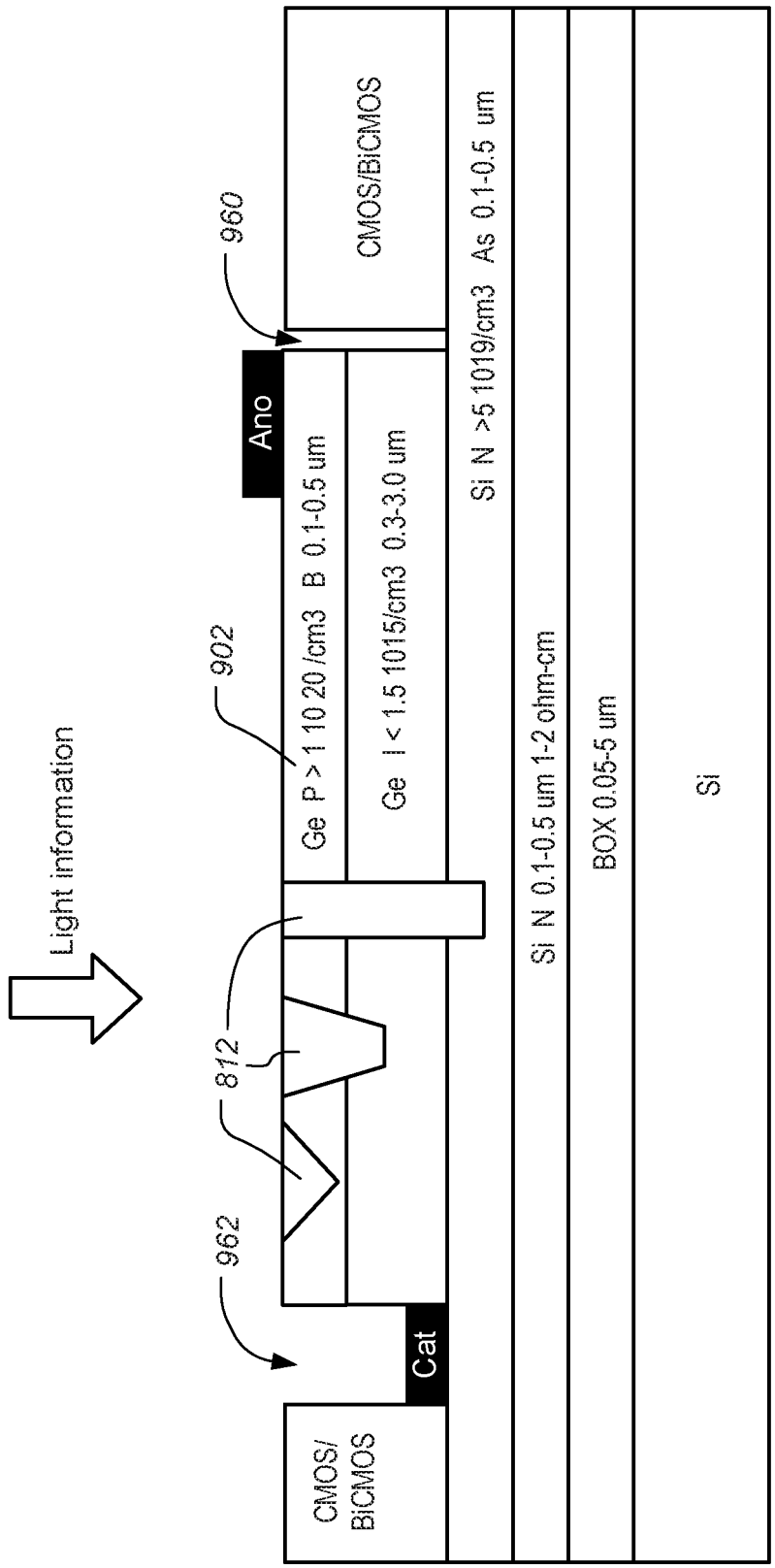
FIG. 9 is similar to FIG. 8 except instead of a mesa, isolation trenches are included, according to some embodiments.

FIG. 9 is similar to FIG. 8 except that instead of a mesa, isolation trenches are included, according to some embodiments. Isolation trench(es) 960 and 962 could also be deep diffusion wells and can be used to contact the N+ layer to form the N ohmic and cathode contacts for biasing and RF signal transmission lines to the silicon electronics ASICs, which are not shown for simplicity.

One or more layers or regions can be GeSi alloys. P and N can be interchanged and in some cases layers for MSAPD can be added. One polarity can be preferred over another for noise considerations for example multiplication of electrons can be preferred over multiplication of holes for better reduction of noise.

The top N or P layer/region 902 can be crystalline, polycrystalline, non-crystalline, or amorphous, and dopant can be added during growth, diffused after growth, or ion implanted after growth. A semitransparent metal layer (not shown) can be added or a transparent conducting metal oxide such as indium tin oxide can be added on the top layer to further reduce series resistance.

Wavelength of operation for the microstructured Ge on Si can range from 800 nm to 2000 nm at data rate of 25 Gb/s or higher and with external quantum efficiencies of 80% or higher at certain wavelengths, in some cases 50% or higher at certain wavelengths, and in some cases 20% or higher at certain wavelengths in the span.

In addition, any of the GeSi or Ge layers can be strained or not strained. In some cases strained GeSi or Ge layers have a smaller bandgap than an equivalent not strained GeSi or Ge layers. In some cases, the strained GeSi or Ge layers can have a lower dislocation density than an equivalent relaxed or not strained GeSi or Ge layer on Si. In some cases, Si layers can be grown epitaxially and/or deposited on GeSi or Ge layers grown on Si in either crystalline and/or non-crystalline form such as microcrystalline or amorphous. Heterojunction bipolar transistors can be made with Si emitter and collector and GeSi or Ge base as is known in the art. In some cases carbon can be used in conjunction with Ge or GeSi to reduce strain and reduce threading dislocation densities.

Figure 10:
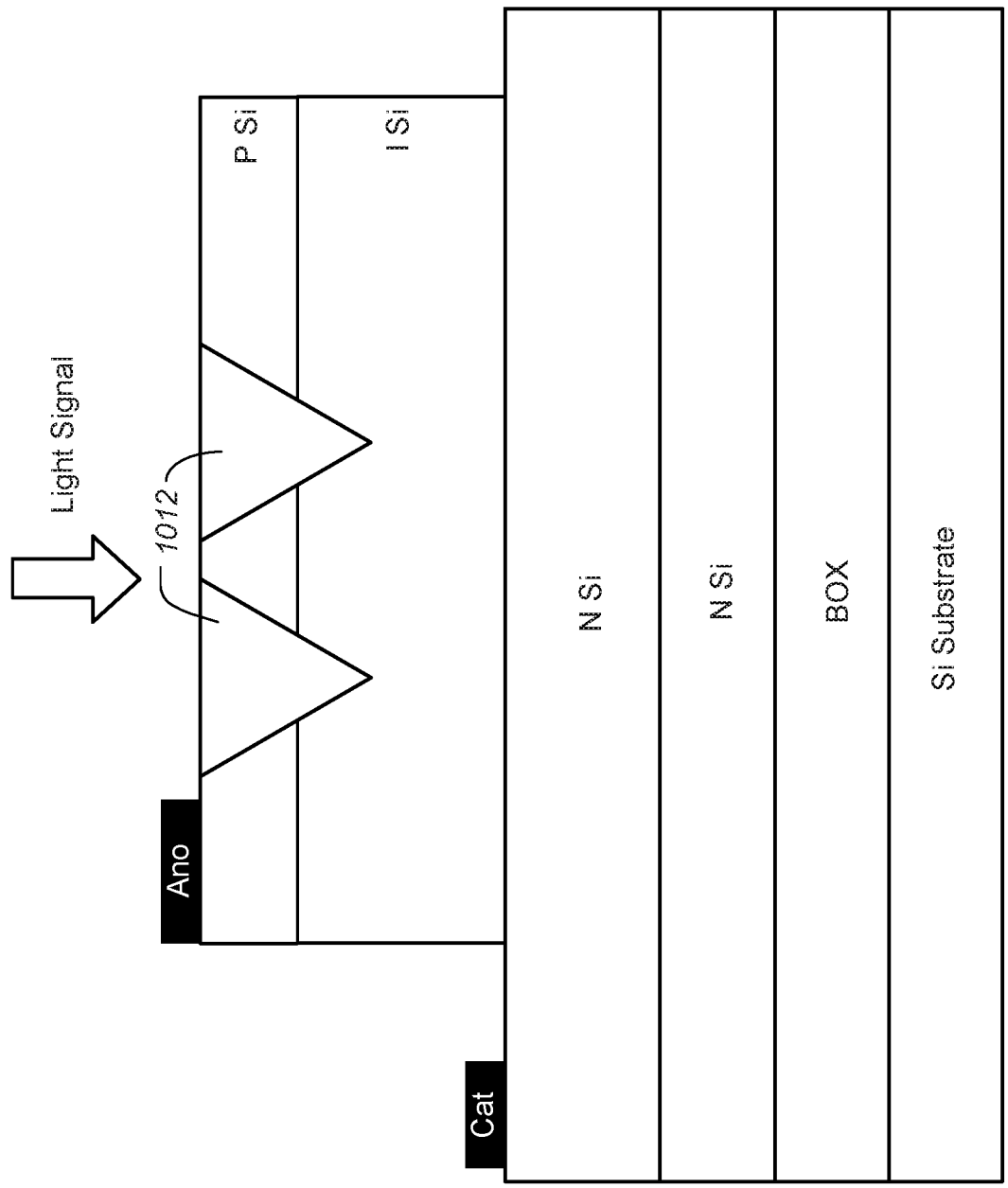
FIG. 10 is a schematic cross-section of a PIN MSPD structure, according to some embodiments.

FIG. 10 is a schematic cross-section of a PIN MSPD structure, according to some embodiments. Although a silicon structure is shown, GeSi can be used for any of the layers where the Ge fraction can vary from 0 to 1. In this example inverted pyramids 1012 are etched as microstructure holes for the enhancement of the quantum efficiency or the external quantum efficiency or the responsivity. The enhancement of the quantum efficiency can be due to photon trapping and in some cases the collective re-radiation from the microstructure holes and/or diffractions can result in light propagating predominately in a transverse direction along the plane of the absorption layers or regions when light is incident on the surface of the MSPD or MSAPD either at a normal angle and/or off normal angle with off normal angle ranging from −45 to 45 degrees or more and in some cases −60 to 60 degrees from the normal angle. In some cases, from −30 to 30 degrees or more form the perpendicular to the surface.

The PIN structure can be multiple regions of P, I and N each with same or different doping and in some cases at least one layer or region can be GeSi with Ge fraction ranging from 0 to 1. During epitaxial growth the dopants diffuse such that there is a transition region from a highly doped region to a low doped region. The profile of the transition region, which can range form nanometers to thousands of nanometers, depends on factors such as layer thickness, growth temperatures, growth rates, and doping concentrations. Diffusion of dopants also depends on factors such as material quality, dislocation densities, and strain. In addition, with heterojunctions such as GeSi on Si or Ge on Si or Si on GeSi or Si on Ge, the bandgaps can be intentionally grated to avoid charge trapping and in some cases the grading can be unintentional due to growth conditions.

For simplicity only three regions of PIN are shown in FIG. 10 but in practice there are shades of P and N transitions into the I region and in some cases band gap gratings where heterojunctions are involved.

The P region can have a thickness ranging from 10 to 500 nm with resistivity less than 0.01 ohm-cm. The I or low doped region can have a thickness ranging from 100 to 5000 nm with resistivity of 0.1 ohm-cm or more. The N layer or region can have a thickness ranging from 10 to 500 nm or more with resistivity of 0.01 ohm-cm or less. The PIN structure can be grown on a SOI wafer with a BOX thickness ranging from 10 to 4000 nm or more and the device layer can be N or P. In some cases the PIN can be grown on a bulk Si layer of N type for example. Similarly, for a MSAPD (microstructure avalanche photodiode) the layer structure can be a PIN, PIPIN, PN. For both MSPDs and MSAPDs the P and N can be reversed.

The lateral surface dimension of microstructure holes 1012 can range from 100 nm to 3500 nm or more. The microstructure holes 1012 can be rectangular, triangular, polygonal, circular, oval, amoebic, and/or any combination of shapes. They can also be irregular, random and/or varying in any dimensions. Spacing between the adjacent edges of microstructure holes 1012 can range from nm to 5000 nm and in some cases from 100 nm to 1500 nm. The spacing can be periodic, regular, irregular, aperiodic, and/or random in any dimension(s). The cross-section of the microstructure holes 1012 can be funnel, conical, inverted pyramids, cylindrical, elliptical, or any combination of shapes. The cross-section can be different for cross-sections cut along different vertical planes. The depth of the microstructure holes 1012 can range from 50 nm to 5000 nm or more. In some cases the microstructure holes 1012 can be within the first doped region of P or N type, and in some cases the microstructure holes can be formed through the first doped region and into the low doped or I region. In some cases the microstructure holes 1012 can be formed through the first doped region and the low doped region or I region and into the second doped region of N or P. And in some cases, the microstructure holes 1012 can include the first doped region and extend into the low doped or I region. See e.g. FIGS. 12A-12E, described infra.

Optical signals impinge on the surface as shown. An anode and a cathode are provided at the P and N region to provide the electrical contact to the MSPD/MSAPD where a reverse bias voltage can be applied to fully deplete the low doped or I region. In some cases, the applied voltage can range from 0 to −50 volts. Electrical signal corresponding to the optical signal is extracted from the anode and cathode with the addition of a transmission line. The MSPD/MSAPD can be monolithically integrated with CMOS/BiCMOS electronics on a single chip. Such monolithic integration can significantly reduce the cost of the optical receiver and improve the performance with reduced parasitic capacitance, inductance and resistances.

The optical signal wavelength can range from 750 nm to 2000 nm depending on the Ge fraction in the GeSi alloy which can range from 0, pure Si to 1, pure Ge. A Ge on Si MSPD/MSAPD for example can operate from 700 to 2000 nm. Data rates can range from 1 Gb/s or less to 100 Gb/s or more.

With micro or nano structures such as microstructure holes 1012 with surface lateral dimensions ranging from 10 nm to 3000 nm or more and depths into the surface of a MSPD/MSAPD ranging from 10 nm to 5000 nm or more, the sharp edges can concentrate the electric field such that as reverse bias is increased the external quantum efficiency or quantum efficiency or responsivity can increase as a function of reverse bias voltage due to avalanche gain for example at the regions of high electric field especially near sharp or abrupt edges. In FIG. 10 the sharp edges can be where the microstructure hole etch passes the P layer and extends into the I region, where the P and I regions are no longer planar but have a microstructure hole and the edge can be regions of high electric fields. In the case of a mesa PIN structure without microstructure holes, the edge of the mesa where the P, I and N regions end abruptly can be regions of high fields. However with microstructure holes, there are more regions of high electric fields that coincide with regions of high optical intensity resulting in increased overlap of optical intensity and electric field for avalanche gain.

Figure 11:
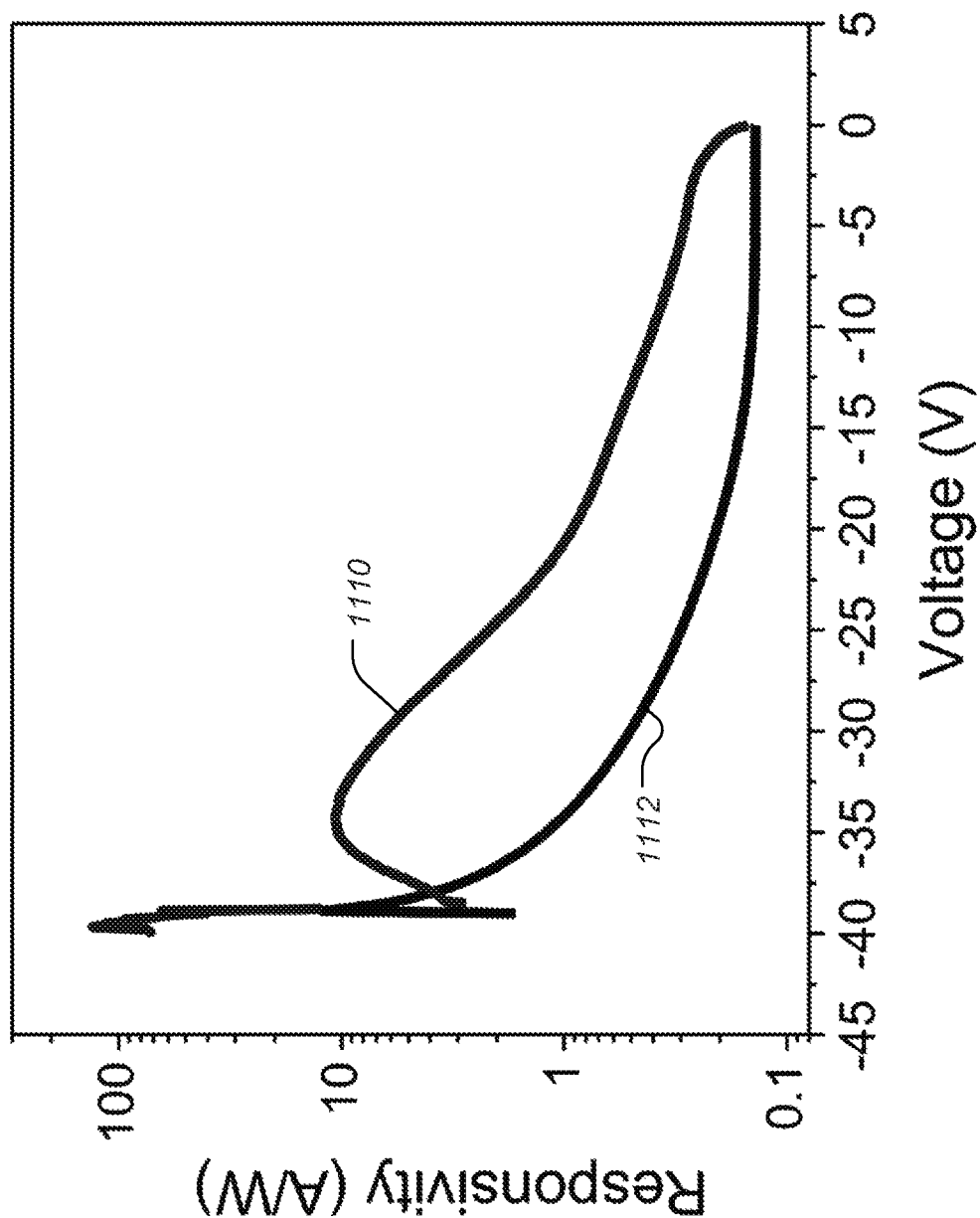
FIG. 11 is a plot shows experimental results of a MSPD structure as in FIG. 10.

FIG. 11 is a plot that shows experimental results of a MSPD structure as in FIG. 10. The structure has inverted pyramids of lateral dimension of 1300 nm and period of 2000 nm in a square lattice, where the P region is 300 nm, the I region is 2000 nm and the N region is 300 nm thick. The wavelength of light is 850 nm and the vertical axis is responsivity and the horizontal axis is reverse bias voltage. Curve 1110 is for a MSPD and curve 1112 is for an equivalent PIN structure without microstructure holes. The responsivity of MSPD increases with increasing reverse bias. Responsivity corresponding to 100% quantum efficiency is reached at approximately −10V and a responsivity as high as 30 is reached at approximately −35V which correspond to a quantum efficiency of 4000% or an avalanche gain of approximately 80. Breakdown voltage of the MSPD or PIN PD without microstructure holes is approximately −40V. The MSPD can behave as a MSAPD at a reverse bias of approximately −5V or higher. The avalanche gain of a MSPD/MSAPD at pre-breakdown voltages can be higher than of an equivalent photodiode/avalanche photodiode without microstructure holes. Experimentally, avalanche gain has been observed in MSPD, which can be a MSAPD at higher reverse bias voltages.

Figure 12A:
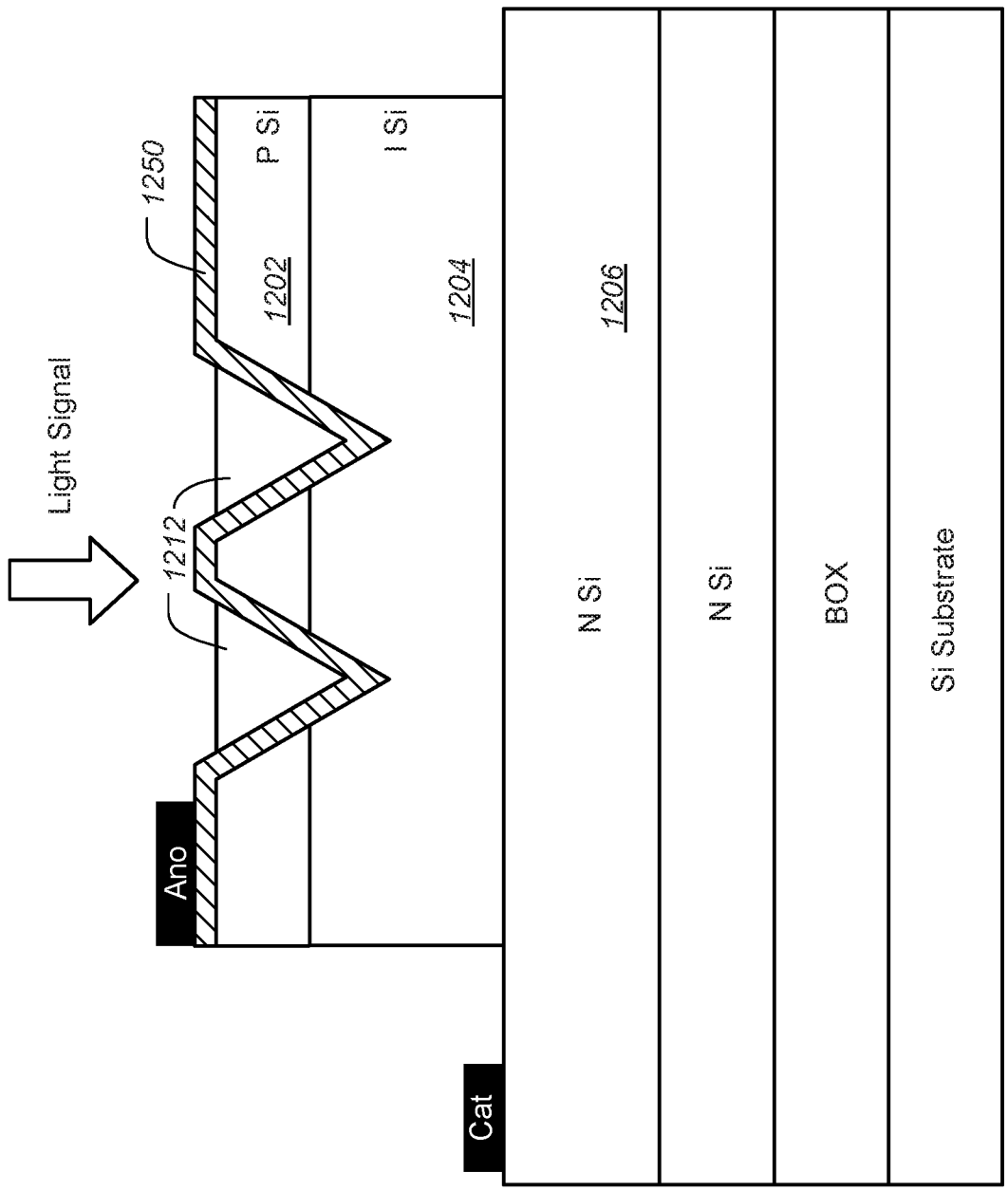
FIG. 12A is a simple cross-section of a MSPD/MSAPD (microstructure-enhanced avalanche photodetector) structure as in FIG. 10 but with the microstructure holes partially or entirely filled with a conductive material, according to some embodiments.

FIG. 12A is a simple cross-section of a MSPD/MSAPD structure as in FIG. 10 but with the microstructure holes partially or entirely filled with a conductive material, according to some embodiments. Examples of the conductive material 1250 includes a transparent conductive metal oxide such as indium tin oxide, and poly crystalline or amorphous silicon, germanium or other semiconductors. The microstructure holes can also be filled entirely or partially with a crystalline semiconductor such as silicon, GeSi, and/or Ge using epitaxial growth. In addition, in some cases, the microstructure holes can be coated partially or entirely with a thin metal such as Pt, Ni, Cr, Au, Cu, of thicknesses ranging from 1 nm to 100 nm or more. Light can also, or instead, impinge from the bottom through a via for example.

The addition of a conductive material can further accentuate the sharp and/or abrupt edges for concentrating high electric field to enhance the overlap of high electric field regions and high optical intensity regions for avalanche gain.

This can be applied to PIN, PN, PINP, or PIPIN structures, Schottky junctions of metal semiconductors, and MSM and MIN structures (where M is metal and S is semiconductor). The P and N can be interchanged.

The microstructure holes 1212 can be formed within the first doped region 1202, within the low doped region 1204 and/or can extend within the second doped region 1206. In all cases microstructure holes 1212 can traverse one or more of the regions. In some cases, as seen in FIG. 12A, the microstructure holes 1212 can be formed through the first doped region 1202 and protrude into the low doped region 1204.

The advantage of the MSAPD with avalanche gain prior to device breakdown voltage is that it can be more reliable and more robust in operations in environments with temperature swings from −40 degrees C. to 100 degrees C. for example than avalanche photodiodes operating at device breakdown voltages.

Without gain, the photodetector behaves as a MSPD and with gain the photodetector behaves as a MSAPD. Example applications of such devices can be in optical communication, LIDAR, single photon MSAPD, imaging, and optical sensors for detection of low light levels.

For example, fiber to the home requires the use of avalanche photodiodes at data rates ranging from 1 to 50 Gb/s and LIDAR (light direction and ranging) requires MSAPD for data rates less than 1 Gb/s but with timing jitter in the tens of picoseconds. LIFI (Light Fidelity—wireless communication using light to transmit information and position) is another area that can use MSAPD for free space optical communication. Night vision and high sensitivity imaging can also use MSAPD in a 2D array and in some cases in a 3D array to provide greater spectral information.

The microstructure holes in FIGS. 1-4, 8-10 and 12A-E, can be any shape at the surface and any cross-sectional shapes. For example, at the surface the microstructure holes can be circular, rectangular, square, triangular, polygonal, oval, amoebic, star, and/or any combinations of shapes in any pattern or non-pattern. The cross-sectional shapes can be funnel, inverted pyramids, conical, cylindrical, hourglass, ball like, oval like, pyramidal, trapezoidal, inverted trapezoidal, and/or any combination of thereof. In addition, one or more of the regions and/or layers can be GeSi alloy with Ge fraction ranging from 0 to 1.

In some cases the microstructure holes can be coated entirely or partially with a conductive layer such as metal, transparent conductive metal oxide, conductive polymer, conductive amorphous semiconductor, conductive spin on glass, crystalline and/or poly crystalline semiconductor that can further enhance the generation of high electric fields at sharp or abrupt edges. The increase in overlap of the high electric field and optical field or optical intensity can significantly enhance the quantum efficiency or external quantum efficiency (quantum efficiency and external quantum efficiency are used interchangeably as equivalent in this application), or responsivity as a function of reverse bias voltages. As can be seen in FIG. 11, high quantum efficiency or responsivity can be achieved at low reverse bias voltages and before the break down voltage. Responsivity can range from 0.3 to 10 over a voltage range of 0 to −35V at 850 nm and in some cases the responsivity at −2V can be greater than be 1.3 times greater than the responsivity at 0V at certain wavelengths. In some cases, the responsivity can be 1.5× or greater between 0 and −3V. In some cases, the responsivity can be 2× or greater between voltages of 0 and −10V. In some cases, the responsivity can be 3× or greater at voltages of −10V or higher than responsivity at 0V at certain wavelengths. Example wavelengths include 850 nm and in some cases wavelengths in the range 800 nm to 2000 nm.

With a conductive layer coating of the microstructure holes, the quantum efficiency can increase by 20% at a reverse bias voltage of −2V as compared to 0V at certain wavelengths. In some cases, the quantum efficiency can increase by 40% or more at voltages of −3V as compared to 0V. In some cases the quantum efficiency can increase by 2× or more at voltage range of −4 to −10V as compared to 0V at certain wavelengths. In some cases, the quantum efficiency can be 10× or more in voyage range of −4 to −30V as compared to the quantum efficiency at 0V at certain wavelengths. A comparable PIN photodiode without microstructure holes has less increase in responsivity at voltages 5 V from the breakdown voltage for example as shown in FIG. 11.

In some cases, the ratio of the change in responsivity over applied voltage can range from 0.02 to 1 A/(WV) or more for applied voltage higher than or equal to −2V (higher, greater, more in reverse bias voltage means a larger absolute value of the voltage, for example −3V is greater or higher or more than −2V). In some cases MSPD/MSAPD can have a responsivity/voltage slope of 0.01 A/WV or greater. In some cases the responsivity voltage slope can be 0.04 A/WV or greater. In some cases the responsivity voltage slope can be 0.08 A/WV or greater. In some cases the responsivity voltage slope can be 0.2 A/WV or greater. In some cases the responsivity voltage slope can be 0.4 A/WV or greater. In some cases the responsivity voltage slope can be 0.8 A/WV or greater. And in some case the responsivity voltage slope can be 1 A/WV or greater. The slope measurement can be in the range of −1V to −50V or more of reverse bias voltage (x-axis or voltage axis, see. FIG. 11). Wavelength can range from 800 nm to 2000 nm. As used herein the slope is defined as the absolute slope and where the applied voltage can be an absolute number (with negative voltage the A/WV slope is negative, for example).

In some cases, the quantum efficiency (QE)/V ratio (absolute) can range from 0.01 to 0.2 per volt or more. In some cases, the QE/V slope can be 0.005/V or more. In some cases, the slope can be 0.01/V or more. In some cases, the slope can be 0.05/V or more. In some cases, the slope can be 0.08/V or more. In some cases, the slope can be 0.1/V or more. In some cases, the slope can be 0.15/V or more. In some cases, the slope can be 0.2/V or more. In some cases, the slope can be 0.5/V or more. In some cases, the slope can be 1/V or more. In some cases, the slope can be 10/V or more. And in some cases, the slope can be 30/V or more. The voltage axis can span from −1V to −50V or more for calculating the QE/V slope which can be expressed in absolute number or just the magnitude of the number.

The increase in slope of the responsivity/V and QE/V can in some cases occur in the voltage span of −1 to −10 V. In some cases, the increase can occur in the voltage span of −2 to −10V. In some cases the increase can occur in the voltage span of −1 to −15V. In some cases the increase can occur in the voltage span of −2 to −15V. In some cases the increase can occur in the voltage span of −2 to −20V. In some cases, the increase can occur in the voltage span of −2 to −30V. And in some cases the increase can occur in the voltage span of −2 to −35V or more.

In some cases, one or more semiconductor layers can be Ge I GeSi where the Ge fraction can vary from 0 (all Si) to 1 (all Ge). The transparent metal oxide can be ITO, Mo-oxide, W-oxide, and in some cases transparent metal nitride, such as TiN. And in some cases, thin metal film with thickness less than 10 nm can be used. Metals used can include Al, Cr, Ni, W, Mo, Zr, V, Pt, Ti, Ta, Cu, Ag, and Au.

Figure 12B:
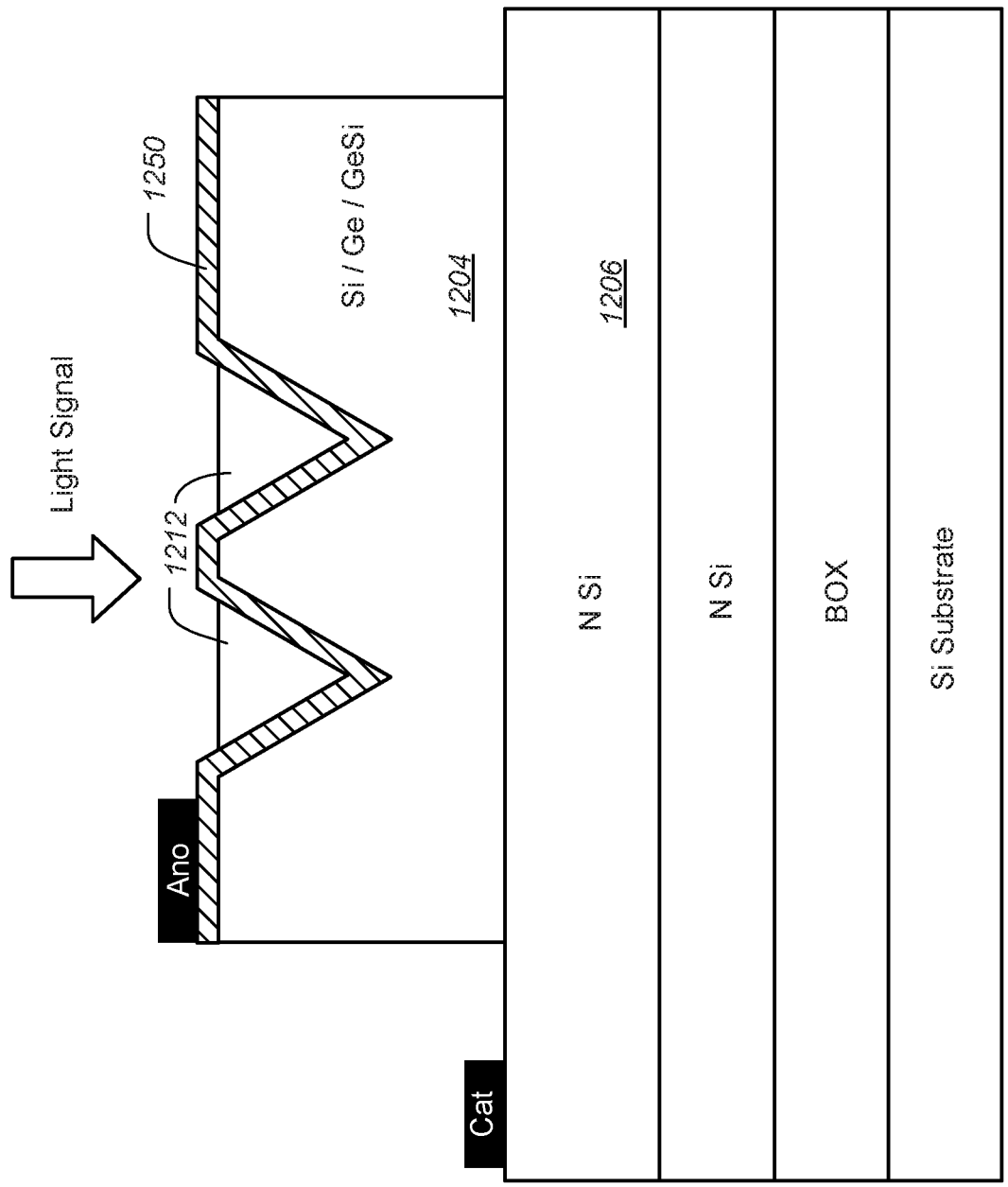
FIGS. 12B and 12C are similar to FIG. 12A and are shown without an upper P layer, according to some embodiments.
Figure 12C:
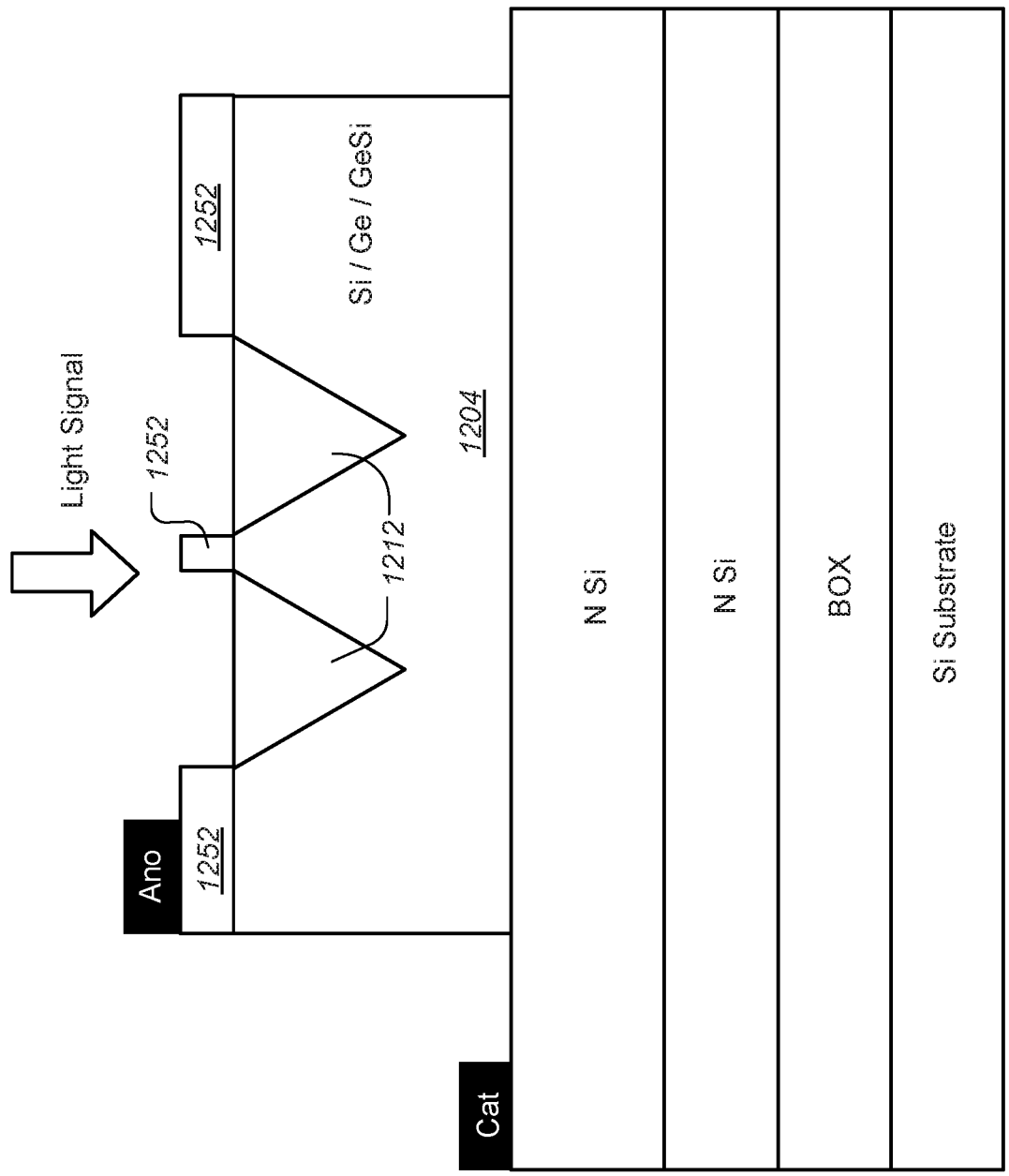

FIGS. 12B and 12C are similar to FIG. 12A and are shown without an upper P layer, according to some embodiments. In FIG. 12B, metal/transparent metal oxide/transparent metal nitride 1250 can be deposited directly on the I or low dope Si or Ge or GeSi layer 1204. In this example the metal and conducting oxide/nitride layers are also deposited in the microstructure holes 1212. In some cases, metal silicide layers can be used.

In FIG. 12C the metal/transparent metal oxide/transparent metal nitride/metal silicide 1252 is on the top surface of the I or low dope Si or Ge, or GeSi 1204 and not in the microstructure holes 1212. In some cases the metal/transparent metal oxide/transparent metal nitride I metal silicide 1252 can be partially in the microstructure holes.

Figure 12D:
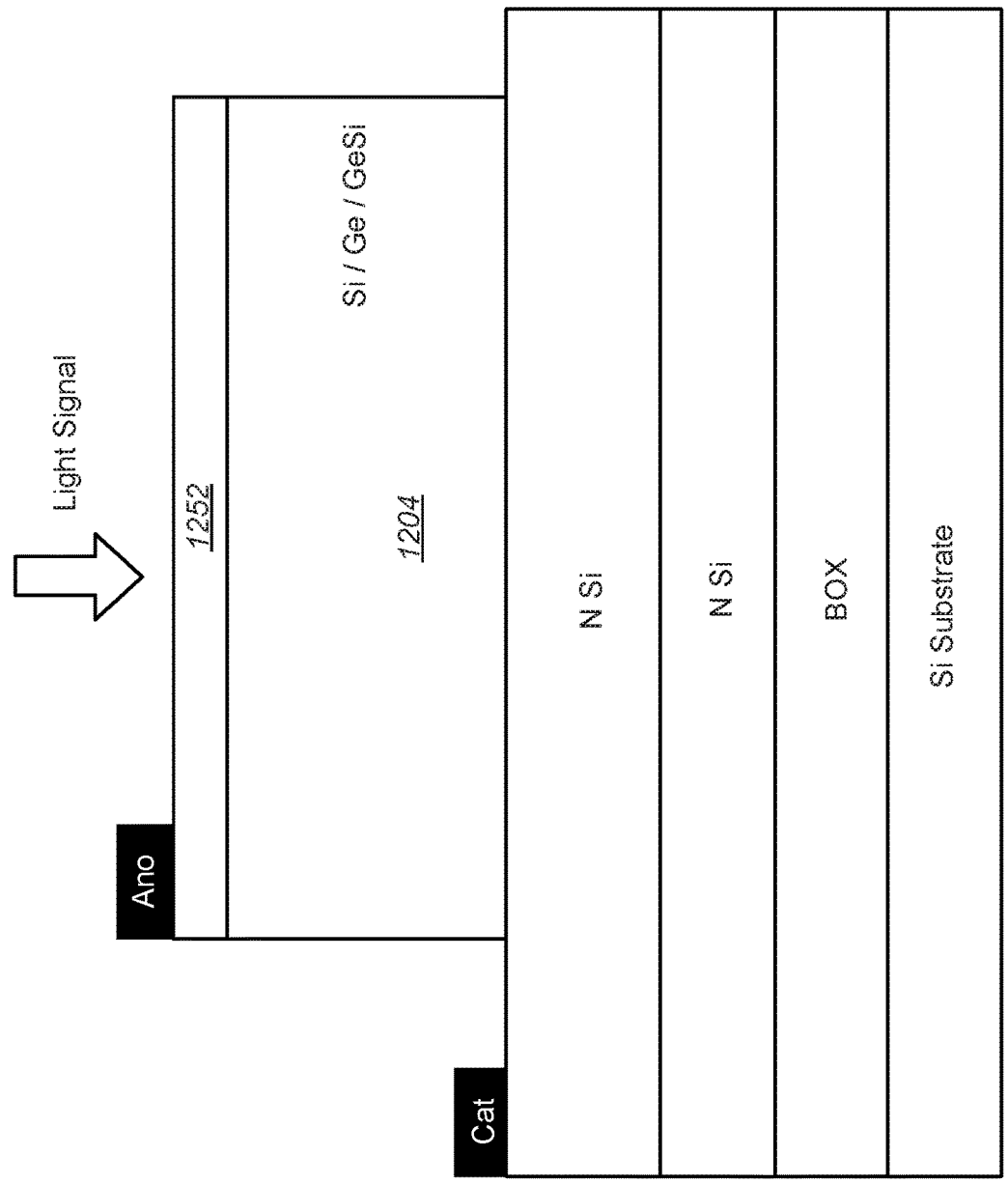
FIG. 12D is similar to FIG. 12C with the exception that no microstructure holes formed.

FIG. 12D is similar to FIG. 12C with the exception that no microstructure holes formed. In some cases, with strong optical absorption, photodetector structures without microstructure holes can be used at certain wavelengths. Photodetectors with microstructure holes can have higher external quantum efficiency than a similar photodetector without holes at certain wavelength.

Figure 12E:
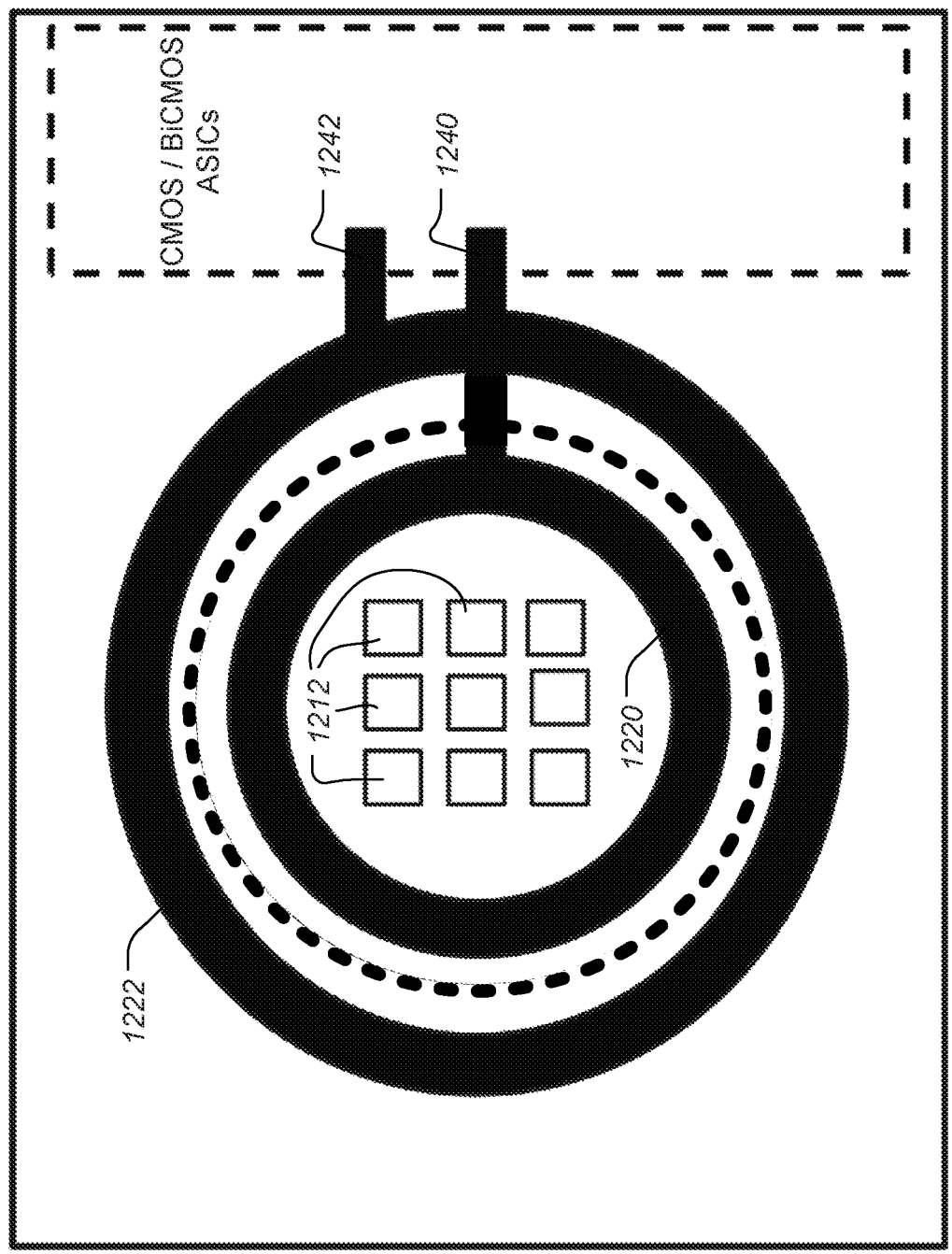
FIG. 12E is a simple schematic top view of a photodetector such as shown in FIGS. 12A-12D.

FIG. 12E is a simple schematic top view of a photodetector such as shown in FIGS. 12A-12D. In this example the photodetector has a circular geometry where the anode 1220 and cathode 1222 are concentric. In some cases, the geometry can be any polygon such as square or hexagon. In some cases, more than one photodetector can be monolithically integrated with CMOS BiCMOS ASICs. The photodetectors are connected to the CMOS BiCMOS ASICs with transmission lines 1240 and 1242. In some cases, the P and the N can be interchanged. This example can be for a microstructure photodiode, or a microstructure avalanched photodiode, or a microstructure single photon avalanche photodiode. Also visible in FIG. 12E is a mesa etch shown by the circular dotted line between the anode 1220 and cathode 1222.

In some cases, the BOX layer can be partially or fully etched away in regions under the photodetector, and in some cases the BOX layer can be fully or partially etched away under the CMOS BiCMOS ASICs region.

Figure 13:
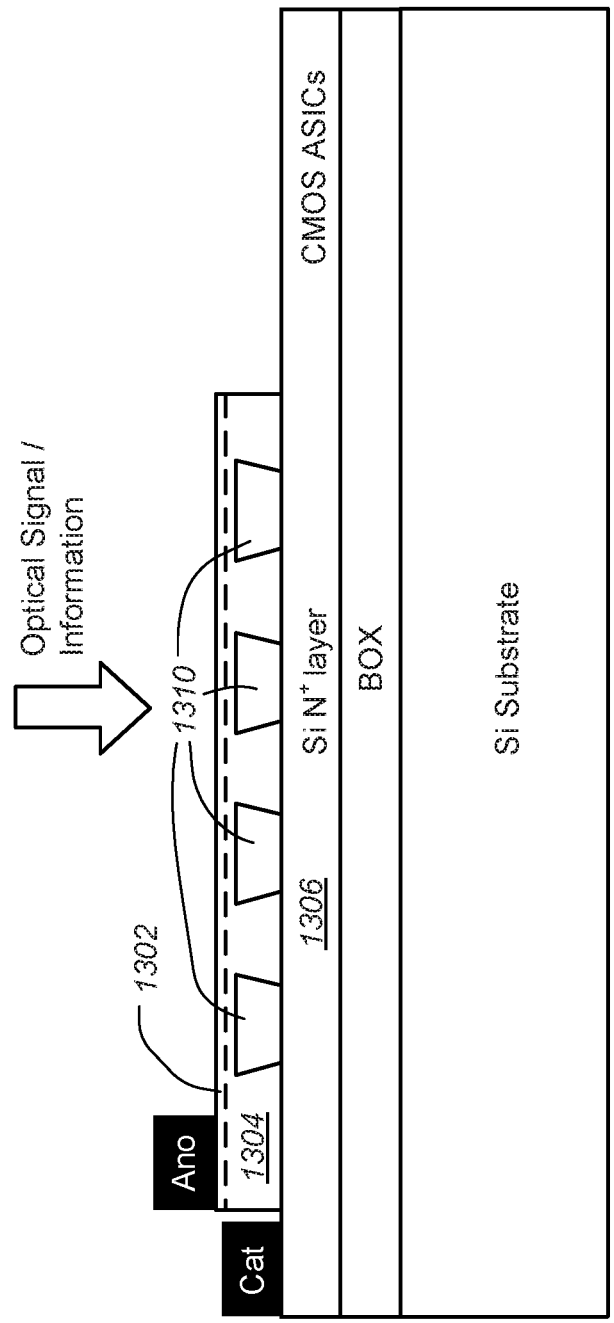
FIG. 13 is similar to FIG. 4 and is a schematic cross-section of GeSi and/or Ge selective area grown on Si monolithically integrated with CMOS/BiCMOS electronics.

FIG. 13 is similar to FIG. 4 and is a schematic cross-section of GeSi and/or Ge selective area grown on Si monolithically integrated with CMOS/BiCMOS electronics. In FIG. 13 the Ge and/or GeSi (where the Ge fraction can range from 0, pure Si to 1 pure Ge) 1304 can be grown over the dielectric islands 1310 to form a continuous or almost continuous top layer and where the dielectric islands 1310 can be buried and/or mostly buried. In some cases, the dielectric 1310 can be made of one or more of the following: silicon dioxide; silicon oxide; silicon nitride; silicon carbide; hafnium oxide; aluminum oxide; and germanium oxide. In some cases, the dielectric material in islands 1310 can re removed by etching to create a void in the Ge and/or GeSi alloy layer. In some cases, the island 1310 can be silicon or partially silicon covered with dielectric layer and in some cases not covered with dielectric layer or layers.

The Ge and/or GeSi layer 1304 can be formed using selective area growth epitaxially and in some cases not epitaxially, on Si 1306 with or without a low temperature Ge or GeSi buffer layer and the low doped region or I (not intentionally doped or intrinsic) region 1304 can have a thickness ranging from 100 nm to 2000 nm or more and can be followed by a highly doped P or N region 1302 with resistivity less than 0.01 ohm-cm. Region 1302 can have a thickness ranging from 50 nm to 200 nm or more. In some cases, the entire selective area growth layer 1304 can be I region or low doped with doping level less than $1\times10^{16}/cm^3$ for example and the P or N region 1302 can be formed by dopant diffusion and/or ion implantation of P or N type ions. In some cases, a thin metal contact (not shown) can be used on the I or low doped region to form a Schottky contact or a metal to semiconductor junction.

The lateral dimensions of dielectric islands 1310 can range from 200 nm to 3000 nm and can have square, polygon, triangular, circular, oval, star, amoebic and/or any other shapes and combination of shapes. The cross-sections can be different in different directions and can have pyramid or inverted pyramid, trapezoid or inverted trapezoid, single or multiple side wall angles, cylindrical, funnel, vertical, off vertical, curved, and any other cross-sections and combinations of cross-sections. The dielectric and/or oxide thickness can range from 1 nm to 2000 nm or more. In some cases during selective area epitaxial growth voids can be formed over areas and near areas with dielectric and/or oxide. These voids can also be used for photon trapping which can be a collective scattering or re-radiation of incoming photons that consequently are trapped in the higher refractive index regions such as the Ge or GeSi regions and in case of Si film between the top air interface and any interface with a different effective index.

The islands 1310 can have spacing ranging from 50 nm to 2000 nm or more and can be periodic and/or aperiodic and/or random in one or more directions. In some cases, the islands can have different size and shapes and depths and can be in a certain pattern or can be random in any of the characteristics of size, shape and depth.

Figure 14:
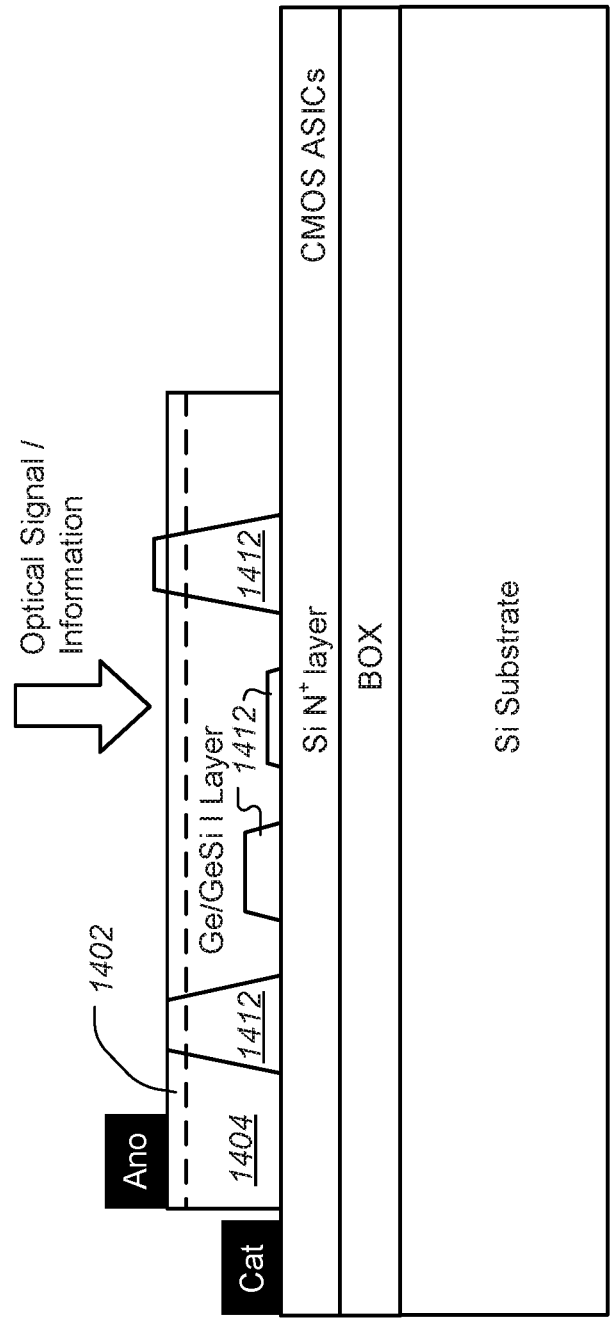
FIG. 14 is a schematic cross-section of epitaxial selective area growth of Ge or GeSi alloy on a patterned silicon surface that can have oxide on part or all of the sidewalls and top surface, according to some embodiments.

FIG. 14 is a schematic cross-section of epitaxial selective area growth of Ge or GeSi alloy on a patterned silicon surface that can have oxide on part or all of the sidewalls and top surface, according to some embodiments. The height of the patterned silicon islands or protrusions 1412 can be less than the thickness of the Ge or GeSi layer 1404 to greater than the thickness of the Ge or GeSi layer(s) 1404 as shown. In some cases, the N or P silicon islands or mesas 1412 can provide regions of high electric field in a PIN or NIP or PIPIN or NINIP or N+N–I–P–P+ or any photodiode or avalanche photodiode with PIN or NIP regions, such that avalanche gain can be achieved prior to breakdown voltage of the overall device. The width and shape of the silicon mesa or islands 1412 can be similar to the dielectric islands described with respect to in FIG. 13. In some cases, during selective epitaxial growth or epitaxial growth on patterned surfaces, voids can be formed which can be helpful in photon trapping. The trapped photons can have Poynting vector components in the plane of the surface or in the lateral directions. In some cases the entire layer 1404 can be an I region or low doped region for example and a P or N region 1402 can be formed by dopant diffusion and/or ion implantation of P or N type ions.

The electric fields in a PIN or NIP structure without microstructure holes are predominantly along the vertical direction or predominantly along the direction of incoming photons prior to impinging the surface of the PIN or NIP photodetector.

A reverse bias ranging from 0.1V to 50V can be applied to the anode and cathode. In some cases, the reverse bias voltage can range from 1V to 35V. In some cases, the reverse bias voltage can range from 1V to 10V (where only the magnitude of the voltage is shown, the anode is more negative than the cathode or a negative voltage is applied to the anode in respect to the cathode).

Selective area growth of Ge and/or GeSi can be preferred over a Ge or GeSi epitaxial growth over the entire wafer. Due to difference in lattice constant and thermal expansion coefficient as the wafer is cooled to room temperature, the difference in thermal expansion can cause the wafer to bow due to stress. Selective area epitaxial growth can grow Ge and/or GeSi only in the photodetector and transistor regions which are localized and microns in scale and thus will not bow the wafer. Selective area growth of Ge and/or GeSi can be relaxed or non-relaxed and may have local strain due to the mismatch in thermal expansion.

Ge or GeSi photodetectors where at least one region is Ge or GeSi, can operate at wavelength spanning from 800 nm to 2000 nm and in some cases from 800 nm to 1750 nm and in some cases from 1000 nm to 1550 nm and in some cases from 1250 nm to 1350 nm and in some cases from 830 nm to 1400 nm and in some cases from 100 nm to 1350 nm. Data rates can range from less than 1 Gb/s to 100 Gb/s or higher. In all cases, the Ge and GeSi MSPD/MSAPD (microstructure photodiode and microstructure avalanche photodiode) can be monolithically integrated with CMOS and/or BiCMOS application specific integrated circuits (ASIC) into a single chip with single and/or multiple MSPD/MSAPD devices that are surface illuminated form the top surface and/or form the bottom surface.

Applications of the MSAPD and MSPD include LIDAR, LIFI, Fiber to the home, data com, data centers, plastic optical fiber. imaging, to name a few.

As in FIG. 11 the addition of microstructure holes, microstructure islands or mesas can give rise to regions of higher electric fields that can result in higher responsivity for microstructured photodetectors than for a comparable photodetector without microstructures. The increase in responsivity can range from 2× to 10× or more at bias voltages below the device breakdown voltage that in some cases is called the device avalanche voltage.

Figure 15:
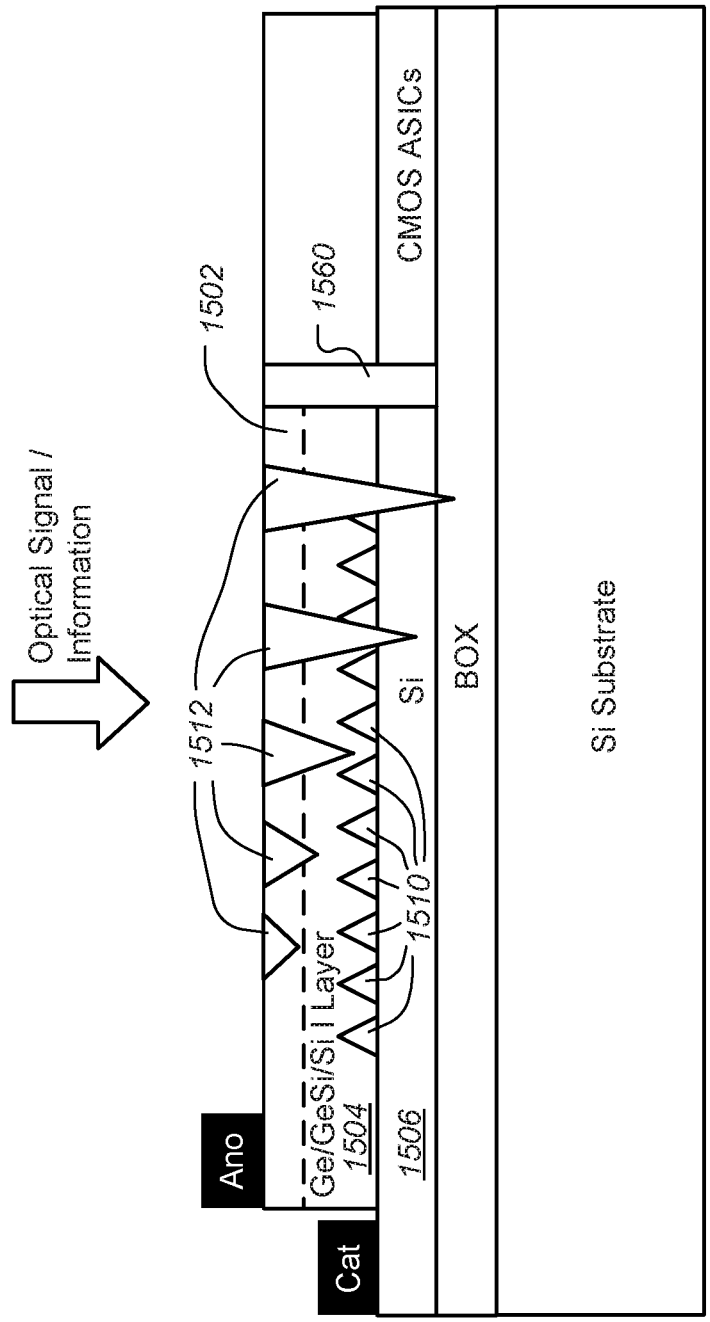
FIG. 15 is a schematic cross-section of a MSPD/MSAPD monolithically integrated with CMOS/BiCMOS ASICs, according to some embodiments.

FIG. 15 is a schematic cross-section of a MSPD/MSAPD monolithically integrated with CMOS/BiCMOS ASICs, according to some embodiments. The CMOS/BiCMOS ASICs can include one or more of the following functionalities: signal processing; signal display; signal conditioning; signal storage; and signal transmission. The silicon substrate can be pre-patterned with micro or nano structures such as mesas and/or holes prior to epitaxial growth or the pattern can be applied after the first doped layer is grown, for example the N+ layer. The pattern of micro/nano structures 1510 can be periodical, aperiodical, random and can have cross-sectional shapes ranging from pyramid, inverted pyramids, conical, polygonal, cylindrical, and/or any combination of shapes with lateral dimensions at the base ranging from 5 nm to 2500 nm and with depth or height ranging from 10 nm to 2000 nm or more.

In some cases the mesas and nano micro holes are not patterned and are dry etched into the substrate similar to black silicon process to depths and/or height ranging from 5 nm to 2000 nm or more.

Si and/or Ge and/or GeSi layers 1504 and 1506 can be epitaxially grown on the pattered surface and in some cases non-epitaxial process of deposition can be used with or without thermal anneal. For a PIN structure, a N+ layer or region 1506 can be grown followed by a low doped layer or region 1504 followed by a highly doped P+ layer or region 1502. Thickness of the doped layer(s) or regions can range from 50 nm to 500 nm or more and the low doped layer or region can have thicknesses ranging from 100 nm to 5000 nm and in some cases from 200 nm to 1500 nm. Microstructure holes 1512 can be etched either by dry etching or wet etch or a combination of both, in the top doped surface 1502 and can extend within the top doped region 1502. The microstructure holes 1512 can pass the top doped region 1502 and extend into the low doped region 1504. The microstructure holes 1512 can extend through the low doped region 1504 and/or into the second doped region 1506. In some cases the microstructure holes 1512 can extend to or into the BOX layer and in some cases BOX layer may be omitted and the microstructure holes can extend to or into the substrate. The BOX layer is all cases can be optional, however BOX layers can provide a greater refractive index contrast and in some cases the BOX layer can be selectively etched entirely or partially away. In some cases, high bandwidth CMOS/BiCOMOS (complementary metal oxide semiconductor/bipolar complementary metal oxide semiconductor) preferably are formed on SOI (silicon on insulator) wafers.

Dimensions of the microstructure holes 1512 can range from 100 nm to 3000 nm and in some cases from 500 nm to 2000 nm at their largest lateral dimensions and can be rectangular, triangular, polygonal, circular, oval, star, amoebic and any combination and summation of shapes. The cross-sectional shapes can be inverted pyramids, conical, funnel, trapezoidal, cylindrical, oval and any combination and summation of shapes. The microstructure holes 1512 can be periodic, aperiodic, random in distribution across the surface of the photodetector. Spacing between adjacent microstructure holes can range from 50 nm to 2500 nm. The photosensitive lateral dimension of the MSPD/MSAPD can range from 5 micrometers to 1000 micrometers or more and in some cases from 20 micrometers to 5000 micrometers depending on bandwidth and applications.

The textured substrate can further concentrate the high electric filed to provide a higher overlap of the trapped optical modes with regions of high electric field to provide enhancement of the responsivity through avalanche gain at low reverse bias or at bias below the breakdown voltage of a PIN or NIP photodetector. In some cases, the PIN can be PP–N or PN–N or PN or NP.

High responsivity MSPD/MSAPD are useful for both data communication and LIDAR applications. Market size for both applications are or are projected to be in the multibillion dollar per year range and monolithic integration can be a key factor to reduce the cost of the optical transceivers and LIDAR in some cases by up to and over 99%. Surface illuminated arrays of MSPD/MSAPD used for CWDM (coarse wavelength division multiplexing) are less temperature sensitive and more robust in data center interconnect applications than integrated waveguide multiwavelength optical circuits.

For LIDAR applications Si MSPD/MSAPD can be integrated in high density arrays with electronics and with photon trapping can extend the wavelength to 1100 nm and with avalanche gain can have responsivity 2× to 10× or more over a comparable conventional Si photodetector at the same reverse bias. With the addition of Ge and GeSi alloy the wavelength can be extended to range from 800 nm to 1800 nm or more and can also be integrated in a high-density array with electronics on a single silicon chip. With avalanche gain, the responsivity can be 2× to 10× or more at certain wavelengths at a certain reverse bias voltage over a similar Ge or GeSi photodetector without microstructure holes. In all cases, at least one of the region or layers can be GeSi where the Ge fraction can range from 0 to 1. Also visible in FIG. 15 is isolation trench 1560.

Figure 16:
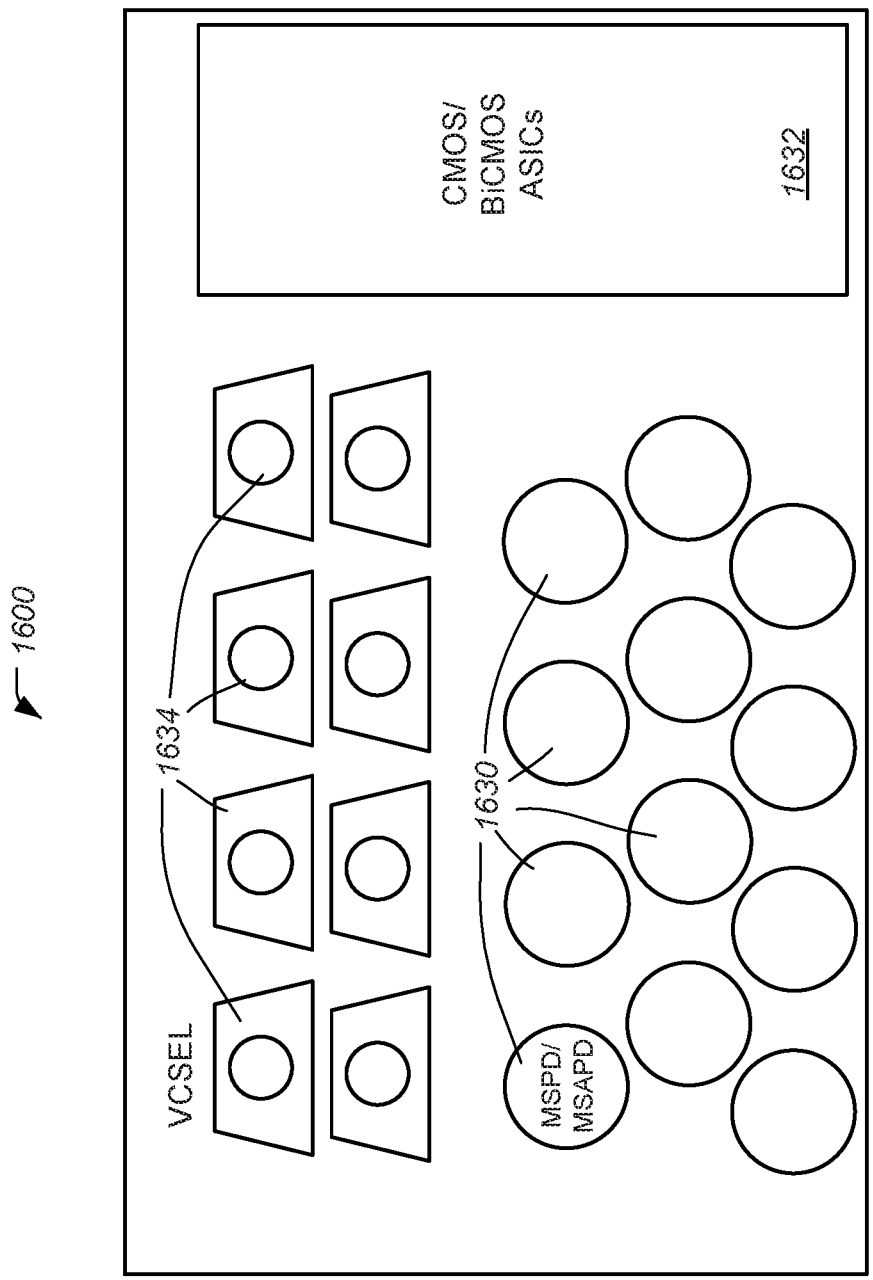
FIG. 16 is a plan view schematic of a single silicon chip that includes vertical cavity surface emitting lasers, MSPDs/MSAPDs and CMOS/BiCMOS ASICs, according to some embodiments.

FIG. 16 is a plan view schematic of a single silicon chip that includes vertical cavity surface emitting lasers, MSPDs/MSAPDs and CMOS/BiCMOS ASICs, according to some embodiments. The MSPD/MSAPD/MS-SPAD (microstructure photodiode, microstructure avalanche photodiode, microstructure single photon avalanche photodiode) arrays 1630 in 1 dimension, 2 dimension and 3 dimension, can be monolithically integrated with optical receiver ASIC electronics and transmitter ASIC electronics 1632 can also be monolithically integrated on to the same single silicon chip 1600. The monolithic integration can include buried electronic transmission lines from the photodetectors 1630 to the ASICs 1632 and from the ASICs 1632 to the VCSELs 1634. Reverse and forward biasing can be included in the ASICs 1632. The VCSELs 1634 are III-V material family and can be integrated using heterogeneous material growth, wafer bonding of the III-V material to the silicon, epitaxial lift off techniques and in some cases fluidic assembly. In the case of assembly, pits can be etched into the silicon with buried electrode transmission lines contacting the bottom of the VCSEL and/or a separate electrode transmission line contacting the top or near the top of the VCSEL. According to some embodiments, both electrodes/transmission lines can contact the top or near the top surface of the VCSEL. The VCSELs 1634 can have beam leads with solder balls such that by dropping each VCSEL into a dedicated pit, the solder balls/beam leads can make contact with the electrode/transmission lines. In addition, solder balls can be attached to the bottom of the pit such that with thermal heating the VCSEL can be attached to the bottom of the pit which can also include a thermal heat sink such as a copper slug that can extend to external heat sinks to pull heat away from the VCSELs. In some cases the VCSEL can include a metal that can attract to magnetic fields such as ferromagnetic, paramagnetic materials, for example nickel, iron, rare earth, to name a few. An opposite pole magnetic material can be deposited on the back of the VCSEL and the bottom of the pit such that the VCSEL chip can self assemble in the pit. In some cases, the pit shape and the VCSEL shape are certain shapes such that the VCSEL chip can fit in only one way, such as when using a trapezoidal shape. The protruding beam leads on the VCSEL prevents the VCSEL chip from entering the pit with the laser-emitting surface down. In some cases, magnetic layers may not be used. In some cases, the pit can be funnel shaped and the VCSEL chip can be funnel shaped and trapezoidal for example so that the VCSEL can fit into the pit only in one orientation. In some cases, bean leads may not be used. Attachment of electrodes/transmission lines the VCSEL can be accomplished with additional masking and processing steps. The ASICs 1632 can comprise plural active electronic circuits, each coupled with a respective photodetector 1630 or a respective group of photodetectors 1630 to process electrical output thereof. In addition, one or more of the active electronic circuits 1632 can be coupled with one or more respective VCSELs 1634 to drive them as needed. The individual active electronic circuits can be in any suitable configuration such as in a linear array, in a 2D array, of in a vertical arrangement such as a 3D array.

In some cases, the pits can be oriented at different angles such that VCSELs in the array can project beams of light at different angles. In some cases, groups of VCSELs in the array can have a different angle than other groups of VCSELs in the array. Group can be one or more VCSELS.

In some cases, self-assembly can include fluid and/or liquid. In some cases, the silicon monolithic chip can be shaken in a fluid to assist in self-assembly. In some cases, the self-assembly can be accomplished at wafer scale level before the monolithic silicon ships are diced into separate chips. In some cases, the entire fabrication process and assembly are completed at wafer scale level. In some cases, after assembly at wafer scale level, the monolithic integrated chip together with the VCSELS is hermetically sealed.

Figure 17:
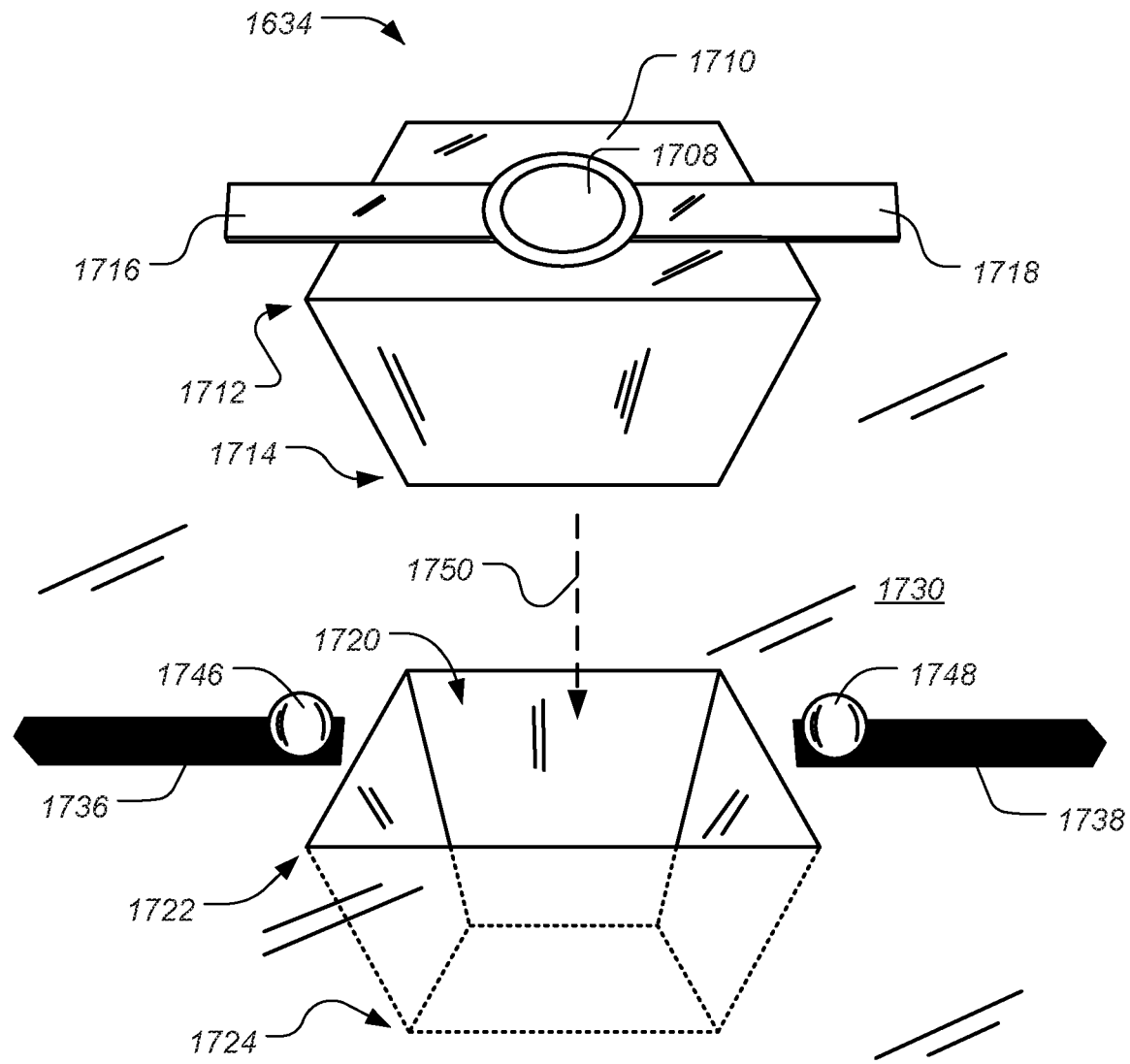
FIG. 17 is a schematic perspective view of a beam lead trapezoidal-shaped tapered VCSEL chip that fits into a receptacle trapezoidal pit etched in a silicon monolithic integrated chip, according to some embodiments.

FIG. 17 is a schematic perspective view of a beam lead trapezoidal-shaped tapered VCSEL chip that fits into a receptacle trapezoidal pit etched in a silicon monolithic integrated chip, according to some embodiments. The VCSEL chip 1634 has emitter 1708 mounted in a body 1710 that is trapezoidal-shaped when viewed from the top. The body 1710 is also tapered such that it is larger at the top end 1712 then the bottom end 1714. The VCSEL chip 1634 also includes two beam leads 1716 and 1718 that protrude laterally above the upper end 1712 of the body 1710. On the upper surface 1730 of the single silicon chip 1600 (shown in FIG. 16) a pit 1720 is formed that matches the shape of the VCSEL chip 1634. In particular the pit 1720 is trapezoidal-shaped when viewed from the top. The pit 1720 is also tapered such that it is larger at the top end 1722 then the bottom end 1724. Due to the shape and tapering of both the VCSEL 1634 and pit 1720, the VCSEL can only fit in the pit in one orientation as shown by the dashed arrow 1750.

Solder balls 1746 and 1748 can be attached to the transmission lines 1736 and 1738 respectively. When the VCSEL 1634 is placed within the pit 1720 the beam leads 1716 and 1718 can be soldered by applying heat to the transmission lines 1736 and 1738, respectively. Solder can also be placed on the bottom of the beam leads of the VCSEL.

Using fluidic self-assembly at wafer level can greatly reduce the manufacturing cost of the transceiver array or transceiver single emitter and receiver for data center application. Using such technologies can reduce the cost of transceivers by up to and over 90%. Similar technology can also be applied to transmitter and receiver arrays for LIDAR applications. In some cases, cost reductions of the LIDAR by up to and over 99% can be achieved.

Figure 18:
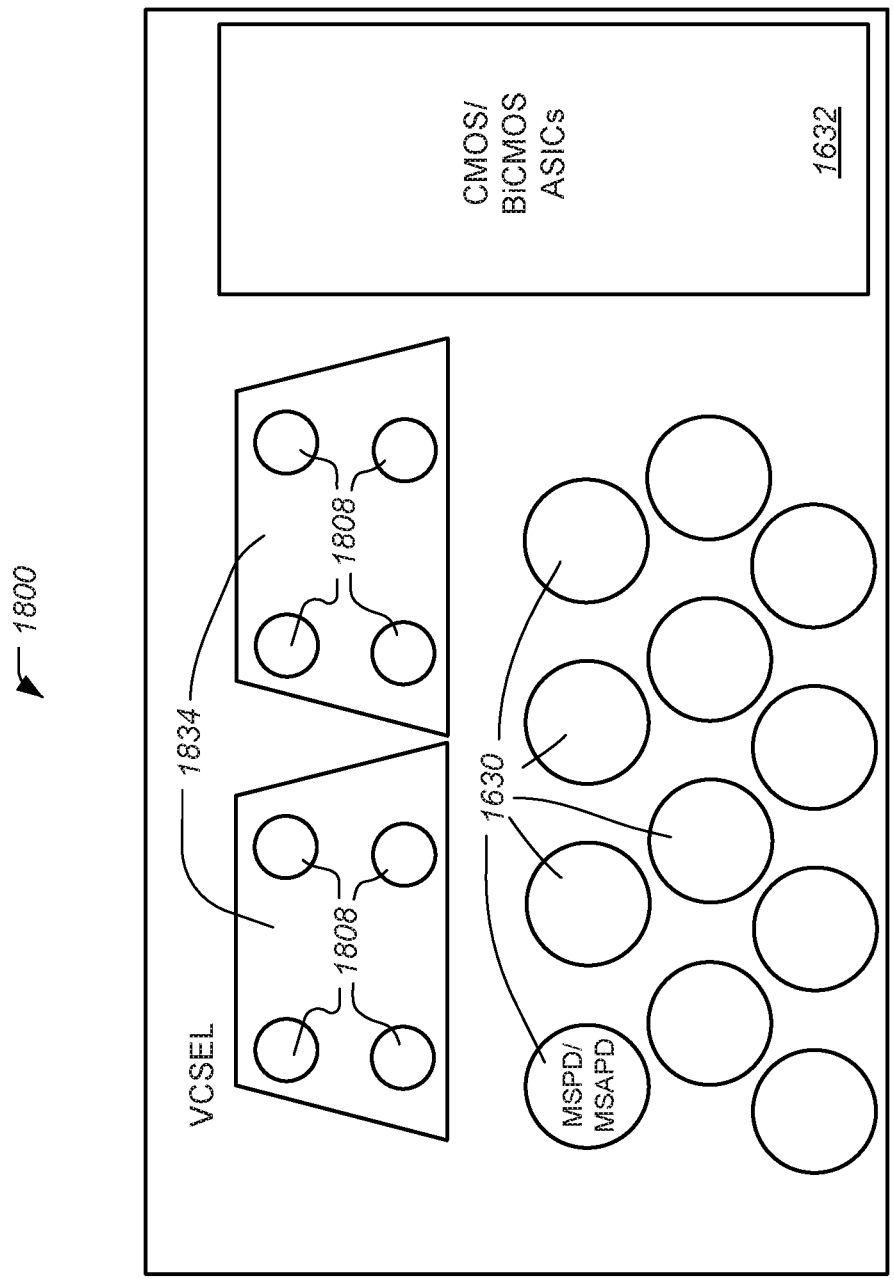
FIGS. 18 and 19A are plan views of a chip similar to that shown in FIG. 16 but with multiple VCSELs included in each chip body.
Figure 19A:
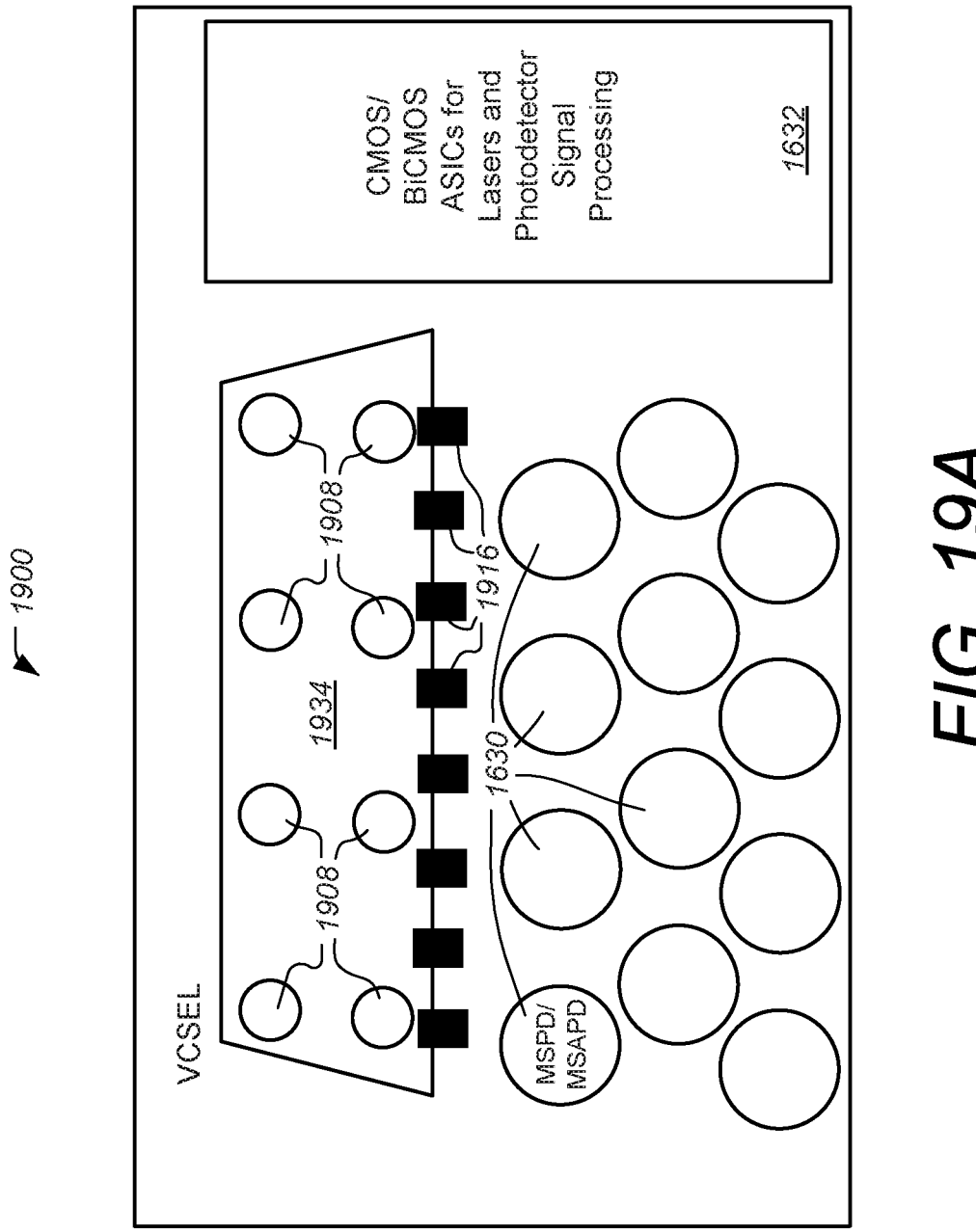

FIGS. 18 and 19A are plan views of a chip similar to that shown in FIG. 16 but with multiple VCSELs included in each chip body. In the case of FIG. 18, single silicon chip 1800 includes photodetectors 1630, one or more ASICs 1632, as shown in FIG. 16 as well as VCSEL chips 1834 that each include four VCSELs 1808. In the case of FIG. 19A, single silicon chip 1900 includes photodetectors 1630, ASICs 1632, as shown in FIGS. 16 and 18 as well as VCSEL chip 1934 that includes eight VCSELs 1908. Note that although the examples shown in FIGS. 18 and 19A show four and eight VCSELs in each chip, in general other numbers of VCSELs can be arranged in each chip.

In some cases, fluidic self-assembly of VCSELs can be thought of as using a pill tray for counting pills in a pharmacy where once all the pill holes are filled the excess pills are poured back into a bottle and those trapped in the pill holes are poured into a separate bottle for the customer.

In some cases, rather than one orientation such as a trapezoid, two or more orientation can be used such as a rectangle or square if the VCSEL chip electrodes and the transmission line electrodes have redundancy and symmetry. For example, for a rectangular shape VCSEL chip containing one or more VCSELS, the electrodes such as beam leads can be one polarity on one side and opposite polarity on the other side. This way the VCSEL chip can fit in a rectangular pit and contact the transmission line electrodes with the correct polarity. This can be extended to the case of a square pit where the VCSEL chip can have 4 pairs of electrodes, one pair from each side. This added orientational freedom from 1 to 4 can allow greater success and yield of fluidic self-assembly.

In some cases, for optical interconnect applications, each VCSEL will have its own set of electrodes and transmission lines so that if a VCSEL chip contains more than one VCSEL, additional pairs of electrodes and beam leads may be needed. Similarly, for LIDAR applications if each VCSEL is pulsed separately then each VCSEL will need additional pairs of beam lead electrodes, however if groups of VCSELs are pulsed together than the number of beam lead electrode can be reduced correspondently, In some cases a BOX (buried oxide) layer is not provided. In some case the BOX can be etched partially and/or entirely away from areas under the MSPD/MSAPD using micro trenches within or without the MSPD/MSAPD photosensitive areas. In some cases it can be desirable to etch partially and/or entirely away the BOX layer in certain areas under the CMOS/BiCMOS electronics to further enhance the performance of the electronics with possible reduction of parasitics.

Thermal oxidation can be used to passivate surfaces under the MSPD/MSAPD and/or CMOS/BiCMOS electronics exposed with the removal of the BOX layer.

In some cases, any of the layers or regions can be GeSi, or at least one of the layers can be GeSi. The Ge fraction can range from 0 "pure silicon" to 1 "pure Germanium".

In some cases, at least one of the doped layers such as the P layer for example can be replaced with a thin metal layer and/or transparent conducting metal oxide layer such as Indium Tin Oxide. The metal or metal oxide layer can have microstructure holes. And in some cases, the metal layer and/or metal oxide layer can be without microstructure holes. For example, in the case of selected area growth where microstructure oxides are used to define regions without semiconducting material, these oxides can also be used to define micro structure holes in the selected area growth of semiconductors such as Germanium and/or Germanium Silicon alloy on Silicon for example. In this case the metal and/or metal oxide layer can be a continuous layer across the surface of the selected area grown semiconductor. The metal or metal oxide film can range in thickness of 0.5 nm to 1000 nm or more. In some cases, from 1-10 nm. Microstructure holes the lateral dimensions can range from 10 nm-3000 nm. And in some cases, from 200 nm-2000 nm. The vertical depth of the holes can range from 1 nm-3000 nm and in some cases the microstructure holes can exist only in the metal or metal oxide layer, and in some cases the depth of the holes can be partially etched into doped region and/or partially etched into the I region.

In some cases, the metal film and/or metal oxide can be on the surface of the doped layer with microstructure holes. And in some cases, the metal film or metal oxide layer can be on the doped layer without microstructure holes. And in some cases in certain areas the metal film or metal oxide film can have microstructure holes that are coincidental with holes in at least one of the PIN layers MSPD/NSAPD structure.

FIG. 19A is a simple partial top view of a fluidic assembled surface emitting lasers 1908 with monolithic integrated photodetectors 1630 and CMOS/BiCMOS ASICs electronics 1632 for both the laser array and the detector array and all signal processing electronics for both transmitters and receivers. Also shown are beam-lead tabs 1916 connecting the laser array chip to transmission lines that are connected to the CMOS/BiCMOS ASICs 1632. The fluidic assembled array chip into the silicon chip can be attached with solder bump technologies. Fluidic assembly is also discussed in Zheng et al, Fluidic Heterogeneous Microsystems Assembly and Packaging, Journal of Microelectromechanical Systems, Vol. 15, NO. 4, August 2006, which is incorporated herein by reference. Not shown are optical fibers and other optical lens assembly for directing the laser light and for coupling to the photodetectors. In some cases robotic assembly can be used in conjunction with fluidic assembly or by itself.

Figure 19B:
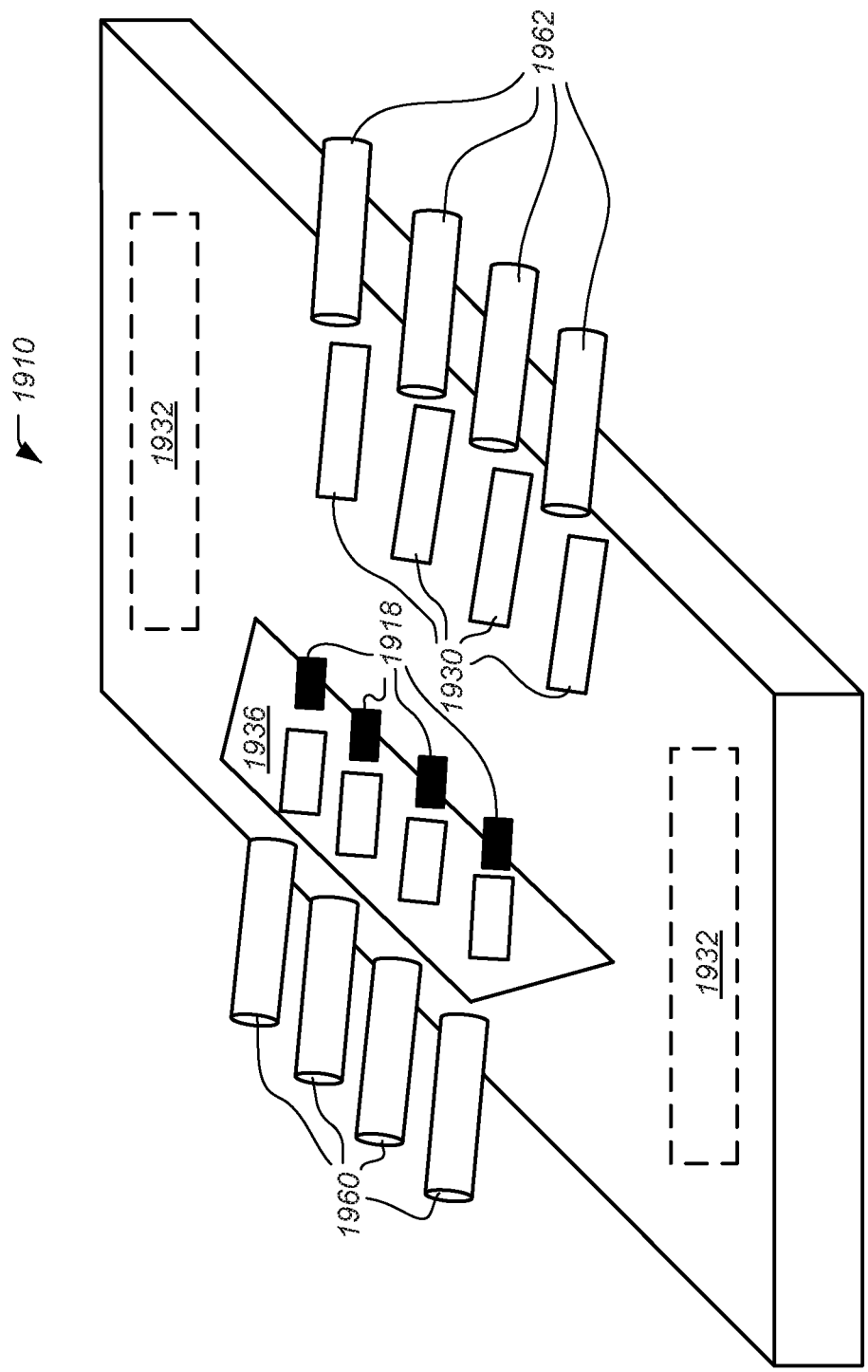
FIG. 19B is a perspective view of a single chip similar to FIG. 19A but using edge emitting rather than surface emitting lasers.

FIG. 19B is a perspective view of a single chip similar to FIG. 19A but using edge emitting rather than surface emitting lasers. The single chip 1910 can be fluidically assembled as in FIGS. 16-18 and 19A. The laser array chip 1936 in this case is edge emitting rather than surface emitting. Also shown are beam-lead tabs 1918 connecting the laser array chip 1936 to transmission lines that are connected to the CMOS/BiCMOS ASICs 1932. The laser array chip 1936 is coupled to optical fibers 1960 with V-grooves (not shown) for precision alignment of the optical fibers 1960 to the fluidic assembled laser array. Similarly waveguide type photodetectors 1930 can be monolithically fabricated on Si and can be coupled to optical fibers 1962. CMOS/BiCMOS electronics 1932 for both the laser array and detector array can be monolithically integrated on the single silicon chip 1910.

Figure 20A:
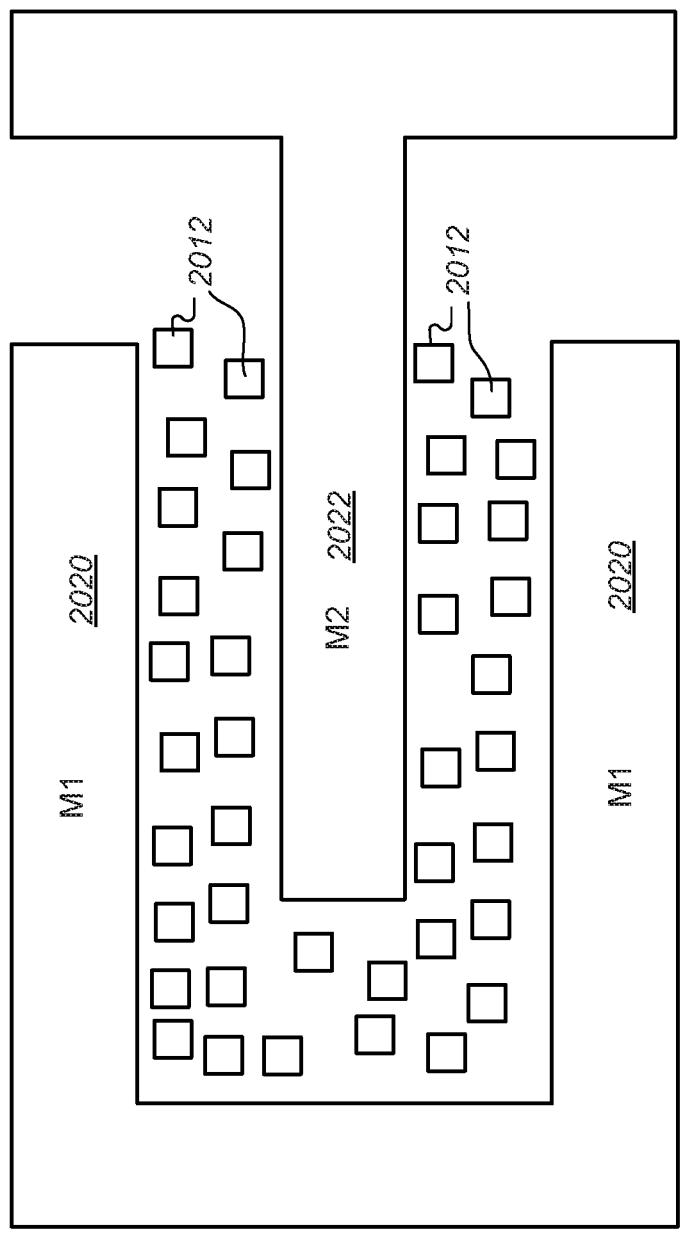
FIG. 20A is a simple schematic of a partial top view of an inter-digitated microstructure photodetector, according to some embodiments.

FIG. 20A is a simple schematic of a partial top view of an inter-digitated microstructure photodetector, according to some embodiments. For simplicity, only one and a half periods of the inter-digitated electrodes are shown. Light trapping microstructure holes 2012 are shown between the inter-digitated electrodes 2020 (M1) and 2022 (M2). M1 and M2 are electrodes/transmission lines connecting the electrode "digits". The electrodes/transmission lines are connected to CMOS/BiCMOS application specific integrated circuits (ASIC) (not shown) for monolithic integration of micro-structured photodetectors with signal processing electronics on a single silicon chip. Arrays of microstructure hole photodetectors can be integrated with CMOS/BiCMOS ASIC's for high speed Datacom applications arrays such as 1×4 or N×M where N and M can be any digits for transmitting aggregated data rates of 100 Gigabits or more and in some cases 400 gigabits or more at wavelength from 800 to 1100 nanometers for silicon I or low dope layers from 800 to 1600 nanometers for Ge/GeSi I or low dope layers. For light direction and ranging (LiDAR) arrays of microstructure inter-digitated photodetectors can be used to detect time of flight signals with hundreds of picoseconds or less time resolution and high responsivity of 0.2 A/W or more and in some cases 0.5 A/W or more and in some cases 1.0 A/W or more for certain wavelength in the range of 800 nanometers to 1650 nanometers. These inter-digitated microstructure hole photodetector can be a photodiode with a PIN structure or with metal/semiconductor/metal structure (back to back Schottky diodes) or avalanche photodiodes with PIN, PIPN, PIPIN structures. Light can impinge normal to the surface. The microstructure holes 2012 can be interspersed between the electrodes M1 (2020) and M2 (2022). And in some cases, microstructure holes 2012 can intersect or even be part of the electrode. M1(2020) can be an anode and M2 (2022) can be the cathode for a PIN or PIPN or PIPIN structure.

The lateral dimension or the photo sensitive inter-digitated region can range from 10 micrometers to 500 micrometers for optical data communication applications. The lateral dimension of the microstructure photo sensitive inter-digitated region for LiDAR applications can range from 30 micrometers to 1 centimeter or more. The width of the electrodes 2020 and 2022 can range from 10 nanometers to 1000 nanometers. The electrodes can comprise metal such as aluminum, copper, titanium, nickel, and chrome. And it can be a combination of metal and silicide—such as aluminum silicide, platinum silicide to name a few. The spacing between the inter-digitated electrodes for optical data communication application can range from 0.4 micrometers to 10 micrometers or more, and in some cases from 0.5 micrometers to 5 micrometers. For LiDAR application the spacing between the inter-digitated electrodes can range from 0.5 micrometers to 500 micrometers or more. In some cases the spacing for LiDAR application from 2 micrometers to 100 micrometers.

The microstructure holes 2012 can have any shape such as square, rectangular, polygonal, circular, oval or amoebic shapes, or any combination of shapes. Lateral dimension of the holes can range from 100 nanometers to 3000 nanometers or more, and the spacing between the adjacent holes can range from 0 nanometers (i.e. "intersecting" or "touching") to 3000 nanometers. In some cases, the hole spacing can range from 0 nanometers to 1500 nanometers. In some cases, the hole spacing can range from 100 nanometers to 1500 nanometers. The spacing of the holes can be periodic and/or aperiodic and/or random, and/or any combination of periodic, aperiodic and random.

Electrodes M1 (2020) and M2 (2022) are connected to transmission lines to the CMOS/BiCMOS electronics (not shown) for signal processing and biasing. Reverse bias voltage is applied across the anode and cathode at voltages ranging from −0.1 volt to −50 volts or more, and in some cases from −1 volt to −35 volts or more.

For high speed operation of the inter-digitated microstructure hole photodetector, photo generated carriers outside of the high field inter-digitated region can contribute to a slow diffused current that can degrade the high speed response of the device. To reduce the generation of photo generated carriers outside the high field region of the inter-digitated electrodes, a mesa can be etched such that the inter-digitated electrodes are confined to area on top of the mesa. In some cases the electrode can extend off the mesa. In some cases, instead of a mesa, a trench (e.g. a moat) can be etched around the inter-digitated electrodes, and in some cases the electrodes can extend into the moat. In some cases, in place of a mesa, areas outside the inter-digitated region can be ion implanted at a very high dose to reduce the lifetime of the photo generated carriers outside the high field region. In some cases, the inter-digitated electrodes can extend into the ion implanted region. Ions that can be used to reduce the lifetime can be N or P dopants ions and/or inert ions such as H, He, N, O and Ar. The inert ions are used to create an amorphous semiconductor region in areas where they are implanted. The carrier lifetime can thereby be significantly reduced, to the picosecond range.

The photo sensitive area under the inter-digitated electrodes can be a square, rectangular, polygonal, and circular. The lateral dimension for a square or circle shape for example can range from 10 micrometers to 100 micrometers or more. In some cases, the lateral dimension can range from 5 micrometers to 100 micrometers or more. In some cases, the lateral dimension can range from 5 micrometers to 1000 micrometers or more. In some cases, the lateral dimension can range from 10 micrometers to 10,000 micrometers or more. For data rate bandwidth of 10 to 100 Gb/s the lateral dimensions can range from 5 micrometers to 100 micrometers. For data bandwidth less than 5 Gb/s the dimension can range from 50 to 250 micrometers, and for data bandwidth and/or speed of response of the photodetector of less than 1 Gb/s the lateral dimension can range from 50 micrometers to 1,000 micrometers or more.

In some cases, the inter-digitated electrodes can be transparent and/or semi-transparent metal oxide and/or metal nitride such as indium tin oxide, and I or titanium nitride, and/or silicide. In some cases, the inter-digitated electrodes can be covered with amorphous semiconductor such as Si, Ge, GaAs, to name a few to reduce reflection from the inter-digitated electrodes.

Figure 20B:
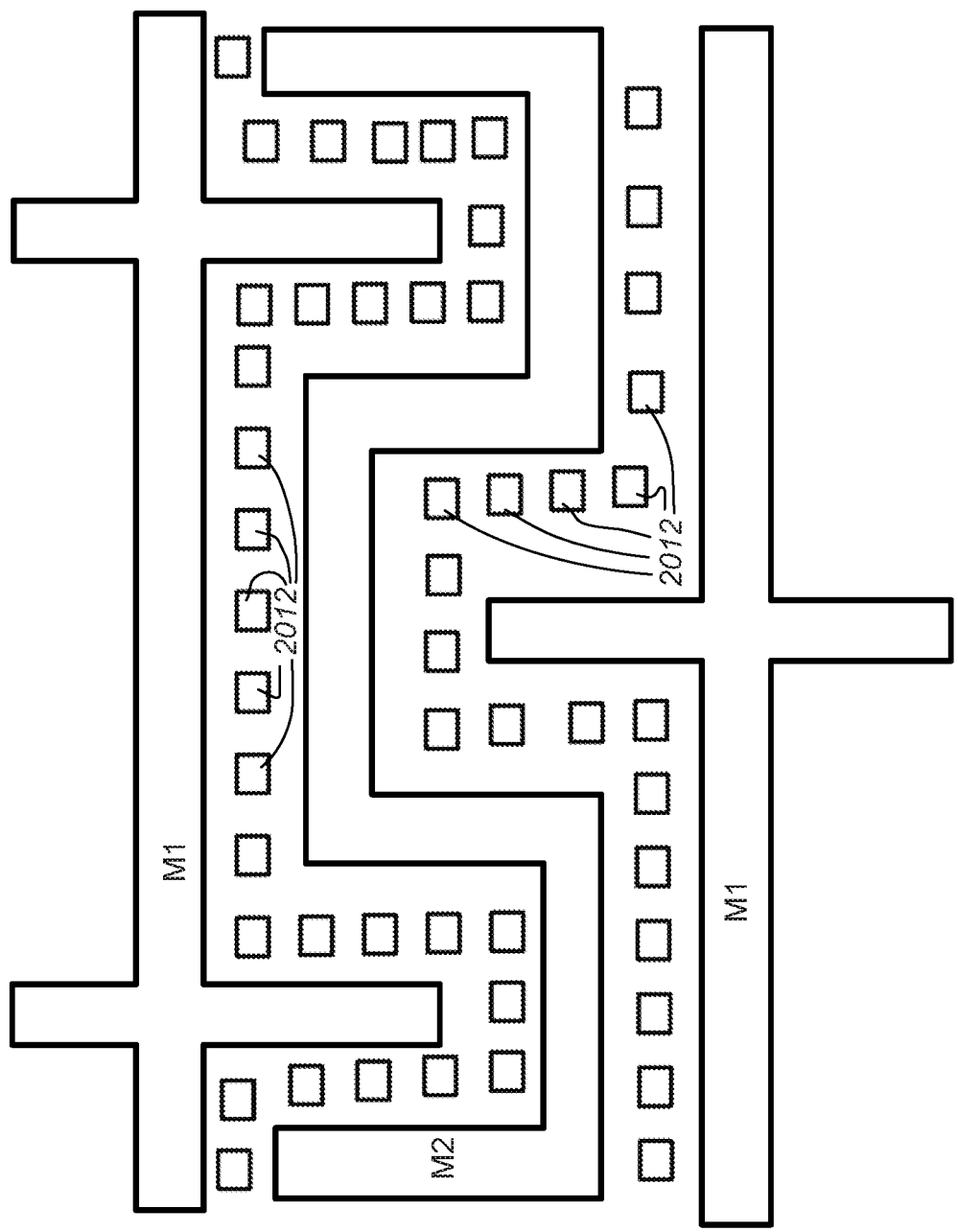
FIG. 20B is a simple schematic partial plan view of an inter-digitated photodetector with microstructure holes, according some embodiments.

FIG. 20B is a simple schematic partial plan view of an inter-digitated photodetector with microstructure holes, according some embodiments. In the case of FIG. 20B the electrodes M1 and M2 "meander" and the microstructure holes 2012 are interspersed between the electrodes M1 and M2. The meandering electrodes can reduce optical polarization sensitivity or the inter-digitated microstructure hole photodetector such that there are approximately equal horizontal and vertical electrodes. The M1 and M2 electrodes are connected to metal transmission lines to the silicon CMOS, BiCMOS electronics for signal processing and biasing of the photodetector.

Figure 20C:
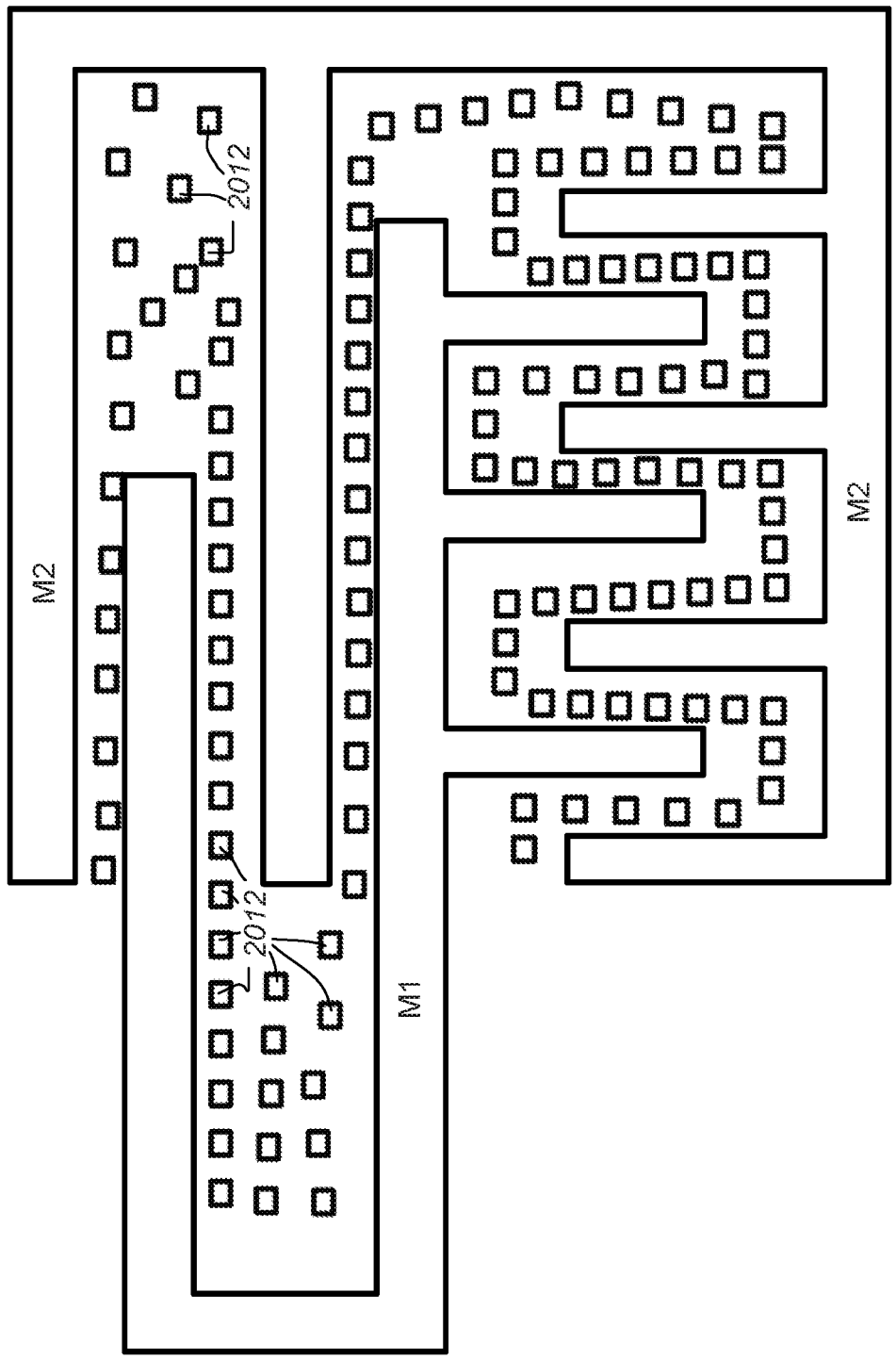
FIG. 20C is a simple schematic drawing of a partial top view of a inter-digitated microstructure hole photodetector, according to some embodiments.

FIG. 20C is a simple schematic drawing of a partial top view of an inter-digitated microstructure hole photodetector, according to some embodiments. In this case, the inter-digitated electrodes have both horizontal and vertical electrodes which reduces optical polarization sensitivity. In applications where optical polarization sensitivity is desired or acceptable, the electrodes can have a predominately single direction such as shown in FIG. 20A. In other cases, the inter-digitated electrodes can be meandering and/or concentric and/or other shapes to reduce sensitivity to optical polarization variations. The width of the inter-digitated electrodes can range from 20 nanometers to 1000 nanometers and in some cases from 20 nanometers to 200 nanometers. The gap between the inter-digitated electrodes can be 0.5 microns or less to 100 microns or more. In some cases, the gap can be 1 micron to 10 microns. In some cases, the gap can be 1 micron to 50 microns or more. The I-layer or low dope layer thickness can range from 100 nanometers to 10,000 nanometers, and in some cases 500 nanometers to 2000 nanometers. The inter-digitated electrodes can be metal such as chromium, nickel, vanadium, hafnium, molybdenum, tungsten, aluminum, titanium, tantalum, or copper. In some cases, the electrodes can include P and N doped wells. In some cases, the electrodes can include silicide such as platinum silicide, nickel silicide, or titanium silicide. In some cases, the electrodes can include amorphous semiconductor material. In some cases, inter-digitated trenches can be etched partially or fully into the I or low dope layer prior to N and P doping, and/or metallization, and/or silicide deposition.

The ratio of the spacing between the electrodes to the electrode width can vary from 0.2 to 100 or more. The electrodes can be straight and/or have any curvature. In some cases, the width of electrode M1 and the width of electrode M2 can be different, and in some cases the width of electrode M1 and/or M2 can vary along the length of the electrode.

Figure 21:
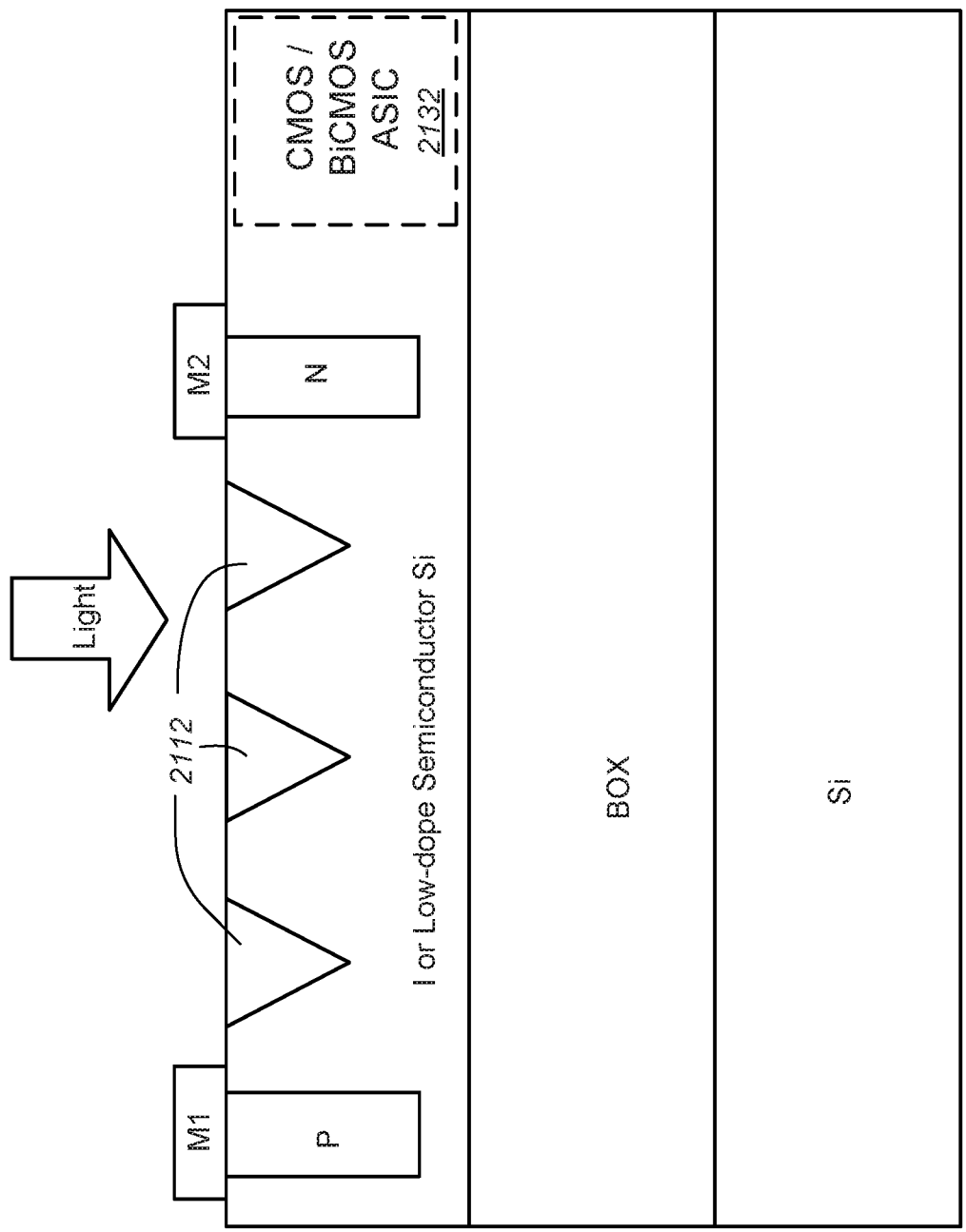
FIG. 21 is a simple schematic cross-section of an inter-digitated photodetector with microstructure holes and monolithically integrated with CMOS/BiCMOS ASICs, according to some embodiments.

FIG. 21 is a simple schematic cross-section of an inter-digitated photodetector with microstructure holes and monolithically integrated with CMOS/BiCMOS ASICs, according to some embodiments. The CMOS/BiCMOS ASICs 2132 can be configured for processing the photodetector electrical signals output. The cross-section shows a SOI "Silicon on insulator" wafer with buried oxide "BOX" layer with thickness ranging from 0.1 micron to 4 microns or more. A low dope device layer that can be intrinsic "I" or low doped P or N layer with thickness ranging from 0.1 micrometers to 10 micrometers or more, and in some cases from 0.5 micrometers to 5 micrometers. The resistivity of the device layer can range from 1 ohm/cm to 30 ohm/cm or more, and in some cases can range from 0.1 ohm/cm to 100 ohm/cm and in some cases from 0.8 ohm/cm to 60 ohm/cm. The P and N region can be formed by ion diffusion of P dopant ions such as boron or aluminum, and the N region can be formed with N dopant ions such as phosphorus or arsenic ions by diffusion and/or ion implantation to depths ranging from 0.1 micron to 10 microns. The P and N resistivity can be less than 0.1 ohm/cm and in some cases less than 0.01 ohm/cm and in some cases less than 0.001 ohm/cm, and in some cases 0.0001 ohm/cm. The width of the P and N region can range from 50 nanometers to 1000 nanometers. Spacing between the P and N regions can range from 0.5 microns to 10 microns or more. And in some cases, the spacing between the P and N can range from 1 micrometer to 100 micrometers. Microstructure holes 2112 such as inverted pyramids can be etched into the I or low dope layer. In some cases, the holes can be etched into the doped N and/or P layers. The microstructure holes 2112 can have cross-sectional shapes of inverted pyramids, funnel, conical, cylindrical, trapezoidal, and/or any combination of cross-sectional shapes. The depth of the microstructure holes 2112 can range from 50 nanometers to 5000 nanometers. In some cases, the depth can range from 200 nanometers to 2500 nanometers. In some cases, the microstructure holes can be partially etched into the I or low dope layer, and in some cases, they can be etched through the I or low dope layer to the BOX layer. The microstructure holes can be partially or fully passivated with silicon dioxide, and/or other dielectrics such as silicon nitride, aluminum nitrite, or hafnium oxide. Ohmic contact to the P and N region can be formed by diffusion and/or implantation. Thermal annealing can be performed after ion implantation to activate the implanted ions with ohmic metal such as aluminum, titanium, platinum, copper to name a few, and/or with silicide, such as aluminum silicide, molybdenum silicide, titanium silicide, tantalum silicide and/or any other ohmic contacts to the P and N region. Ohmic electrode width such as M1 and M2 can range from 20 nanometers to 1000 nanometers. CMOS/BiCMOS ASICs 2132 can be integrated with the inter-digitated microstructure hole photodetector. A reverse bias is applied between M1 "anode" and M2 "cathode" with a reverse bias voltage ranging from −0.1 volts to −40 volts or more and in some cases from −1 volt to −20 volts or more. The inter-digitated microstructure hole photodetector is surface illuminated with light that is predominately normal to the surface and in some cases can be off normal to the surface angle ranging from 0 degrees "normal" to 60 degrees or more "off normal".

The wavelength range in the case of silicon I or low dope device layer can range from 600 nanometers to 1100 nanometers. In some cases, the range can be from 780 nanometers to 1000 nanometers. In some cases, the range can be from 850 nanometers to 980 nanometers. In some cases, the device layer can be GeSi alloy where the Ge fraction can range from 0 (all silicon) to I (all germanium) and in some cases Ge alloy (Ge fraction ranging from 0 to 1) can be grown on a silicon device layer either using selective area growth or uniform area growth. For GeSi alloy I or low dope layer the wavelength can range from 800 nanometers to 1600 nanometers. The GeSi alloy thickness can range from 0.1 microns to 10 microns. Similar microstructure holes and P and N ohmic regions can be formed on the GeSi alloy, and a reverse bias is applied between the anode and cathode. FIG. 21 shows a partial simple schematic cross-section of a pair of inter-digitated anode and cathode of a photodetector which has multiple inter-digitated anodes and cathodes. The I or low dope layer has thickness ranging from 0.4 micrometers to 10 micrometers allows for monolithic integration with CMOS/BiCMOS ASIC 2132. The P and N well/trenches can be partially in the I layer or entirely through the I layer with depth ranging from 50 nanometers to 5000 nanometers or more. The N and P doping can have a resistivity 0.1 ohm/cm or less. In some cases multiple well/trenches for each electrode can be implemented.

Microstructure holes 2112 can enable photon trapping that can enhance the external quantum efficiency (EQE) of an inter-digitated photodetector with optical signal impinging on the top surface over a comparable inter-digitated photodetector without microstructure holes. The enhanced EQE of the inter-digitated photodetector with microstructure holes can be greater than the EQE of an inter-digitated photodetector without microstructure holes by 10% or more. In some cases, the EQE can be enhanced by 20% or more. In some cases, the EQE can be enhanced by 40% or more. In some cases, the EQE can be enhanced by 60% or more. In some cases, the EQE can be enhanced by 100% or more. In some cases, the EQE can be enhanced by 150% or more. In some cases, the EQE can be enhanced by 200% or more. In some cases, the EQE can be enhanced by 500% or more. In some cases, the EQE can be enhanced by 1000% or more. The EQE enhancements apply at certain wavelengths in the range of 800 nanometers to 1650 nanometers. In some cases, the wavelengths are in the range from 800 nanometers to 980 nanometers. In some cases, the wavelengths are in the range from 800 to 1100 nanometers. In some cases, the wavelengths are in the range from 1000 nanometers to 1350 nanometers. In some cases, the wavelengths are in the range from 1350 nanometers to 1650 nanometers.

The microstructure holes in the I or low dope layer enable photon trapping in the I layer, which can be Silicon or Germanium Silicon. The trapped photons can have modes in the I or low dope layer that can be confined by the Silicon Dioxide BOX layer on the bottom and air and/or dielectric layers on the top surface. This confinement entrapping of the signal photons can result in enhanced EQE or inter-digitated photodetector with microstructure holes. The microstructure holes of the inter-digitated photodetector can further reduce optical reflection from the surface that can result in higher EQE. The reduction of reflection with microstructure holes can occur over a wide wavelength range of 20 nanometers or more. In some cases, the wavelength range can be 50 nanometers or more. In some cases, the wavelength range can be 100 nanometers or more. In some cases, the wavelength range can be 120 nanometers or more. In some cases, the wavelength range can be 180 nanometers or more. In some cases, the wavelength range can be 200 nanometers or more. In addition, the reduction in reflectivity means that the inter-digitated photodetector with microstructure holes can accept a wide range of incident angles of the incoming signal photons. The angular range can be plus or minus 5 degrees off normal or more. In some cases, the angular range can be plus or minus 10 degrees off normal or more. In some cases, the angular range can be plus or minus 15 degrees off normal or more. In some cases, the angular range can be plus or minus 25 degrees off normal or more. In some cases, the angular range can be plus or minus 30 degrees off normal or more. In some cases, the angular range can be plus or minus 35 degrees off normal or more. In some cases, the angular range can be plus or minus 45 degrees or more. In some cases, the angular range can be plus or minus 55 degrees or more. The reflectivity of microstructure holes surface can be 15% or less. In some cases, the reflectivity can be 10% or less. In some cases, the reflectivity can be 5% or less. In some cases, the reflectivity can be 3% or less. In some cases, the reflectivity can be 1% or less. The reflectivity is at certain wavelengths in the range of 800 nanometers to 1650 nanometers. In some cases, the wavelengths can range from 850 nanometers to 950 nanometers. In some cases, the wavelengths can range from 850 nanometers to 1000 nanometers. In some cases, the wavelengths can range from 1200 nanometers to 1350 nanometers. In some cases, the wavelengths can range from 1400 nanometers to 1650 nanometers.

A reverse bias voltage is applied between the anode P or M1 and the cathode N or M2. Anti-reflection coatings can be used on the surface if desired. The microstructure holes can be passivated with thermal native oxide, and/or other dielectrics. The spacing between the digits (or "inter-digit" distance or spacing) for high-speed optical data communication can range from 0.3 to 10 micrometers for data rates ranging from 100 Gb/s or more to a few Gb/s. For LiDAR applications the inter-digit spacing can range from 1 micrometer to 1000 micrometers or more, which can correspond to spatial timing resolutions of less than 10 picoseconds to I nanosecond or more.

In some cases, the light can impinge from the bottom surface of the inter-digitated microstructure photodetector with the bottom silicon substrate partially or fully etched away. In some cases, BOX layer can be etched fully or partially under the inter-digitated microstructure hole photodetector. Box layer thickness can range from 0.1 micron or less to 10 microns or more. In some cases, electrical isolation trench can be included that is etched to the BOX layer, that is not shown.

In some cases, the I or low dope Si can be crystalline. In some cases, the I or low dope Si can be polycrystalline. In some cases, the I or low dope Si can be nanocrystalline. In some cases, the I or low dope Si can be amorphous. In some cases, a combination of crystalline, polycrystalline, nanocrystalline and/or amorphous layers can be used.

Not shown in FIG. 21 are surface passivation for the microstructure holes, mesas, and/or trenches. Surface passivation can include thermal oxide, deposition of dielectric and/or amorphous semiconductor such as silicon dioxide, silicon nitride, hafnium oxide, and/or amorphous silicon. Chemical treatment such as hydrogen fluoride and thermal treatments such as rapid thermal annealing can be used as part of the surface passivation. Other surface passivation techniques known in the art for CMOS processing can also be used. The microstructure holes can be wet etched, dry etched, and/or any combination of wet and dry etching.

Figure 22:
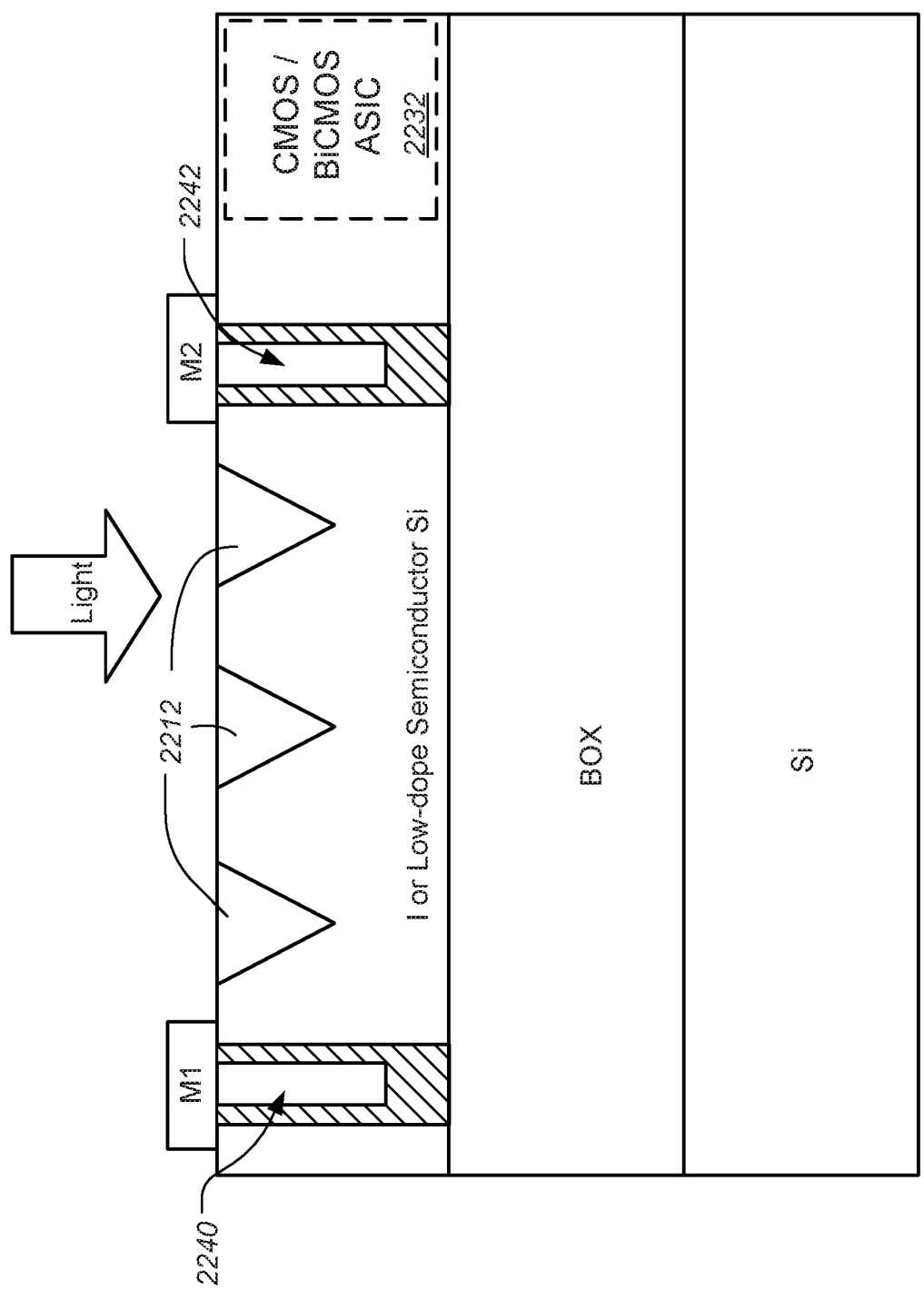
FIG. 22 shows a partial simple schematic cross-section of an inter-digitated microstructure hole photodiode, according to some embodiments.

FIG. 22 shows a partial simple schematic cross-section of an inter-digitated microstructure hole photodiode, according to some embodiments. This is similar to FIG. 21 except for the introduction of trenches. Trenches 2240 and 2242 are etched partially into or entirely through the I or low dope layer as shown. P and N dopant are then applied by diffusion such that the walls of the trenches are doped with P or N ions as shown by the cross-hatching. In this example, trench 2240 is doped with P ions and trench 2242 is doped with N ions. Electrodes such as M1 and M2 are deposited on the P and N doped regions respectively. These electrodes can make ohmic contact to the P and N doped region. The electrodes M1 and M2 can be metal such as aluminum, molybdenum, titanium, tantalum, or platinum. In some cases, a silicide can be used for the electrodes. The trenches can be filled partly or fully with dielectrics and/or left unfilled and/or filled with metal and/or silicide. The trench under the inter-digitated electrode provides electrical contact to the P and N regions and can also provide an optical reflection surface. The optical reflections provided by the trench can confine the optical wave in the I or low dope region. The optical wave in the plane of the I or low dope region can reflect off the interface between the I or low dope region semiconductor, and the boundary of the trench which can be air, dielectric or metal. This can further enhance the trapping of photons in the I or low dope layer and thereby enhance the EQE. Reverse bias voltage can be applied between M1 (the anode), and M2 (the cathode) with a reverse bias voltage ranging from −0.5 volts to −100 volts or more. In some cases, the reverse bias ranges from −1 volt to −35 volts. In some cases, the reverse bias ranges from −1 volt to −10 volts. In some cases, the reverse bias ranges from −1 volt to −4 volts.

Figure 23:
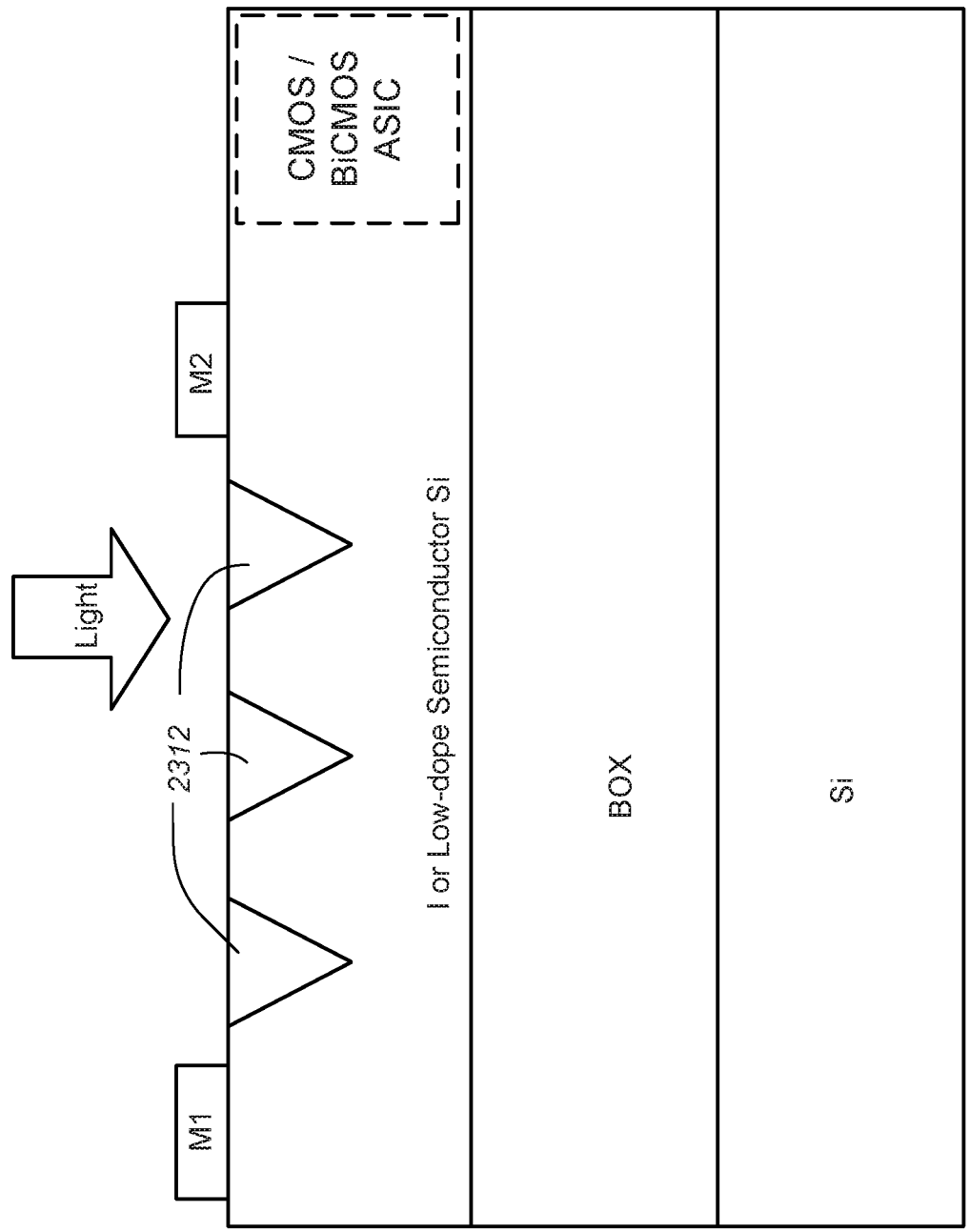
FIG. 23 is a partial simple schematic cross-section of a inter-digitated microstructure hole photodiode, according to some embodiments.

FIG. 23 is a partial simple schematic cross-section of an inter-digitated microstructure hole photodiode, according to some embodiments. FIG. 23 is similar to FIG. 21 but without P or N doped wells. In the case of FIG. 23 the electrodes M1 and M2 are metal and make direct contact to the I or low dope layer resulting in a metal semiconductor metal "MSM" structure. This MSM structure is equivalent to 2 Schottky diodes with one forward biased and the other reverse biased. A reverse bias voltage can be applied to M1 and M2 to generate an electric field between M1 and M2 such that photo generated carriers can be swept out to either M1 or M2 contacts. In addition, as in FIG. 22 trenches can be etched under electrode M1 and M2 such that the trenches can be filled with metal M1 or M2 for a MSM inter-digitated photodiode with microstructure holes. Reverse bias voltage can be applied between M1, and M2 with a reverse bias voltage ranging from −0.5 volts to −100 volts or more. In some cases, the reverse bias voltage can range from −1 volt to −35 volts. In some cases, the reverse bias voltage can range from −1 volt to −10 volts. In some cases, the reverse bias voltage can range from −1 volt to −4 volts.

See, e.g.: Martuza, et al, Nanocrystalline Silicon Lateral MSM Photodetector for Infrared Sensing Applications, IEEE Transactions on Electron Devices, VOL. 65, NO. 2, February 2018; and Xiao, et al, A 2 Gb/s optical receiver with monolithically integrated MSM photodetector in standard CMOS process, Chinese Science Bulletin, VOL. 56 NO. 21:2281-2285, July 2011 (referred to herein after as "Xiao"), both of which are incorporated herein by reference.

In Xiao, responsivity of approximately 0.1 A/W was observed at 850 nm for a finger width of 0.8 microns and finger spacing of 0.5 microns which corresponds to external quantum efficiency of approximately 17%. With the addition of microstructure holes, such as holes 2312, for photon trapping, the absorption and therefore the quantum efficiency, external quantum efficiency can be enhanced by 20% or more. In some cases, the enhancement can be 30% or more. In some cases, the enhancement can be 40% or more. In some cases the enhancement can be 50% or more. In some cases, the enhancement can be 60% or more. In some cases, the enhancement can be 70% or more. The enhancements can be observed at 850 nm. In some cases, the external quantum efficiency can be improved with narrower finger width such as 300 nm or less. In some cases, 200 nm or less. In some cases, 100 nm or less. In some cases, 50 nm or less. For high quantum efficiency and/or high bandwidth operation the ratio of the width of the fingers to the spacing of the fingers (spacing between finger/width of finger) can be 2 or greater. In some cases, the ratio can be 5 or greater. In some cases, the ratio can be 10 or greater. In some cases, the ratio can be 20 or greater. Inter-digitated photodetectors with microstructure holes can have a higher external quantum efficiency than a comparable inter-digitated photodetector without microstructure holes.

Microstructure hole inter-digitated photodetectors such as the MSM structure for applications such as optical data communication can achieve data rates of 10 Gb/s or more. In some cases, 25 Gb/s or more can be achieved. In some cases, 40 Gb/s or more can be achieved. In some cases, 50 Gb/s or more can be achieved. In some cases, 100 Gb/s or more can be achieved. In some applications lower data rate, and very high external quantum efficiency are desirable. In some such cases data rates of 10 Gb/s or less and with external quantum efficiency of 50% or more can be achieved at certain wavelengths. In some cases, external quantum efficiency of 100% or more can be achieved at certain wavelength. In some cases, external quantum efficiency of 100% or more can be achieved at certain wavelengths for data rates of less than 5 Gb/s. In some cases, external quantum efficiency of 100% or more can be achieved at certain wavelengths for data rates of 25 Gb/s or more, and in some cases for data rates of 50 Gb/s or more.

Figure 24:
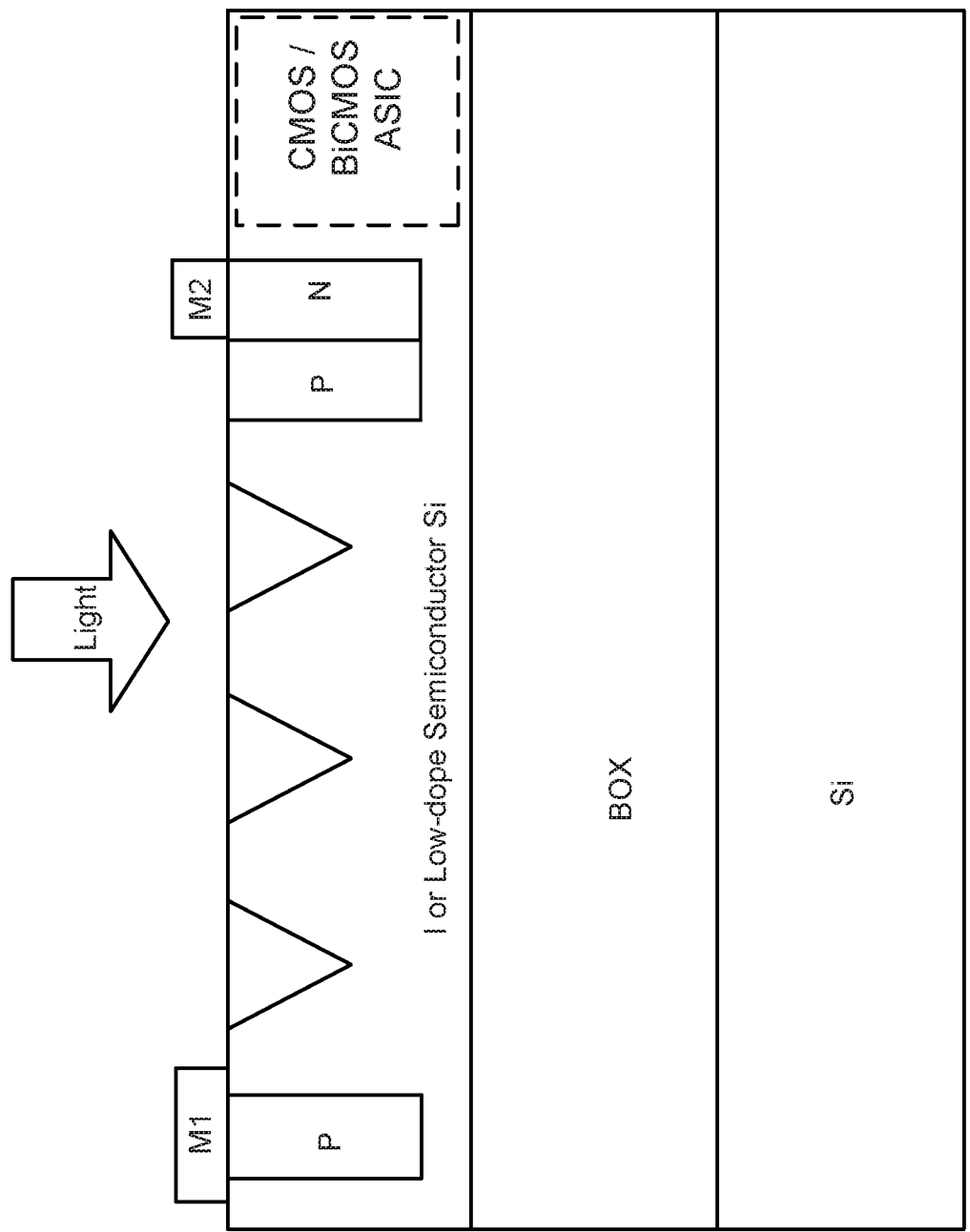
FIG. 24 is a partial schematic cross-section of an inter-digitated microstructure hole avalanche photodiode, according to some embodiments.

FIG. 24 is a partial schematic cross-section of an inter-digitated microstructure hole avalanche photodiode, according to some embodiments. The structure is similar to that shown in FIG. 21 but with an additional P region in contact with the N region. Under a reverse bias between the anode or P or M1 and the cathode N or M2 photo generated carriers in the I or low dope region are swept to the anode and cathode. Photo generated electrons are swept toward the anode and can have avalanche gain in the PN junction. Reverse bias voltage ranging from −5 to −100 or more volts can be applied between the anode and cathode. The avalanche gain of 1.5 times to 100 times or more can be achieved. And in some cases, 1.5 times to 3 times, can in some cases 1.5 times to 10 times. The structure shown is a lateral PIPN junction and in some cases avalanche gain can occur in PIN structures. In some cases, light can impinge on the bottom surface of the inter-digitated microstructure hole avalanche photodiode from the bottom surface with the silicon substrate partially or fully removed by etching and/or polishing. For the optical data communication application, the inter-digit distance (i.e. the distance between the inter-digitated electrodes) can range from 0.3 to 10 micrometers, and for LiDAR applications the inter-digit distance can range from 1 micrometer to 100 micrometers or more. One or two-dimensional arrays of any size can be fabricated with the inter-digitated microstructure hole photodetector/MSM/photodiode/avalanche photodiode, and monolithically integrated with CMOS/BiCMOS ASICs.

Figure 25:
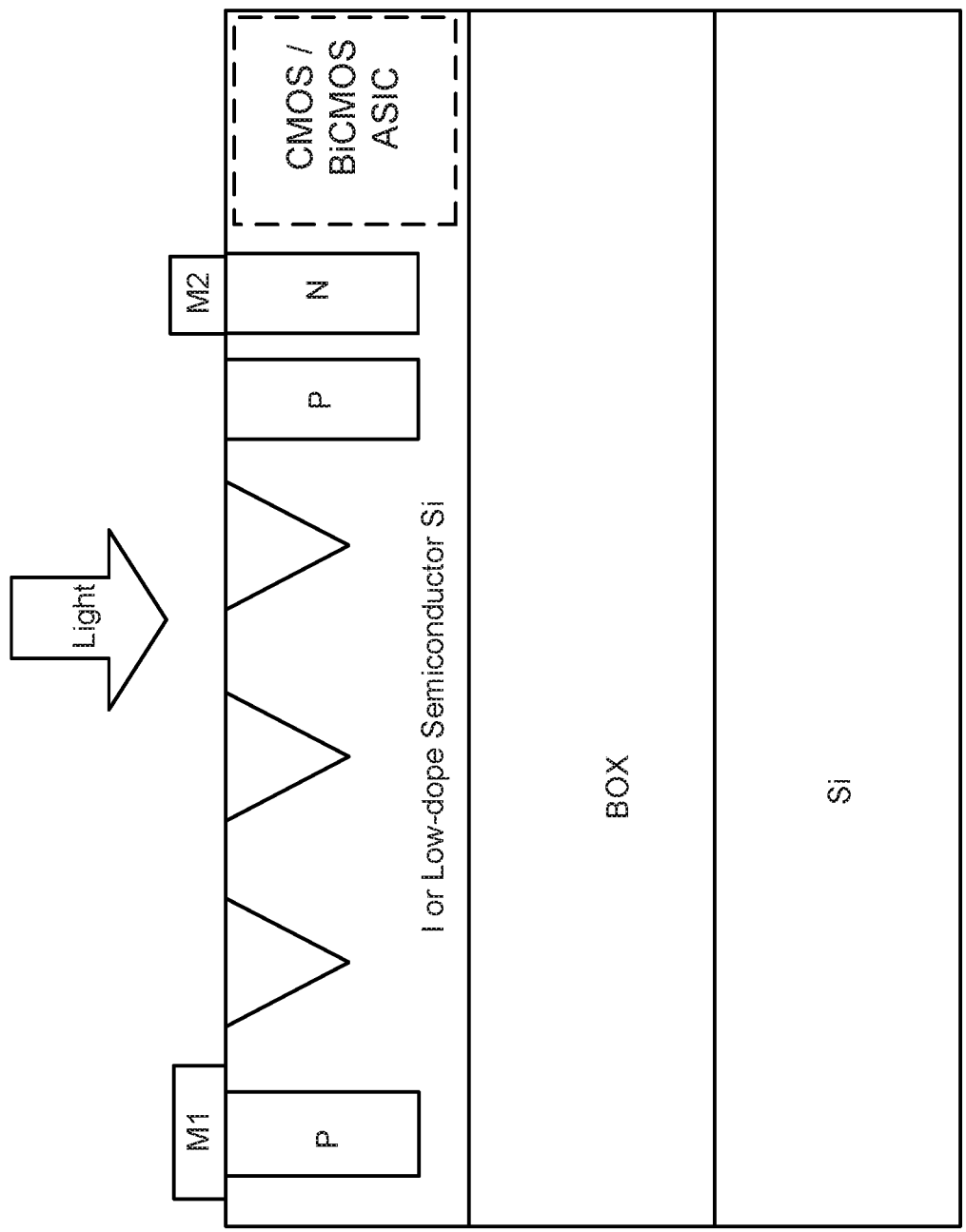
FIG. 25 is a partial schematic cross-section of a inter-digitated microstructure hole avalanche photodiode, according to some embodiments.

FIG. 25 is a partial schematic cross-section of an inter-digitated microstructure hole avalanche photodiode, according to some embodiments. With the spacing between the P and N doped regions near M2, a lateral PIPIN structure, or P/I/low dope/N is shown. Reverse bias ranging from −5 volts to −100 volts or more can be applied to the anode M1 and cathode M2. The electrical signal generated by the inter-digitated microstructure hole photodiode is transmitted via a metal, and/or highly conductive silicide transmission line to the CMOS/BiCMOS ASIC electronics. The entire structure can be monolithically integrated onto a single silicon chip.

Inter-digitated microstructure hole photodetectors can be PN, PIN, PIPN, PIPIN, or metal-semiconductor-metal structure. The P and N can be interchanged, for example NINP, NINIP. Doping of the N and P region can diffuse or implant from the surface and in some cases, trenches can be etched (as in FIG. 22) prior to the doping of N or P, and/or deposition of metal, and/or high conductivity silicide.

I or low dope Germanium, Ge/GeSi can be grown on the silicon device layer to extend the operational wavelength from 800 nanometers to 1650 nanometers. In all cases the inter-digitated microstructure hole photodetector can be surface illuminated and/or bottom illuminated. The bottom silicon substrate can be partially or entirely removed by etching and/or polishing. Anti-reflection coatings (not shown) can be applied to the top and/or bottom surfaces. The anti-reflection coatings can be dielectric and/or nanostructures of dielectric or semiconductor.

Figure 26:
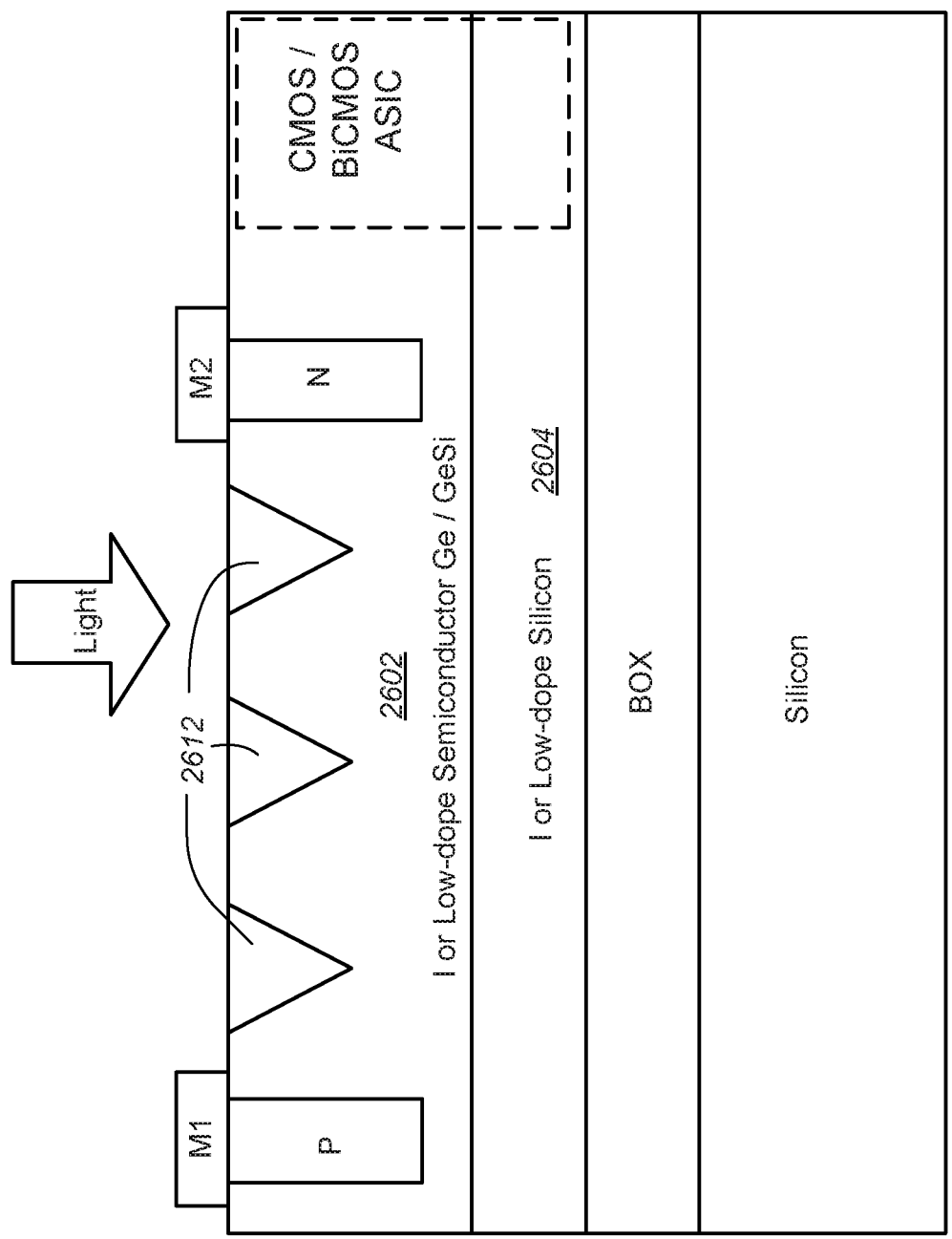
FIG. 26 is a simple partial cross-section schematic of an inter-digitated microstructure hole photodiode structure that is monolithically integrated with CMOS, BiCMOS, ASICs.

FIG. 26 is a simple partial cross-section schematic of an inter-digitated microstructure hole photodiode structure that is monolithically integrated with CMOS, BiCMOS, ASICs. The structure shown is similar to that shown in FIG. 21. In this case, I or low-dope Ge, or GeSi where the Ge fraction can vary from 0 to 1 layer 2602 is grown on top of a I or low-dope Si device layer 2604, with a BOX layer underneath followed by a Si Handle substrate. P and N wells or trenches can be implemented using ion diffusion methods, and/or ion implantation methods. The Ge/GeSi I or low-dope layer 2602 can have thicknesses ranging from 0.3 microns to 10 microns, and in some cases 0.5 microns to 1.5 microns. The resistivity of the Ge/GeSi layer can be 1 ohm-cm or larger. In some cases the resistivity can be 0.1 ohm-cm or larger. In some cases, the resistivity can be 5 ohm-cm or larger. In some cases the resistivity can be 10 ohm-cm or larger. The P and N doped wells can have resistivity of 0.1 ohm-cm or less. In some cases, the resistivity is 0.01 ohm-cm or less. In some cases, the resistivity is 0.001 ohm-cm or less. In some cases, the resistivity is 0.0001 ohm-cm or less. The width of the P and N well can range from 20 nanometers to 1000 nanometers or more, and the depth can range from 20 nanometers to 10 microns or more. The well can be partially diffused or implanted into the Ge/GeSi I or low-dope layer 2602, or it can be diffused or implanted through the entire thickness of the I or low-dope layer. The metal or silicide ohmic electrodes are formed on the P and N layers with widths ranging from 20 nanometers to 1000 nanometers or more, and thickness ranging from 20 nanometers to 1000 nanometers. The gap between the inter-digitated electrodes can range from 0.2 microns to 100 microns or more, and in some cases 1 micron to microns, and in some cases 1 micron to 100 microns. Microstructure holes can be etched partially and/or entirely into the Ge I or low-dope layer 2602, and in some cases some or all microstructure holes can be etched into the I or low-dope Si layer 2604. In some cases, electrical isolation trenches that are etched to the BOX layer can be included. Microstructure hole etch depth can range from 250 nanometers to 10,000 nanometers or more, and in some cases 200 nanometers to 2,000 nanometers. The microstructure holes can have any shape such as circular, oval, rectangular, triangular, polygonal, amoebic, star, clover, and any combination of shapes. The cross-section of the microstructure holes can be cylindrical, funnel, conical, trapezoidal, polygonal, inverted pyramids, to name a few and any combination of shapes. The lateral hole diameter can range from 100 nanometers to 3,000 nanometers or more. In some cases, the diameter can range from 400 nanometers to 2,000 nanometers. In some cases, the diameter can range from 500 nanometers to 2,500 nanometers or more. The microstructure holes can have multiple lateral dimensions. The spacing between adjacent microstructure holes can range from 0 nanometers (intersecting or touching) to 3,000 nanometers. In some cases, the spacing can range from 0 nanometers to 1,000 nanometers. In some cases, the spacing can range from 0 nanometers to 5,000 nanometers or more. The microstructure holes in all cases can be periodic, aperiodic, or random.

The I or Low-dope Silicon device layer 2604 can have a thickness ranging from 10 nanometers to 1000 nanometers or more, and in some cases 100 nanometers to 2000 nanometers or more with resistivity of 10 ohm-cm or larger. In some cases the resistivity can be 1 ohm-cm or larger, and in some cases less than 1 ohm-cm or larger. The BOX layer can have a thickness ranging from 100 nanometers to 4000 nanometers or more, and in some cases the BOX layer can be partially or fully etched away in regions below the inter-digitated microstructure hole photodetector, and/or CMOS electronics. In some cases, for back illuminated inter-digitated microstructure photodetector the silicon handle layer can be thinned and polished, and in some cases the silicon handle layer can be removed in areas beneath the inter-digitated microstructure hole photodetector. The anti-reflection coating of dielectric films and/or nanostructures can be applied to the bottom and/or top surfaces. In some cases, an amorphous semiconductor such as silicide can be applied to the metal electrode to reduce reflection from the metal surface.

For optical data communication applications, the optical wavelength ranges from 800 nanometers to 980 nanometers. In some cases, the wavelength ranges from 800 nanometers to 1100 nanometers. In some cases, the wavelength ranges from 800 nanometers to 1350 nanometers. In some cases, the wavelength ranges from 800 nanometers to 1550 nanometers. In some cases, the wavelength ranges from 800 nanometers to 1700 nanometers. In some cases, the wavelength ranges from 1200 nanometers to 1350 nanometers. In some cases, the wavelength ranges from 1200 nanometers to 1550 nanometers. In some cases, the wavelength ranges from 1200 nanometers to 1700 nanometers. In some cases, the wavelength ranges from 1500 nanometer to 1800 nanometers. Data rates can range from a few Gb/s to 100 Gb/s or more. In some cases data rates can range from 1 Gb/s to 25 Gb/s. In some cases, data rates can range from 10 Gb/s to 40 Gb/s. In some cases, data rates can range from 25 Gb/s to 50 Gb/s. In some cases, data rates can range from 25 Gb/s to 100 Gb/s or more. Inter-digitated microstructure hole photodetector can have responsivity that is greater than the responsivity of a comparable inter-digitated photodetector without microstructure holes. In some cases, the microstructure hole inter-digitated photodetector can have a responsivity that is 10% or higher than the responsivity of an inter-digitated photodetector without microstructure holes at certain wavelengths. In some cases, responsivity can be 30% or higher. In some cases, responsivity can be 50% or higher. In some cases, responsivity can be 80% or higher. In some cases, responsivity can be 120% or higher. In some cases, responsivity can be 200% or higher. In some cases, responsivity can be 300% or higher. In some cases, responsivity can be 500% or higher. In some cases, responsivity can be 1000% or higher.

For LiDAR applications the wavelength can range from 800 to 1000 nanometers, in some cases from 800 to 1550 nanometers, and in some cases from 800 to 2000 nanometers. The time resolution of the inter-digitated microstructure hole photodetector can be less than 1 nanosecond, in some cases less than 100 picoseconds, and in some cases less than 20 picoseconds. For LiDAR with 250-meter distance, distance resolution of 1 meter may be adequate which corresponds to a time resolution of approximately 3 nanoseconds. For 25-meter distance LiDAR, distance resolution of 30 cm may be desirable, which corresponds to a time resolution of 100 picoseconds. For 5-meter LiDAR applications distance resolution of 3 cm may be desirable, which corresponds to a time resolution of 10 picoseconds.

Microstructure holes 2612 can enable photon trapping that can result in enhanced quantum efficiency (QE) of the inter-digitated microstructure hole photodetector. The Ge/GeSi inter-digitated microstructure hole photodetector can respond to the optical signal the wavelength can range from 800 nanometers to 2000 nanometers. In some cases, the wavelength can range from 850 nanometers to 1200 nanometers, in some cases 850 nanometers to 1350 nanometers, in some cases 800 nanometers to 1650 nanometers, in some cases 1250 nanometers to 1350 nanometers, and in some cases 1200 nanometer to 1750 nanometers. A reverse bias is applied between the anode (M1) and cathode (M2) with a reverse bias voltage ranging from 0.5 volts to −100 volts or more. Optical signals as in FIG. 21 impinge from the top surface and in some cases can impinge from the bottom surface. For short range LiDAR of approximately 5 meters distance, the rise time of full width half maximum of the inter-digitated microstructure hole photodetector time resolution can range from 10 to 50 picoseconds, and in some cases less than picoseconds. For medium range LiDAR of 25 meters the time resolution can range from 30 picoseconds to 300 picoseconds. For long range LiDAR the "rise time" or full width half max of the electrical pulse generated as a result of a incoming optical pulse impinging on the inter-digitated microstructure hole photodetector can range from 500 picoseconds to 10 nanoseconds.

In some cases, the I or low dope Ge/GeSi layer 2602 can be crystalline. In some cases, the I or low dope Ge I GeSi can be polycrystalline. In some cases, the I or low dope Ge I GeSi can be nanocrystalline. In some cases, the I or low dope Ge/GeSi can be amorphous. In some cases, the I or low dope Ge/GeSi can be a combination of crystalline, polycrystalline, nanocrystalline, and/or amorphous.

Not shown in FIG. 26 are passivation layers for the microstructure holes that are dry etched and/or wet etched into Ge/GeSi. Passivation layers such as dielectrics and/or an amorphous semiconductor can be used to passivate the surfaces of the microstructure holes, and mesa. Other techniques such as chemical treatment, native oxides, and/or thermal oxides can all be used in conjunction with the passivation methods. Deposition techniques can include epitaxial growth, atomic layer deposition, chemical vapor deposition, plasma enhanced chemical vapor deposition, molecular beam epitaxy, and laser ablation to name a few.

Ge/GeSi can be grown over the entire wafer and to correct for the bowing due to lattice mismatch dielectric layers can be coated on the bottom of the silicon wafer to compensate for the bowing, and in some cases selective area grown Ge/GeSi regions can be only at the photo sensitive areas of the inter-digitated photodetector, which avoids having Ge/GeSi over the entire silicon wafer in a single, continuous film. The selective area grown Ge/GeSi on silicon can be in the form of islands with lateral dimensions ranging from 5 microns to 1000 microns or more.

Figure 27:
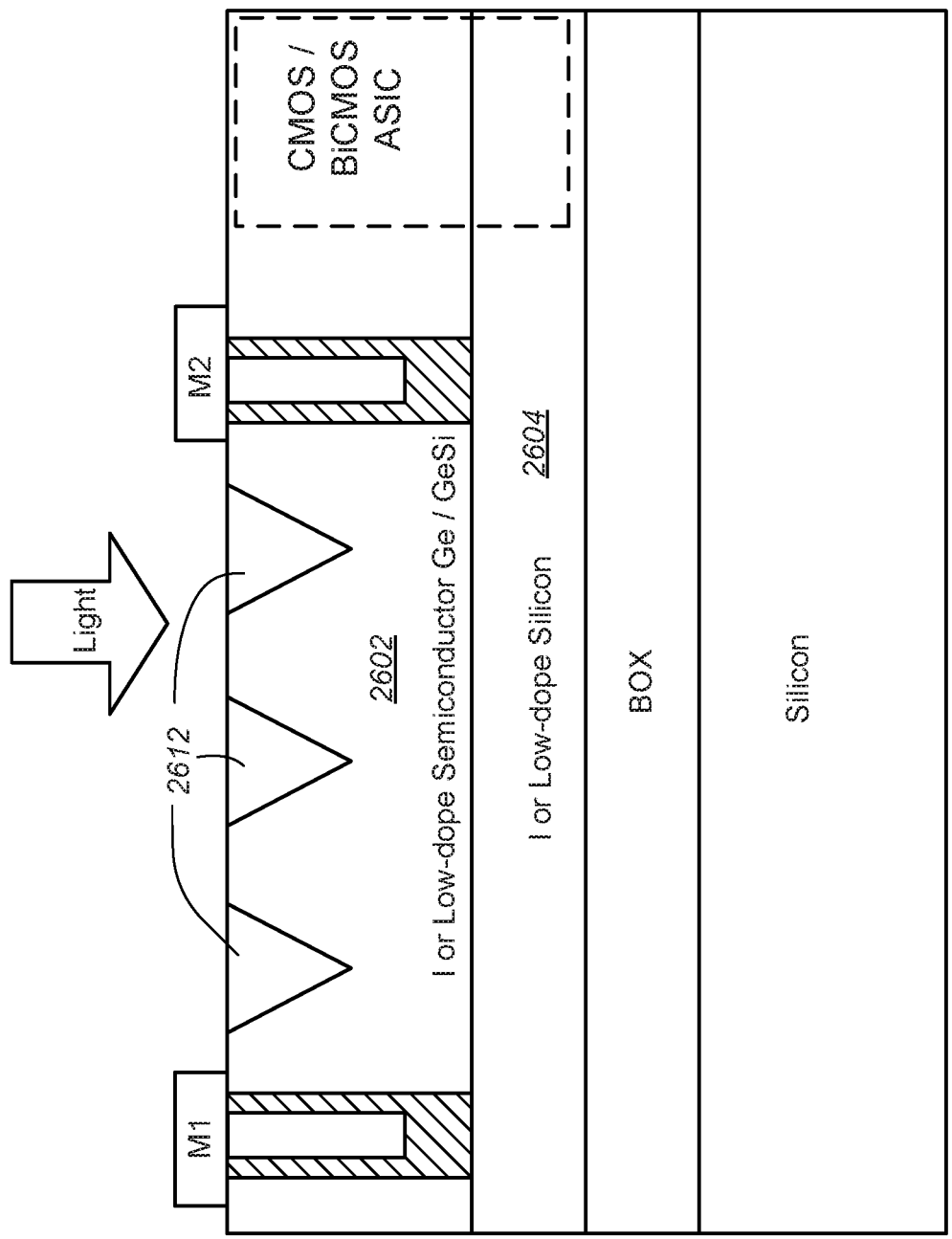
FIG. 27 is a partial simple cross-section schematic of an inter-digitated microstructure hole photodiode, according to some embodiments.

FIG. 27 is a partial simple cross-section schematic of an inter-digitated microstructure hole photodiode, according to some embodiments. The structure is similar to that shown in FIG. 26 except that a trench is etched prior to doping the N and P wells. P and N dopant are then applied by diffusion such that the walls of the trenches are doped with P or N ions as shown by the cross-hatching. Anode M1 metal and cathode M2 are placed in contact of the P and N region respectively. The trench can be etched partially or entirely into the I or Low-dope Ge/GeSi layer 2602, and in some cases can be etched into the I or Low-dope Silicon layer 2604.

Figure 28:
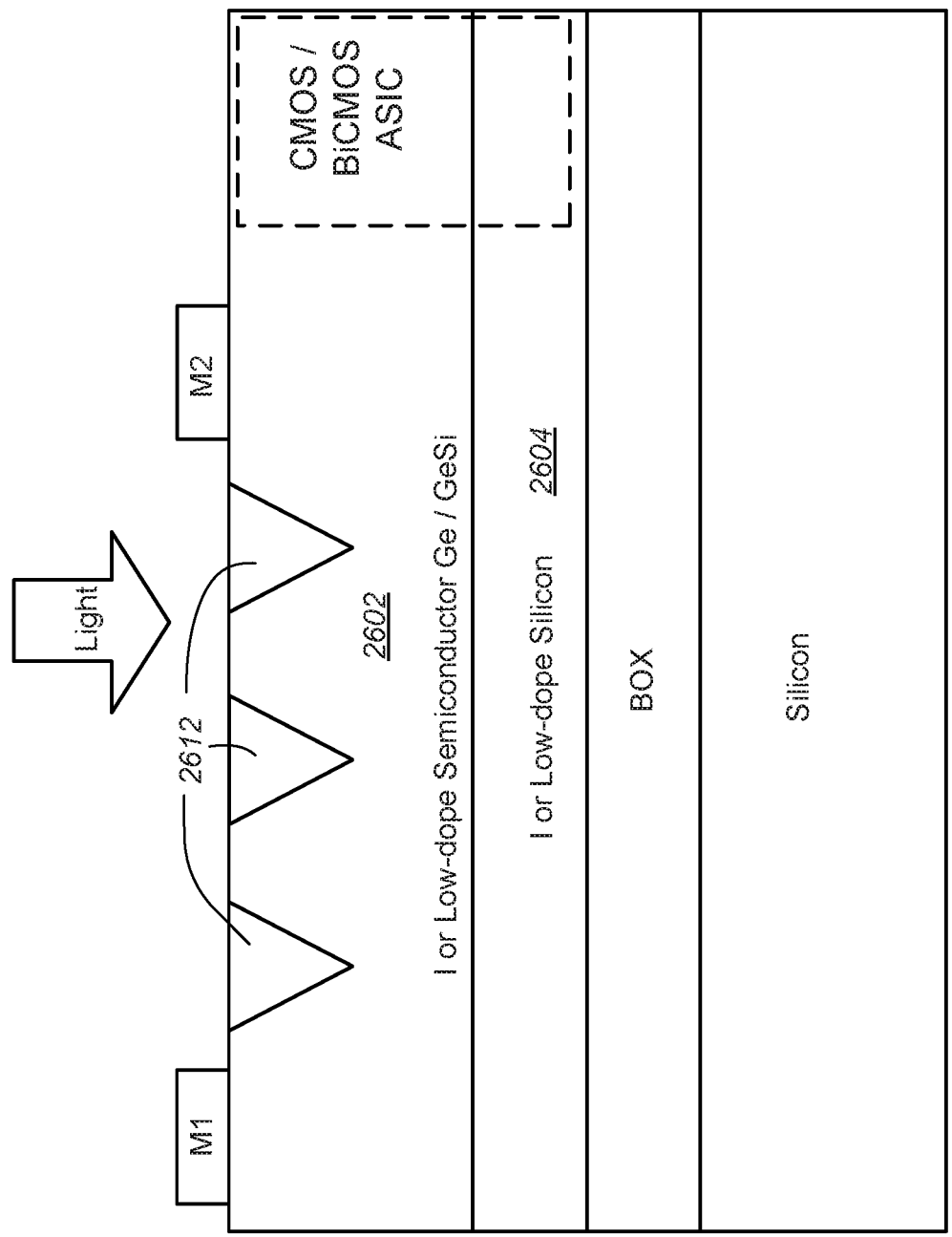
FIG. 28 is a partial simple cross-section schematic of an inter-digitated microstructure hole photodiode, according to some embodiments.

FIG. 28 is a partial simple cross-section schematic of an inter-digitated microstructure hole photodiode, according to some embodiments. The structure is similar to that shown in FIG. 26 except that instead of P and N doped wells, the metal electrode M1 and metal electrode M2 forms a Schottky contact to the I or low-doped Ge/GeSi layer 2602. In some cases, the M1 and M2 can be silicide, TiN, for example, and in some cases the metal M1 and M2 can be covered with amorphous semiconductor such as a Si, Ge, and/or GaAs to reduce optical reflection from the metal surface. The metal M1 and M2 can be a material such as Al, Ni, Cr, Ti, W, Mo, and/or Cu.

Figure 29:
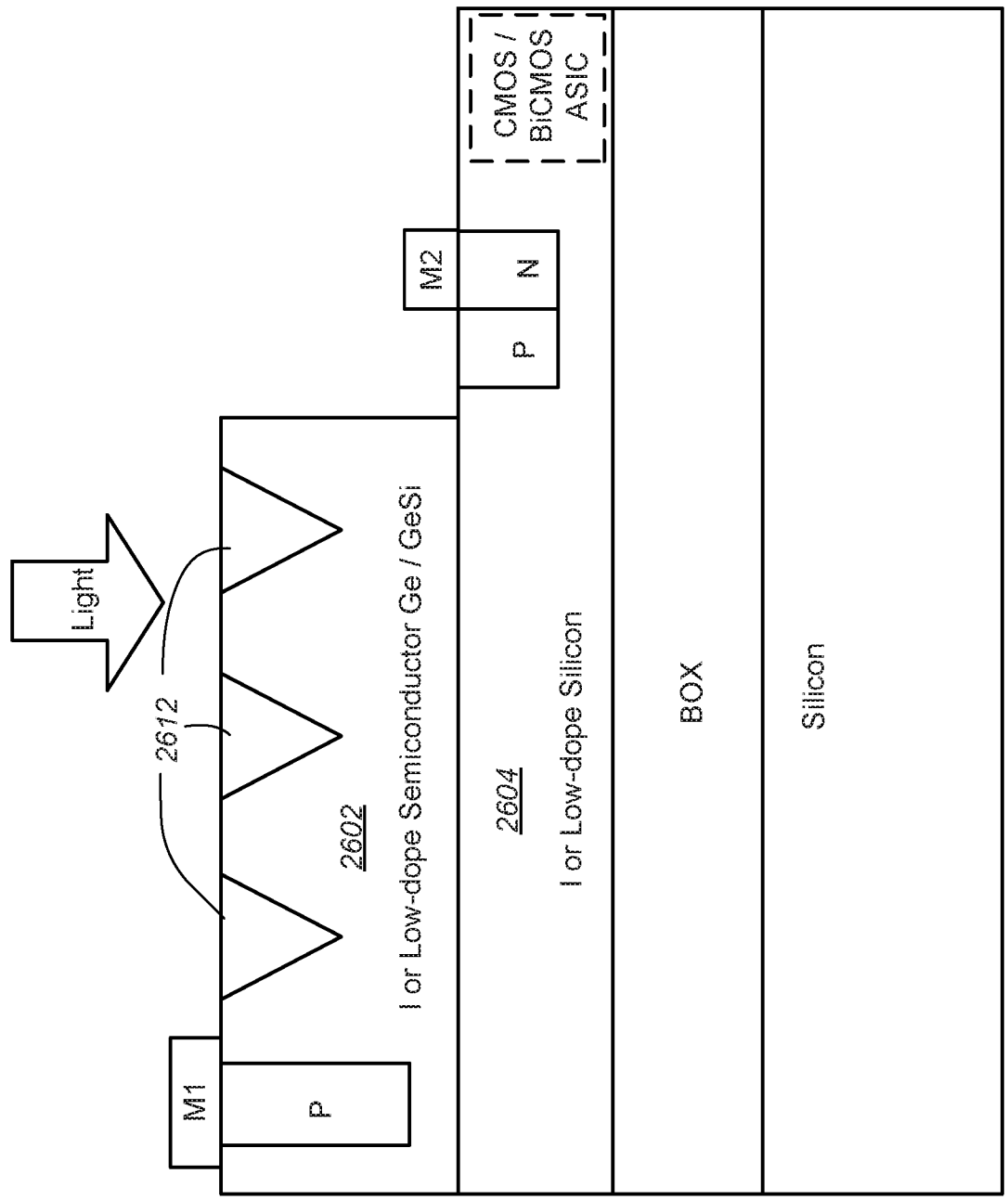
FIG. 29 is a partial schematic cross-section of an inter-digitated microstructure hole avalanche photodiode, according to some embodiments.
Figure 30:
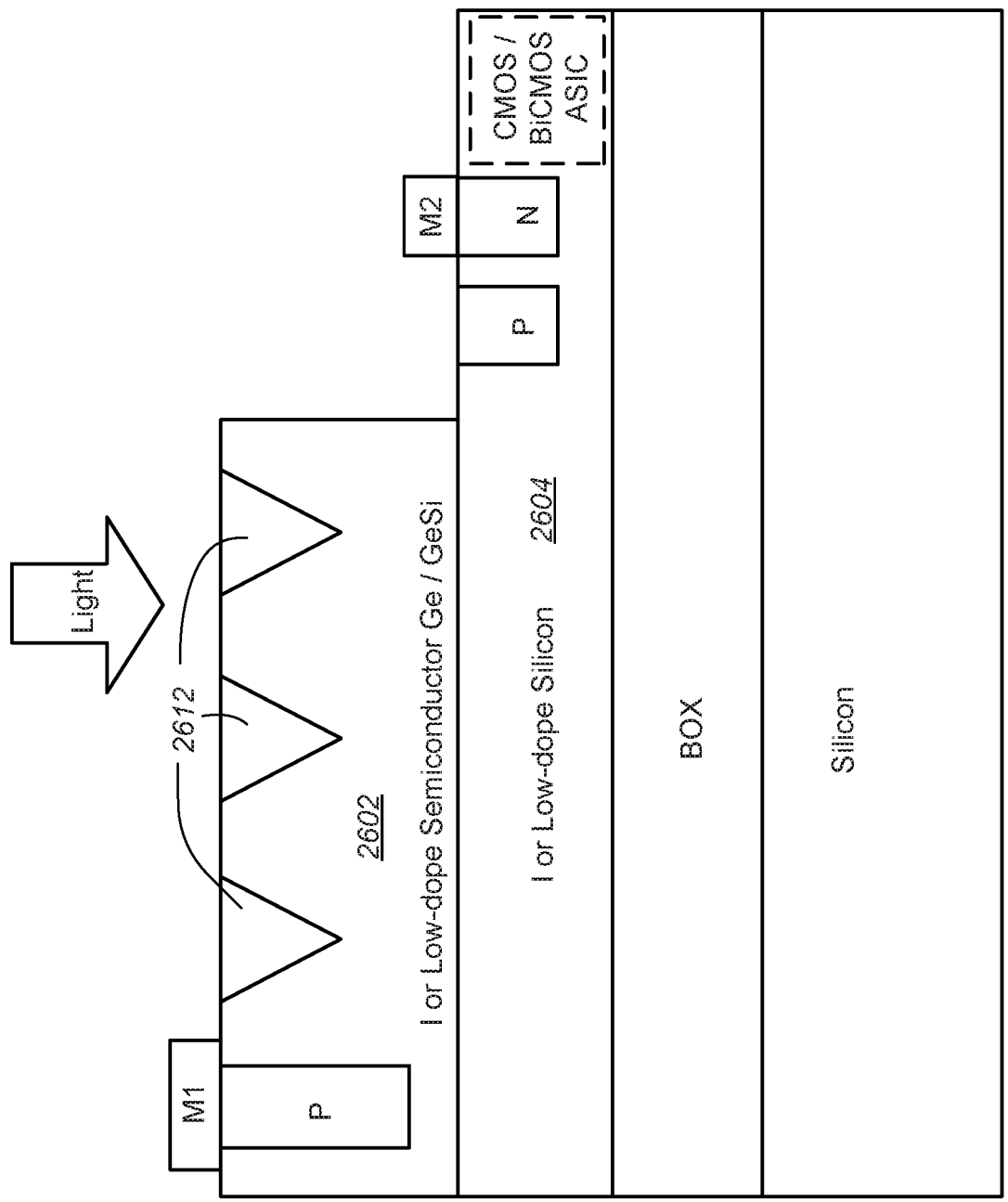
FIG. 30 is a partial schematic cross-section of an inter-digitated microstructure hole avalanche photodiode, according to some embodiments.

FIG. 29 is a partial schematic cross-section of an inter-digitated microstructure hole avalanche photodiode, according to some embodiments. The structure is similar to that shown in FIG. 24, with the addition of a I or low-dope Ge/GeSi layer 2602. The P well and electrode M1 are formed on the Ge/GeSi layer 2602 and the PN well is formed on the I or low dope Si layer 2604 with the M2 inter-digitated metal electrode on N. The Ge/GeSi layer 2602 includes microstructure holes 2612 as described with respect to FIG. 26. As in FIG. 24 a reverse bias is applied between the anode (M1) and cathode (M2) with a reverse bias voltage ranging from −5 volts to −100 volts or more to achieve avalanche gain in the PN junction. In some cases, the PN junction can be formed on the I or low-dope Ge/GeSi layer 2602 instead of on the I or low-dope Si layer 2604, and the electrode M2 is formed over the N well. Avalanche gain can range from 0.1 to 20 dB or more for reverse bias voltages ranging from −4 volts to −100 volts or more. FIG. 30 is a partial schematic cross-section of an inter-digitated microstructure hole avalanche photodiode, according to some embodiments. The structure shown is similar to that shown in FIG. 29 except for a small gap between the P and N well to form a PIPIN avalanche photodiode structure, and in some cases the P and N well can be formed on the I or low-dope Ge/GeSi layer 2602. A reverse bias is applied between the anode (M1) and cathode (M2) to achieve avalanche gain. A Poly Si layer can be deposited on the surface of Ge/GeSi 2602, with P dopant extending through the poly Si and into the Ge/GeSi 2602, and in some cases only in the poly Si, and the M1 and/or M2 electrodes can be deposited on the Poly Si as in FIG. 71E.

Figure 31:
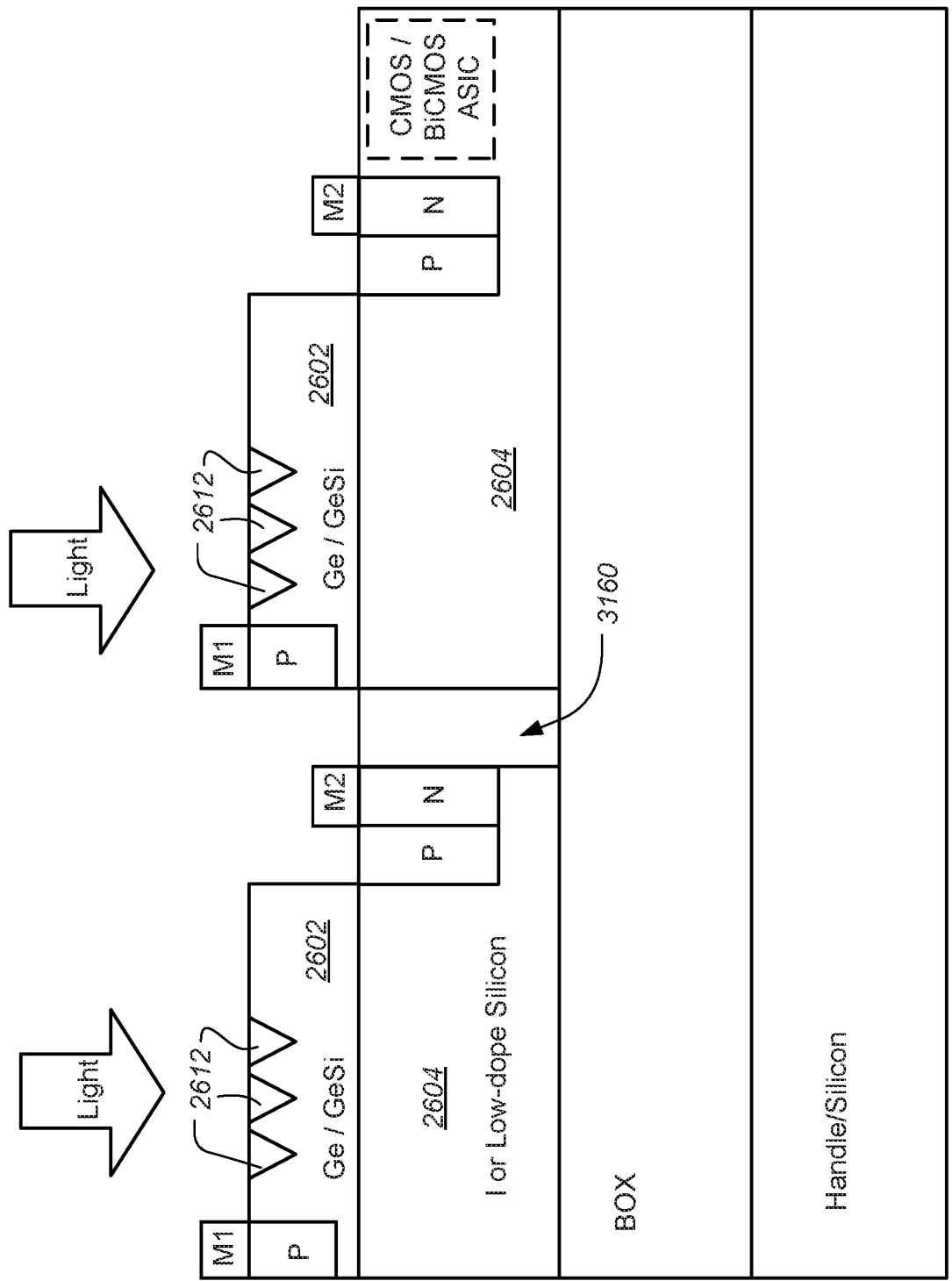
FIG. 31 is a partial simple cross-section with two sets of inter-digitated electrodes microstructure hole photodetector, according to some embodiments.

FIG. 31 is a partial simple cross-section with two sets of inter-digitated electrodes microstructure hole photodetectors, according to some embodiments. Shown in this example are two structures, each similar to that shown in FIG. 29. An electrical isolation trench 3160 is shown between the two sets of inter-digitated electrodes. It should be understood that similar isolation trenches could be provided in connection with the lateral structures such as shown in FIGS. 21 through 30. The number of sets of inter-digitated electrodes in an inter-digitated microstructure hole photodetector depends on the overall size of the photo sensitive area and the spacing between the inter-digitated electrodes. The number of sets of inter-digitated electrodes can range from 2 to 1,000 or more, in some cases from 4 to 40 sets of electrodes, and in some cases 20 to 100 sets of electrodes or more. Avalanche gain can range from 0.1 to 20 dB or more for reverse bias voltages ranging from −4 volts to −100 volts or more.

Figure 32:
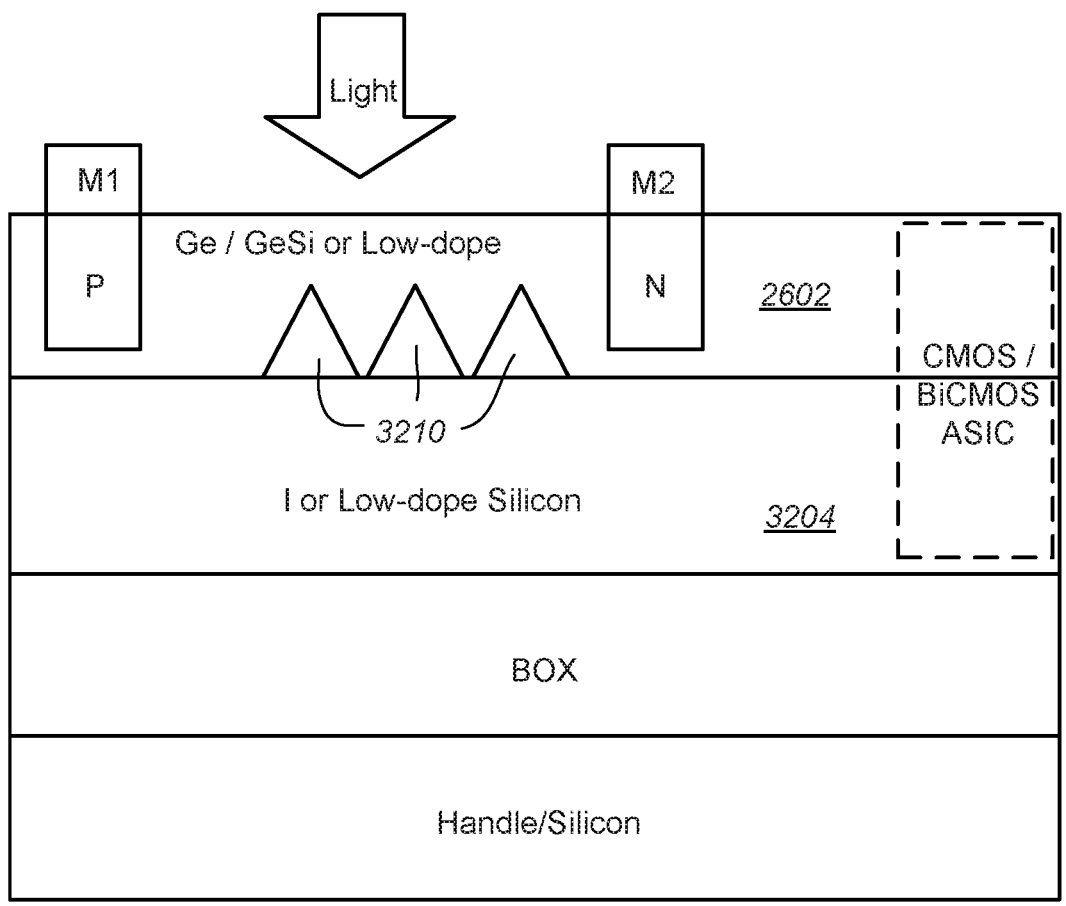
FIG. 32 is a partial simple schematic cross-section of an inter-digitated microstructure hole photodiode, according to some embodiments.

FIG. 32 is a partial simple schematic cross-section of an inter-digitated microstructure hole photodiode, according to some embodiments. The structure is similar to that shown in FIG. 26 except that the I or low-dope Ge/GeSi layer 2602 is grown on a patterned Si device layer 3204. The pattern on the silicon device layer 3204 can have nano/micro structures 3210 such as pyramids and/or inverted pyramids, rectangular, polygonal, cylindrical shapes for photon trapping to enhance the external QE and/or responsivity of the microstructure inter-digitated photodiode. The micro or nano structures 3210 on Si layer 3204 can have lateral dimensions ranging from 100 nanometers to 2,000 nanometers, and in some cases from 300 nanometers to 3,000 nanometers. The spacing between the microstructures 3210 can range from 0 to 2,000 nanometers, and in some cases 0 to 1,000 nanometers. The height or depth of microstructures 3210 can range from nanometers to 1000 nanometers or more. P and N wells or metal Schottky contacts can be formed on the I or low-dope Ge/GeSi layer 2602. Light is illuminated on the top surface and in some cases can be illuminated from the bottom surface. The I or low-dope Ge layer 2602 grown on top of the Si microstructures 3210 can have a thickness range from 200 nanometers to 3,000 nanometers or more. In some cases, the pyramids, and/or inverted pyramids 3210 can be coated with a dielectric or oxide partially or entirely to enable selective area epitaxy growth.

In some cases, as shown in FIG. 2, dielectric microstructures can be placed on the silicon to allow selective area growth of the Ge/GeSi in a waffle pattern or in a pattern with microstructure holes. Inter-digitated electrodes can be deposited on the selective area grown Ge/GeSi to form a lateral inter-digitated microstructure hole photodetector. And in some cases, P and N wells can be formed to create lateral inter-digitated microstructure hole PIN structure. And in some cases, it can be metal-semiconductor-metal structure.

Figure 33:
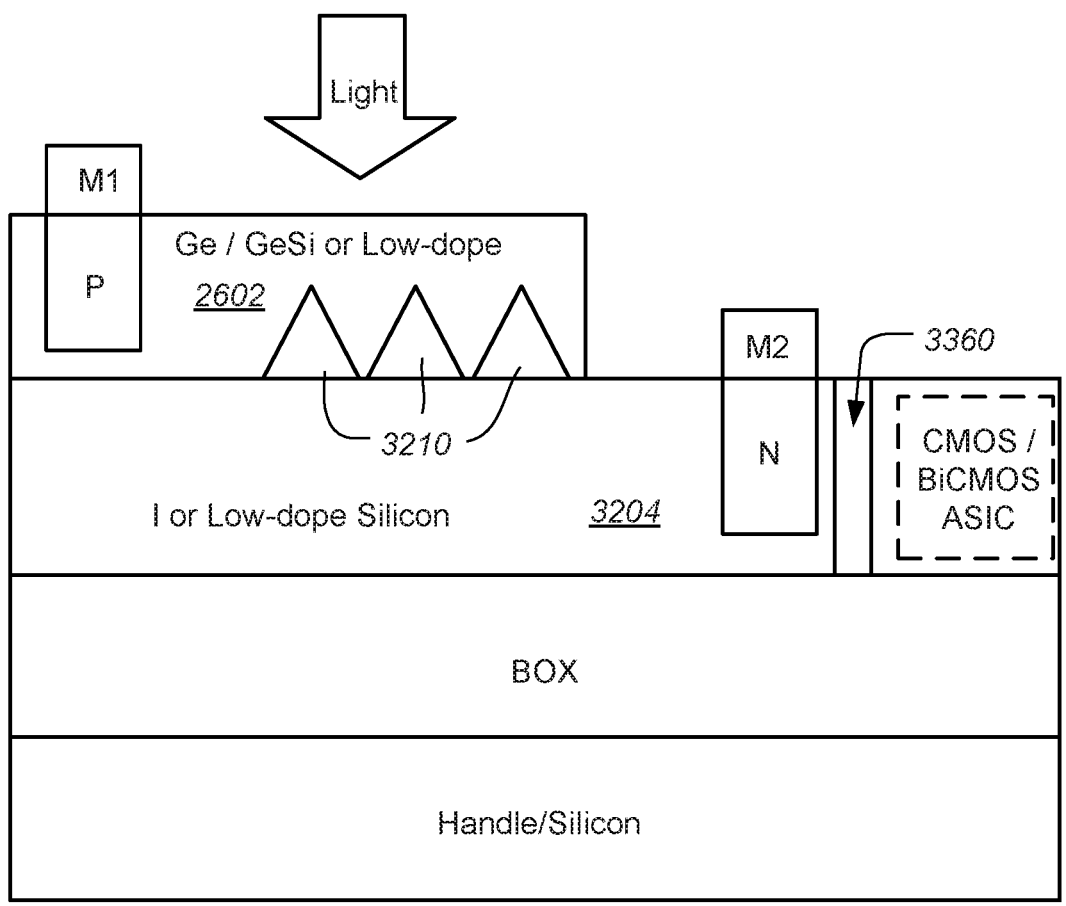
FIG. 33 is a partial simple schematic cross-section of an inter-digitated microstructure hole photodiode, according to some embodiments.

FIG. 33 is a partial simple schematic cross-section of an inter-digitated microstructure hole photodiode, according to some embodiments. The structure is similar to that shown in FIG. 32 except that the N well and M2 metal are formed on the I or low-dope Si layer 3204 and an electrical isolation trench 3360 is added. The resistivity of the I or low-dope Si 3204 can be greater than the resistivity of the Ge/GeSi layer 2602.

In cases where Ge/GeSi I or low-dope layer 2602 is formed on Si I or low-dope layer 3204, the BOX layer can be omitted. For example, the I or low-dope Ge I GeSi on I or low-dope Si layer can be grown directly on a Si substrate without the BOX and can be monolithically integrated with CMOS/BiCMOS electronics.

Figure 34:
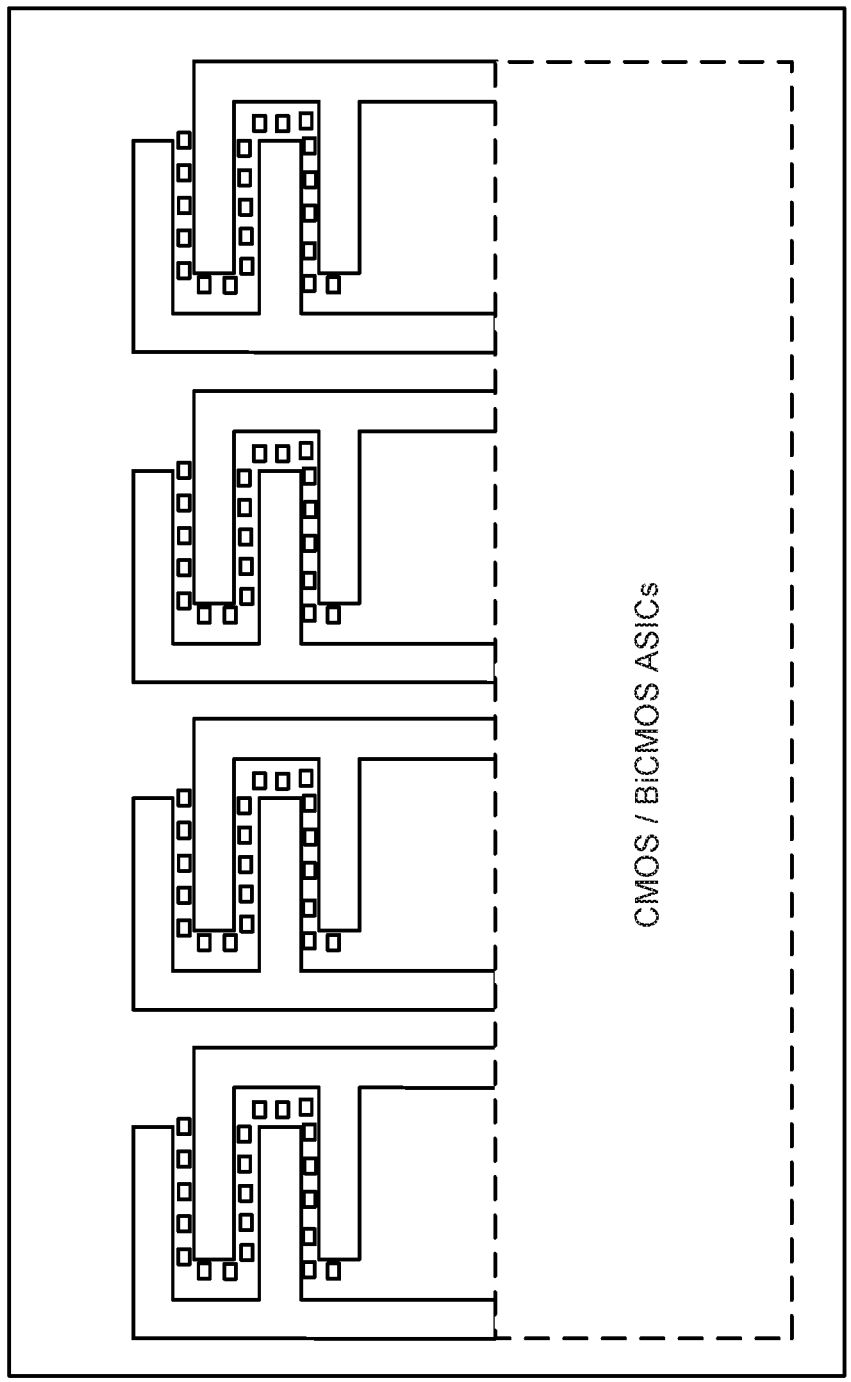
FIG. 34 shows a partial simple top view schematic for a plurality of inter-digitated microstructure hole photodetectors monolithically integrated with CMOS/BiCMOS ASICs on a single silicon chip, according to some embodiments.

FIG. 34 shows a partial simple top view schematic for a plurality of inter-digitated microstructure hole photodetectors monolithically integrated with CMOS/BiCMOS ASICs on a single silicon chip, according to some embodiments. Shown in this example is a 1×4 "Quad" arrangement of photodetectors. As used herein, the term "photodetector" can include: photodiodes; avalanche photodiodes; single photon avalanche photodiodes; and metal-semiconductor-metal photodetectors. Arrays of higher densities such as 4×4, 8×8, 1×8 and 2×8 are possible for higher bandwidth optical data communication. In some applications such as LiDAR array densities can be much higher, for example 10×10, 20×20, 30×30 or 30×100.

For optical data communication 1×4 arrays can achieve aggregated data bandwidth of 100 Gb/s, in some cases 200 Gb/s, and in some cases 400 Gb/s using modulation schemes such as PAM-4. Inter-digitated microstructure hole photodetectors can be integrated in high density with CMOS/BiCMOS ASICs, for example a 4×4 array can achieve 400 Gb/s to 1600 Gb/s or more. Optical signals impinge on the top surface and in some cases can impinge from the bottom surface. The optical signals can be brought in by one or more optical fiber ribbons, and in some cases for wavelength division multiplexing, different wavelengths of light can impinge on different inter-digitated microstructure hole photodetectors with the use of optical filters. Wavelength ranges for the inter-digitated microstructure hole photodetector can be from 800 to 1100 nanometers for Si I or low-dope layer, and 800 to 2000 nanometers for Ge and/or GeSi I or low-dope layer.

Figure 35:
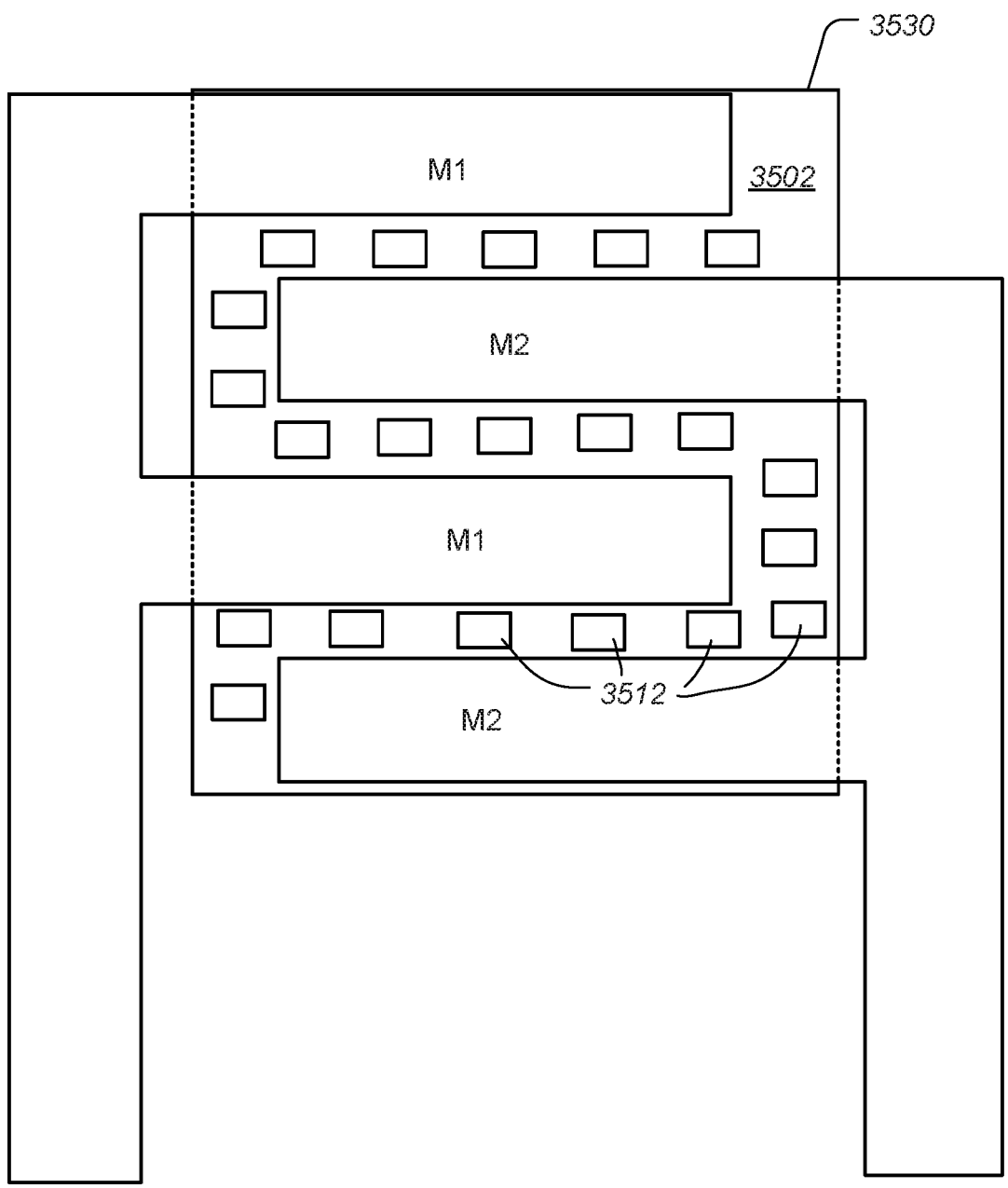
FIG. 35 is a simple partial top view of an inter-digitated microstructure hole photodetector, according to some embodiments.

FIG. 35 is a simple partial top view of an inter-digitated microstructure hole photodetector, according to some embodiments. Microstructure holes 3512 are shown formed in an I or low-dope Si and/or Ge or GeSi layer 3502. In this case a mesa 3530 is etched into the I or low-dope Si and/or Ge or GeSi layer 3502 to eliminate or reduce photo-generated carriers outside the inter-digitated region. Such carriers could cause the inter-digitated photodetector to have a slower response time, and therefore lower bandwidth due to slow diffusion of photo-generated carriers. In the case of a Si inter-digitated microstructure hole photodetector, the mesa 3530 can be etched to the BOX layer. The inter-digitated electrodes can overlap the mesa and, in some cases, can extend past the mesa. In the case of Ge or GeSi I or low-dope layer grown on Si, the mesa can be etched to the Si layer and in some cases to the BOX layer. For Ge or GeSi inter-digitated microstructure hole photodetector in some cases the BOX layer may be omitted. In some cases, instead of a mesa a moat or a trench around the inter-digitated region can be used to reduce or minimize stray photo-generated carriers diffusing to the high electric field region between the inter-digitated electrode "fingers." In some cases, a mesa or a moat may be omitted such as in cases where a lower inter-digitated photodetector response time, or data bandwidth can be tolerated.

Figure 36:
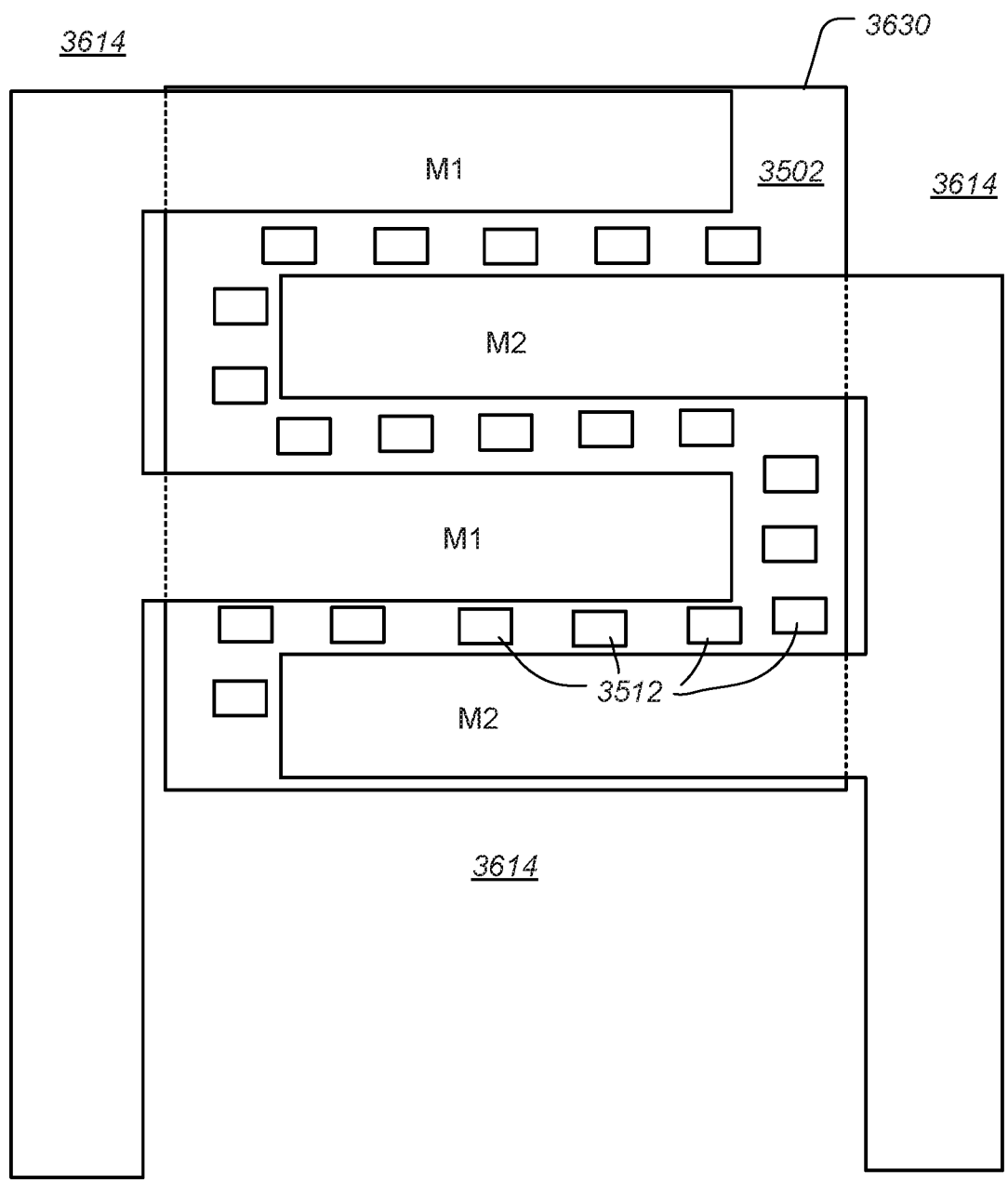
FIG. 36 is a simple partial top view schematic of an inter-digitated microstructure hole photodetector where ion implantation is used in areas outside the inter-digitated microstructure hole regions, according to some embodiments.

FIG. 36 is a simple partial top view schematic of an inter-digitated microstructure hole photodetector where ion implantation is used in areas outside the inter-digitated microstructure hole regions, according to some embodiments. Ions are implanted in the region 3614, outside of the inter-digitated area 3630. The ion implanted region 3614 can reduce the effects of photo-generated carriers outside the high electric field regions to reduce or minimize diffusion tails in the impulse response of the inter-digitated photodetector. Ion implantation of ions such as H, N, O, He, Ar, Ze, Ne, and/or C can be used to reduce photo-generated carriers lifetimes. Ion implant dosage can range from $1\times10^{12}/cm^2$ to $1\times10^{17}/cm^2$ or more. Ion implant energy can range from 5 keV to 400 keV and in some cases using ionized ions the energy can exceed 400 keV to 1000 keV or more. In some cases, other ions dosage and/or energy ranges can be used to reduce photo-generated carrier lifetime outside the inter-digitated high electric field region.

Figure 37:
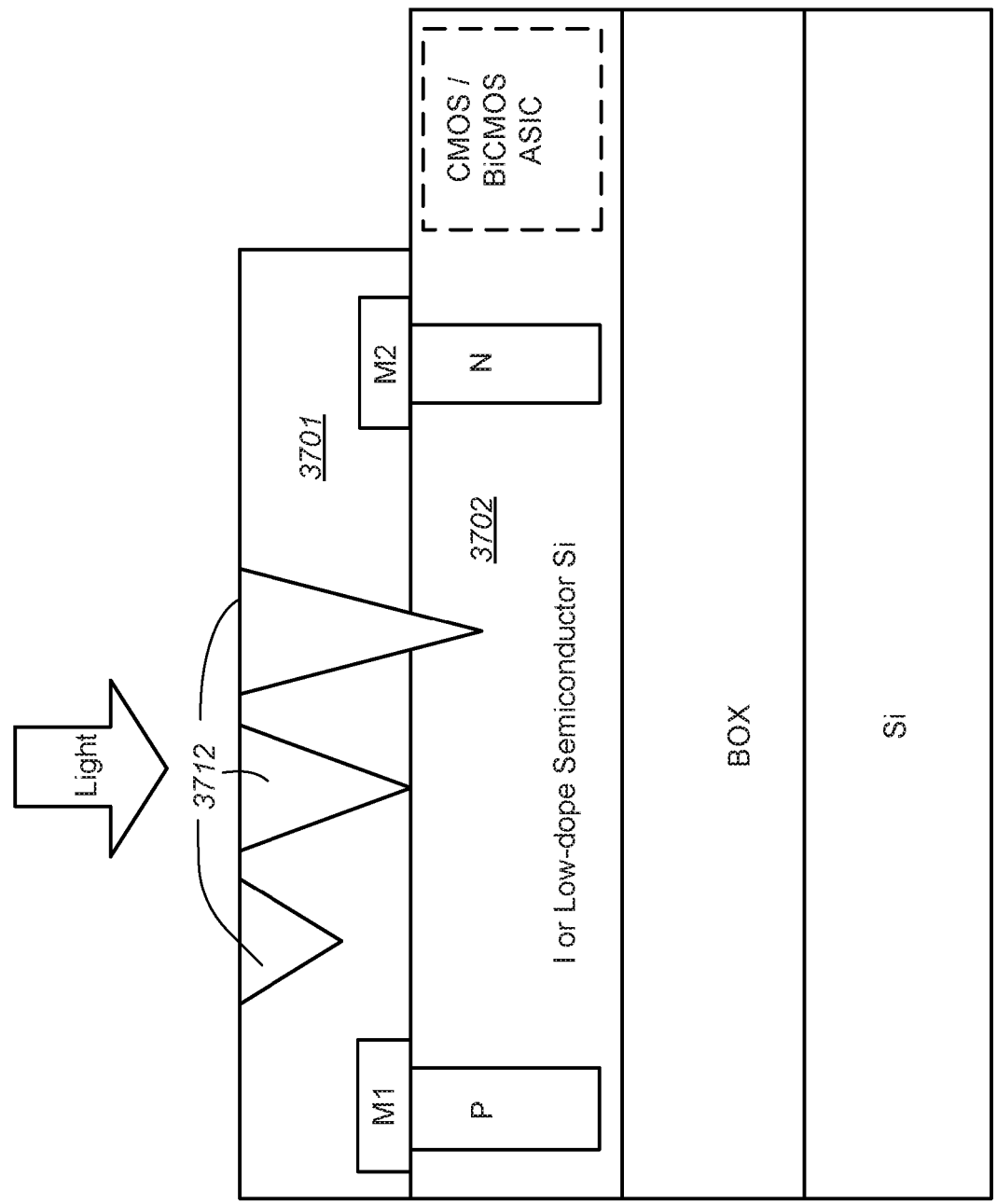
FIG. 37 is a simple partial top view schematic of an inter-digitated microstructure hole photodetector that includes a superstrate, according to some embodiments.

FIG. 37 is a simple partial top view schematic of an inter-digitated microstructure hole photodetector that includes a superstrate, according to some embodiments. The structure shown is similar to those shown in FIGS. 21 and 26. In this case a superstrate 3701 is formed above the Ge/GeSi I or low-dope layer 3702. Microstructure holes 3712 are etched or otherwise formed in the superstrate 3701. The superstrate material can be a dielectric such as silicon dioxide, silicon nitride, hafnium oxide, silicon carbide, and/or aluminum oxide. In some cases, superstrate 3701 can be a polymer such as polyimide, or an amorphous or poly-crystalline semiconductor layer. Microstructure holes 3712 can be partially etched into the superstrate 3701, entirely through the superstrate, and/or past the superstrate and into the Si/Ge/GeSi I or low-dope layer 3702. The microstructure holes 3712 in the superstrate 3701 can enable photon trapping in the I or low-dope semiconductor layers 3702.

For inter-digitated microstructure hole photodetectors, the ratio between the inter-digit distance and the width of the "digits" (or electrodes) should in general be large in high speed applications. For example, if the width of gap is "G" and the width of the digit (or electrode) is "W" then G/W preferably should be 10 or larger, and in some cases 20 or larger to minimize light loss to reflection from the electrodes. In one example, for a high speed inter-digitated photodetector, the gap can be 2 microns and the width of the electrode can be 200 nanometers. In some cases, the gap can be 1.5 microns, and the width of the electrode 100 nanometers. In some cases, the gap can be 1.5 microns and the width of the electrode can be 60 nanometers. In some cases, the width of the electrode can be 20 nanometers. The ratio of G/W can be greater than or equal to 10 or more, in some cases 20 or more, in some cases 30 or more, in some cases 100 or more, and in some cases 150 or more. For some applications the G/W ratio can be 1000 or more. In a single inter-digitated microstructure hole photodetector, there can be a single gap to width ratio, and in some cases there can be multiple gap to width ratios that can be the same or different from each other.

For microstructure hole photodetectors including the microstructure inter-digitated photodetectors, the microstructure holes can have one or more lateral dimensions. The lateral dimensions can range from 100 nanometers to 3000 nanometers, in some cases from 200 nanometers to 2000 nanometers, in some cases from the 300 nanometers to 3000 nanometers, in some cases from 400 nanometers to 3500 nanometers, in some cases from 500 nanometers to 5000 nanometers, in some cases from 600 nanometers to 3000 nanometers, in some cases 700 nanometers to 5000 nanometers, in some cases 800 nanometers to 5000 nanometers, and in some cases one of the lateral dimensions can be greater than 5000 nanometers. The microstructure holes can be square, triangular, trapezoidal, polygonal, star, circular, oval, clover, hourglass, amoebic, or any combination of shapes. The cross-section of the microstructure hole can be triangular, trapezoidal, rectangular, funnel, conical, spherical, cylindrical, amoebic, and/or any combination of cross-sectional shapes, and in some cases different cross-section slices of the same microstructure hole in different orientations can have different cross-sections. The microstructure holes can be etched from a depth ranging from 50 nanometers to 10,000 nanometers or more, in some cases from 50 nanometers to 5000 nanometers, in some cases from 50 nanometers to 2500 nanometers, in some cases 50 nanometers to 2000 nanometers, in some cases from 50 nanometers to 1000 nanometers, and in some cases from 50 nanometers to 500 nanometers. In some cases, the etch depth can range from 100 nanometers to 1000 nanometers or more, in some cases from 200 nanometers to 1500 nanometers or more, in some cases from 30 nanometers to 2000 nanometers or more, and in some cases from 30 nanometers to 3000 nanometers or more. The microstructure holes can have any combination of etch depth. The spacing between adjacent microstructure holes can be 0 nanometers "touching or overlapping" to 3000 nanometers, in some cases from 0 to 1500 nanometers, and Sin some cases from 0 to 2500 nanometers or more. The microstructure holes can be arranged in a periodic lattice, in some cases can be aperiodic, in some cases can be random, and in some cases a combination of periodic, aperiodic and random.

Figure 38:
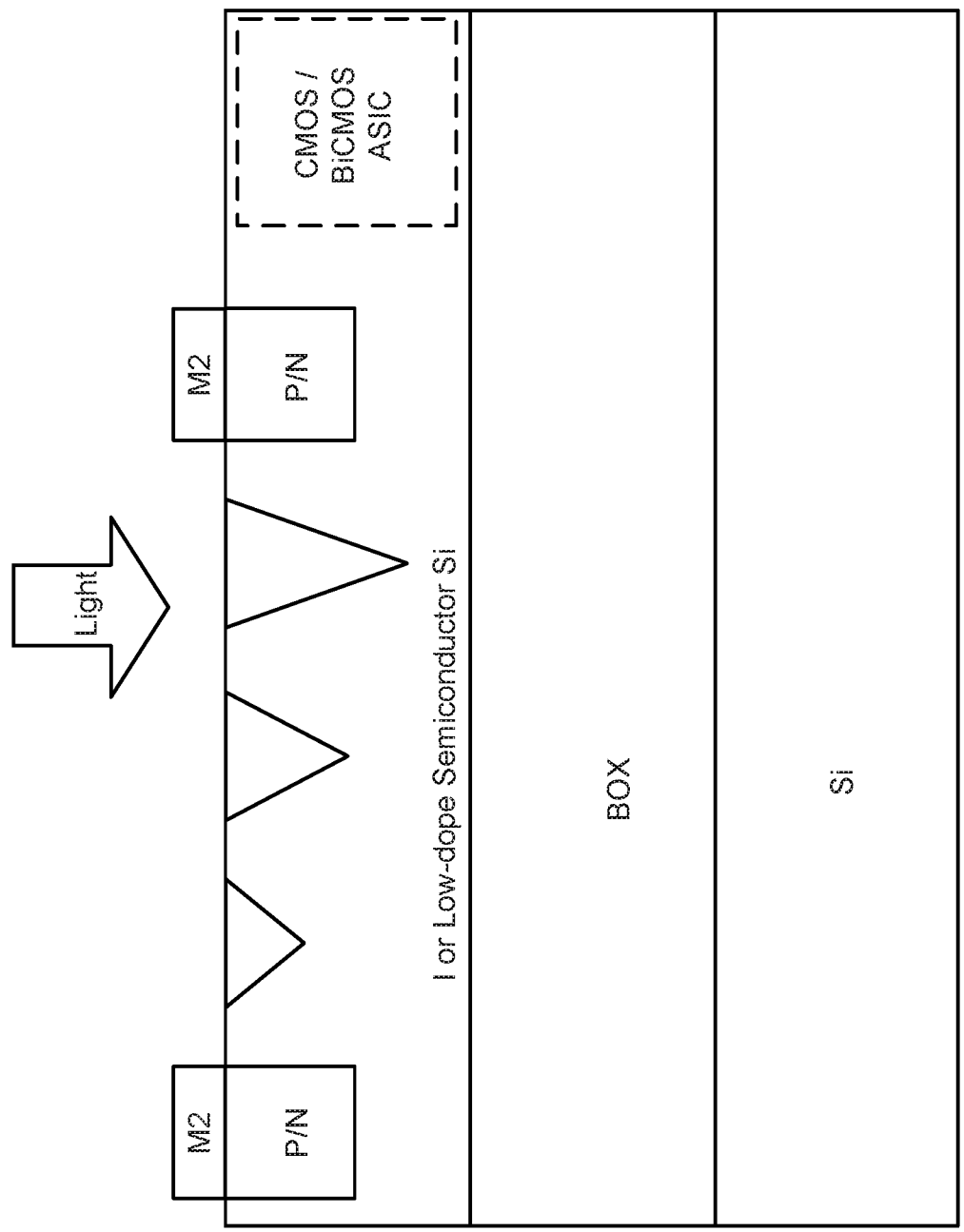
FIG. 38 is a simple partial cross-section schematic of a metal semiconductor metal photodiode, according to some embodiments.

FIG. 38 is a simple partial cross-section schematic of a metal semiconductor metal photodiode, according to some embodiments. The structure is similar to that shown in FIG. 23 except underneath metal M1 and M2 a P or N dope region extends in the I or low-dope silicon layer. In the MSM structure, the doped regions are both P doped or both N doped. For example, the inter-digitated electrode M1 is in contact with P and the inter-digitated electrode M2 is also in contact with the P doped region, and in some cases the inter-digitated electrode M1 is in contact with the N region and the inter-digitated electrode M2 is in contact with the N region. The doping of the P or N region can range from $1\times10^{16}/cm^3$ to $1\times100^{19}/cm^3$ or more. The doped wells can have a depth of 10 nanometers to 1000 nanometers or more and can extend partway or all the way through the thickness of the I or low dope layer of Si. The electrodes can be metal, such as Al, Ni, Cr, Cu, Mo, Ti, Ta, and/or V. The electrodes can also be silicide or a combination of silicide and metal. The microstructure holes can be etched partially into the I or low dope Si semiconductor, and/or entirely into the I or low dope Si semiconductor. In some cases a trench can be etched as in FIG. 22 prior to the doping and/or deposition of metal, and/or silicide. This same structure can be applied to Ge/GeSi such as for example FIGS. 28, 32, and 33.

Figure 39:
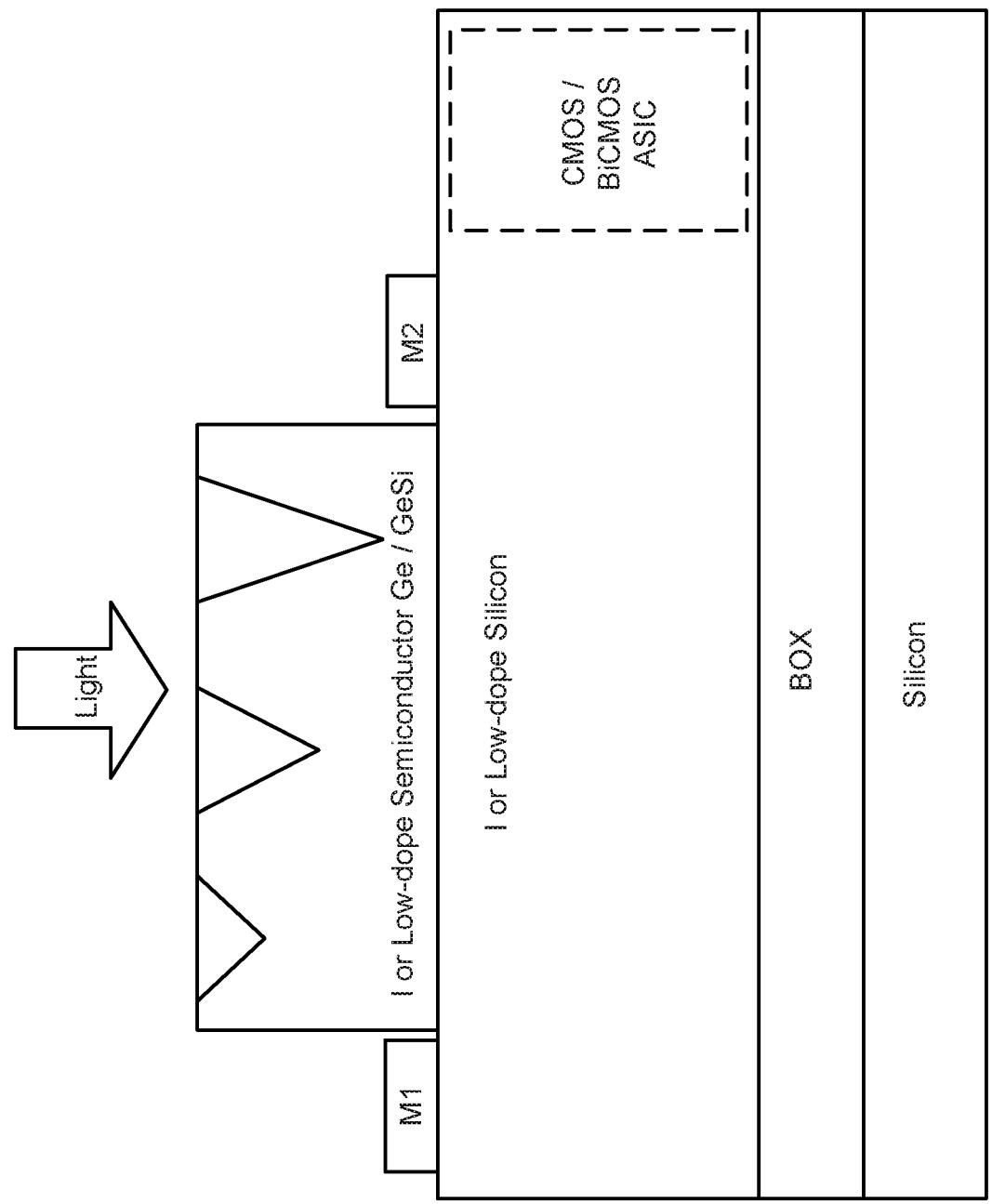
FIG. 39 is a simple partial cross-section of a inter-digitated microstructure hole photodiodes, according to some embodiments.

FIG. 39 is a simple partial cross-section of an inter-digitated microstructure hole photodiodes, according to some embodiments. The structure is similar to that shown in FIG. 28 except that the M1 and M2 electrodes are deposited on the I or low dope Si layer. The electrodes can make Schottky contact to the I or low dope Si layer, and in some cases as in FIG. 38 the electrodes can make P or N contacts. In some cases, as in FIG. 26 a lateral PIN structure can be provided. The reverse bias is applied between M1 and M2 and the electric field can exist in the Ge/GeSi layer where it can sweep out the photo-generated carriers to the M1 and M2 contacts. The structure of FIG. 39 can have reduced dark currant which can reduce or minimize noise in an optical communication system, and in some cases for LiDAR systems. As in FIGS. 29 and 30, the addition of a PN junction such as a PIPN junction can provide avalanche gain. Avalanche gain can range from 1 dB to 10 dB or more. Selective area grown Ge/GeSi on microstructure in Si such as in FIGS. 32 and 33 can be used; similarly, both M1 and M2 electrodes can be placed on the I or low-dope Si layer or on the Ge/GeSi layer.

Since Ge has a higher dielectric constant than Si, the electric field between the M1 and M2 electrodes will also penetrate the Ge layer. This electric field in the Ge will then cause the photo-generated carriers in the Ge layer to be swept to the M1 and M2 electrodes. In some cases, the M1 and M2 can be Schottky contacts, and in some cases the M1 and M2 can be P and N junctions. The electric field is generated by a reverse bias applied to the inter-digitated electrodes M1 and M2. The I or low dope Ge/GeSi can be crystalline, polycrystalline, nanocrystalline, amorphous, or any combination of the above.

Figure 40:
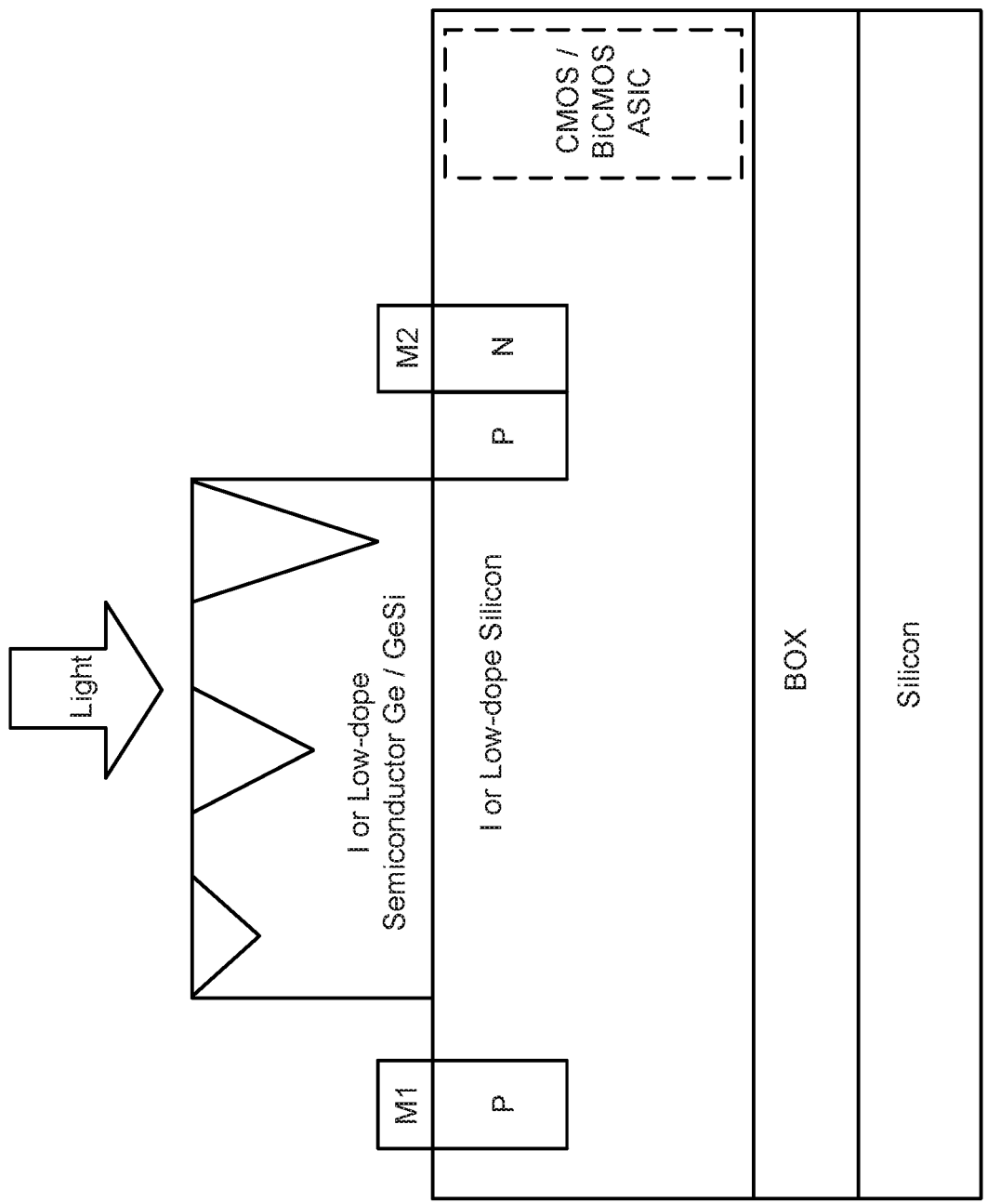
FIG. 40 is a partial simple cross-section schematic of a Ge/GeSi on Si inter-digitated microstructure hole photodiode, according to some embodiments.

FIG. 40 is a partial simple cross-section schematic of a Ge I GeSi on Si inter-digitated microstructure hole photodiode, according to some embodiments. The structure shown is similar to that of FIG. 39 except an additional PN junction is added to provide avalanche gain. The I or low dope Ge/GeSi on I or low-dope Si with microstructure holes for photo trapping absorbs photo-generated carriers that and are swept out under a reverse bias voltage applied between the M1 (anode) and M2 (cathode) with reverse bias ranging from −3V to −100V or more. In some cases the reverse bias ranges from −3V to −40V or more, and in some cases from −3V to −25V or more. Avalanche gain can range from 0 dB to 20 dB or more, and in some cases from 1.5 dB to 10 dB or more at certain wavelengths in the spectrum from 800 nanometers to 2000 nanometers. In some cases, the gain ranges can be at wavelengths from 800 nanometers to 1100 nanometers, in some cases from 850 nanometers to 1050 nanometers, in some cases from 850 nanometers to 1350 nanometers, in some cases from 1250 nanometers to 1400 nanometers, and in some cases from 1000 nanometers to 1750 nanometers.

Data rates can range from 10 megabits Mb/s to 3 gigabits Gb/s, in some cases from a few Gb/s to 10 Gb/s or more, in some cases the data rate can be 25 Gb/s or more, in some cases the data rate can be 50 Gb/s or more, and in some cases the data rate can be 100 Gb/s or more. The I or low-dope Ge/GeSi can be grown selectively on the Si between the inter-digitated electrode "fingers", and in some cases the Ge can be grown globally on the Si and trenches can be etched in the Ge to provide metal contacts to the Si. The BOX layer in some cases can be omitted.

Figure 41:
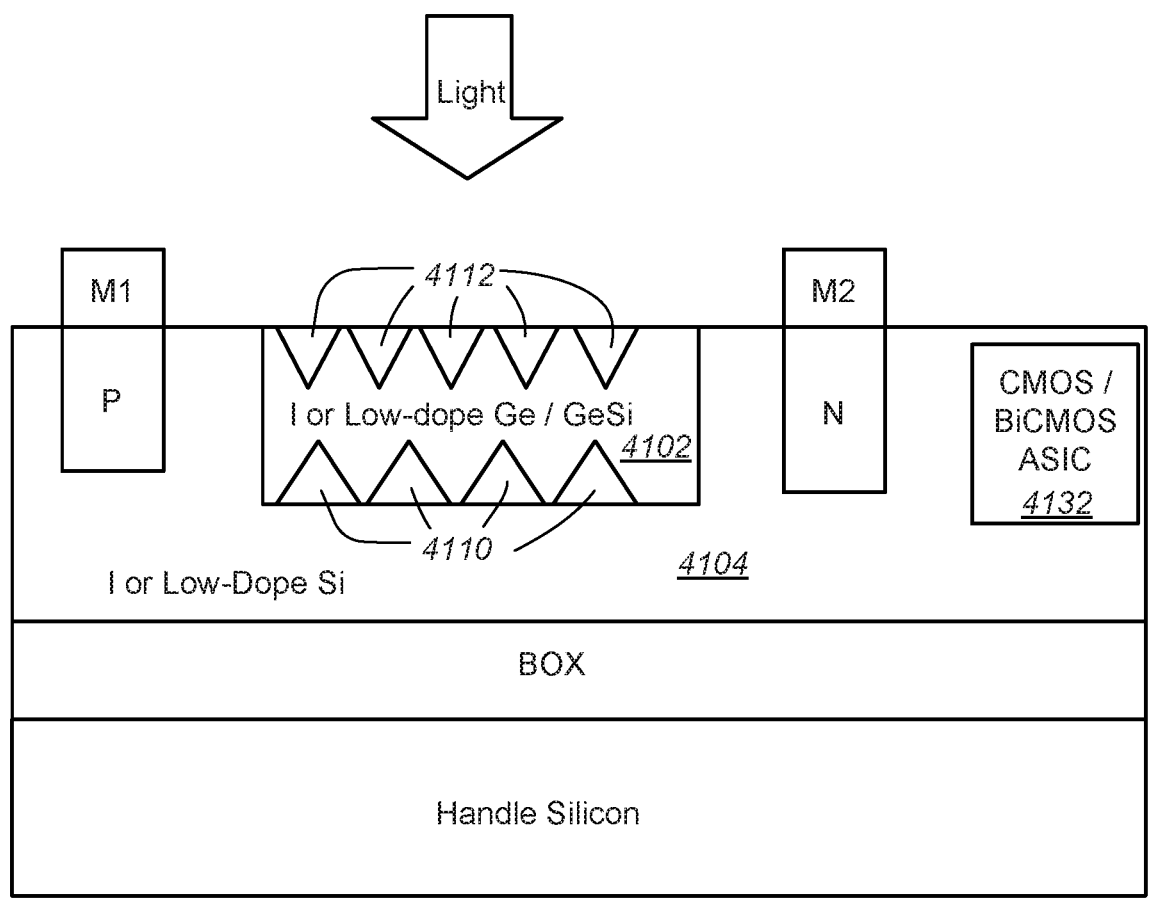
FIG. 41 is a partial simple cross-section schematic of an I or low-dope Ge/GeSi inter-digitated microstructure hole photodiode, according to some embodiments.

FIG. 41 is a partial simple cross-section schematic of I or low-dope Ge/GeSi inter-digitated microstructure hole photodiode, according to some embodiments. In this case I or low-dope Ge/GeSi region 4102 can be formed using selective epitaxy area growth on I or low-dope Si 4104. A slot can be etched in the Si 4104 between the electrodes. In the slot micro or nano structures 4110 can be etched or formed. The I or low-dope Ge/GeSi 4102 is then selective area grown in the slot. Additional microstructure holes 4112 can be formed on the surface of the I or low-dope Ge 4102. Schottky contacts of M1 and M2 can be made to the Si 4104 and in some cases PN junction can be formed in the Si 4104 where M1 and M2 can make ohmic contacts forming the anode and cathode respectively. In some cases avalanche gain PN junctions can be added in the Si 4104. A reverse bias is applied between the inter-digitated electrodes M1 and M2 to provide an electric field in the I or low-dope Ge I GeSi 4102 to sweep out photo-generated carriers to the anode and/or cathode, and in some cases to the forward and reverse bias Schottky contacts M1 and M2. The depth of the slot and/or the thickness of the I or low-dope Ge/GeSi layer 4102 can range from 100 nanometers to 5000 nanometers or more, in some cases from 250 nanometers to 2000 nanometers or more, in some cases from 300 nanometers to 2000 nanometers, in some cases from 300 nanometers to 1500 nanometers, and in some cases from 300 nanometers to 900 nanometers. The GeSi alloy can have Ge fraction ranging from greater than zero to 1 where 1 is pure Ge. The Ge/GeSi on Si inter-digitated microstructure hole photodetector can be integrated with CMOS, BiCMOS ASICs 4132. Arrays of the inter-digitated microstructure hole photodetectors (MSM, PIN, PIPN, PIPIN, PN, NIN, PIP, MSN, MSP) can be fabricated on the same chip, using respective slots in layer 4104, where the array size can be m×n where m and n are any digits; for example, for optical data communication m can range from 1 to 4, and n can range from 1 to 4. And in some cases, m can be 1 to 10 or more and in some cases n can be 1 to 10 or more. In LiDAR applications m and n can range from 1 to 100 or more.

In some cases, for Ge/GeSi on Si inter-digitated microstructure hole photodetectors, the BOX layer can be omitted. In some cases, for Si inter-digitated microstructure hole photodetector the BOX layer can be omitted. In some cases, the I "intrinsic" or low dope Si, Ge, GeSi can be crystalline, in some cases the I or low dope Si, Ge, GeSi can be polycrystalline, and in some cases the I or low dope Si, Ge, GeSi can be amorphous layers and/or regions.

FIG. 41 is an example of a high bandgap/low bandgap/high bandgap lateral photodiode structure. The photo-generated carriers are predominately in the low bandgap material (Ge/GeSi) and the electrical contacts are in the high bandgap material (Si) which can generate electric fields concentrated predominately in the low bandgap material, which can have a higher dielectric constant. Reverse bias is applied to the electrodes which can be anodes and cathodes and/or Schottky contacts. Similarly FIG. 39 also shows a high bandgap/low bandgap/high bandgap lateral photodetector structure.

Figure 42:
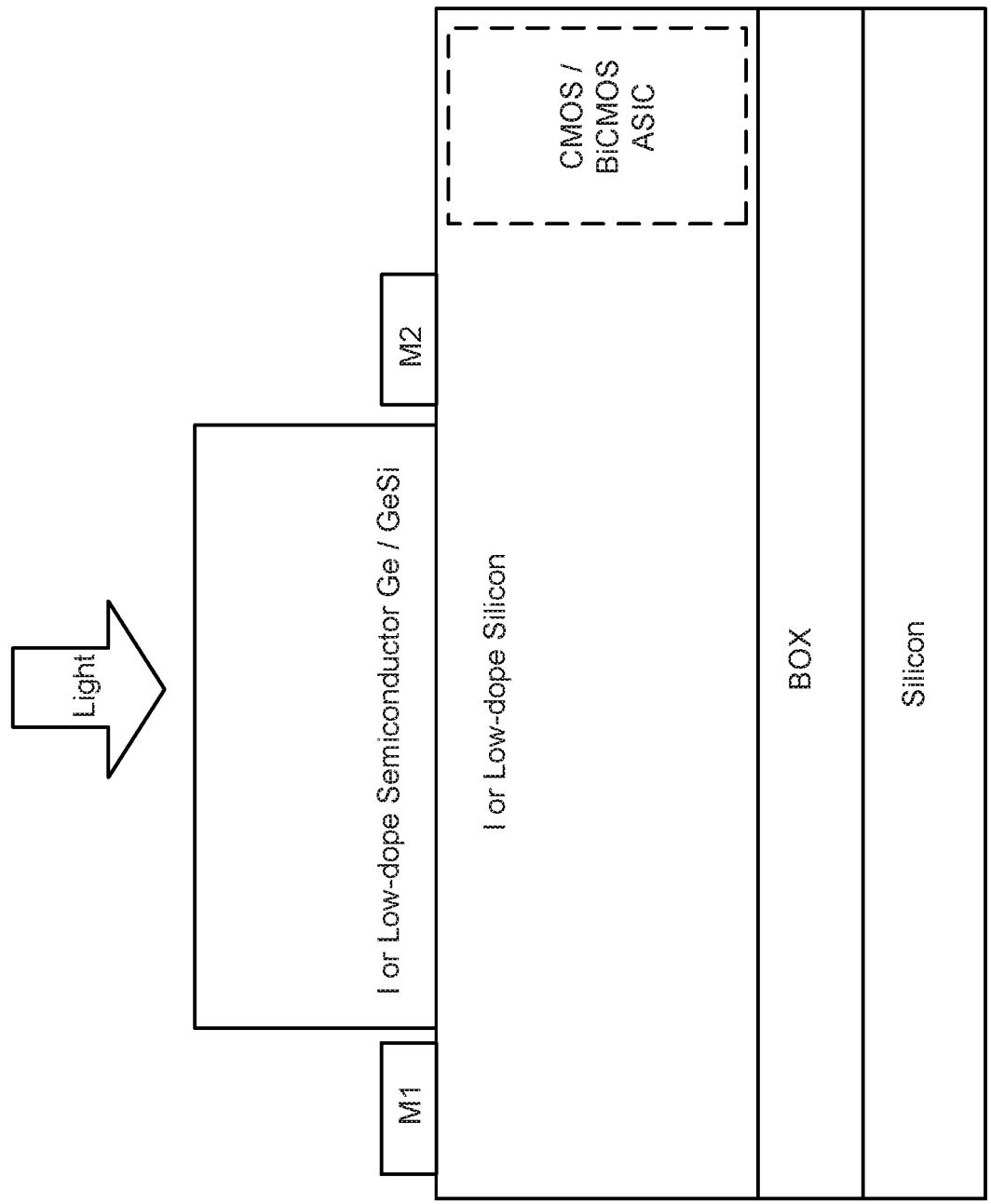
FIG. 42 is a simple partial cross-section of a Ge/GeSi on Si inter-digitated photodiode, according to some embodiments.

FIG. 42 is a simple partial cross-section of a Ge/GeSi on Si inter-digitated photodiode, according to some embodiments. The structure shown is similar to that shown in FIG. 39 except that microstructure holes have been omitted. The inter-digitated electrodes M1 and M2 are placed on the Silicon, and in some cases can be in contact with the Ge/GeSi layer. A reverse bias is applied between M1 and M2 where M1 and M2 can be Schottky contacts, and in some cases M1 and M2 can be in contact doped regions such as P and N doping. The inter-digitated photodetector is surface illuminated as shown. The inter-digitated photodetector shown in FIG. 42 without nanostructure or microstructure holes can have lower external quantum efficiency or responsivity than a similar Ge/GeSi inter-digitated microstructure hole photodetector shown in FIG. 39 for certain wavelengths.

Figure 43:
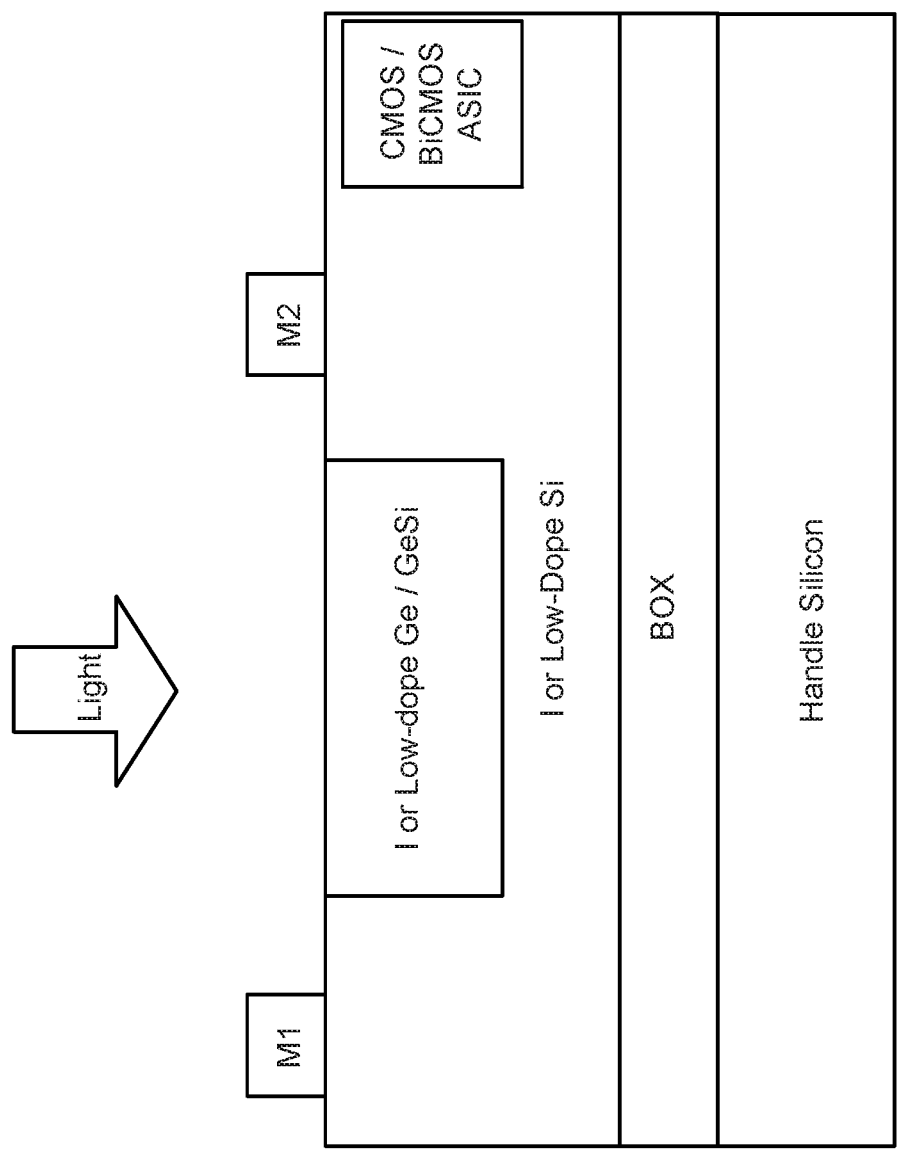
FIG. 43 is a simple partial cross-sections schematic of a Ge/GeSi inter-digitated photodetector, according to some embodiments.

FIG. 43 is a simple partial cross-sections schematic of a Ge/GeSi inter-digitated photodetector, according to some embodiments. The structure shown is similar to that of FIG. 41 except that micro and/or nanostructures for photon trapping have been omitted. This structure as shown in FIG. 43 can have lower external quantum efficiency or responsivity than a similar structure with microstructure holes for photon trapping at certain wavelengths. The Ge/GeSi can be crystalline, polycrystalline, nanocrystalline, amorphous, or in some cases a combination of any of these. The electrodes M1 and M2 can form a Schottky contact. In some cases, P and N doping can be formed under the electrodes to form PIN, PIP, NIN, PIPN, PIPIN lateral structures. In some cases the metal electrodes and/or doped wells can be in contact to the Silicon. In some cases the metal and/or P and N doped wells can be in contact with the Ge/GeSi. In some cases the metal and/or P and N doped wells can be in contact with both the Si and Ge/GeSi. The Ge/GeSi can be I or low dope, and the Si can be I or low dope. A reverse bias is applied between M1 and M2 to create a high field region in the Ge/GeSi region. Photo generated carriers are swept out in the Ge/GeSi under the high field to the M1 and M2 electrodes, which can be the anode and cathode respectively. The BOX layer in some cases can be omitted. The inter-digitated Ge/GeSi photodetector where the Ge/GeSi is selectively grown in a slot between the inter-digitated electrodes, can be monolithically integrated with CMOS/BiCMOS electronics. The Ge fraction in the GeSi alloy can range from 0 to 1 where 0 is all Si and 1 is all Ge. The Ge/GeSi on Si inter-digitated photodiode can operate from 800 nanometers to 2000 nanometers wavelength. In some cases the wavelength can range from 800 to 1100 nanometers, 800 to 1350 nanometers, 900 nanometers to 1400 nanometers, or 1000 nanometers to 1600 nanometers. Data rates can range from less than 1 Gb/s to 10 Gb/s. In some cases, data rates can reach 25 Gb/s, in some cases 50 Gb/s, and in some cases to 100 Gb/s or more. Arrays of inter-digitated Ge/GeSi photodetectors can be fabricated for both optical data communication and for LiDAR applications. The arrays can be in 1 dimension or 2 dimensions, and in some cases 3 dimensions.

The resistivity of the low dope Si can be greater than the resistivity of the low dope Ge/GeSi. The thickness of the Si layer beneath the selective area grown Ge/GeSi can range from 1 nm to 1000 nm, and in some cases less than or equal to 100 nm.

Figure 44A:
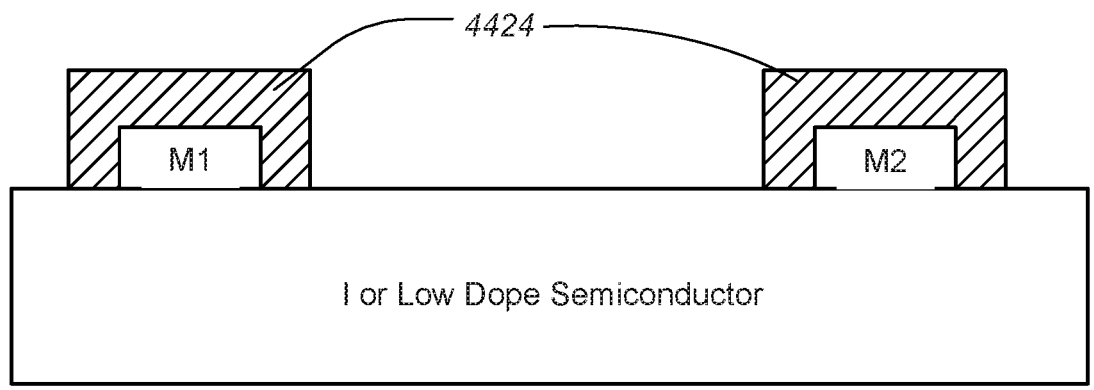
FIGS. 44A-44B are simple partial cross-sections of inter-digitated photodetector electrodes, according to some embodiments.
Figure 44B:
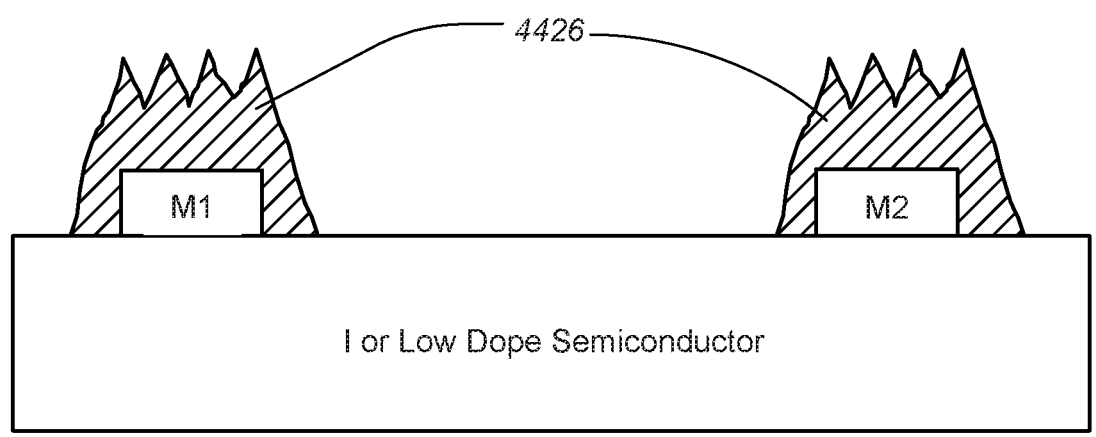

FIGS. 44A-44B are simple partial cross-sections of inter-digitated photodetector electrodes, according to some embodiments. The electrodes M1 and M2 are metal such as Al, Mo, Ni, Cr, Cu, Pt, Ti, Ta or V. In some cases, the electrodes can be metal silicide such as Ni silicide or Pt silicide. In some cases, the electrodes can be metal nitride such as TiN or TaN. In some cases, the electrodes are a combination of one or more metals, metal silicides, and/or metal nitrides. For some applications optical reflection from the electrodes, M1 and M2 is not desirable. In FIG. 44A, amorphous semiconductor 4424 is deposited on the electrodes M1 and M2. Examples of material for amorphous semiconductor 4424 includes amorphous silicon, amorphous Ge, and amorphous GaAs. The amorphous semiconductor covering the inter-digitated electrodes can absorb incident photons and thus significantly reduce reflection from the electrode surfaces. The amorphous semiconductor 4424 thickness can range from 10 nanometers to 1000 nanometers or more.

FIG. 44B shows a nanostructured semiconductor and/or dielectric 4426 deposited on the metal electrode M1 and M2. The nanostructures 4426 can be black silicon for example. These nanostructures 4426 deposited on the electrodes M1 and M2 can absorb incident photons and thus can significantly reduce reflection from the surface of the inter-digitated electrodes. In some applications such as for optical data communication, optical reflections from the inter-digitated photodetector surface is not desirable, and an anti-reflection coating (not shown) can be used to reduce surface reflection from the semiconductor regions. And in some cases, microstructures such as microstructure holes can be used to reduce surface reflections from the I or low dope semiconductor.

Regions outside the photosensitive I or low dope inter-digitated photodetector can be coated with amorphous semiconductor and/or black silicon which can be created using dry etching of silicon. Amorphous semiconductor and/or black silicon can be deposited on the transmission lines, and other regions outside of the photosensitive area to reduce optical reflection. Optical reflection in optical communication applications in some cases is desirable to be less than or equal to 5%, and in some cases less than or equal to 3%, and in some cases less than or equal to 1% at certain wavelengths of operation.

Figure 45:
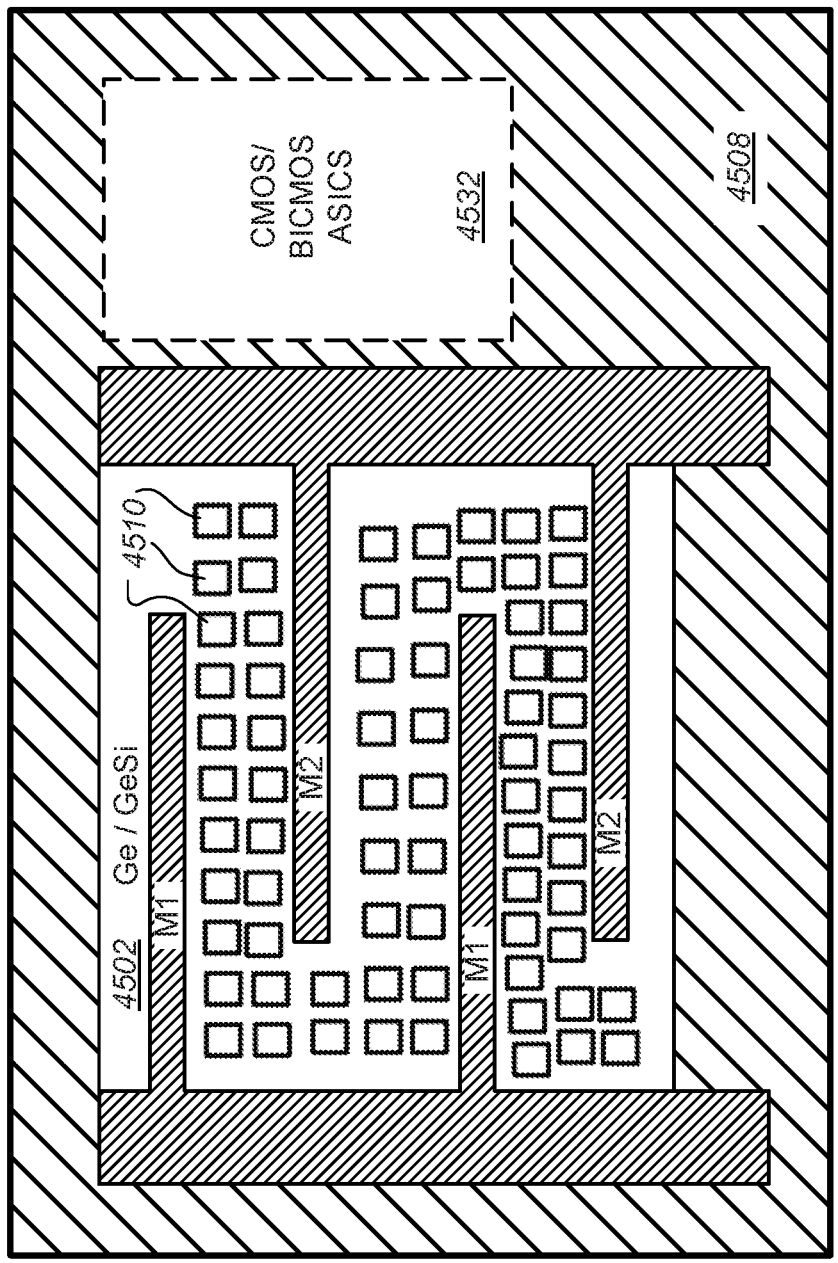
FIG. 45 is a top view of a partial simple schematic of an inter-digitated microstructure hole photodetector, according to some embodiments.

FIG. 45 is a top view of a partial simple schematic of an inter-digitated microstructure hole photodetector, according to some embodiments. In this case Ge/GeSi layer 4502 is grown selectively as in FIG. 1 on Si substrate or SOI substrate 4508. The microstructure holes 4510 in the Ge/GeSi 4502 are dielectrics such as Silicon dioxide and the Ge/GeSi can be grown in areas not covered by dielectric or silicon dioxide. In FIG. 45 the Ge/GeSi layer 4502 is grown only in the inter-digitated region; everywhere else the device can be covered with a dielectric layer and/or silicon dioxide. The microstructure holes 4510 in the Ge/GeSi layer can be implemented with islands of dielectric such as silicon dioxide. These islands of dielectric or silicon dioxide can be any shape such as square, circular, polygonal, oval, star, clover, amoebic, and/or any other combination of shapes. The lateral dimension of the dielectric island 4510 can range from 50 nanometers to 3000 nanometers or more, in some cases from 200 nanometers to 2500 nanometers, and in some cases from 300 nanometers to 2000 nanometers. The spacing between the adjacent dielectric islands 4510 can range from 50 nanometers to 3000 nanometers or more, in some cases from 200 nanometers to 2000 nanometers, and in some cases from 300 nanometers to 3000 nanometers. The height of the islands 4510 can range from 10 nanometers to 5000 nanometers, in some cases from 100 nanometers to 3000 nanometers, and in some cases from 10 nanometers to 10,000 nanometers or more. More than one shape of the islands can exist, and the islands can be in a periodic and/or aperiodic and/or random pattern, and in some cases any combination of periodic, aperiodic and random. The Ge/GeSi 4502 can be intrinsic (I) and/or low dope P and N such as P− or P−− and/or N− or N−−. The inter-digitated electrodes M1 and M2 can have a width ranging from 20 nanometers to 5000 nanometers or more, and in some cases from 20 nanometers to 300 nanometers. The spacing between the inter-digitated electrodes M1 and M2 can range from 100 nanometers to 10,000 nanometers or more. The inter-digitated electrodes M1 and M2 are connected to a wider transmission line that is further connected to bond pads and/or CMOS BiCMOS electronics 4532. The length of the inter-digitated electrode "fingers" can range from 1 micron to 100 microns or more, in some cases from 5 microns to 1000 microns or more, in some cases from 5 microns to 100 microns, and in some cases from 10 microns to 100 microns or more. The overall photo sensitive area defined by the inter-digitated finger region of the inter-digitated photodetector can be circular, rectangular, polygonal, hexagonal, square, and can have one of its lateral dimensions ranging from 1 micron to 1000 microns or more, in some cases from less than 1 micron to 1000 microns or more, and in some cases from 10 microns to 100 microns. For example, for a circular shape photosensitive area the diameter can range from 3 microns to 1000 microns or more, and in some cases from 10 microns to 100 microns. Similarly, for a square shaped photosensitive area the dimension from 1 side can range from 5 microns to 1000 microns or more, in some cases from 10 microns to 1000 microns or more, and in some cases from 10 microns to 100 microns. The transmission line connecting the inter-digitated electrodes M1 and M2 can be off the Ge/GeSi layer and can be on the silicon and/or dielectric surface, and/or silicon dioxide surface.

Figure 46:
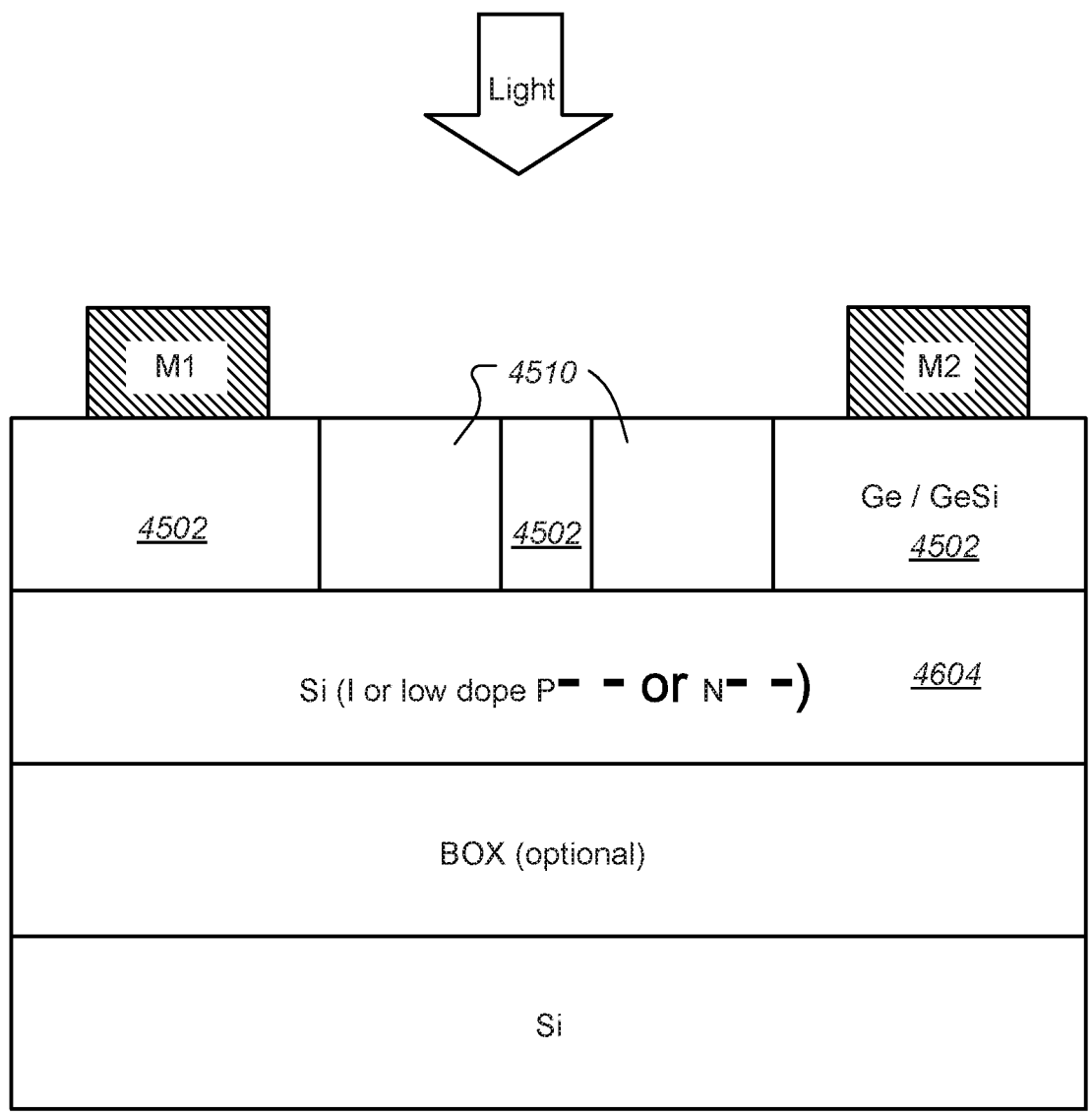
FIG. 46 is a partial simple cross-section schematic of an inter-digitated microstructure hole Ge/GeSi on Si photodetector shown in FIG. 45.

FIG. 46 is a partial simple cross-section schematic of an inter-digitated microstructure hole Ge/GeSi on Si-photodetector shown in FIG. 45. The BOX layer can be omitted. The inter-digitated electrodes M1 and M2 can be Schottky contacts on I or low dope Ge/GeSi 4502, and in some cases the electrode M1 can be and ohmic contact to a P well (not shown), and electrode M2 can be an ohmic contact to an N well (not shown), and in some cases M1 can be in contact P well (not shown), and electrode M2 can also be in contact with the P well (not shown), and in some cases M1 can be in contact with the N well (not shown), and M2 can also be in contact with the N well (not shown). In selective area growth of Ge/GeSi 4502 the dielectric and/or silicon dioxide islands 4510 can be used to define the microstructure holes in the Ge/GeSi layer 4502 that can be used for photon trapping to enhance photon absorption and therefore the external quantum efficiency, and in some cases also called quantum efficiency. A reverse bias is applied between M1 and M2 and in some cases M1 can be the anode, and M2 can be the cathode, and in some cases M2 can be anode, and M1 can be the cathode. The thickness of the I or low dope Ge/GeSi can range from 100 nanometers to 5,000 nanometers or more, in some cases from 500 nanometers to 2,000 nanometers, and in some cases from 500 nanometers to 3,000 nanometers. The cross-section of the microstructure holes 4510 can be cylindrical, funnel, trapezoidal, inverted trapezoidal, and in some cases can have curvatures and/or any combination of straight and/or curved surfaces. The device layer 4604 in the case of a SOI substrate can be intrinsic and/or low dope silicon such as P-, P--, or N-,N--. The Si device layer can range in thickness from 10 nanometers to 2000 nanometers or more.

The microstructure holes 4510 and mesa of the Ge/GeSi are formed by selective area growth of Ge/GeSi on Si and can have a lower leakage currant than a similar structure formed by etching. Passivation is not shown and can include amorphous semiconductor, oxides, nitrides, and other dielectrics such as silicon dioxide, silicon nitride, aluminum oxide, and/or aluminum nitride.

Figure 47:
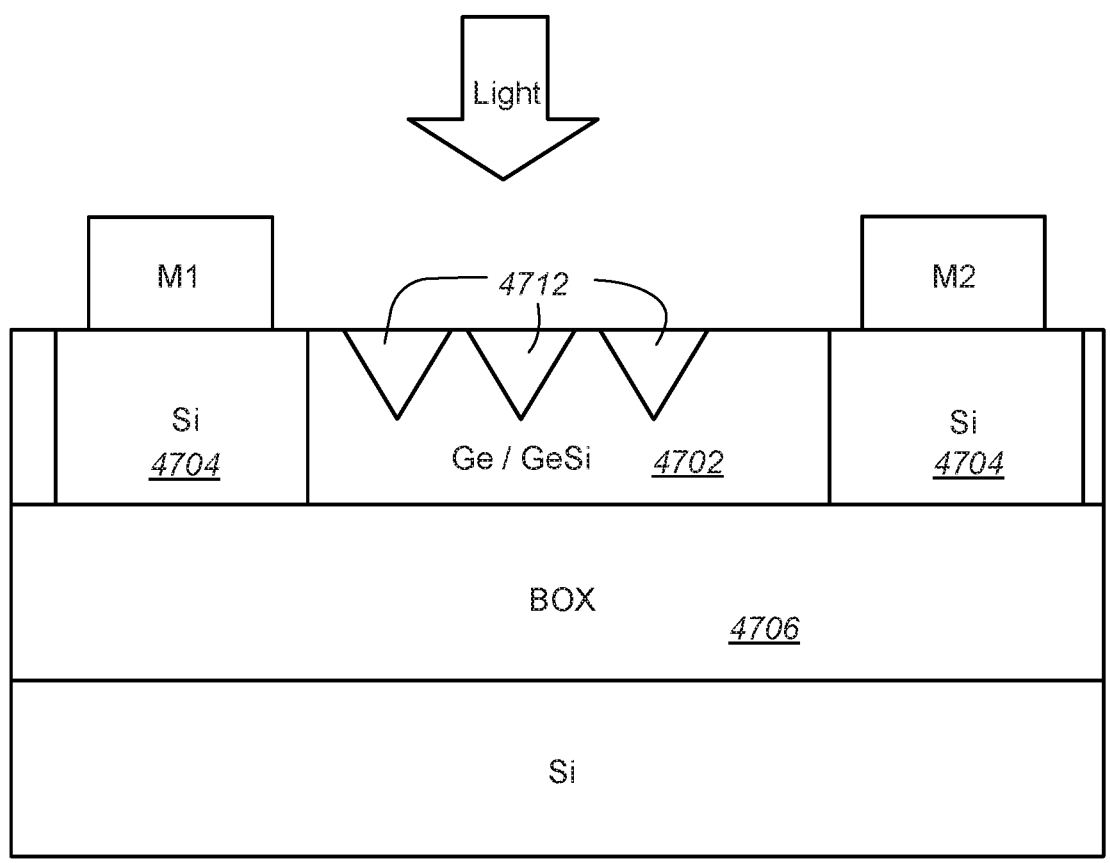
FIG. 47 is a partial simple cross-section schematic of an inter-digitated selective area grown Ge/GeSi on Si photodetector, according to some embodiments.

FIG. 47 is a partial simple cross-section schematic of an inter-digitated selective area grown Ge/GeSi on Si photodetector, according to some embodiments. In this case the Ge/GeSi 4702 is grown laterally from the sidewall of the Si 4704. In this structure Si 4704 is etched away in a slot between the inter-digitated electrodes M1 and M2 all the way to the BOX layer 4706. Ge/GeSi 4702 is then selective area grown in the inter-digitated region and where Ge/GeSi initiates growth only on the sidewall of the Si 4704 and where after a period of time Ge/GeSi that are growing from opposing sidewalls are joined together at approximately half the distance between the inter-digitated electrodes M1 and M2. This is sometimes known as epitaxy lateral growth. Regions where Ge/GeSi growth is inhibited are covered by dielectric such as silicon dioxide and, and in some cases silicon nitride. The M1 and M2 electrodes can be placed on the Si layers 4704, and can be Schottky contacts and/or ohmic contacts to P and N wells (not shown). The Ge/GeSi 4702 can be intrinsic and/or low doped P or N, and the silicon layer 4704 can be intrinsic and/or low doped P or N.

In some cases the Si layer 4704 can be doped Si layer of P type or N type, and in some cases additional P N junction can be formed on the Si layer such that an avalanche gain region can be created. A reverse bias is applied between inter-digitated electrode M1 and inter-digitated electrode M2, and in some cases M1 can be in contact with the P well (anode) and M2 can be in contact with the N well (cathode). Reverse bias voltages can range from −1 volt to −100 volts, in some cases from −3 volts to −30 volts, in some cases −1 volt to −4 volts, and in some cases 0 volts. Microstructure holes 4712 can be etched, and in some cases microstructure holes can be selective area grown such as in FIG. 45, and in some cases microstructure holes may be omitted. Microstructure hole inter-digitated photodetector can have a higher external quantum efficiency, or quantum efficiency greater than that of a comparable inter-digitated photodetector without microstructure holes at certain wavelengths. The Si layer thickness can range from 100 nanometers to 3000 nanometers or more, and the epitaxial lateral growth of Ge/GeSi layer thickness can range from 100 to 3,000 nanometers or more. Wavelength ranges for photo carriers electron and holes generated in the Ge/GeSi layer can range from 700 to 2,000 nanometers, and in some cases from 800 to 1600 nanometers. Arrays of inter-digitated photodetectors with or without microstructure holes can be fabricated. Arrays of M×N where M can be a digit from 1 to 100 or more, and N can be a digit 1 to 100 or more can be monolithically integrated on a single chip with CMOS/BiCMOS ASICs. In optical communication M can range from 1 to 10, and N can range from 1 to 10. In LiDAR and/or imaging applications M can range from 1 to 300 or more, and N can range from 1 to 300 or more, and in some cases M and N can be 1000 or more. Amorphous Si and/or amorphous Ge can be deposited on the BOX layer to facilitate selective area growth in addition to the epitaxial lateral over growth (ELOG) from the Si sidewalls.

Figure 48A:
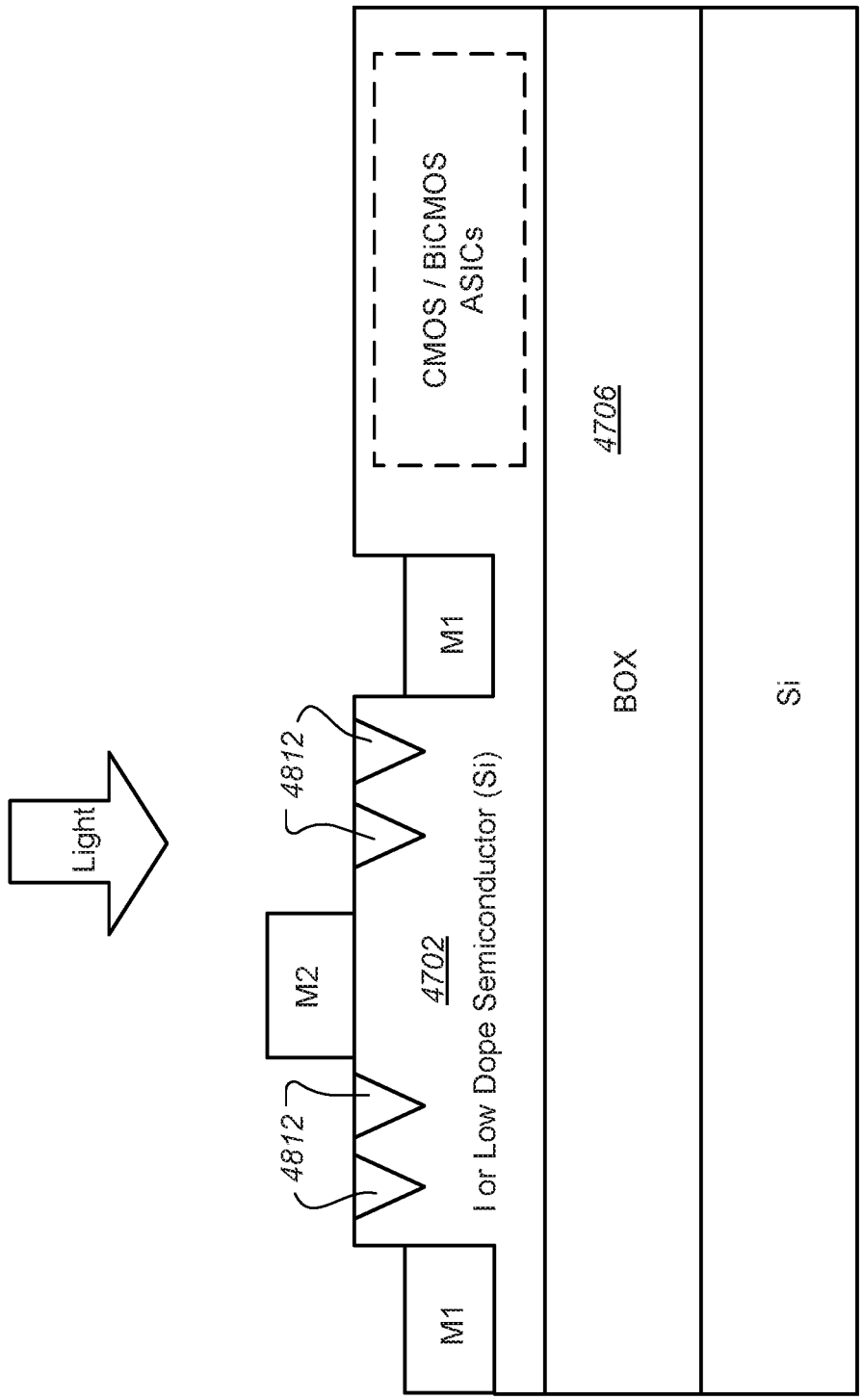
FIG. 48A is simple partial cross-section of a photodetector having inter-digitated electrodes on different horizontal planes, according to some embodiments.

FIG. 48A is simple partial cross-section of a photodetector having inter-digitated electrodes on different horizontal planes, according to some embodiments. As shown, the electrode M1 is placed in a trench and electrode M2 is placed above the trench. The depth of the trench can range from 50 nanometers to 3,000 nanometers or more, and the width of the trench can range from 50 nanometers to 300 nanometers or more, and in some cases from 100 nanometers to 500 nanometers. The I or low dope semiconductor 4802 can be Si, Ge, or GeSi, or any combination of Si and Ge/GeSi, and can be on a BOX layer 4706. Microstructure holes 4812 such as inverted pyramids or cylindrical or funnel can be formed on the I or low dope semiconductor 4702. A reverse bias is applied between the inter-digitated electrodes M1 and M2 and an electric field is formed between M1 and M2. Photo generated carriers are then swept toward the anode and cathode. M1 and M2 can be Schottky and/or ohmic contacts, and in some cases M2 can be Schottky and M1 can be ohmic to P or N wells (not shown) and in some cases M1 can be ohmic to a P well (not shown) and M2 can be ohmic to and N well not shown), and in some cases the N and P can be interchanged.

In some cases, multiple layers of I or low dope Si, and/or I or low dope Ge/GeSi layers can be employed in the inter-digitated microstructure hole photodetector, and in some cases multiple doping levels or N and P type can be used in the inter-digitated microstructure hole photodetector, and in some cases multiple ion implant energies, dose, species can be used in the fabrication of inter-digitated microstructure hole photodetector. In some cases, multiple diffusion profiles of N and P, and/or multiple diffusion depths of N and P dopants can be used in the fabrication of inter-digitated microstructure hole photodetectors. Passivation (not shown) can include native oxide such as silicon dioxide and/or dielectrics and/or amorphous semiconductor. Electrodes M1 and M2 can be metal, and in some cases can be silicide, and in some cases can be metal silicide, and in some cases can be a combination of metal and metal silicide.

Figure 48B:
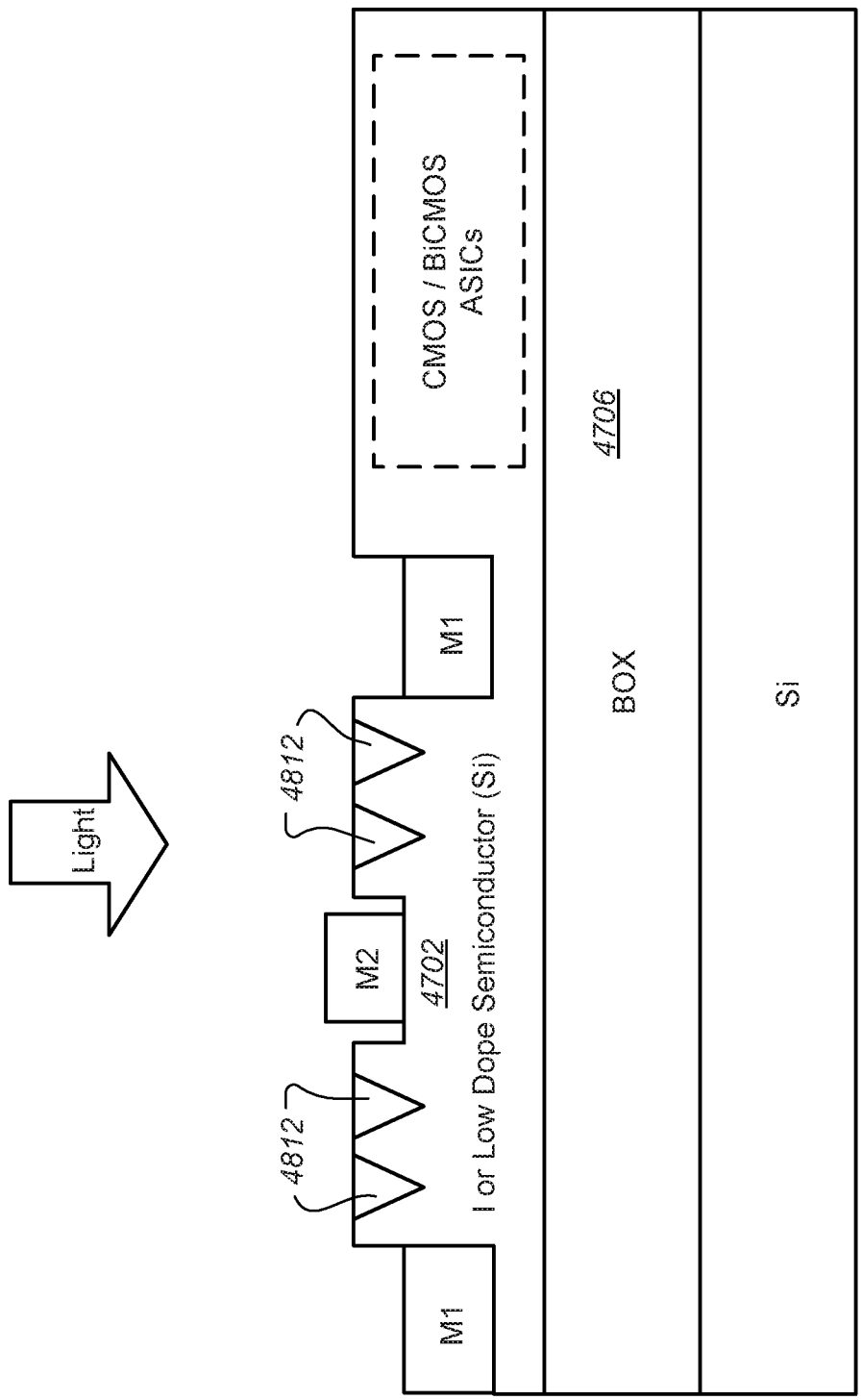
FIG. 48B is a cross-section of a structure similar to FIG. 48A, according to some embodiments.

FIG. 48B is a cross-section of a structure similar to FIG. 48A, according to some embodiments. In FIG. 48B, the electrode M2 is sunken below the surface as shown for more uniform control of the electric field. The depth of the trench for the M2 electrode can range from 10 nanometers to 1000 nanometers or more, and the depth of the M1 electrode trench can range from 10 nanometers to 3000 nanometers or more.

In some cases, the inter-digitated microstructure hole photodetectors can be illuminated from the back surface, and in some cases the material for the inter-digitated photodetector can be made from a III-V material family, such as GaAs, InP, GaN to name a few.

The data rate of inter-digitated photodetector can be determined primarily from the electron hole transit time between the inter-digitated electrodes, and the capacitance between the inter-digitated electrodes. Inter-digitated photodetectors with microstructure holes can have lower capacitance between the "fingers" which can further reduce the RC time resulting in a faster photodetector. The two time constants are commonly known as the transit time and RC time. For high data rate inter-digitated devices low dope and/or intrinsic layers can be used such that at the operating voltage, the region between the inter-digitated fingers are mostly depleted. Depending on the operating voltage, the doping of the semiconductor can range from intrinsic to low dope such as $P^{--}$, $N^{--}$, $P^-$, $N^-$, P and N. Reverse bias voltages can range from −1 volt to −100 volts, in some cases from −1 volt to −35 volts, in some cases, −1 volt to −4 volts, and in some cases 0 volts.

Figure 48C:
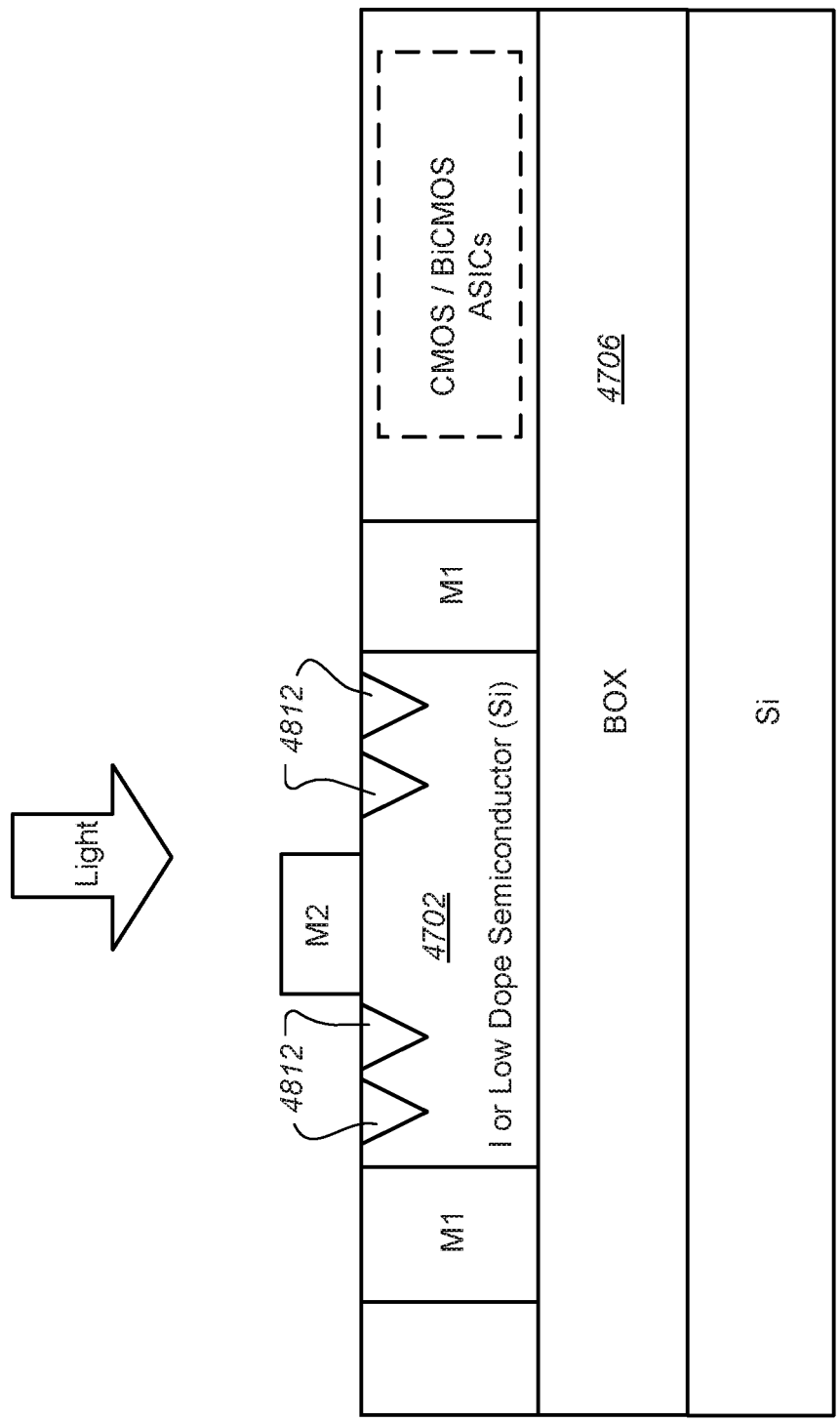
FIG. 48C is a simple partial cross-section of an inter-digitated photodetector with microstructure holes, according to some embodiments.

FIG. 48C is a simple partial cross-section of an inter-digitated photodetector with microstructure holes, according to some embodiments. The structure shown is similar to that of FIG. 48A. In this case, one of the inter-digitated electrodes, for example M1, is deposited in a trench that extends to the BOX layer 4706. The trench can be wet or dry etched, or a combination of wet and dry etched. The M1 inter-digitated electrode can be metal and/or metal silicide that can completely fill the trench. The width of the M1 electrode for example in the trench can have a range from 60 nanometers or less to 300 nanometers or more. The M2 electrode is shown on the surface of the I or low dope semiconductor 4702, for example Si, and can have a width ranging from 60 nanometers or less to 300 nanometers or more. And in some cases, the width of the inter-digitated electrodes can range from 60 nanometers to 300 nanometers. The thickness of the I or low dope semiconductor 4702, for example Si, can range from 300 nanometers to 3000 nanometers or more. The thickness of the BOX layer 4706 can range from 100 nanometers to 4000 nanometers or more, and in some cases can be less than 100 nanometers.

Figure 48D:
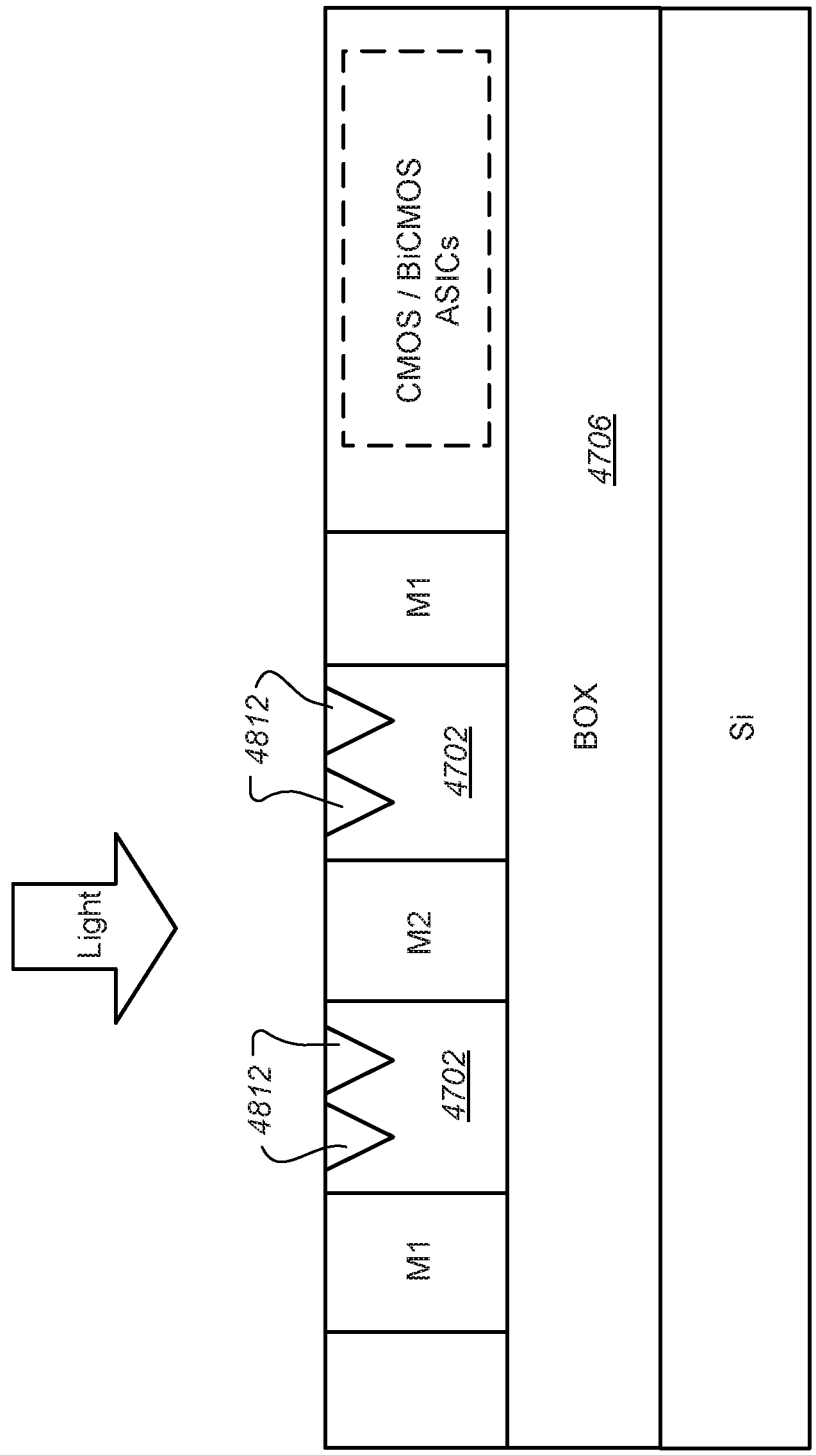
FIG. 48D is a simple partial cross-section of an inter-digitated photodetector with microstructure holes, according to some embodiments.

FIG. 48D is a simple partial cross-section of an inter-digitated photodetector with microstructure holes, according to some embodiments. The structure shown is similar to that of FIG. 48C. In this case both the inter-digitated electrodes M1 and M2 are deposited in respective trenches that are etched to the BOX layer 4706 as shown. The inter-digitated electrodes are deposited in a trench that is dry and/or wet etched or any combination of dry and wet etch. The electrodes M1 and/or M2 can be metal, and/or metal silicide, and/or any combination of metal and metal silicide. This structure where the electrodes of both M1 and M2 extend to the BOX layer can provide a more uniform electric field between M1 and M2 electrodes when an external voltage bias is applied between M1 and M2. Such uniform electric field can be important for high data rate operation of the inter-digitated photodetector for data rates ranging from 10 to 50 Gb/s or more, and in some cases 100 Gb/s or more. The I or low dope layer 4702 thickness can range from 300 nanometers to 3000 nanometers, and in some cases the thickness of the I of low dope semiconductor thickness can be 3000 nanometers or more. In some cases, the thickness of the I or low dope layer semiconductor 4702 can range from 500 nanometers to 1500 nanometers, and in some cases the thickness can range from 500 nanometers to 5000 nanometers or more. In some cases, microstructure holes 4812 may be omitted especially for layer thicknesses greater than 5000 nanometers at some wavelengths. Inter-digitated photodetectors with microstructure holes can have a higher external quantum efficiency or quantum efficiency than a similar inter-digitated photodetector without microstructure holes at certain wavelengths. Wavelength range for inter-digitated photodetector with I or low dope silicon can range from 800 to 1100 nanometers, and in some cases from 850 to 950 nanometers, and in some cases 850 to 1050 nanometers. Inter-digitated photodetector can be monolithically integrated with CMOS/BiCMOS ASICs and can have array size ranging from 1×4, 4×4, to 10×10, 100×100, 1000×1000 or more.

Figure 48E:
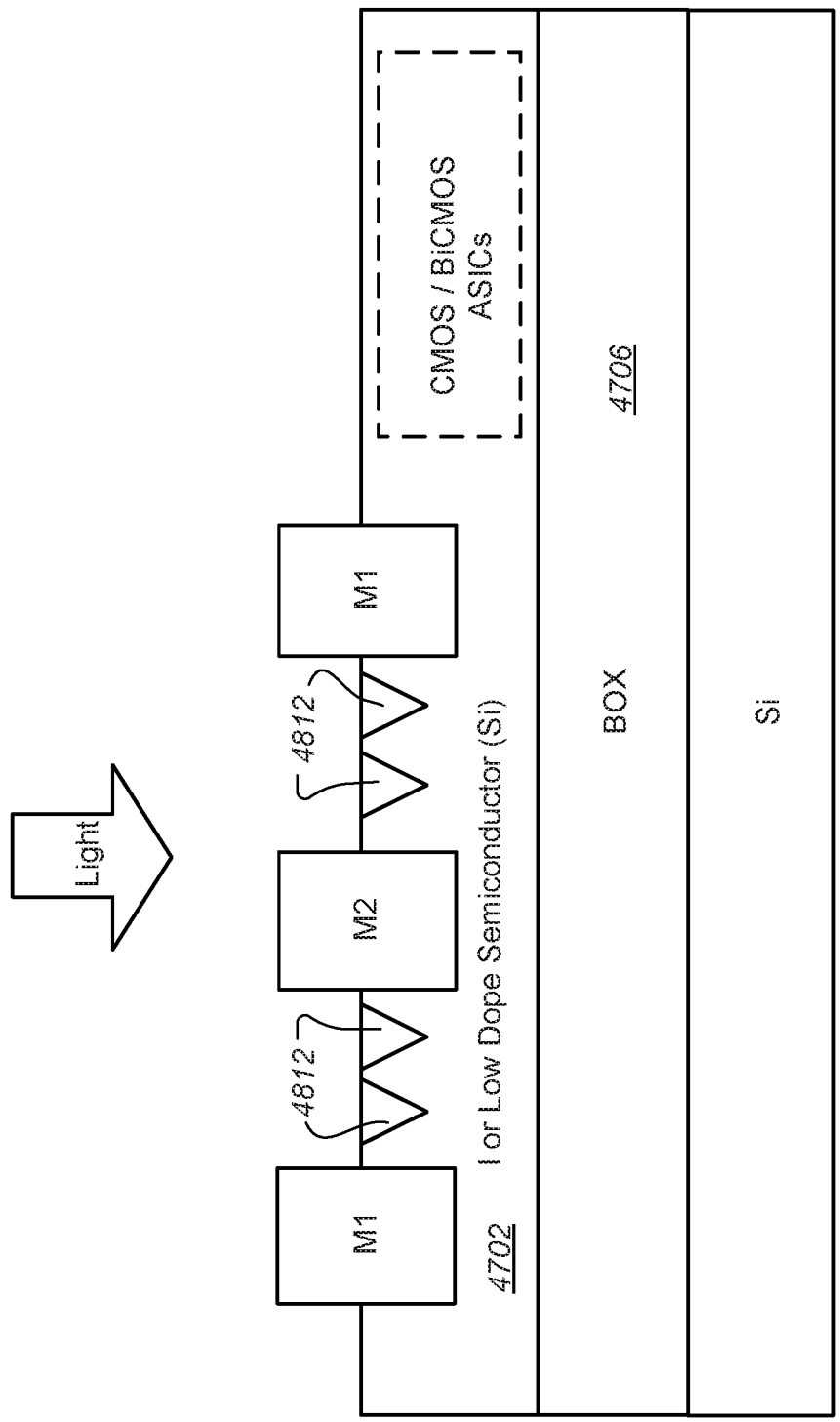
FIG. 48E is a simple partial cross-section of an inter-digitated photodetector with microstructure holes, according to some embodiments.

FIG. 48E is a simple partial cross-section of an inter-digitated photodetector with microstructure holes, according to some embodiments. The structure shown is similar to that of FIG. 48D except the electrodes extend only partially into the I or low dope Si or Ge/GeSi 4702 and in some cases the electrodes can be ⅓ of the way into the I or low dope semiconductor 4702, and in some cases ½ or more way into the I or low dope semiconductor.

The electrodes can be metal or metal silicide, or transparent metal oxide, or transparent metal nitride, and/or any combination thereof. In some cases, the dopant can be P type or N type to form lateral PIN junctions, and in some cases can be N type to form NIN junctions, and in some cases P type for form PIP junctions, and in some cases PN junctions can be added to form PIPN junctions or NINP junctions or PIPIN junctions or NINIP junctions for avalanche gain. And in some cases, PIN junctions or NIP junctions can also have avalanche gain. With the addition of microstructure holes electric field concentration can be intense at the holes such that avalanche gain can be achieved at a lower bias than a comparable photodetector structure without microstructure holes. Reverse bias voltage between M1 and M2 can range from 0 to 100 volts, and in some cases from 1 to 4 volts, and in some cases from 3 to 40 volts, and in some cases from 10 to 100 volts or more.

Figure 48F:
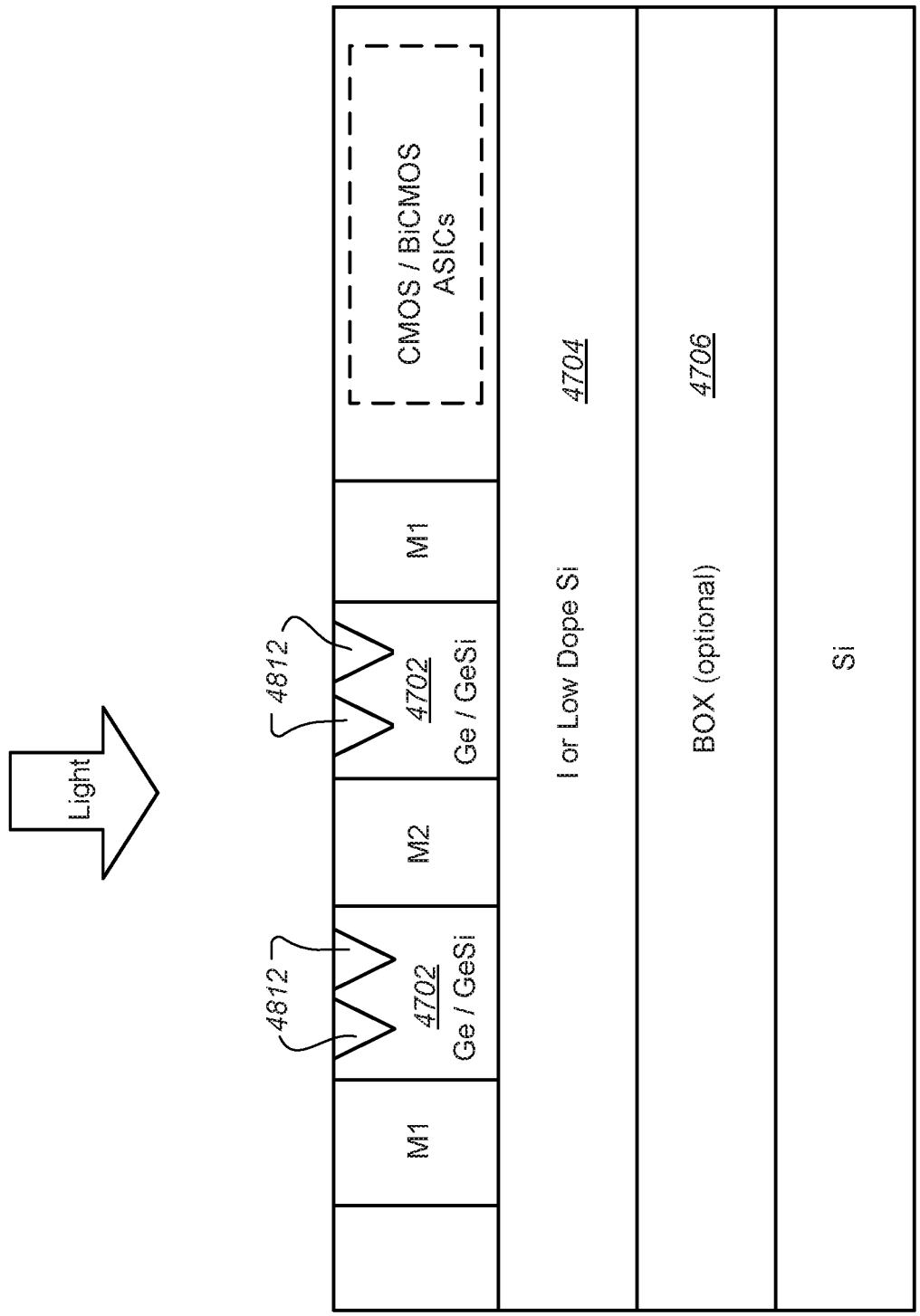
FIG. 48F is a simple partial cross-section of an inter-digitated photodetector with microstructure holes, according to some embodiments.

FIG. 48F is a simple partial cross-section of an inter-digitated photodetector with microstructure holes, according to some embodiments. In this case, the Ge/GeSi layer 4702 is formed on Si layer 4704. BOX layer 4706 is optional. The I or low dope Ge/GeSi 4702 can have a thickness range of 100 nanometers to 3000 nanometers or more, in some cases from 500 nanometers to 2000 nanometers, and in some cases from 500 nanometers to 1000 nanometers. The I or low dope Si 4704 can have a layer thickness range of 100 nanometers to 2000 nanometers or more, and in some cases the BOX layer can be optional. The BOX layer thickness can range from 100 nanometers to 4000 nanometers or more. The inter-digitated electrodes M1 and M2 extend to the Si layer 4704 and in some cases extend into the Si layer 4704. In some cases, the electrodes M1 and M2 extend to or into the BOX layer. The M1 and M2 electrodes can be metal and/or metal silicide, and/or metal germanium, and/or any combination of metal and metal germanium alloy. The width of the M1 and M2 electrodes can range from 60 nanometers to 300 nanometers or more, and in some cases the M1 and M2 electrodes can be less than 60 nanometers wide. Microstructure holes can be etched in the Ge/GeSi with lateral dimensions ranging from 300 nanometers to 3000 nanometers or more, and the depth ranging from 100 nanometers to 3000 nanometers or more. The wavelength range depending on the germanium fraction in the GeSi alloy can range from 800 nanometers to 2000 nanometers. In some cases microstructure holes 4812 may be omitted for thicker layers of Ge/GeSi at certain wavelengths. Inter-digitated microstructure hole photodetectors have higher external quantum efficiency than a similar inter-digitated photodetector without microstructure holes at certain wavelengths.

Figure 48G:
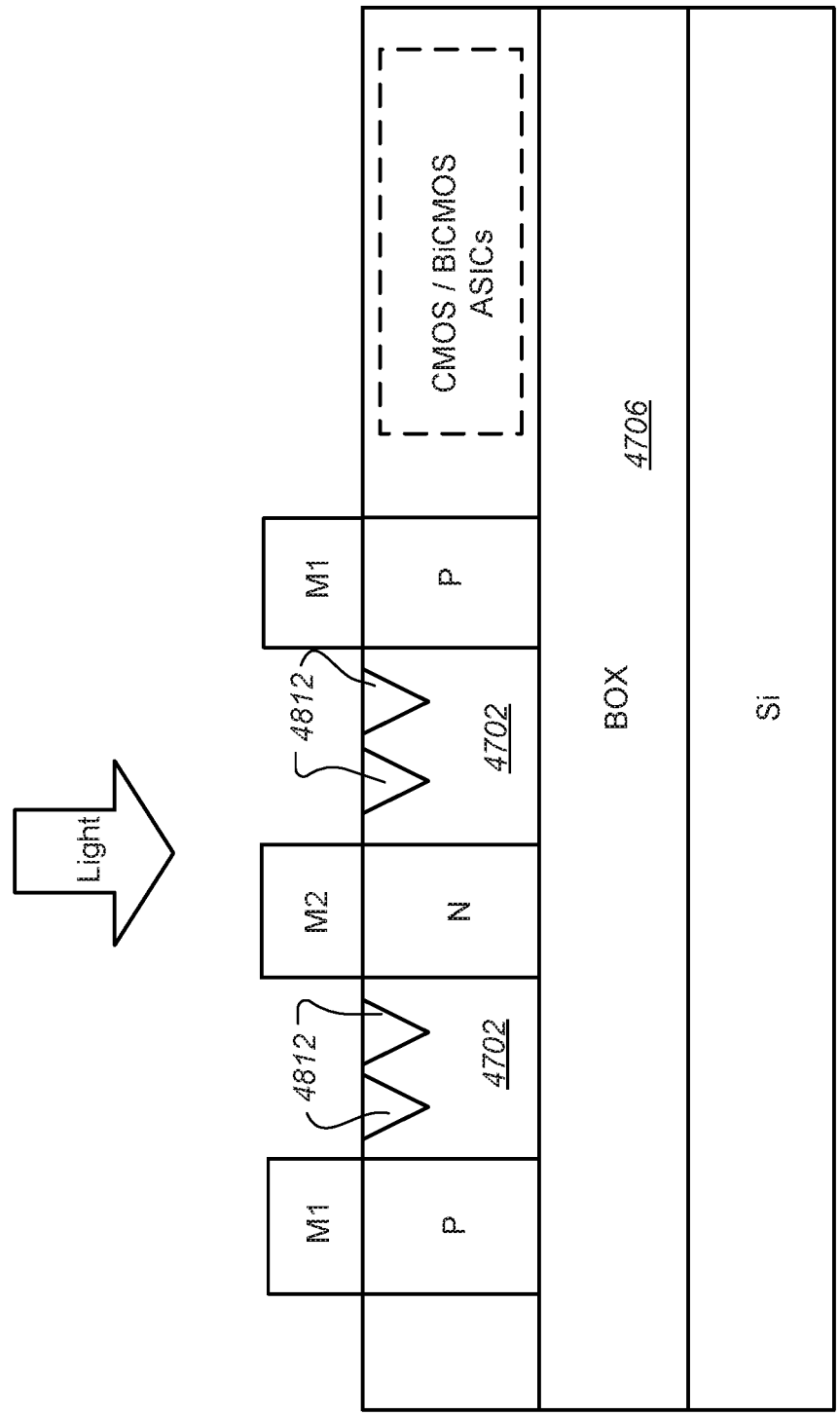
FIG. 48G is a simple partial cross-section of an inter-digitated photodetector with microstructure holes, according to some embodiments.

FIG. 48G is a simple partial cross-section of an inter-digitated photodetector with microstructure holes, according to some embodiments. The structure shown is similar to that of FIG. 48D but in this case PN junctions are used instead of metal semiconductor junctions and the P and N dopants extends to the BOX layer. In some cases, the dopants extend nearly to the BOX layer. Electrodes M1 form an ohmic contact to the P well, and electrode M2 forms an ohmic to the N well. Reverse bias is applied between the M1 anode and the M2 cathode electrode. This structure can also be implemented in a Ge/GeSi on Si inter-digitated photodetector as shown in FIG. 48E.

Inter-digitated photodetectors with either metal electrodes, or P/N dopant extending to the BOX layer and in some cases nearly to the BOX layer can have very uniform electric fields which can result in high speed photodetector operation. The speed of the inter-digitated photodetector can be determined mostly by the spacing between the M1 and M2 electrodes, and by capacitance between M1 and M2 electrodes. Data rates of 10 Gb/s to 25 Gb/s or more can be achieved with M1 and M2 electrode spacing ranging from 500 nanometers to 2000 nanometers, in some cases 1000 nanometers to 2000 nanometers, and in some cases from 500 nanometers to 2500 nanometers. For data rates of 25 Gb/s to 50 Gb/s electrode spacing can range from 300 nanometers to 1500 nanometers. The I or low dope semiconductor layer thickness can range from 300 nanometers to 3000 nanometers or more, in some cases from 500 nanometers to 2500 nanometers, in some cases from 500 nanometers to 1500 nanometers, and in some cases from 500 nanometers to 1000 nanometers. External quantum efficiency (EQE) can range from 30% or more at certain wavelengths. In some cases, the EQE can range from 50% or more at certain wavelength. In some cases, EQE can range from 70% or more in certain wavelengths. In some cases, EQE can range from 90% or more at certain wavelength. In some cases, EQE can range from 100% or more at certain wavelengths and at certain bias.

The lateral dimension of the photosensitive area of the inter-digitated photodetector can range from 5 microns to 100 microns for high data rate operation, and in some cases from 10 microns to 80 microns for high data rate operations and/or for high time domain resolution. For lower data rate operation, and/or lower time domain resolution the lateral dimension of the photosensitive area of the inter-digitated photodetector can range from 100 microns to 1000 microns or more.

In some cases, the electrodes or diffused wells of P and N can extend partially into the I or low dope semiconductor (Si, Ge, GeSi) instead of reaching all the way to the BOX layer. For example, in some cases the metal electrode in the etched trench or the diffused P and N well can extend ⅓ of the way into the I or low dope semiconductor, and in some cases ½ of the thickness into the I or low dope semiconductor, and in some cases can extend more than 2 the thickness of the I or low dope semiconductor layer(s). The depth of the electrodes or the diffused dopant P or N wells can range from 100 nanometers to 2000 nanometers or more into the I or low dope semiconductor layer(s). In some cases the depth of the electrode or P and/or N wells can range from 500 nanometers to 1000 nanometers. Not shown is a trench that is first etched using dry and/or wet etching and any combination of dry and wet etching, and any surface treatment such as HF dip prior to metal deposition into the etched trench. In some cases, P and/or N dopant can be diffused into the etched trench to form P and/or N junctions in the sidewalls of the trench and metal ohmic contact can be formed in this trench to form P and N junctions. The trench depth can range from 100 nanometers to 2000 nanometers or more into the I or low dope semiconductor layer(s) or region. In some cases, the etched trench can range from 500 nanometers to 1000 nanometers into the I or low dope semiconductor layer(s) region. In some cases, the etched trench can extend all the way to the BOX layer for cases where SOI wafers are used and for cases where Ge/GeSi I or low dope layers are grown on Si I or low dope layer the trench can extend to the Si layer. In some cases, the trench can extend down past the Si layer.

To optimize the external quantum efficiency and the speed of the inter-digitated microstructure hole photodetector, the depth of the electrode and/or P and/or N diffused wells into the I or low dope semiconductor can be optimized. The optimization involves sweeping the photo-generated electron hole pairs in the I or low dope semiconductor to the metal semiconductor contact and/or P and N junctions under a reverse bias voltage. The transit time of the electron hole pairs to the electrodes/P or N junction and the RC time can also be optimized for a certain bandwidth operation for the inter-digitated microstructure hole photodetector. For example, bandwidth of 25 Gb/s to 50 Gb/s may require transit times of approximately 30 picoseconds or less and RC time also of 30 picoseconds or less approximately. In some cases the sum of the square of the transit time and the RC time is less than 1000 picoseconds, and in some cases less than 500 picoseconds, or less than 625 picoseconds.

Figure 48H:
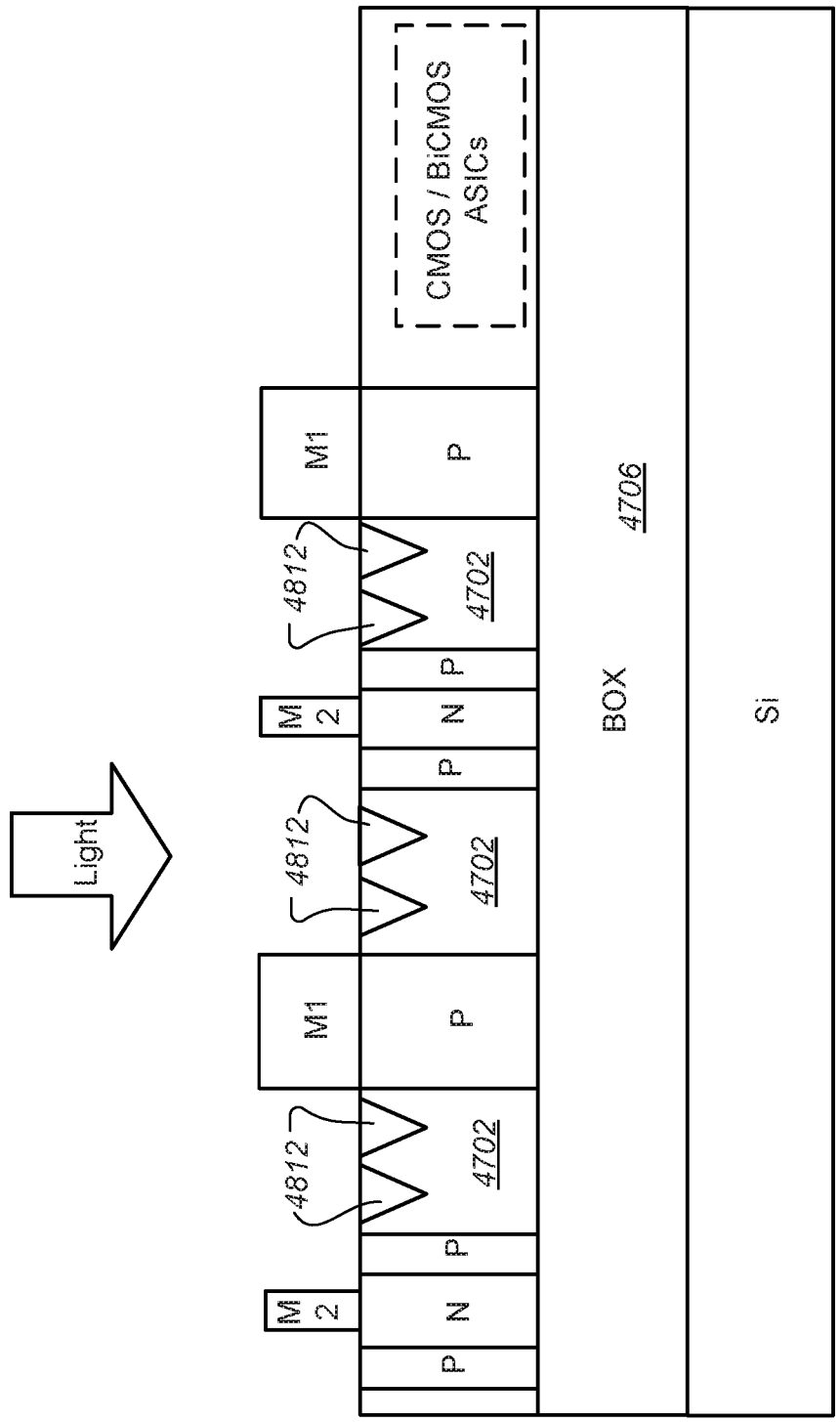
FIG. 48H shows a simple partial cross-section schematic of a P–I or low dope PN avalanche lateral inter-digitated microstructure hole photodiode, according to some embodiments.
Figure 48I:
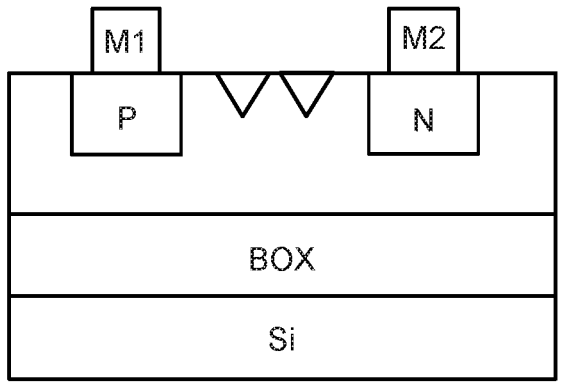
FIGS. 48I-48L are simple cross-section partial schematics of four inter-digitated microstructure photodetectors, according to some embodiments.
Figure 48J:
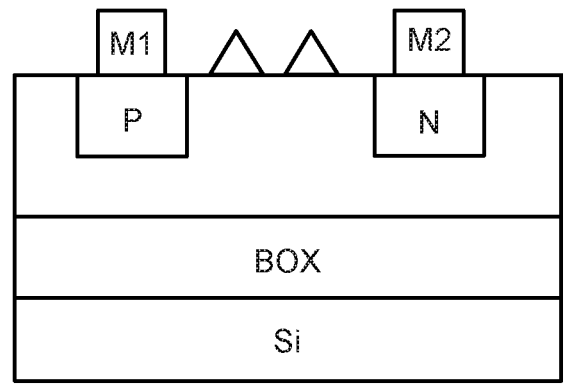

FIG. 48H shows a simple partial cross-section schematic of a P–I or low dope PN avalanche lateral inter-digitated microstructure hole photodiode, according to some embodiments. Two "periods" of the inter-digitated electrodes are shown. Avalanche gain can range from 1 dB to 20 dB or more for certain wavelength ranges. Layer 4702 can be Si and/or GeSi with P and N diffused wells/trenches with depth varying from 100 nm to 3,000 nm or more, and in some cases the P and N diffused regions can be partially into the I or low dope region 4702. In some cases, the P or N dopant can diffuse all the way to the BOX layer 4706. Wavelength ranges for a Si I or low dope layer can range from 700 nm to 1100 nm, and wavelength ranges for GeSi I or low dope layer depending on the Ge fraction in the GeSi allow can range from 700 nm to 2,000 nm. The I or low dope layer 4702 thickness can range from 200 nm to 3,000 nm or more, and in some cases from 500 nm to 1500 nm. Data rates can range from a few Gb/s to 50 Gb/s or more, in some cases 25 Gb/s to 30 Gb/s and in some cases from 25 Gb/s to 40 Gb/s or more. EQE can range from 30% to 90% or more at certain wavelengths. The microstructure holes can be inverted pyramids, funnel, cylindrical and/or any other shape/combination of shapes with lateral surface dimension ranging from 200 nm to 2000 nm, in some cases from 300 nm to 1000 nm, and in some cases from 300 nm to 800 nm. The etch depth of the holes can range from 100 nm to 3000 nm and in some cases the holes can be partially etched into the I or low dope region, or the N and P region. In some cases, the microstructure holes can be etched entirely into the BOX layer, in the I or low dope region and/or in the P and/or N regions.

Figure 48K:
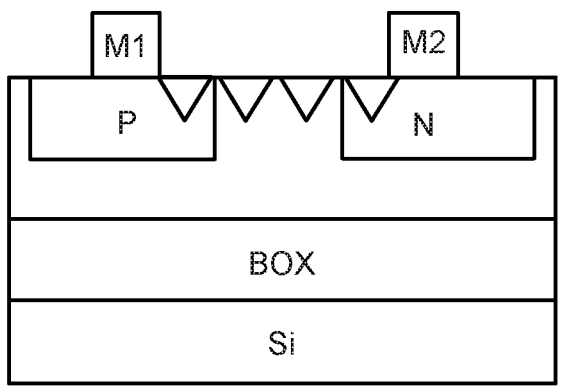
Figure 48L:
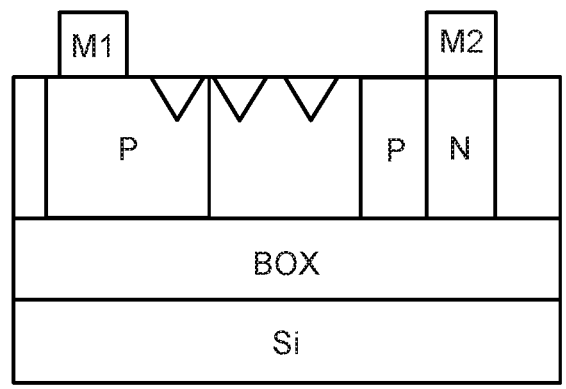

FIGS. 48I-48L are simple cross-section partial schematics of four inter-digitated microstructure photodetectors, according to some embodiments. The structure of FIG. 48I includes microstructure holes with inverted pyramids. The structure of FIG. 48J includes a microstructure of pyramidal protrusions. FIG. 48K shows the metal electrodes being narrower than the P and/or N doped wells or regions. FIG. 48L shows a PIPN avalanche photodiode with the electrodes narrower than one or more doped regions. In some cases, the electrodes can make Schottky contact to the I or low dope layer/region. In some cases, one of the electrodes can be a Schottky contact and the other electrode can be an ohmic contact, and in some cases one of the electrodes can be Schottky and the other electrode can make ohmic contact to a P or N well or region. In some cases, one or more of the layers or regions can be GeSi. Avalanche gain can be observed at breakdown voltage or beyond breakdown voltage, and in some cases before breakdown voltage in PN, PP–N, PN–N, PIPIN, NINIP, PIPN, NINP, Schottky MSM, Schottky N, Schottky P, and in some cases one or more of the P and/or N regions can be replaced with a Schottky contact.

Figure 49A:
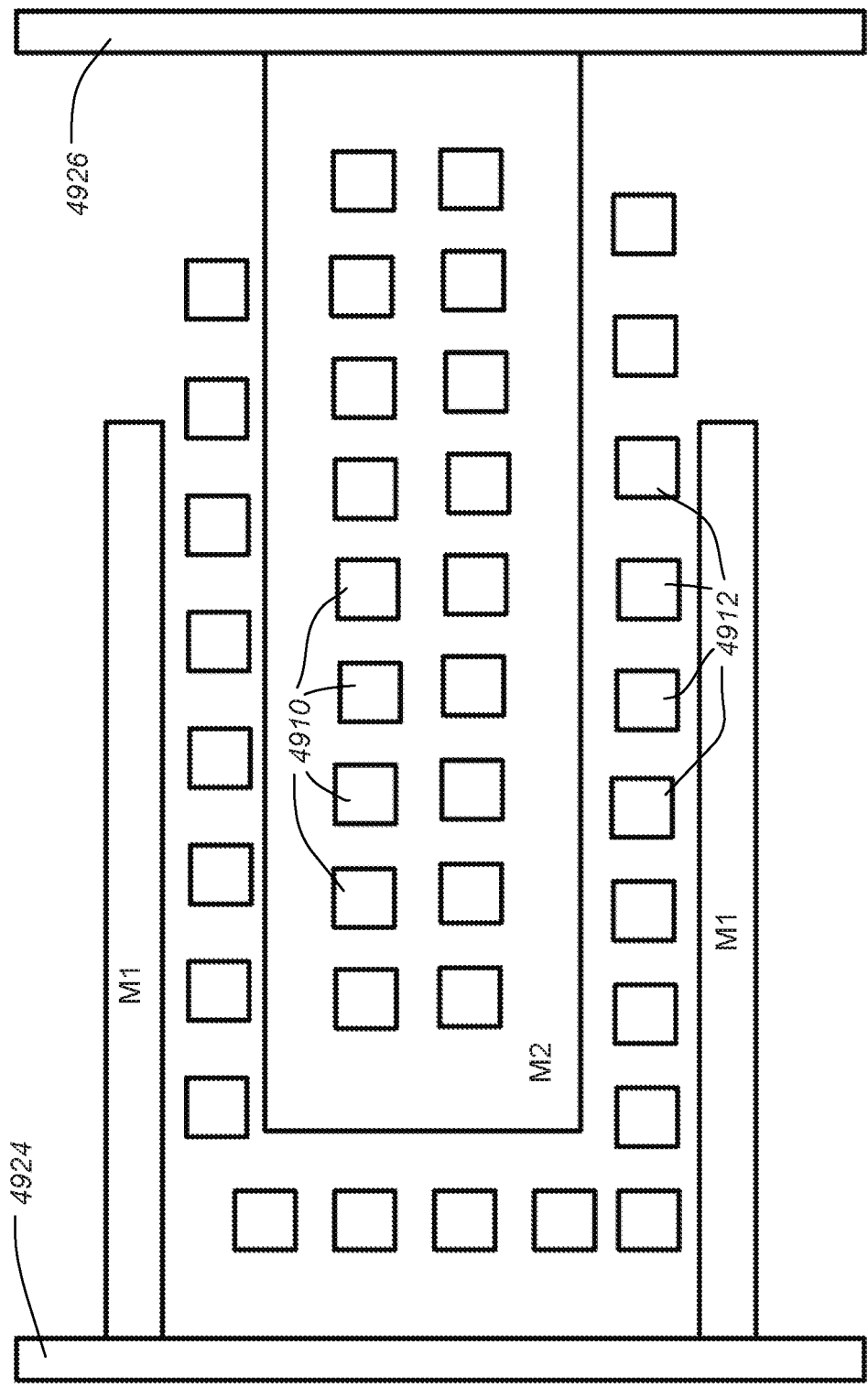
FIGS. 49A-49D show simple partial top views of inter-digitated microstructure hole photodetectors, according to some embodiments.

FIGS. 49A-49D show simple partial top views of an inter-digitated microstructure hole photodetectors, according to some embodiments. In the case of FIG. 49A the inter-digitated electrodes have different widths. In particular, one of the inter-digitated electrodes, M2, is significantly wider than the other inter-digitated electrode, M1. The electrodes M2 are connected transmission line 4926 and the electrodes M1 are connected to transmission line 4924. The wider inter-digitated electrodes can be semi-transparent such that light can penetrate the electrodes and microstructure holes 4910 can be formed on the electrode itself in addition to microstructure holes 4912 formed in regions between the electrodes. In some cases the inter-digitated electrodes can be a semiconductor, and in some cases can be a combination of semiconductor and transparent metal conducting oxide such as ITO (indium tin oxide). In some cases the inter-digitated electrodes can be a very thin semi transparent metal. The narrow inter-digitated electrodes can also be metal, semiconductor and/or transparent conducting metal oxide and/or semitransparent metal, and in some cases can be silicide such as nickel silicide, platinum silicide. Ratio of the inter-digitated electrode widths can range from 1 (M1 and M2 have same width) to 100 or more (M2 width is 100× wider than M1 or more).

Figure 49B:
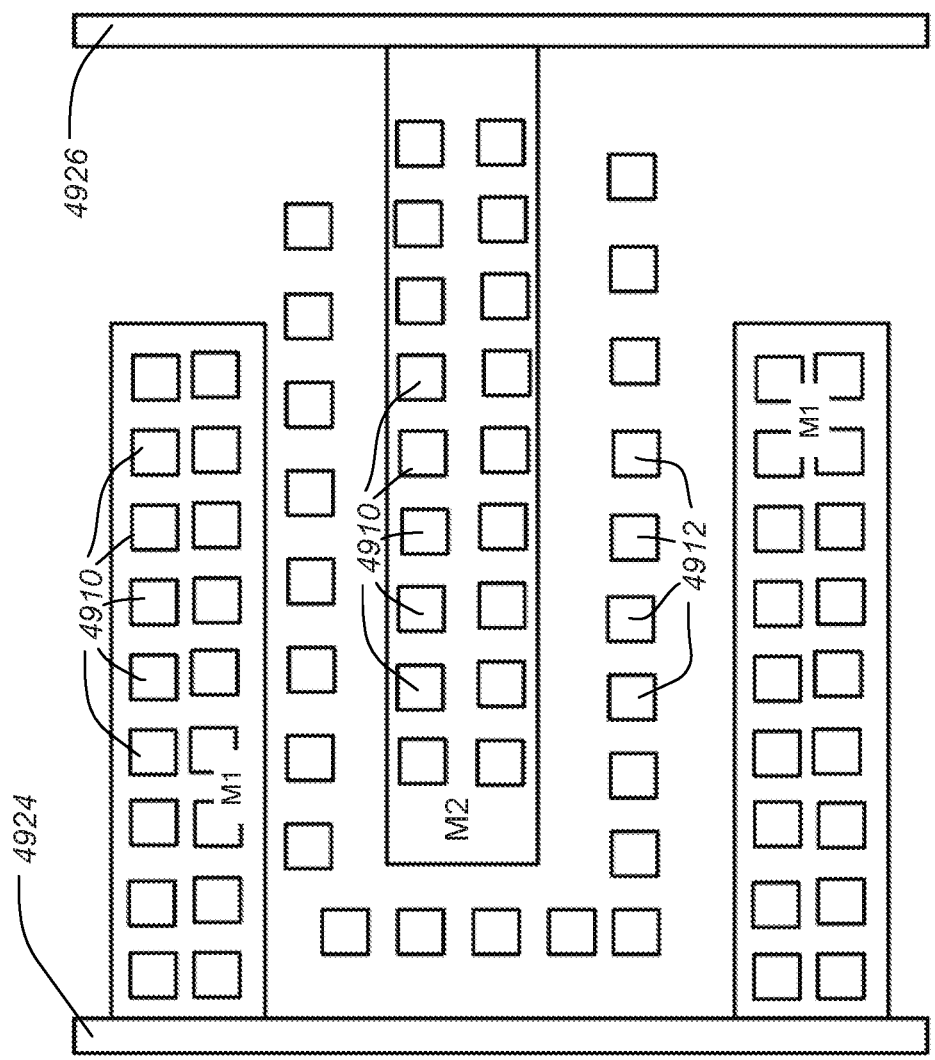

FIG. 49B is similar to FIG. 49A except the M1 and M2 electrodes are similar in width and can be made from semitransparent metal with metal thicknesses of less than 10 nanometers and in some cases, less than 5 nanometers. The metal can be Al, Ni, Cr, Mo, W, V, Pt, Ag, Au, Zr, or Ta. In some cases the M1 and M2 can be transparent metal oxide such as ITO Mo oxide. In some cases, they can be transparent metal nitride such as TiN. In some cases, they can be metal silicide. The regions below the electrodes M1 and M2 can be doped with P or N type ions. The electrodes can in some cases fully or partially cover the microstructure holes as is shown by microstructure holes 4910, or in some cases the microstructure holes are not covered by the electrodes, as is shown for microstructure holes 4912.

Figure 49C:
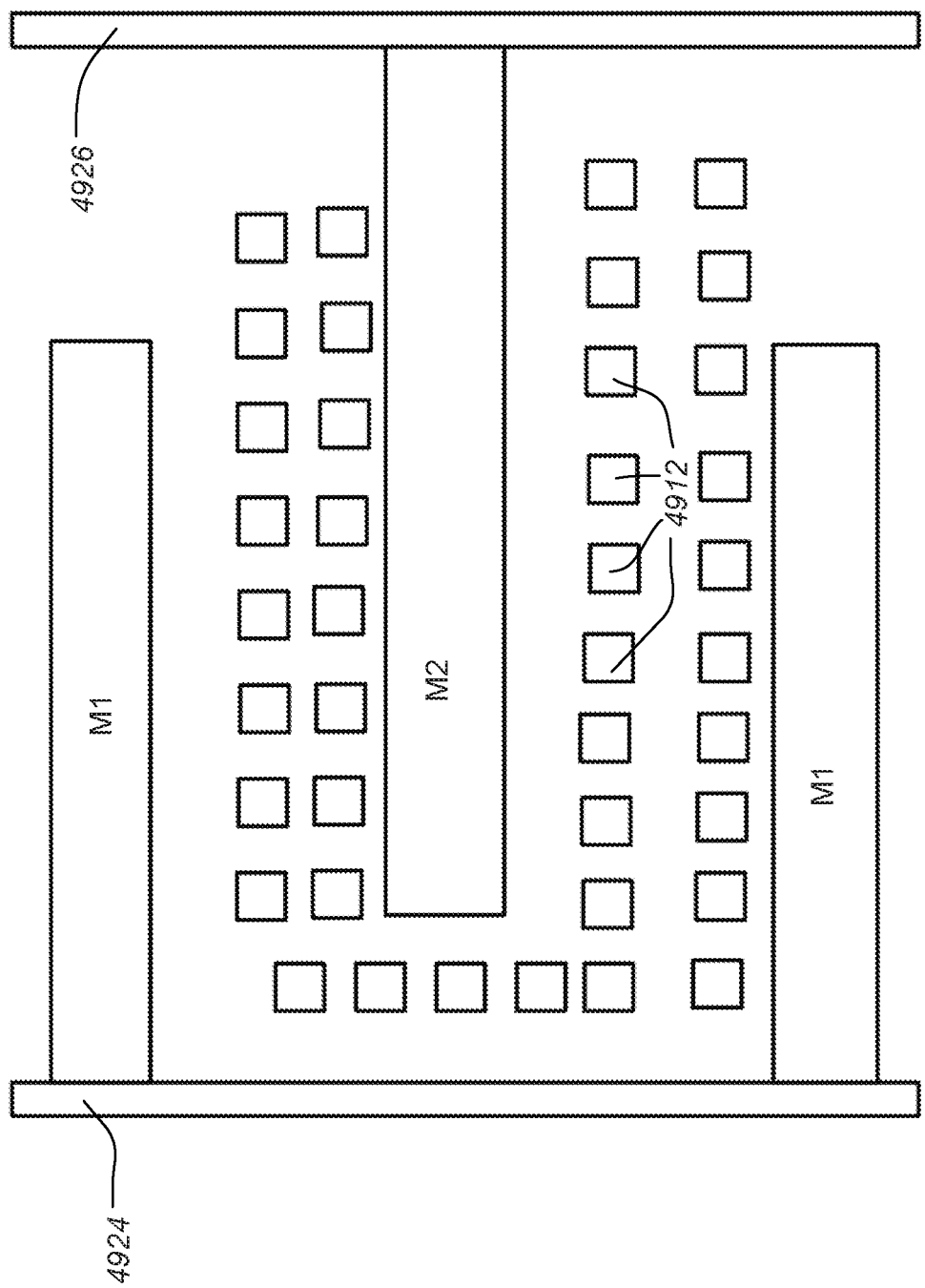

FIG. 49C shows electrodes M1 and M2 made of transparent metal, metal oxide, metal nitride and/or metal silicide. In some cases, P or N dopant can be under the electrodes, and in some cases N dopant or P dopant can be under the electrodes. The electrodes as shown in FIGS. 48A-48G can be partially and/or fully sunken beneath the surface of the substrate. Note that as used herein the term "electrode" can include a P or N doped region or well formed under the electrodes such as M1, M2, cathodes and/or anodes. Not shown is the etching process to form the trenches to deposit the electrodes and/or P and/or N dopants inside the trench to form fully or partially buried electrodes and P or N junction. The etching can be dry or wet etch and in some cases a surface treatment can be used, and in some cases thermal anneal can be used to removed etching damages. Also not shown are any passivation with oxide or other dielectrics.

The inter-digitated microstructure hole photodetectors can be either photodiodes or photoconductors and in some cases avalanche photodiodes. The electrode material of M1 and M2 can be similar and in some cases it can be different. For example, M1 can be Schottky contact and M2 can be ohmic contact. In some cases, M1 and M2 can both be Schottky contacts, in some cases M1 can be P and M2 can be N, in some cases M1 and M2 can both be N, or both P. In some cases M1 can be Schottky and M2 and be P or N. In some cases, M1 can be Schottky with a certain metal, and M2 can be Schottky with a metal that is different from M1. For example, M1 can be Al and M2 can be Pt. Other combinations of metal are possible and other combinations of P and N dopant and metal and silicide are also possible. In some cases, M1 can be a transparent conducting metal oxide, and M2 can be an ohmic contact to P or N type. And, in some cases, M1 can be a transparent metal and M2 can be P or N ohmic contact, and any other combination there of. The I or low dope layer can have 1 or more I or low dope layers with different doping concentrations, and in some cases 1 or more layers can be GeSi, the layers can have resistivity ranging from 0.001 ohm-cm to 100 ohm-cm or more. The layers can be continuous, and in some cases the layers can be non-continuous, for example certain regions in the layers can have different doping concentrations of P and/or N to form P and/or N contacts to the electrodes M1 and M2. In some cases, there may be doping in the semiconductor between the electrodes for avalanche gain, and in some cases, there may be doping between the electrodes for electric field modifications.

Figure 49D:
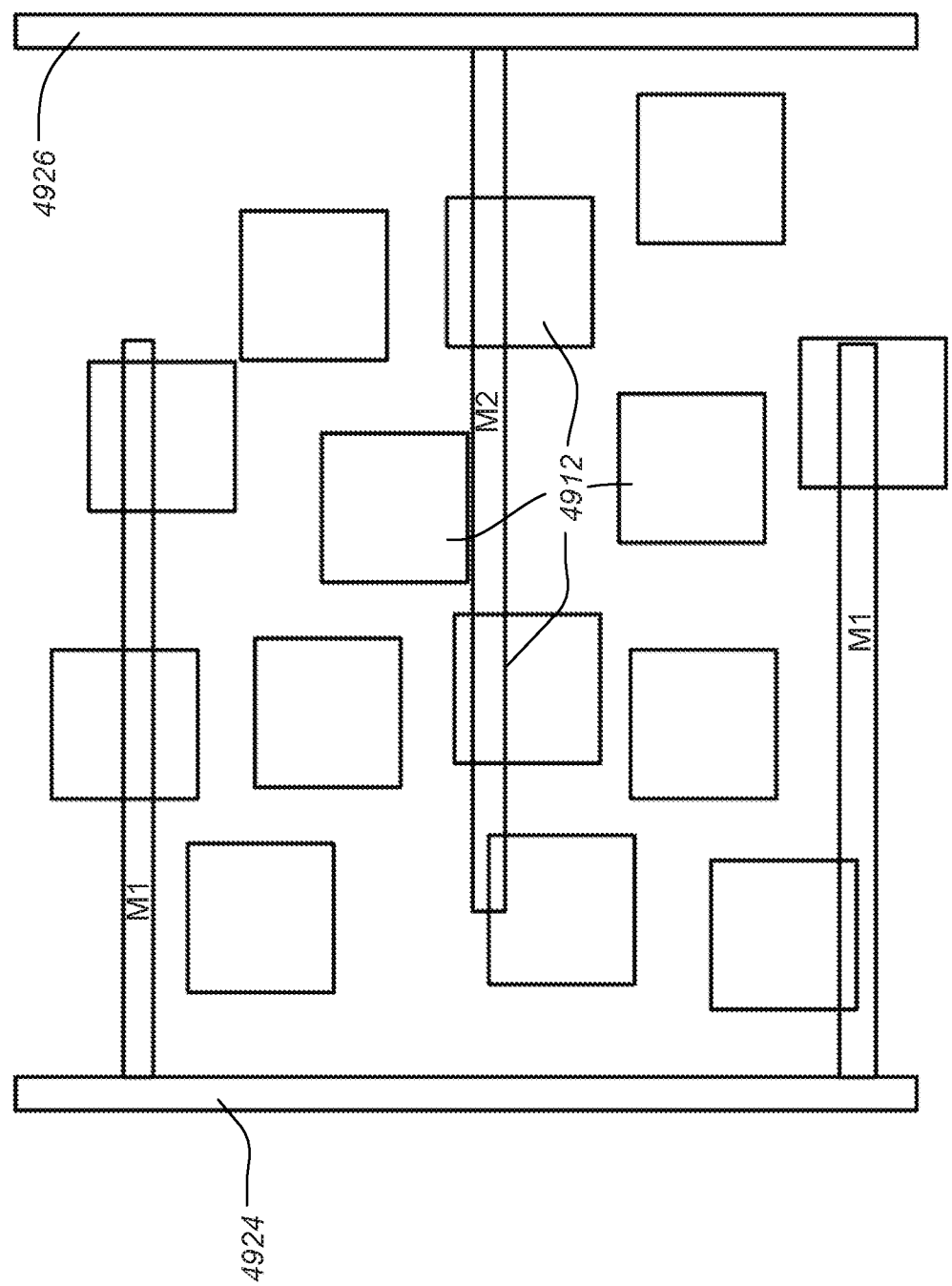

FIG. 49D shows a simple partial top view of an inter-digitated microstructure photodetector where the electrodes M1 and M2 can cross over the microstructures 4912 which can be holes or protrusions. In some cases, the width of the electrodes can range from 20 nm to 500 nm and the holes' surface dimension can range from 200 nm to 2000 nm. The length of the electrode (measured from the transmission line) can range from 500 nm to 10,000 nm or more, and in some cases can range from 1 micron to 100 microns or more, and in some cases the length of the electrode can range from 5 microns to 1000 microns or more.

In some cases, the electrodes in the inter-digitated photodetector can be meandering and/or have multiple branches such that the total horizontal length and total vertical length are approximately equal to minimize optical polarization sensitivity. Anti-reflection coating (not shown) can be applied to the top surface of the inter-digitated microstructure photodetector. And in some cases, amorphous semiconductor and/or black silicon can be applied to the electrodes and on the surface of the photodetector.

Figure 49E:
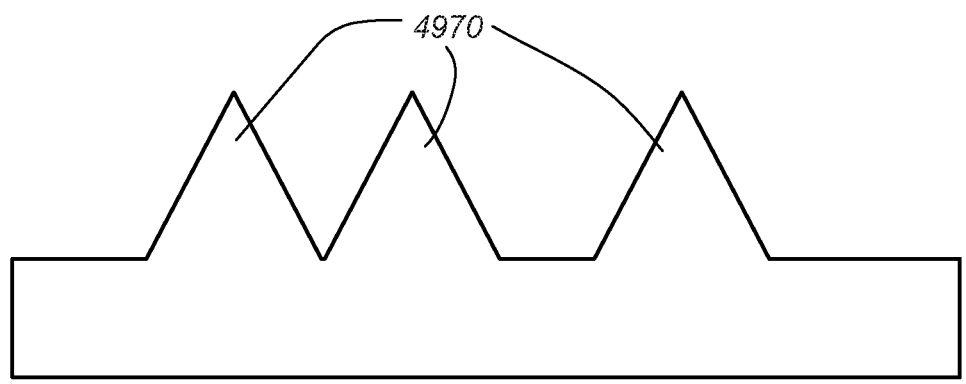
FIGS. 49E and 49F show simple partial cross-sections of microstructure protrusions and microstructure holes.
Figure 49F:
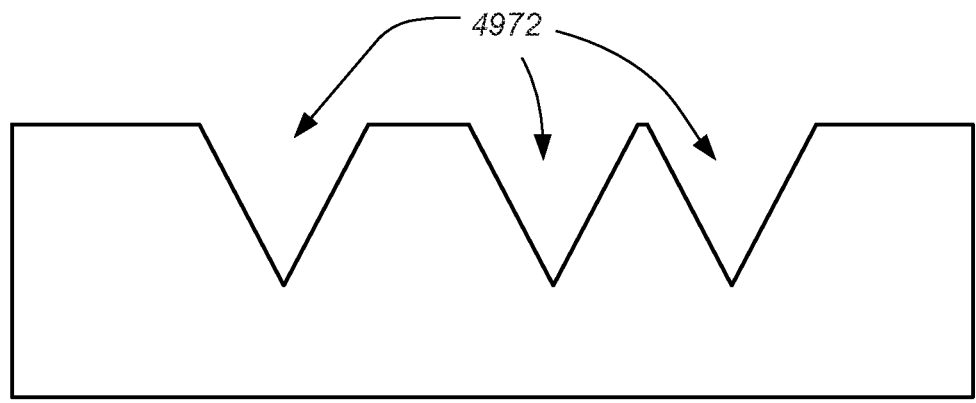

FIGS. 49E and 49F show simple partial cross-sections of microstructure protrusions and microstructure holes. FIG. 49E shows microstructure pyramids 4970 that can be intersecting, touching, or have a separation. The base of the microstructure pyramids can range from 200 nm to 2000 nm or more. The material can be Si or GeSi and/or any combination of Si and GeSi layer(s). The height of the pyramids can range from 100 nm to 3000 nm or more, and in some cases from 300 nm to 1000 nm. The pyramids can have a flat top such as a Mayan pyramid. FIG. 49F shows inverted pyramids 4972 as microstructure holes, and in some cases the tip of the inverted pyramids can have a flat surface such as an inverted Mayan pyramid. The inverted pyramids can intersect, and/or touch I and/or have a space between them, and/or any combination of intersecting, touching, and non-intersecting.

Microstructure protrusions as shown in FIG. 49E can be applied to lateral inter-digitated photodetectors and in some cases can also be applied to vertical microstructure photodetectors. The surface lateral dimension of either the microstructure protrusion which can be pyramids or the microstructure holes which can be inverted pyramids, can range from 300 nm to 4000 nm. In some cases the surface lateral dimension can range from 100 nm to 2500 nm. The spacing between the microstructure protrusions or holes can range from 0 (touching or overlapping) to 3000 nm. In some cases, for vertical PIN microstructure hole photodetector the spacing can range from 100 nm to 3000 nm. In some cases, microstructure photodetector can have both protrusion and holes. The number of microstructures (holes and/or protrusions) in a microstructure photodetector can range from 1 to 1 Billion or more. The height of the protrusion or the depth of the holes can range from 30 nanometers to 3000 nm and in some cases from 100 nm to 5000 nm or more, and in some cases from 100 nm to 1500 nm.

Figure 50:
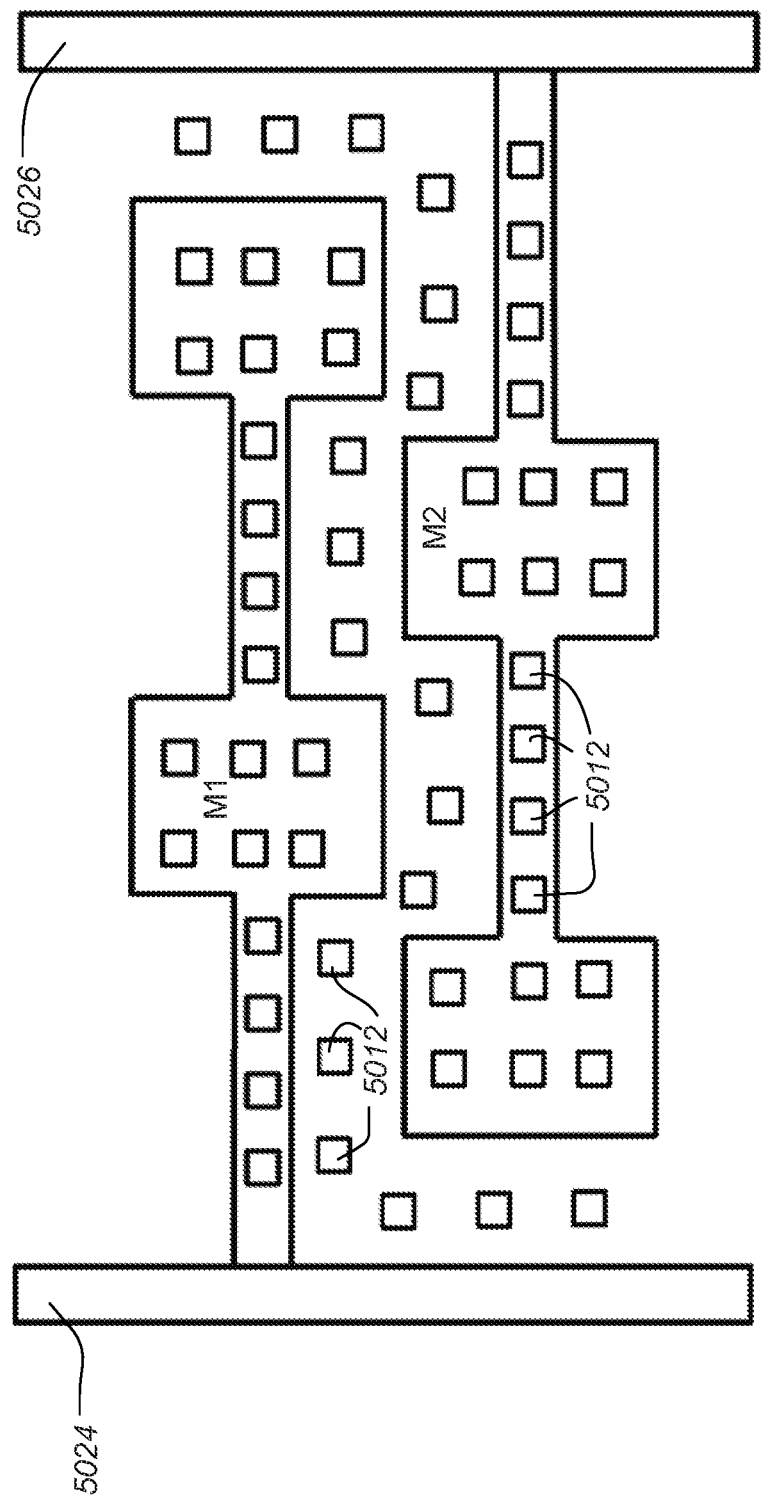
FIG. 50 is a simple partial top view of an inter-digitated microstructure hole photodetector that includes inter-digitated electrodes having width variations as a function of length, according to some embodiments.

FIG. 50 is a simple partial top view of an inter-digitated microstructure hole photodetector that includes inter-digitated electrodes M1 and M2 having width variations as a function of length, according to some embodiments. This is just one example of such variation, other variations and patterns are possible. The electrodes of M1 and M2 can be metal, semiconductor, semitransparent metal, transparent conducting metal oxide, titanium nitride, silicide, and can be Schottky contacts and/or ohmic contacts to P and/or N regions. Microstructure holes 5012 can be placed in regions on and/or under the electrodes, and in spaces between the electrodes.

Figure 51A:
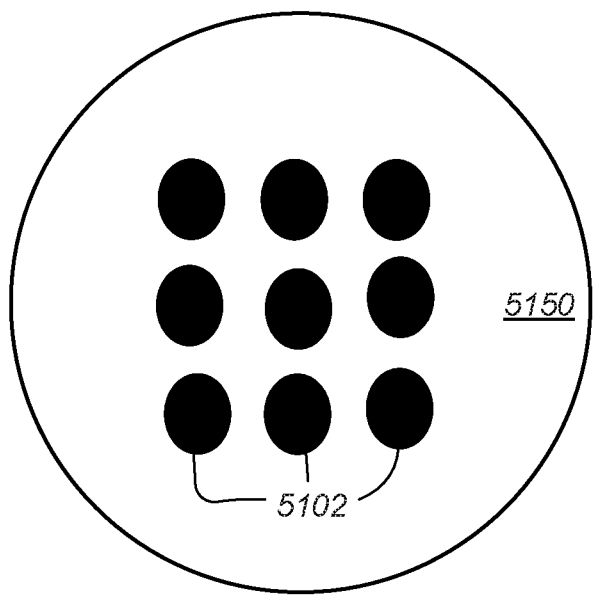
FIGS. 51A and 51B are simple partial top views of a silicon wafer with selective area growth Ge/GeSi, according to some embodiments.
Figure 51B:
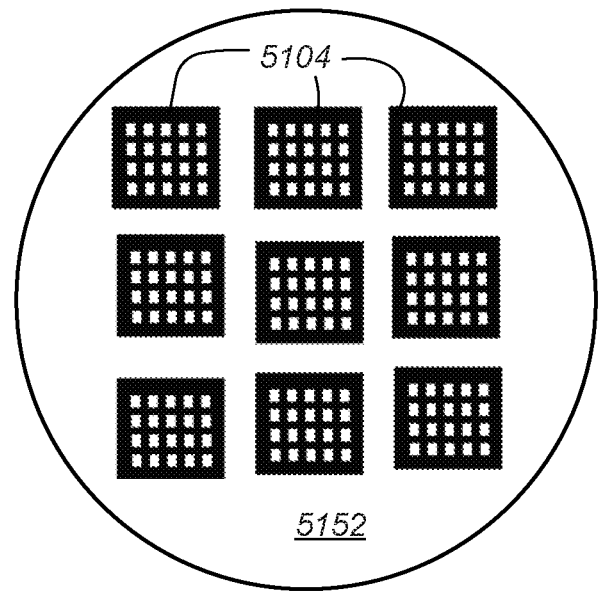

FIGS. 51A and 51B are simple partial top views of a silicon wafer with selective area growth Ge/GeSi, according to some embodiments. The selective area grown Ge/GeSi can be only in regions 5102 where the photo sensitive areas are. The lateral dimension of an area 5102 can range from 0.5 microns to 1000 microns or more. In some cases, the lateral dimension can range from 1 micron to 100 microns. In circular Ge/GeSi photodetectors the diameter can range from 5 microns to 100 microns or more. In some cases, strips of Ge/GeSi are grown for inter-digitated photodetectors rather than or in addition to circular or oval areas 5102. The selective area grown Ge/GeSi on a Si wafer can avoid bowing the wafer since the footprint of the Ge/GeSi is small and the stress due to lattice mismatch between Ge I GeSi and Si is mostly localized.

In some cases, a thin metal layer less than or equal to 10 nanometers can be deposited over the microstructure holes for enhanced plasmonic absorption which can further enhance the quantum efficiency, or external quantum efficiency. And in some cases, nano or micro holes can be formed concentric or non-concentric in the metal film to the microstructure holes in the semiconductor.

FIG. 51A shows a silicon wafer 5150 with selective area growth of Ge/GeSi regions 5102 that do not have microstructure holes at least initially. In this case, the microstructure holes can be etched into the selective area growth regions 5102. FIG. 51B shows a silicon wafer 5152 with selective area growth regions 5104 that have microstructure holes formed during the selective area growth process, such as discussed with respect to FIG. 1, supra. Regions 5104 are shown as squares but can be shaped differently, e.g. as other multisided shapes.

J. Michel et al, High-performance Ge-on-Si photodetectors, Nature Photonics, 30 July, 2010, incorporated herein by reference and referred to herein as "J. Michel", discusses using selective area growth of Ge on Si/GeSi/GeSi on Si. S. Assefa et al, CMOS-integrated high-speed MSM germanium waveguide photodetector, Optics Express 1 Mar. 2010, Vol. 18, No. 5; and S. Assefa et al, A 90 nm CMOS Integrated Nano-Photonics Technology for 25 Gbps WDM Optical Communications Applications, IEEE International Electron Devices Meeting (IEDM), 10-12 Dec. 2012, both incorporated herein by reference and referred to herein as "Assefa et al. 2010" and "Assefa et al. 2012" respectively, discuss amorphous Ge crystallized using rapid thermal processing to fabricated waveguide Ge photodiode that is integrated with CMOS/BiCMOS ASICs. L. Chen et al, Ultra-low capacitance and high-speed germanium photodetectors on silicon, Optics Express, 11 May 2009, Vol. 17, No. 10, incorporated herein by reference and referred to herein as "Chen et al.", discusses wafer bonding to fabricate Ge on Si photodiodes.

Figure 52A:
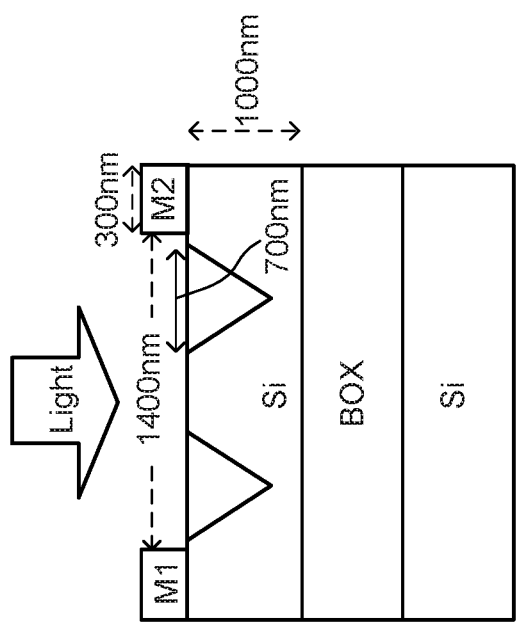
FIG. 52A is cross-section diagram of a structure used for a finite difference time domain (FDTD) calculation of the optical field.
Figure 52B:
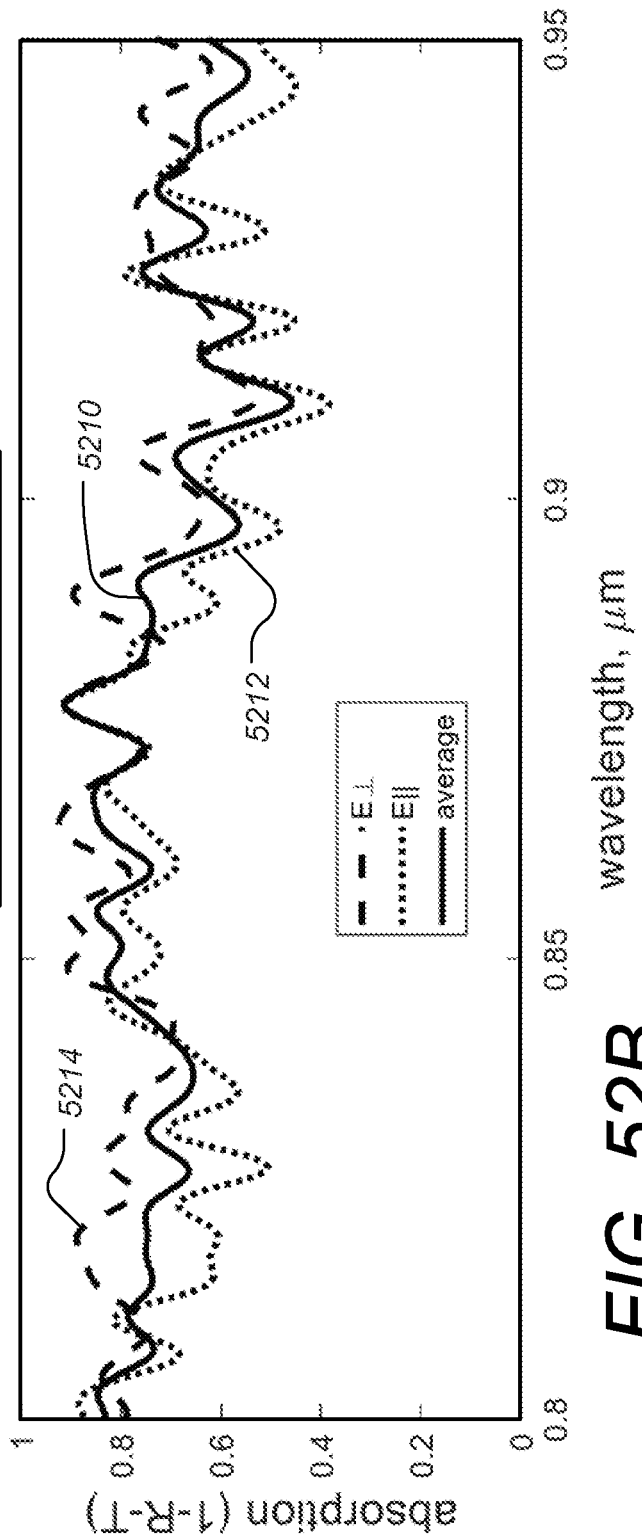
FIG. 52B is a plot of FDTD simulations of a structure shown in FIG. 52A.

FIG. 52A is cross-section diagram of a structure used for a finite difference time domain (FDTD) calculation of the optical field. FIG. 52B is a plot of the FDTD calculation of the optical field in the structure shown in FIG. 52A. The vertical axis of FIG. 52B shows the optical absorption in the I or low dope semiconductor with holes, which is in this example Si. The optical absorption is directly related to the external quantum efficiency, and in some cases it can be the external quantum efficiency. The horizontal axis of FIG. 52B is the wavelength in microns from 0.8 microns to 0.95 microns of the incident optical signal. The solid curve 5210 shows the average optical absorption for light polarized along the inter-digitated fingers and for light polarized perpendicular to the inter-digitated electrodes. The dotted curve 5212 shows the optical absorption for light polarized parallel to the electrodes, and the dashed curve 5214 shows light polarized perpendicular to the electrodes. The average optical absorption or the average external quantum efficiency is over 80% at 850 nanometers, and over 50% at 950 nanometers. The structure that is modeled has 1 micron thick I or low dope Si microstructure holes which are inverted pyramids and are 700 nanometers along one side of the square. The spacing between M1 and M2 electrodes is 1400 nanometers, and the width of the electrodes is 300 nanometers. The inter-digitated microstructure hole photodetector has a higher external quantum efficiency than a comparable photodetector without microstructure holes over the wavelength range of 850-950 nanometers. The inter-digitated microstructure hole photodetector is illuminated on the top surface. The electrodes are placed on the surface of the I or low dope Si.

X. Xiao et al, A 2 Gb/s optical receiver with monolithically integrated MSM photodetector in Standard CMOS Process, Chinese Science Bulletin, July 2011, Vol. 56, No. 21, incorporated by reference herein and referred to herein as "Xiao et al.", discusses Silicon MSM integrated with CMOS/BiCMOS ASICs. Liu et al, 140-GHz metal-semiconductor-metal photodetectors on silicon-on-insulator substrate with scaled active layer, Applied Physics Letters 65 (7), 15 Aug. 1994, incorporated by reference herein and referred to herein as "Liu et al. 1994", discusses a Si MSM photodetector reaching a bandwidth of 140 GHz.

Figure 53:
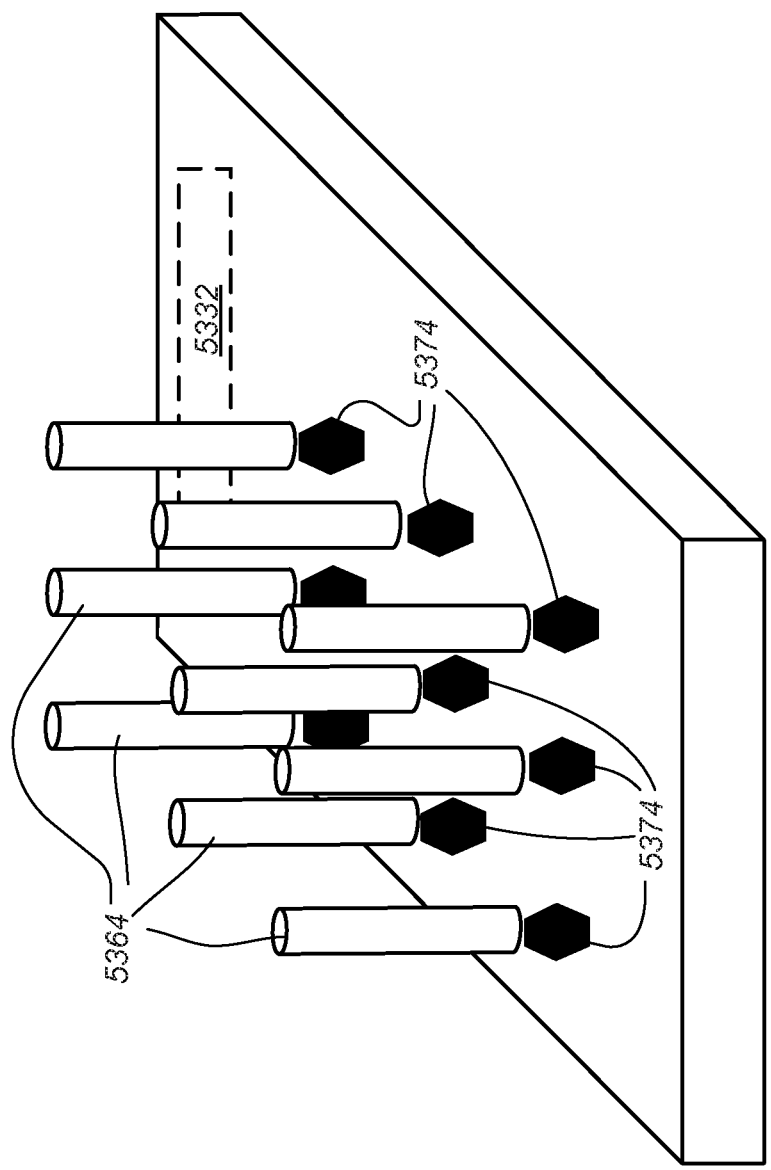
FIG. 53 is a simple diagram of an arrangement of a 2-D array of surface illuminated photodetectors, according to some embodiments.

FIG. 53 is a simple diagram of an arrangement of a 2-D array of surface illuminated photodetectors, according to some embodiments. A monolithic surface illuminated integrated 2-D photodetector array is shown fabricated using surface illuminated photodetectors 5374. Since the photodetectors 5374 are surface illuminated, they can be arranged in a high-density 2-D array and can also be monolithically integrated with CMOS BiCMOS ASICs 5332. Parasitics are significantly reduced allowing high performance. In this example for the 2-D surface illuminated photodetector array, optical fibers 5364 can each be coupled to a photodetector for very high bandwidth optical data communication. In some cases, a single fiber can be coupled to the 2-D array carrying multiple wavelengths and the individual wavelength can be directed to specific photodetectors using wavelength selective filters such as gratings. For applications such as LiDAR very high density 2-D arrays of 100×100 or more surface illuminated photodetectors can be monolithically integrated with CMOS BiCMOS ASICs for high spatial resolution applications. The use of microstructure holes for enhancing absorption and thereby external quantum efficiency in both vertical photodetectors such as PIN and lateral photodetectors such as PIN or MSM can greatly enhance the sensitivity and speed of response of the photodetector over that of a similar photodetector without microstructure holes at certain wavelengths. Note that non-surface illuminated photodetectors, such as known waveguide photodetectors which are edge-illuminated can only be arranged in a 1-D array an therefore are not as well suited to high-density applications as are surface illuminated photodetectors.

Figure 54A:
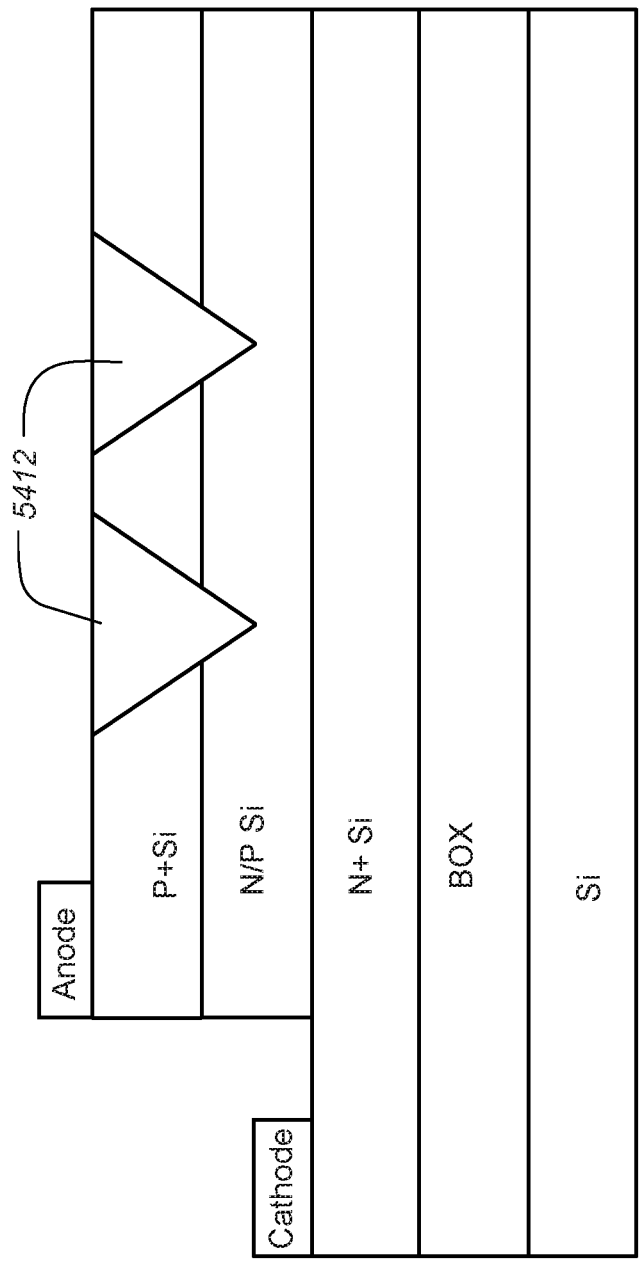
FIGS. 54A and 54B are simple partial cross-sections of a vertical microstructure hole PIN photodiode and lateral microstructure hole PIN photodiode, according to some embodiments.
Figure 54B:
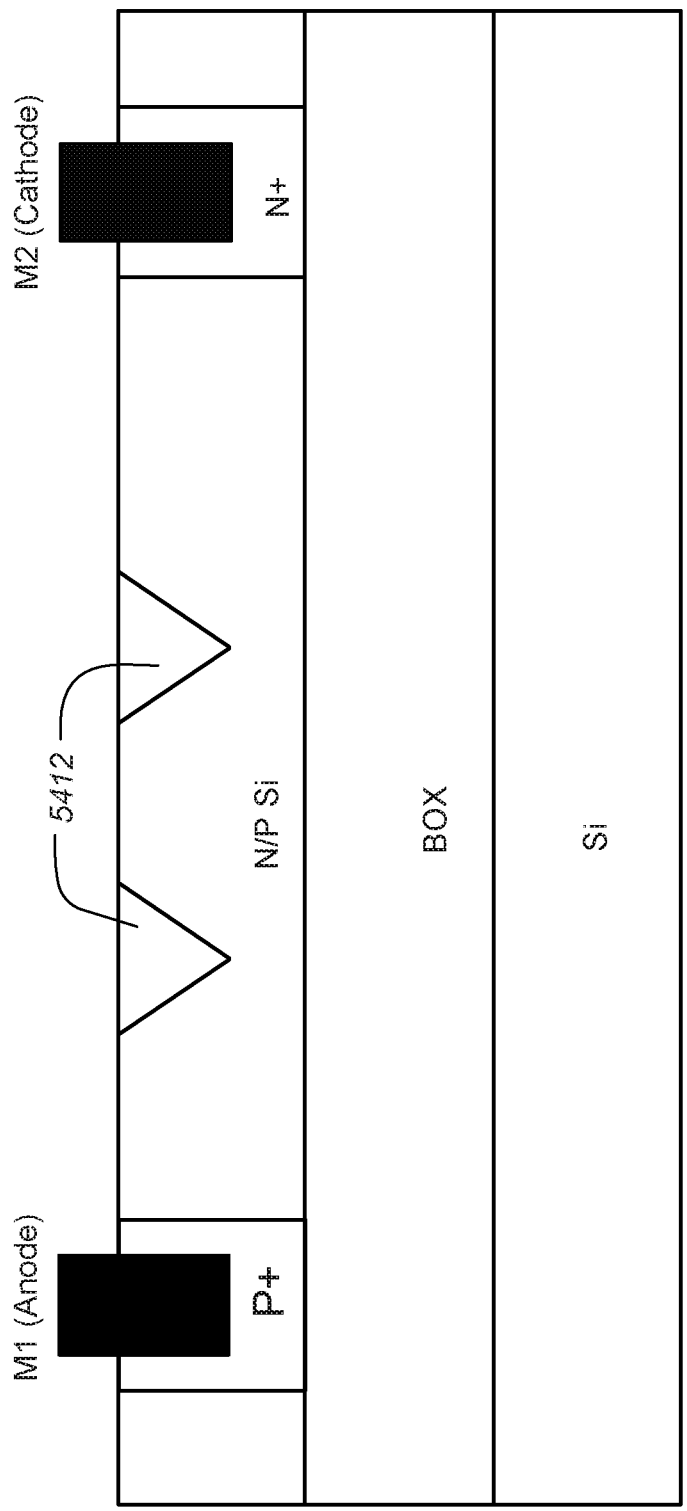

FIGS. 54A and 54B are simple partial cross-sections of a vertical microstructure hole PIN photodiode and lateral microstructure hole PIN photodiode, according to some embodiments. The I layer which is the layer or region between the P+ and N+ layers or regions often has a doping range from $1 \times 10^{12}/cm^3$ to $5 \times 10^{16}/cm^3$ and can be called an intrinsic or low dope P− N− layer or region. In some cases the region between the P+ and N+ layers or regions can have doping ranges from $1 \times 10^{16}$ to $8 \times 10^{17}/cm^3$ or higher. This can be called N or P doping. In the case where the I or low dope region has a higher doping the depletion due to a reverse bias applied between the anode and cathode width will be less than for an I or low dope region with very low doping below $5 \times 10^{15}/cm^3$ for example, and this will result in a lower breakdown voltage ranging from −4 to −10 volts where as the breakdown voltage for I or low dope layer/region can range from −10 volts to −100 volts or more, and in some cases from −10 to −45 volts. In the case of the doping level in the range of 1 to $5 \times 10^{17}$ for the layer or region between the P+ and N+ avalanche gain can be observed at voltages below the breakdown voltage, for example less than −5 volts. For example, in a vertical P+ N+ microstructure hole photodiode where the P+ is 0.2 microns thick the N is 1.5 micron and the N+ is 0.2 micron and with optical signals illuminating the surface at the wavelength of 1040 nanometers responsivity as high as 0.7 A/W or more can be obtained, at bias voltage of approximately −4 volts which is approximately less than 1 volt below the breakdown voltage of approximately 5 volts. The microstructure holes 5412 are inverted pyramids with side lateral dimension of approximately 700 nanometers, and a spacing of approximately 300 nanometers. The responsivity of microstructure hole Si P+NN+ photodetector is approximately 5× higher than a similar silicon P+NN+ photodetector without microstructure holes at 1040 nanometer wavelength, and in some cases the responsivity can be 10× or more than a similar Si P+NN+ photodetector without microstructure holes.

Similar enhanced responsivity can be observed for the lateral P+NN+ microstructure hole photodiode where the spacing between the M1 and M2 inter-digitated fingers can be 1.5 microns and the microstructure holes can be inverted pyramids with a lateral side dimension of 700 nanometers approximately, and a spacing of 300 nanometers. Other dimensions of the inverted pyramids and spacing can also result in enhanced absorption and therefore enhanced external quantum efficiency. The lateral dimension of the inverted pyramids can range from 500 nanometers to 1000 nanometers, and in some cases can range from 600 nanometers to 1300 nanometers or more, and the spacing can range from 0 nanometers (only for lateral photodiodes) to 1000 nanometers.

Avalanche gain together with enhanced absorption can result in responsivity ranging from 0.3 A/W to 1 A/W or more for wavelength ranges from 800 nanometers to 1100 nanometers.

Figure 55A:
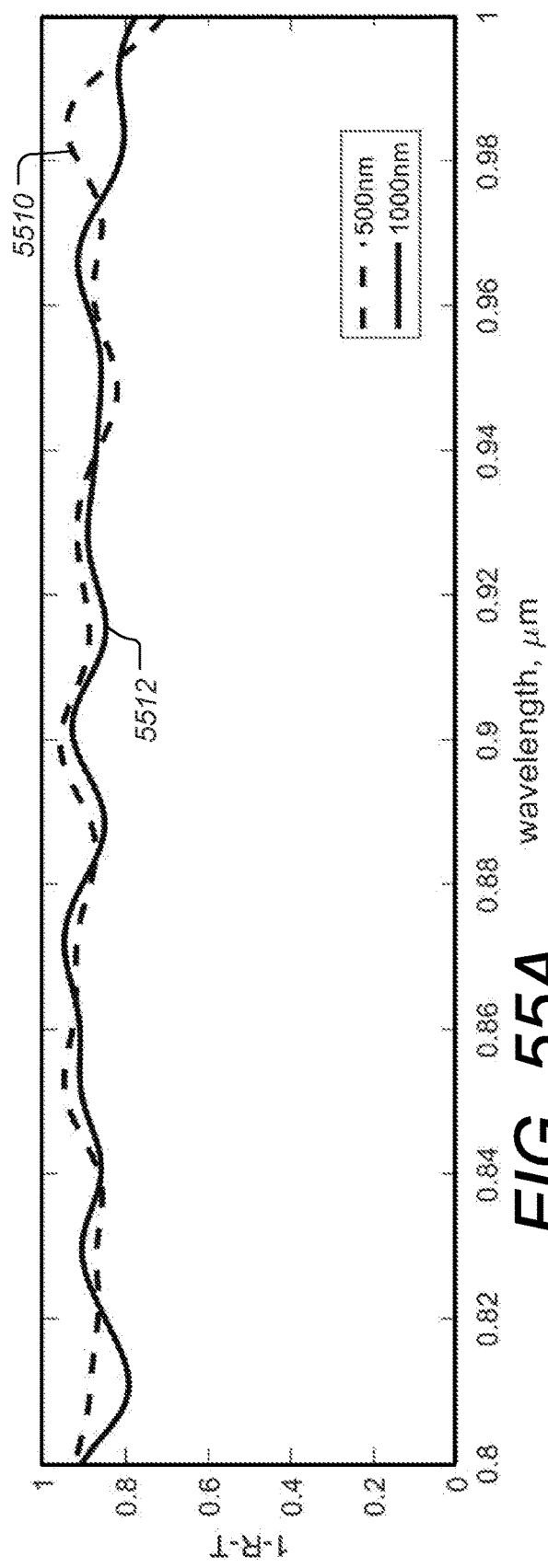
FIGS. 55A and 55B are plots of FDTD simulations of structures shown in FIGS. 48D and 48E.
Figure 55B:
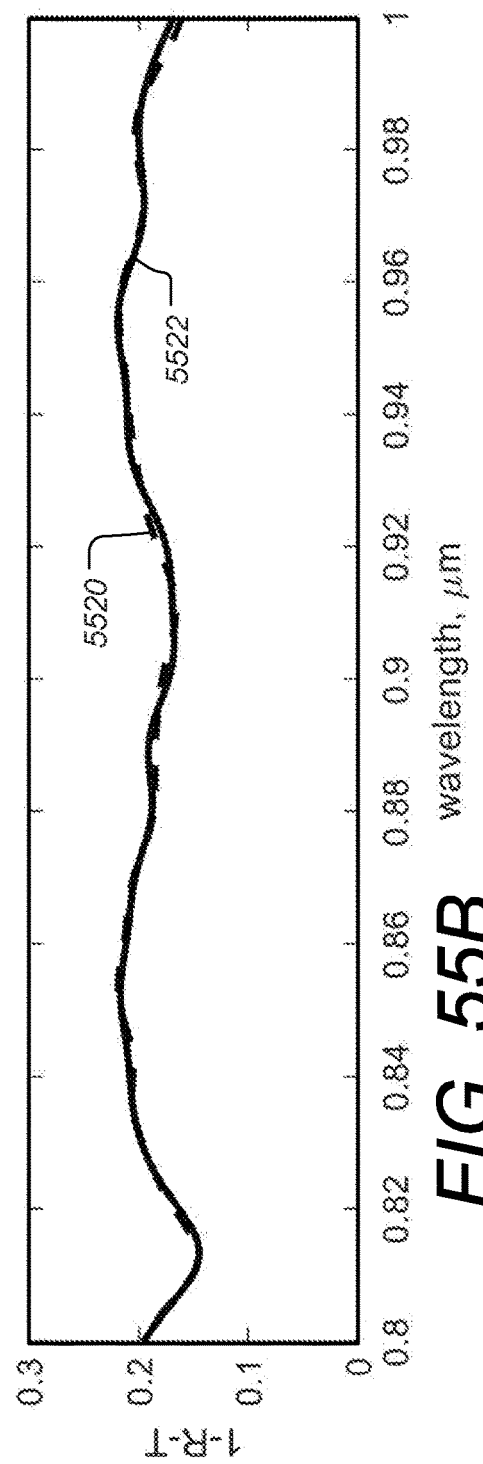

FIGS. 55A and 55B are plots of FDTD simulations of structures shown in FIGS. 48D and 48E. The electrodes are 300 nm wide, the inverted pyramids have a base lateral dimension of 700 nm with a separation between the inverted pyramids of 300 nm and the electrodes have a gap of 1700 nm. The I or low dope Si has a thickness of 1000 nm on top of a BOX layer of 2000 nm on top of a silicon wafer. FIG. 55A shows the absorption (1-Reflection-Transmission) or approximately the external quantum efficiency vs incident photon wavelength from 800 nm 1000 nm. The dashed curve 5510 shows electrodes 500 nm into the I or low dope layer (as in FIG. 48E), and the solid curve 5512 shows electrodes to the BOX layer (as in FIG. 48D). As can be seen in the plots the absorption and/or external quantum efficiency (EQE) can be greater than 80% at most of the wavelengths between 800-1000 nm, and in some cases the EQE can be equal to or greater than 60%, and in some cases the EQE can be equal to or greater than 40% at some of the wavelengths in the span of 800-1000 nm. FIG. 55B shows the absorption or EQE of an inter-digitated photodiode similar to those in FIGS. 48D and 48E but without microstructure holes. The dashed curve 5520 shows electrodes 500 nm into the I or low dope layer (as in FIG. 48E), and the solid curve 5522 shows electrodes to the BOX layer (as in FIG. 48D). As can be seen the absorption or EQE is 20% or less at some of the wavelengths between 800 and 1000 nm. Inter-digitated microstructure hole photodiodes can have a higher absorption or EQE than a comparable inter-digitated photodiode without microstructure holes.

Figure 56A:
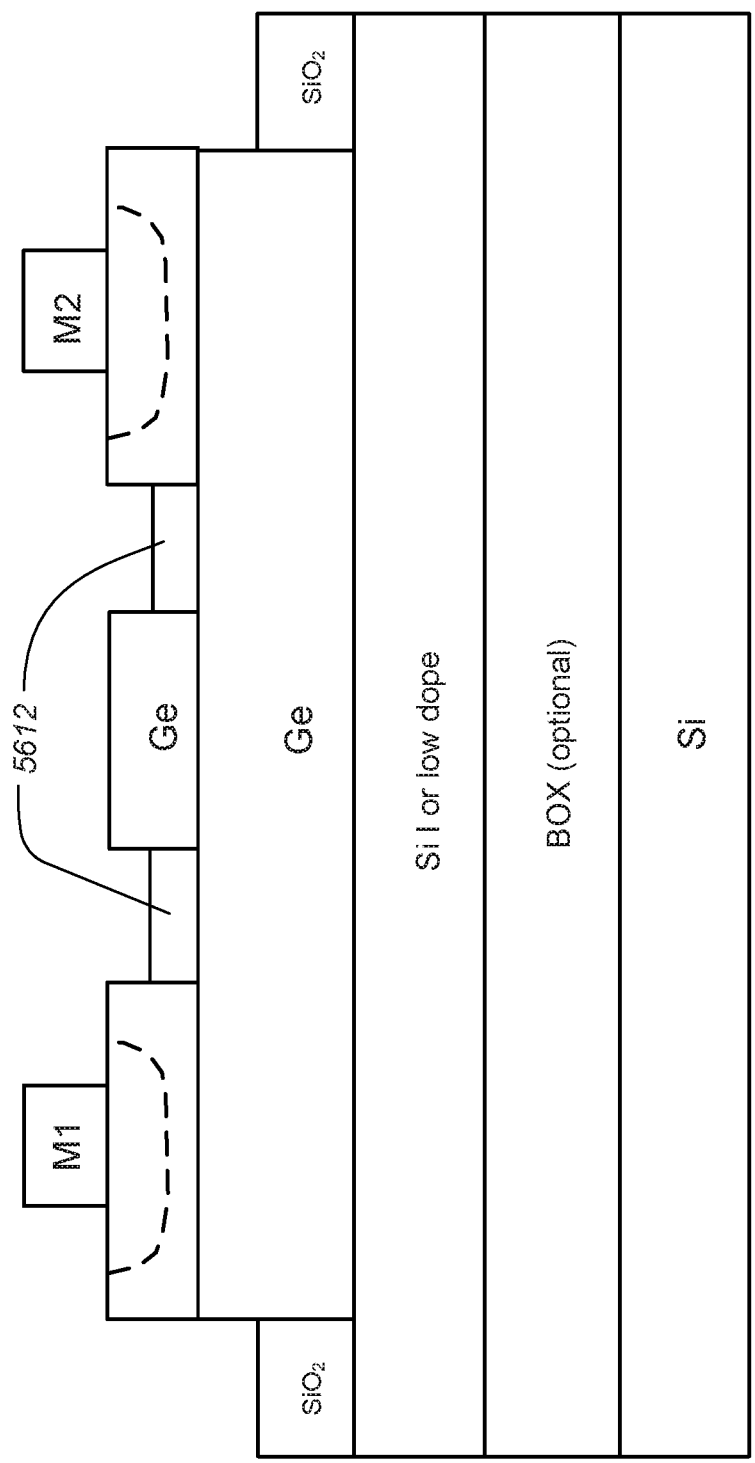
FIGS. 56A and 56B are a partial simple cross-sections of a two-step selective area growth of Ge on Si for a lateral inter-digitated photodetector and a vertical PIN microstructure hole photodetector.
Figure 56B:
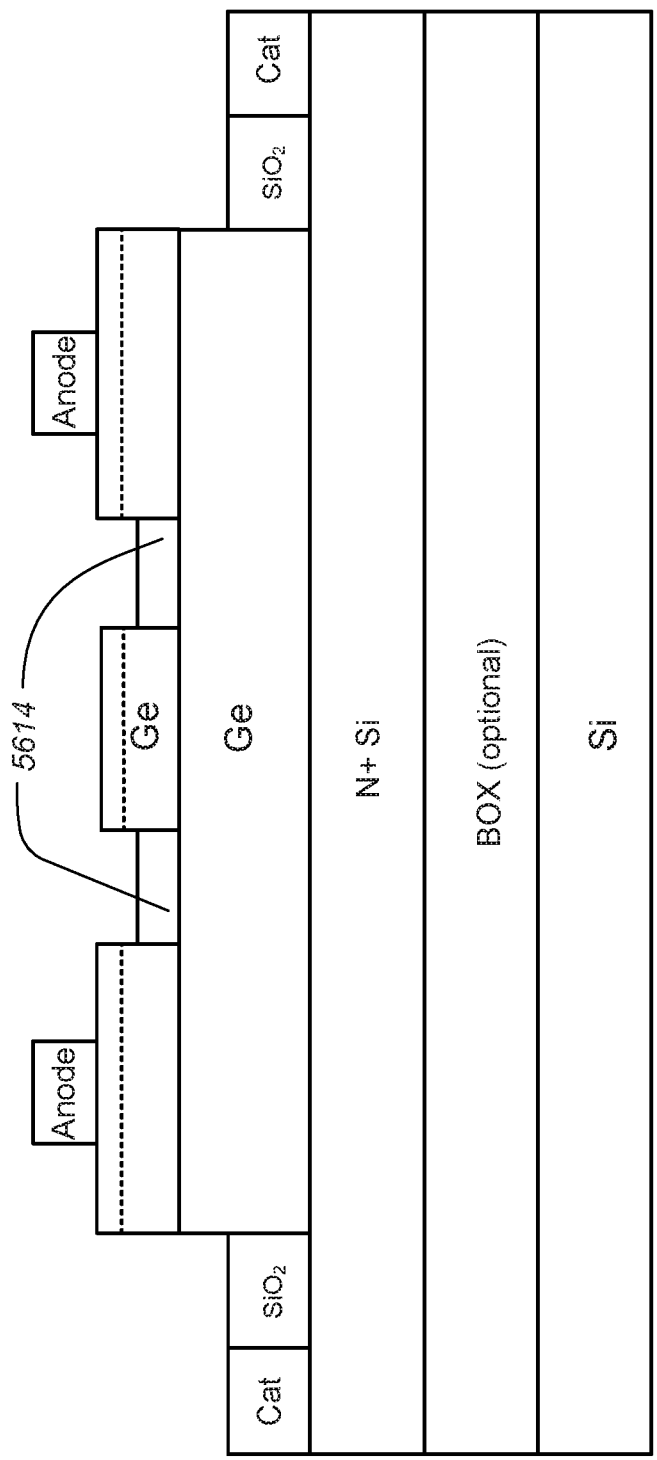

FIGS. 56A and 56B are a partial simple cross-sections of a two-step selective area growth of Ge on Si for both a lateral inter-digitated photodetector and vertical PIN microstructure hole photodetectors. FIG. 56A shows a lateral PIN inter-digitated photodetector with microstructure holes formed by selective area growth on a previously grown Ge layer also formed by selective area growth. Areas where Ge growth in not desired are covered with a dielectric such as $SiO_2$, Silicon Nitride, or Aluminum oxide. The microstructure holes 5612 are formed as in FIG. 1 by placing dielectric islands in areas where microstructure holes are desired and by using selective area growth Ge will be formed everywhere except in regions where there are dielectrics as shown in the figure. P and N dopant can be implanted and electrode M1 and M2 can form ohmic contacts on the P and N dopant resulting in the anode and cathode respectively. Only one cell or pair of the inter-digitated electrodes are shown for simplicity. The dimension of the microstructure holes can range from 100 nm to 4000 nm. The spacing between the holes can range from 100 nm to 3000 nm. In some cases, the Ge layer or at least 1 of the Ge layers can be GeSi alloy with Ge fraction ranging from 0< to 1. The Ge and/or GeSi can be intrinsic and/or low dope P and/or N. The device Si layer can be intrinsic and/or low dope P and/or N.

FIG. 56B shows a vertical PIN two-step selective area growth of Ge on Si. The first, lower layer of Ge is selective area grown on Si that defines the photosensitive area of the detector. A second selective area growth of Ge is used to form the microstructure holes 5614. P+ Ge layer can be grown on top of the I or low dope Ge to complete the vertical PIN structure. In some cases, the P region can be ion implanted or diffused with P dopant ions. The anode electrode can be formed on the P surface of Ge and the cathode electrode can be formed on the N+Si layer. The Ge can be intrinsic (I or low dope P and/or N), the device layer Si can be N+ and the BOX layer can be optional. In some cases, the Ge can be GeSi alloy.

The P and N can be interchanged and, in some cases, multiple regions of P and N can be implemented to form avalanche photodiodes. Avalanche gain can be observed in PN, PIN, PIPN, PIPIN structures, either lateral structures or vertical structures. Avalanche gain can be achieved at voltages before the breakdown voltage, at the breakdown voltage and/or greater than the breakdown voltage. Reverse bias is applied between the anode and the cathode with voltages ranging form −1 volt to −100 volts, and in some cases −1 volt to −35 volts, and in some cases from −1 volt to −20 volts.

FIGS. 56A and 56B show that a two-step selective area growth of Ge on Si and in some cases more than two step selective area growth can be used. In some cases, multiple layers of Ge/GeSi can be used for the fabrication of lateral PIN and vertical PIN microstructure photodetectors. In some cases, the structure can be PN, PIN, P–N, PN–N, PIPN, P–PN, PN–PN, PIPIN to name a few. The P and N can be interchanged.

In some cases, the BOX layer can be partially and/or entirely etched away under the microstructure photodetector and/or under the CMOS BiCMOS ASICs. In some cases, air or fluid can be forced in the regions where the BOX layer is etched away to assist thermal cooling.

H. Zang et al, Application of dopant segregation to metal-germanium-metal photodetectors and its dark current suppression mechanism, Applied Physics Letters, 92, 051110 (2008), incorporated by reference herein, discusses Schottky barrier height modification using P and N doping such as both M1 and M2 have P doping, and M1 and M2 have opposite polarity doping and both M1 and M2 have N doping to reduce dark current. This reference also discusses an example of selective area growth also known as selective epitaxial growth (SEG) of Ge on Si.

Figure 57:
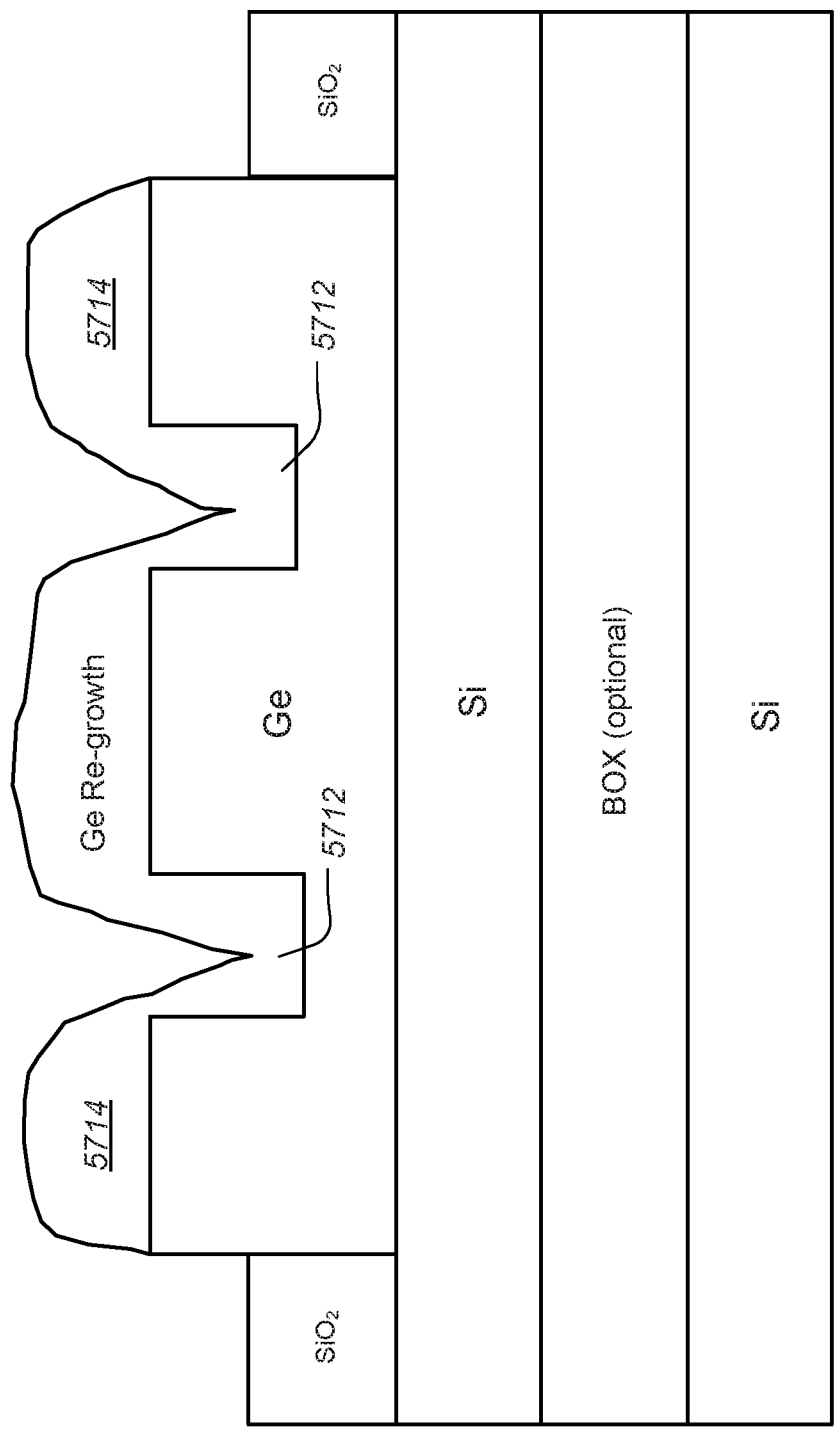
FIG. 57 is a partial simple cross-section schematic of a selective area grown Ge on Si where microstructure holes are etched, followed by a re-growth of Ge over the microstructure holes.

FIG. 57 is a partial simple cross-section schematic of a selective area grown Ge on Si where microstructure holes are etched, followed by a re-growth of Ge over the microstructure holes, according to some embodiments. This re-growth of Ge 5714 over the microstructure holes 5712 can reduce the leakage current due to the damage to the sidewalls of the microstructure holes as a result of dry and I or wet etching. The selective area grown Ge and/or GeSi can have a diameter ranging from 5 microns to 1000 microns or more, and in some cases from 20 microns to 80 microns, and in some cases from 30 microns to 200 microns. The thickness of the first selective area grown Ge can range from 300 nm to 3000 nm and in some cases from 500 nm to 5000 nm, and in some cases from 500 nm to 1000 nm. Microstructure holes 5712 are dry and/or wet etched in the first selective area grown Ge layer with lateral dimensions ranging from 100 nm to 4000 nm, and the spacing between the microstructure holes can range from 100 nm 3000 nm. The etch depth of the microstructure holes can range from 100 nm to 3000 nm, and in some cases the depth can range from 100 nm to 1000 nm. The microstructure holes can be partially etched in to the Ge I or low dope layer or etched entirely through the Ge I or low dope layer to the Si layer. A second selective area grown Ge 5714 is formed over the first selective area grown Ge as shown. The second layer Ge/GeSi 5714 can have a thickness ranging from 100 nm to 1000 nm, and in some cases 50 nm to 3000 nm, and in some cases 100 nm to 500 nm. P and N regions can be formed to create a lateral inter-digitated microstructure hole photodiode or a vertical PIN microstructure hole photodiode. In some cases, for lateral or vertical photodiodes one or more of the contacts can be a Schottky contact.

The Ge/GeSi microstructure photodetector can operate in the wavelength range from 800 nm to 2000 nm. For optical data communication a wavelength ranges can be 1000 nm to 1350 nm and 1550 nm to 1670 nm, the later being desirable for long distance optical links of approximately 2 km to 100 km or more. In LiDAR applications long wavelength operation in the range of 1350 nm to 1650 nm can be desirable for eye safety issues. In some cases, multiple wavelengths with multiple pulsing and/or modulation schemes can be used for accurate signal acquisition, and to avoid interference from other LiDAR that may be using different pulsing wavelength and/or modulation schemes. In some cases, homodyne and/or heterodyne can be used to increase the sensitivity of the LiDAR system, and in some cases multiple wavelengths can be used also to increase the performance and sensitivity of the LiDAR system. In addition, for automotive applications the use of free space long wavelength communication between automobiles can be advantageous for auto safety and traffic management. In some cases, bicyclists and pedestrian's can also have free space communication units to warn the bicyclist and pedestrian of approaching autos.

For both lateral photodiode or photoconductor inter-digitated photodetectors or vertical photodiode there can be 1 or more layers of Si and/or Ge/GeSi with I or low dope P−, N− and/or N and P doping. In addition, there can be regions that are Si and/or Ge/GeSi with I or low dope P−, N− and/or N and P doping. The doping can range from N−−, P−−, to P++, N++ or approximately from $1 \times 10^{14}$ per $cm^3$ to $1 \times 10^{20}$ per $cm^3$ or more of N and P dopant ions. Microstructure holes and/or protrusions can be formed in at least I or more layers/regions of P, I (or low dope), N. In some cases, at least one or more layers can be Ge/GeSi.

Figure 58A:
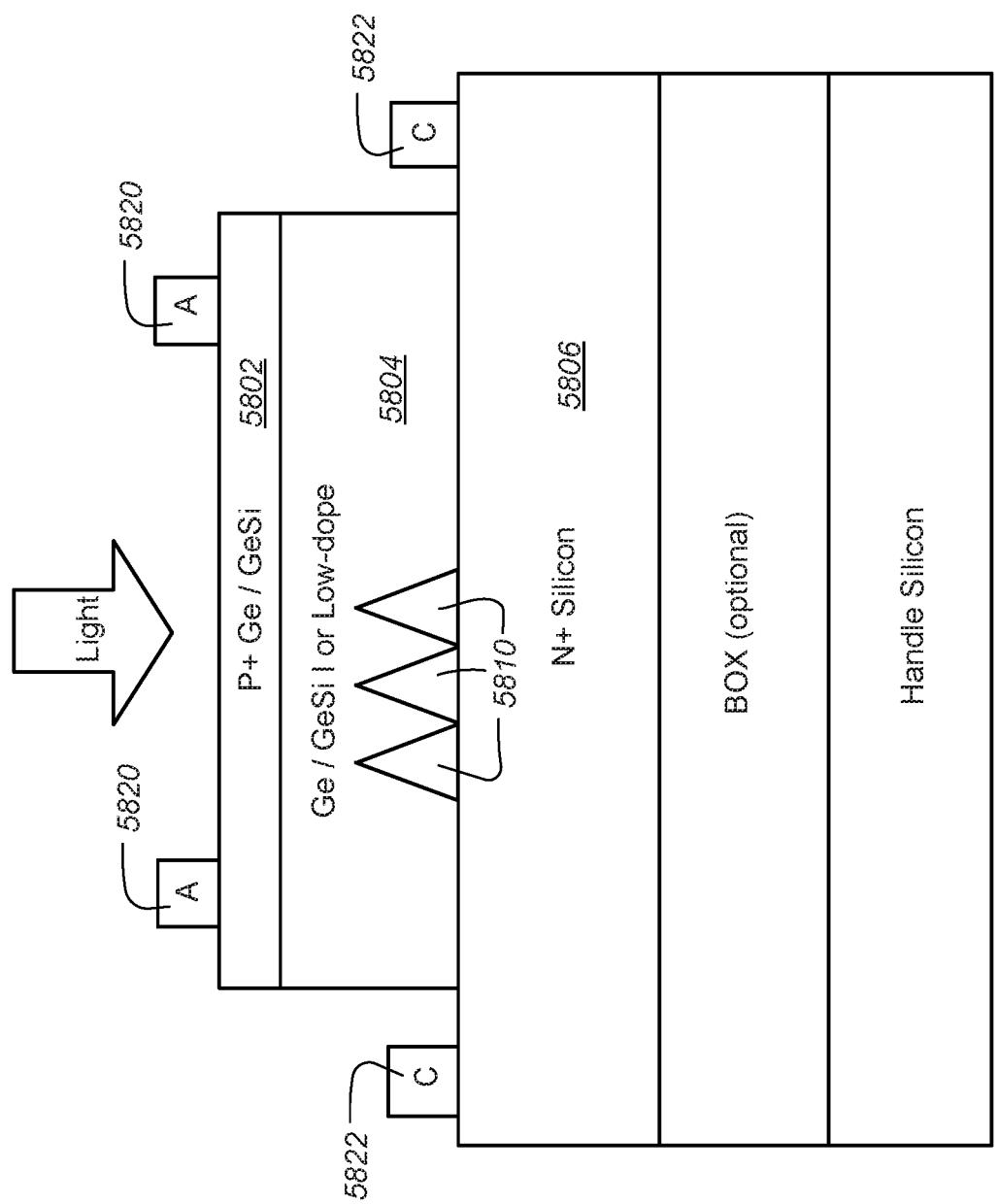
FIGS. 58A and 58B are simple partial cross-sections of Ge/GeSi on Si PIN vertical microstructure photodiodes, according to some embodiments.
Figure 58B:
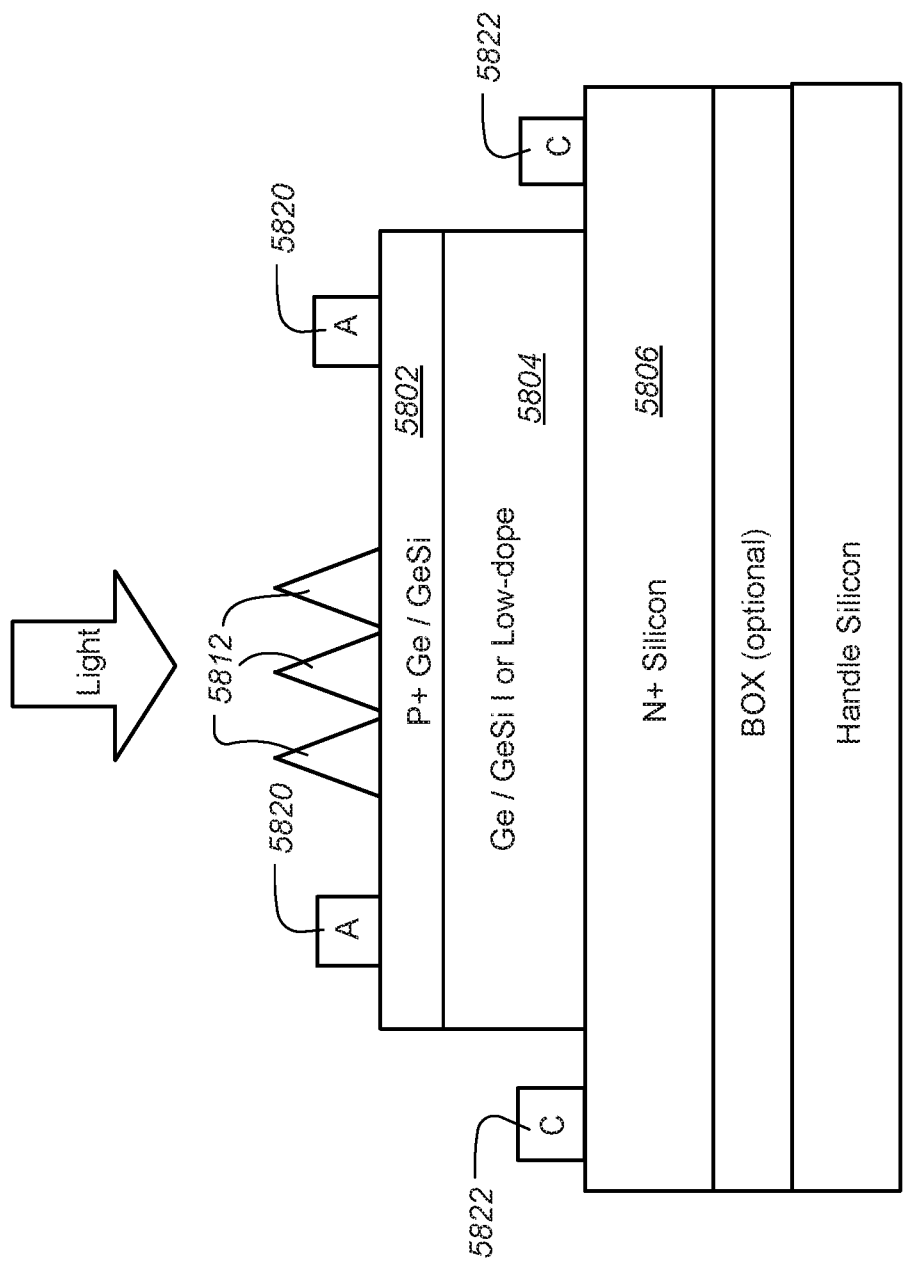

FIGS. 58A and 58B are simple partial cross-sections of Ge/GeSi on Si PIN vertical microstructure photodiodes, according to some embodiments. FIG. 58A shows Si protrusions 5810 that are extend up into the I or low dope region 5804. The Ge/GeSi for region 5804 is selective area grown over the Si protrusions 5810. The Si protrusions 5810 can be pyramids or inverted pyramids. The pyramids or inverted pyramids can have a lateral dimension ranging from 500 nm to 3000 nm and the spacing can range from 0 to 2000 nm.

P+ Ge/GeSi layer 5802 is grown on top of the I or low dope Ge/GeSi layer 5804 which is grown on N+Si 5806. A BOX layer can be included in some cases. The I or low dope Ge/GeSi layer 5804 can have a thickness range from 0.4 microns to 2 microns, and in some cases from 0.5 microns to 1 micron. In some cases. the Ge/GeSi I or low dope layer 5804 can have a thickness greater than 2 microns. P+ Ge/GeSi layer 5802 can have a thickness range from 0.05 microns to 0.3 microns. Metal ohmic contact(s) 5820 can be formed on the P+ layer which can be the anodes and metal ohmic contact(s) 5822 can be formed on the N+ which can be the cathode. A reverse bias is applied between the anode and cathode. Optical signals impinge on the top surface of the P+ Ge/GeSi 5802 and in some cases can impinge from the bottom surface of the Si substrate. Wavelength for the Ge/GeSi photodiode can range from 800 nm to 2000 nm depending on the Ge fraction in the GeSi alloy. FIG. 58B shows protrusions 5812 on the P+ Ge/GeSi layer 5802 which can be I or low dope Ge or in some cases P Ge/GeSi. The protrusion height can range from 0.1 micron to 1 micron. Anodes and cathodes can be formed on the P+ Ge/GeSi and the N+ Si respectively. In some cases the protrusions 5812 can be high index dielectrics and can have a lateral dimension ranging from 500 nm to 2000 nm, and the spacing of the protrusions can range from 0 to 1000 nm or more.

Figure 59A:
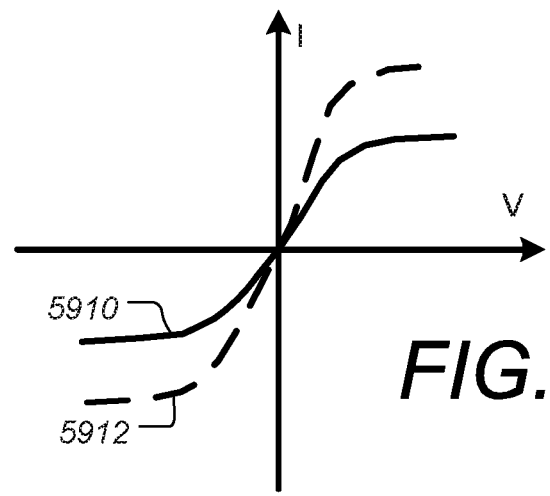
FIGS. 59A-59C are diagrams of IV (current-voltage) characteristics of photoconductors and photodiodes, according to some embodiments.
Figure 59B:
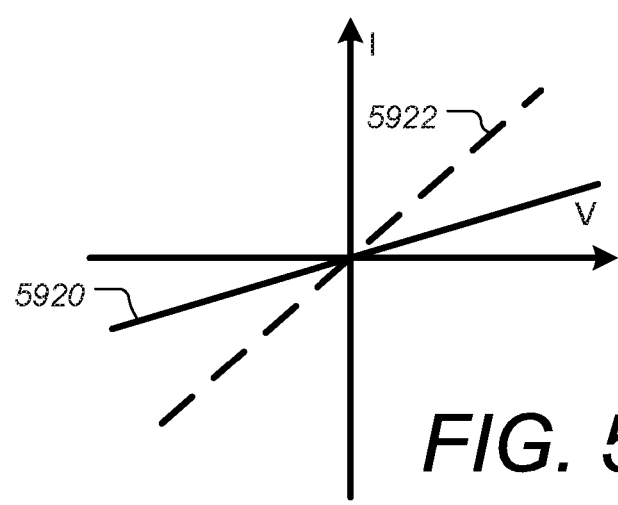
Figure 59C:
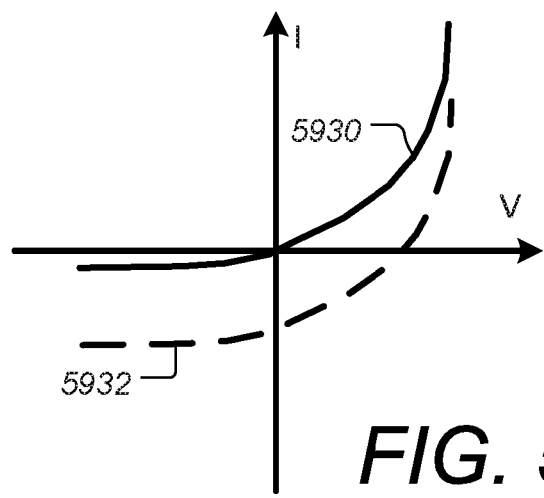

FIGS. 59A-59C are diagrams of IV (current-voltage) characteristics of photoconductors and photodiodes, according to some embodiments. Solid curves 5910, 5920 and 5930 show the IV characteristics when no light is shinning on the photoconductor, and often called the dark IV. The dashed curves 5912, 5922 and 5932 are when light is shinning on the photoconductor and is called the light IV. As can be seen in FIGS. 59A and 59B, photoconductors can have symmetric IV characteristics and therefore the photoconductor can operate in both the reverse and forward bias. For example. it can operate with −0.5 volts to −100 volts and it can operate in +0.5 volts to +100 volts. As can be seen, the curves are symmetric in the negative and positive voltage with negative current with negative voltage, and positive current with positive voltage. In some cases. the curves can be almost symmetric. In some cases, there can be some asymmetry due to differences in contact sizes. FIG. 59A shows an example of a Schottky semiconductor Schottky arrangement, or equivalently back to back Schottky of a MSM photodetector where the Schottky to semiconductor contact generates a depletion layer. The FIG. 59A IV characteristics shows back to back Schottky diodes that can operate in both the forward and reverse bias.

FIG. 59B shows the IV characteristics of a photoconductor where the metal electrodes make ohmic contact to the semiconductor. Under illumination the resistance of the photoconductor changes and can be a lower resistance than when the photoconductor is not illuminated. In some cases. the photoconductor can have photoconductive gain. The structure can be MSM inter-digitated structure where metal electrodes form ohmic contacts such as PIP and NIN.

FIG. 59C shows IV curve photodiode characteristics of Schottky semiconductor ohmic (P or N) or PIN or PN, and in some cases PIPN, PIPIN. Photodiodes operate in reverse bias voltage where a reverse bias is applied to the anode and cathode, and in some cases it can operate at 0 bias. For high-speed operation a reverse bias ranging from −1 volt to −30 volts or more can be applied to the anode and cathode. Inter-digitated lateral microstructure holes/protrusions photodetectors can be made in either as a photoconductor or as a photodiode, depending on the contacts. The vertical microstructure holes/protrusions photodetectors are often PIN or Schottky photodiodes, and in some cases can also be fabricated in a photoconductor structure with NIN or PIP contacts for example.

Figure 60:
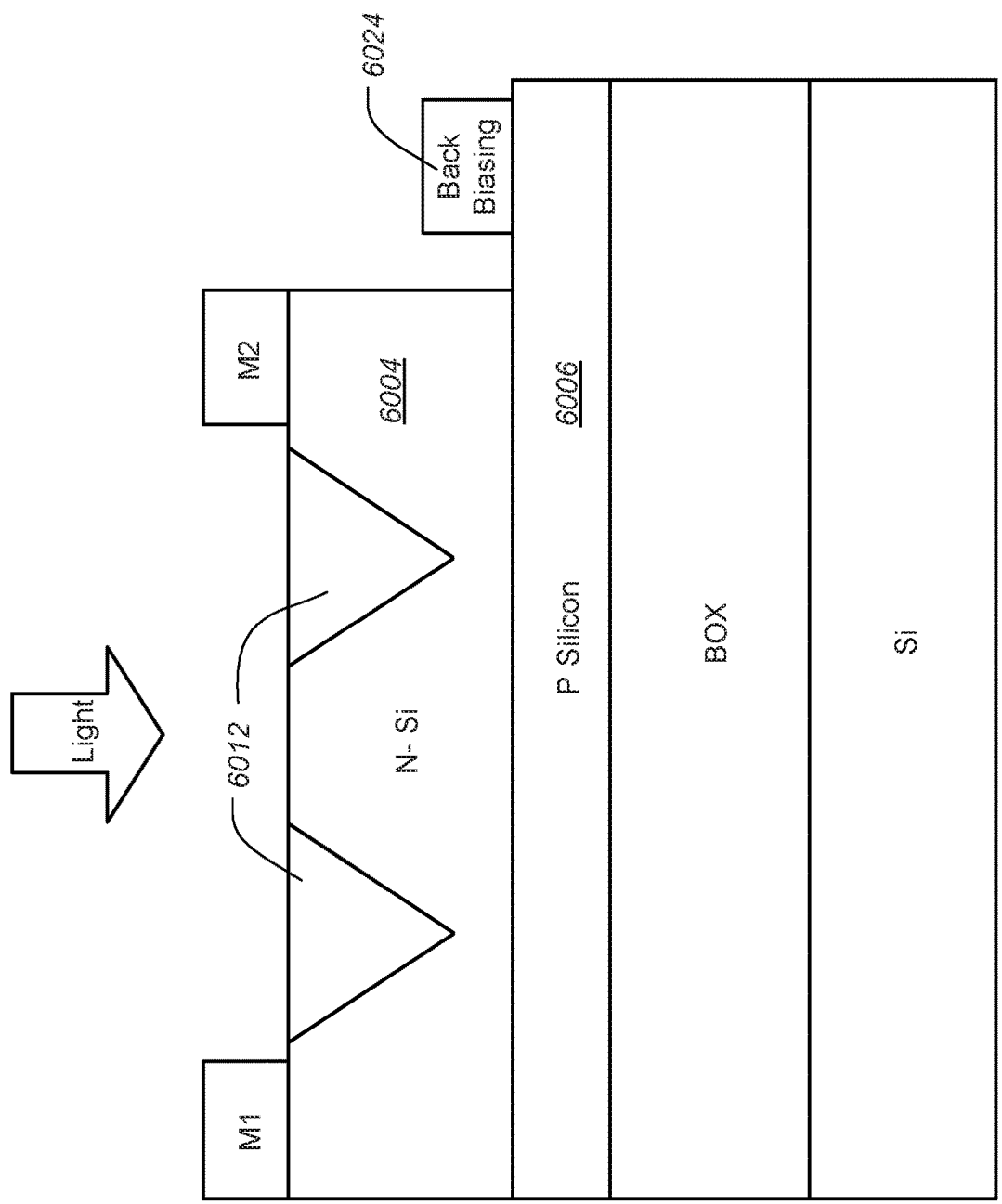
FIG. 60 is a simple partial cross-section of an inter-digitated microstructure hole photodetector, according to some embodiments.

FIG. 60 is a simple partial cross-section of an inter-digitated microstructure hole photodetector, according to some embodiments. The structure includes I or low dope N⁻ Si 6004 with Schottky contacts. In some cases, P and/or N contacts are used with an additional P layer under the I or N⁻Si layer 6004. Contact 6024 is formed on the P Si 6006 to allow a reverse biasing between the P layer 6006 and the N⁻ Si layer 6004. By applying a reverse bias between the P and N⁻ Si the speed and in some cases the EQE can be enhanced in the inter-digitated microstructure hole photodetector which can be a photoconductor or a photodiode depending on the contacts formed by M1 and M2. The holes 6012 can have shapes such as pyramids, cylindrical, conical, trapezoidal to name a few, and in some cases, it can have a combination of shapes. The lateral dimension of the protrusion can range from 50 nm to 3000 nm, and in some cases 300 nm to 1500 nm. The protrusions can be spaced from 0 nm to 2000 nm. The height of the protrusions can range from 50 nm to 2000 nm or more, and in some cases from 10 nm to 1500 nm, and in some cases from 100 nm 1000 nm.

Figure 61A:
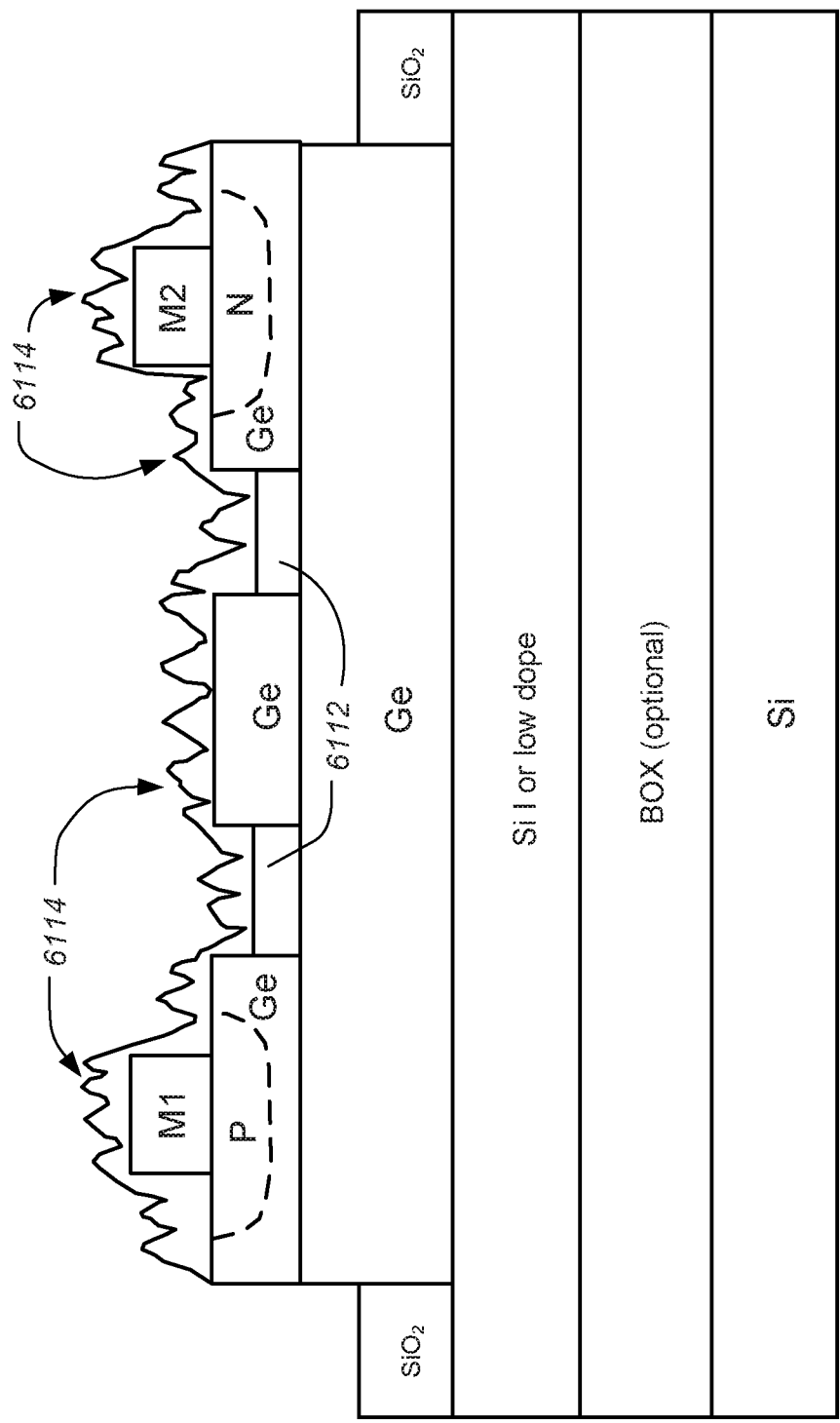
FIGS. 61A and 61B are cross-sections of nanostructures on lateral and on vertical inter-digitated photodetectors, according to some embodiments.
Figure 61B:
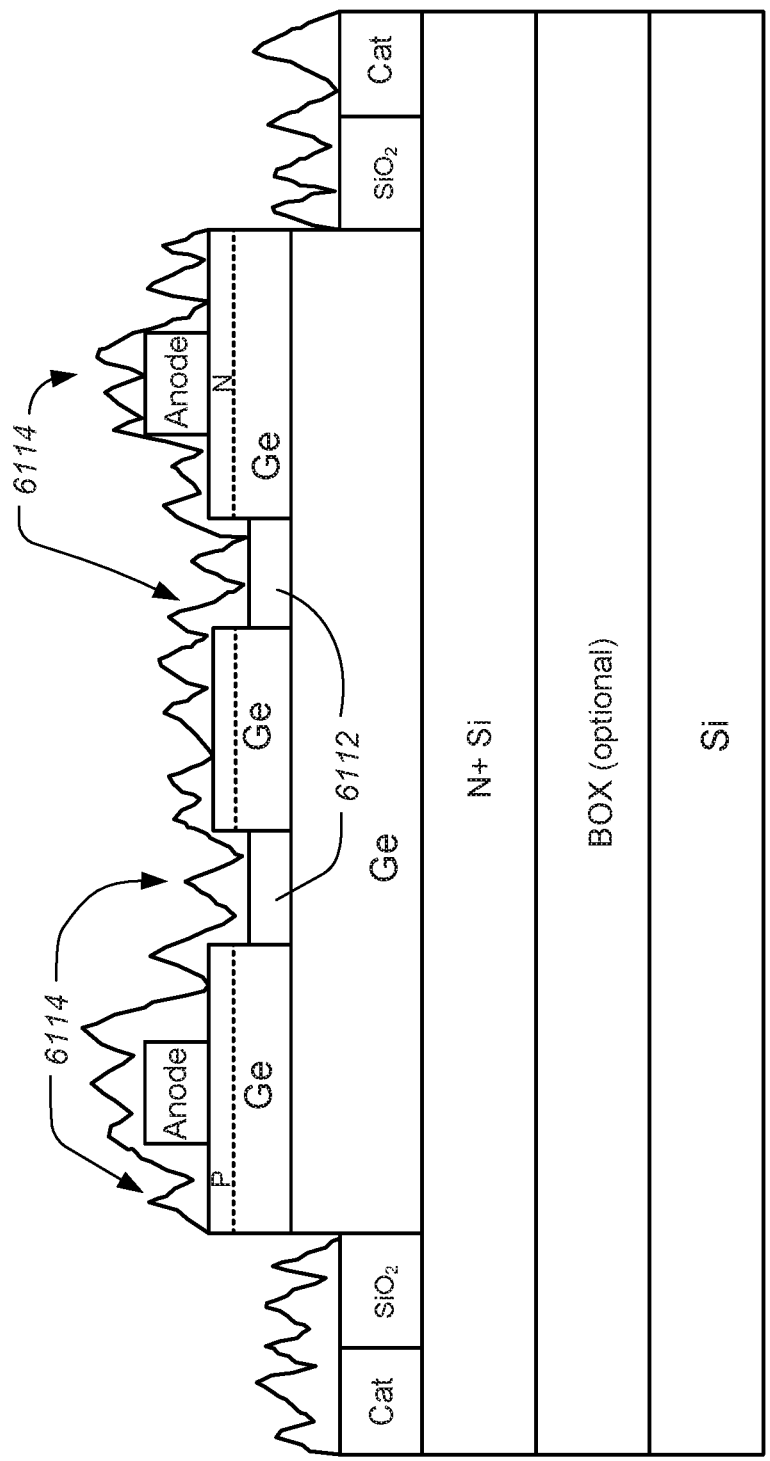

FIGS. 61A and 61B are cross-sections of nanostructures on lateral inter-digitated photodetectors and vertical photodetectors, according to some embodiments. Microstructure holes 6112 are shown as holes but can be holes or protrusions. The nanostructures 6114 on the photodetector and on the electrodes, and in some cases on the transmission lines, are intended to reduce optical reflection. Optical reflection back into optical fibers from the surface of the microstructure photodetector preferably should be less than or equal to −12 dB, and in some cases less than or equal to −26 dB. Anti-reflection coatings can be applied to the surface that often consist of one or more dielectric thin films where the optical refractive index is the geometric mean between the medium and the photodetector where the medium is often air and the photodetector has the refractive index of the semiconductor. The thicknesses of the dielectric layers are often quarter wavelength and/or multiples of quarter wavelength of incoming optical signal impinging on the surface of the photodetector. The dielectric film can be etched to create nanostructures which can be periodic and/or random that can further trap light and reduce reflection. The transparent dielectric film has a high optical dielectric constant such as Hf-oxide, Si nitride, ZnSe, Al-oxide, GaN to name a few. These nanostructures 6114 can have lateral dimensions ranging from nm to 1000 nm or more. The spacing can range from 0 nm to 1000 nm and the height can range from 10 nm to 3000 nm. In some cases, black Si can be used, and in some cases black Ge can be used, and in some cases black Al-nitride, GaN-nitride to name a few can be used.

The advantage of nanostructure anti-reflection coating can be that it is less wavelength and angle dependent than a similar dielectric layer or layers without nanostructures. These nanostructures can be patterned, and in some cases not patterned, similar to the methods forming black Si where a dry etch process is applied to the surface.

Very low optical reflections from the surfaces of the microstructure photodetectors are desirable for optical communication. For LiDAR applications ultralow reflection from the surfaces of the microstructure photodetector is generally less important. For example, for LiDAR applications reflection of −10 dB or less is adequate as compared to optical communication where the reflection is often between −12 dB to −26 dB depending on short reach for multimode fibers and long reach/medium reach wfor single mode fibers.

H. Cansizoglu, Optical Absorption Properties of Semiconducting Nanostructures with Different Shapes, Advanced Optical Materials, 2013, 1, 158-166; J. Q. Xi et al, Optical thin-film materials with low refractive index for broadband elimination of Fresnel reflection, Nature Photonics, Vol. 1, March 2007, both incorporated by reference herein, discuss using nanostructures to reduce reflection. Dielectric nanograss can be effective in reducing reflection to less than 1% and in some cases to less than or equal to 0.2% over a wide wavelength range and a wide angle of incidence. Reflectivity of −26 dB can be required for certain single mode optical data communication at 1350 nm wavelength range.

Figure 62A:
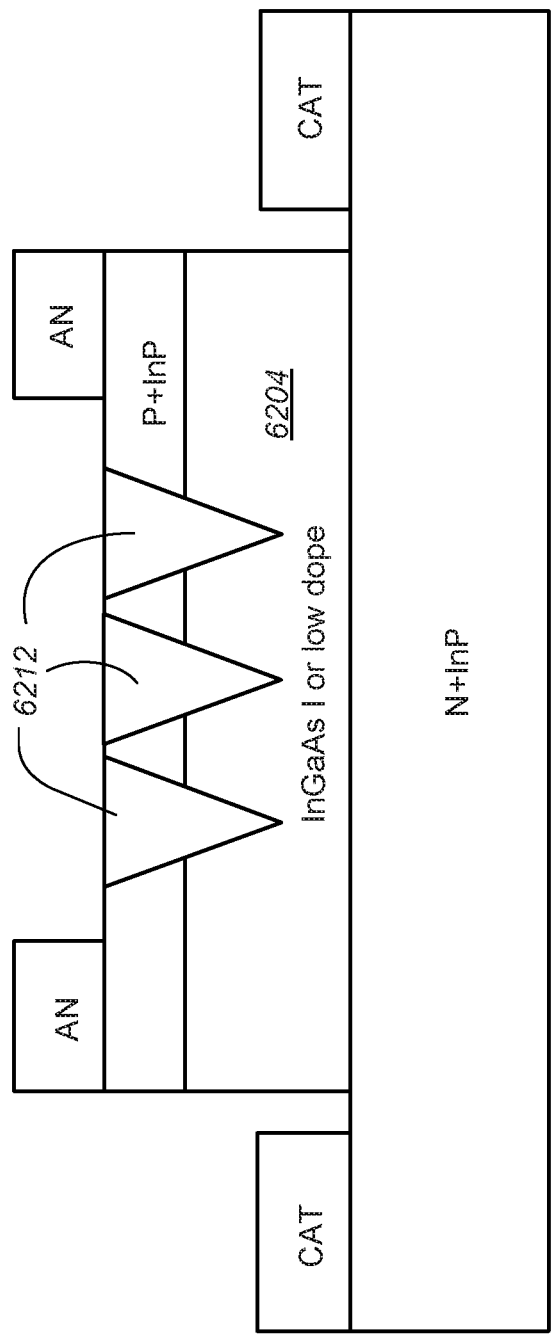
FIGS. 62A and 62B are partial schematic cross-section of III-V material family vertical microstructure PIN photodetector and a lateral MSM inter-digitated microstructure hole photodetector, according to some embodiments.
Figure 62B:
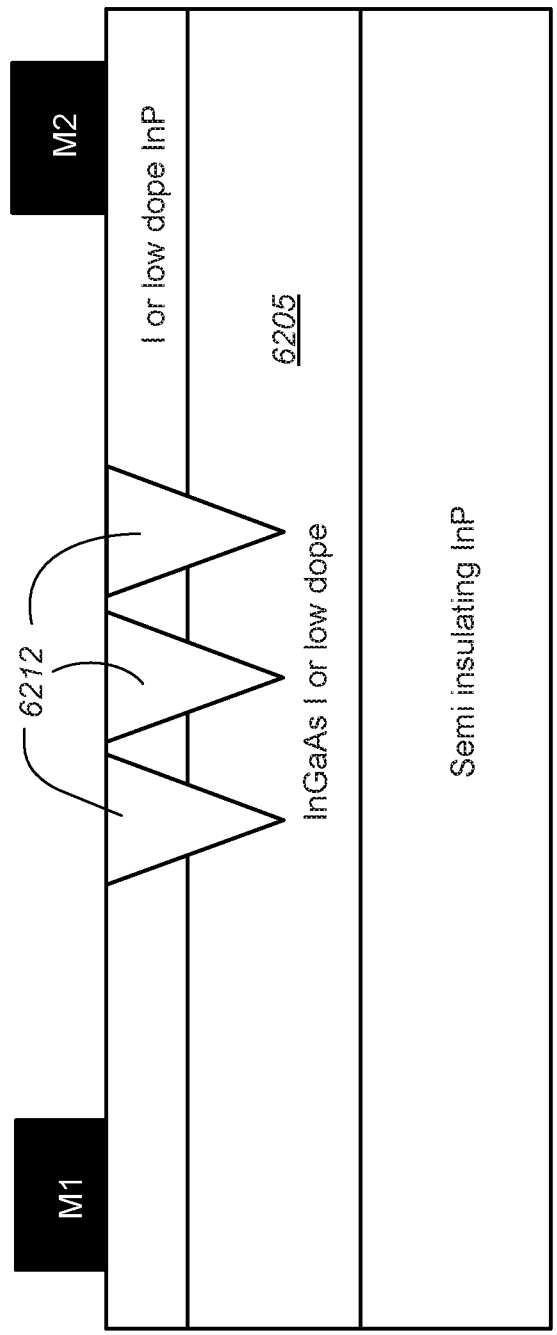

FIGS. 62A and 62B are partial schematic cross-section of III-V material family vertical microstructure PIN photodetector and a lateral MSM inter-digitated microstructure hole photodetector, according to some embodiments. For data rates of 50 Gb/s or more and in some cases photodetectors with a bandwidth of 50 GHz or more the absorbing layer will be necessarily thin to allow a fast transit time. The absorbing layer thickness, such as the InGaAs layer 6204 for example, can range from 200 nm to 1000 nm, and in some cases 300 nm to 500 nm. The diameter of the photodetector in the case of a vertical PIN structure can range from 5 microns to 30 microns, and in some cases 8 microns to 20 microns. FIG. 62A shows a surface illuminated PIN structure comprising of P+InP layer with thickness ranging from 300 nm to 1000 nm. The absorbing layer InGaAs 6204 can be I or low dope and can have a thickness ranging from 300 nm to 1000 nm and in some cases 300 nm to 500 nm grown on N+InP layer or substrate. In the case of N+InP layer, the layer thickness can range from 1000 nm to 5000 nm and can be on semi-insulating InP substrate. Microstructure holes 6212 can be wet or dry etched, and can have shapes such as inverted pyramids, cylindrical, conical, trapezoidal to name a few, and can have a surface lateral dimension ranging from 500 nm to 2500 nm, and in some cases from 700 nm to 1500 nm. The edge-to-edge spacing of the microstructure holes 6212 can range from 100 nm to 1000 nm, and in some cases 100 nm to 500 nm. The depth of the microstructure holes can range from 100 nm to 1500 nm or more. The holes can be partially etched into the P+InP layer, and in some cases through the P+InP layer to the I or low dope InGaAs layer, and in some cases partially into the I or low dope InGaAs layer, and in some cases through the I or low dope InGaAs layer. Ohmic contacts such as anode can be formed on the P+InP and the cathode can be formed on the N+InP. As shown, a mesa can be used to define the photosensitive region by etching through the P+InP and through the InGaAs layer as shown. Not shown are anti reflection layers, and/or anti reflection nanostructures.

FIG. 62B shows MSM or Schottky semiconductor Schottky inter-digitated microstructure photodetector with I or low dope InP layer on I or low dope InGaAs layer 6205 on semi insulting InP substrate. The InP layer can have a thickness ranging from 100 nm to 1000 nm and the InGaAs layer 6205 can have a thickness ranging from 200 nm to 1000 nm, and in some cases from 200 nm to 600 nm. Microstructure holes 6212 can be wet or dry etched and can be inverted pyramids, conical, trapezoidal, cylindrical shapes to name a few. The microstructure holes can have lateral dimension ranging from 500 nm to 2500 nm and the edge to edge spacing between the microstructure holes can range from 0 and/or intersecting to 1000 nm. The holes can be etched partially into the upper InP layer, and in some cases through the upper InP layer and partially into the InGaAs layer, and in some cases through the InGaAs layer. In some cases, the upper InP top layer may be omitted. Inter-digitated electrodes are formed on the upper InP layer as metal semiconductor Schottky contacts and can be P and N contacts in cases where the region below the M1 and M2 electrodes are doped P and N respectively. The inter-digitated electrode spacing can range from 300 nm to 1000 nm, and the width of the electrodes M1 and M2 can range from 10 nm to 180 nm.

The wavelength range for InGaAs lattice matched to InP is approximately 1300 nm+/−100 nm or more, and in some cases, it can be 1250 nm to 1350 nm, and in some cases+/−200 nm and in some cases+/−300 nm with a center wavelength at 1300 nm. By using other compositions of materials such as InGaAs, P, on InP other wavelength ranges can be achieved. Data rates can range from 40 Gb/s to 80 Gb/s, and in some cases to 100 Gb/s or more. Reverse bias can be applied to the anode and cathode with voltages ranging from −1 to −40 volts and in some cases from −1 to −3.3 volts. In the case of MSM where M1 and M2 are symmetric or almost symmetric such as back to back Schottky contacts the photodetector can operate in both forward and reverse bias voltages; for example, a positive voltage can be applied to M1 and a negative voltage can be applied to M2, and in some cases a negative voltage can be applied to M1 and a positive voltage can be applied to M2. The voltage range can be from −1 volt to −40 volts or more, and in some cases the voltage can range from −1 to −3.3 volts.

In some cases, other III-V materials may be used in one or more layers, and in some cases at least one layer can be Si and/or Ge and/or GeSi. And in some cases, one or more layers can be crystalline and/or non-crystalline. In some cases, the P and N can be interchanged.

In both vertical PIN and lateral MSM Schottky contacts and/or PN contacts avalanche gain can be observed for Si, Ge on Si, GeSi on Si, and III-V photodetectors. The avalanche gain in some cases gain can be observed prior to the breakdown voltage and microstructure hole or protrusion photodetectors can have higher gain than a similar photodetector without microstructure holes or protrusions before the breakdown voltage. Microstructure holes or protrusions can have high electric fields at edges which can result in gain prior to breakdown voltage which can be higher than gain observed in similar structures without microstructure holes or protrusions.

O. Wada et al, Very high speed GaInAs metal-semiconductor-metal photodiode incorporating an AlInAs/GaInAs graded superlattice, Applied Physics Letters, 54 (1) 2 Jan. 1989, incorporated by reference herein, discusses high speed III-V MSM photodiode with an absorption layer thickness of 1.5 microns. As data rate increases beyond 25 Gb/s for surface illuminated photodetectors the absorption layer becomes necessarily thin for example 1.5 microns or less such that the transit time of the photo generated carriers is less than 30 pico seconds, and in some cases less than 20 pico seconds. For such thin layers microstructure holes can enhance the absorption and can have a higher EQE than a comparable photodetector without microstructure holes.

In some cases amorphous Si can be used to fabricate MSM or Vertical Schottky photodetectors. See e.g., S. Ghanbarzadeh, Low Dark Current Amorphous Silicon Metal-Semiconductor-Metal Photodetector for Digital Imaging Applications, IEEE Electron Device Letters, Vol. 35, No. 2, February 2014, which is incorporated by reference herein. Such devices can be used for imaging, and in some cases with the addition of microstructure holes the wavelength at which the detector is sensitive can be extended.

Figure 63A:
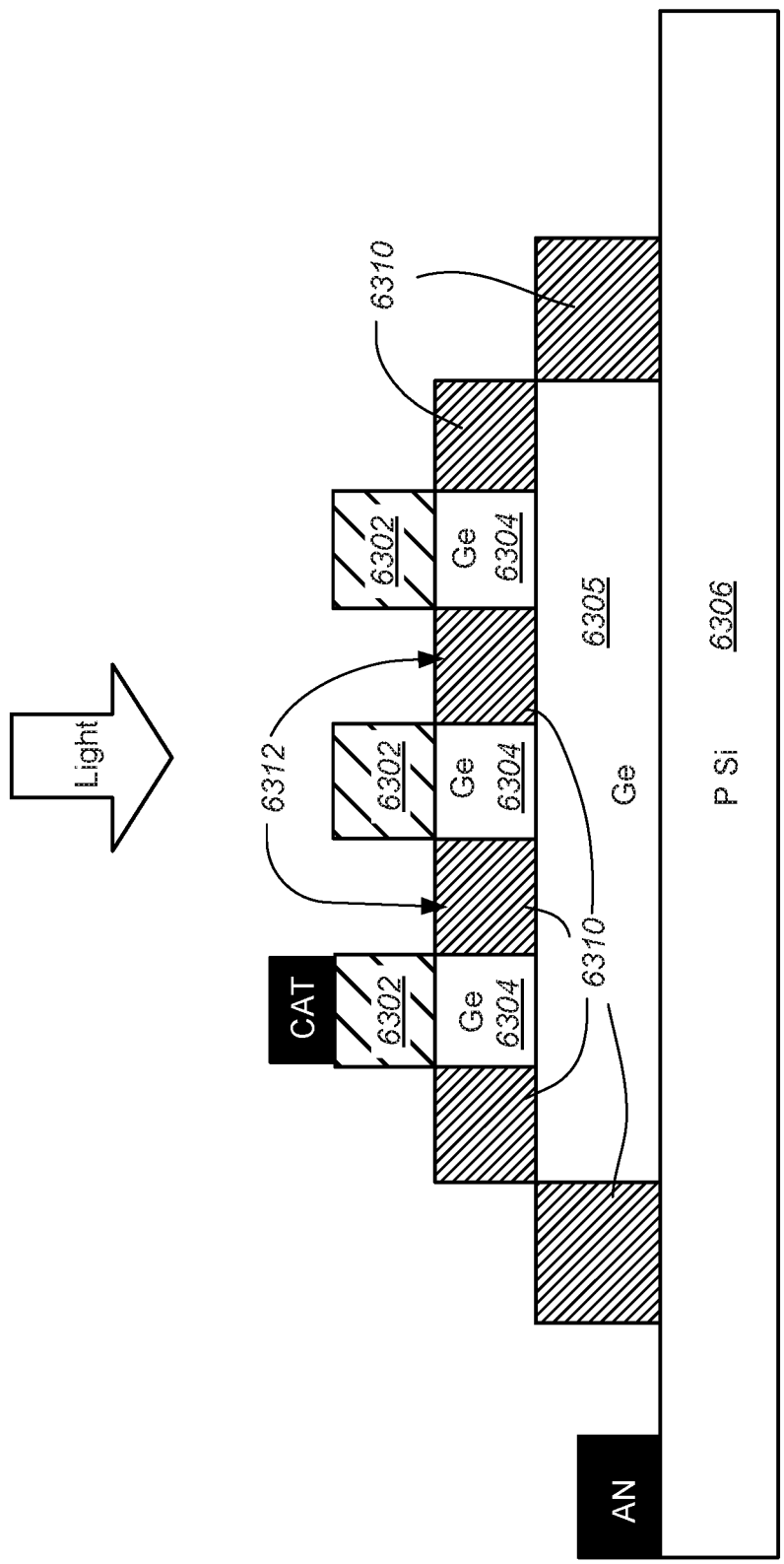
FIGS. 63A and 63B are partial cross-sections of Ge and/or GeSi on Si microstructure photodetectors in a vertical configuration and in a lateral configuration, according to some embodiments.
Figure 63B:
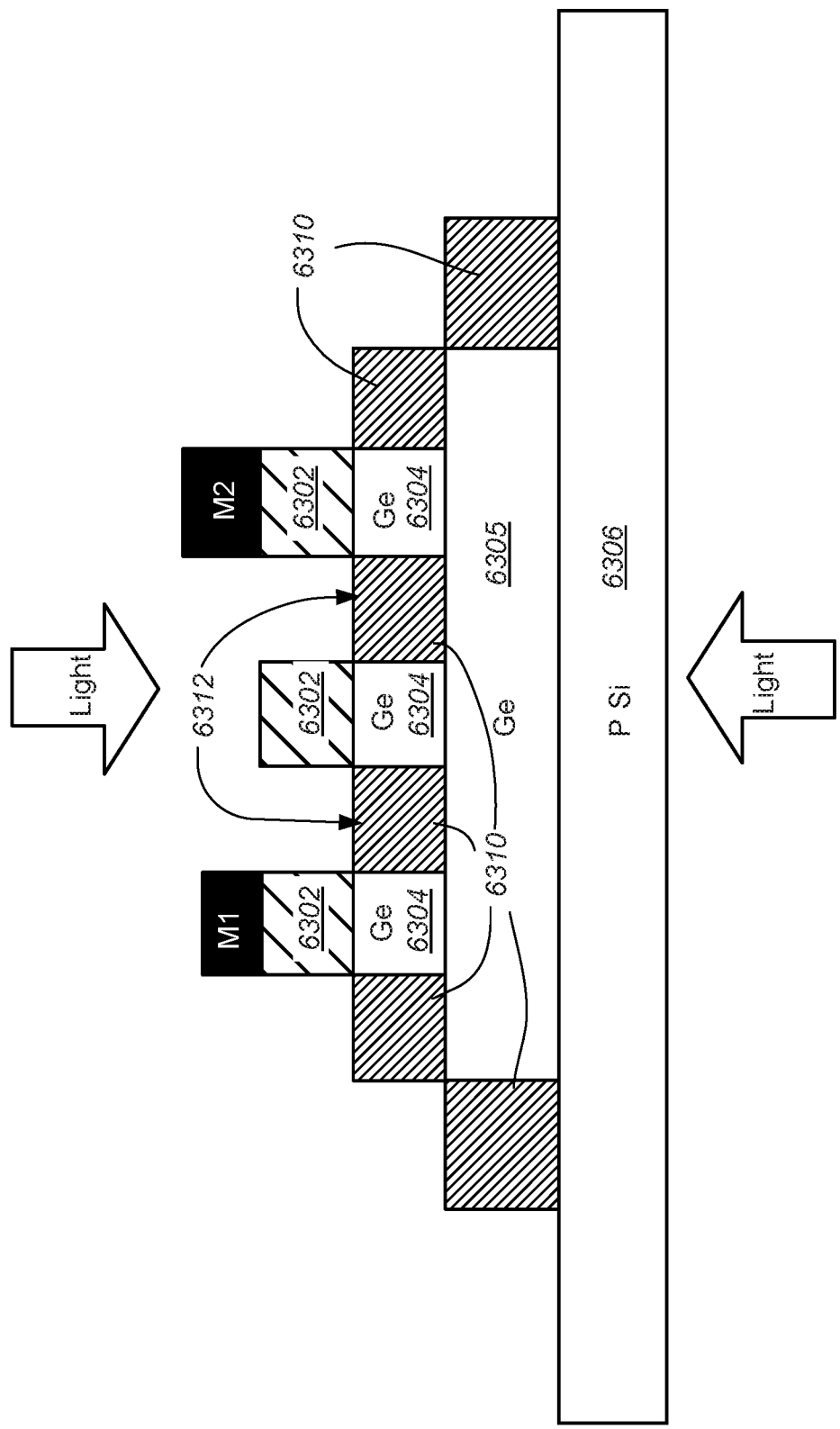

FIGS. 63A and 63B are partial cross-sections of Ge and/or GeSi on Si microstructure photodetectors in both vertical configuration and lateral configuration, according to some embodiments. FIG. 63A shows the vertical Ge on Si microstructure hole photodiode where the Ge is grown using selective area growth. See, e.g., J. Michel. The microstructure holes 6312 in the Ge are also formed by selective area growth. In this case a two-stage selective area growth process is used. In the example of FIG. 63A, first Ge layer 6305 is grown followed by Ge layer 6304. Dielectric 6310 is used to mask off areas where Ge growth is not desired. Dielectric 6310 be Silicon dioxide, Si nitride, Al oxide, and/or other dielectric materials. Other mask materials such as amorphous Si and/or other amorphous semiconductor can also be used. The microstructure holes 6312 are formed in the Ge 6304 using selective area growth and a poly Si layer 6302 with N+ doping can be used to form the N layer. The structure is grown on a P+Si substrate 6306, and in some cases can be on a SOI wafer. The Ge 6304 and 6305 is I or low doped. The microstructure holes 6312 can have lateral dimensions ranging from 300 nm to 2500 nm, and the edge-to-edge spacing of the microstructure holes can range from 100 nm to 1000 nm. The thickness of the Ge and/or GeSi layer can range from 300 nm to 3000 nm, and in some cases the Ge and/or GeSi thickness can range from 500 nm to 1000 nm. In this example the first layer of selective area grown Ge or GeSi 6305 on P+Si 6306 can have a thickness ranging from 200 nm to 1000 nm, and the second selective area grown Ge 6304 with microstructure holes can have a thickness ranging from 100 nm to 1000 nm. The Poly Si N+ layer 6302 can have a thickness ranging from 100 nm to 1000 nm. Cathodes can be formed on the N+ poly Si layer 6302, and the anode can be formed on the P+ Si substrate or layer 6306. Optical signals can impinge from the front (top) for a surface illuminated photodetector and in some cases the optical signal can impinge from the back (bottom) of the substrate side for a bottom illuminated photodetector. The process is compatible with CMOS or BiCMOS electronics and therefore can be integrated with CMOS, BiCMOS ASICs (not shown). In some cases the microstructure holes can be formed with wet and/or dry etching. The holes can be conical, trapezoidal, cylindrical, and/or any combination of shapes. Wavelength range for the Ge/GeSi on Si PIN microstructure hole photodiode of FIG. 63A can range from 750 nm to 2000 nm and in some cases from 800 nm to 1700 nm, in some cases from 800 nm to 1350 nm, in some cases from 950 nm to 1350 nm, and in some cases from 1000 nm to 1350 nm. The EQE of microstructure hole Ge/GeSi photodetector can be higher than a comparable Ge/GeSi photodetector without microstructure holes for certain wavelengths.

FIG. 63B shows a similar Ge/GeSi photodetector in MSM or inter-digitated microstructure hole configuration. Inter-digitated electrodes M1 and M2 can form Schottky contacts on the poly silicon 6302 which can be I or low doped, and the selective area grown Ge 6304 can be I or low doped on Si substrate or layer 6306. And in some cases, SOI wafers can be used, which can include a BOX layer. Light can impinge from the top surface, and in some cases from the bottom surface. Not shown are anti reflection coatings and/or anti reflection nanostructures. Also not shown are any additional passivation or dielectrics that can coat the photodetector as part of a CMOS or BiCMOS process. The inter-digitated Ge/GeSi microstructure photodetector of FIG. 63B can also be integrated with CMOS, BiCMOS ASICs (not shown). Liu et al, Tensile strained Ge p-i-n photodetectors of Si platform for C and L band telecommunications, Journal of Applied Physics 98, 013501 (2005), incorporated by reference herein and referred to herein as "Liu et al. 2005", discusses Ge on Si PIN photodiode.

Liu et al. 2005, for example, discusses the use of poly silicon on Ge. H. Zang et al, Asymmetrically contacted germanium photodiode using a metal-interlayer-semiconductor-metal structure for extremely large dark current suppression, Optics Letters Vol. 41, No. 16, 15 Aug. 2016, incorporated by reference herein and referred to herein as "Zang et al. 2016", discusses the use of Ti Oxide. M. Miura et al, Differential receivers with highly-uniform MSM Germanium photodetectors capped by SiGe layer, Optics Express, Vol. 21, No. 20, 7 Oct. 2013, incorporated by reference herein, discusses the use of SiGe at the interface between Ge and TiN. Dushaq et al, Metal-germanium-metal photodetector grown on silicon using low temperature RF-PECVD, Optics Express, Vol. 25, No. 25, 11 Dec. 2017, incorporated by reference herein and referred to herein as "Dushaq et al.", discusses the use of amorphous Si for example. In addition, P and N junctions can also be used in a Ge photodetector. In some cases, transparent conducting metal oxide such as Indium Tin Oxide can be used. Any combination of the various techniques to reduce dark current can be used.

B. S. Pearson et al, Germanium Photodetectors on Amorphous Substrates for Electronic-Photonic Integration, IEEE 2016 978-1-5090-1903-8/16, incorporated by reference herein and referred to herein as "Pearson et al.", discusses Al oxide used at the interface between Al electrodes and Ge to reduce dark current.

T. Nishimura et al, A significant Shift of Schottky Barrier Heights at Strongly Pinned Metal/Germanium Interface by Inserting an Ultra-Thin Insulating Film, Applied Physics Express, Vol. 1 2008, incorporated by reference herein and referred to herein as "Nishimura et al.", discusses Ge oxide used to reduce dark/leakage current.

Passivation has not been shown and in some cases amorphous Si and/or other dielectrics can be used to reduce dark current. J. Kang, Suppression of dark current in GeOx—passivated germanium metal-semiconductor-metal photodetector by plasma post-oxidation, Optics Express, Vol. 23, No. 13, 29 Jun. 2015, incorporated by reference herein, discusses surface passivation that can be effective in reducing dark or leakage current.

Selective area growth has been shown by many research groups. Other methods of growing crystalline Ge and/or poly crystalline Ge for photodetector purposes can use deposition of amorphous Ge followed by a rapid thermal anneal, and in some cases by using laser annealing. See e.g., Assefa et al. 2010 and Assefa et al. 2012. In addition, the Ge on Si or GeSi on Si photodetectors can be integrated with CMOS/I BiCMOS ASICs. See e.g., Y. Urino et al, Demonstration of 12.5-Gbps optical interconnects integrated with lasers, optical splitters, optical modulators and photodetectors on a single silicon substrate, Optics Express, Vol. 20, No. 26, 10 Dec. 2012, incorporated herein by reference, and Xiao et al.

In some cases, wafer bonding can be used to fabricate Ge on Si photodetectors. See e.g., Chen et al.

J. Liu et al, Tensile strained Ge p-i-n photodetectors on Si platform for C and L band telecommunications, Applied Physics Letters, 87, 01110, 2005, incorporated herein by reference and referred to herein as "Liu et al. 2005-1", discusses N poly silicon deposited on Ge on Si photodiode to form a NIP structure, and low leakage/dark characteristics.

Figure 64A:
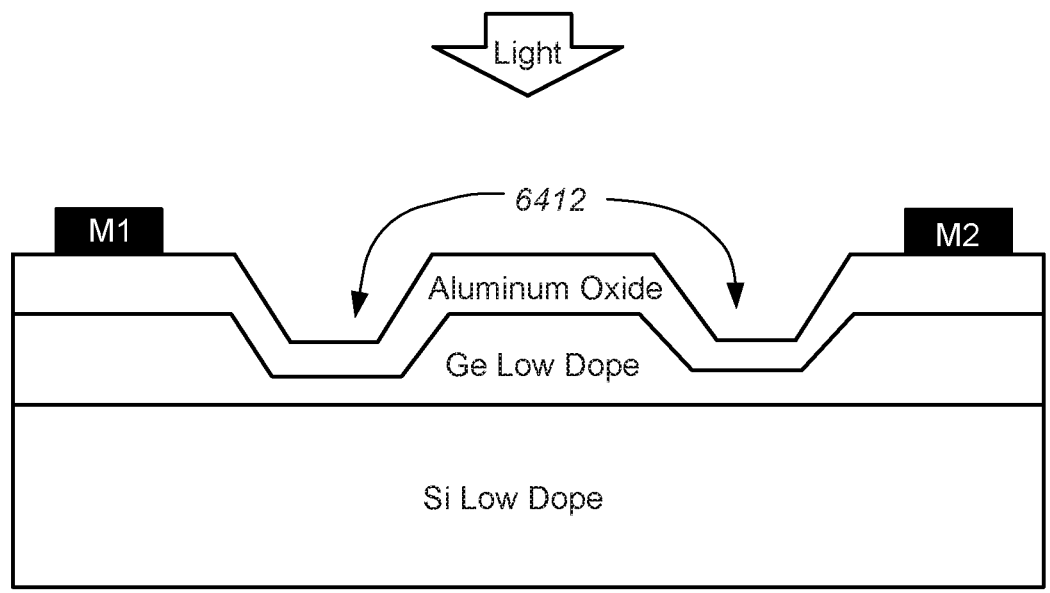
FIG. 64A shows back-to-back metal oxide semiconductor contacts, and can be operated in either positive voltage bias, or negative voltage bias.
Figure 64B:
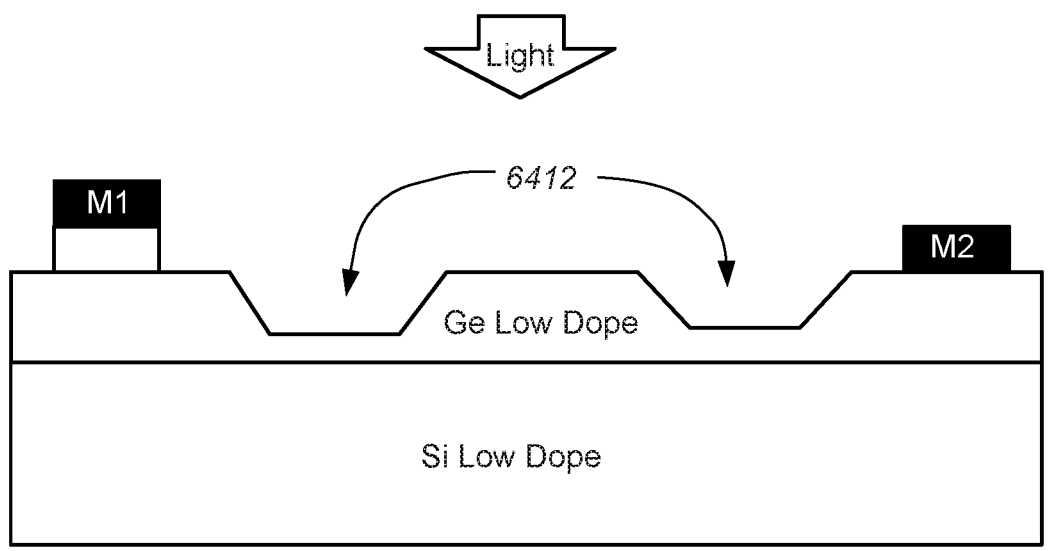
FIG. 64B shows a partial cross-section of a microstructure hole Ge on Si inter-digitated MSM photodetector that is asymmetric.

FIGS. 64A and 64B are partial cross-sections of a microstructure hole Ge on Si inter-digitated MSM photodetector that is symmetric and asymmetric, according to some embodiments. FIG. 64A shows metal electrodes on thin metal oxide such as Al oxide, Ti oxide, Hf oxide, Si oxide to name a few with oxide thickness ranging from 1 nanometer to 10 nanometers. FIG. 64A shows a symmetric MSM, and FIG. 64B shows an asymmetric MSM where one of the electrodes, M1, is sitting on oxide, and the other electrode, M2, is on the Ge. See e.g., Zang et al. 2016; Pearson et al; Dushaq et al; Nishimura; Liu et al. 2005; and Liu et al. 2005-1. As mentioned earlier materials other than oxide can be used such as poly silicon, amorphous silicon, GeSi, and/or any combination thereof. In some cases, at least one of the layers can be GeSi with Ge fraction ranging from greater than 0 to 1, where 1 is all Ge. In some cases, P and N dopant can be used in conjunction with the crystalline, poly crystalline, or amorphous semiconductors. A BOX layer can be optional.

FIG. 64A shows back-to-back metal oxide semiconductor contacts, and can be operated in either positive voltage bias, or negative voltage bias. FIG. 64B shows a metal oxide semiconductor contact for M1 and the M2 contact can be a leaky Schottky contact, and in some cases M2 can be an ohmic contact in which case the operation of the inter-digitated microstructure hole photodetector has the best performance with a reverse bias applied to M1. Alternatively, a negative voltage can be applied to M1 in respect to M2. The bias voltage can range from −1 to −10 volts and in some cases from −1 to −3.3 volts. Methods to reduce leakage or dark current as mentioned for FIG. 63 can be applied to all vertical and lateral photodetector structures where at least one of the layers is GeSi with the Ge fraction ranging from 0 to 1, and in some cases with the Ge fraction ranging from greater than 0 to 1.

FIGS. 65A-65C are partial top view diagrams of inter-digitated microstructure hole photodetectors where the holes are connected to the inter-digitated electrodes, according to some embodiments. In some cases to achieve Gb/s or higher data rates the spacing of the inter-digitated electrodes can be less than 1 micron. See, e.g. Liu et al. 1994.

For microstructure hole inter-digitated MSM photodetectors, the holes can be larger than the spacing of the inter-digitated electrodes to achieve data rates greater than or equal to 25 Gb/s at certain wavelengths. For example, at 1350 nm wavelength the lateral dimension of the microstructure hole can range from 1000 nm to 2000 nm, and the spacing between the inter-digitated electrodes can be less than or equal to 1.5 microns, and in some cases less than 1 micron. The width of the inter-digitated electrodes can range from 20 nm to 300 nm. To overcome the situation where the microstructure holes are larger than the spacing of the inter-digitated electrodes, the microstructure hole itself can form part of the inter-digitated electrodes.

FIG. 65A shows square microstructure holes 6512 that can be inverted pyramids for example, and the inter-digitated electrodes M1, M2 and M3 are diagonal to the holes. Note that in FIGS. 65A-65C there are references to "M3" but it is understood that in many cases where there are two polarities of inter-digitated electrodes the references to M3 can be associated with M1. In some cases, the inter-digitated electrodes can circumvent the holes as shown. The microstructure hole edge to edge spacing can be less than 1 micron and, in some cases, less than 0.5 microns, and in some cases 0.3 microns or less. FIG. 65A shows the inter-digitated electrodes M1, M2 and M3 connecting the square microstructure holes 6512 at mid point, and in some cases can circumvent the microstructure holes. FIG. 65B shows circular holes, or almost circular microstructure holes 6514, that can be cylindrical or trapezoidal in cross-section, in a hexagonal lattice where the inter-digitated electrodes M1, M2 and M3 connect the holes, and in some cases can circumvent the holes as shown. The spacing of the microstructure holes 6514 can range from 100 nm to 1000 nm. The hole dimensions for either the square or circular holes can range from 300 nm to 2000 nm, and in some cases from 600 nm to 1700 nm.

In some cases, the microstructure holes can be periodic and in some cases aperiodic, and in some cases random. The microstructure hole lateral dimension can be uniform, and in some cases not uniform. The shape of the microstructure holes can be polygonal, oval, circular, amoebic and/or any combination of shapes and sizes.

Microstructure holes can be an integral part of the inter-digitated electrodes where the surfaces of the holes can have metal oxide semiconductor (MOS), metal semiconductor (Schottky), poly Si, amorphous Si (a-Si) with and without hydrogen, p doping, n doping to form pn, pp, nn junctions, ohmic contacts. In some cases SAG of GeSi or Ge can be grown on the surfaces of the microstructure holes The top surface of the Ge, GeSi, Si can be coated with metal oxide such as Al oxide, Hf oxide, Ti oxide to name a few and in some cases Si oxide. Other dielectrics or a-Si:H may be deposited in some cases. Metal inter-digitated electrodes can be deposited on the dielectric to reduce leakage or dark current.

Metal, transparent conducting metal oxide, TiN, metal silicide, singly or in any combination, can be used as contacting electrodes in the holes and with the connecting electrodes to connect adjacent microstructure holes together which form M1, M2 and M3. These are only some of the examples of junctions and electrodes; other combinations of metal, metal oxides, metal nitrides, amorphous semiconductors, poly crystalline semiconductors, crystalline semiconductors can be used to form MOS metal semiconductor, PN junctions, ohmic contacts, dopant segregation can be utilized.

Figure 65D:
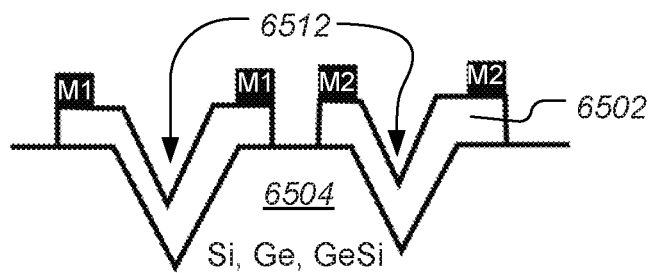
FIGS. 65D-65G are partial simple cross-section of examples of microstructure holes shown in FIGS. 65A-65C.
Figure 65E:
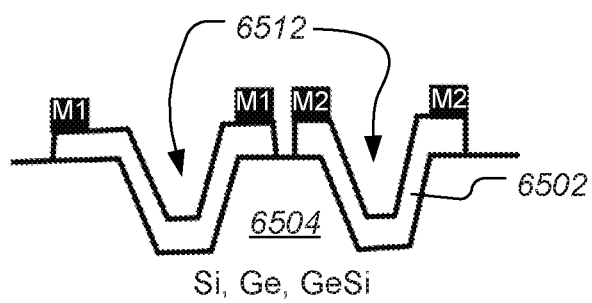
Figure 65F:
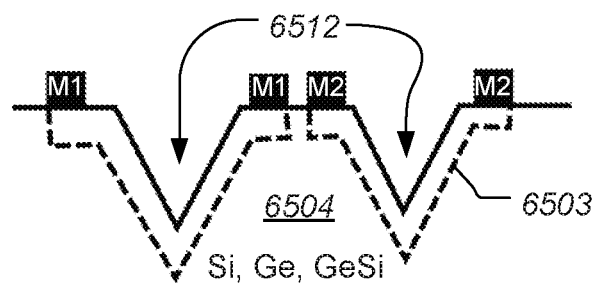
Figure 65G:
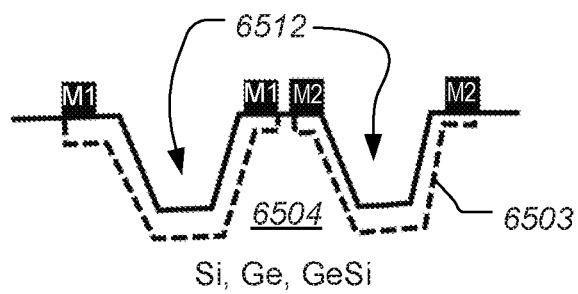

FIGS. 65D-65G are partial simple cross-section of examples of microstructure holes shown in FIGS. 65A-65C. As shown in FIGS. 65D and 65E, the holes 6512 can fully or partially covered with a layer 6502 of thin metal, transparent conducting metal oxide, amorphous Si, poly Si, that can be P or N doped, or undoped, metal oxide, and/or any combination thereof. In addition, as shown in FIGS. 65F and 65G the holes 6512 can be doped with N and/or P dopant ions, shown by dashed line 6503, to form PP, NN or PN junctions, and in some cases additional layers of poly Si and/or amorphous Si can be deposited in the holes fully or partially, and in some cases metal or transparent conducting metal oxides can also be used. The inter-digitated electrodes M1 and M2 can circumvent the holes 6512 so the holes are electrically connected as shown in FIGS. 65A-65C for example. In some cases, the inter-digitated electrodes can form Schottky contacts, or metal-oxide-semiconductor contacts, and in some cases P or N junctions, and in some cases a combination thereof. In the case of GeSi where Ge fraction can vary from greater than 0 to 1, the control of leakage or dark current is important and higher bandgap material such as poly Si, or amorphous Si or metal oxide can be used.

With the holes forming a part of the inter-digitated electrodes the application of a reverse bias can generate electric fields between adjacent holes that are connected to the opposite polarity electrodes. In some cases, a reverse bias of −0.5 to −10 volts or more can be applied between M1 and M2, and in some cases a voltage reverse bias ranging from 0 to −3.3 volts or more can be applied. In the case of symmetric and/or almost symmetric IV characteristics the MSM photodetector can operate in either forward or reverse bias. The layer thickness of metal, transparent conducting metal oxide, metal oxide, poly Si, amorphous Si and any combination there of can range from 1 nm or less to 100 nm or more. And in some cases, from 1 nm to 100 nm. The dopant can diffuse 1 to 100 nm or more with dopant concentration ranging from $1 \times 10^{17}$ per cm$^3$ to $5 \times 10^{19}$ per cm$^3$ or more. A thermal anneal may be used to activate the dopants.

Figure 66:
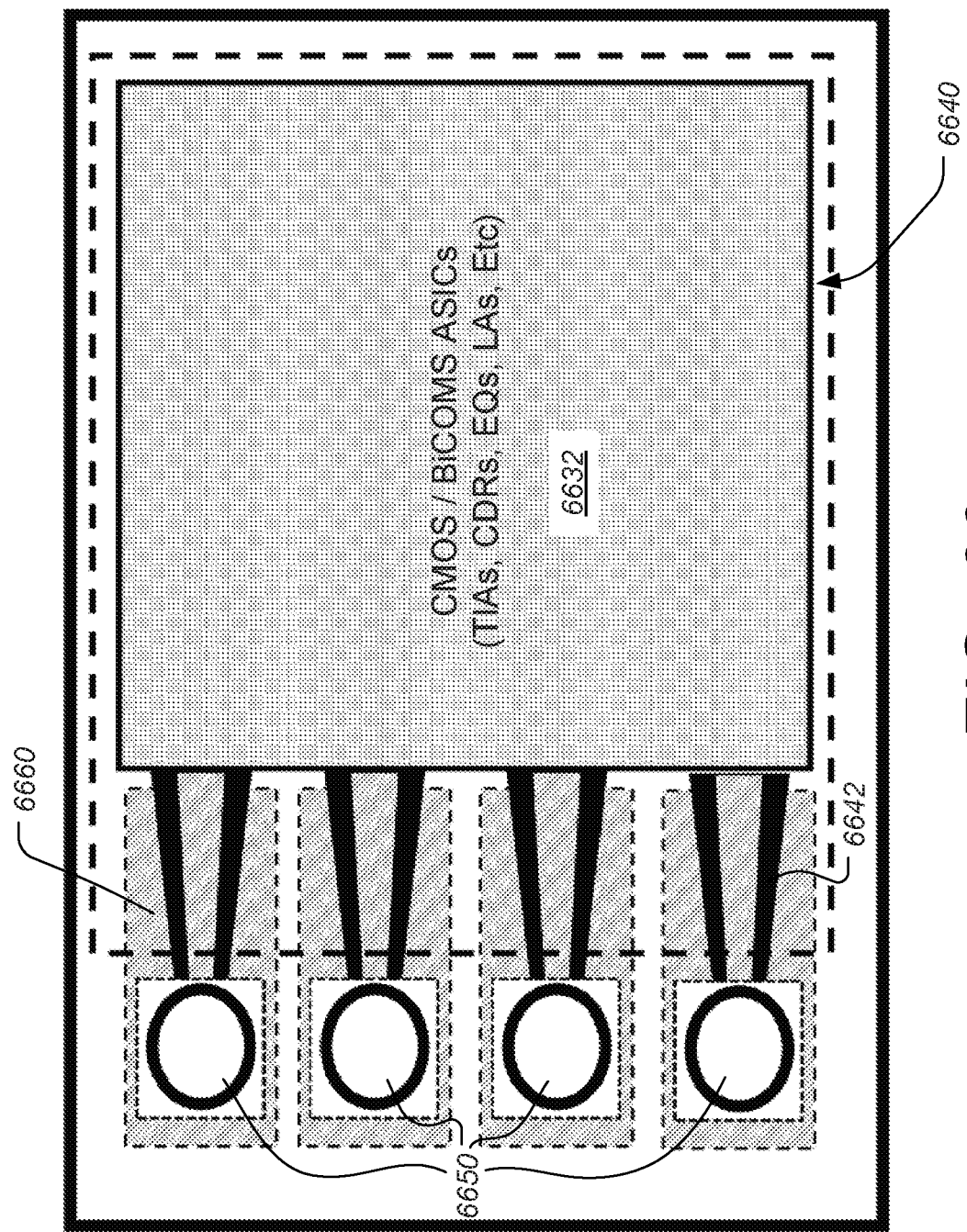
FIG. 66 is simple top view of a monolithically integrated quad Si/GeSi/Ge vertical PIN or lateral MSM photodetectors integrated with CMOS, BiCMOS ASICs on a single chip that can include solder bump technology.

FIG. 66 is simple top view of a monolithically integrated quad Si/GeSi/Ge vertical PIN or lateral MSM integrated with CMOS, BiCMOS ASICs on a single chip that can include solder bump technology. The quad photodetectors 6650 are surface illuminated, and in some cases the quad photodetectors can be illuminated from the back side or the substrate side. Electrical isolation 6660 is provided such as using ion implantation of H, He, O, N, and/or other ions in regions surrounding the photodetector. In some cases, a trench can be used for electrical isolation 6660 such as a moat around each photodetector 6650. In some cases, a trench or implant can be used to separate the photodetectors from the CMOS, BiCMOS ASICs 6632. A light and RF shield 6640, outlined by the dashed line, can be used to cover the CMOS, BiCMOS ASICs 6632 and partially cover the transmission lines 6642 of the photodetectors to minimize cross-talk and/or interference. ASICs 6632 can comprise one or more active electronic circuits coupled with one or more of photodetectors 6650 to process electrical output thereof and to transmit processed signal from the chip. The individual active electronic circuits can be in any suitable configuration such as in a linear array, in a 2D array, of in a vertical arrangement such as a 3D array.

Figure 67:
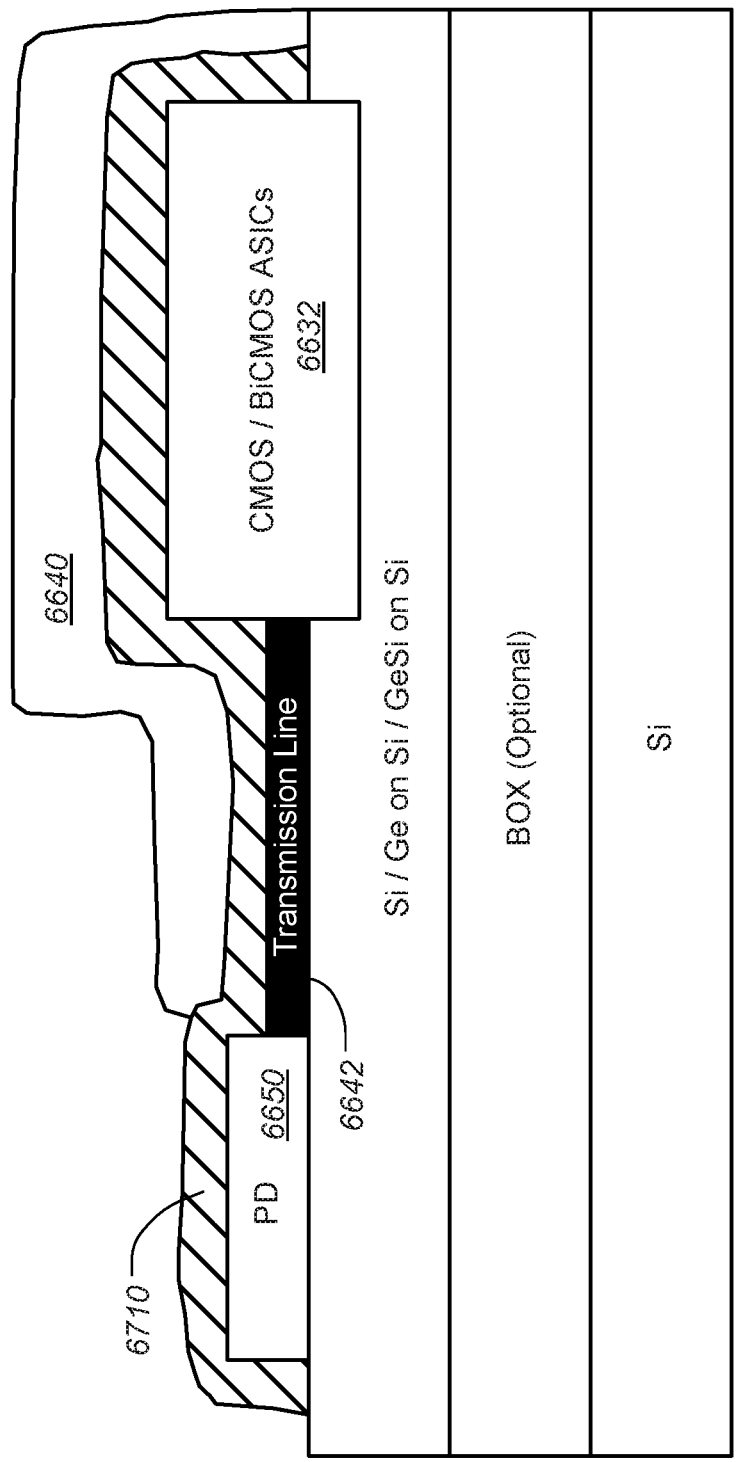
FIG. 67 is simple partial cross-section of the structure shown in FIG. 66, according to some embodiments.

FIG. 67 is simple partial cross-section of the structure shown in FIG. 66, according to some embodiments. A buffer layer 6710 such as a hermetic sealer can seal the entire surface of the monolithically integrated quad photodetector and CMOS, BiCMOS ASICs chip. The buffer layer 6710 can be polymer and/or Si dioxide and/or Si Nitride, and/or other dielectrics. Optical/RF shield 6640 can be deposited on the transmission line 6642 fully or partially and cover the CMOS, BiCMOS ASICs 6632 fully or partially. The optical/RF shield 6640 can consist of nano particles of Si, Ge, metal, metal wires where light can be absorbed by the nano or micro particles of Si and/or Ge and the RF field can be absorbed by metal nano/micro particles or nano/micro wires. In some cases, dye can be used to absorb light. Micro/nano structures such as nanograss can also be formed on the light/RF shield to reduce reflection.

FIGS. 68A-68J are cross-sections illustrating some basic processing steps for fabricating a Ge on Si microstructure hole photodiode on a SOI wafer, according to some embodiments. Only some of the basic steps are shown and steps such as passivation, anti-reflection, surface treatment, additional dielectric layers that may be used in a complete CMOS/BiCMOS process are not included. Also not shown are the CMOS/BiCMOS ASICs that are fabricated on the same chip as the photodetectors. In some cases, the fabrication steps of the photodetector can be interwoven with the processing steps of those of the CMOS I BiCMOS ASICs. Also not shown are electrical isolation trenches or electrical ion implantation or light shields and/or hermetic sealing of the entire chip and/or in some cases part of the chip. In addition, solder bump technologies for attaching the chips to printed circuit boards are not shown, and other features for completing the monolithic integration of the photodetector with CMOS/BiCMOS ASICs, and attachment to the printed circuit boards are not shown. Optical signals can impinge from the front (top) surface and in some cases can impinge on the back (bottom) surface using flip chip technologies. In some cases, some of the process steps can be front end of the line (FEOL), and in some cases some of the process steps can be intermediate steps, and in some cases some of the process steps can be back of the line (BEOL) process for CMOS/BiCMOS ASICs.

FIG. 68A shows the basic starting material, in this case P-type device layer on BOX on Si. The device layer P type (or N type) can have a resistivity ranging from 1 to 40 ohm-cm or more, and the device layer can have thickness range from 0.2-2 um or more, and in some cases from 0.3-1 um approximately.

FIG. 68B shows the implantation Boron into the device layer which can be single or multiple energy/dose to achieve resistivity of less than or equal 0.1 ohm-cm and in some cases less than or equal 0.01 ohm-cm. In some cases, the Boron ion implantation can be selective area implant. The depth of the ion implant can range from 50 nm-300 nm or more.

FIG. 68C shows the deposition of a dielectric layer for selective area growth of Ge and in some cases GeSi, and in some cases a combination of Ge and GeSi layers. The dielectric can be thermally grown Si oxide, and in some cases can be other oxides, such as Al oxide, and/or Si nitride. The oxide is patterned only in areas where Ge/GeSi is desired, and in addition the microstructure holes can be formed by the deposition of oxide islands that can be of any shape, and in some cases can be circular or oval, and in some cases square or polygonal, or any combination of shapes. The oxide thickness can range from a few nm, for example 1 nm, to 1000 nm or more, and in some cases 100 nm-300 nm. For the Ge I GeSi photodetector the diameter of the Ge/GeSi window can range from 5 um to 100 um or more, and in some cases 10 um to 80 um, and in some cases from 10 um to 1000 um or more for a circular geometry, and in some cases the photo sensitive window of Ge/GeSi can be a square, rectangle, polygonal with lateral dimensions ranging from 5 um to 1000 um or more. The dielectric islands 6810 that will form the microstructure holes in the Ge/GeSi can have lateral dimensions ranging from 300 nm-2500 nm, and in some cases 500 nm-2000 nm, and in some cases 1000 nm-3000 nm. The spacing between the dielectric islands can range from 100 nm-1000 nm, and in some cases from 300 nm-1500 nm, and in some cases from 200 nm-1000 nm, and in some cases more than 3000 nm.

FIG. 68D shows the Ge/GeSi selective area growth in areas not covered by the dielectric. The Ge/GeSi can have a thickness ranging from 100 nm-2000 nm or more, and in some cases from 300 nm-1000 nm, and in some cases from 100 nm-1000 nm. The Ge/GeSi are grown without any intentional doping and can be intrinsic and/or low dope P or N type. Not shown are various techniques for growing the Ge/GeSi such as the inclusion of a low temperature buffer followed by higher temperature growth, and in some cases the Ge/GeSi can be entirely grown at a low temperature such as 450 degrees Celsius or lower, and in some cases the Ge/GeSi can be crystalline and/or poly crystalline and/or amorphous, and in some cases a high temperature anneal may be used that can include a rapid thermal anneal or laser annealing. In some cases, amorphous Si or Ge can be deposited prior to the growth of Ge/GeSi epitaxial layers. Also not shown are epitaxial lateral overgrowth of Ge/GeSi over the dielectric layers.

FIG. 68E shows selective area ion implantation of Phosphorous or Arsenic into region 6802 the Ge/GeSi layer with single or multiple energy/dose to achieve a resistivity of less than or equal 0.1 ohm-cm and in some cases less than or equal to 0.01 ohm-cm. The implanted depth can range from 10 nm-300 nm, and in some cases from 10 nm-500 nm. In some cases, N+ polysilicon can be deposited on the Ge I GeSi instead of using ion implantation to create the N layer or region.

In FIG. 68F shows a rapid thermal anneal process performed to activate ion implanted regions 6802, and in some cases to improve the crystal quality of the Ge/GeSi, for example from amorphous to polycrystalline or crystalline.

FIG. 68G shows the formation of ohmic contacts to the N region and the P region. The P ohmic contact can be on the Si device layer which can be implanted with boron. The N contact can be on the Ge/GeSi N implanted region, and in some cases the N contact can be on the N+ polysilicon layer on the Ge/GeSi layer. These contacts form ohmic contacts and can include metal such as Al, Ni, Ti, Pt, Cu, NiGe, Cr, amorphous Ge to name a few and any combination thereof. In some cases, a thermal annealing process may be used to create ohmic contacts.

FIG. 68H shows a mesa etch, and in some cases a trench etch, such as a moat trench etch to the BOX layer, and in some cases a mesa etch may be omitted if a dielectric layer is formed on the P device layer. If mesa etch is not used a process similar to FIG. 69G, discussed infra, can be used with or without a moat trench isolation.

Figure 68I:
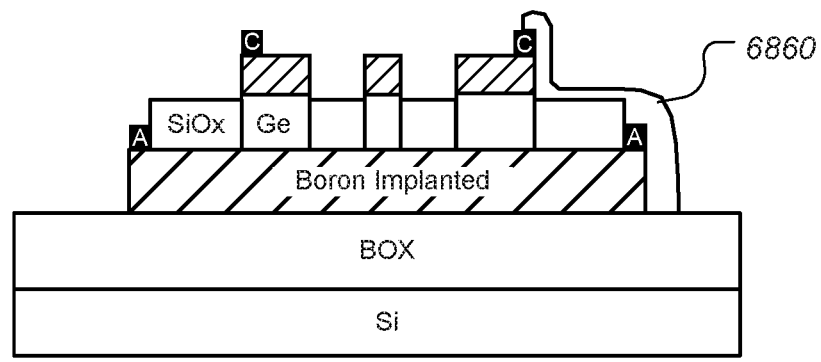

FIG. 68I shows an isolation dielectric protecting layer 6860 partially covering the Ge/GeSi layer and the P device layer. In some cases, without a mesa etch this dielectric isolation layer can cover partially the Ge/GeSi and the P device layer on both the cathode and the anode.

Figure 68J:
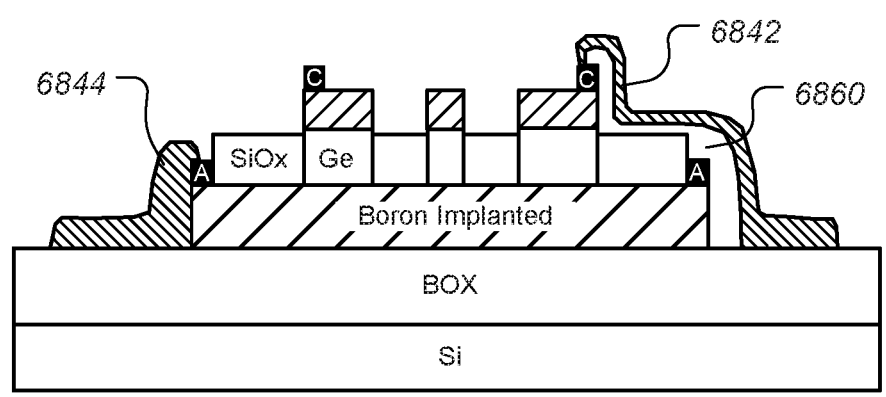

FIG. 68J shows the formation of transmission line electrodes 6842 and 6844 connecting the cathode and the anode of the photodetector, respectively, to the CMOS/BiCMOS ASICs (not shown). The transmission line electrode metal can be Al, Cu, W, Mo, Ni, Ti, Au, Pt, Sn or any combination of metals and silicide and metal silicide. It should be noted that the N and the P can be interchanged.

FIG. 69A to 69H are cross-sections illustrating some basic steps for fabricating a Ge/GeSi on Si microstructure hole PIN photodiode on P Si substrate that can be monolithically integrated with CMOS/BiCMOS ASICs. The processing steps are similar to those illustrated by FIGS. 68A-68J but the use of SOI wafers, and the mesa etch has been omitted.

FIG. 69A shows a P Si wafer (or N Si wafer) with resistivity ranging from 0.1 ohm-cm or less to 1 ohm-cm or more. For high resistivity P substrate selective area P ion implantation may be used to decrease the resistivity to 0.1 ohm-cm or less over a thickness of 100 nm-500 nm range. A rapid thermal anneal may be used to activate the ion implanted region.

FIG. 69B shows the formation of dielectric on the surface of the Si, including dielectric islands 6910 for selective area growth of Ge/GeSi as discussed for FIG. 68C.

FIG. 69C shows a Ge/GeSi growth as discussed for FIG. 68D.

FIG. 69D shows ion implantation of phosphorous or As ions, single or multiple energy/dose into the Ge/GeSi layer in in implant region 6902 as discussed for FIG. 68E. In some cases, N+ polysilicon can be grown or deposited on the Ge/GeSi layer to form the N region or layer.

Figure 69E:
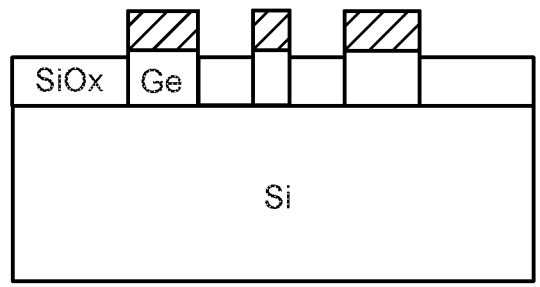

In FIG. 69E shows a rapid thermal anneal performed to activate ion implanted regions and/or to improve the crystalline quality of the Ge/GeSi.

Figure 69F:
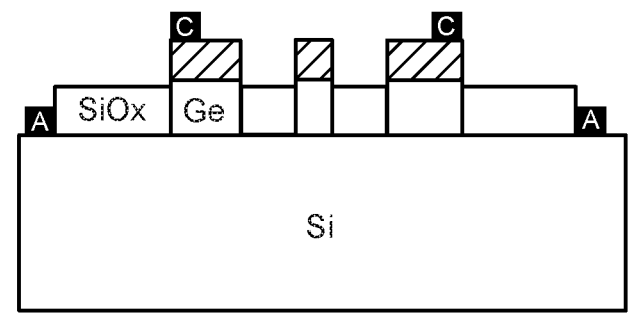

FIG. 69F shows forming a cathode and anode on the photodetector as in FIG. 68G.

Figure 69G:
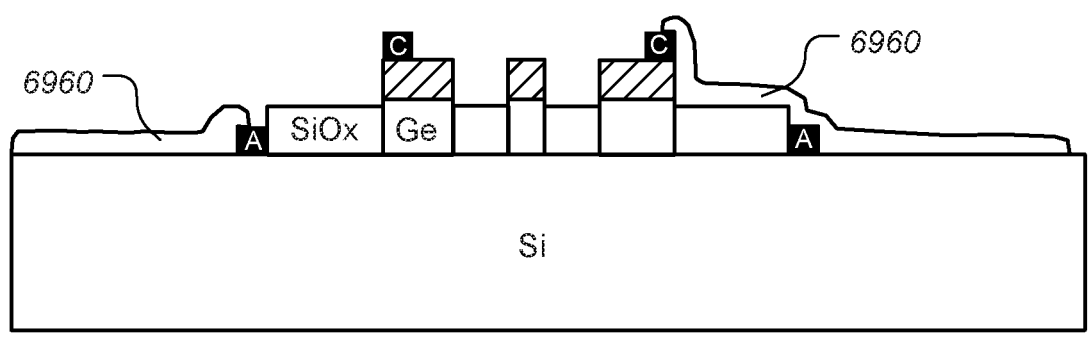

FIG. 69G shows the deposition of dielectric layer 6960 to protect the edge of the Ge/GeSi and the surface of the P substrate. In addition, the dielectric 6960 partially protects the anode such that the transmission electrode connecting the cathode does not short the anode or the Ge/GeSi intrinsic or low dope layer. The dielectric layer 6960 on the surface of the P layer also reduces the transmission electrode capacitance. The thickness of the dielectric layer can range from 100 nm-3000 nm or more. The dielectric layer can be Si oxide, Si nitride, spin on glass, polyimide, or other polymers. In some cases, it can be a combination thereof. This step can replace the mesa etch step shown in FIG. 68H. In some cases a moat trench can be used for electrical isolation and this step may be used to protect the P (or N) semiconductor surface of the substrate or the device layer.

Figure 69H:
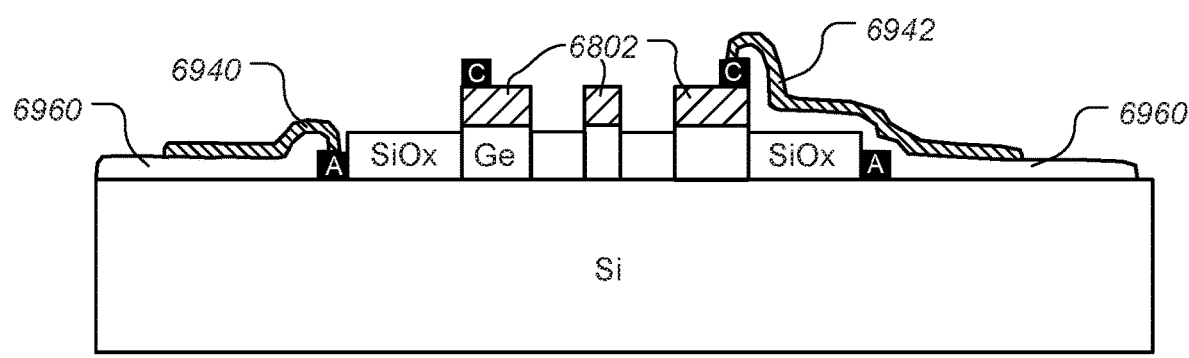

FIG. 69H shows the formation of electrode transmission lines 6942 and 6940 connecting the cathode and anode, respectively, of the photodetector to the CMOS/BiCMOS ASICs (not shown). The transmission electrode can be composed of metal or a combination of metal or silicide or metal silicide of Al, Ni, Cr, W, Mo, Ti, Cu, Pt, Au, and/or V.

FIGS. 70A to 70H are cross-section views illustrating certain variations in vertical microstructure hole PIN photodiode with Ge/GeSi absorption layer, according to some embodiments. Any combination of the shown variations can be used in a Ge/GeSi on Si microstructure hole PIN photodiode fabrication that can be monolithically integrated with CMOS BiCMOS ASICs on a single chip. Arrays of the microstructure hole Ge/GeSi photodiodes can be fabricated together with CMOS BiCMOS electronics on a single silicon chip.

Figure 70A:
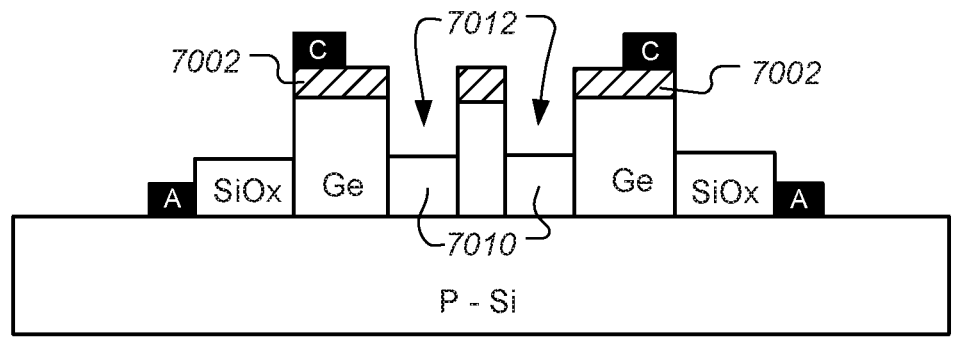
FIGS. 70A to 70H are cross-section views illustrating certain variations in vertical microstructure hole PIN photodiode with a Ge/GeSi absorption layer, according to some embodiments.

FIG. 70A shows selective area grown Ge/GeSi on P Si substrate and I or on a P device layer on a SOI substrate where the microstructure holes 7012 are formed by selective area growth around dielectric islands 7010. N+ poly Si layer 7002 is deposited on the surface of the selective area grown Ge I GeSi to provide the N contact. Ohmic contacts can be formed on the N+ Poly Si which can be the cathode, and ohmic contacts can be formed on the P Si which can be the anode contact. Reverse bias is applied between the cathode and anode. The Ge/GeSi is not intentionally doped and can be intrinsic and/or low dope. In all cases the N and the P can be interchanged.

Figure 70B:
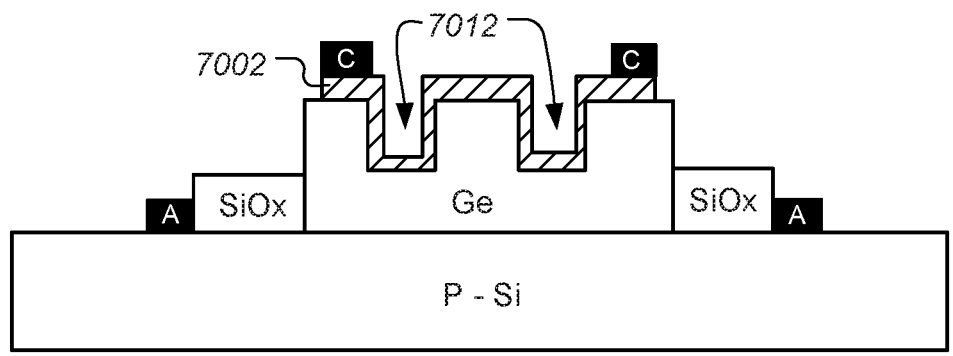

FIG. 70B shows a selective area grown Ge/GeSi on P Si with etched microstructure holes 7012 and where the N+ poly Si 7002 is both on the surface of the selective area grown Ge/GeSi and on the side walls and bottom of the microstructure etched holes 7012.

Figure 70C:
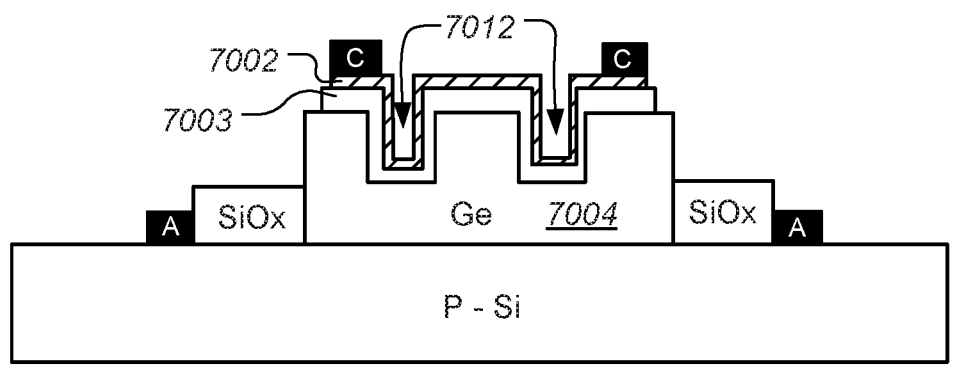

FIG. 70C shows selective area grown Ge/GeSi 7004 with etched microstructure holes 7012 and where an additional regrowth of Ge/GeSi 7003 is grown on the selective area grown Ge/GeSi 7004 and inside the microstructure holes 7012. N+ poly Si layer 7002 is formed on the regrown Ge/GeSi 7003 and also extends into the microstructure holes covering the side walls and the bottom. Cathode metallization can be formed on the N+ poly Si and anode metallization can be formed on the P Si.

Figure 70D:
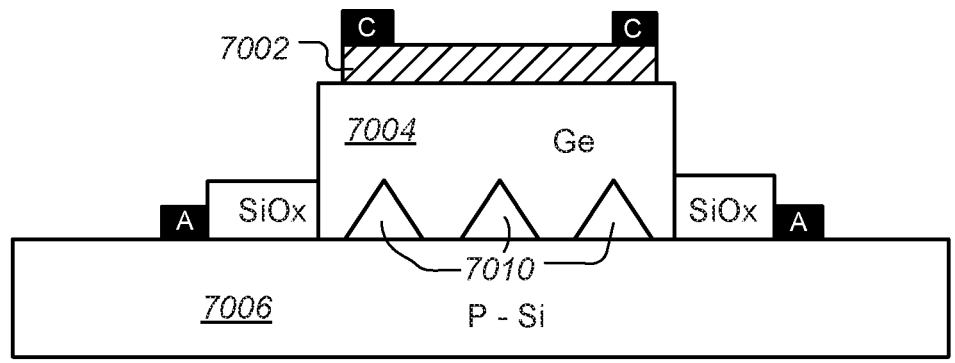

FIG. 70D shows microstructure protrusions 7010 etched into the P Si 7006 such as pyramids. The protrusions 7010 can have lateral dimensions ranging from 100 nm to 2500 nm and can have a height ranging from 50 nm to 2000 nm, and in some cases from 300 nm to 1000 nm. Ge/GeSi 7004 is grown using selective area growth on top of the protrusions. N+ poly Si 7002 can be deposited on the surface of the selective area grown Ge/GeSi. Cathode metallization can be formed on the N+ metallization, and the anode metallization can be formed on the P Si. Light can impinge from the front (top) surface (N+ poly si) or in some cases can impinge from the bottom surface of the Si substrate.

Figure 70E:
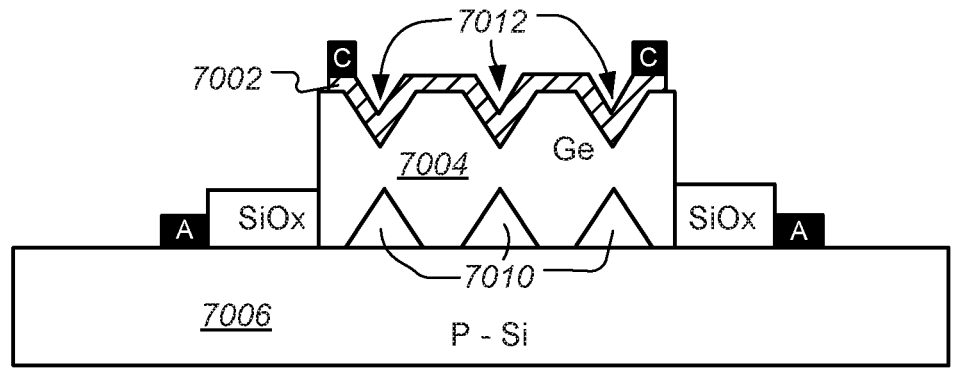

FIG. 70E shows Ge/GeSi grown over the Si protrusions 7010 and surface irregularities 7012 such as dips that can resemble holes in areas where there are protrusions 7010. N+ poly Si 7002 can be formed on the surface of the Ge/GeSi 7004 which are grown using selective area techniques. Cathodes and anodes are formed on the N+ poly Si 7002 and the P Si 7006 respectively. In some cases the Ge/GeSi 7004 can be grown not using selective area growth methods and mesas can be etched.

Figure 70F:
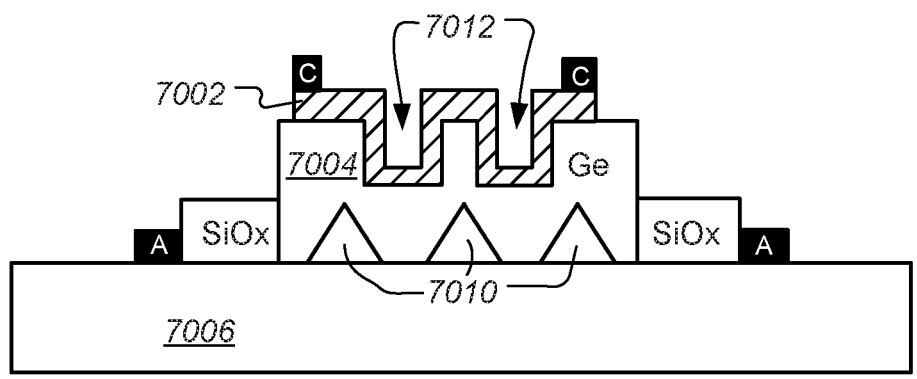

FIG. 70F shows selective area grown Ge/GeSi 7004 on Si protrusions 7010, and in addition microstructure holes 7012 are etched in the Ge/GeSi and N+ poly Si 7002 can be formed on the surface, and in some cases within the holes 7012. Cathode and anode metallization are formed on the N+ and P Si surfaces.

Figure 70G:
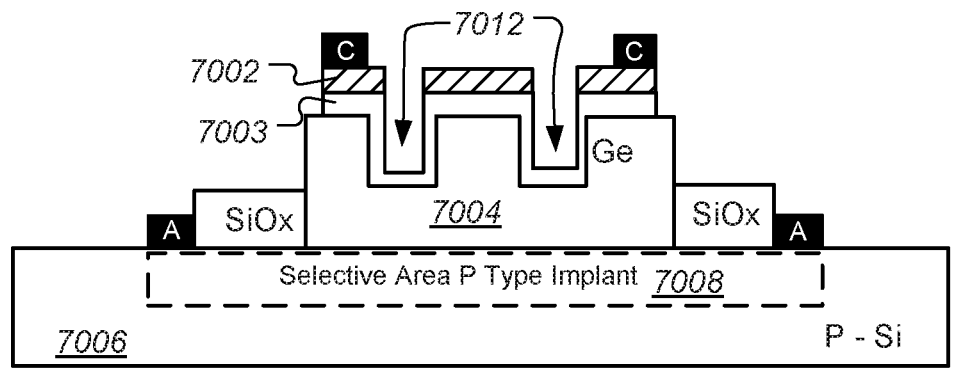

FIG. 70G shows selective area grown Ge/GeSi 7004 with microstructure holes 7012 etched followed by a regrowth of Ge/GeSi 7003 on the surface and within the microstructure holes 7012 of the Ge/GeSi 7004. N+ poly Si 7002 is formed on the surface of the regrowth Ge/GeSi 7003. A selective area ion implantation 7008 of Boron can be implanted into the P Si 7006 prior to the selective area growth of Ge/GeSi. A thermal anneal to activate the implanted regions may be used. The implanted P type region 7008 can have a resistivity of less than or equal to 0.1 ohm-cm. Cathodes are formed on the N+ poly Si and anodes are formed on the P or P+ Si.

Figure 70H:
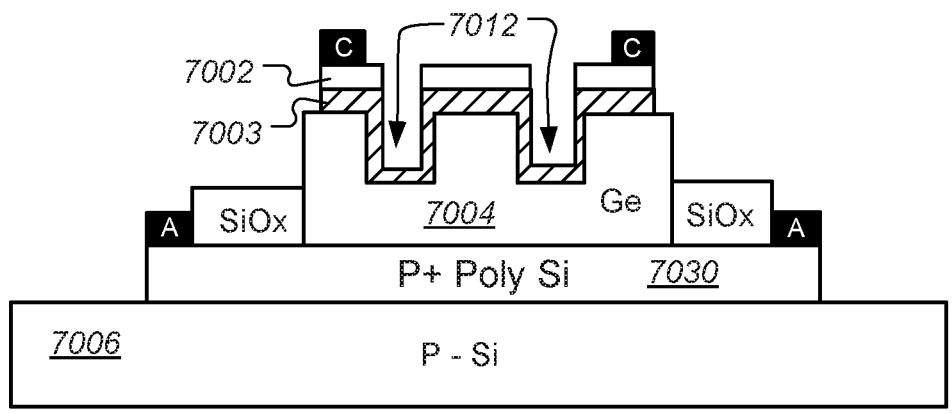

FIG. 70H is similar to FIG. 70G except for the addition with a P+ poly Si layer 7030 on top of the P Si 7006 on which Ge/GeSi 7004 is selective area grown with etched microstructure holes 7012 followed by Ge I GeSi regrowth 7003 and capped with N+ poly Si 7002. Cathodes are formed on the N+ poly Si and anodes are formed P+ poly Si. The N+ poly Si can have thickness range from 100 nm-1000 nm or more and can have resistivity less than or equal to 0.1 ohm-cm, and in some cases 0.01 ohm-cm or less. The P+ poly Si can have thickness ranging from 50 nm-2000 nm or more and can have resistivity ranging from 0.1 ohm-cm or less and in some cases 0.01 ohm-cm or less. In some cases the P poly Si can be a P poly Ge and/or P poly GeSi. The P poly Ge/GeSi can have a thickness range of 10 nm-1000 nm or more and can have a resistivity of 0.1 ohm-cm or less and in some cases 0.01 ohm-cm or less.

In all cases the P and N type can be interchanged. And in some cases there can be multiple layers of Si/Ge/GeSi within each structure, that can be crystalline, poly crystalline, and/or amorphous. And, in addition, any combination of Si/Ge/GeSi layers and/or regions can be used.

FIGS. 71A to 71F are cross-sections illustrating some basic steps for fabricating a Ge/GeSi metal semiconductor metal (MSM) lateral photodiode that can be monolithically integrated with CMOS/BiCMOS ASICs.

FIG. 71A shows a starting material of P Si that can be substrate or a P Si device layer on SOI substrate with resistivity ranging from 1-40 ohm-cm or more.

FIG. 71B shows the deposition of oxide, such as Si dioxide which can be formed using thermal oxidation or by deposition such as atomic layer deposition. Other dielectrics such as Si nitride, Al oxide, Hafnium oxide, and/or Tantalum oxide can also be used. These dielectric layers are formed on the P Si 7106 for selective area growth of Ge/GeSi on Si. The Ge/GeSi will grow in areas which are not covered by the dielectrics. Microstructure holes can be formed by dielectric islands 7110. The diameter of the area in which the holes are formed for a circular photodiode can range from 5 um-100 um or more, and in some cases from 10 um-1000 um or more. The dielectric islands can have dimensions ranging from 100 nm-3000 nm and in some cases 500 nm-2500 nm. The dielectric islands 7110 can have spacing ranging form 100 nm-1000 nm or more, and the height of the dielectric can range from 10 nm-1000 nm or more.

FIG. 71C shows the selective area growth of Ge/GeSi 7104 in regions not covered by the dielectrics. In some cases, the Ge/GeSi can exhibit epitaxial overgrowth that can narrow the dimensions of microstructure hole 7112. The thickness of the Ge/GeSi selective area growth 7004 can range from 0.2 um-2 um or more, and in some cases from 0.3 um-1 um.

Figure 71D:
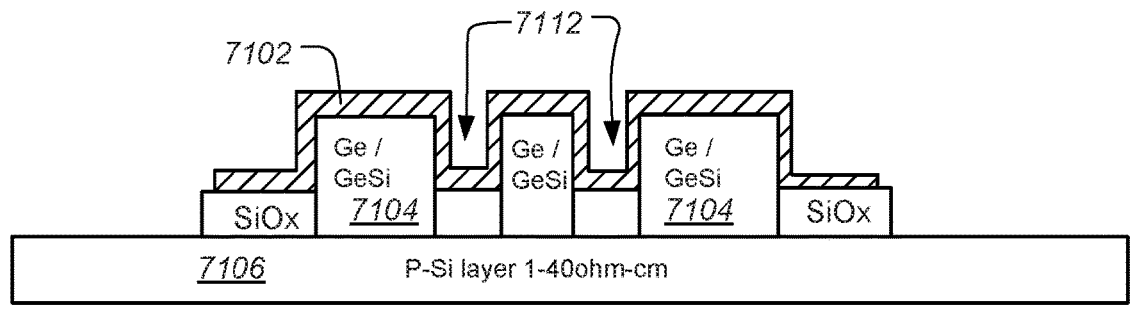

FIG. 71D shows Al oxide or Hf oxide or Ti oxide or Ta oxide 7102 formed using atomic layer deposition that covers the surface of the selective area grown Ge/GeSi 7104. Metal oxide 7102 can have a thickness ranging from 0.5 nm-10 nm or more, and in some cases 1 nm-5 nm, in some cases Si oxide can also be used.

Figure 71E:
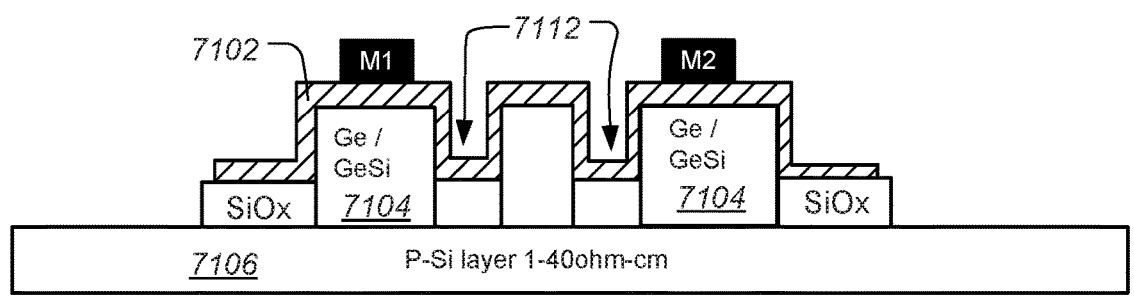

FIG. 71E shows the forming of the inter-digitated electrodes M1 and M2 for example on the metal oxide or Si oxide to from a MOS junction (metal-oxide-semiconductor). This junction can reduce the leakage/dark current of the Ge/GeSi MSM photodiode. In some cases, the M1 and M2 junction can be asymmetric as discussed in previous figures. M1 and M2 can comprise of Al, W, Mo, Ti, Ta, V, Pt, Cu, Ni, Cr, to name a few.

Figure 71F:
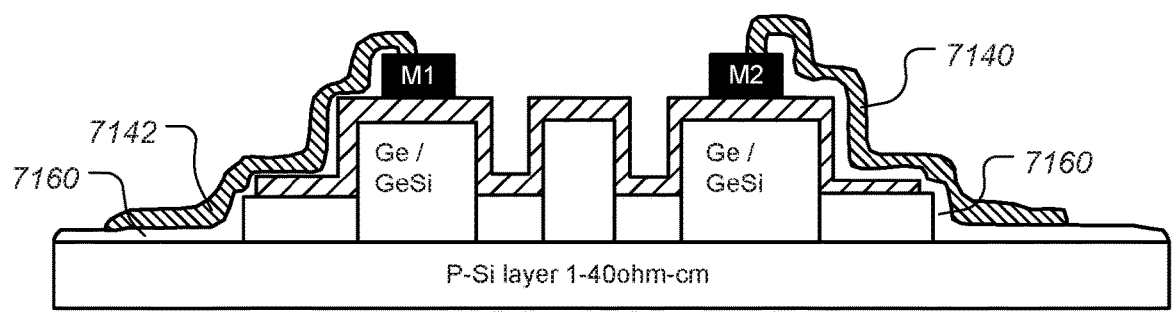

FIG. 71F shows the forming of the transmission electrodes 7140 and 7142 to M1 and M2, respectively, which can include polyimide isolation layer, and in some cases the electrical isolation layer 7160 can be a dielectric such as Si nitride, Si carbide, or Si oxide, or other dielectrics. In some cases, if the MSM photodetector is formed on a SOI substrate the P Si device layer can be etched to the BOX layer, and the electrodes are formed on the BOX layer with an electric isolation layer.

Other layers not shown are antireflection layers; dielectric nanostructures such as nanograss to reduce surface reflections are not shown. Also not shown are any light-shielding layers, other passivation layers, and in some cases in CMOS/BiCMOS process a thick oxide layer may be formed on the top surface of the MSM photodetector. In some cases, multiple layers of Si/Ge/GeSi can be used in the MSM microstructure hole photodetector.

FIG. 72A-72G are cross-sections and a plan view illustrating some variations in Ge/GeSi microstructure hole and/or protrusions MSM, according to some embodiments. Any combination of these variations can be used to fabricate Ge/GeSi microstructure hole/protrusions for monolithic integration with CMOS/BiCMOS ASICs on a single chip.

Figure 72A:
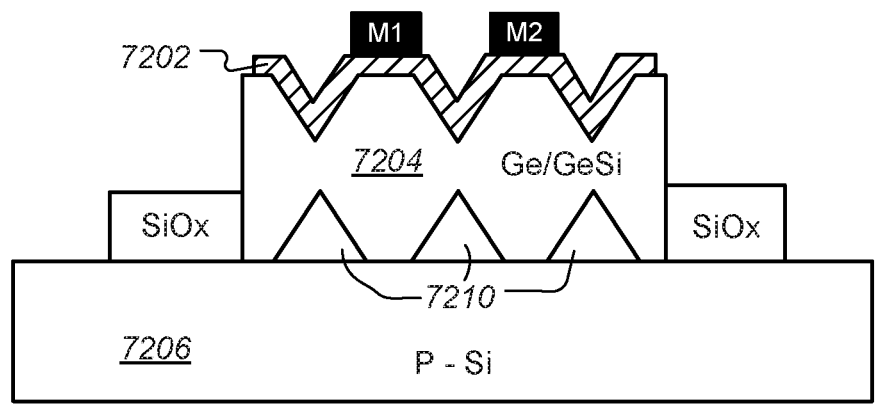

FIG. 72A shows Ge/GeSi selective area grown 7204 on Si protrusions 7210, for example Si pyramids. Ge/GeSi can exhibit depressions or dips in the surface resembling microstructure holes due to the growth of Ge/GeSi over the Si protrusions. A metal oxide layer 7202 such as Al oxide or Ti oxide or Hf oxide, and in some cases poly SI or amorphous Si can be used to reduce dark/leakage current. The extra layers are deposited on the surface of the Ge/GeSi. M1 and M2 inter-digitated electrodes can be formed in areas that do not have depressions or dips in the surface, and in some cases in areas that are between the Si protrusions. The Si pyramids or protrusions 7210 can have lateral dimensions 50 nm-1000 nm or more, and in some cases 500 nm-2500 nm, the spacing of the protrusions can range from 100 nm-1000 nm or more, and in some cases from 300 nm-1500 nm. The height of the Si protrusions can range from 50 nm-1000 nm or more, and in some cases from 100 nm-1000 nm. The protrusions can be wet etched or dry etched and can have any shape ranging from pyramids, trapezoids, rectangular, polygonal, cylindrical, or oval or any combination of shapes, and can be arrange in a periodic or aperiodic and or random manner. The thickness of the Ge can range from 300 nm-2000 nm or more, and in some cases from 300 nm-1000 nm.

Figure 72B:
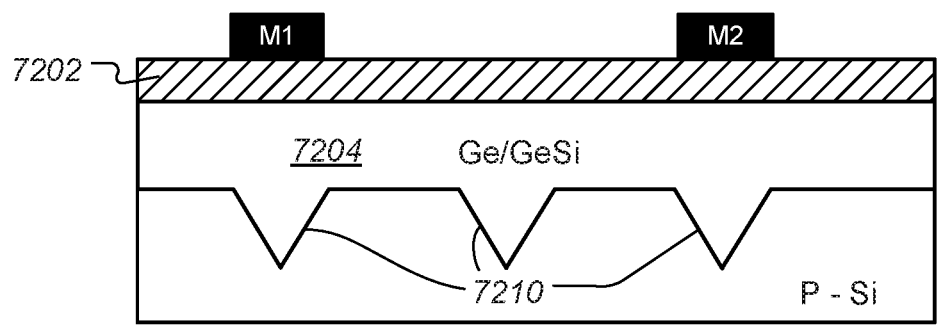

FIG. 72B shows selective area grown Ge I GeSi 7204 on Si with inverted pyramids 7210 and in some cases can be inverted trapezoids, and/or other shapes. Metal oxide layer 7202 such as Al oxide Hf oxide Ta oxide to name a few, and in some cases Si oxide, and in some cases poly Si and/or amorphous Si can be deposited on the Ge/GeSi surface to reduce dark/leakage current. M1 and M2 electrodes are formed on the surface of the metal oxide and the M1 and M2 electrodes are formed over regions where the Ge/GeSi layer is thicker.

Figure 72C:
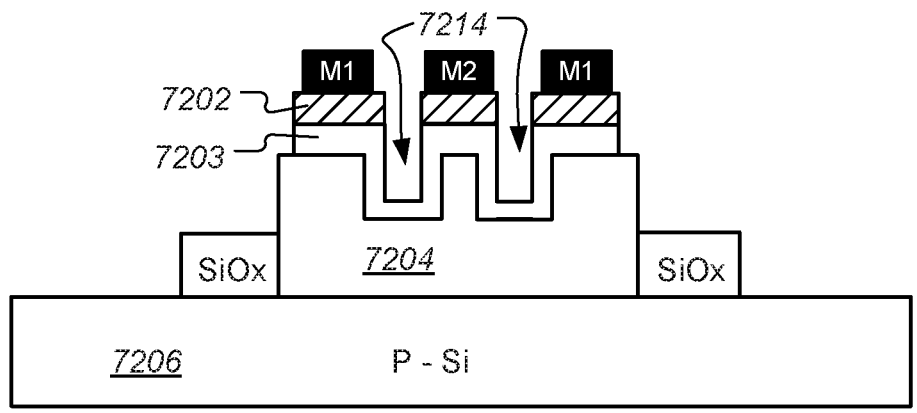

FIG. 72C Shows selective area grown Ge/GeSi 7204 on P Si 7206 with etched microstructure holes 7214 followed by a regrowth of Ge/GeSi 7203 on the surface of the Ge/GeSi 7204 and within the microstructure holes 7214. A metal oxide layer 7202, poly Si, amorphous Si, Si dioxide can be formed on the surface of the Ge/GeSi to reduce dark/leakage current. Inter-digitated M1 and M2 electrodes are formed on the metal oxide/poly Si/amorphous Si layer.

Figure 72D:
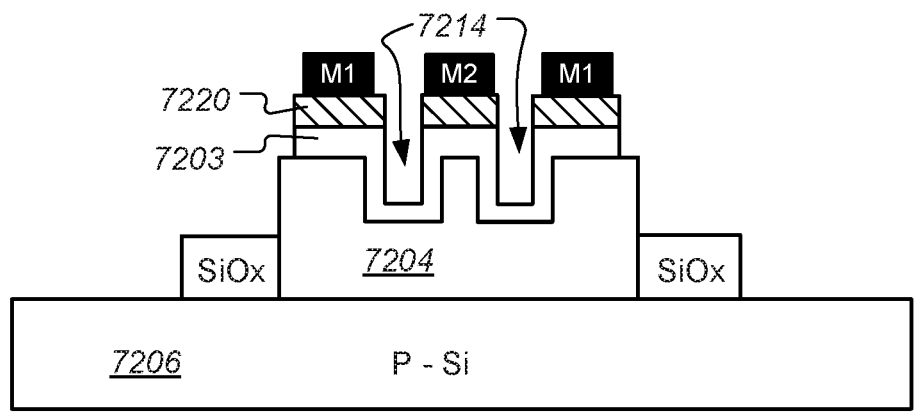
Figure 75A:
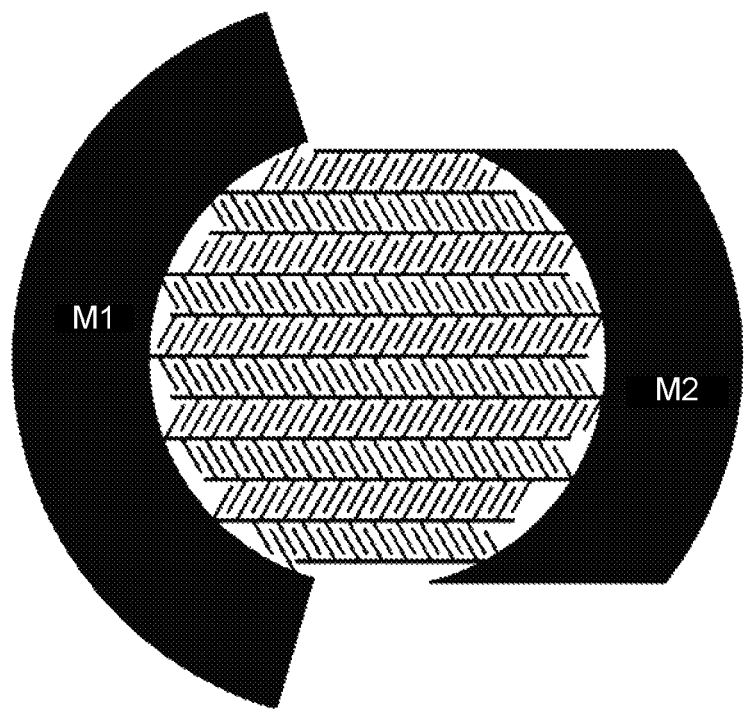
Figure 75B:
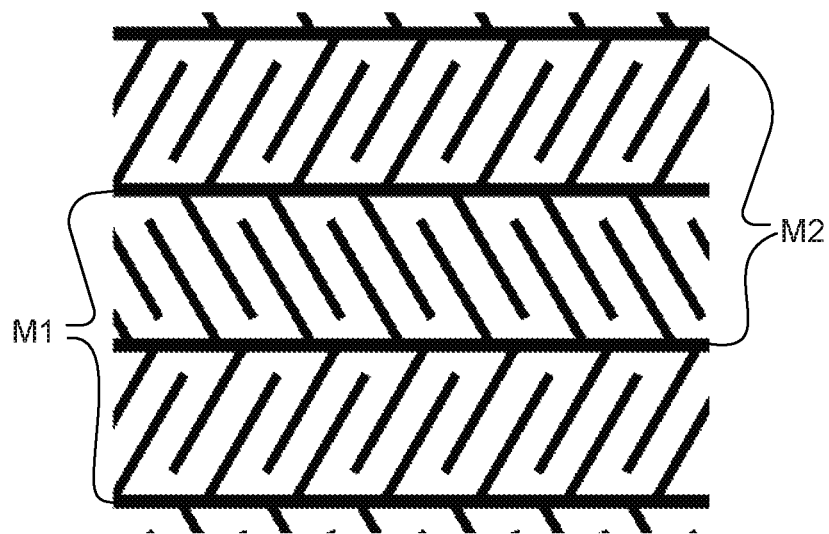
Figure 76A:
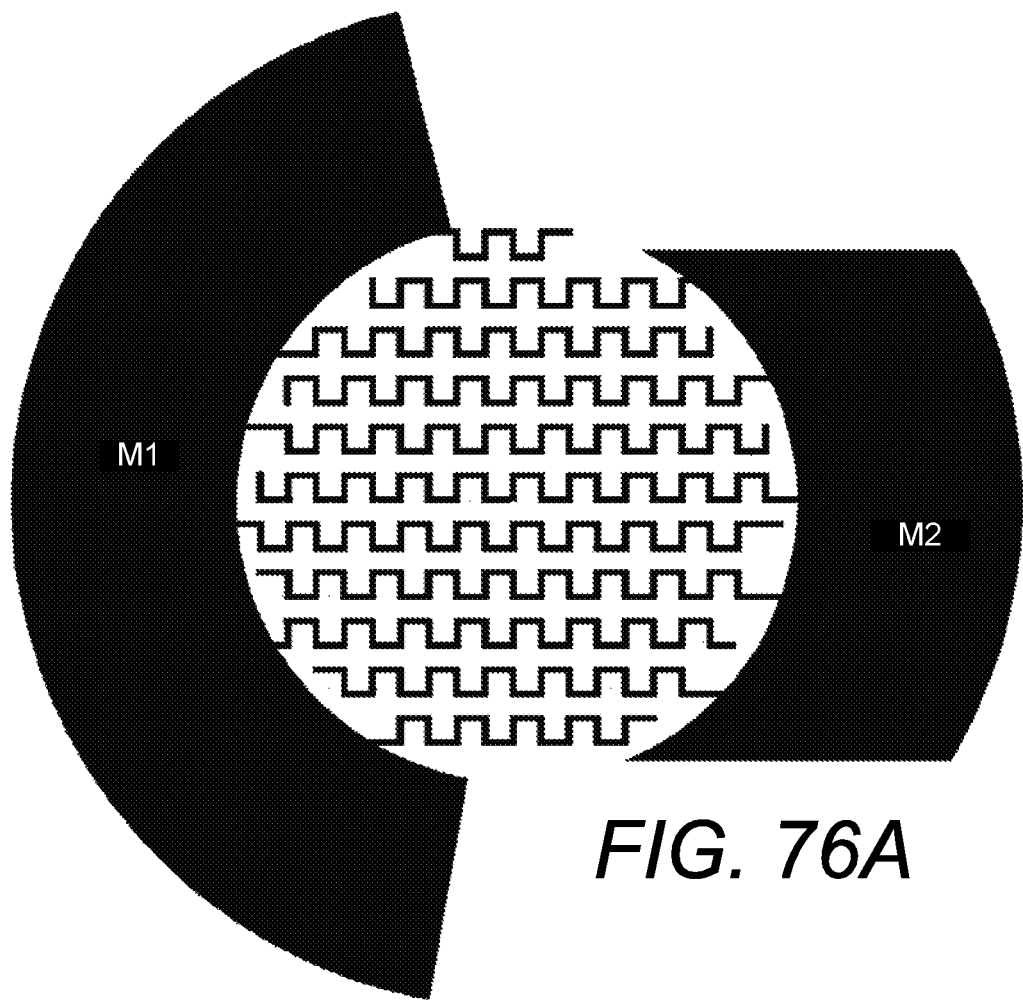
Figure 76B:
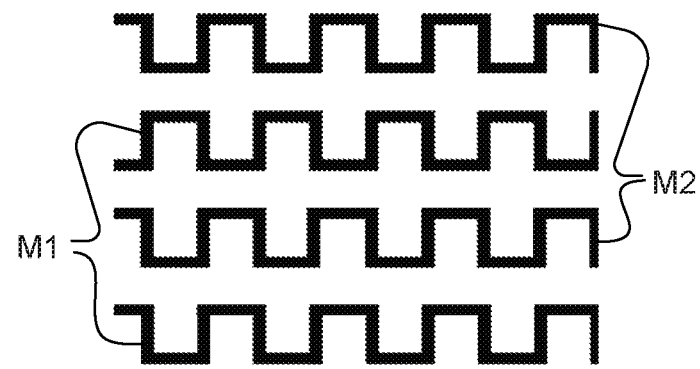
Figure 77A:
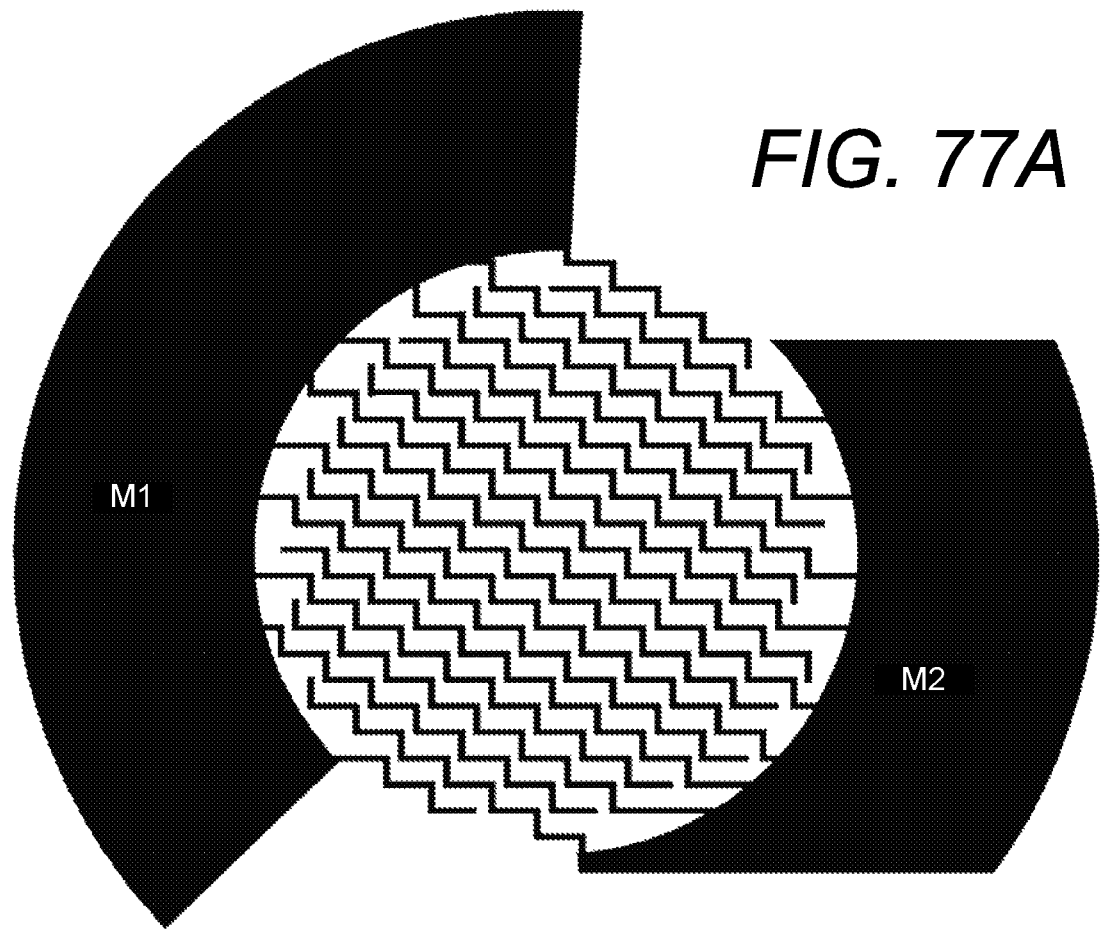
Figure 77B:
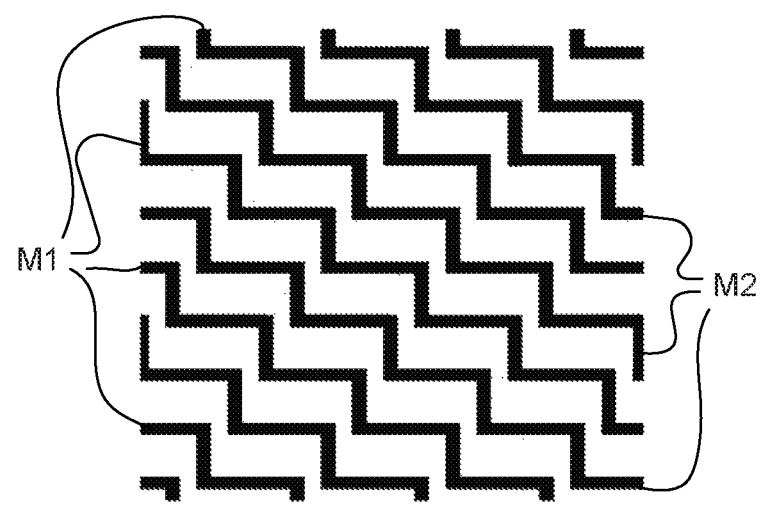
Figure 78A:
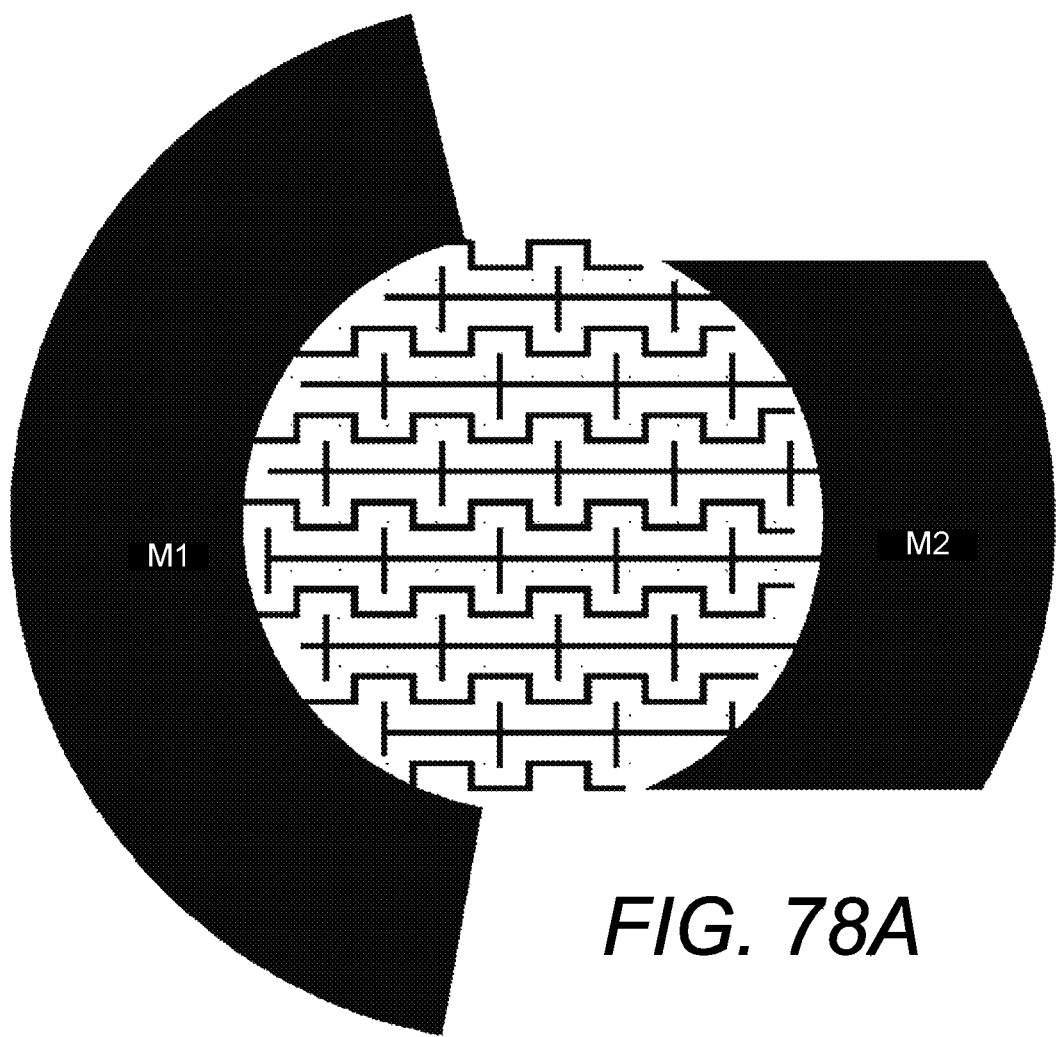
Figure 78B:
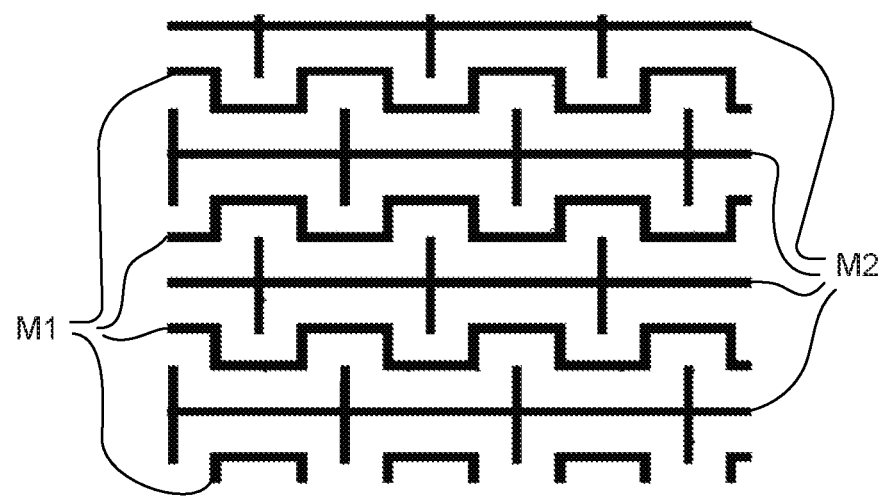
Figure 79A:
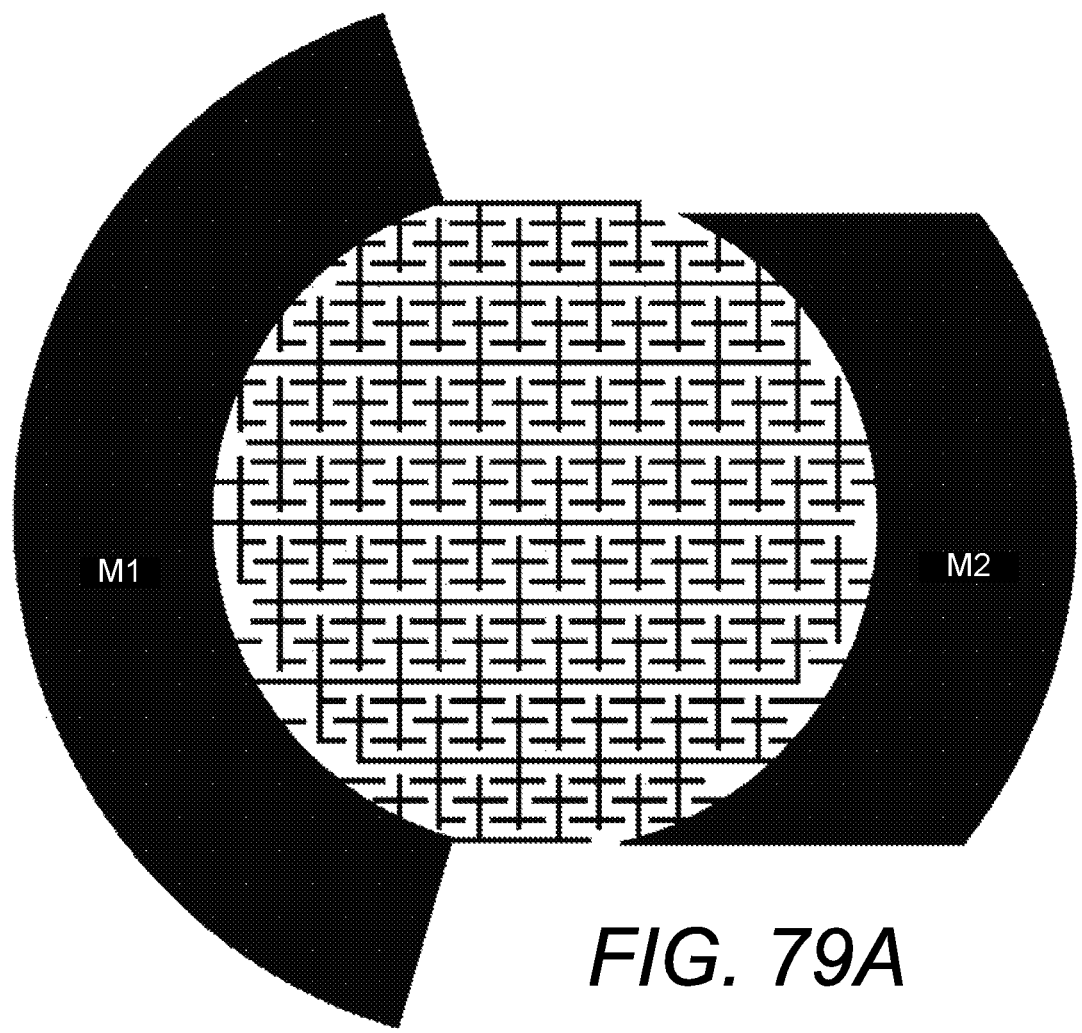
Figure 79B:
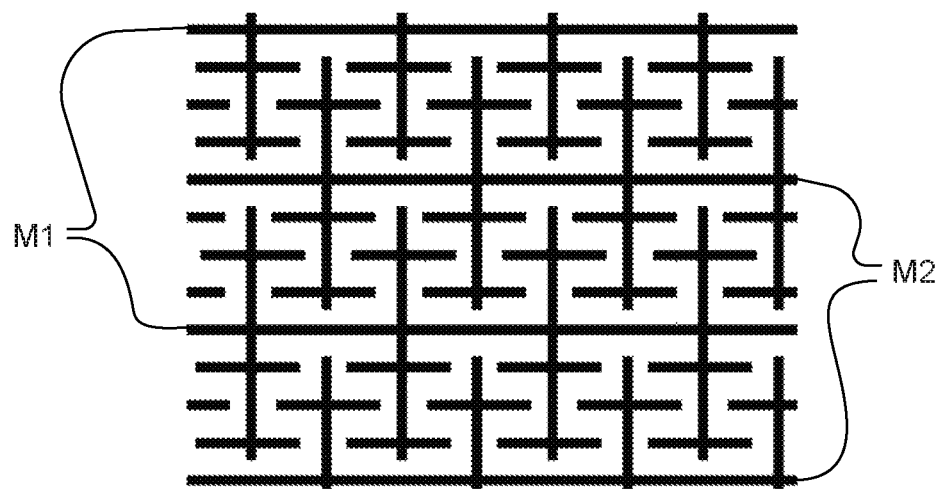
Figure 80A:
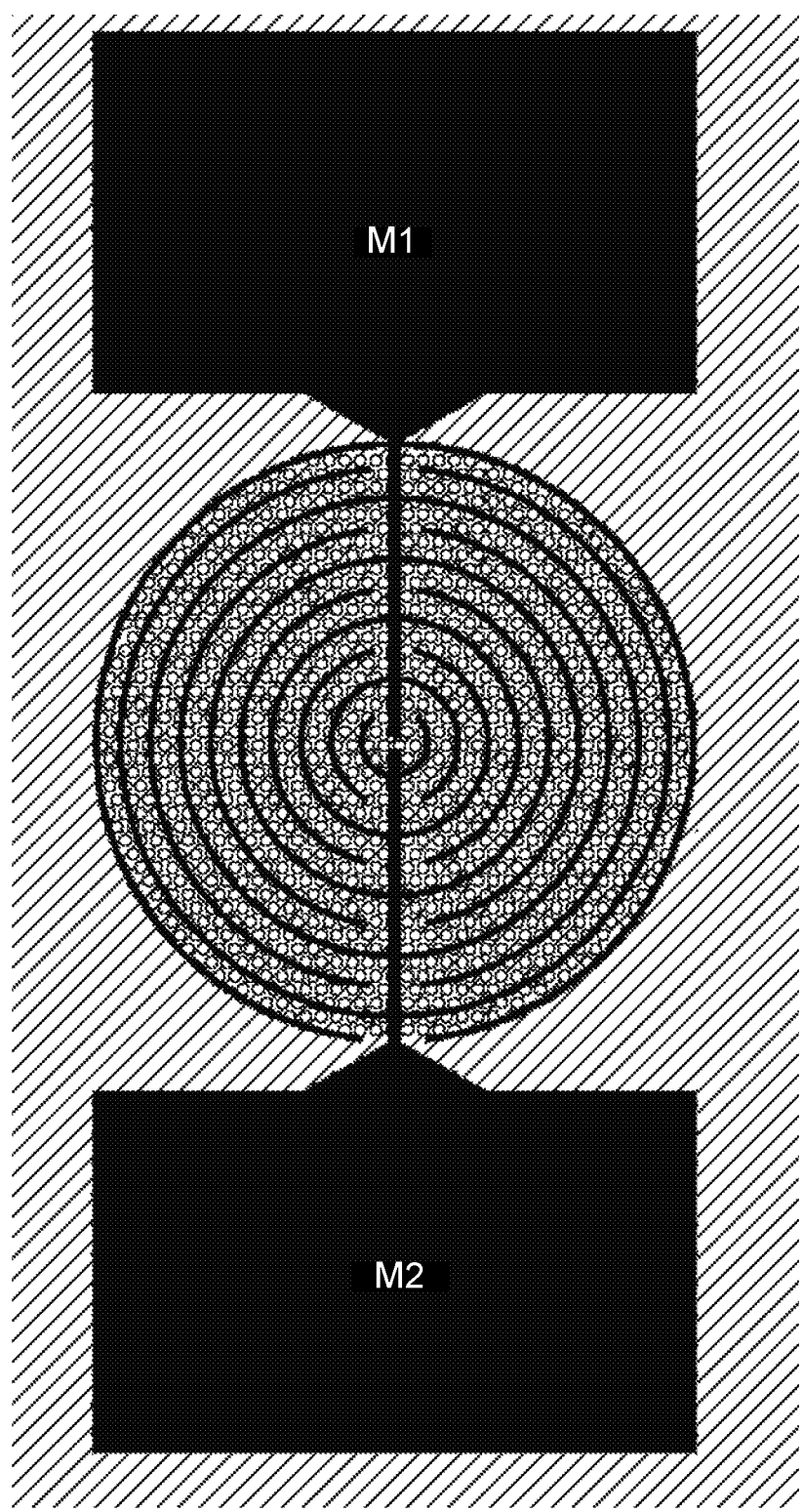
Figure 80B:
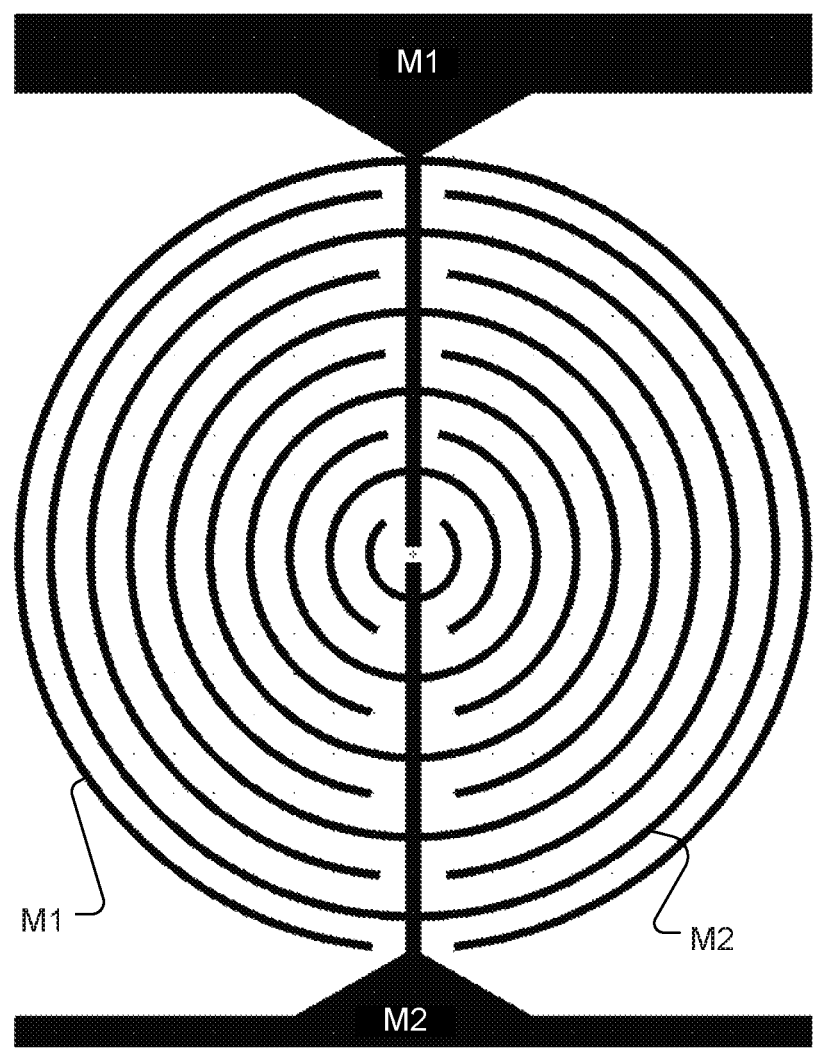

FIG. 72D shows selective area grown Ge/GeSi 7204 on P Si 7206 with regrowth of Ge/GeSi 7203 on the surface of etched microstructure holes 7214. P+ poly Si/amorphous Si 7220 is deposited on the Ge/GeSi 7203 followed by forming the M1 electrode, and N+ poly Si/amorphous Si is deposited on the Ge/GeSi surface followed by forming the M2 electrode. This forms a PIN structure for the MSM photodiode. The Ge/GeSi layers are not doped intentionally and can be intrinsic and, in some cases, low doped. The P Si layer can have a resistivity ranging from 1-40 ohm-cm or more, and in some cases the resistivity of the P Si layer is approximately the same or greater than the resistivity of the Ge/GeSi layer. M1 and M2 can be asymmetric. A reverse bias is applied between M1 and M2, where M1 is the anode and M2 is the cathode.

FIG. 72E shows Ge/GeSi 7224 grown in a P Si layer 7206 with Si islands 7230. Si islands 7230 can form a square patter, and in some cases can be square or trapezoidal shape and can be in a square lattice and in some cases a hexagonal lattice and in some cases can be periodic, aperiodic or randomly spaced. The Si islands 7230 can have a lateral dimension ranging from 100 nm-3000 nm or more, and in some cases from 300 nm-2000 nm. The height of the Si islands can range from 50 nm-2000 nm or more, in some cases from 300 nm-1000 nm, in some cases 500 nm-2000 nm. The Si islands 7230 can be spaced ranging from 100 nm-1000 nm or more, and in some cases from 3000 nm-2500 nm. Ge/GeSi 7224 is selective area grown in regions between the Si islands. Metal oxide/poly Si/amorphous Si/Si dioxide 7222 can be formed on the Ge/GeSi surface to reduce dark/leakage current. M1 and M2 inter-digitated electrodes can be formed over regions with Ge.

FIG. 72F Is similar to FIG. 72E with the exception that Ge/GeSi 7232 is selective area grown in spaces between the Si islands 7230 and above the Si islands as shown, followed by metal oxide/poly Si/amorphous Si/Si dioxide 7222 deposited on the surface of Ge 7232 and the inter-digitated electrodes M1 and M2 are formed on the surface.

FIG. 72G a plan view of a Si islands 7230 that are etched into the Si, with Ge/GeSi 7224 in areas between the Si islands (as in FIG. 72E), and in some cases above the Si islands (as in Ge/GeSi 7232 in FIG. 72F). M1 and M2 electrodes are shown between the Si islands.

FIGS. 73A and 73B are partial cross-section of selective area growth of Ge/GeSi on Si using epitaxial lateral over growth (ELOG) to form buried dielectric islands for photon trapping, according to some embodiments of both vertical PIN and lateral MSM structures.

Note that in some cases the microstructure holes 7214 could be filled with a material such as a dielectric. Filling the holes could allow greater freedom in electrode layout and spacing because the electrodes could partially or fully overlap one or more holes. The photon trapping benefits of the microstructure holes could be maintained since the dielectric material could have a substantial index of refraction contrast with the surrounding material.

FIG. 73A shows a PIN microstructure buried dielectric island photodiode. In this example on a N+ Si layer or region dielectrics 7310 are formed or deposited on the N+ Si in areas where Ge/GeSi growth is not desired. The dielectric 7310 can be Si dioxide, Si nitride, Al oxide, to name a few. Intrinsic and or low dope Ge/GeSi is selective area grown, and in addition with ELOG dielectric islands can be buried. The Ge/GeSi 7304 can have a thickness ranging from 200 nm-2000 nm. The dielectric layer 7310 can have a thickness ranging from 50 nm-1000 nm or more. The buried dielectric islands 7310 have a lower refractive index than Ge, and therefore can be seen as "holes" in the sense that effective index of the region comprising the buried dielectric and the Ge overgrown over it, has a lower effective index than the Ge/GeSi region that doesn't contain the dielectric island. These buried dielectric islands can enhance absorption due to photon trapping in a similar fashion as microstructure holes enhance absorption due to photon trapping. The PIN structure is completed with P Poly Si deposited on the Ge/GeSi. Anodes are formed on the P+ Poly Si, and cathodes are formed on the N+ Si. Photons can impinge from either the top surface or from the bottom surface. A reverse bias is applied between the anode and cathode. The N+ Si can be crystalline, and in some cases can be poly crystalline, and in some cases can be amorphous. In some cases, the N+ layer can be Poly crystalline Ge and/or amorphous Ge/GeSi. ("/" refers to and/or.) In some cases a BOX layer can be beneath the N+ Si. The P and N can be interchanged.

FIG. 73B shows a selective area grown intrinsic or low dope Ge/GeSi on Si with the addition of ELOG process to form buried dielectric islands. The structure can be similar to FIG. 73A except P and N doping are not used in this example. A thin metal oxide layer such as Al oxide or Hf oxide or Si dioxide or Ti oxide with thickness ranging from 0.5 nm-10 nm, and in some cases 1 nm is deposited on the Ge/GeSi surface and inter-digitated electrodes, M1 and M2 are formed on the surface. The buried dielectric islands are effectively holes as seen by a photon.

The dielectric islands 7310 can have lateral dimensions ranging from 300 nm-2000 nm, and in some cases 100 nm-1500 nm. The spacing between the dielectric islands can range from 50 nm-2000 nm, and in some cases from 100 nm-1000 nm. The dielectric islands 7310 can be periodic, aperiodic, and/or randomly arranged. The dielectric islands can be rectangular, polygonal, triangular, cylindrical, oval, and/or any combination of shapes. The Ge/GeSi can be selective area grown on I or low doped crystalline Si, polycrystalline Si, polycrystalline Ge, amorphous Si, and/or amorphous Ge. In some cases a BOX layer can be included. Light can impinge from either the top surface or the bottom surface.

FIGS. 74A-74C; 75A, 75B, 76A, 76B, 77A, 77B, 78A, 78B, 79A, 79B, 80A and 80B are diagrams illustrating aspects various configurations of inter-digitated electrodes for MSM photodetectors, according to some embodiments. In FIG. 74A the electrodes M1 and M2 are connected to transmission lines 7440 and 7442 respectively. Some of the configurations, such as FIGS. 75A-B, 76A-B, 77A-B, 79A-B and 80A-B may have reduced sensitivity to the polarization of the incoming optical signal.

Figure 81:
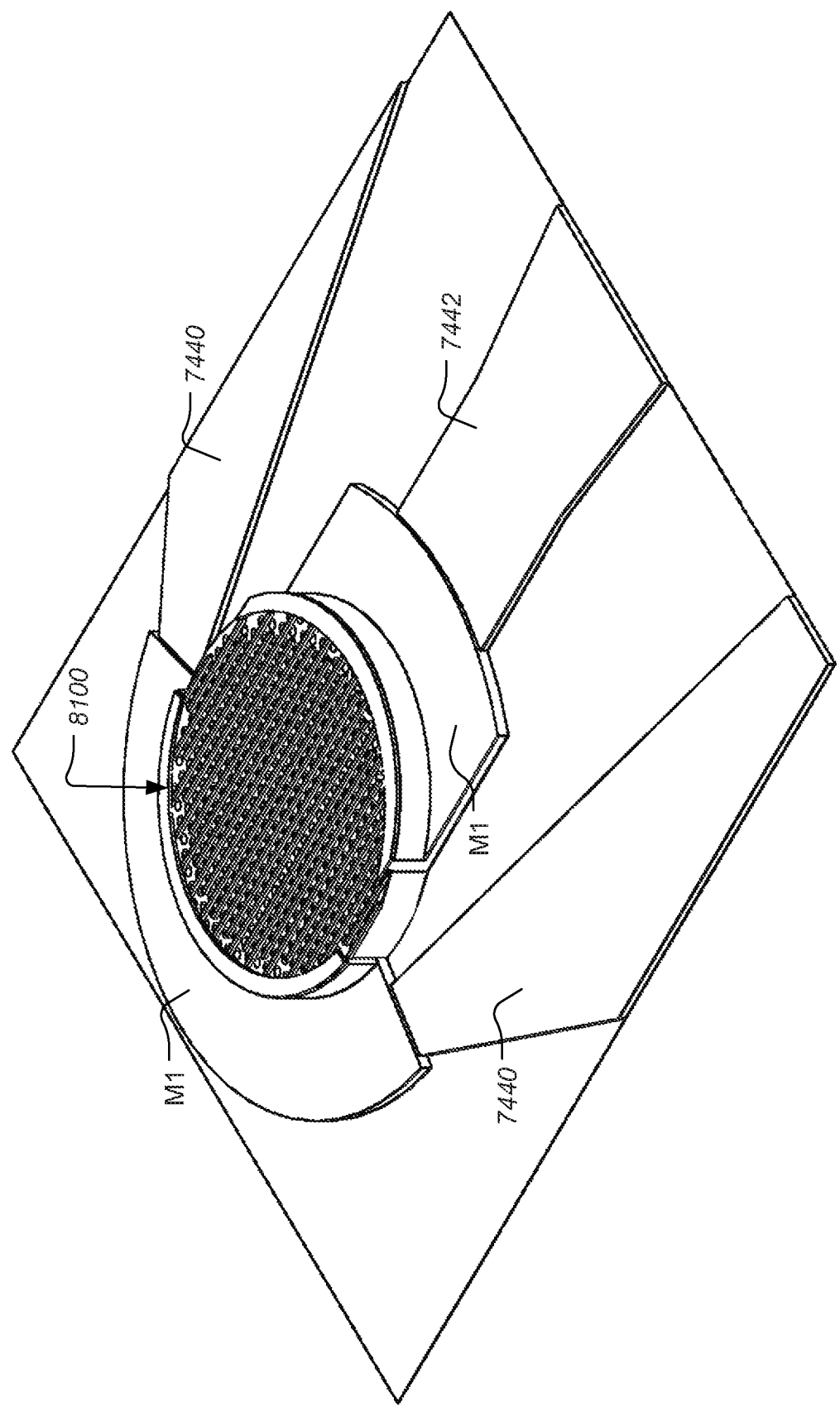
FIG. 81 is perspective view of an MSM structure having inter-digitated electrodes, according to some embodiments.

FIG. 81 is perspective view of an MSM structure having inter-digitated electrodes, according to some embodiments. The structure shown is similar to that shown in FIGS. 74A-74C wherein the photosensitive area 8100 has inter-digitated electrodes M1 and M2 which are connected to transmission lines 7440 and 7442 respectively. Note that although not shown, all of structures depicted in FIGS. 74A-74C; 75A, 75B, 76A, 76B, 77A, 77B, 78A, 78B, 79A, 79B, 80A, 80B and 81 can be monolithically integrated with CMOS/BiCMOS ASICs, and can have 1-D or 2-D arrays of photodetectors.

Figure 82A:
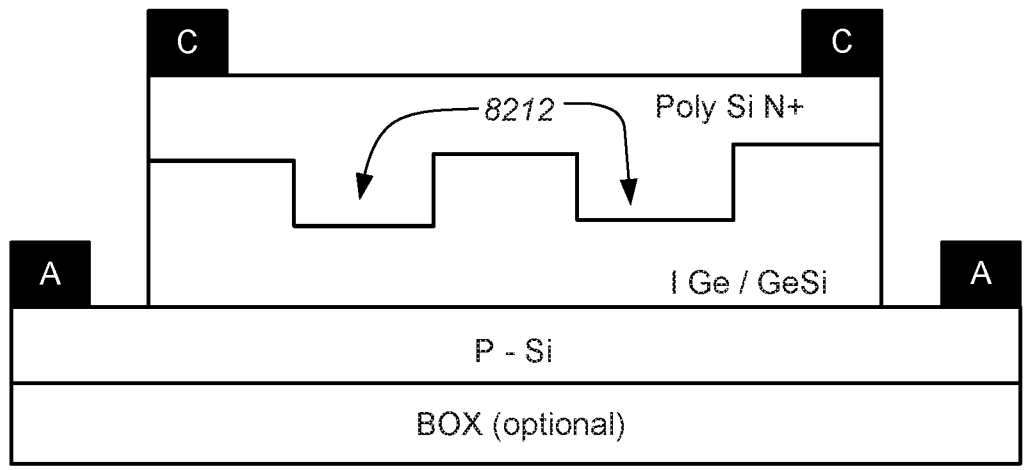
FIGS. 82A and 82B are cross-sections of an example of Poly Si deposited on I or low dope Ge/GeSi with etched microstructure holes, according to some embodiments.
Figure 82B:
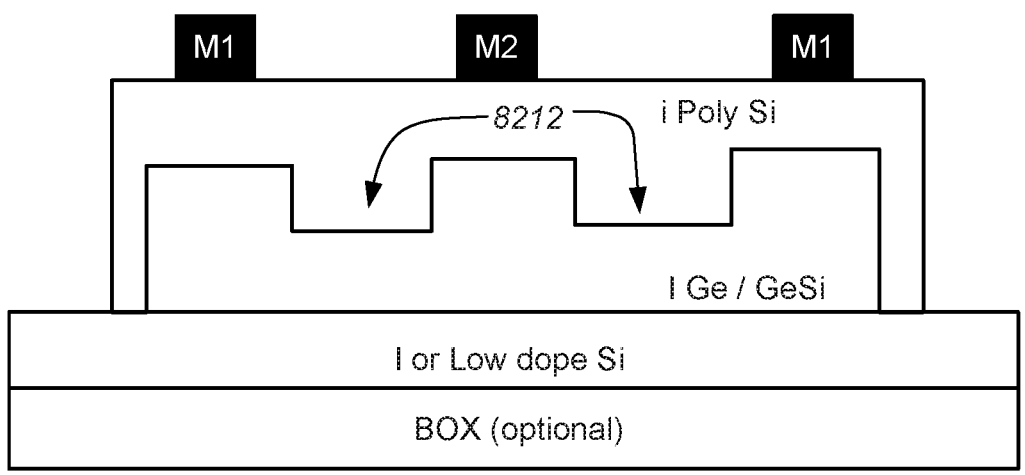

FIGS. 82A and 82B are cross-sections of an example of Poly Si deposited on I or low dope Ge/GeSi with etched microstructure holes, according to some embodiments. The Poly Si can cover the microstructure holes partially or entirely.

FIG. 82A shows a surface illuminated and in some cases be bottom illuminated NIP vertical structure where the Ge can be selective area grown on P Si device layer and/or substrate. The I or low dope Ge/GeSi can have a thickness ranging from 0.3 microns to 2 microns or more, and in some cases 0.5 microns to 1 micron. A Poly Si N+ layer can be formed on the surface of the I or low dope Ge/GeSi and in some cases can cover the hole entirely as shown. The N+ Poly Si can have a thickness ranging from 0.1 micron to 2 microns or more. The microstructure holes 8212 in the I or low dope Ge/GeSi can have a depth ranging from 0.1 micron to 1 micron, and in some cases 0.3 micron to 0.7 micron. In some cases the microstructure holes 8212 can be etched partially in the Ge/GeSi and in some cases can be etched to the P Si. The lateral dimension of the microstructure holes 8212 can range from 300 nm-2000 nm, and the spacing between the microstructure holes can range from 50 nm-2000 nm. Cathodes are formed on the N+ Poly Si and anodes are formed on the P or P+ Si. Not shown are passivation layers that can be deposited on the sidewalls of the mesa of the I or low dope Ge/GeSi that can be Poly and/or amorphous Si and in some cases poly and/or amorphous Ge.

FIG. 82B shows a similar structure to FIG. 82A except all the layers are I or low dope. In addition, the i Poly Si can also be deposited on the sidewall of the I or low dope Ge/GeSi mesa. This structure is a MSM structure with inter-digitated electrodes M1 and M2 formed between the microstructure holes 8212 which in some cases can be partially or fully buried with i Poly Si. Optical signals can be illuminated on the top surface and in some cases on the bottom surface.

Intrinsic or low dope can have doping less than $1 \times 10^{16}$ $cm^{-3}$ or less, and in some cases can be $10^{15}$ $cm^{-3}$ or less, and in some cases $10^{14}$ $cm^{-3}$ or less. Anti-reflection and/or nanograss materials to reduce reflections are not shown.

Figure 83A:
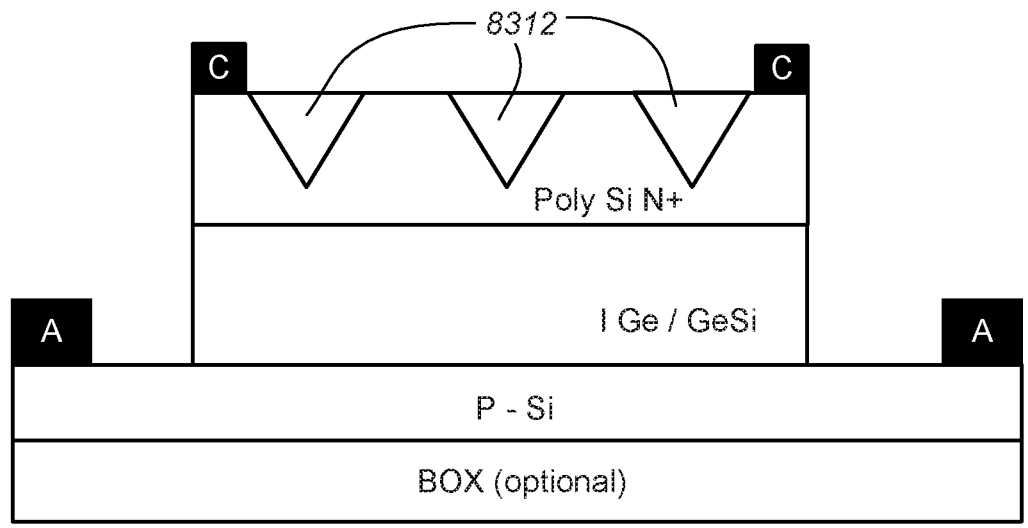
FIGS. 83A and 83B are cross-sections illustrating aspects of forming microstructure holes in the N+ Poly Si layer.
Figure 83B:
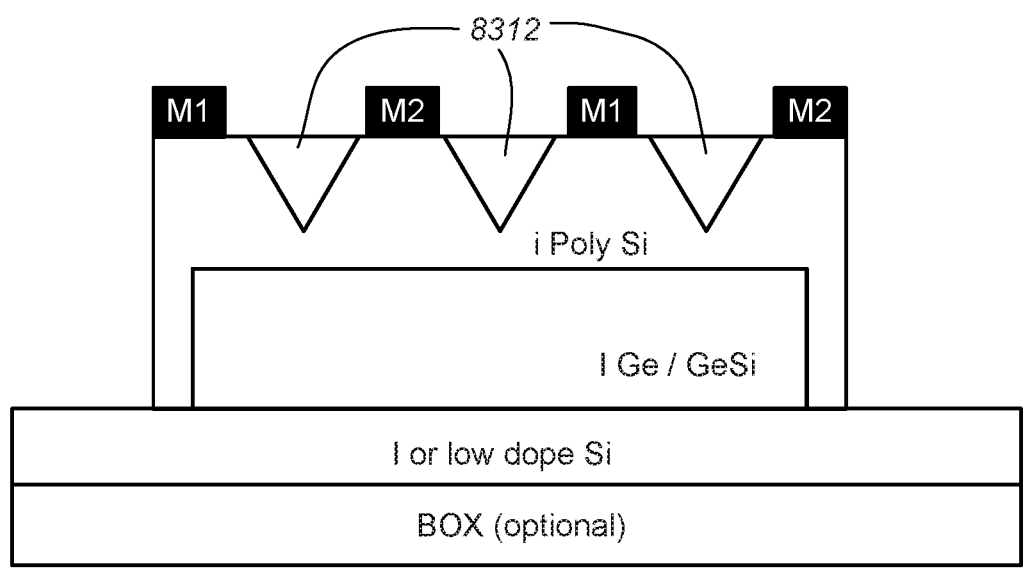

FIGS. 83A and 83B are cross-sections illustrating aspects of forming microstructure holes in the N+ Poly Si layer. FIG. 83A shows a top surface and in some cases bottom surface illuminated microstructure hole NIP vertical structure photodiode. The I or low dope Ge/GeSi can be selective area grown on P or P+Si device layer or substrate where the BOX layer is optional. The I or low dope Ge/GeSi can have a thickness range from 0.1-2 microns or more, and in some cases 0.3-1 micron. The N+ poly Si is deposited on the surface of the Ge/GeSi and can have a thickness range from 0.1-2 microns or more, and in some cases 0.5-1 micron. Microstructure holes 8312 are etched in the N+ poly Si with depth ranging from 0.1-1 micron or more, and in some cases from 0.3-0.7 micron. The lateral dimensions of the microstructure holes can range from 0.3-2 microns or more, and in some cases from 0.6-1.8 micron, and the spacing between the holes can range from 0.1 micron-1 micron. The microstructure hole cross-sections can be inverted pyramids, inverted trapezoid, cylindrical, or any cross-section and combination. The shape of the microstructure holes can be square, polygonal, circular, oval, amoebic, and or any other combination of shapes. The microstructure holes can be arranged periodic, aperiodic and/or random. Cathodes are formed on the surface of the N+ poly Si and anodes are formed on the surface of the P or P+Si.

FIG. 83B shows a MSM structure where the I or low dope Poly Si is formed on the I or low dope Ge i GeSi and in some cases can cover the side wall of the I or low dope Ge/GeSi mesa. Inter-digitated electrodes M1 and M2 can be formed between the microstructure holes 8312. The structure is similar to FIG. 83A except the layers are I or low dope. In some cases, the M1 and M2 electrodes can be transparent conducting metal oxide such as Indium Tin oxide, other transparent conducting metal oxides can also be used. In some cases, silicide such as Pt silicide, Ti silicide, W silicide, Mo silicide, and other metal silicides can be used for the M1 and M2 inter-digitated electrodes.

Dark current in Ge/GeSi photodiodes can be due to dislocations caused by lattice mismatch between Ge/GeSi and Si. Thermal anneal can be used to reduce the dislocation density and therefore the dark leakage current. See, e.g., Chen et al; Dark Current Analysis in High-Speed Germanium P–I–N Waveguide Photodetectors; Journal of Applied Physics, 119, 213105 (2016), which is incorporated by reference herein. Other methods of reducing dark current include surface passivation with dielectrics, amorphous semiconductor, poly crystalline semiconductor, crystalline semiconductor to name a few, and in some cases an oxide layer with thickness ranging from 0.5 nm-5 nm can be inserted between the inter-digitated electrodes and the Ge/GeSi surface.

Wet etch into poly Si may not result in an inverted pyramid and depends on the crystal orientations in the poly Si that can determine the final shape of a hole. Shapes other than inverted pyramids can be used as microstructure holes for the enhancement of absorption. In some cases dry etching of microstructure holes such as cylindrical holes, or funnel holes can be used to create absorption enhancing microstructure holes.

Figure 84A:
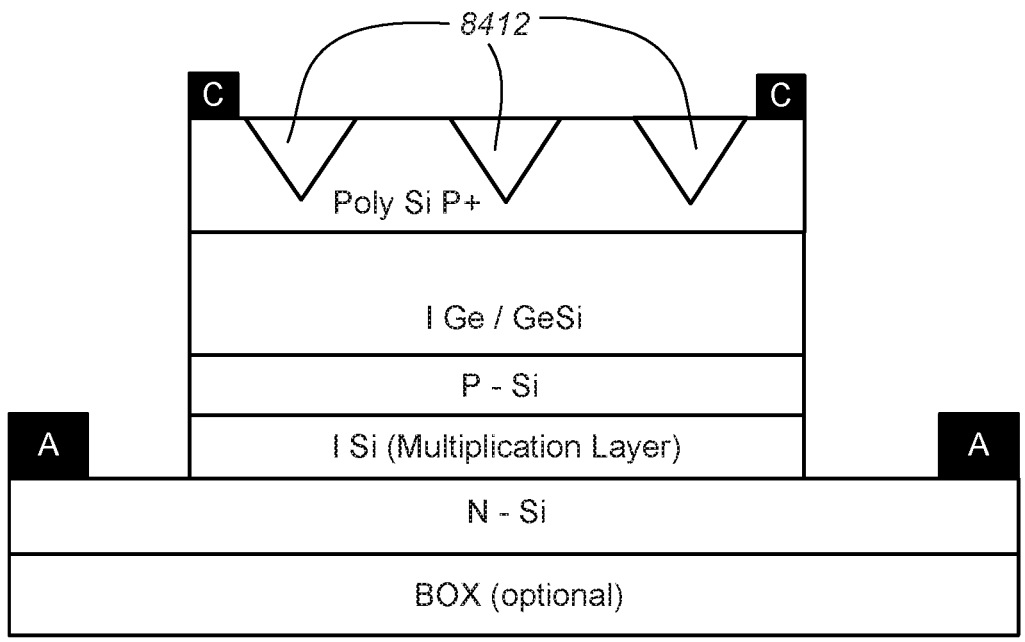
FIGS. 84A to 84H are cross-sections illustrating aspects of microstructure hole avalanche photodiodes in a vertical PIPIN structure and a lateral PIN structure, according to some embodiments.

FIGS. 84A to 84H are cross-sections illustrating aspects of microstructure hole avalanche photodiodes in both vertical PIPIN structure and a lateral PIN structure, according to some embodiments. FIG. 84A shows PIPIN avalanche photodiode where the top P layer is poly Si and microstructure holes 8412 such as inverted pyramids, cylindrical, funnel holes can be etched in the poly Si. An intrinsic or low dope Ge/GeSi layer beneath the poly Si absorbs incoming photons with wavelength range of 1000 nm to 2000 nm. A P Si charged layer sits beneath the Ge/GeSi. Intrinsic or low dope Si multiplication layer is located beneath the P Si charged layer. A N or N+ Si layer is located beneath the multiplication layer. A box layer is optional and can be either a SOI wafer or a Si wafer. An anode is placed on the P poly Si and a cathode is placed on the N or N+ Si layers. A reverse bias is applied between the anode and cathode with voltage range of −3 to −50 volts or more. Light can impinge from the top surface and in some cases from the bottom surface. The layer thickness for the N or N+Si can range from 200 nm to 2000 nm or more. The I or low dope Si multiplication layer can range from 50 nm to 1000 nm thick. The P Si charged layer can range from 20 nm to 300 nm thick. The I or low dope Ge/GeSi can range from 100 nm to 2000 nm, and in some cases from 300 nm to 1000 nm. The poly Si P+ layer can range from 100 nm to 1000 nm. Microstructure holes 8412 are etched predominately in the poly Si P+ layer, and in some cases can extend into the I or low dope Ge/GeSi layer. In some cases, the microstructure holes 8412 are only in the poly Si layer. P and N can be interchanged.

Figure 84B:
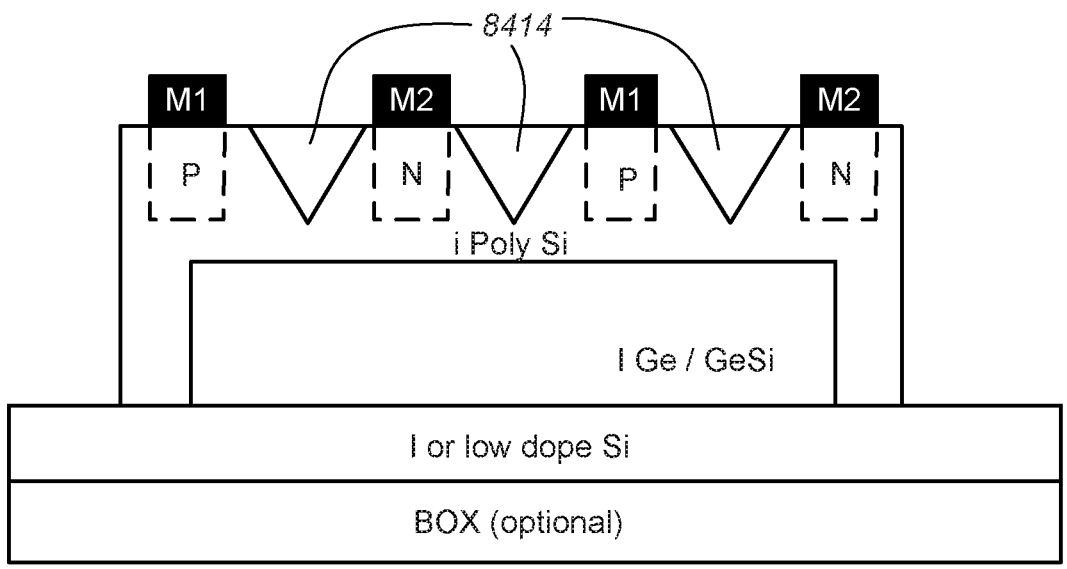

FIG. 84B shows a lateral PIN structure with inter-digitated electrodes M1 and M2. In this example a P doped region is under inter-digitated electrode M1 and an N doped region is under inter-digitated electrode M2. The microstructure holes 8414 are etched between inter-digitated electrodes M1 and M2 in I or low dope poly Si which can encapsulate the I or low dope Ge/GeSi. The Ge/GeSi is selectively area grown on I or low dope Si. A BOX layer is optional. The device can be fabricated on either a SOI wafer of a Si wafer. Layer thickness of the I or low dope Si layer can range from 100-2000 nm or more. The I or low dope Ge/GeSi layer can range from 100-2000 nm, and in some cases from 300-1000 nm. The I or poly Si layer can range from 100-1000 nm. The N and P doped wells can have a depth ranging from 100-1000 nm and can be predominately in the I or low dope poly Si, and in some cases can extend into the I or low dope Ge/GeSi region. Optical signal can impinge either from the top or bottom surface.

A reverse bias can be applied between M1 (anode) and M2 (cathode) with reverse bias voltage ranging from −3 to −50 volts or more. Anti-reflection coatings and/or nanograss are not shown and can be included to further reduce reflection. A reverse bias voltage is applied between M1 and M2 with voltages ranging from −1 volt to −35 volts and in some cases greater than −35 volts. In some cases the reverse bias voltage range from −1 to −4 volts.

Figure 84C:
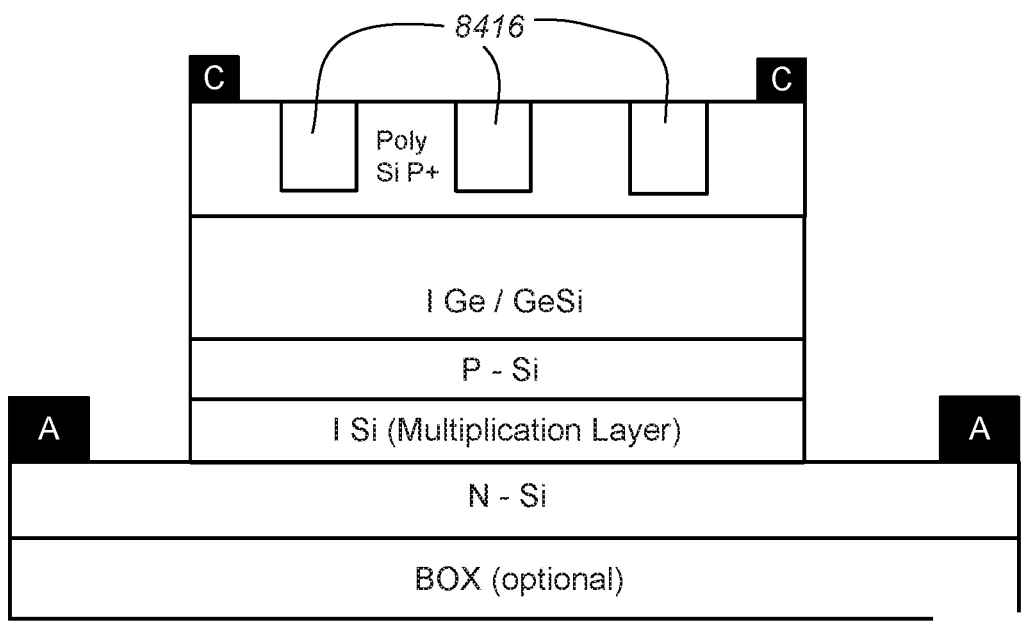

FIG. 84C is similar to FIG. 84A and shows microstructure holes 8416 in the poly Si that can be dry etched and/or wet etched in polygonal shapes and maybe irregular shapes due to the many crystal orientations of the poly Si.

Figure 84D:
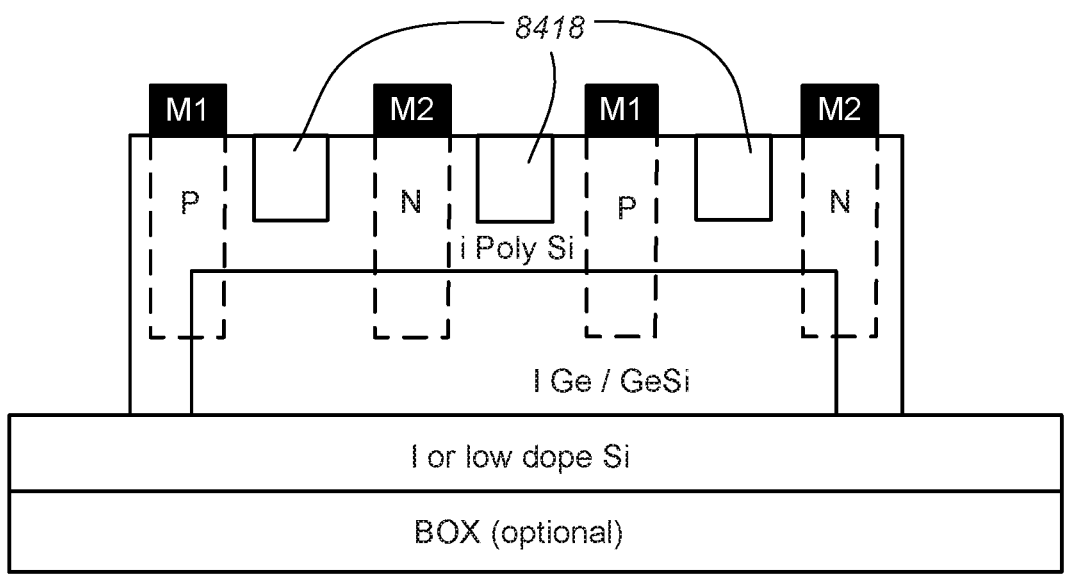

FIG. 84D is similar to FIG. 84B with the exception that the P and N well extends partially into the I or low dope Ge/GeSi layer. Microstructure holes 8418 are etched into the poly Si.

Figure 84E:
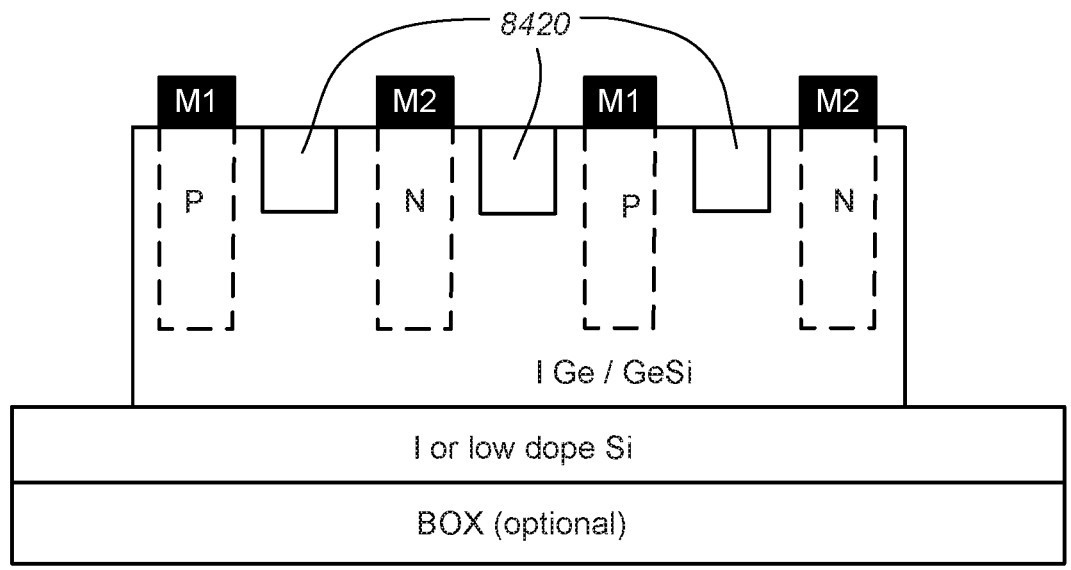

FIG. 84E illustrates an I or low dope Ge layer with microstructure holes 8420 and with P and N wells under inter-digitated electrodes M1 and M2. The microstructure holes 8420 can have a depth ranging from 100 nm-1000 nm or more, and can have a lateral dimension ranging from 500 nm-2000 nm and in some cases from 600 nm-1600 nm. The spacing between the microstructure holes can range from 100 nm-1000 nm. The microstructure holes can be periodic, aperiodic and/or random, and/or any combination of periodic, aperiodic and random. In some cases, the holes can have a square lattice, and in some cases it can have a hexagonal lattice.

The I or low dope Ge/GeSi can have a layer thickness ranging from 300 nm-2000 nm and in some cases from 500 nm-1000 nm. The I or low dope Ge can have a doping of less than $1\times10^{16}/cm^3$ or less, and in some cases $5\times10^{15}/cm^3$ or less, and in some cases $1\times10^{15}/cm^3$ or less. The N and P wells can have doping of $3\times10^{17}/cm^3$ or more and can have a depth ranging from 100 nm-1000 nm or more. The M1 and M2 electrodes can be ohmic contacts to the P and N wells with metal thickness ranging from 50 nm-500 nm or more and can have a width ranging from 30 nm-300 nm. In some cases, the metal width can be less than 30 nm. The spacing between the inter-digitated electrodes M1 and M2 can range from 300 nm-2000 nm or more, and in some cases 500 nm-1000 nm. In some applications the spacing of the inter-digitated electrodes can range from 1000 nm-3000 nm or more. Koester et. al, Ge-on-SOI-Detector/Si-CMOS-Amplifier Receivers for High-Performance Optical-Communication Applications; Journal of Lightwave Technology, Vol 25, No 1 Jan. 2007, incorporated by reference herein, discusses inter-digitated MSM Ge on SOI photodetector integrated with CMOS ASICs without microstructure holes. With the addition of microstructure holes, the EQE can be higher at certain wavelengths as compared to a similar structure without microstructure holes.

Figure 84F:
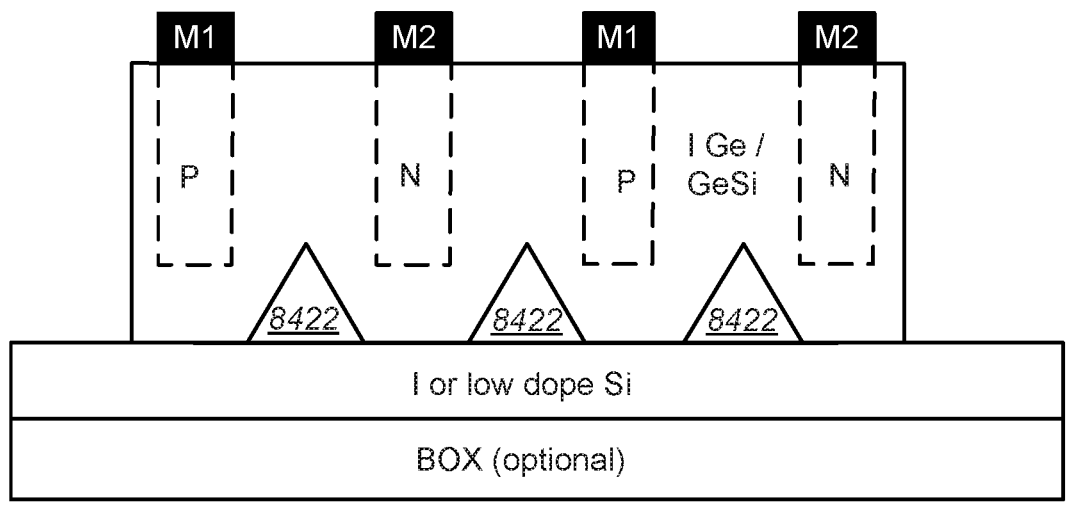

FIG. 84F shows buried islands 8422 that can be crystalline Si, poly crystalline Si, and/or dielectric in polygonal shapes, and where the I or low dope Ge/GeSi can be epitaxially lateral overgrown on these islands such that the lower refractive index islands are buried by the I or low dope Ge which have a higher optical refractive index. Such buried islands 8422 can be viewed as buried microstructure holes. The islands can have lateral dimensions ranging from 100 nm-2000 nm or more, and in some cases can range from 500 nm-1700 nm and can have spacing ranging from 0 nm or overlap to 2000 nm or more, and in some cases from 0 nm-1000 nm. The height of the islands can range from 30 nm-1000 nm or more, and in some cases from 300 nm-1000 nm. The I or low dope Ge can be selective area grown and epitaxial lateral overgrown such that the islands are fully or partially buried. The islands can be periodic, aperiodic, and/or randomly arrange, and/or any combination there of. P and N wells can be implemented in the I or low dope Ge to provide electric field between M1 and M2, and within the I or low dope Ge. A reverse bias is applied between the M1 and M2.

Figure 84G:
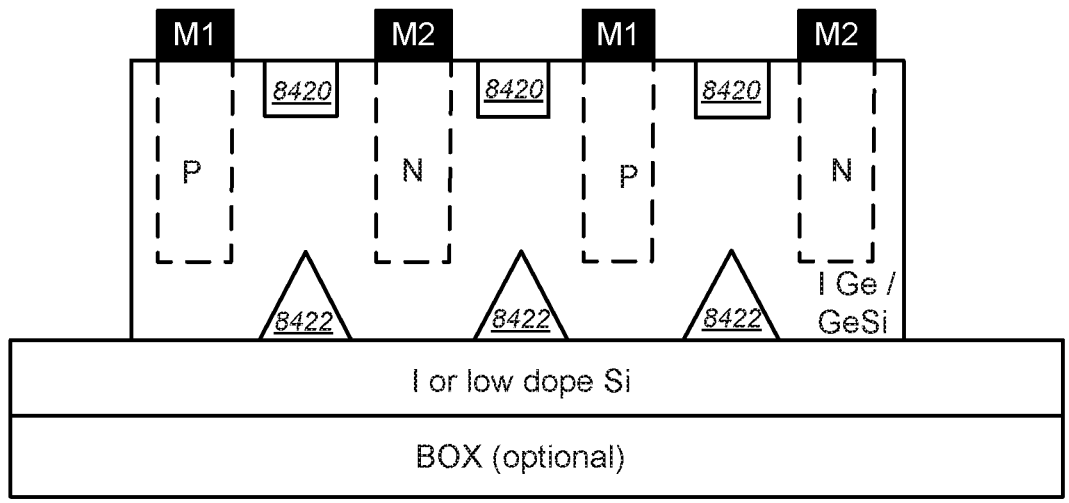

FIG. 84G is similar FIGS. 84E and 84F. In this case both buried islands 8422 and microstructure holes 8420 are included.

Figure 84H:
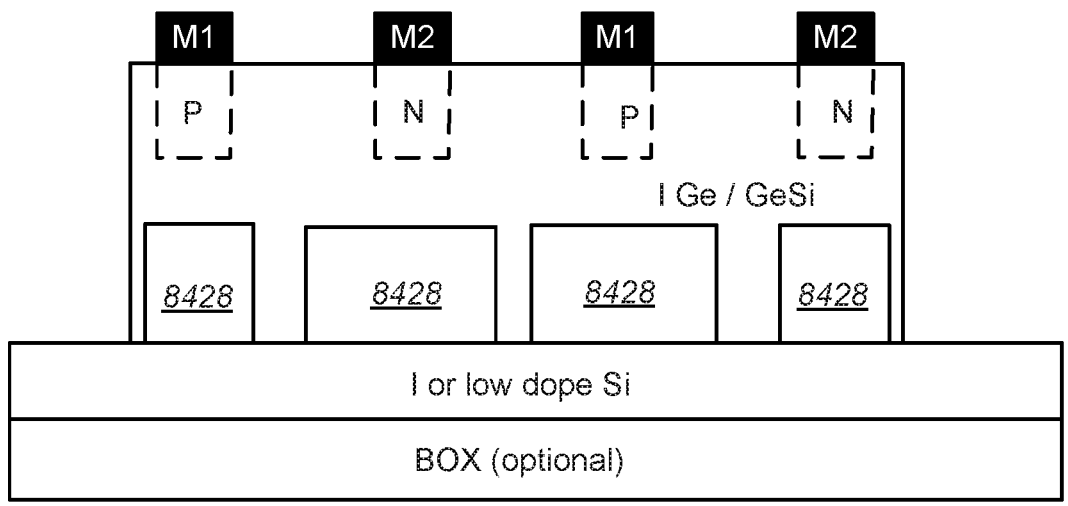

FIG. 84H is similar to FIG. 84F except the buried islands 8428 can be trapezoidal, rectangular, and/or polygonal. Additionally, the islands can include crystalline and non-crystalline semiconductor, and/or dielectrics. The buried islands can have a height ranging from 30 nm-1000 nm or more. In some cases, the islands can be fully or partially buried by the I or low dope Ge/GeSi layer which can be selective area grown and/or epitaxial lateral overgrown. P and N wells can be included in the I or low dope Ge/GeSi region with depths ranging from 50 nm-1000 nm or more. In some cases the islands can be between the wells, and in some cases the islands can be underneath the wells. The islands can be periodic, aperiodic, and/or randomly arranged, and in some cases any combination of periodic, aperiodic, and random arrangements. In some cases the islands can have a square lattice, and in some cases it can have a hexagonal lattice. A reverse bias is applied between the P and N wells. M1 and M2 metal make ohmic contacts to the P and N wells. The M1 and M2 can be metallic such as Al, Cu, Sn, Ni, Cr, Ti, Ta, V, W, or Mo, or any combination of metals. In some cases amorphous Si and/or Ge can be used in forming ohmic contacts. In some cases M1 and M2 can be silicide such as Pt silicide, Ti silicide, Ni silicide, Al silicide to name a few. Not shown are nanograss or anti reflection coatings that can be applied to the Ge/GeSi surface and the M1 and M2 electrodes. Amorphous Si and/or Ge can be deposited on the M1 and M2 electrodes to further reduce reflection from the metal surfaces.

FIG. 84H additionally shows the inter-digitated electrodes M1 and M2 with or without the P and N wells over the buried islands. The buried islands can have lateral dimensions greater than the lateral dimension of the M1 and M2 electrode, and in some cases greater or equal to the spacing between M1 and M2 electrodes.

Figure 84I:
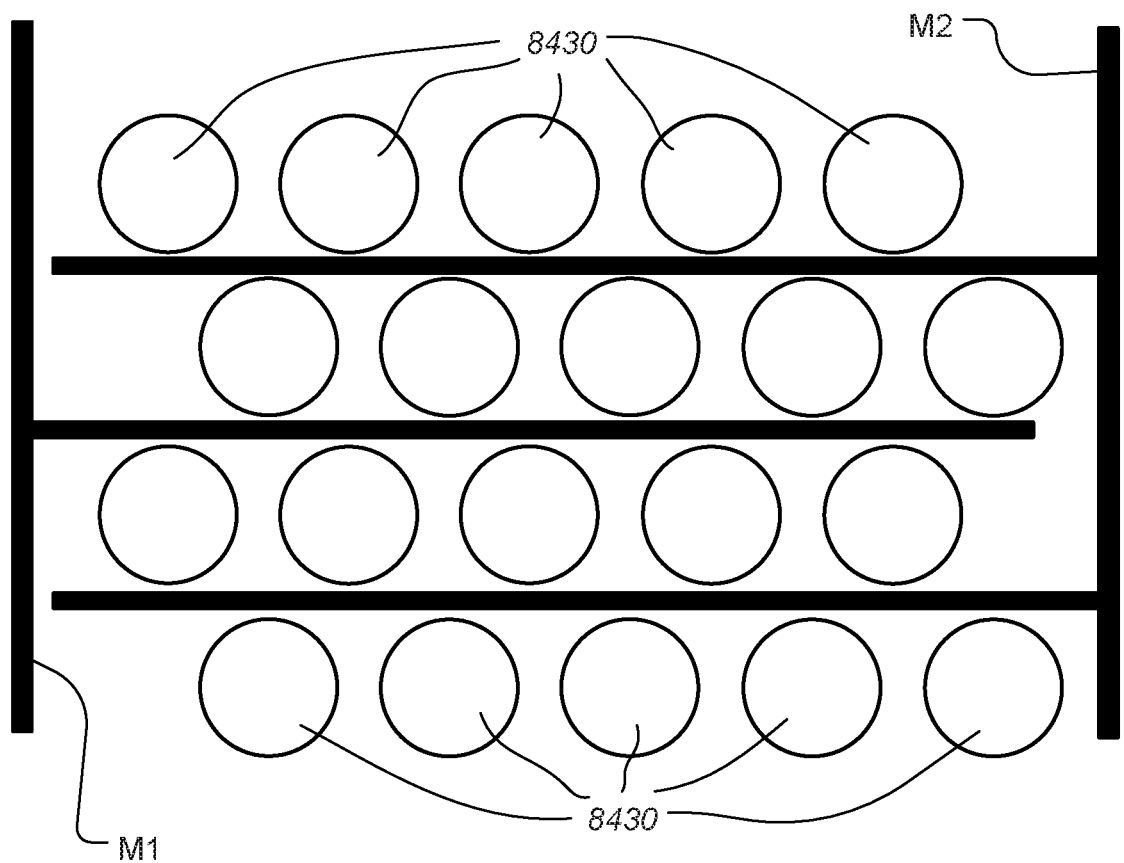
FIG. 84I is a plan view showing microstructure holes or buried islands arranged in a hexagonal lattice, according to some embodiments.

FIG. 84I is a plan view showing microstructure holes or buried islands arranged in a hexagonal lattice, according to some embodiments. The holes and/or buried islands 8430 can have shapes ranging from circular, oval, polygonal, irregular and amoebic. Inter-digitated electrodes M1 and M2 are formed between microstructure holes and in the case of buried islands the M1 and M2 electrodes can be formed between the buried islands, and in some cases over the buried islands.

Figure 85A:
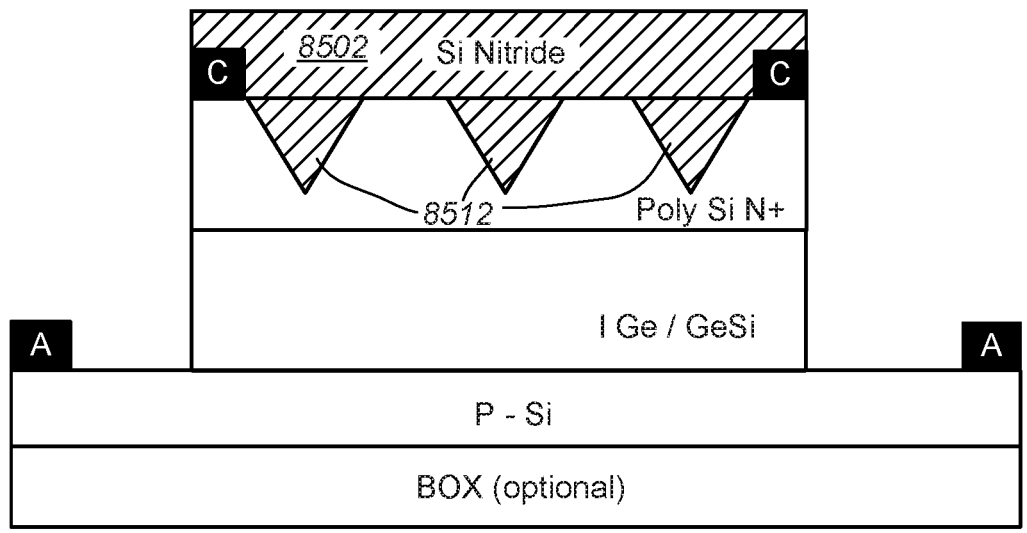
FIGS. 85A and 85B are cross-sections illustrating aspects of the use of dielectric materials in connection with some embodiments.
Figure 85B:
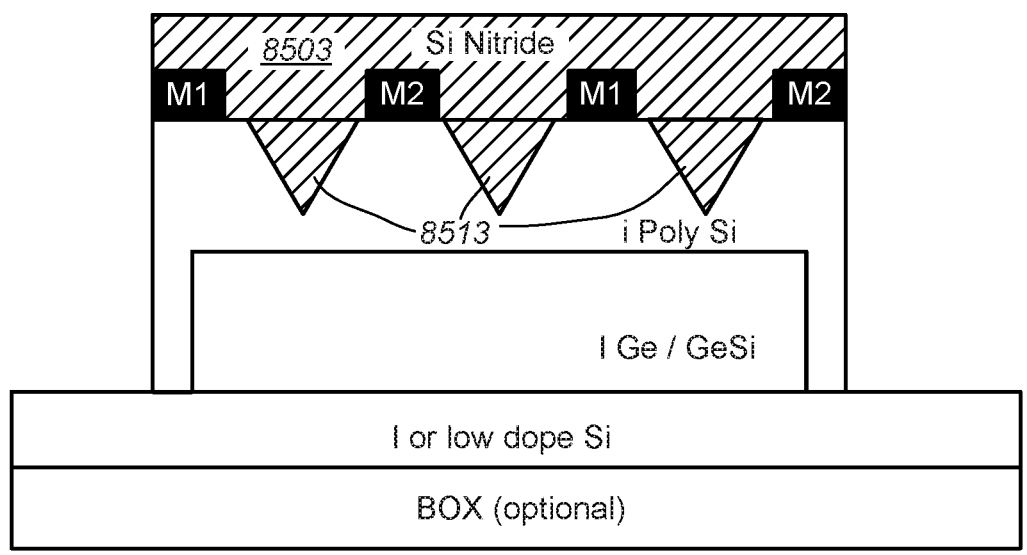

FIGS. 85A and 85B are cross-sections illustrating aspects of the use of dielectric materials in connection with some embodiments. Examples of the dielectric material used includes Si nitride, Si carbide, Si oxide, Al oxide, and Al. They can serve to apply stress to the I or low dope Ge/GeSi layer to enhance the absorption coefficient of Ge/GeSi to longer wavelengths such as 1700 nm to 2000 nm, and in some cases from 1550 nm to 2000 nm. FIG. 85A shows a dielectric layer 8502 such as Si nitride deposited in the microstructure holes 8512 and on the top surface of the poly Si N+ layer. The dielectric layer can have thickness ranging from 100 nm to 2000 nm or more, and in some cases can encapsulate the entire mesa which include the I or low dope Ge/GeSi layers.

FIG. 85B shows a lateral structure with similar dielectric layer 8503 deposited in the microstructure holes 8513 and above the microstructure hole to apply stress to the I or low dope Ge/GeSi. And in some cases the dielectric layer can encapsulate the entire photodiode.

Figure 86A:
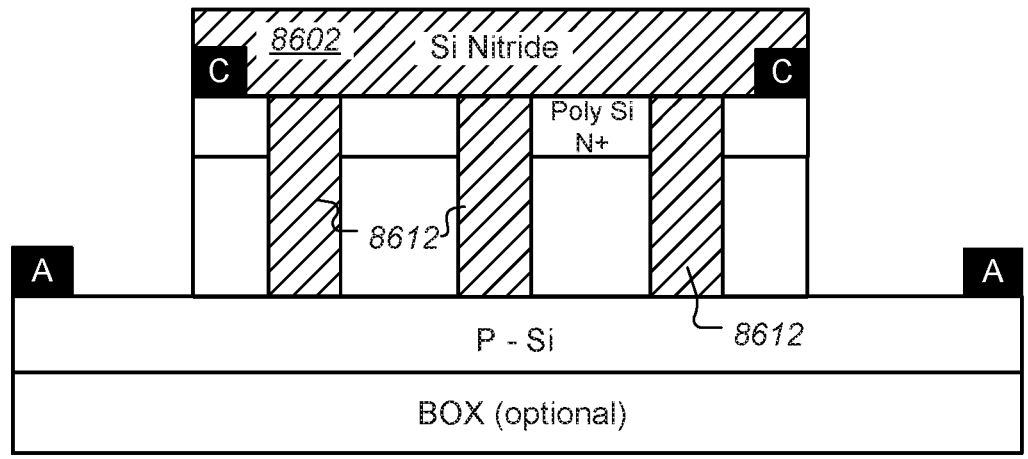
FIGS. 86A and 86B are cross-sections illustrating structures having microstructure holes etched into an I or low dope Ge/GeSi layer, and in some cases etched through the I or low dope Ge/GeSi layer to a P Si layer.
Figure 86B:
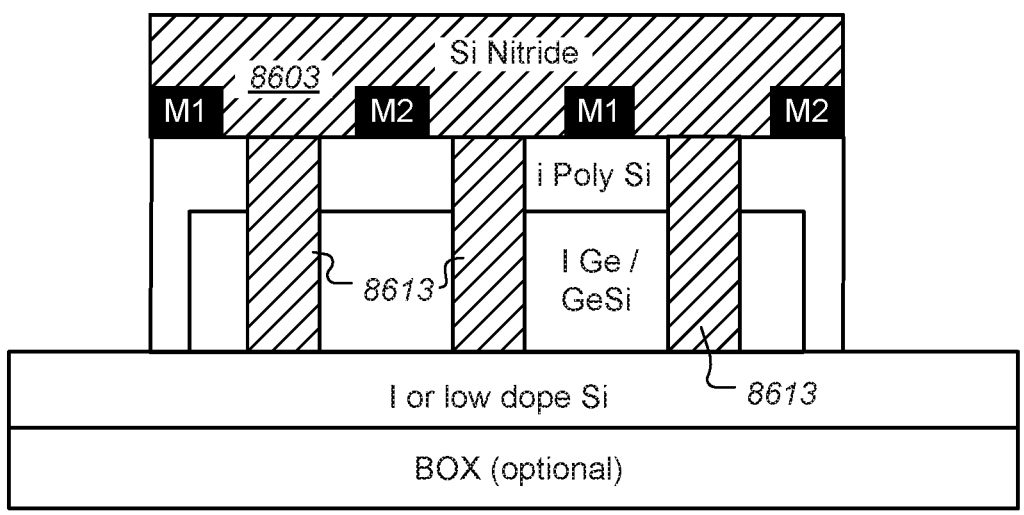

FIGS. 86A and 86B are cross-sections illustrating structures having microstructure holes etched into an I or low dope Ge I GeSi layer, and in some cases etched through the I or low dope Ge I GeSi layer to a P Si layer. In FIG. 86A a dielectric layer 8602 fills the microstructure holes 8612 and is also deposited on top of the microstructure holes. The dielectric layer 8602 can be Si nitride, Si carbide, Si oxide, Al oxide, Al nitride, or Ga nitride to name a few. The dielectric material applies stress to the I or low dope Ge I GeSi to enhance the absorption coefficient to wavelength between 1550 nm and 2000 nm, and in some cases between 1200 nm and 2000 nm.

FIG. 86B shows a lateral MSM structure with microstructure holes 8613 etched into the I or low dope Ge/GeSi, and in some cases through the I or low dope Ge/GeSi to the I or low dope Si layer. The dielectric layer 8503 as in layer 8602 in FIG. 86A applies a stress to the I or low dope Ge to enhance the absorption coefficient of Ge/GeSi at wavelength range of 1200 nm to 2000 nm, and in some cases 1500 nm to 2000 nm.

The dielectric layer can have a thickness range from 100 nm to 2000 nm or more. Not shown are anti-reflection coating or nanograss to reduce reflection. The dielectric layer such as the SiN in some cases can be a thin film with thickness ranging from 50 nm-1000 nm or more covering the Ge/GeSi with or without microstructure holes to provide stress. In some cases the holes can be islands or Si, Poly Si, or dielectrics where Ge/GeSi are epitaxially overgrown using process such as ELOG.

Figure 87A:
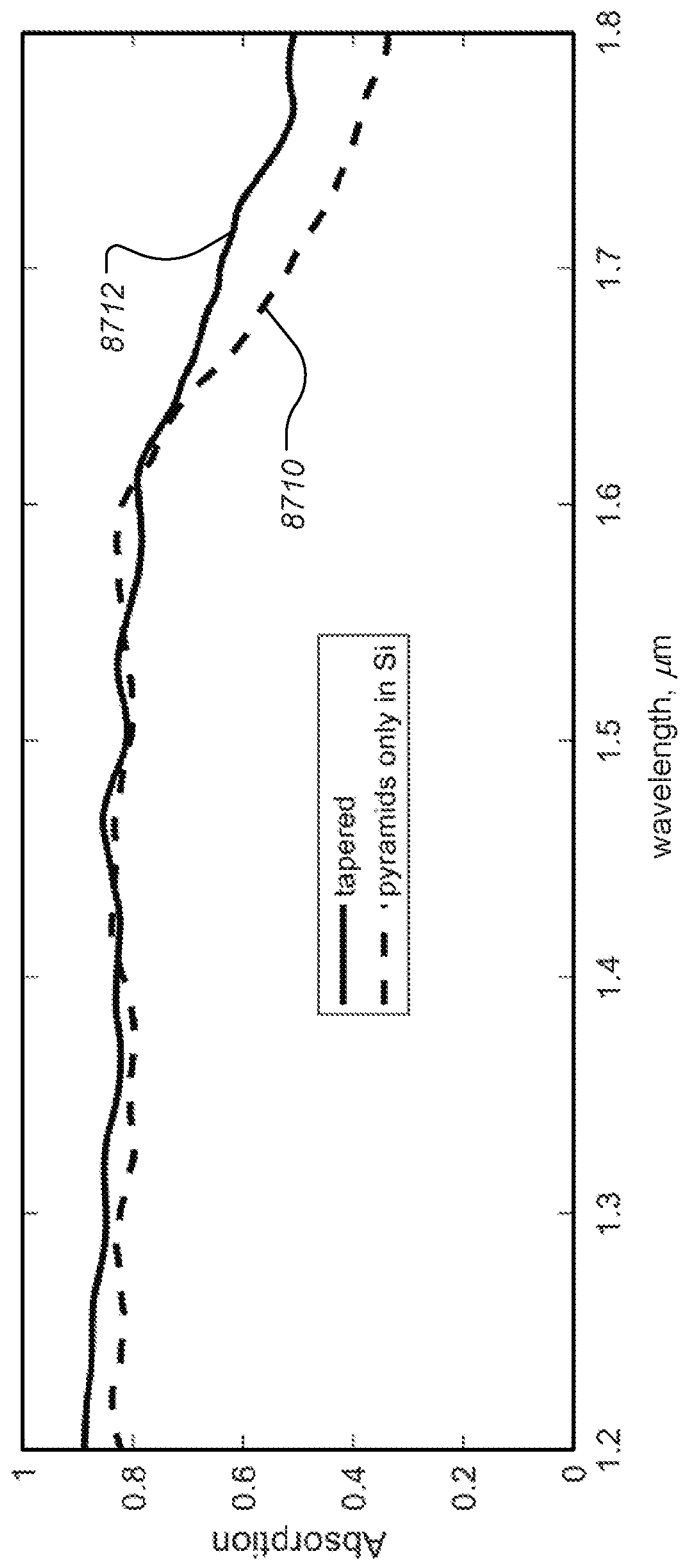
FIG. 87A illustrates a finite difference time domain (FTTD) simulation of the optical field absorption in structure similar to FIG. 83A, and FIGS. 87B and 87C are vertical cross-sections illustrating funnel holes and inverted pyramid microstructures, according to some embodiments.
Figure 87B:
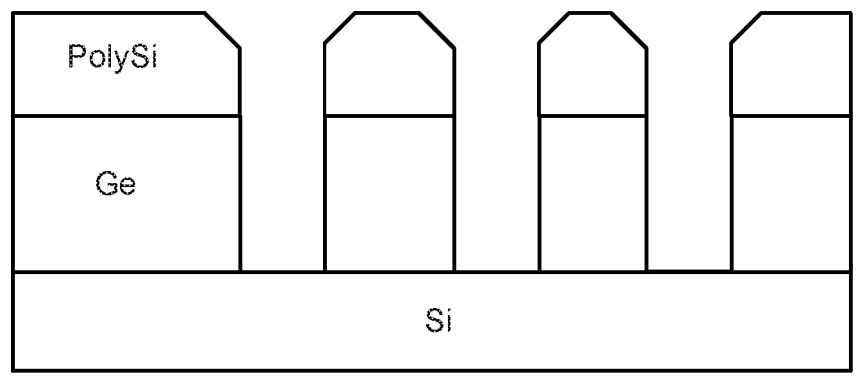
Figure 87C:
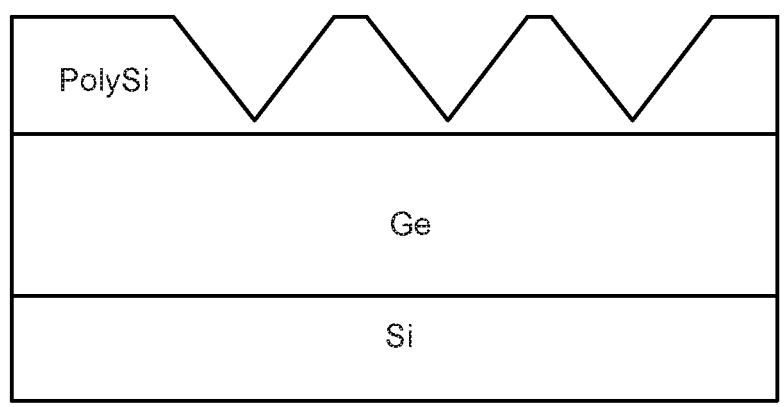

FIGS. 87A-87C illustrate a finite difference time domain (FTTD) simulation of the optical field absorption in structure similar to FIG. 83A. FIG. 87A is a plot of absorption vs. optical wavelength for the structure shown in FIG. 87C having inverted pyramids in a poly Si layer (curve 8710), and also for the structure shown in FIG. 87B with funnel holes etched through the poly Si layer and through the Ge layer to the N substrate (curve 8712). A BOX layer is not included in either case. The microstructure holes have a diameter or lateral dimension of 1100 nm and a period of 1700 nm. In the case of the inverted pyramids of FIG. 87C the poly Si layer is 800 nm, the Ge is 1600 nm, and the bottom Si layer is 1000 nm. In the case where funnel holes of FIG. 87B are etched through the Ge layer to the bottom Si layer, the top poly Si layer is 300 nm. The simulation shows absorption which is directly proportional to quantum efficiency and/or external quantum efficiency as a function of wavelength from 1200 nm to 1800 nm. The enhanced absorption is approximately 80% between 1200 and 1600 nm, and monotonically drops to approximately 50% at 1800 nm. EQE can be directly proportional to absorption and can similarly have an EQE of approximately 80% between 1200 to 1600 nm, and monotonically dropped to approximately 50% at 1800 nm. Anti-reflection coating or nanograss are not included.

Note that the structures shown in FIGS. 87B and 87C are compatible with CMOS/BiCMOS processes and can be monolithically integrated with CMOS/BiCMOS ASICs on a single Si chip.

In this simulation the microstructure holes have a square lattice, and in some cases the microstructure holes can be periodic, aperiodic, and/or random, and/or any combination thereof.

Figure 88A:
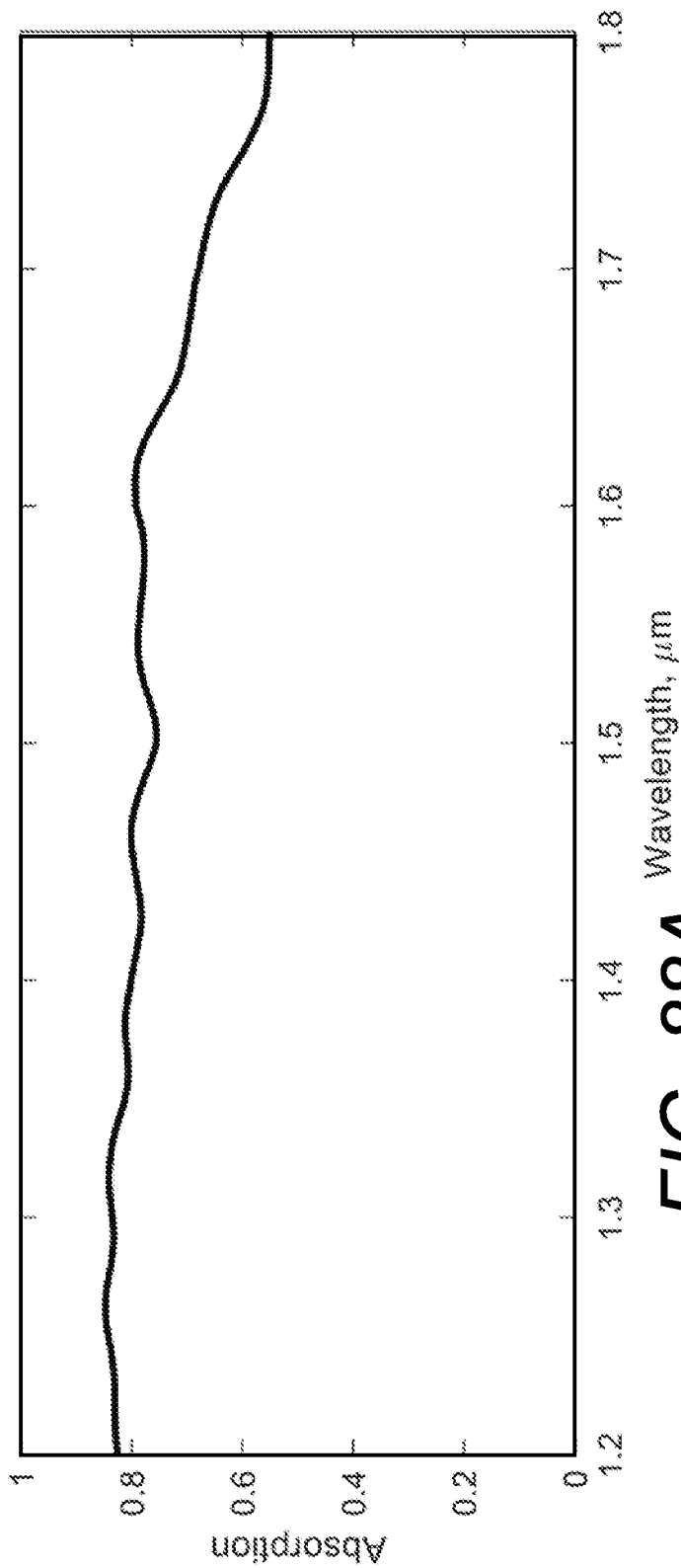
FIG. 88A illustrates an FDTD simulation of enhanced absorption in a microstructure device.
Figure 88B:
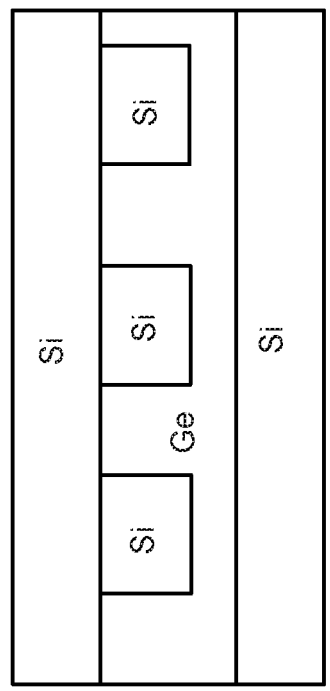
FIG. 88B is a partial cross-section of a photodetector, according to some embodiments.

FIGS. 88A and 88B illustrate an FDTD simulation of enhanced absorption in a microstructure device. FIG. 88A is a plot of the FDTD simulation and FIG. 88B shows the layer structure used for the simulation. The dimensions of the microstructure are as follows. The bottom layer is 1000 nm of Si, followed by a Ge layer of 1600 nm thickness with microstructure holes etched 1000 nm, and the microstructure holes have a period of 1700 nm, and a diameter of 1100 nm. The microstructure holes are cylindrical in shape, in a square lattice. Poly Si is deposited on the Ge microstructure holes covering the microstructure holes entirely, with a thickness of 1300 nm measured from the bottom of the hole to the top surface of the poly Si. Light impinges from the top surface. The Ge has a strain of approximately 0.6%. The plot in FIG. 88A shows enhanced absorption as a function of wavelength from 1200 nm to 1800 nm. The enhanced absorption is approximately 80% from 1200 nm to 1600 nm with a monotonic decrease to approximately 50% absorption at 1800 nm. The quantum efficiency, and or external quantum efficiency is directly proportional to the enhanced absorption. The external quantum efficiency can be approximately 80% from 1200 nm to 1600 nm and with a monotonic decrease to approximately 50% at 1800 nm. In some cases the EQE can be greater than 60% from 1200 nm to 1600 nm, and in some cases the EQE can be greater than 45% from 1200 nm to 1800 nm at certain wavelengths. In this structure, holes are etched in the Ge and covered entirely by poly Si. The top surface of the poly Si can be approximately planar and anti-refection, and/or nanograss can be applied to reduce reflection. In some cases light can impinge from the bottom surface.

For LiDAR applications the laser pulses can be transmitted in a coded pulse stream similar to that of data communication pulse streams in order to minimize interference from LiDAR transmission from other automobiles. The coded pulse stream can be a series of on and off pulses similar to 0 and 1 in a data communication pulse stream with return to 0 format. In some cases non-return to 0 format can also be used. Other methods of minimizing interference from other LiDAR units can be the use of multiple spectrums of lasers, and in some cases can use coincidence methods to detect light reflected from the target. In some cases cross-polarization filters can be used on photodetectors to minimize light from opposing LiDARs FIGS. 89A and 89B illustrate an FDTD simulation of a microstructure PIN photodiode similar to the structures simulated in FIGS. 87A-87C. The structure simulated is shown in FIG. 89B. The microstructure holes are etched into the Ge and the microstructure holes are filled with SiN and have a surface thickness of 300 nm. The SiN thickness measured from the bottom of the microstructure hole to the top surface of the SiN is 1500 nm. The bottom layer is N+SI 1000 nm, the I or low dope Ge ranges from 500-1600 nm, followed by P Si of 200 nm. Microstructure holes are etched into the poly Si and Ge with a period of 1700 nm and diameter of 1100 nm in a square lattice. In the case of Ge with a thickness of 1000 nm or 1600 nm the holes are etched to a depth of 1200 nm. In the case where the Ge is 500 nm the holes are etched to a depth of 700 nm. The microstructure holes are filled with SiN and has a surface thickness of 300 nm. In FIG. 89A, the solid curve 8910 is for the case of 1600 nm thick I Ge with holes etched to a depth of 1200 nm, and the holes filled with SiN. Enhanced absorption is approximately 90% to 1350 nm and monotonically drops to approximately 50% at 1800 nm. EQE is directly proportional to enhanced absorption and can have a quantum efficiency greater than or equal to 80% for some wavelengths ranging from 1200-1350 nm, and greater than 50% for some wavelength ranging from 1350-1800 nm. The Ge has a strain of 0.6%. The dashed curve 8912 shows a comparable Si Ge Si PIN photodiode without microstructure holes and without SiN. In some cases, the microstructure hole PIN photodiode has EQE that is greater than the EQE of a comparable Si Ge Si photodiode without holes in the wavelength span of 1200-1800 nm at certain wavelengths. The vertical axis is absorption, and the horizontal axis is wavelength in microns.

Figure 89C:
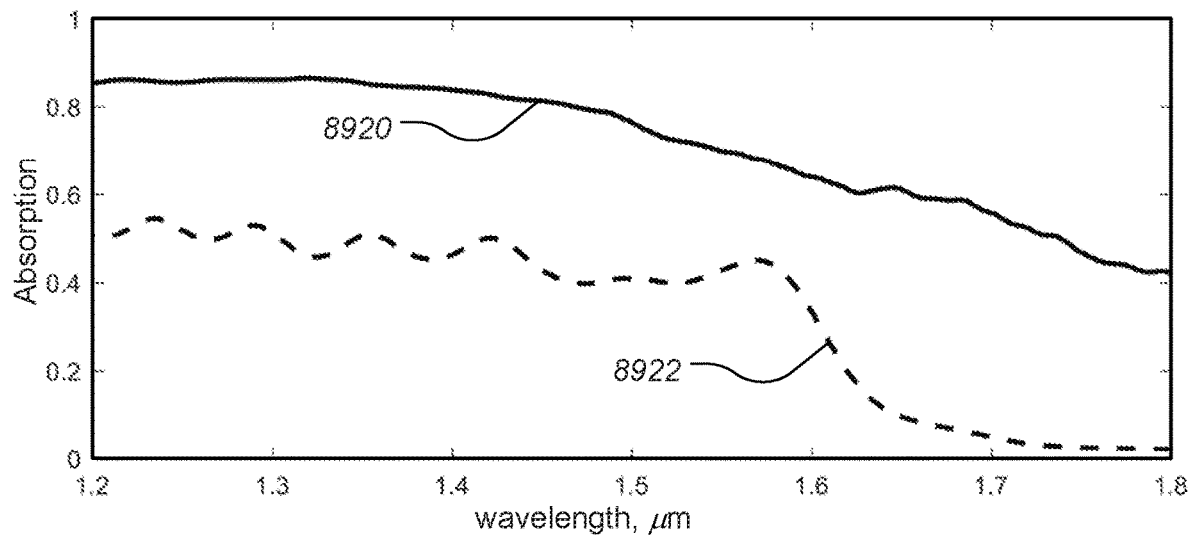
FIGS. 89C and 89D are plots of FDTD simulations of further variations of the structure shown in FIG. 89B.
Figure 89D:
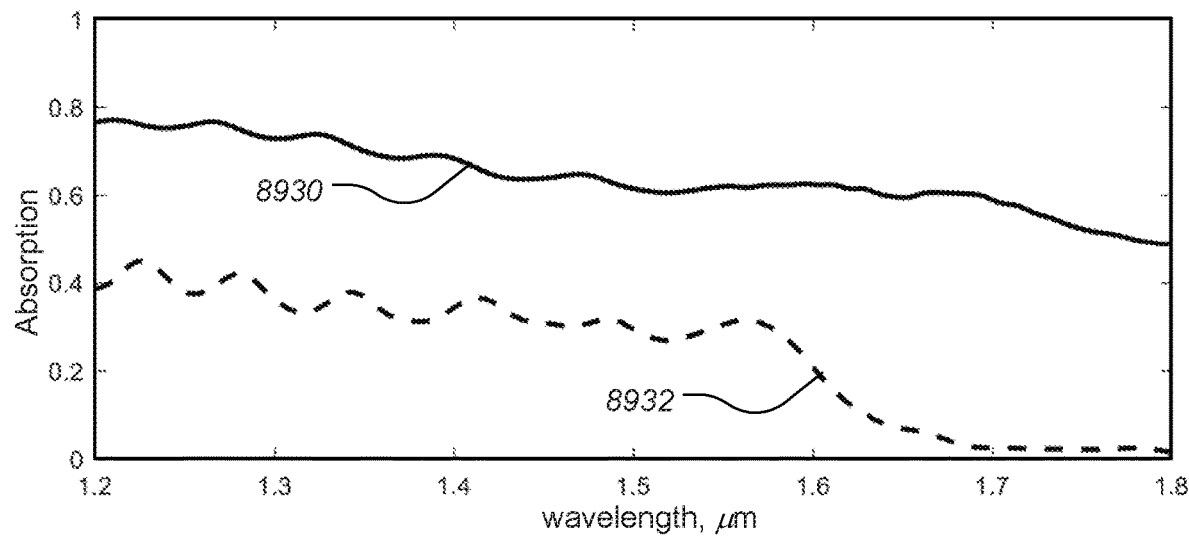

FIGS. 89C and 89D are plots of FDTD simulations of further variations of the structure shown in FIG. 89B. In FIG. 89C the solid curve 8920 shows the case where the I Ge layer has a thickness 1000 nm. The dashed curve 8922 is the equivalent Si Ge Si PIN photodiode without microstructure holes. In FIG. 89D the solid curve 8930 shows the case where the I Ge has a thickness of 500 nm. The dashed curve 8932 is the equivalent photodiode without microstructure holes.

As can be seen, for the 500 nm I Ge case with enhanced absorption the device achieves greater than 70% absorption over the wavelength range of 1200-1350 nm that monotonically decrease to approximately 50% from 1350-1800 nm. A 20-microns diameter PIN Si/Ge/Si microstructure photodiode with 500 nm I Ge layer can have a data bandwidth equal to or greater than 30 Gb/s and in some cases 50 Gb/s with quantum efficiency greater than or equal to 40% at certain wavelengths in the wavelength span of 1200-1800 nm.

Figure 89E:
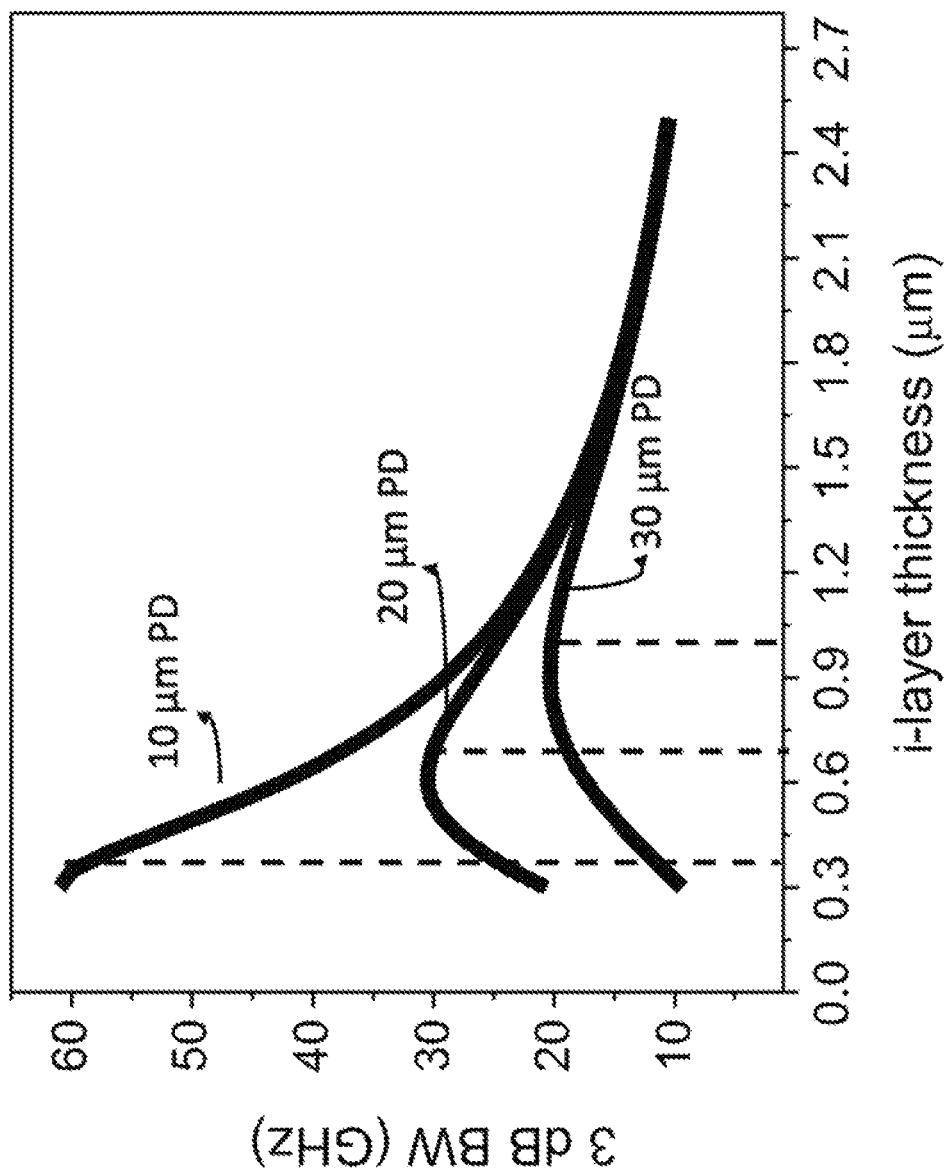
FIG. 89E is a plot of a calculation of the photodiode 3 dB bandwidth (Ghz) vs I layer thickness of a Si-I Ge—Si PIN microstructure hole photodiode.

FIG. 89E is a plot of a calculation of the photodiode 3 dB bandwidth (Ghz) vs I layer thickness of a Si-I Ge—Si PIN microstructure hole photodiode. The plot shows 3 curves representing different photodiode diameter examples: um, 20 um, 30 um (microns). The calculation takes into account the transit time of photo generated carriers in the I Ge layer, and the capacitance of the PIN junction which gives the RC time where R is the resistance (in this case 50 ohms) and C is the junction capacitance. As can be seen, for a thin I—Ge layer of approximately 0.5 um a bandwidth of greater than 40 Ghz can be reached with a 10 um diameter Si—Ge—Si PIN microstructure photodiode. For I Ge layer thickness of approximately 0.3 um a bandwidth greater than 50 Ghz can be reached by a Si—Ge—Si microstructure photodiode. An I Ge layer thickness of 0.9 um can achieve bandwidth of 20 Ghz with a photodetector diameter of 30 um. As the I Ge layer thickness is reduced to less than or equal to 1 um, the microstructure holes photodetector can have a higher EQE than a comparable photodetector without microstructure holes. The microstructure holes can be buried by poly Si and in some cases can be buried by dielectrics, and in some cases the microstructure hole can be predominately in the poly Si and/or other amorphous or poly crystalline semiconductor.

The microstructure holes can be wet or dry etched, and in some cases can be inverted pyramids, cylindrical, funnel, conical, trapezoidal, and/or any combination of shapes. The lateral dimension of the microstructure hole, or buried hole can range from 300 nm to 2000 nm, in some cases from 600 nm to 1700 nm, and in some cases from 700 nm to 1200 nm. The depth of the microstructure hole, or buried hole can range from 100 nm to 2000 nm, and in some cases from 300 nm to 1000 nm. The spacing between the nanostructure holes can range from 0 nm to 2000 nm, and in some cases from 0 nm to 1000 nm. The microstructure holes or buried holes can be periodic, and/or aperiodic, and/or random, and/or any combination there of.

FIG. 90A is a plan view of microstructure photodetectors monolithically integrated with CMOS/BiCMOS ASICs on a single chip having receptacle holes for surface emitting lasers, according to some embodiments. The single chip 9000 includes a 2×4 array of MSPDs/MSAPDs 9030, CMOS/BiCMOS ASICs 9032 and receptacle holes 9034. VCSEL devices can be positioned in receptacles 9034 using fluidic assembly methods, and in some cases the use of a fluid may be omitted. In this example the receptacle holes 9032 in the Si chip 9000 are circular such that surface emitting lasers with similar circular shape can be fluidic assembled with high probability resulting in a high yield. Not shown are the transmission lines connecting the photodetector and the laser to the CMOS/BiCMOS electronics. ASICs 9032 can comprise plural ASICs or other active electronic circuits spaced laterally from each other and each coupled with and processing electrical output from a respective one of photodetectors 9030 or from a respective group of two or more photodetectors 9030. One or more of said active electronic circuits can be coupled with one or more of VCSELs 9034 to activate it as needed. The individual active electronic circuits can be in any suitable configuration such as in a linear array, in a 2D array, of in a vertical arrangement such as a 3D array.

Figure 90B:
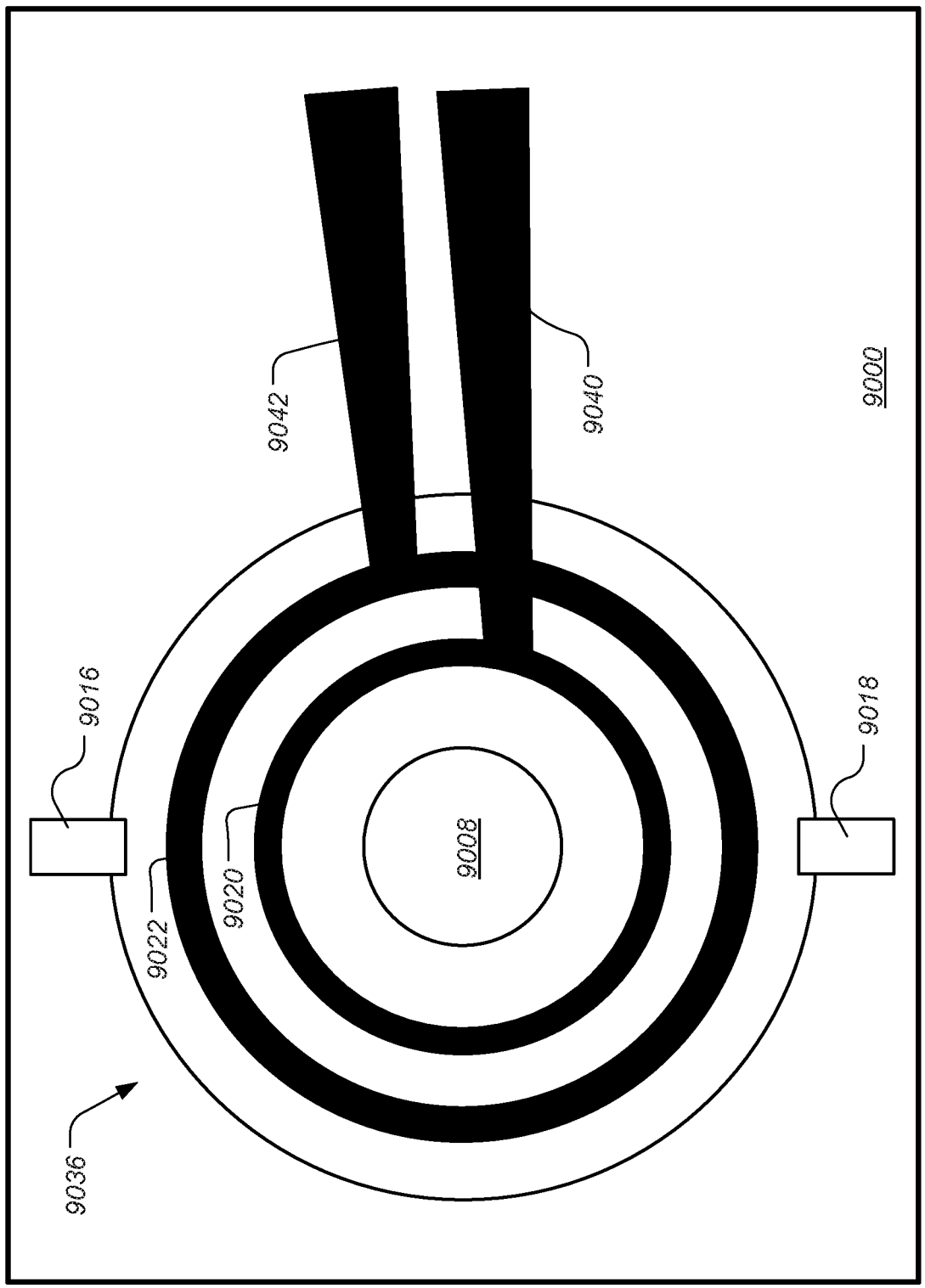
FIG. 90B shows a surface-emitting laser 9036 in a circular geometry with concentric anode 9020 and cathode 9022, according to some embodiments.

FIG. 90B shows a surface-emitting laser 9036 in a circular geometry with concentric anode 9020 and cathode 9022. Also shown are light emitting area 9008, transmission lines 9040 and 9042, and metal tabs 9016 and 9018. Due to the circular geometry, when the VCSEL 9036 falls into a circular receptacle hole in the Si chip 9000, it can be in any orientation for later attachment of transmission lines 9040 and 9042. Small tabs 9016 and 9018 that can be dielectric or metal prevent the circular laser from falling into the receptacle hole upside down during fluidic assembly. Following fluidic assembly, the VCSEL 9036 is attached or bonded to the chip 9000 for example using solder in the bottom of the receptacle hole. After bonding, using known photo lithographic techniques the transmissions lines 9040 and 9042 can be connected to the anode 9020 and cathode 9022, respectively. The transmission lines 9040 and 9042 form a connection with the CMOS/BiCMOS ASICs (shown in FIG. 90A.).

Figure 90C:
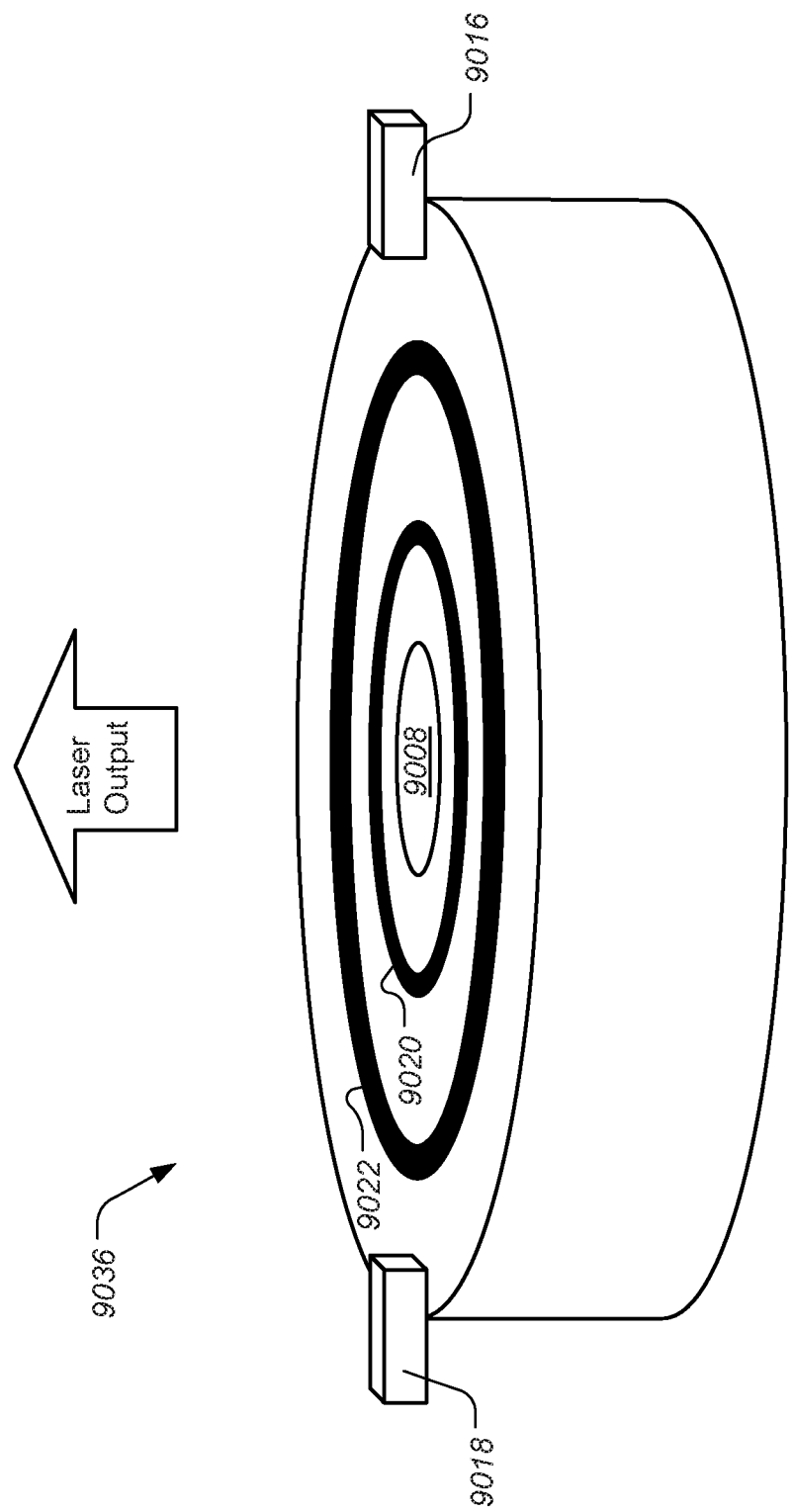
FIG. 90C is a perspective view of a surface emitting laser, according to some embodiments.

FIG. 90C is a perspective view of a surface emitting laser, according to some embodiments. The VCSEL 9036 is shown having a "hockey puck" like geometry. Visible are the concentric anode 9020 and cathode 9022, and the lasing region 9008 and with dielectric or metal tabs 9016 and 9018 on the surface. The surface emitting laser 9036 is typically made out of III-V material, the bottom of the surface emitting laser can have a metal contact such as Indium that can be attached to the bottom of the receptacle hole which can also have Indium such that with heating the surface emitting laser chip can be soldered down. In some cases the bottom of the receptacle hole can be part of a transmission line. The receptacle hole can be etched into Si and in some cases the receptacle hole can be Si dioxide, or a dielectric, or a combination of Si and dielectric.

Figure 90D:
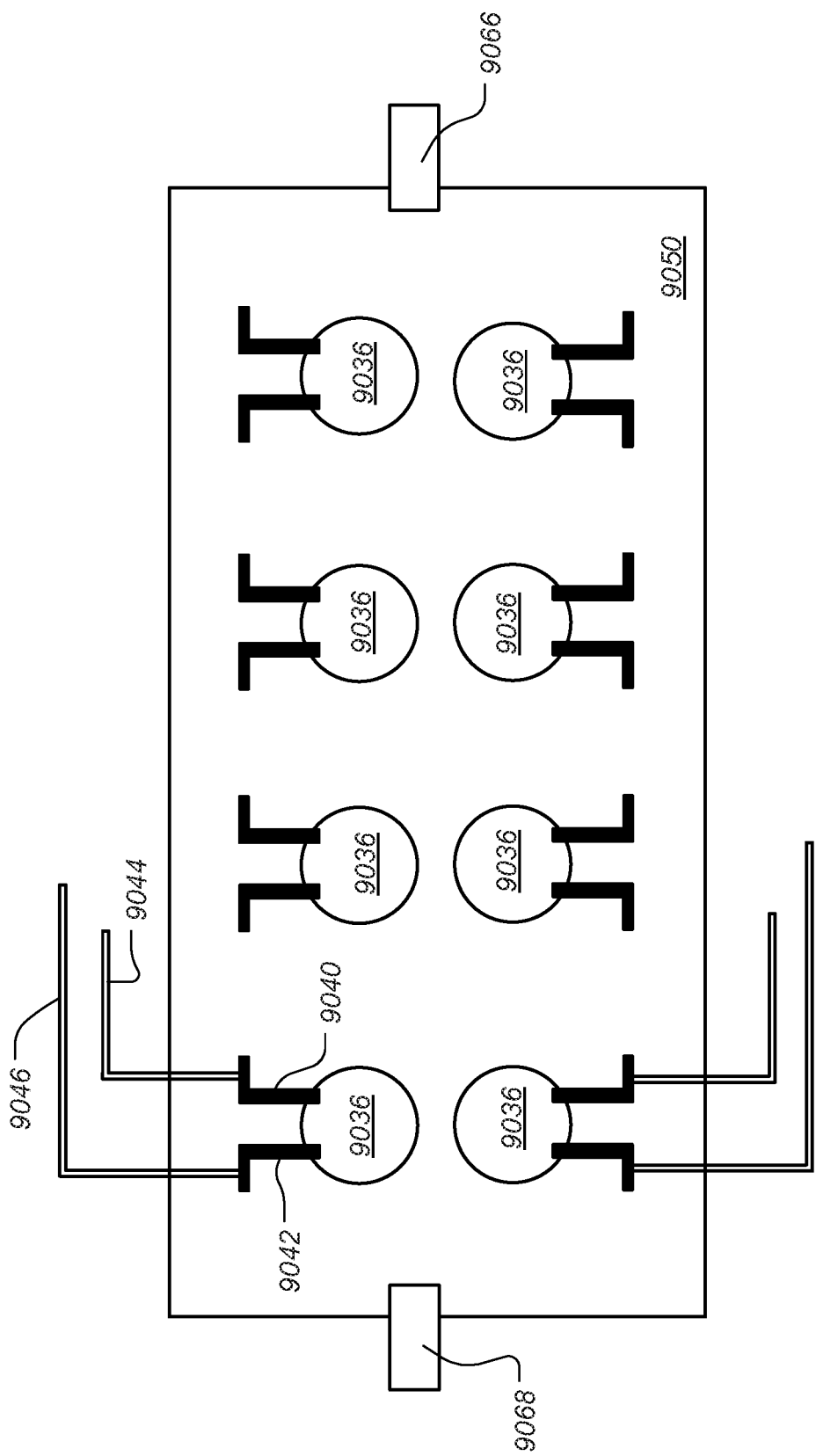
FIG. 90D is a plan view of a 2-D array of surface emitting lasers on a rectangular III-V chip, according to some embodiments.

FIG. 90D is a plan view of a 2-D array of surface emitting lasers on a rectangular III-V chip, according to some embodiments. Chip 9050 includes an array (in this case 2×4) of VCSELs 9036. Each VCSEL has anode and cathode electrodes positioned in such a way that the rectangular chip 9050 can be fluidic assembled in two possible orientations and can be connected to transmission lines (e.g. 9044 and 9046) that are connected to laser drivers in the CMOS/BiCMOS ASICs (e.g. shown in FIG. 90A). Metal or dielectric tabs 9066 and 9068 can be included such that the rectangular chip will not fall into the receptacle hole upside down. To allow 2 orientations the anode and cathode can have a 180-degree rotation symmetry. The configuration illustrated in FIG. 90D alternatively can be square-shaped such that it has 4-fold symmetry and the chip can be fluidic assembled with any 4 rotation orientations. Transmission lines can be added to all 4 edges.

In some cases, fluidic assembly can be used with III-V material that are not completely processed into devices and where upon completion of fluidic assembly, the III-V material can be processed back end of line to complete the laser arrays. The laser can be vertical cavity surface emitting laser, and in some cases can be lens integrated surface emitting laser, and in some cases can be edge emitting lasers.

Anderson et al, PSM4 Technology & Relative Cost Analysis Update; www.ieee802.org/3/bm/public/jan13/anderson_01_0113optx.pdf, incorporated by reference herein, discusses LISEL array for a parallel single mode fiber with 4 channels.

Figure 91A:
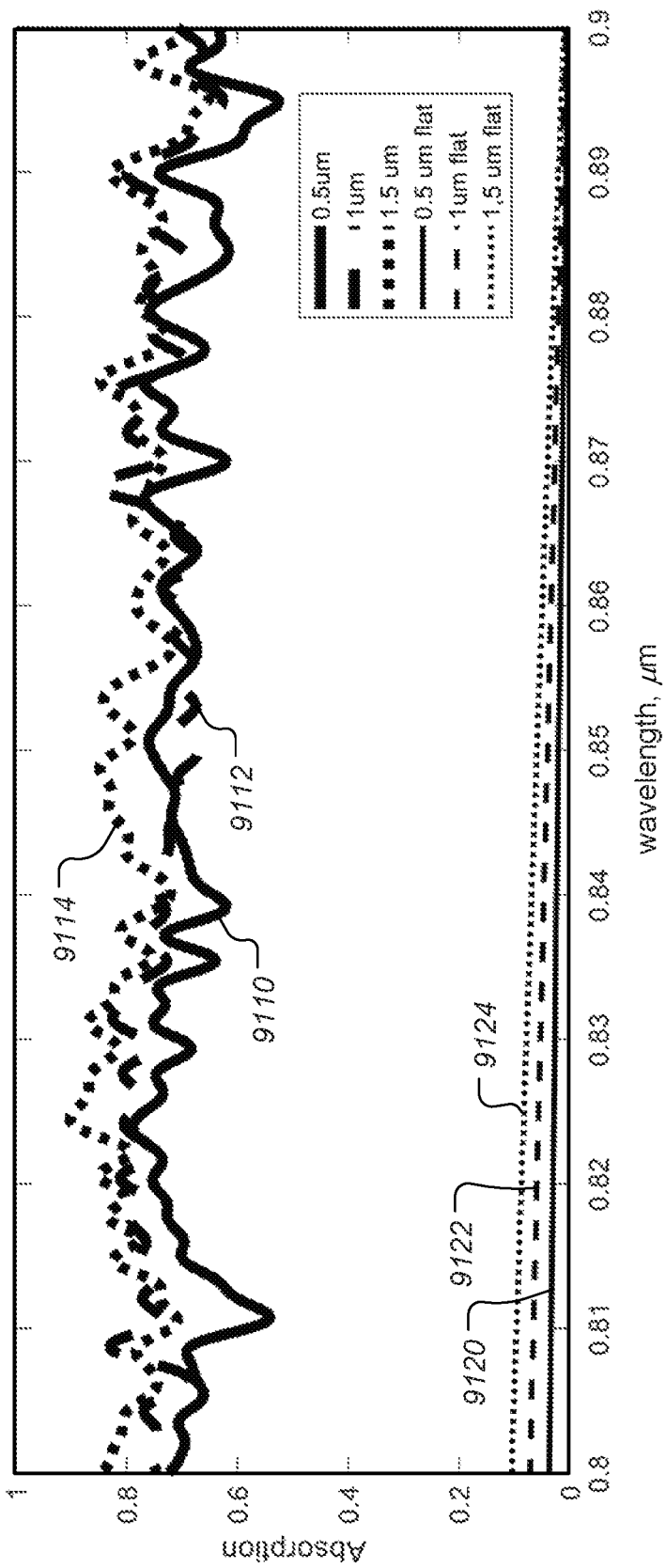
FIG. 91A is plot of an FDTD simulation of the optical field for some all-silicon MSM lateral photodiodes and some all-silicon vertical PIN photodiodes.
Figure 91B:
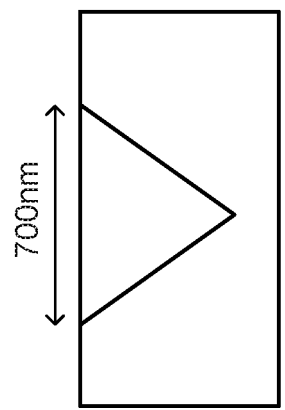
FIG. 91B is a partial cross-section illustrating a structure shape, according to some embodiments.

FIGS. 91A and 91B illustrate an FDTD simulation of the optical field for some all-silicon MSM lateral photodiodes and some all-silicon vertical PIN photodiodes. In some cases, the lateral MSM can also include P and N doping to provide a lateral PIN. The simulated structure includes an Si layer having a thickness of 0.5, 1, or 1.5 microns formed on a BOX layer of 1 micron and underlying on silicon substrate. Inverted pyramids, depicted in FIG. 91B, of 700 nm lateral dimension are wet etched into the Si with approximate depth of 500 nm. The inverted pyramid holes have a period of 825 nm in a square lattice. In FIG. 91A, the vertical axis is absorption, and the horizontal axis is wavelength from 800 nm-900 nm. The upper curves 9110, 9112 and 9114 shows photodiodes with microstructure inverted pyramids for Si layer thicknesses of 0.5, 1, 1.5 microns respectively. Absorption is predominately above 60%, and in some cases approximately 80% at certain wavelengths, for wavelengths from 800-900 nm. The lower curves 9120, 9122 and 9124 show comparable photodiodes without microstructure holes for Si layer thicknesses of 0.5, 1, 1.5 microns respectively. As can be seen, the devices without microstructure holes have absorption of approximately 10% or less in the wavelength range 800-900 nm. Absorption is directly proportional to external quantum efficiency (EQE), and in some cases EQE can equal absorption. Photodiodes with microstructure holes can have EQE greater than comparable photodiodes without microstructure holes. In some cases, microstructure hole photodetector EQE can be two times higher than the EQE of comparable photodiode without microstructure holes over the wavelength 800-900 nm. In some cases, the EQE can be three times higher or more at certain wavelengths, and in some cases five times or more at certain wavelengths between 800-900 nm.

Figure 91C:
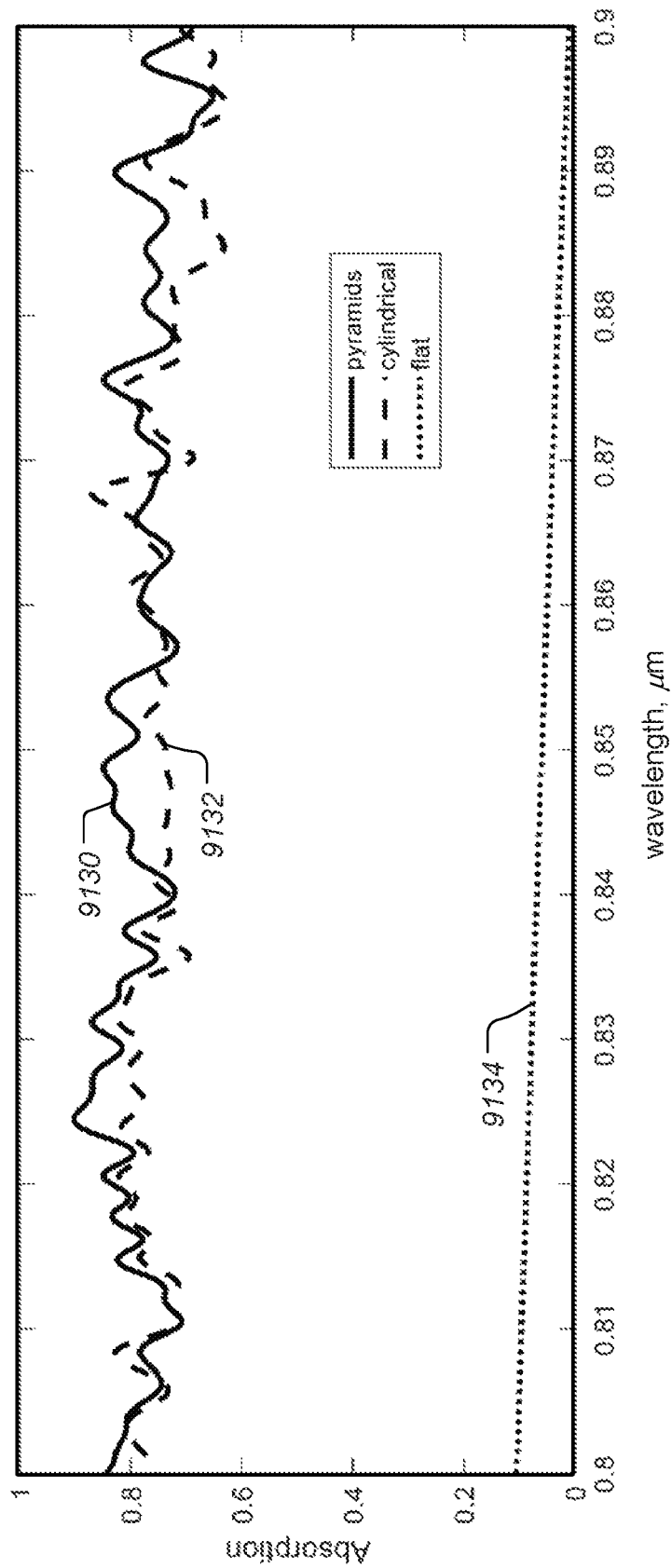
FIG. 91C is a plot of FDTD simulations comparing photodetectors having microstructure inverted pyramids and microstructure cylindrical shaped holes, according to some embodiments.

FIG. 91C is a plot of FDTD simulations comparing photodetectors having microstructure inverted pyramids and microstructure cylindrical shaped holes, according to some embodiments. The holes have lateral dimensions of 700 nm, depth of 500 nm, in a square lattice with 825 nm periods. The Si layer is 1.5 microns on a BOX layer of 1 micron on Si substrate. Curves 9130, 9132 and 9134 are for inverted pyramids, cylindrical, and "flat" (no microstructure holes), respectively. As can be seen from the plots the absorption vs wavelength characteristics for the inverted pyramids and the cylindrical holes both have greater than 60% absorption over the wavelength span of 800-900 nm. The Si photodetector without microstructure holes has approximately less than 10% absorption in the wavelength span of 800-900 nm. At some wavelengths the cylindrical holes have a slightly lower absorption than inverted pyramid microstructure holes.

Figure 91D:
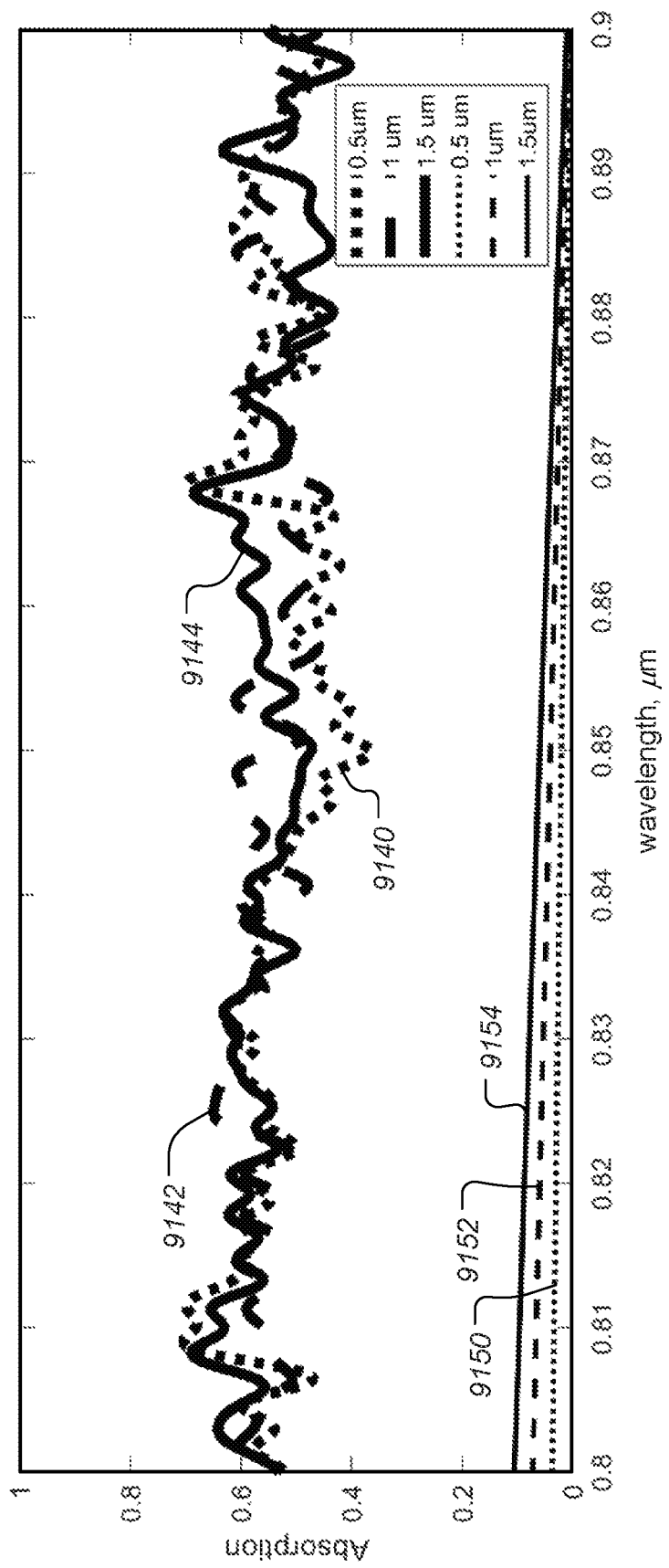
FIG. 91D is a plot of FDTD simulations of structures having shallow microstructure holes of 250 nm depth.
Figure 91E:
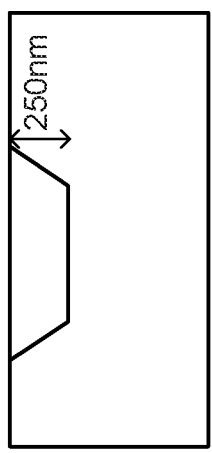
FIG. 91E is a partial cross-section illustrating a structure shape, according to some embodiments.

FIGS. 91D and 91E illustrate FDTD simulations of structures having shallow microstructure holes of 250 nm depth, according to some embodiments. In this simulation the structure, shown in FIG. 91E, includes inverted pyramids having a lateral dimension of 700 nm, etch depth of 250 nm, and a period of 825 nm in a square lattice. The Si layer is 0.5, 1, or 1.5 microns thick and is formed on a 1 micron thick BOX layer and on a Si wafer. In FIG. 91D, curves 9140, 9142 and 9144 show absorption for Si layer thicknesses of 0.5, 1, 1.5 microns, respectively. Curves 9150, 9152 and 9154 show absorption in a "flat" (no microstructure holes) for Si layer thicknesses of 0.5, 1, 1.5 microns, respectively. As can be seen in the simulation the shallower holes resulted in a decrease in absorption for wavelength range from 800-900 nm. The absorption is approximately 60%, and drops to approximately 50% at 900 nm as shown. The EQE of the shallow microstructure hole can be 2-3 times or greater than a comparable EQE of a Si photodetector without microstructure holes, at certain wavelengths, for wavelength range from 800-900 nm.

Figures 92A, 92B:
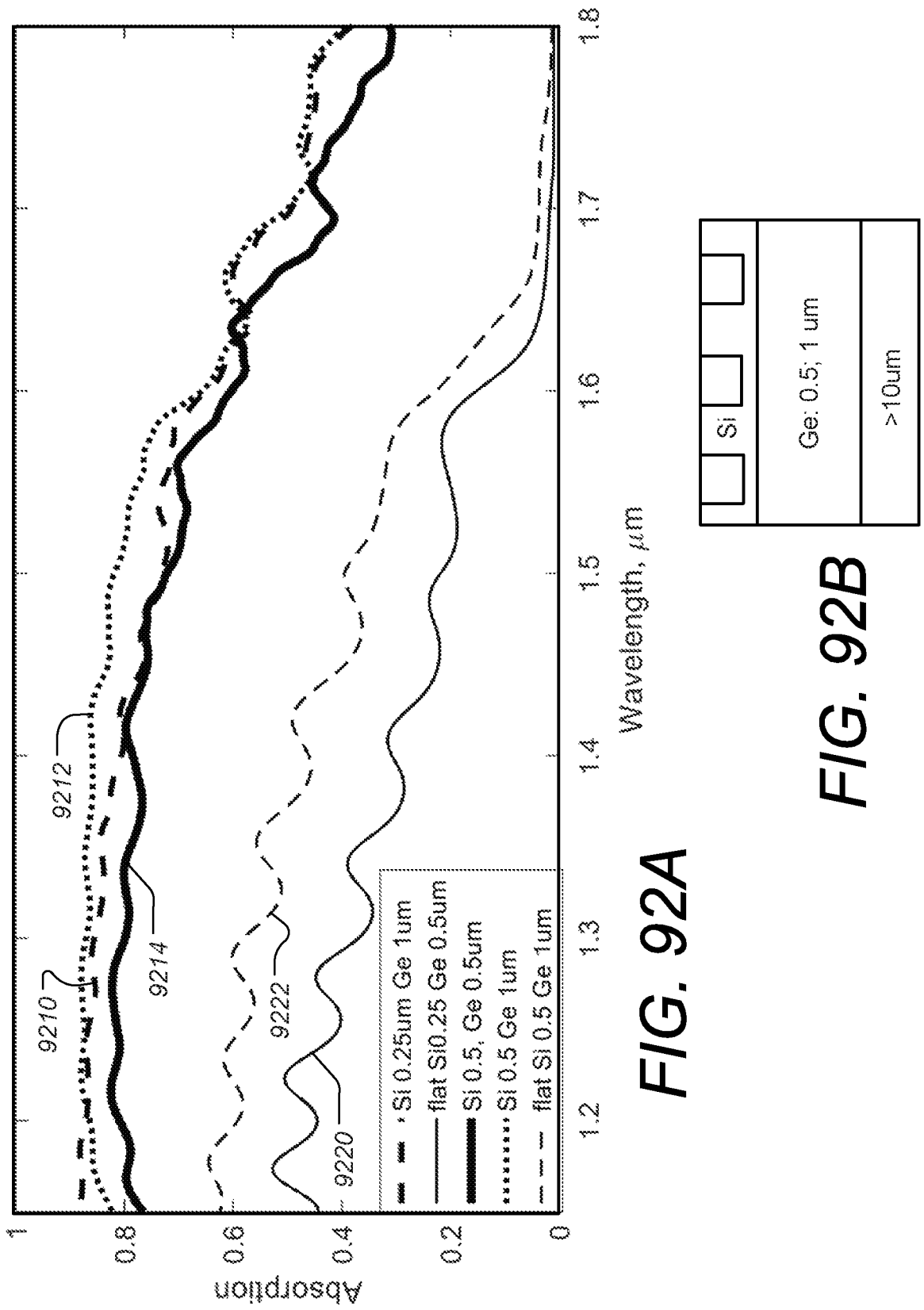
FIG. 92A is a plot of FDTD simulations of absorption vs wavelength for Ge on Si structures and having a poly Si layer on top of the Ge.
FIG. 92B is a partial cross-section of structure shapes, according to some embodiments.
Figure 92C:
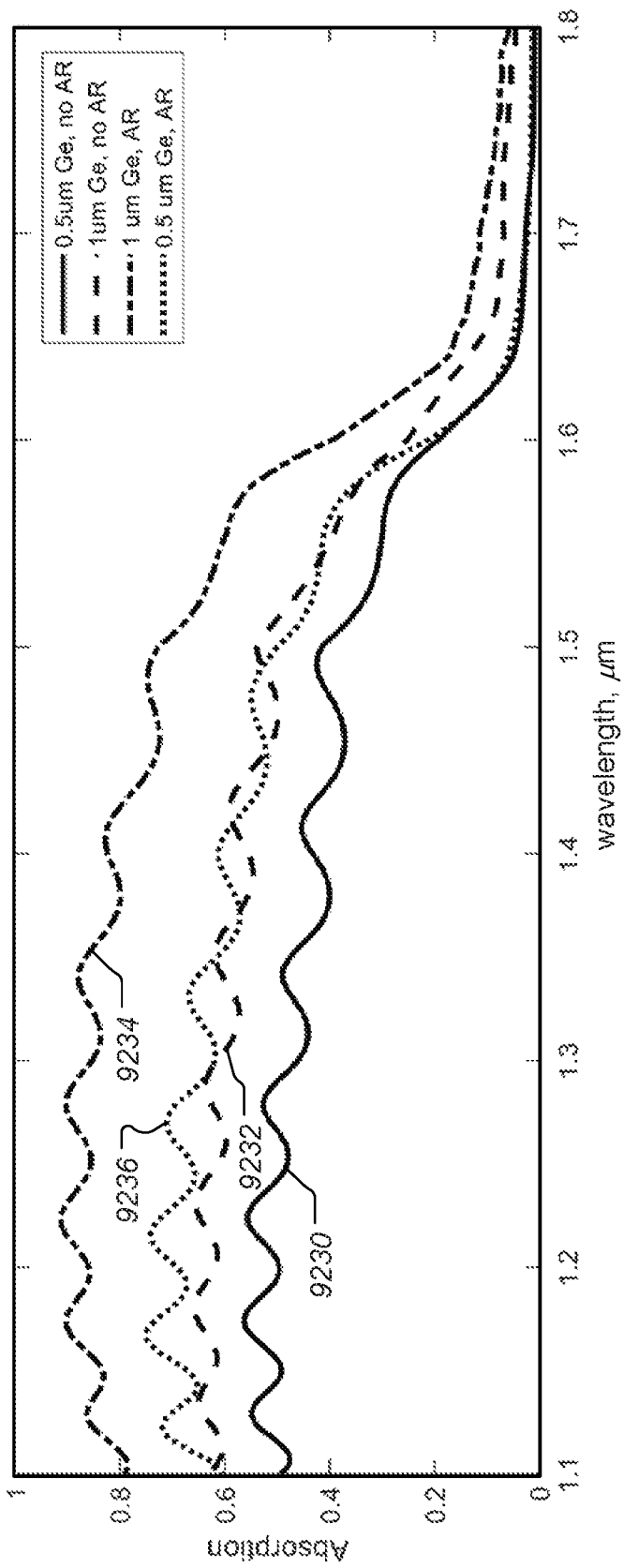
FIGS. 92C and 92E are plots of FDTD simulations of optical absorption vs wavelength for Ge on Si structures having Si pyramid islands with and without poly Si capping layer on the Ge surface.

FIGS. 92A and 92B illustrate FDTD simulations of absorption vs wavelength for Ge on Si structures and having a poly Si layer on top of the Ge, according to some embodiments. The simulated structure is depicted in FIG. 92B. The poly Si top layer has a thickness of 0.25 and 0.5 microns, and the lateral dimension of cylindrical microstructure holes is 1200 nm, for holes etched to a depth 90% of the poly Si layer thickness. The holes have a period of 1700 nm in a square lattice. The Ge layer is 0.5, and 1 micron thick, and the bottom Si layer is greater than 10 microns. The Ge layer can be strained. Curves 9210, 9212 and 9214 shows the cases of Poly Si=0.23 micron/Ge=1 micron, Poly Si=0.5 micron/Ge=1 micron, and Poly Si=0.5 micron/Ge=0.5 micron, respectively. The absorption is above 70% to 150 nm wavelength, and monotonically decreases to approximately 30% or more at 1800 nm wavelength. The lower curves 9220 and 9222 shows the cases of similar photodetector structures without microstructure holes (flat). And as can be seen, at wavelengths greater than 1600 nm the absorption rapidly decreased to less than 5%.

EQE can be directly proportional to absorption and the EQE of microstructure hole photodetector can be 1.5 times or greater than the EQE of a comparable photodetector without microstructure holes at certain wavelengths, in the wavelength range of 1200-1800 nm. In the wavelength range between 1600-1800 nm the EQE of microstructure holes photodetector can be 5 times or greater than comparable photodetectors without microstructure holes at certain wavelengths.

The poly Si—Ge—Si structure can be applied to both lateral and/or vertical photodetector structures, for example lateral PIN MSM and/or vertical PIN or NIP structures. In both cases, these structures are able to be monolithically integrated with CMOS/BiCMOS ASICs. In some cases, the optical signals can impinge on the top surface, and in some cases can impinge from the bottom surface.

The FDTD simulation is an average of optical signal impinging +/−10 degrees from the normal in the cases of microstructure hole devices. In the case of comparable photodetector without microstructure holes (flat) the FTDT simulation is only for normal incidence.

In some cases, Ge on Si photodiodes can be fabricated on SOI wafers. See, e.g., Xue et al, 1×4 Ge-on-SOI PIN Photodetector Array for Parallel Optical Interconnects, Journal of Lightwave Technology, Vol. 27, No. 24, Dec. 15, 2009, which is incorporated by reference herein. The Ge on Si photodiodes can be monolithically integrated with CMOS/BiCMOS ASICs. See, e.g., Knoll et al, Monolithically Integrated 25 Gbit/sec Receiver for 1.55 um in Photonic BiCMOS Technology, OFC 2014, which is incorporated by reference herein.

Dark current of Ge on Si photodiode with Mesa PIN structures can be suppressed with Si passivation. See for example reference Dong et al, Suppression of dark current in germanium-tin-on silicon p-i-n photodiode by silicon surface passivation technique, Optics Express Vol 23, No 14, 13 Jul. 2015. Reference DiLello et al, Characterization of dark current in Ge-on-Si photodiodes, Journal of Applied Physics, 112, 054506 (2012) shows reduction of dark current in Ge on Si photodiodes using dielectrics process compatible with CMOS/BiCMOS fabrication methods.

Figure 92D:
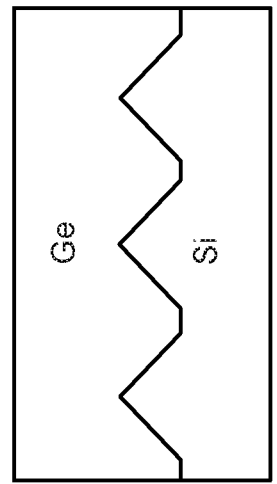
FIGS. 92D and 92F are partial cross-sections of structure shapes, according to some embodiments.
Figure 92E:
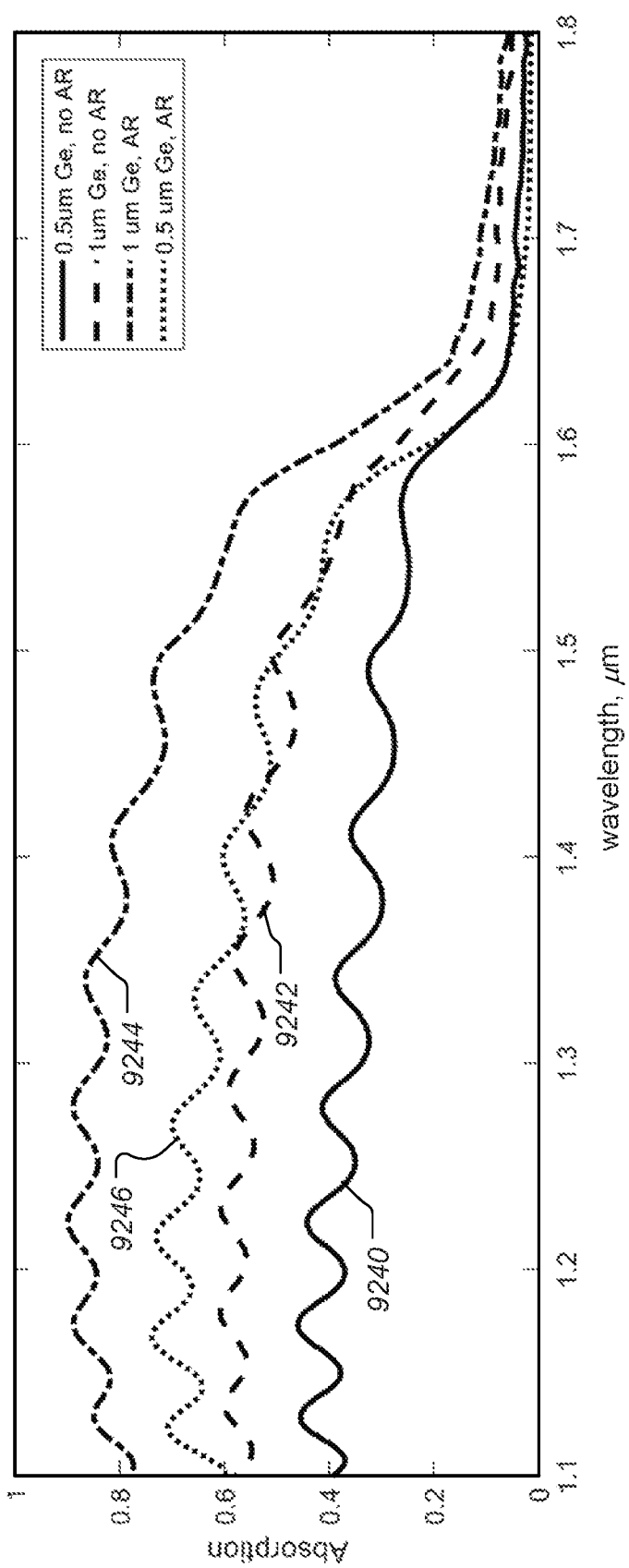
Figure 92F:
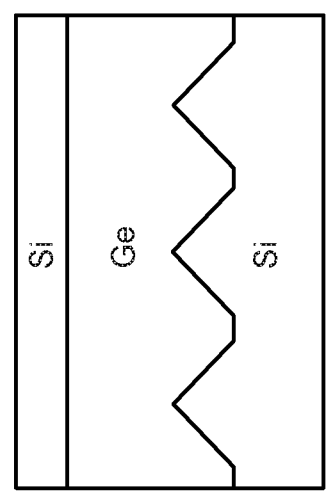

FIGS. 92C-92F illustrate FDTD simulations of optical absorption vs wavelength for Ge on Si structures having Si pyramid islands with and without poly Si capping layer on the Ge surface. The structures are depicted in FIGS. 92D (no Si cap) and 92F (with Si cap). The Ge layer has thicknesses of 0.5 and 1 micron. The Si pyramids have a base dimension of 1200 nm and a period of 1700 nm in a square lattice. The optical signal impinges on the top surface of the Ge at a normal incidence and in some cases at an off normal incidence of plus/minus 10 degrees. Curves 9230 and 9232 in FIG. 92C, and 9240 and 9242 in FIG. 92E show the case without a Si capping layer on the Ge and with and without any anti-reflection coatings. The small spaced dashed curves 9234 and 9244 show the absorption vs wavelength from 1100 nm to 1800 nm for a 1-micron Ge thickness with anti-reflection coating. The dotted curves 9236 and 9246 show 0.5 microns Ge thickness with anti-reflection coating. The enhanced absorption can bb approximately 80% for the 1-micron Ge thickness and 60% for the 0.5 micron thickness Ge to 1400 nm wavelength. The EQE is proportional to absorption and the proportionality factor can range from 1 (EQE=absorption) to 0.5 (EQE=0.5 absorption) and in some cases the proportionality factor can range from 1 to 0.3.

In both cases Ge on Si photodetectors with buried Si islands (that in general can be pyramid, cylindrical, square, trapezoidal, or polygonal) can have a higher EQE than a comparable Ge on Si photodetector without Si islands at certain wavelengths, in the wavelength range of 1100 nm to 1800 nm.

The structure can be applied to both vertical PIN or lateral PIN or lateral MSM microstructure photodetectors.

Optical signals in some cases can impinge from the bottom, and in some cases a BOX layer can be included.

The lateral dimension of the Si islands can range from 300 nm-1800 nm, the height can range from 50 nm-1000 nm or more, and the spacing can range from 0 nm (touching or overlapping)-2000 nm or more. The Si islands can be periodic, aperiodic, and/or random, and in some cases can be any combination of periodic, aperiodic and/or random. The wavelength span can be from 800-2000 nm, and in some cases 1000-1450 nm, and in some cases from 1000-1800 nm. Data rate can range from 10 Gb/s to 50 Gb/s or more, and the structures are compatible with CMOS BiCMOS process. Lateral dimension of the photodetector can range from 5-1000 microns or more, and in some cases form 10-80 microns, and in some cases from 10-3000 microns. APD and SPAD photodetector structures can also be implemented with Ge on Si with buried Si islands. And in some cases, the buried Si islands can be dielectric and/or coated with dielectric, and the islands can be non-crystalline, and/or crystalline.

FIGS. 93A and 93B illustrate FDTD simulations of optical absorption vs wavelength for Ge—Si structures having Si rectangular islands with poly Si capping layer on the Ge surface. The structure simulated is depicted in FIG. 93B. The lower Si layer is either 0.25 microns or 0.5 microns. The Ge layer on top of the Si layer is 0.5 or 1.0 microns. The upper Poly Si layer is 100 nm. The microstructure protrusions are formed from Si and are cylindrical in shape. The cylindrical protrusions are 1.2 microns lateral diameter with a 1.7 microns period arranged in a square lattice. The protrusion heights are 0.25 microns and 0.5 microns. The Ge strain is 0.6%. An antireflective coating overlays the upper Poly Si layer. In FIG. 93A curves 9310, 9312 and 9314 illustrate absorption vs optical signal wavelength for the three cases, respectively: (1) Si protrusion height=0.5 microns, Ge thickness=0.5 microns; (2) Si protrusion height=0.5 microns, Ge thickness=1.0 microns; and (3) Si protrusion height=0.25 microns, Ge thickness=1 micron, respectively. Note for case (1) above that the Si protrusion and Ge thickness are equal, so the protrusions extent to the upper surface of the Ge layer. The lower curves 9320 and 9322 are for flat structures (no microstructures) for two cases, respectively: (1) Ge thickness-0.5 microns; and (2) Ge thickness=0.25 microns. It can be seen that without protrusions between 1.6 microns-1.8 microns wavelengths the absorption rapidly decreases to 10% or less. In contrast, in the cases that include microstructure protrusions, the absorption is substantially higher at all wavelengths and monotonically decreases to about 30% at wavelengths of 1.8 microns. With protrusions the absorption enhancement is approximately 1.2 to greater than 6 times over the wavelength range of 1.2 to 1.8 microns when compared with similar structures without microstructure protrusions.

Note that the structures simulated are applicable for both vertically arranged PIN photodetectors as well as laterally arranged MSM inter-digitated electrode photodetectors. In addition, in the case of laterally arranged inter-digitated electrode photodetectors, the inter digit spacing (between the electrodes) can be less than or equal to the lateral dimension of the protrusions.

Note the refractive index of the silicon protrusions would ordinarily be lower than the overlying Ge layer. However, in some cases, the protrusions could be made of a higher index material (such as Ge) and then overlaid with lower index material (such as poly Si). Such configurations could be used to achieve enhanced absorption as shown herein.

Figures 94A, 94B, 94C, 94D:
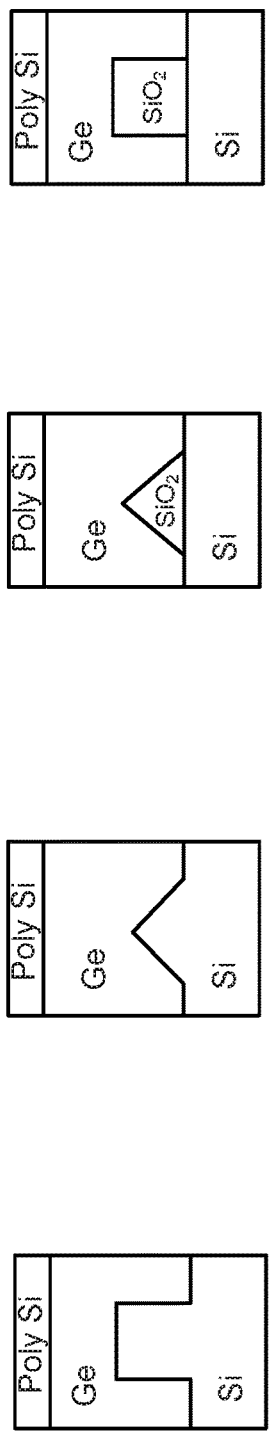
FIGS. 94A-94D show four different Ge on Si structures and FIG. 94E is a plot of FDTD simulations of the optical field impinging on the surface of the four different Ge on Si structures, according to some embodiments.
Figure 94E:
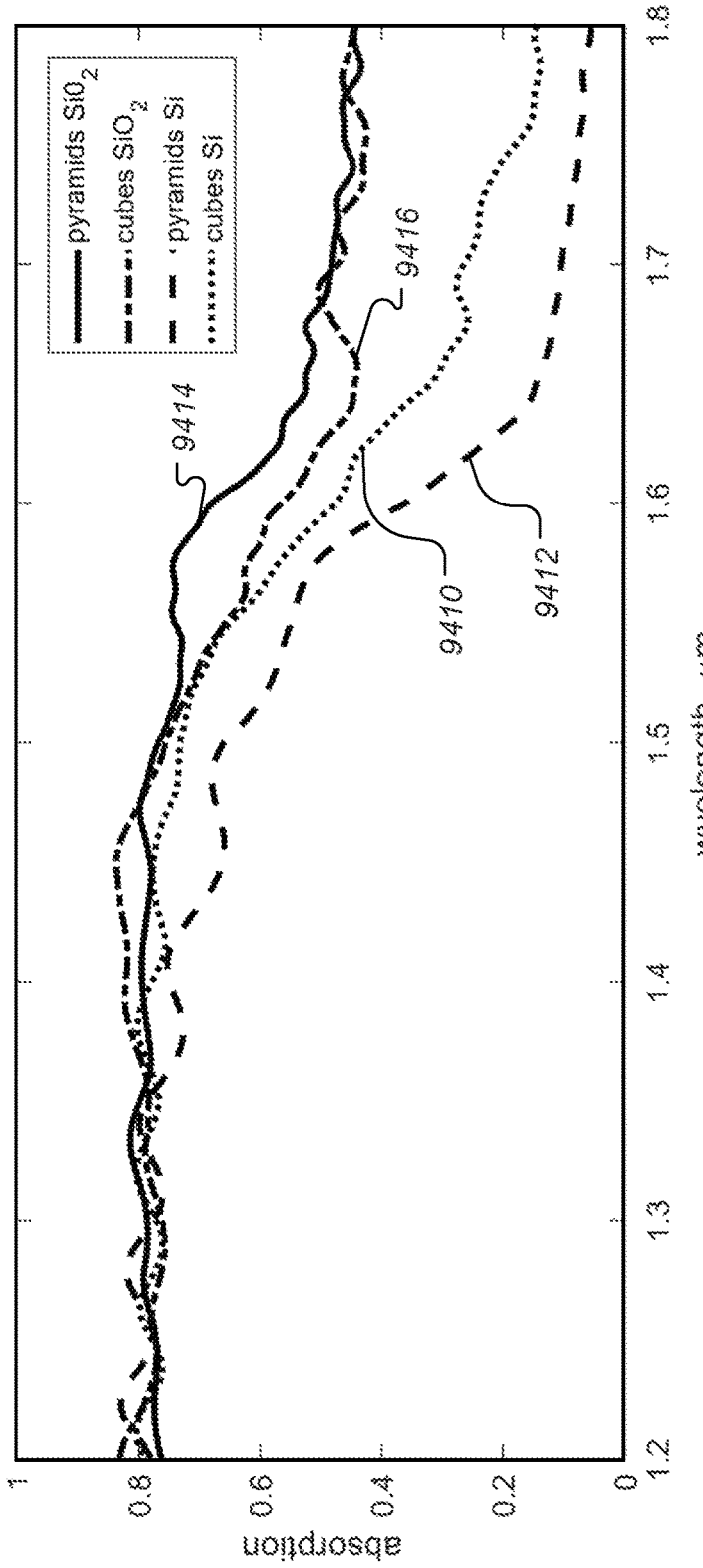

FIGS. 94A-94D show four different Ge on Si structures and FIG. 94E shows FDTD simulations of the optical field impinging on the surface of those structures. FIG. 94A shows square Si islands with side dimensions of 1200 nm and a period of 1700 nm in a square lattice, and a height of 500 nm on which Ge is grown to a thickness of 1000 nm and a poly Si capping layer of 100 nm thickness is formed. FIG. 94B is similar to FIG. 94A but has a pyramid etched in Si with a base dimension of 1200 nm, and a period of 1700 nm in a square lattice with a height of approximately 500 nm on which 1000 nm of Ge is grown and capped with 100 nm of poly Si. FIG. 94C shows a dielectric such as Si dioxide deposited on Si in a pyramid shape with a 1200 nm base and 1700 nm period in a square lattice, with a height of approximately 500 nm, and 1000 nm of Ge is grown over it using epitaxial lateral overgrowth methods and is capped with 100 nm of poly Si. FIG. 94D shows a dielectric such as Si dioxide deposited on Si and etched in cubic islands with lateral dimension of 1200 nm, a period of 1700 nm in a square lattice, and a height of approximately 500 nm, and Ge of 1000 nm thickness is epitaxial lateral overgrown over the dielectric and is capped with 100 nm of poly Si.

FIG. 94E shows several plots of absorption vs wavelength from 1.2 to 1.8 microns. As seen, the structures using buried dielectric islands (FIGS. 94C and 94D and curves 9414 and 9416) results in higher absorption from 1.6 micron to 1.8 micron than structures using Si protrusions (FIGS. 94A and 94B and curves 9410 and 9412). For the structures FIGS. 94C and 94D (curves 9414 and 9416) the absorption is approximately 80% for wavelengths from 1.2 to 1.5 microns and approximately monotonically decreased to approximately 40% at 1.8 microns wavelength. EQE is proportional to absorption and can have EQE ranging from 40% to 80% for some wavelength in the range 1.2-1.8 microns, and in some cases 20% or more in the wavelength range of 1.2-1.8 microns. The structures illustrated in FIGS. 94A-94D can be applied to both lateral interdigitated photodetectors and to vertical PIN photodiodes each using a multiplicity of holes receiving the same optical signal.

In structures using a multiplicity of holes of the type FIGS. 94A-94D illustrate, the islands in Si or dielectric can have lateral dimensions in the range 800 nm-1500 nm and in some cases 500 nm-2000 nm, and the spacing can range from 0 (overlapping) to 1000 nm or more between the islands. In some cases, the spacing can range from 100 nm to 1000 nm. The height of the islands can range from 50 nm-1000 nm and in some cases 250 nm-1000 nm. The shape of the islands can be cylindrical, pyramidal, polygonal, trapezoidal, and any combination of shapes, and can be arranged periodically, and/or aperiodic, and/or random. The islands can have same and/or different dimensions within the same array, or groups of islands. Poly Si can be used in place of amorphous Si and in some cases amorphous Si can be used in place of Poly Si.

Figure 95:
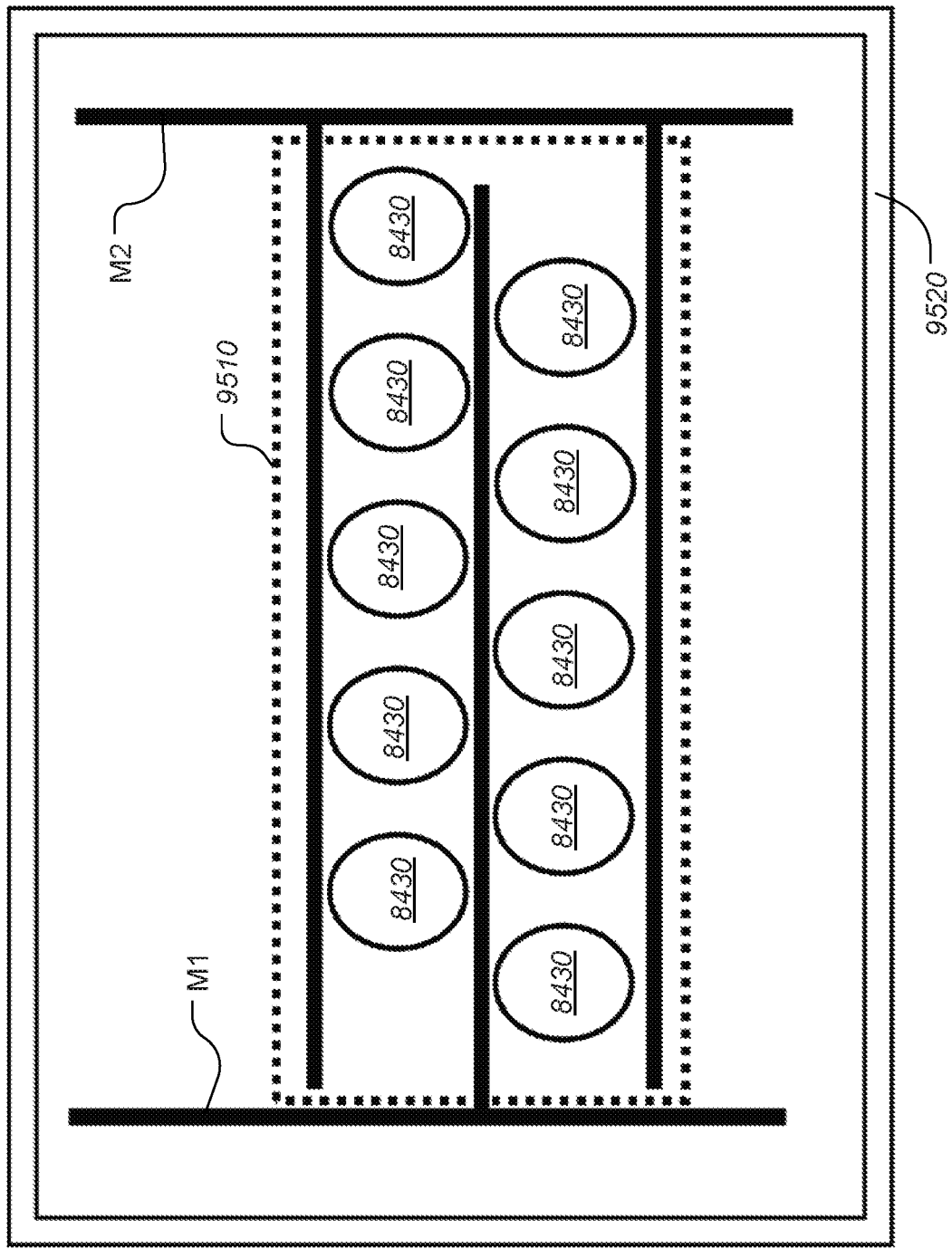
FIG. 95 is a cross-section similar to FIG. 84I, with the addition of an ion implant layer, according to some embodiments.

FIG. 95 is similar to FIG. 84I but shows the addition of an ion implant at and near the dotted line 9510, where regions outside the microstructure hole area are heavily ion implanted with ions such as N, O, H, Ar, to name a few to reduce the lifetime of photo generated carriers and minimize diffusion of those photo generated carriers to the high field region that can contribute to a slow tail in the optical impulse response. In some cases, a trench can be etched along the dotted line 9510. Also shown is a trench 9520 that surrounds the M1 and M2 electrodes and the microstructure holes 8430 that can be used as optical isolation for photo carriers generated outside the region bound by the trench 9520 to minimize contributions of photo carriers diffusing back to the high field regions. The trench 9520 can be continuous such as shown, like a moat, and in some cases can have gaps to allow connecting metal lines to the M1 and M2 electrodes. In the case where gaps are not used, the trench can be filled with a filler such as dielectric and/or polyimide and connecting metal such as transmission lines can cross the trench and connect to the M1 and M2 electrodes. The depth of the trench 9520 can range from 100 nm to 1000 nm or more, and in some cases can be etched to the BOX layer. In some cases, the trench can be 10% to 100% of the Si or Ge/GeSi layer thickness. In the case of ion implantation to reduce carrier lifetime the doping concentration of the ions can range from $5 \times 10^{17}$ per $cm^3$ to $1 \times 10^{20}$ per $cm^3$ or more and can have multiple ion implantation energies to provide a uniform depth distribution of the ion implanted ions.

As shown in FIGS. 48A-48C the MSM electrodes can be positioned on different planes. However, at higher data rate bandwidths, the gap between the interdigitated electrodes M1 and M2 can be less than 1000 nm. In many cases the microstructure holes are of the order of 1000 nm in lateral dimension. If it is desirable to keep the holes size wider than the gap between the interdigitated electrodes, one of the electrodes, M1 or M2, can be buried such that the absorbing layer Ge/GeSi can be positioned between the M1 and M2 electrodes.

Figure 96A:
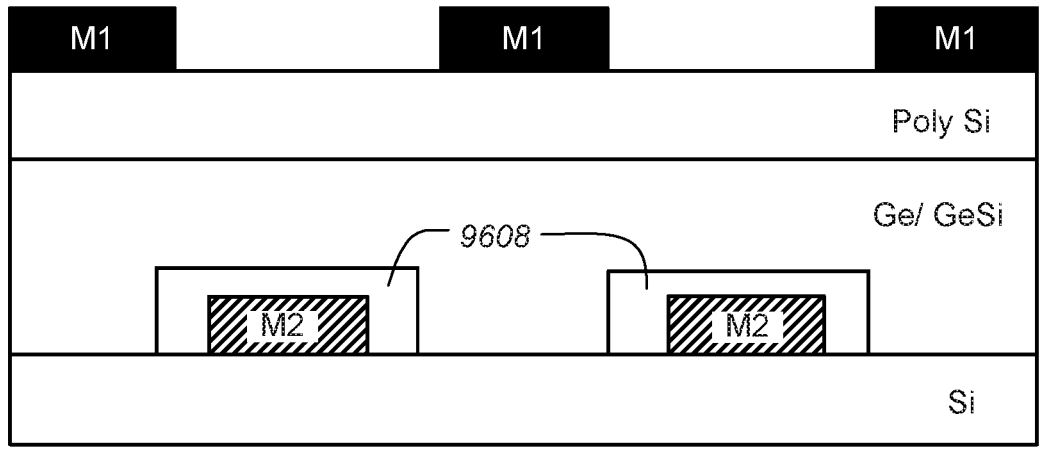
FIGS. 96A-96D are simple cross-sections of an inter-digitated electrode photodetector where one of the electrodes is buried or formed beneath the absorbing layer, according to some embodiments.

FIGS. 96A-96D are simple cross-sections of an inter-digitated electrode photodetector where one of the electrodes is buried or formed beneath the absorbing layer, according to some embodiments. In the case of FIG. 96A, the electrode M2 is deposited on Si and can be covered with a layer of Poly Si 9608 that can be doped or undoped. The thickness of the Poly Si 9608 can range from 50 nm to 500 nm or more, and in some cases the Poly Si can be less than 50 nm. Ge/GeSi is selective area grown on Si with or without a buffer layer and is epitaxially grown over the M2 electrode and any Poly Si such that the M2 electrode is buried by the Ge/GeSi layer. A thin layer of Poly Si doped or undoped can be deposited on the Ge/GeSi layer as shown. M1 interdigitated electrodes are then deposited on the Poly Si layer as shown. The Poly Si layer over the Ge/GeSi layer can have a thickness ranging from 10 nm-500 nm or more, and in some cases the thickness can be less than 10 nm. The Ge/GeSi layer can have a thickness ranging from 300 nm-1000 nm, and in some cases more than 1000 nm, and in some cases less than 300 nm. Light impinges on the surface of the Poly Si layer, and in some cases can impinge from the bottom of the substrate, with wavelength ranges from 800 nm-1800 nm.

With buried M2 electrodes the spacing between the M1 electrodes is two times or closer than a MSM photodetector where the M1 and M2 electrodes are approximately on the same plane. The lateral dimension or the width of the M1 electrode can be as narrow as possible to minimize blockage of surface illuminated optical signal and can range from 20 nm to 300 nm, and in some cases can be wider than 300 nm, and in some cases less than 20 nm. Examples of material for the M2 electrodes include: Mo, W, and/or metal silicide, all of which can use standard CMOS/BiCMOS processing. Examples of material used for the M1 electrodes include: Al, Cu, W, Mo, metal silicide, and/or any metal commonly used in CMOS/BiCMOS processing. Not shown are anti-reflection layers, nanograss to reduce surface reflection, passivation, isolation trenches, transmission lines, and contacts to the buried electrodes. The M2 electrodes can have a lateral dimension ranging from 20 nm to 300 nm or more. The spacing of the M1 electrode can range from 500 nm to 2000 nm or more, and the spacing of the M2 electrodes can range from 100 nm to 2000 nm or more.

Figure 96B:
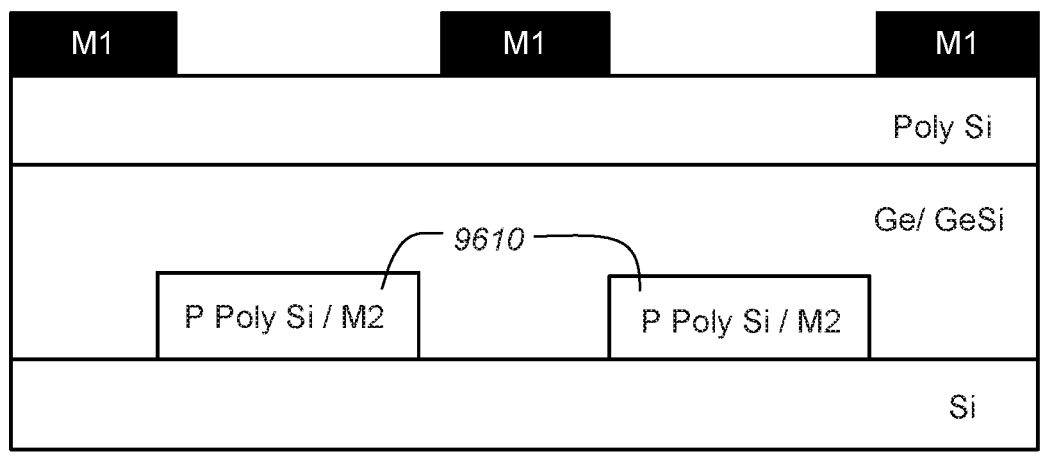

FIG. 96B is similar to FIG. 96A except the buried M2 electrodes are made of P Poly Si with a thickness ranging from 100 nm to 500 nm or more, and lateral dimension ranging from 300 nm to 1700 nm or more. The spacing of the M2 electrodes 9610 can range from 100 nm to 1000 nm, and in some cases more than 1000 nm. In some cases, the P Poly Si 9610 can be N Poly Si.

Figure 96C:
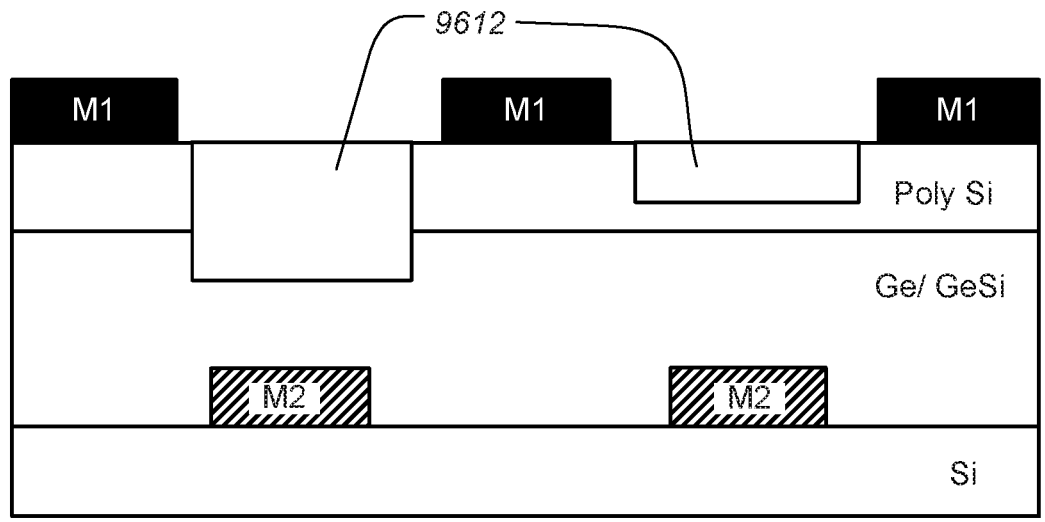

FIG. 96C shows etched microstructure holes 9612 between the M1 electrodes that can be etched into the Poly Si, and in some cases etched past the Poly Si layer into the Ge/GeSi layer. The etch depth can range from 100 nm to 1000 nm or more. The lateral dimension of the microstructure holes can range from 500 nm to 1700 nm, and in some cases 600 nm to 1500 nm. The spacing of the microstructure holes 9612 can range from 0 nm (touching on the top edges) to 1000 nm, and in some cases from 100 nm to 500 nm. The shape of the holes can be circular, rectangular, polygonal, funnel, inverted pyramids, and can be periodic or aperiodic. The M2 electrodes can be a metal, or metal silicide, and in some cases can be doped Poly Si. In some cases, the M2 electrodes can be coated with an oxide layer or Poly Si layer to minimize leakage current.

Figure 96D:
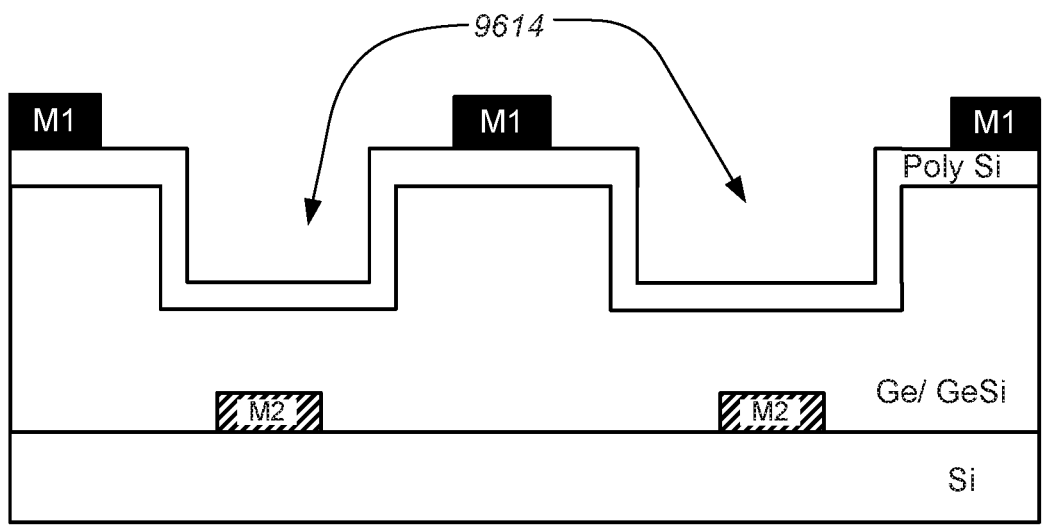

FIG. 96D is similar to FIG. 96C with the holes 9614 etched into the Ge/GeSi layer coated with a Poly Si layer. In some cases, the holes 9614 can be coated with a thin metal oxide layer, such as Al oxide to reduce leakage current.

Figure 96E:
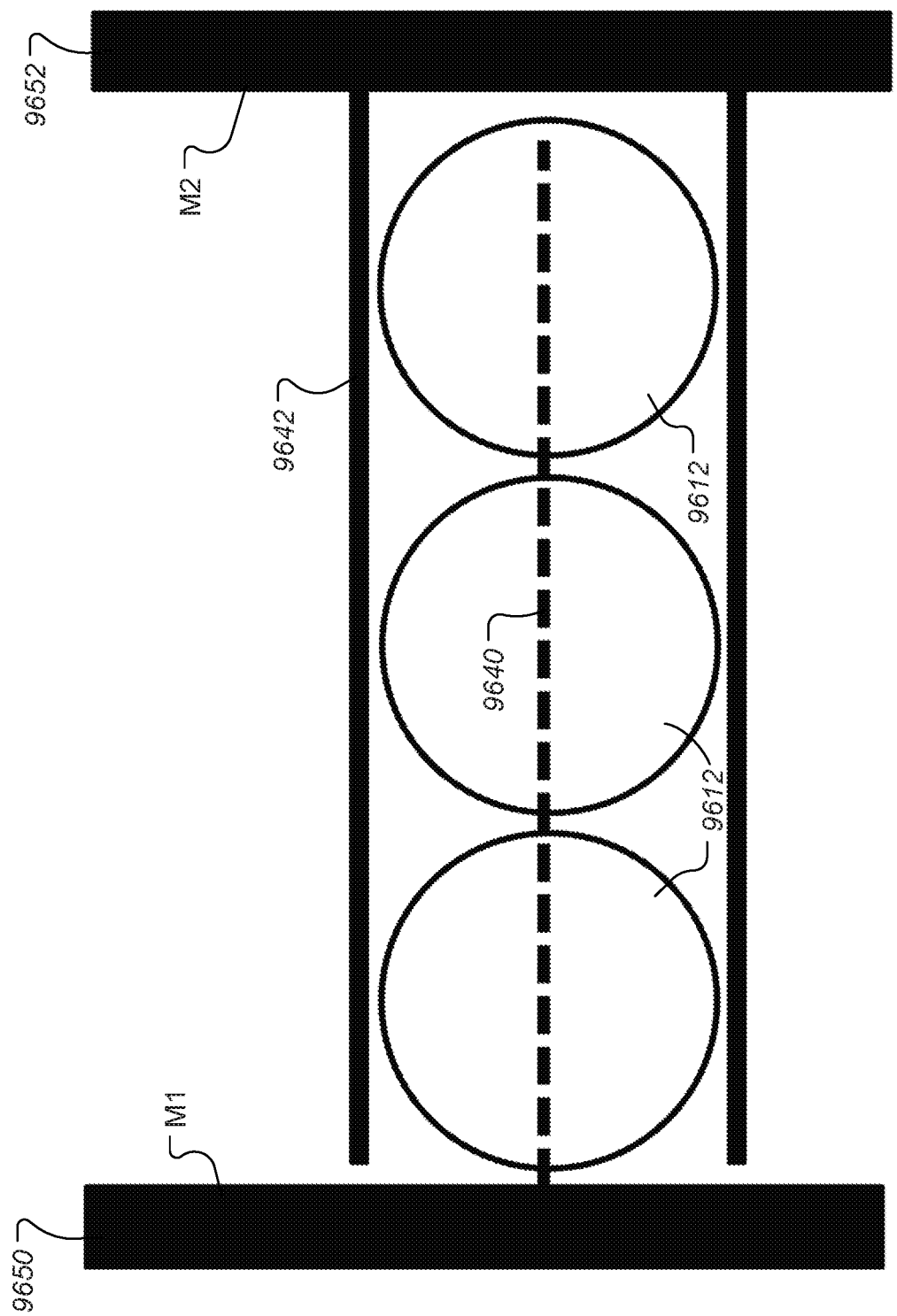
FIG. 96E is a simple top view schematic an inter-digitated photodetector where one set of the inter-digitated electrodes are buried, according to some embodiments.

FIG. 96E is a simple top view schematic an inter-digitated photodetector where one set of the inter-digitated electrodes are buried, according to some embodiments. In particular, the M1 "digit" or electrode "finger" 9640 shown by a dotted horizontal line from M1 transmission line 9650 is buried. Burying one set of electrodes (such as M1 in the present case and M2 in FIGS. 96A-96D) allows for more room for microstructure holes 9612 between the M2 inter-digitated electrodes 9642 for example, and at the same time allows the distance between the M1 and M2 inter-digitated electrodes 9640 and 9642 to be less than 1000 nm. In this schematic, the microstructure holes 9612 are shown as an example; in some cases, microstructure islands can be formed that are also buried. Such buried islands can be implemented which allows the distance between M1 and M2 inter-digitated electrodes to be significantly less than 1000 nm, and in some cases less than 500 nm. Providing a smaller distance between the M1 and M2 digits allows higher data rates, for example 25 Gb/s or higher, and in some cases 50 Gb/s or higher. Also shown is transmission line 9652 connected to the M2 digit electrodes (e.g. 9642).

The buried electrodes digits can have different widths and/or periods than the electrode digits on the surface. In some cases, both M1 and M2 digits can be buried fully or partially. In some cases, voids can be formed in the burying process using epitaxial lateral over-growth and/or selective area growth. Materials used for the buried or unburied electrodes include: metals such as W, Mo, Al, Cu, Pt, Ni, Cr, Ti, Ta; metal silicides; doped poly Si; and/or any combination of the foregoing. The Ge/GeSi can be crystalline, poly crystalline, amorphous and any combination there of, and can have more than a single layer of Ge/GeSi with different composition and/or crystallinity. The process to bury the electrodes can use standard CMOS/BiCMOS and/or non-standard CMOS/BiCMOS processes.

Other configurations of a buried inter-digitated electrode photodetectors are possible. For example, some can have P and N junctions, metal semiconductor junctions, metal oxide semiconductor junctions, and/or ohmic contacts for at least 1 or both of the M1 and M2 electrodes. In some cases P N junctions can be included for avalanche gain. The Ge i GeSi can be I or low doped and can be crystalline and/or polycrystalline and/or amorphous. In the case of GeSi the Ge mole fraction can range from 0-1, where 0 is pure Si and 1 is pure Ge.

Figure 97A:
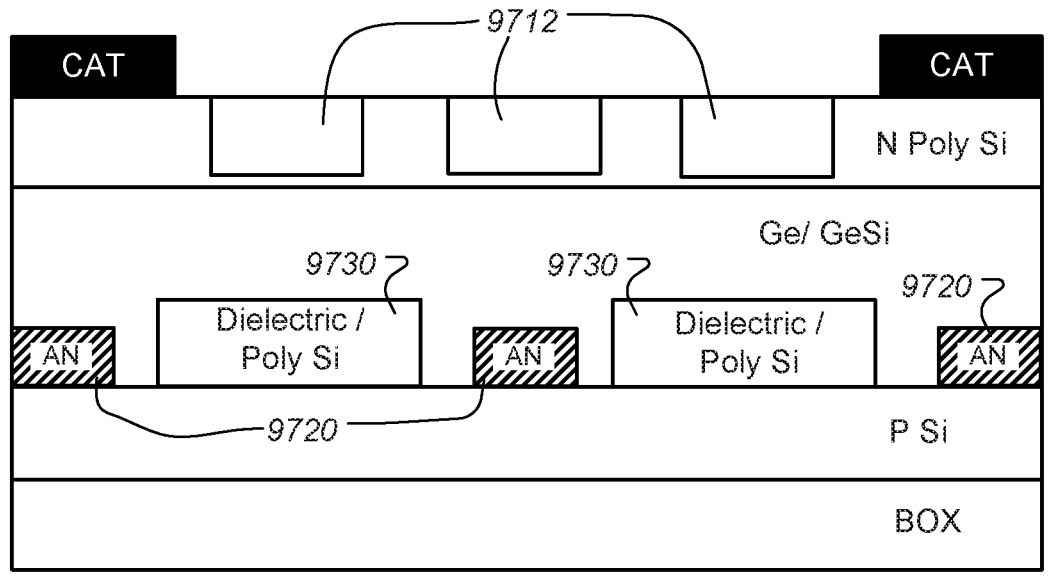
FIGS. 97A-97C are simple schematic cross-sections of a vertically arranged photodetector with buried anode or cathode electrodes, according to some embodiments.
Figure 97B:
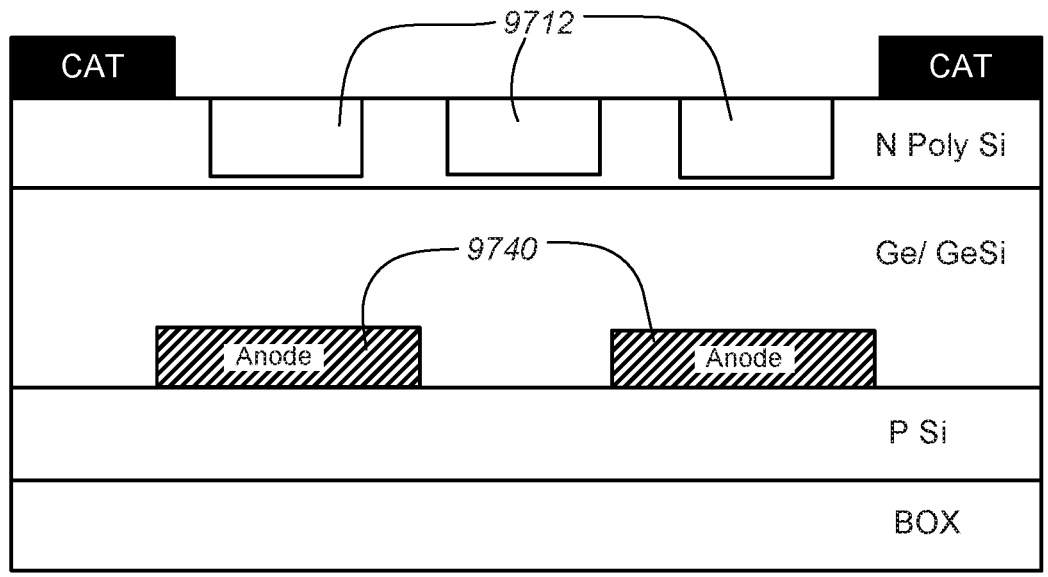
Figure 97C:
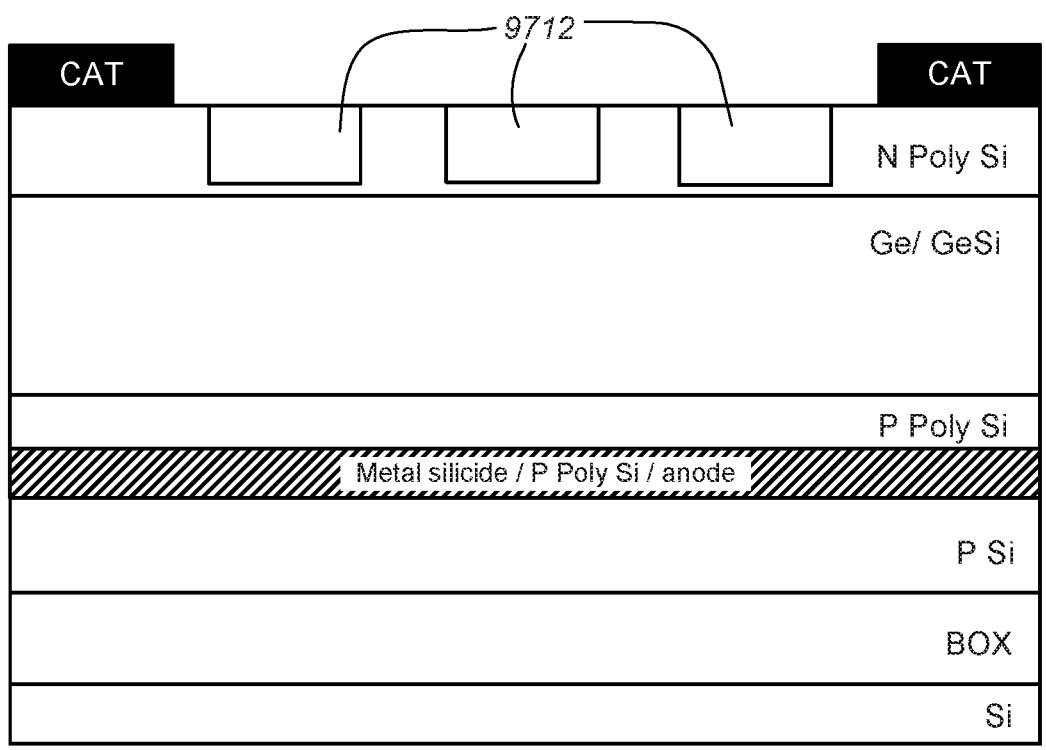

FIGS. 97A-97C are simple schematic cross-sections of a vertically arranged photodetector with buried anode or cathode electrodes, according to some embodiments. The photodetector can be configured as PIN, NIP or Schottky contact, with surface illumination. In FIG. 97A, the anodes 9740 are in contact with the P Si which can include a BOX layer as shown. The anodes 9720 can be Mo, W, metal silicide for example. Islands 9730 can be a dielectric, Poly Si or Si with lateral dimensions ranging from 500 nm to 1500 nm and with spacing ranging from 100 nm-1000 nm and in some cases more than 1000 nm. The microstructure islands 9730 can have a height ranging from 100 nm to 500 nm, and in some cases more than 500 nm. Ge/GeSi can be selective area, and epitaxial lateral overgrown to bury the anode and the microstructure islands. The thickness of the Ge/GeSi can range from less than 300 nm to 1000 nm or more, and in some cases from 300 nm to 1000 nm. N Poly Si can be deposited on the Ge/GeSi and can have a thickness ranging from 100 nm to 500 nm and in some cases more than 500 nm. Cathode electrodes are formed on the N Poly Si. Microstructure holes 9712 can be formed in the N Poly Si layer with lateral dimensions ranging from 500 nm to 1500 nm, and with spacing ranging from 100 nm to 500 nm. The microstructure holes 9712 can be periodic and/or aperiodic. The dielectric islands 9730 can also be periodic, and/or aperiodic. The anode electrodes 9720 can be arranged in a grid between the islands 9730 and in some cases it can be on the peripheral area buried or not buried by the Ge/GeSi layer.

FIG. 97B is similar to FIG. 97A but omitting the dielectric or Poly Si islands, and with the anodes 9740 formed of metal silicide, P Poly Si and/or metal.

FIG. 97C is similar to FIG. 97B except the anodes can extend the width of the photosensitive area as shown. The anode is shown covered by P Poly Si, which in some cases can be un-doped Poly Si. The Ge/GeSi can be crystalline, poly crystalline, amorphous, and/or any combination of crystalline, poly crystalline, and amorphous. For GeSi, the Ge mole fraction can range from 0-1. In some cases microstructure and/or nanostructure holes 9712 can be etched through the Poly Si and anode to the Si layer prior to Ge/GeSi growth. The P Poly Si or un-doped Poly Si on the metal silicide or metal anode can have a thickness ranging from a few nanometers to 1000 nm, and in some cases 10 nm to 100 nm. The thickness of the Ge/GeSi which can be I or low dope can range from 200 nm to 1000 nm and in some cases more than 1000 nm.

The wavelength range with a Ge/GeSi absorption layer, and with microstructure holes and/or islands can range from 800 nm to 1800 nm. Additional PN junctions can be included for avalanche gain. Light can impinge from the top surface, and in some cases from the bottom surface. In the case of buried electrodes such as the buried anode (P and N can be interchange, and anode and cathode can be interchanged) wavelength selective pattern can be generated in the buried electrode such that light impinging from the bottom surface can have a wavelength selectivity characteristic.

Figure 98:
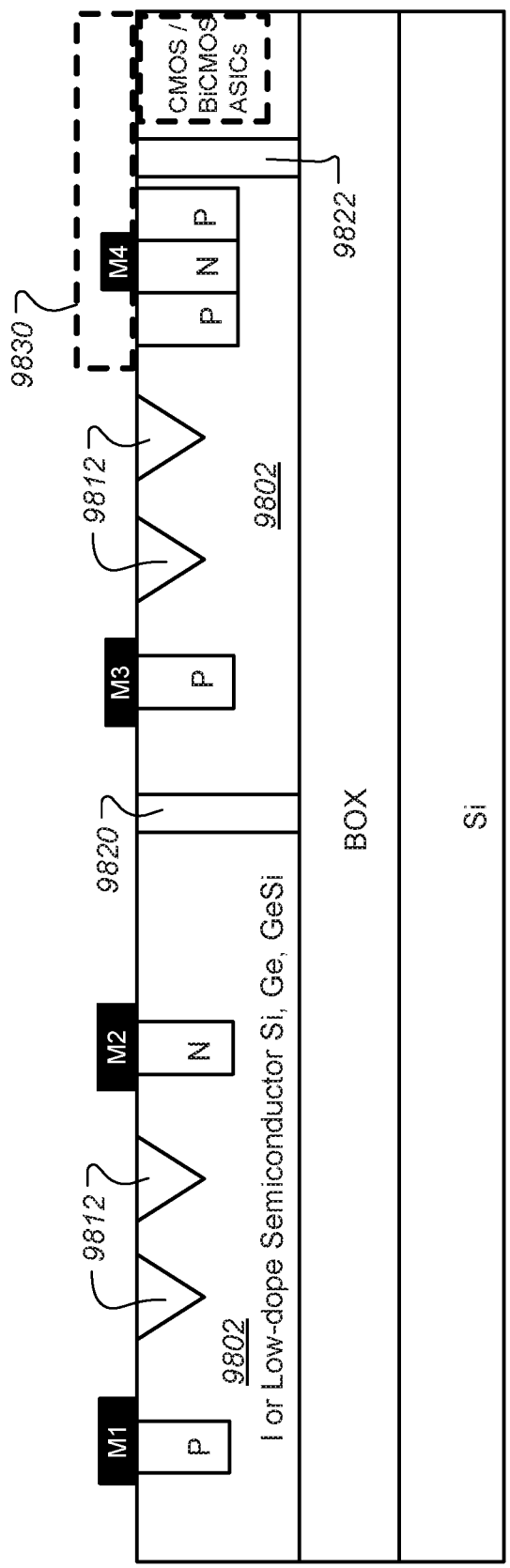
FIG. 98 is a cross-section schematic of a lateral interdigitated photodiode and interdigitated lateral avalanche photodiode (APD) and/or single photon avalanche photodiode (SPAD) that are fabricated on the same substrate (chip) and are monolithically integrated with CMOS/BiCMOS ASICs, according to some embodiments.

FIG. 98 is a cross-section schematic of a lateral inter-digitated photodiode and inter-digitated lateral avalanche photodiode (APD) and/or single photon avalanche photodiode (SPAD) that are fabricated on the same substrate and are monolithically integrated with CMOS/BiCMOS ASICs, according to some embodiments. In some cases, the photodiode and/or avalanche photodiode are arranged in a 1D array. In other cases, the photodiodes can be arranged in a 2D array such as shown in FIG. 53 and FIG. 90A. The lateral dimension of the photodiode and/or avalanche photodiode can be different and can have a range from 10 microns to 1000 microns or more. An isolation trench 9820 can be included to separate the photodiodes and from the APD/SPAD, and in the case of trench 9822 to separate the photodiodes and APD/SPAD from the CMOS/BiCMOS electronics. In some cases, light shield 9830 can be included to block the light from the avalanching region and the CMOS/BiCMOS electronics. This example the fabrication of an inter-digitated photodiode such as shown in FIG. 21 together with an APD/SPAD as shown in FIG. 24. M1 and M2 are a pair of inter-digitated electrodes for the photodiode, and M3 and M4 are the pair of inter-digitated electrodes for the APD/SPAD. Multiple photodiodes and APD/SPAD can be fabricated in an array with different or same lateral dimensions. Other contacts such as Schottky contacts, ohmic contacts, metal oxide semiconductor contacts are possible. In addition, other APD structures containing Ge/GeSi such as shown in FIG. 30 and photodetectors shown in FIG. 26 and FIG. 33 can be combined on a single common substrate.

In this example, microstructure holes 9812 such as inverted pyramids are etched in the surface, and in some cases can be filled with dielectrics, and in some cases can be doped P or N type. In some cases, the holes can be solid such as an island and can be buried within the I or low dope semiconductor region. In some cases, the BOX layer can be optional. Optical signals impinge on the top surface, and in some cases can impinge on the bottom substrate surface.

The lateral photodetector and the lateral APD/SPAD can be fabricated on a common substrate with a common I or low dope layer(s) and can be monolithically integrated with CMOS/BiCMOS ASICs.

The FIGs. discussed above generally show only a portion of a photodetector, and it should be understood that the shown portion can be duplicated many times to form a single photodetector. For example, FIG. 72F shows a portion illustrating only two electrodes M1 and one electrode M2 but, as seen for example in FIG. 74B, the illustrated photodetector comprises a pattern of a many more electrodes M1 and many more electrodes M2 over the photosensitive area of the photodetector. FIG. 74C shows only a portion of the many electrodes M1 and many electrodes M2 seen in FIG. 74B.

It should also be understood that in embodiments in which two or more photodetectors are formed on or in the same chip, these photodetectors can be identical or different from each other. For example, some can be MSPDs and some MSAPDs, some can use metallic electrodes, some can add doped semiconductor under a metallic electrode and some can use Schottky junction electrodes, some can be lateral MSPDs and some vertical, etc. Similarly, in embodiments that include two or more active electronic circuits monolithically integrated in the same chip as one of more MSPDs and/or MSAPDs, the active electronic circuits can be identical or can differ from each other, e.g., some can be amplifiers, some can do digital processing, etc.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered as illustrative and not restrictive, and the body of work described herein is not to be limited to the details given herein, which may be modified within the scope and equivalents of the appended claims.

The invention claimed is:

1. A lateral microstructure-enhanced photodetector comprising:
   one or more laterally extending, non-doped or low-doped I-layers of silicon and/or germanium;
   interdigitated electrodes that are laterally spaced from each other and are electrically coupled with said one or more I-layers and configured to produce a laterally extending electrical field therein;
   a microstructure comprising a laterally extending multiplicity of deliberately formed holes in said photodetector;
   wherein:
      said one or more I-layers are continuous and planar except for any penetration thereof by said holes;
      said holes have heights in a direction transverse to said I-layers;
      said photodetector is configured to respond to illumination with spatially continuous light at each of one or more regions each encompassing a multiplicity of said holes, in a direction transverse to said one or more I-layers, by producing an electrical output that depends on said illumination; and
      said holes enhance a desirable electrical response of said photodetector to said light in one or more selected wavelength ranges compared to an electrical response of an otherwise same photodetector without said holes said photodetector being configured to operate in the frequency of 1-100 Giga bits per second range.

2. The lateral microstructure-enhanced photodetector of claim 1, further including a monolithic chip and one or more active electronic circuits monolithically integrated with said photodetector on or in said chip and electrically coupled with said electrodes to receive and process said electrical output.

3. The lateral microstructure-enhanced photodetector of claim 1, further including a monolithic chip and plural active electronic circuits monolithically integrated with said photodetector on or in said cup and electrically coupled with said electrodes to receive and process said electrical output.

4. The lateral microstructure-enhanced photodetector of claim 1, further including a monolithic chip and plural electronic circuits monolithically integrated with said photodetector on or in a said chip and electrically coupled with said electrodes to receive and process said electrical output, and one or more light emitting devices mounted to said chip and coupled to one or more active electronic circuits to be driven thereby.

5. The lateral microstructure-enhanced photodetector of claim 1, in which at least some of said holes are laterally between said electrodes.

6. The lateral microstructure-enhanced photodetector of claim 1, in which said electrodes overlie at least some of said holes.

7. The lateral microstructure-enhanced photodetector of claim 1, further including a cover layer over said one of more I-layers, and wherein said holes are only in said cover layer.

8. The lateral microstructure-enhanced photodetector of claim 1, in which said holes extend only partway down from a top surface of said one of more I-layers.

9. The lateral microstructure-enhanced photodetector of claim 1, in which said one or more I-layers have a top surface and a bottom surface and said holes extend down from said top to said bottom surface.

10. The lateral microstructure-enhanced photodetector of claim 1, in which said holes comprise islands of dielectric material laterally spaced from each other by said semiconductor material of said I-layers, formed by selective area growth.

11. The lateral microstructure-enhanced photodetector of claim 1, in which said one or more I-layers have a bottom surface and at least some of said holes extend from said bottom surface up into said one or more I-layers and comprise material with electrical and/or optical properties different from those of said one or more I-layers.

12. The lateral microstructure-enhanced photodetector of claim 1, in which said one or more I-layers have a top surface and a bottom surface and some of said holes extend into said one or more I-layers down from said top surface and some of said holes extend into said one or more I-layers up from said bottom surface.

13. The lateral microstructure-enhanced photodetector of claim 1, in which said holes comprise a solid dielectric material.

14. The lateral microstructure-enhanced photodetector of claim 1, in which said holes comprise a semiconductor material that is different from the semiconductor material of said one or more I-layers.

15. The lateral microstructure-enhanced photodetector of claim 1, in which said electrodes comprise laterally extending conductors and doped semiconductor material regions thereunder, laterally spaced by said one or more I-layers and forming one or more PN junctions in said photoconductor, where the materials forming each of the one or more PN junctions are touching.

16. The lateral microstructure-enhanced photodetector of claim 1, further comprising at least one doped semiconductor region and in which said electrodes comprise laterally extending conductors and additional doped semiconductor material regions under one or more of said conductors and in ohmic contact therewith, said doped regions being laterally spaced by said one or more I-layers and forming one or more PN junctions in said photoconductor, where the materials forming each of the one or more PN junctions are touching.

17. The lateral microstructure-enhanced photodetector of claim 1, in which said electrodes comprise laterally extending conductors forming Schottky junctions in said photodetector.

18. The lateral microstructure-enhanced photodetector of claim 1, in which at least two of said electrodes differ from each other in vertical position relative to a top surface of said one or more I-layers.

19. The lateral microstructure-enhanced photodetector of claim 1, in which at least one of said electrodes has a bottom surface that is below a top surface of said one or more I-layers.

20. The lateral microstructure-enhanced photodetector of claim 1, in which said electrodes and said one or more I-layers have at least one of (i) top surfaces that are substantially at the same level and (ii) bottom surfaces that substantially at the same level.

21. The lateral microstructure-enhanced photodetector of claim 1, further including a layer of a light-absorbing material over at least portions of said electrodes.

22. The lateral microstructure-enhanced photodetector of claim 1, further including a light-absorbing layer that is over at least portions of said electrodes and has a nano-structured top surface.

23. The lateral microstructure-enhanced photodetector of claim 1, further including a light-absorbing layer that is over at least portions of said electrodes and said one or more I-layers and has a nano-structured top surface.

24. The lateral microstructure-enhanced photodetector of claim 1, further including a layer of doped semiconductor over at least a portion of said one or more I-layers, forming one or more PN junctions in said photodetector, where the material forming each of the one or more PN junctions are touching.

25. A method of manufacturing a lateral microstructure-enhanced photodetector comprising:
providing one or more laterally extending, non-doped or low-doped 1-layers of silicon and/or germanium, plural electrodes electrically coupled with said one or more 1-layers and configured to produce an electrical field therein, and interdigitated electrodes that are laterally spaced from each other and are electrically coupled with said one or more i-layers and configured to produce a laterally extending electrical field therein;
a microstructure comprising a laterally extending multiplicity of deliberately formed holes in said photodetector; said providing step further comprising:
forming said one or more I-layers as continuous and planar except for any penetration thereof by said holes;
configuring said photodetector to respond to illumination with spatially continuous light at each of one or more regions each encompassing a multiplicity of said holes, in a direction transverse to said one or more 1-layers, by producing an electrical output that depends on said illumination;
configuring said holes to enhance a desirable electrical response of said photodetector to said light in one or more selected wavelength ranges compared to an electrical response of an otherwise same photodetector without said holes; and
monolithically integrating said photoconductor on or in a single chip with one or more active electronic circuits and electrically connecting said photodetector and said active electronic circuits for transfer of said electrical output to said circuits for processing thereby;
said photodetector being configured to operate in the frequency of 1-100 Giga bits per second range.

26. The method of claim 25, further including providing one or more additional photodetectors each comprising a laterally extending multiplicity of holes that enhance desirable electrical responses of said one or more additional photodetectors to light having selected wavelengths compared to otherwise same photodetectors without said holes and assembling said photodetectors on or in said chip and electrically connecting them with said one or more active electronic circuits.

27. The method of claim 25, further including providing plural additional photodetectors each comprising a laterally extending multiplicity of holes that enhance desirable electrical responses of said one or more additional photodetectors to light having selected wavelengths compared to otherwise same photodetectors without said holes and fluidically assembling said photodetectors on or in said chip and electrically connecting them with said active electronic circuits.

28. The method of claim 25, further including providing one or more additional photodetectors each comprising a laterally extending multiplicity of holes that enhance desirable electrical responses of said one or more additional photodetectors to light having selected wavelengths compared to otherwise same photodetectors without said holes and one or more light emitting devices and assembling said photodetectors and said light emitting devices on or in said chip, and electrically connecting said photodetectors and light emitting devices with said active electronic circuits.

29. The method of claim 25, comprising forming at least some of said holes as island of a solid material that differs in electrical and/or optical properties from said one or more I-layers and forming at least some of said holes involves etching or deposition and forming at least some of the material of said one or more I-layers employs epitaxial layer growth over said islands.

\* \* \* \* \*